US011183637B2

(12) United States Patent
Mitchell et al.

(10) Patent No.: US 11,183,637 B2
(45) Date of Patent: Nov. 23, 2021

(54) ORGANIC PHOTODETECTOR

(71) Applicant: Raynergy Tek Incorporation, Hsinchu (TW)

(72) Inventors: William Mitchell, Chandler's Ford (GB); Lichun Chen, Southampton (GB); Toby Cull, Romsey (GB)

(73) Assignee: RAYNERGY TEK INCORPORATION, Hsinchu (TW)

( * ) Notice: Subject to any disclaimer, the term of this patent is extended or adjusted under 35 U.S.C. 154(b) by 240 days.

(21) Appl. No.: 16/339,422

(22) PCT Filed: Oct. 2, 2017

(86) PCT No.: PCT/EP2017/074954

§ 371 (c)(1),
(2) Date: Apr. 4, 2019

(87) PCT Pub. No.: WO2018/065352

PCT Pub. Date: Apr. 12, 2018

(65) Prior Publication Data

US 2020/0052216 A1 Feb. 13, 2020

(30) Foreign Application Priority Data

Oct. 5, 2016 (EP) .................................... 16192351
Oct. 5, 2016 (EP) .................................... 16192352
(Continued)

(51) Int. Cl.
*H01L 51/00* (2006.01)
*C08G 61/12* (2006.01)
(Continued)

(52) U.S. Cl.
CPC ........ *H01L 51/0036* (2013.01); *C08G 61/126* (2013.01); *C09D 165/00* (2013.01);
(Continued)

(58) Field of Classification Search
CPC ................ C08G 61/123; C08G 61/126; C08G 2261/12; C08G 2261/1412;
(Continued)

(56) References Cited

U.S. PATENT DOCUMENTS 10,053,542 B2 8/2018 Mitchell et al.
2011/0114184 A1* 5/2011 Brown ................. C07F 7/0816 136/263

(Continued)

FOREIGN PATENT DOCUMENTS

CN 104557968 4/2015
CN 105315298 2/2016
(Continued)

OTHER PUBLICATIONS

International Search Report US20170833742 dated Jan. 2, 2018 (pp. 1-3).

(Continued)

*Primary Examiner* — Shane Fang
(74) *Attorney, Agent, or Firm* — WPAT, PC

(57) ABSTRACT

The invention relates to an organic photodetector (OPD) comprising a photoactive layer that contains an electron acceptor and an electron donor, the acceptor being an n-type semiconductor which is a small molecule that does not contain a fullerene moiety, and the electron donor being a p-type semiconductor which is a conjugated copolymer comprising donor and acceptor units.

35 Claims, 3 Drawing Sheets

(30) Foreign Application Priority Data

| | | |
|---|---|---|
| Oct. 31, 2016 | (EP) | 16196564 |
| Nov. 23, 2016 | (EP) | 16200289 |
| Dec. 6, 2016 | (EP) | 16202329 |
| Feb. 1, 2017 | (EP) | 17154205 |
| Jun. 12, 2017 | (EP) | 17175533 |

(51) Int. Cl.
*C09D 165/00* (2006.01)
*H01L 51/42* (2006.01)

(52) U.S. Cl.
CPC ...... *H01L 51/0043* (2013.01); *H01L 51/4253* (2013.01); *C08G 2261/122* (2013.01); *C08G 2261/124* (2013.01); *C08G 2261/146* (2013.01); *C08G 2261/3223* (2013.01); *C08G 2261/3229* (2013.01); *C08G 2261/3241* (2013.01); *C08G 2261/3243* (2013.01); *C08G 2261/3246* (2013.01); *C08G 2261/3247* (2013.01); *C08G 2261/344* (2013.01); *C08G 2261/364* (2013.01); *C08G 2261/91* (2013.01); *C08G 2261/94* (2013.01)

(58) Field of Classification Search
CPC ...... C08G 2261/1424; C08G 2261/148; C08G 2261/1644; C08G 2261/1646; C08G 2261/3223; C08G 2261/3243; C08G 2261/3246; C08G 2261/126; C08G 2261/124; C08G 2261/95; C08G 2261/91; C08G 2261/344; C08G 2261/364; C08G 2261/414; H01L 51/0043; H01L 51/0036; H01L 51/4253; C07D 417/14; C08L 2205/02; Y02E 10/549
See application file for complete search history.

(56) References Cited

U.S. PATENT DOCUMENTS

| | | | | |
|---|---|---|---|---|
| 2016/0141534 A1 | 5/2016 | Navarro et al. | | |
| 2016/0155946 A1* | 6/2016 | Blouin | H01B 1/127 | 252/511 |

FOREIGN PATENT DOCUMENTS

| | | | |
|---|---|---|---|
| TW | 201625710 A | 7/2016 |
| WO | 14029453 A1 | 2/2014 |
| WO | 15004393 A1 | 1/2015 |
| WO | WO2016041615 | 3/2016 |

OTHER PUBLICATIONS

Chen-Hao Wu et al: "Influence of Molecular Geometry of Perylene Diimide Dimers and Polymers on Bulk Heterojunction Morphology Toward High-Performance Nonfullerene Polymer Solar Cells", Advanced Functional Materials, vol. 25, No. 33, Jul. 24, 2015 (Jul. 24, 2015), DE, pp. 5326-5332, XP055421209, ISSN: 1616-301X.

Li Cheng et al: "A systematical investigation of non-fullerene solar cells based on diketopyrrolopyrrole polymers as electron donor", Organic Electronics, Elsevier, Amsterdam, NL, vol. 35, May 20, 2016 (May 20, 2016), pp. 112-117, XP029563890, ISSN: 1566-1199.

Hui Huang et al: "Alkoxy-Functionalized Thienyl-Vinylene Polymers for Field-Effect Transistors and All-Polymer Solar Cells", Advanced Functional Materials, WILEY—V C H VERLAG GMBH & CO. KGAA, DE, vol. 24, No. 19, May 21, 2014 (May 21, 2014), pp. 2782-2793, XP001590115, ISSN: 1616-301X.

J. Miao et al. Adv. Opt. Mater., Aug. 2016, p. 1-7.

Japan Patent Office, "Office action", dated Jun. 29, 2021.

Taiwan Patent Office "Office Action" dated Aug. 30, 2021, Taiwan.

* cited by examiner

ORGANIC PHOTODETECTOR

TECHNICAL FIELD

The invention relates to an organic photodetector (OPD) comprising a photoactive layer that contains an electron acceptor and an electron donor, the acceptor being an n-type semiconductor which is a small molecule that does not contain a fullerene moiety, and the electron donor being a p-type semiconductor which is a conjugated copolymer comprising donor and acceptor units.

BACKGROUND

In recent years, there has been development of organic semiconducting (OSC) materials in order to produce more versatile, lower cost electronic devices. Such materials find application in a wide range of devices or apparatus, including organic field effect transistors (OFETs), organic light emitting diodes (OLEDs), perovskite-based solar cell (PSC) devices, organic photodetectors (OPDs), organic photovoltaic (OPV) cells, sensors, memory elements and logic circuits to name just a few. The organic semiconducting materials are typically present in the electronic device in the form of a thin layer, for example of between 50 and 300 nm thickness.

One particular area of importance is that of organic photodetectors (OPDs), for which conjugated light-absorbing polymers offer the hope of allowing efficient devices to be produced by solution-processing technologies, such as spin casting, dip coating or ink jet printing, to name a few only.

The photosensitive (or photoactive) layer in an OPD device is usually composed of at least two materials, an n-type semiconductor, which is typically a fullerene or substituted fullerene, graphene, a metal oxide, or quantum dots, and a p-type semiconductor, which is typically a conjugated polymer, an oligomer or a defined molecular unit.

The p-type semiconductor acts as a photon absorber, forming an exciton. This exciton migrates onto the interface between the p-type semiconductor and the n-type semiconductor where it dissociates. Since the LUMO of the n-type semiconductor is deeper than that of the p-type semiconductor, the n-type semiconductor will accept the electron while the hole will remain at the p-type semiconductor. After separation, the holes and electrons are transmitted to the corresponding electrodes.

The n-type OSC commonly used in an OPD is based on a fullerene, such as PCBM[C60] or PCBM[C70]. However, one problem is that fullerenes often have limited solubility and show crystallisation or aggregation in the photoactive layer, leading to thermal instability of the OPD. Also, they do not always show optimum HOMO-LUMO energy levels.

It was an aim of the present invention to provide new OPDs, which can overcome the drawbacks of the OPDs from prior art, and which provide one or more of the above-mentioned advantageous properties, especially related to thermal stability, optimization of energy levels and crystallinity.

Another aim of the invention was to extend the pool of OPDs available to the expert. Other aims of the present invention are immediately evident to the expert from the following detailed description.

The inventors of the present invention have found that one or more of the above aims can be achieved by providing an OPD as disclosed and claimed hereinafter, which contains as electron acceptor an n-type OSC small molecule that is not a fullerene, and as electron donor a p-type conjugated OSC copolymer that comprises donor and acceptor units, preferably in random sequence.

It was surprisingly found that the use of alternative n-type OSCs as disclosed hereinafter helps to solve the above problems. These n-type OSC small molecules have suitable HOMO-LUMO energy levels and a low bandgap, preferably 1.5 eV or less, which can be further optimized by the addition of suitable electron withdrawing or electron donating moieties. Furthermore, the solubility and crystallinity of the non-fullerene small molecule can be modified by the addition of solubilising chains, which enables an improved solubility and helps to suppress or prevent undesired crystallisation in the device. Further advantages will be discussed below.

J. Miao, F. Zhang, Y. Lin, W. Wang, M. Gao, L. Li, J. Zhang and X. Zhan, Adv. Opt. Mater. 2016, discloses an OPD comprising in its photoactive layer poly(3-hexylthiophene) (P3HT) as donor and the non-fullerene small molecule 3,9-bis(2-methylene-(3-(1,1-dicyanomethylene)-indanone)-5,5,11,11-tetrakis(4-hexylphenyl)-dithieno[2,3-d:2',3'-d']-s-indaceno[1,2-b:5,6-b']dithiophene (ITIC) as acceptor. However, it does not disclose or suggest an OPD as disclosed and claimed hereinafter.

SUMMARY

The invention relates to an organic photodetector (OPD) comprising a photoactive layer that contains an n-type organic semiconducting (OSC) compound, which is preferably a small molecule, and a p-type OSC compound, characterized in that the n-type OSC compound does not contain a fullerene moiety, and the p-type OSC compound is a conjugated copolymer comprising donor and acceptor units, which are preferably distributed in random sequence along the polymer backbone.

Preferably the n-type and the p-type OSC compound in the photoactive layer form a bulk heterojunction (BHJ).

The invention further relates to the use of the OPD as described above and below for the detection of NIR light.

The invention further relates to the use of an OPD as described above and below in a sensor device.

The invention further relates to a sensor device which comprises an OPD as described above and below.

The sensor device is for example a biosensor, or a detector or detector array for vein pattern recognition.

The invention further relates to the use of the OPD or sensor as described above and below for applications including but not limited to biometrics, e.g. the recognition or imaging of finger geometrics or vein patterns.

TERMS AND DEFINITIONS

Figure 1:
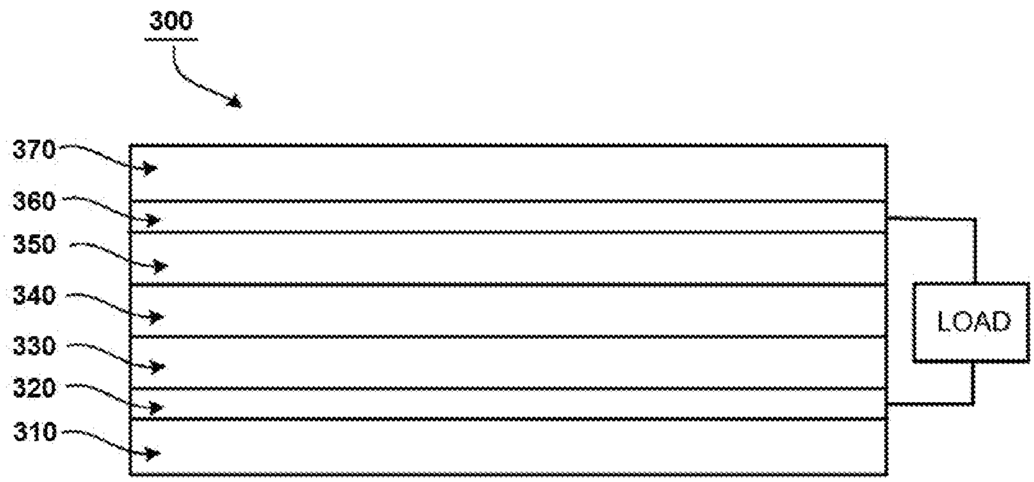
FIG. 1 is a schematic cross-sectional view of an exemplary organic photodetector according to the present invention.

As used herein, the term "near infrared", which may be abbreviated as "NIR", is used to denote radiation with a wavelength of from 0.7 m to 3.0 μm, unless otherwise indicated.

As used herein, the term "polymer" will be understood to mean a molecule of high relative molecular mass, the structure of which essentially comprises multiple repetitions of units derived, actually or conceptually, from molecules of low relative molecular mass (*Pure Appl. Chem.,* 1996, 68, 2291). The term "oligomer" will be understood to mean a molecule of intermediate relative molecular mass, the structure of which essentially comprises a small plurality of units derived, actually or conceptually, from molecules of lower relative molecular mass (*Pure Appl. Chem.,* 1996, 68, 2291). In a preferred meaning as used herein present invention a polymer will be understood to mean a compound having >1, i.e. at least 2 repeat units, preferably ≥5, very preferably ≥10, repeat units, and an oligomer will be understood to mean a compound with >1 and <10, preferably <5, repeat units.

Further, as used herein, the term "polymer" will be understood to mean a molecule that encompasses a backbone (also referred to as "main chain") of one or more distinct types of repeat units (the smallest constitutional unit of the molecule) and is inclusive of the commonly known terms "oligomer", "copolymer", "homopolymer", "random polymer" and the like. Further, it will be understood that the term polymer is inclusive of, in addition to the polymer itself, residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

As used herein, in a formula showing a polymer or a repeat unit, an asterisk (*) will be understood to mean a chemical linkage to an adjacent unit or to a terminal group in the polymer backbone. In a ring, like for example a benzene or thiophene ring, an asterisk (*) will be understood to mean a C atom that is fused to an adjacent ring.

As used herein, the terms "repeat unit", "repeating unit" and "monomeric unit" are used interchangeably and will be understood to mean the constitutional repeating unit (CRU), which is the smallest constitutional unit the repetition of which constitutes a regular macromolecule, a regular oligomer molecule, a regular block or a regular chain (*Pure Appl. Chem.,* 1996, 68, 2291). As further used herein, the term "unit" will be understood to mean a structural unit which can be a repeating unit on its own, or can together with other units form a constitutional repeating unit.

As used herein, the expression "copolymer formed from donor and acceptor that are distributed in random sequence along the polymer backbone", hereinafter also abbreviated as "random copolymer" or "statistical copolymer" will be understood to mean a copolymer comprising two or more repeat units, herein a donor and an acceptor unit, which are chemically distinct, i.e. which are not isomers of each other, and which are distributed in irregular sequence, i.e. random sequence or statistical sequence or statistical block sequence, along the polymer backbone.

Such a random copolymer can for example be prepared by the use of two, three or more distinct monomers as exemplarily shown in the polymerisation reaction schemes R1-R3 below. Therein, A, B and C represent structural units and $X^1$ and $X^2$ represent reactive groups of the monomers. The reactive groups $X^{1,2}$ are selected such that $X^1$ can only react with $X^2$ but not with another group $X^1$, and $X^2$ can only react with $X^1$ but not with another group $X^2$. The polymer backbones shown on the right side as reaction product are only exemplarily chosen to illustrate a random sequence, other random sequences are also possible.

Scheme R1

$X^1$-A-$X^1$+$X^1$-B-$X^1$+$X^2$-C-$X^2$→-AC-BC-AC-AC-BC-BC-AC-BC-BC-BC-BC-

In Scheme R1, due to the choice of reactive groups $X^1$ and $X^2$, the units A, B and C form diads "AC" and "BC" which are distributed in random sequence. The polymer backbone formed by the reaction as illustrated in scheme R1 is represented by the following formula $$*\text{-}[(AC)_x\text{-}(BC)_y]_n\text{-}*$$

wherein x is the molar ratio of diads AC, y is the molar ratio of diads BC, and n is the total number of diads AC and BC.

Scheme R2

$X^1$-A-$X^2$+$X^1$-B-$X^2$+$X^1$-C-$X^2$→-A-B-B-C-A-A-C-B-B-C-C-B-A-A-B-C-

In Scheme R2 the units A, B and C are distributed in random sequence. The polymer backbone formed by the reaction as illustrated in scheme R2 is represented by the following formula $$*\text{-}[(A)_x\text{-}(B)_y\text{-}(C)z]_n\text{-}*$$

wherein x is the molar ratio of units A, y is the molar ratio of units B, z is the molar ratio of units B, and n is the total number of units A, B and C.

Scheme R3

$X^1$-A-$X^2$+$X^1$-B-$X^2$→-B-A-A-A-B-B-A-B-B-B-A-A-B-A-

In Scheme R3 the units A and B are distributed in random sequence. The polymer backbone formed by the reaction as illustrated in scheme R3 is represented by the following formula $$*\text{-}[(A)_x\text{-}(B)_y]_n\text{-}*$$

wherein x is the molar ratio of units A, y is the molar ratio of units B, and n is the total number of units A and B.

As used herein, the term "alternating copolymer" will be understood to mean a polymer which is not a random or statistical copolymer, and wherein two or repeat units which are chemically distinct, are arranged in alternating sequence along the polymer backbone.

An alternating copolymer can for example be prepared by the use of two, three or more distinct monomers as exemplarily shown in the polymerisation reaction schemes A1 and A2 below, wherein A, B, C, $X^1$ and $X^2$ have the meanings given above. The polymer backbones shown on the right side as reaction product are only exemplarily chosen to illustrate an alternating sequence, longer or shorter sequences are also possible.

Scheme A1

$X^1$-A-$X^1$+$X^2$-B-$X^2$→-A-B-A-B-A-B-A-B-

In Scheme A1 the units A and B are arranged in alternating sequence. The polymer backbone formed by the reaction as illustrated in scheme A1 is represented by the following formula $$*\text{-}[A\text{-}B]_n\text{-}*$$

wherein n is the total number of units A and B.

Scheme A2

$X^1$-A-B-C-$X^2$→-A-B-C-A-B-C-A-B-C-A-B-C-

In Scheme A2 the units A, B and C are arranged in alternating sequence. The polymer backbone formed by the reaction as illustrated in scheme A2 is represented by the following formula $$*\text{-}[A\text{-}B\text{-}C]_n\text{-}*$$

wherein n is the total number of units A, B and C in the polymer backbone.

From scheme A it can be seen that an alternating copolymer formed from three or more different structural units A, B and C typically requires the use of more complex monomers where two or more of these structural units are combined.

As used herein, the expressions "copolymer formed from donor and acceptor that are distributed in random sequence along the polymer backbone", "random copolymer" and "statistical copolymer" are understood not to include copolymers which are alternating but non-regioregular, for example wherein donor units and/or acceptor units that are chemically identical but of asymmetric nature are arranged along the polymer backbone in alternating but non-regioregular manner, like for example the following polymers wherein n, x and y are as defined in formula Pi below.

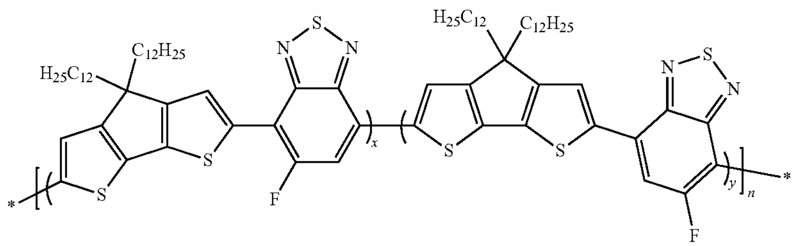

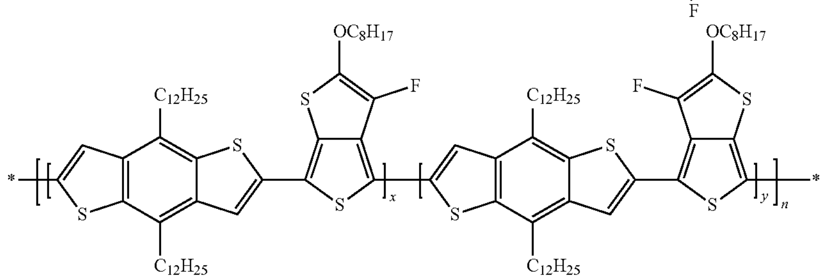

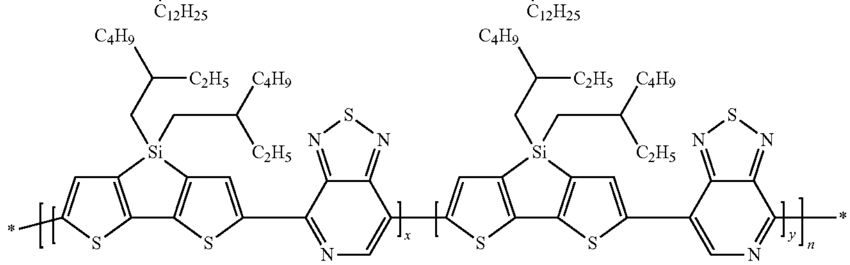

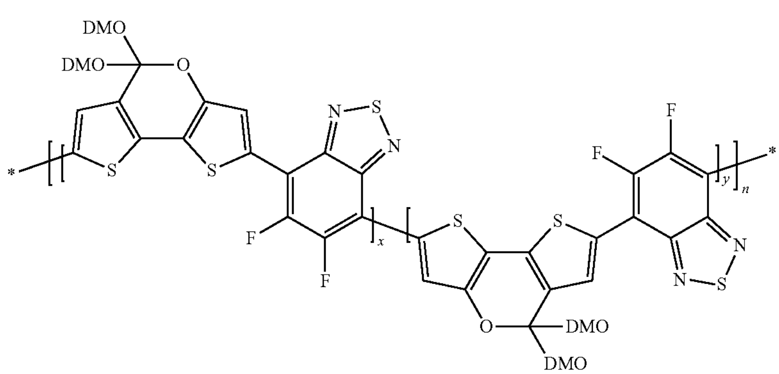

where DMO =

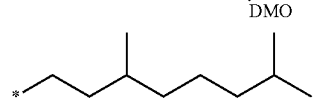

As used herein, a "terminal group" will be understood to mean a group that terminates a polymer backbone. The expression "in terminal position in the backbone" will be understood to mean a divalent unit or repeat unit that is linked at one side to such a terminal group and at the other side to another repeat unit. Such terminal groups include endcap groups, or reactive groups that are attached to a monomer forming the polymer backbone which did not participate in the polymerisation reaction, like for example a group having the meaning of $R^{22}$ or $R^{23}$ as defined below.

As used herein, the term "endcap group" will be understood to mean a group that is attached to, or replacing, a terminal group of the polymer backbone. The endcap group can be introduced into the polymer by an endcapping process. Endcapping can be carried out for example by reacting the terminal groups of the polymer backbone with a monofunctional compound ("endcapper") like for example an alkyl- or arylhalide, an alkyl- or arylstannane or an alkyl- or arylboronate. The endcapper can be added for example after the polymerisation reaction. Alternatively the endcapper can be added in situ to the reaction mixture before or during the polymerisation reaction. In situ addition of an endcapper can also be used to terminate the polymerisation reaction and thus control the molecular weight of the forming polymer. Typical endcap groups are for example H, phenyl and lower alkyl.

As used herein, the term "small molecule" will be understood to mean a monomeric compound which typically does not contain a reactive group by which it can be reacted to form a polymer, and which is designated to be used in monomeric form. In contrast thereto, the term "monomer" unless stated otherwise will be understood to mean a monomeric compound that carries one or more reactive functional groups by which it can be reacted to form a polymer.

As used herein, the terms "donor" or "donating", unless stated otherwise, will be understood to mean an electron donor, and will be understood to mean a chemical entity that donates electrons to another compound or another group of atoms of a compound. See also International Union of Pure and Applied Chemistry, Compendium of Chemical Technology, Gold Book, Version 2.3.2, 19. August 2012, pages 477 and 480.

As used herein, the terms "acceptor" or "accepting" will be understood to mean an electron acceptor. The terms "electron acceptor", "electron accepting" and "electron withdrawing" will be used interchangeably and will be understood to mean a chemical entity that accepts electrons transferred to it from another compound or another group of atoms of a compound. See also International Union of Pure and Applied Chemistry, Compendium of Chemical Technology, Gold Book, Version 2.3.2, 19. August 2012, pages 477 and 480.

As used herein, the term "n-type" or "n-type semiconductor" will be understood to mean an extrinsic semiconductor in which the conduction electron density is in excess of the mobile hole density, and the term "p-type" or "p-type semiconductor" will be understood to mean an extrinsic semiconductor in which mobile hole density is in excess of the conduction electron density (see also, J. Thewlis, *Concise Dictionary of Physics*, Pergamon Press, Oxford, 1973).

As used herein, the term "leaving group" will be understood to mean an atom or group (which may be charged or uncharged) that becomes detached from an atom in what is considered to be the residual or main part of the molecule taking part in a specified reaction (see also *Pure Appl. Chem.,* 1994, 66, 1134).

As used herein, the term "conjugated" will be understood to mean a compound (for example a polymer) that contains mainly C atoms with $sp^2$-hybridisation (or optionally also sp-hybridisation), and wherein these C atoms may also be replaced by hetero atoms. In the simplest case this is for example a compound with alternating C—C single and double (or triple) bonds, but is also inclusive of compounds with aromatic units like for example 1,4-phenylene. The term "mainly" in this connection will be understood to mean that a compound with naturally (spontaneously) occurring defects, or with defects included by design, which may lead to interruption of the conjugation, is still regarded as a conjugated compound.

As used herein, unless stated otherwise the molecular weight is given as the number average molecular weight $M_n$ or weight average molecular weight $M_w$, which is determined by gel permeation chromatography (GPC) against polystyrene standards in eluent solvents such as tetrahydrofuran, trichloromethane (TCM, chloroform), chlorobenzene or 1,2,4-trichloro-benzene. Unless stated otherwise, chlorobenzene is used as solvent. The degree of polymerization, also referred to as total number of repeat units, n, will be understood to mean the number average degree of polymerization given as $n=M_n/M_U$, wherein $M_n$ is the number average molecular weight and $M_U$ is the molecular weight of the single repeat unit, see J. M. G. Cowie, *Polymers: Chemistry & Physics of Modern Materials*, Blackie, Glasgow, 1991.

As used herein, the term "carbyl group" will be understood to mean any monovalent or multivalent organic moiety which comprises at least one carbon atom either without any non-carbon atoms (like for example —C≡C—), or optionally combined with at least one non-carbon atom such as B, N, O, S, P, Si, Se, Sn, As, Te or Ge (for example carbonyl etc.).

As used herein, the term "hydrocarbyl group" will be understood to mean a carbyl group that does additionally contain one or more H atoms and optionally contains one or more hetero atoms like for example B, N, O, S, P, Si, Se, As, Te or Ge.

As used herein, the term "hetero atom" will be understood to mean an atom in an organic compound that is not a H- or C-atom, and preferably will be understood to mean B, N, O, S, P, Si, Se, As, Te or Ge.

A carbyl or hydrocarbyl group comprising a chain of 3 or more C atoms may be straight-chain, branched and/or cyclic, and may include spiro-connected and/or fused rings.

Preferred carbyl and hydrocarbyl groups include alkyl, alkoxy, thioalkyl, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms, wherein all these groups do optionally contain one or more hetero atoms, preferably selected from B, N, O, S, P, Si, Se, As, Te and Ge.

Further preferred carbyl and hydrocarbyl group include for example: a $C_1$-$C_{40}$ alkyl group, a $C_1$-$C_{40}$ fluoroalkyl group, a $C_1$-$C_{40}$ alkoxy or oxyalkyl group, a $C_2$-$C_{40}$ alkenyl group, a $C_2$-$C_{40}$ alkynyl group, a $C_3$-$C_{40}$ allyl group, a $C_4$-$C_{40}$ alkylidenyl group, a $C_4$-$C_{40}$ polyenyl group, a $C_2$-$C_{40}$ ketone group, a $C_2$-$C_{40}$ ester group, a $C_6$-$C_{18}$ aryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_1$-$C_{20}$ fluoroalkyl group, a $C_2$-$C_{20}$ alkenyl group, a $C_2$-$C_{20}$ alkynyl group, a $C_3$-$C_{20}$ allyl group, a $C_4$-$C_{20}$ alkylidenyl group, a $C_2$-$C_{20}$ ketone group, a $C_2$-$C_{20}$ ester group, a $C_6$-$C_{12}$ aryl group, and a $C_4$-$C_{20}$ polyenyl group, respectively.

Also included are combinations of groups having carbon atoms and groups having hetero atoms, like e.g. an alkynyl group, preferably ethynyl, that is substituted with a silyl group, preferably a trialkylsilyl group. The carbyl or hydrocarbyl group may be an acyclic group or a cyclic group. Where the carbyl or hydrocarbyl group is an acyclic group, it may be straight-chain or branched. Where the carbyl or hydrocarbyl group is a cyclic group, it may be a non-aromatic carbocyclic or heterocyclic group, or an aryl or heteroaryl group.

A non-aromatic carbocyclic group as referred to above and below is saturated or unsaturated and preferably has 4 to 30 ring C atoms. A non-aromatic heterocyclic group as referred to above and below preferably has 4 to 30 ring C atoms, wherein one or more of the C ring atoms are optionally replaced by a hetero atom, preferably selected from N, O, P, S, Si and Se, or by a —S(O)— or —$S(O)_2$— group. The non-aromatic carbo- and heterocyclic groups are mono- or polycyclic, may also contain fused rings, preferably contain 1, 2, 3 or 4 fused or unfused rings, and are optionally substituted with one or more groups L, wherein L is selected from F, Cl, —CN, —NC, —NCO, —NCS, —OCN, —SCN, —$R^0$, —$OR^0$, —$SR^0$, —C(═O)$X^0$, —C(═O)$R^0$, —C(═O)—$OR^0$, —O—C(═O)—$R^0$, —$NH_2$, —$NHR^0$, —$NR^0R^{00}$, —C(═O)$NHR^0$, —C(═O)$NR^0R^{00}$, —$SO_3R^0$, —$SO_2R$, —OH, —$NO_2$, —$CF_3$, —$SF_5$, or optionally substituted silyl, or carbyl or hydrocarbyl with 1 to 30, preferably 1 to 20 C atoms that is optionally substituted and optionally comprises one or more hetero atoms, wherein $X^0$ is halogen, preferably F or Cl, and $R^0$, $R^{00}$ denote H or straight-chain or branched alkyl with 1 to 20, preferably 1 to 12 C atoms that is optionally fluorinated.

Preferably L is selected from F, —CN, $R^0$, —$OR^0$, —$SR^0$, —C(═O)—$R^0$, —C(═O)—$OR^0$, —O—C(═O)—$R^0$, —O—C(═O)—$OR^0$, —C(═O)—$NHR^0$ and —C(═O)—$NR^0R^{00}$.

Further preferably L is selected from F or alkyl, alkoxy, oxyalkyl, thioalkyl, fluoroalkyl, fluoroalkoxy, alkylcarbonyl, alkoxycarbonyl, with 1 to 12 C atoms, or alkenyl or alkynyl with 2 to 12 C atoms.

Preferred non-aromatic carbocyclic or heterocyclic groups are tetrahydrofuran, indane, pyran, pyrrolidine, piperidine, cyclopentane, cyclohexane, cycloheptane, cyclopentanone, cyclohexanone, dihydro-furan-2-one, tetrahydro-pyran-2-one and oxepan-2-one.

An aryl group as referred to above and below preferably has 4 to 30 ring C atoms, is mono- or polycyclic and may also contain fused rings, preferably contains 1, 2, 3 or 4 fused or unfused rings, and is optionally substituted with one or more groups L as defined above.

A heteroaryl group as referred to above and below preferably has 4 to 30 ring C atoms, wherein one or more of the C ring atoms are replaced by a hetero atom, preferably selected from N, O, S, Si and Se, is mono- or polycyclic and may also contain fused rings, preferably contains 1, 2, 3 or 4 fused or unfused rings, and is optionally substituted with one or more groups L as defined above.

An arylalkyl or heteroarylalkyl group as referred to above and below preferably denotes —$(CH_2)_a$-aryl or —$(CH_2)_a$-heteroaryl, wherein a is an integer from 1 to 6, preferably 1, and "aryl" and "heteroaryl" have the meanings given above and below. A preferred arylalkyl group is benzyl which is optionally substituted by L.

As used herein, "arylene" will be understood to mean a divalent aryl group, and "heteroarylene" will be understood to mean a divalent heteroaryl group, including all preferred meanings of aryl and heteroaryl as given above and below.

Preferred aryl and heteroaryl groups are phenyl in which, in addition, one or more CH groups may be replaced by N, naphthalene, thiophene, selenophene, thienothiophene, dithienothiophene, fluorene and oxazole, all of which can be unsubstituted, mono- or polysubstituted with L as defined above. Very preferred aryl and heteroaryl groups are selected from pyrrole, preferably N-pyrrole, furan, pyridine, preferably 2- or 3-pyridine, pyrimidine, pyridazine, pyrazine, triazole, tetrazole, pyrazole, imidazole, isothiazole, thiazole, thiadiazole, isoxazole, oxazole, oxadiazole, thiophene, preferably 2-thiophene, selenophene, preferably 2-selenophene, 2,5-dithiophene-2',5'-diyl, thieno[3,2-b]thiophene, thieno[2,3-b]thiophene, furo[3,2-b]furan, furo[2,3-b]furan, seleno[3,2-b]selenophene, seleno[2,3-b]selenophene, thieno[3,2-b]selenophene, thieno[3,2-b]furan, indole, isoindole, benzo[b]furan, benzo[b]thiophene, benzo[1,2-b;4,5-b']dithiophene, benzo[2,1-b;3,4-b']dithiophene, quinole, 2-methylquinole, isoquinole, quinoxaline, quinazoline, benzotriazole, benzimidazole, benzothiazole, benzisothiazole, benzisoxazole, benzoxadiazole, benzoxazole, benzothiadiazole, 4H-cyclopenta[2,1-b;3,4-b']dithiophene, 7H-3,4-dithia-7-sila-cyclopenta[a]pentalene, all of which can be unsubstituted, mono- or polysubstituted with L as defined above. Further examples of aryl and heteroaryl groups are those selected from the groups shown hereinafter.

An alkyl group or an alkoxy group, i.e., where the terminal $CH_2$ group is replaced by —O—, can be straight-chain or branched. Particularly preferred straight chains have 2, 3, 4, 5, 6, 7, 8, 12 or 16 carbon atoms and accordingly denote preferably ethyl, propyl, butyl, pentyl, hexyl, heptyl, octyl, dodecyl or hexadecyl, ethoxy, propoxy, butoxy, pentoxy, hexoxy, heptoxy, octoxy, dodecoxy or hexadecoxy, furthermore methyl, nonyl, decyl, undecyl, tridecyl, tetradecyl, pentadecyl, nonoxy, decoxy, undecoxy, tridecoxy or tetradecoxy, for example.

An alkenyl group, i.e., wherein one or more $CH_2$ groups are replaced by —CH═CH— can be straight-chain or branched. It is preferably straight-chain, has 2 to 10 C atoms and accordingly is preferably vinyl, prop-1-, or prop-2-enyl, but-1-, 2- or but-3-enyl, pent-1-, 2-, 3- or pent-4-enyl, hex-1-, 2-, 3-, 4- or hex-5-enyl, hept-1-, 2-, 3-, 4-, 5- or hept-6-enyl, oct-1-, 2-, 3-, 4-, 5-, 6- or oct-7-enyl, non-1-, 2-, 3-, 4-, 5-, 6-, 7- or non-8-enyl, dec-1-, 2-, 3-, 4-, 5-, 6-, 7-, 8- or dec-9-enyl.

Especially preferred alkenyl groups are $C_2$-$C_7$-1E-alkenyl, $C_4$-$C_7$-3E-alkenyl, $C_5$-$C_7$-4-alkenyl, $C_6$-$C_7$-5-alkenyl and $C_7$-6-alkenyl, in particular $C_2$-$C_7$-1E-alkenyl, $C_4$-$C_7$-3E-alkenyl and $C_5$-$C_7$-4-alkenyl. Examples for particularly preferred alkenyl groups are vinyl, 1E-propenyl, 1E-butenyl, 1E-pentenyl, 1E-hexenyl, 1E-heptenyl, 3-butenyl, 3E-pentenyl, 3E-hexenyl, 3E-heptenyl, 4-pentenyl, 4Z-hexenyl, 4E-hexenyl, 4Z-heptenyl, 5-hexenyl, 6-heptenyl and the like. Groups having up to 5 C atoms are generally preferred.

An oxaalkyl group, i.e., where one $CH_2$ group is replaced by —O—, can be straight-chain. Particularly preferred straight-chains are 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

In an alkyl group wherein one $CH_2$ group is replaced by —O— and one $CH_2$ group is replaced by —C(O)—, these radicals are preferably neighboured. Accordingly these radicals together form a carbonyloxy group —C(O)—O— or an oxycarbonyl group —O—C(O)—. Preferably this group is straight-chain and has 2 to 6 C atoms. It is accordingly preferably acetyloxy, propionyloxy, butyryloxy, pentanoyloxy, hexanoyloxy, acetyloxymethyl, propionyloxymethyl, butyryloxymethyl, pentanoyloxymethyl, 2-acetyloxyethyl, 2-propionyloxyethyl, 2-butyryloxyethyl, 3-acetyloxypropyl, 3-propionyloxypropyl, 4-acetyloxybutyl, methoxycarbonyl, ethoxycarbonyl, propoxycarbonyl, butoxycarbonyl, pentoxycarbonyl, methoxycarbonylmethyl, ethoxycarbonylmethyl, propoxycarbonylmethyl, butoxycarbonylmethyl, 2-(methoxycarbonyl)ethyl, 2-(ethoxycarbonyl)ethyl, 2-(propoxycarbonyl)ethyl, 3-(methoxycarbonyl)propyl, 3-(ethoxycarbonyl)propyl, 4-(methoxycarbonyl)-butyl.

An alkyl group wherein two or more $CH_2$ groups are replaced by —O— and/or —C(O)O— can be straight-chain or branched. It is preferably straight-chain and has 3 to 12 C atoms. Accordingly, it is preferably bis-carboxy-methyl, 2,2-bis-carboxy-ethyl, 3,3-bis-carboxy-propyl, 4,4-bis-carboxy-butyl, 5,5-bis-carboxy-pentyl, 6,6-bis-carboxy-hexyl, 7,7-bis-carboxy-heptyl, 8,8-bis-carboxy-octyl, 9,9-bis-carboxy-nonyl, 10,10-bis-carboxy-decyl, bis-(methoxycarbonyl)-methyl, 2,2-bis-(methoxycarbonyl)-ethyl, 3,3-bis-(methoxycarbonyl)-propyl, 4,4-bis-(methoxycarbonyl)-butyl, 5,5-bis-(methoxycarbonyl)-pentyl, 6,6-bis-(methoxycarbonyl)-hexyl, 7,7-bis-(methoxycarbonyl)-heptyl, 8,8-bis-(methoxycarbonyl)-octyl, bis-(ethoxycarbonyl)-methyl, 2,2-bis-(ethoxycarbonyl)-ethyl, 3,3-bis-(ethoxycarbonyl)-propyl, 4,4-bis-(ethoxycarbonyl)-butyl, 5,5-bis-(ethoxycarbonyl)-hexyl.

A thioalkyl group, i.e., where one $CH_2$ group is replaced by —S—, is preferably straight-chain thiomethyl (—$SCH_3$), 1-thioethyl (—$SCH_2CH_3$), 1-thiopropyl (=—$SCH_2CH_2CH_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the $CH_2$ group adjacent to the $sp^2$ hybridised vinyl carbon atom is replaced.

A fluoroalkyl group can either be perfluoroalkyl $C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $CO_8F_{17}$, very preferably $C_6F_{13}$, or partially fluorinated alkyl, preferably with 1 to 15 C atoms, in particular 1,1-difluoroalkyl, all of the aforementioned being straight-chain or branched.

Preferably "fluoroalkyl" means a partially fluorinated (i.e. not perfluorinated) alkyl group.

Alkyl, alkoxy, alkenyl, oxaalkyl, thioalkyl, carbonyl and carbonyloxy groups can be achiral or chiral groups. Particularly preferred chiral groups are 2-butyl (=1-methylpropyl), 2-methylbutyl, 2-methylpentyl, 3-methylpentyl, 2-ethylhexyl, 2-butyloctyl, 2-hexyldecyl, 2-octyldodecyl, 3,7-dimethyloctyl, 3,7,11-trimethyldodecyl, 2-propylpentyl, in particular 2-methylbutyl, 2-methylbutoxy, 2-methylpentoxy, 3-methyl-pentoxy, 2-ethyl-hexoxy, 2-butyloctoxyo, 2-hexyldecoxy, 2-octyldodecoxy, 3,7-dimethyloctoxy, 3,7,11-trimethyldodecoxy, 1-methylhexoxy, 2-octyloxy, 2-oxa-3-methylbutyl, 3-oxa-4-methyl-pentyl, 4-methylhexyl, 2-hexyl, 2-octyl, 2-nonyl, 2-decyl, 2-dodecyl, 6-methoxyoctoxy, 6-methyloctoxy, 6-methyloctanoyloxy, 5-methylheptyloxy-carbonyl, 2-methylbutyryloxy, 3-methylvaleroyloxy, 4-methylhexanoyloxy, 2-chloro-propionyloxy, 2-chloro-3-methylbutyryloxy, 2-chloro-4-methyl-valeryloxy, 2-chloro-3-methylvaleryloxy, 2-methyl-3-oxapentyl, 2-methyl-3-oxa-hexyl, 1-methoxypropyl-2-oxy, 1-ethoxypropyl-2-oxy, 1-propoxypropyl-2-oxy, 1-butoxypropyl-2-oxy, 2-fluorooctyloxy, 2-fluorodecyloxy, 1,1,1-trifluoro-2-octyloxy, 1,1,1-trifluoro-2-octyl, 2-fluoromethyloctyloxy for example. Very preferred are 2-methylbutyl, 2-ethylhexyl, 2-butyloctyl, 2-hexyldecyl, 2-octyldodecyl, 3,7-dimethyloctyl, 3,7,11-trimethyldodecyl, 2-hexyl, 2-octyl, 2-octyloxy, 1,1,1-trifluoro-2-hexyl, 1,1,1-trifluoro-2-octyl and 1,1,1-trifluoro-2-octyloxy.

Preferred achiral branched groups are isopropyl, isobutyl (=methylpropyl), isopentyl (=3-methylbutyl), tert. butyl, isopropoxy, 2-methyl-propoxy, 3-methylbutoxy and 3,7-dimethyloctyl.

In a preferred embodiment, substituents on an aryl or heteroaryl ring are independently of each other selected from primary, secondary or tertiary alkyl, alkoxy, oxaalkyl, thioalkyl, alkylcarbonyl or alkoxycarbonyl with 1 to 30 C atoms, wherein one or more H atoms are optionally replaced by F, or aryl, aryloxy, heteroaryl or heteroaryloxy that is optionally alkylated, alkoxylated, alkylthiolated or esterified and has 4 to 30 ring atoms. Further preferred substituents are selected from the group consisting of the following formulae

SUB1

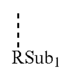

SUB2

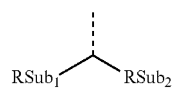

SUB3

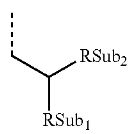

SUB4

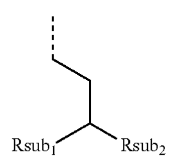

SUB5

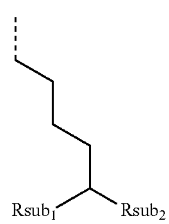

SUB6

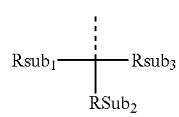

SUB7

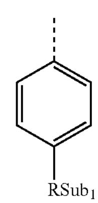

-continued

SUB8

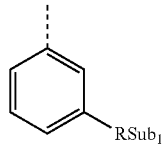

SUB9

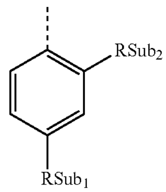

SUB10

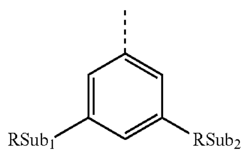

SUB11

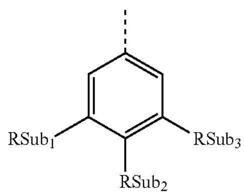

SUB12

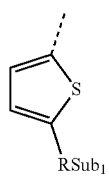

SUB13

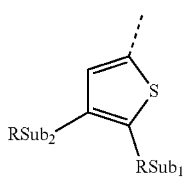

SUB14

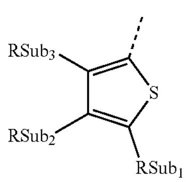

wherein $RSub_{1-3}$ denotes L as defined above and below and where at least one group $RSub_{1-3}$ is alkyl, alkoxy, oxaalkyl, thioalkyl, alkylcarbonyl or alkoxycarbonyl with 1 to 24 C atoms, preferably 1 to 20 C atoms, that is optionally fluorinated, and wherein the dashed line denotes the link to the ring to which these groups are attached. Very preferred among these substituents are those wherein all $RSub_{1-3}$ subgroups are identical.

As used herein, if an aryl(oxy) or heteroaryl(oxy) group is "alkylated or alkoxylated", this means that it is substituted with one or more alkyl or alkoxy groups having from 1 to 24 C-atoms and being straight-chain or branched and wherein one or more H atoms are optionally substituted by an F atom.

Above and below, $Y^1$ and $Y^2$ are independently of each other H, F, Cl or CN.

As used herein, —CO—, —C(=O)— and —C(O)— will be understood to mean a carbonyl group, i.e. a group having the structure

As used herein C=$CR^1R^2$ etc. will be understood to mean a group having the structure

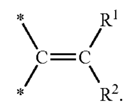

Unless stated otherwise "optionally substituted" without mentioning the substituent means optionally substituted by L.

As used herein, "halogen" includes F, Cl, Br or I, preferably F, Cl or Br. A halogen atom that represents a substituent on a ring or chain is preferably F or Cl, very preferably F. A halogen atom that represents a reactive group in a monomer is preferably Cl, Br or I, very preferably Br or I.

Above and below, "mirror image" means a moiety that is obtainable from another moiety by flipping it vertically or horizontally across an external symmetry plane or a symmetry plane extending through the moiety. For example the moiety

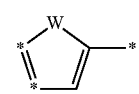

also includes the mirror images

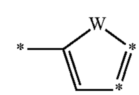 , 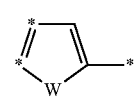 and 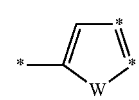 .

DETAILED DESCRIPTION

The OPDs of the present invention show several advantageous properties.

For example, tuning of the energy levels of the non-fullerene small molecule results in a light response originating from the absorption of the non-fullerene small molecule acceptor. This response can be tuned to allow light absorption into the near infrared (NIR) such as light with wavelengths longer than 750 nm.

An OPD device as disclosed hereinafter which absorbs light >800 nm can be used to detect NIR light for applications such as biometrics, e.g. finger geometrics and vein imaging.

Also, the use of a non-fullerene small molecule acceptor helps to avoid crystallisation and thereby improves the OPD device stability.

Moreover it was found that, in comparison to OPD devices of prior art, the use of non-fullerene n-type OSCs as disclosed hereinafter in OPDs allows higher thickness of the photoactive layer up to >300 nm, thereby the dark current can be reduced and the device fabrication yield can be increased.

Also the OPD devices according to the present invention using non-fullerene n-type OSCs have good flatness (photocurrent at negative direction does not change dramatically with voltage) and good EQE at low bias voltage. The use of a low driving bias voltage increases the application capability as low voltage batteries can be utilised, whereas the use of higher driving voltages such as −15 V as disclosed in prior art can decrease the device lifetime.

Furthermore the OPD devices according to the present invention enable the use of non-chlorinated solvents for fabrication which are suitable for industrial application, compared to the chlorinated aromatic solvents like o-dichlorobenzene as used in the prior art, which are less desired inter alia due to environmental reasons.

In the OPD of the present invention, the n-type OSC compound in the photoactive layer preferably has a band-gap of <2 eV, more preferably <1.6 eV, further preferably <1.6 eV, very preferably <1.4 eV, most preferably <1.3 eV.

In the OPD of the present invention, the p-type OSC compound in the photoactive layer preferably has a band-gap of <2.5 eV, very preferably <2.0 eV.

In the OPD according to the present invention, preferably the HOMO of the n-type OSC is >0.3 eV deeper, very preferably >0.4 eV deeper, than the HOMO of the p-type OSC.

The OPD according to the present invention preferably has a photodetector response to wavelengths >700 nm, very preferably >800 nm, characterised by using an external quantum efficiency system.

In the photoactive layer of the OPD according to the present invention, preferably the n-type OSC compound is not a polymer.

Preferably the n-type OSC compound is a monomeric or oligomeric compound, very preferably a small molecule, which does not contain a fullerene moiety.

Preferably the n-type OSC compound which does not contain a fullerene moiety contains a polycyclic electron donating core and attached thereto one or two terminal electron withdrawing groups, and is preferably selected of formula N below

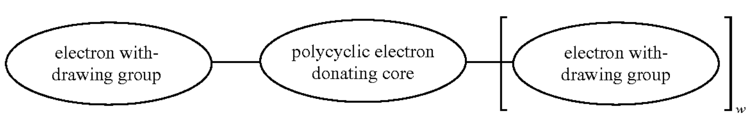

N wherein w is 0 or 1.

More preferably the n-type OSC compound is selected of formula NI

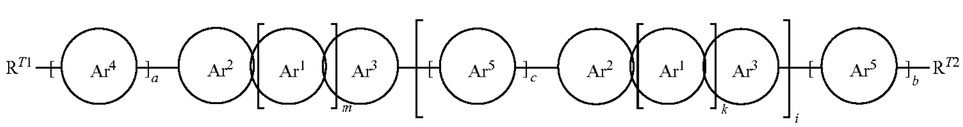

NI wherein the individual radicals, independently of each other and on each occurrence identically or differently, have the following meanings $Ar^1$

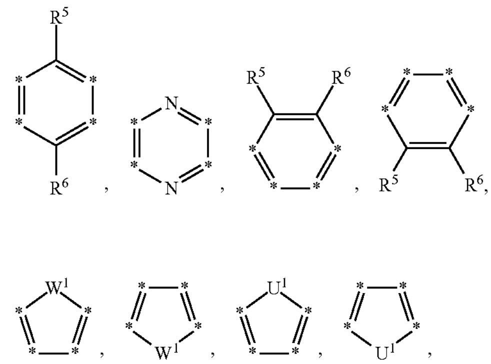

wherein a group

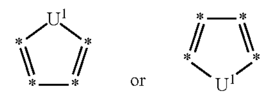

is not adjacent to another group

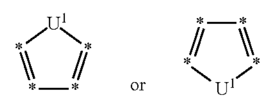

$Ar^2$

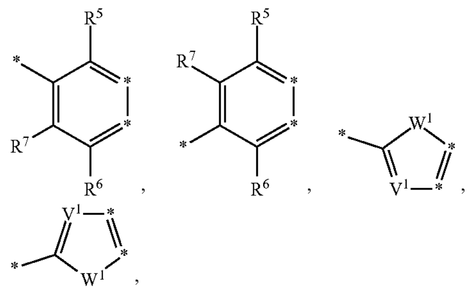

$Ar^3$

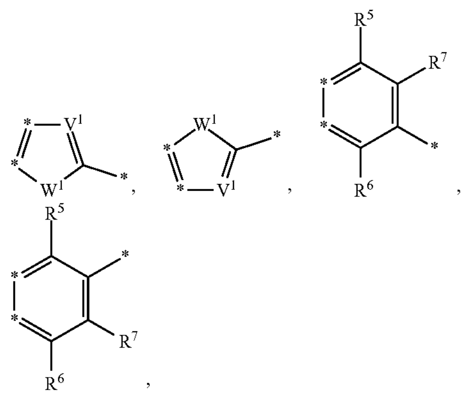

$Ar^{4,5}$ arylene or heteroarylene that has from 5 to 20 ring atoms, is mono- or polycyclic, optionally contains fused rings, and is unsubstituted or substituted by one or more identical or different groups $R^1$ or L, or $CY^1{=}CY^2$ or —C≡C—, $U^1$ $CR^1R^2$, $SiR^1R^2$, $GeR^1R^2$, $NR^1$ or C═O, $V^1$ $CR^3$ or N, $W^1$ S, O, Se or C═O, $R^{1\text{-}7}$ $Z^1$, H, F, Cl, CN, or straight-chain, branched or cyclic alkyl with 1 to 30, preferably 1 to 20, C atoms, in which one or more $CH_2$ groups are optionally replaced by —O—, —S—, —C(═O)—, —C(═S)—, —C(═O)—O—, —O—C(═O)—, $—NR^0—$, $—SiR^0R^{00}—$, $—CF_2—$, $—CR^0{=}CR^{00}—$, $—CY^1{=}CY^2—$ or —C≡C— in such a manner that O and/or S atoms are not linked directly to one another, and in which one or more H atoms are optionally replaced by F, Cl, Br, I or CN, and in which one or more $CH_2$ or $CH_3$ groups are optionally replaced by a cationic or anionic group, or aryl, heteroaryl, arylalkyl, heteroarylalkyl, aryloxy or heteroaryloxy, wherein each of the aforementioned cyclic groups has 5 to 20 ring atoms, is mono- or polycyclic, does optionally contain fused rings, and is unsubstituted or substituted by one or more identical or different groups L, and the pair of $R^1$ and $R^2$ together with the C, Si or Ge atom to which they are attached, may also form a spiro group with 5 to 20 ring atoms which is mono- or polycyclic, does optionally contain fused rings, and is unsubstituted or substituted by one or more identical or different groups L, $Z^1$ an electron withdrawing group, $R^{T1}$, $R^{T2}$ H, a carbyl or hydrocarbyl group with 1 to 30 C atoms that is optionally substituted by one or more groups L and optionally comprises one or more hetero atoms, wherein at least one of $R^{T1}$ and $R^{T2}$ is an electron withdrawing group, $Y^1$, $Y^2$ H, F, Cl or CN, L F, Cl, $—NO_2$, —CN, —NC, —NCO, —NCS, —OCN, —SCN, $R^0$, $OR^0$, $SR^0$, $—C({=}O)X^0$, $—C({=}O)R^0$, $—C({=}O)—OR^0$, $—O—C({=}O)—R^0$, $—NH_2$, $—NHR^0$, $—NR^0R^{00}$, $—C({=}O)NHR^0$, $—C({=}O)NR^0R^{00}$, $—SO_3R^0$, $SO_2R^0$, —OH, $—NO_2$, $—CF_3$, $—SF_5$, or optionally substituted silyl, or carbyl or hydrocarbyl with 1 to 30, preferably 1 to 20 C atoms that is optionally substituted and optionally comprises one or more hetero atoms, preferably F, —CN, $R^0$, $—OR^0$, $—SR^0$, $—C({=}O)—R^0$, $—C({=}O)—OR^0$, $—O—C({=}O)—R^0$, $—O—C({=}O)—OR^0$, $C({=}O)—NHR^0$, or $—C({=}O)—NR^0R^{00}$, $R^0$, $R^{00}$ H or straight-chain or branched alkyl with 1 to 20, preferably 1 to 12, C atoms that is optionally fluorinated, $X^0$ halogen, preferably F or Cl, a, b 0, 1, 2 or 3, c one of the meanings given for a, 0, 1, 2 or 3, k one of the meanings given for m, m 0 or an integer from 1 to 10, preferably 1, 2, 3, 4, 5 or 6.

Preferred compounds of formula NI are those wherein i is 1, 2 or 3, very preferably 1.

Further preferred compounds of formula NI are those wherein i is 0, preferably selected of formula I

I

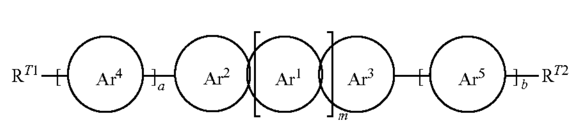

wherein the individual radicals, independently of each other and on each occurrence identically or differently, have the meanings given in formula NI.

The invention further relates to novel compounds of formula I and its subformulae, novel synthesis methods for preparing them, and novel intermediates used therein.

In a preferred embodiment the compound of formula NI or I contains at least one group $Ar^1$ that denotes

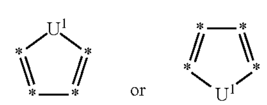

In another preferred embodiment the compound of formula NI or I contains at least one group $Ar^1$ that denotes

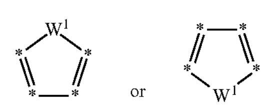

In another preferred embodiment the compound of formula NI or I contains at least one group $Ar^1$ that denotes

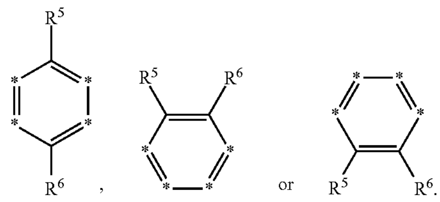

In another preferred embodiment the compound of formula NI or I contains at least one group $Ar^1$ that denotes

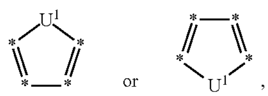

and at least one group $Ar^1$ that denotes

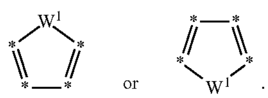

In another preferred embodiment the compound of formula NI or I contains at least one group $Ar^1$ that denotes

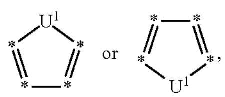

at least one group $Ar^1$ that denotes

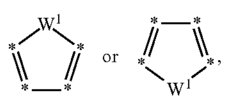

and at least one group $Ar^1$ that denotes

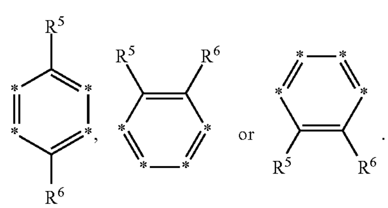

Preferred compounds of formula NI and I are selected of subformula IA

IA

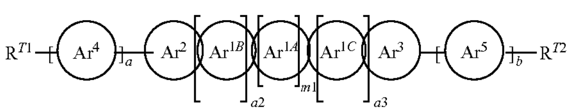

wherein $R^{T1}$, $R^{T1}$, $Ar^2$, $Ar^3$, $Ar^4$, $Ar^5$, a and b have the meanings given in formula NI, $Ar^{1A}$, $Ar^{1B}$ and $Ar^{1C}$ have, independently of each other, and on each occurrence identically or differently, one of the meanings given for $Ar^1$ in formula NI, m1 is 0 or an integer from 1 to 10, a2 and a3 are each 0, 1, 2 or 3, and $m1+a2+a3<10$.

Preferred compounds of formula IA are those wherein a2 is 1 or 2 and/or a3 is 1 or 2.

Further preferred compounds of formula IA are those wherein

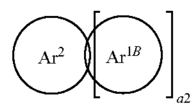

is selected from the following formulae

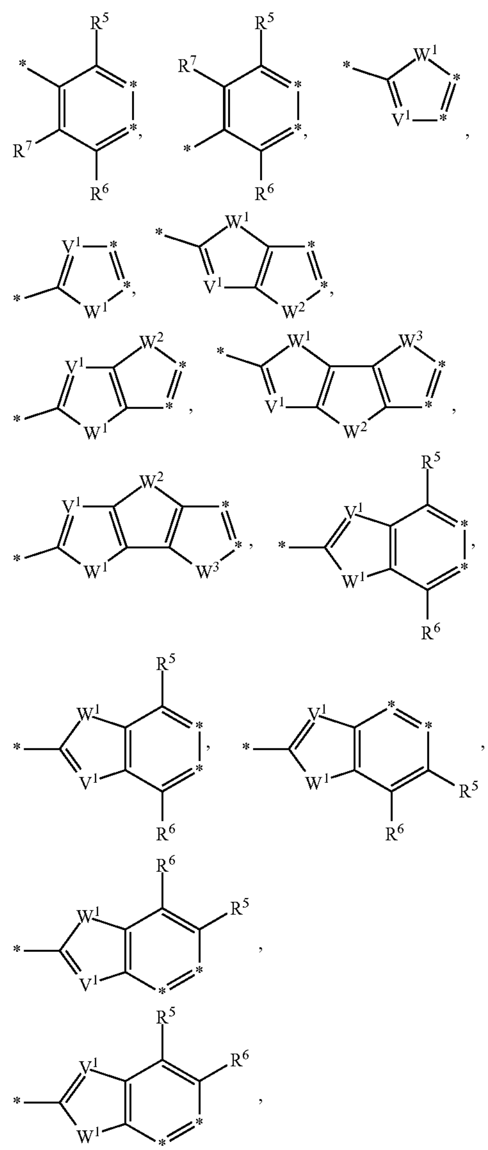

-continued

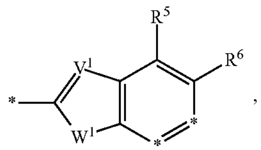

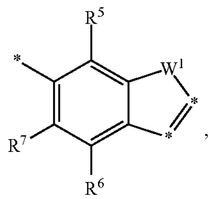

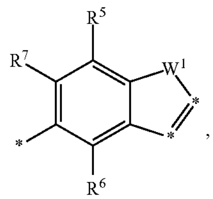

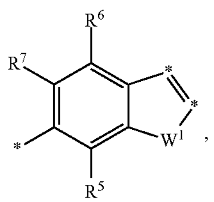

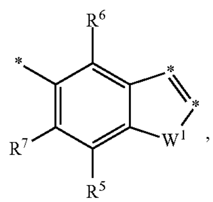

wherein $W^1$, $V^1$ and $R^5$ to $R^7$, independently of each other and on each occurrence identically or differently, have the meanings given above, $W^2$ and $W^3$ have independently of each other one of the meanings given for $W^1$ in formula NI.

Further preferred compounds of formula IA are those wherein

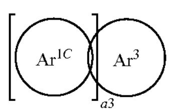

is selected from the following formulae

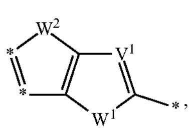

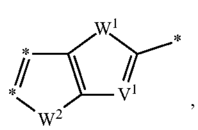

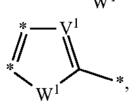

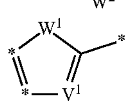

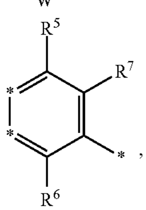

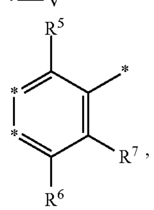

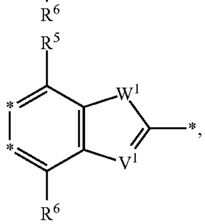

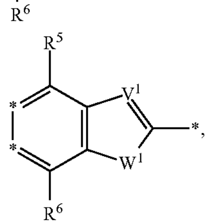

-continued

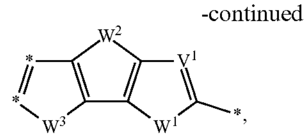

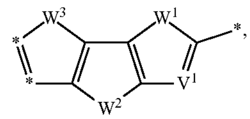

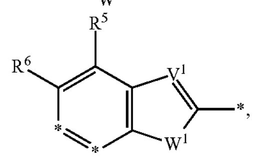

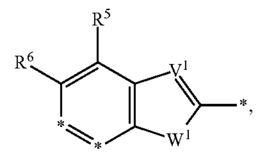

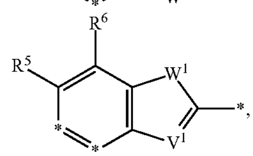

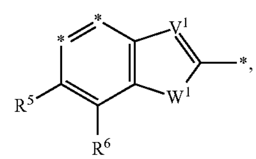

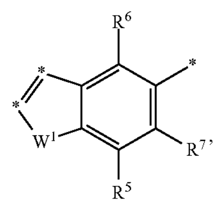

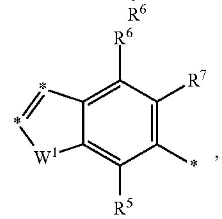

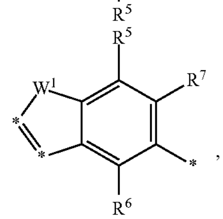

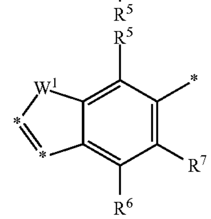

wherein $W^{1-3}$, $V^{1,2}$ and $R^5$ to $R^7$, independently of each other and on each occurrence identically or differently, have the meanings given above.

Very preferred compounds of formula IA are those wherein

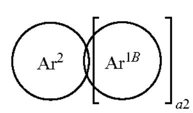

is selected from the following formulae

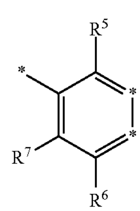

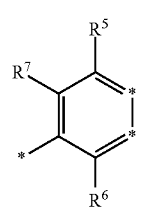

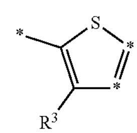

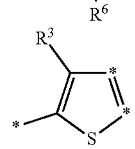

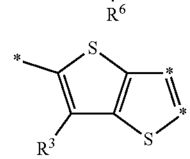

-continued

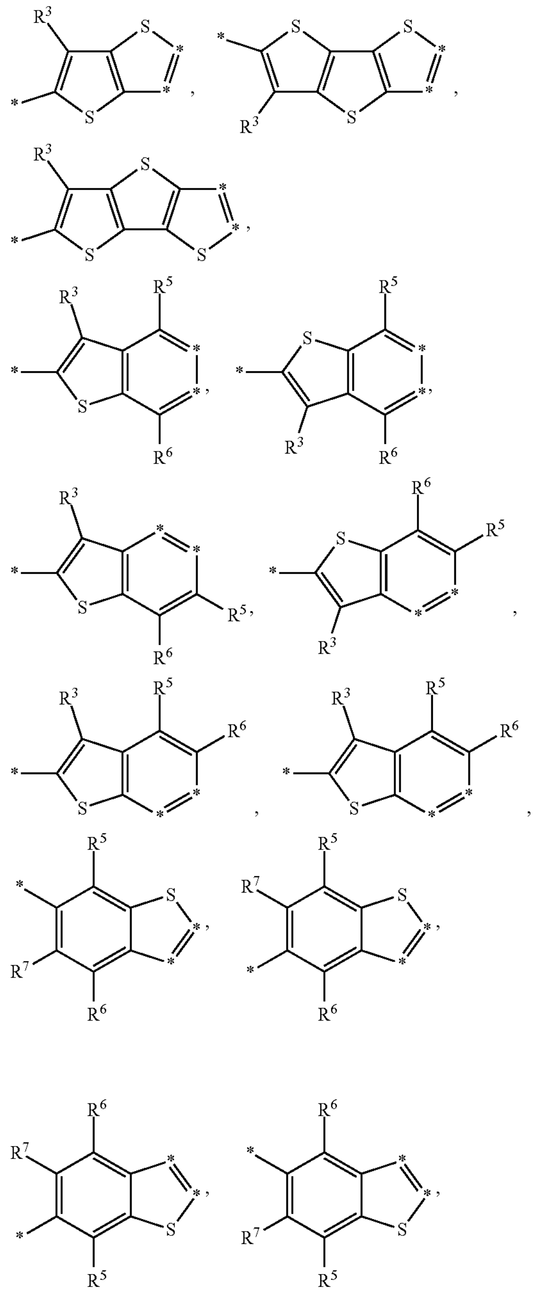

wherein $R^3$ and $R^5$ to $R^7$, independently of each other and on each occurrence identically or differently, have the meanings given above.

Further very preferred compounds of formula IA are those wherein

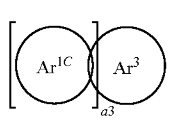

is selected from the following formulae

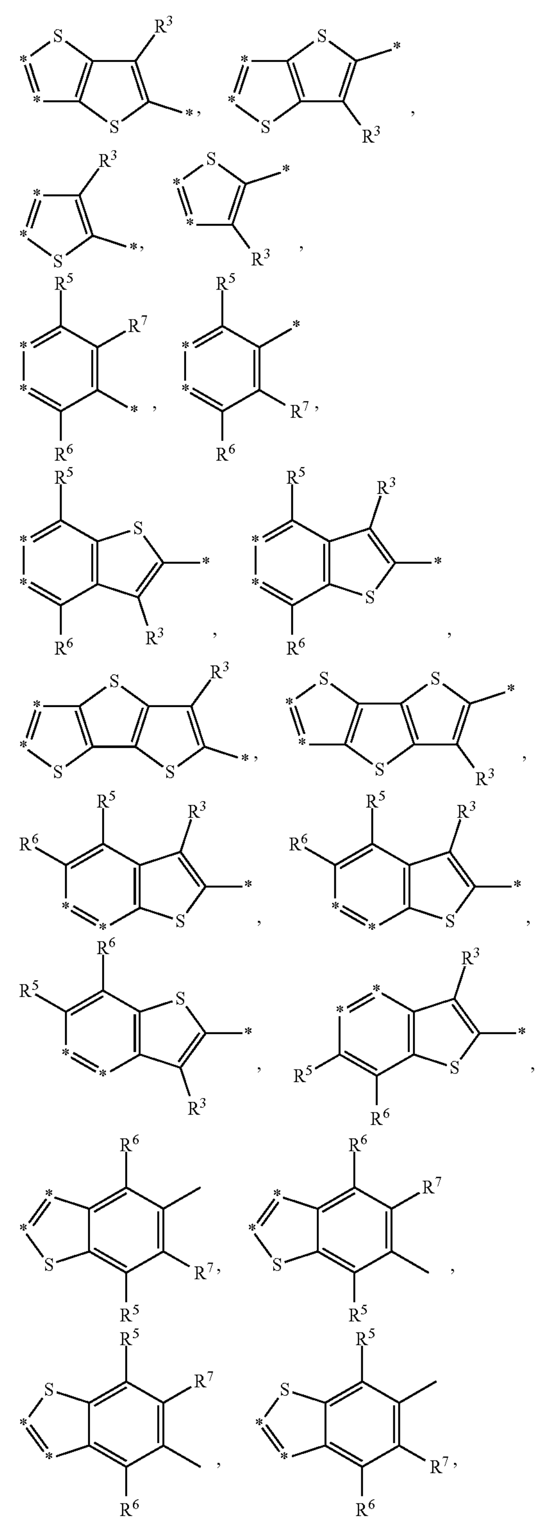

wherein $R^3$ and $R^5$ to $R^7$, independently of each other and on each occurrence identically or differently, have the meanings given above.

Preferred groups $Ar^1$, $Ar^{1A}$, $Ar^{1B}$ and $Ar^{1C}$ in formula NI, I and IA are selected from the following formulae

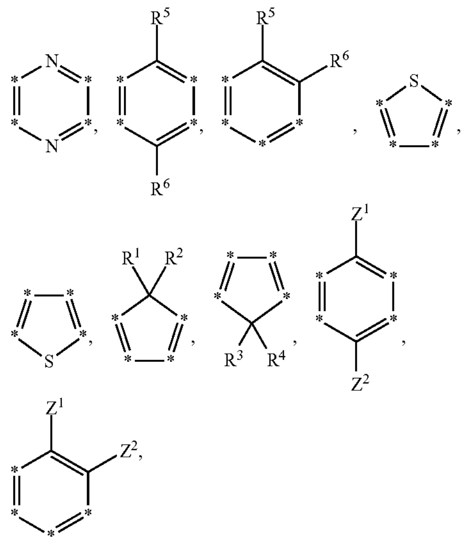

wherein $R^{1-3}$, $R^{5-7}$ and $Z^1$ are as defined above and below, $R^4$ has one of the meanings given for $R^3$, and $Z^2$ has one of the meanings given for $Z^1$.

Preferred groups $Ar^2$ in formula NI, I and IA are selected from the following formulae

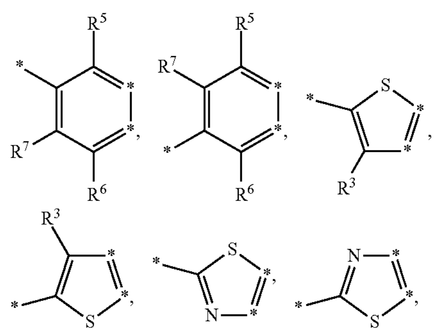

wherein $R^{3-7}$ are as defined above and below.

Preferred groups $Ar^3$ in formula NI, I and IA are selected from the following formulae

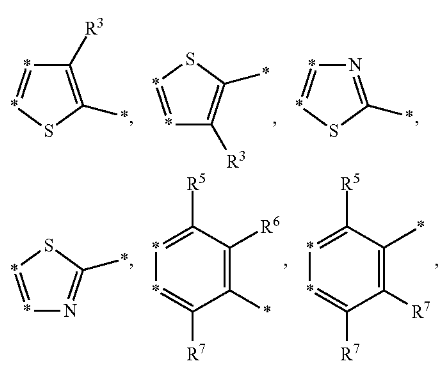

wherein $R^{3-7}$ are as defined above and below.

In the compounds of formula NI, I and IA $Ar^4$ and $Ar^5$ are preferably arylene or heteroarylene as defined above.

In another preferred embodiment the compounds of formula NI, I and IA have an asymmetric polycyclic core formed by the groups $Ar^{1-3}$, or by the groups $Ar^{1A-1C}$ and $Ar^{2-3}$, respectively.

Preferred compounds of this embodiment are compounds of formula IA wherein

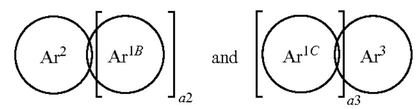

are different from each other and are not a mirror image of each other.

Further preferred compounds of this embodiment are compounds of formula NI, I or IA wherein $[Ar^1]_m$ or $[Ar^{1A}]_{m1}$ respectively form an asymmetric group, i.e. a group that has no intrinsic mirror plane.

Further preferred are compounds of formula NI, I and IA that contain at least one group $Ar^{1A}$, $Ar^{1B}$ or $Ar^{1C}$ that denotes

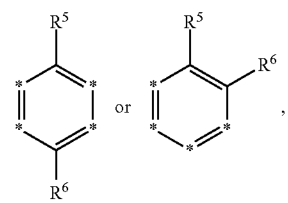

wherein one or both of $R^5$ and $R^6$ denote an electron withdrawing group $Z^1$ or $Z^2$.

Preferred compounds of formula NI, I and IA are selected from the following subformulae

I1

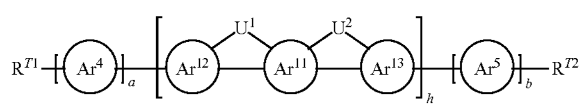

I2

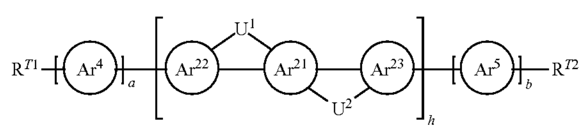

I3

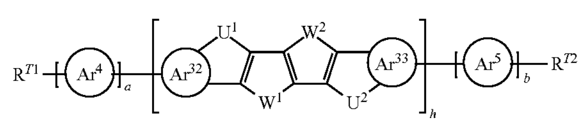

I4

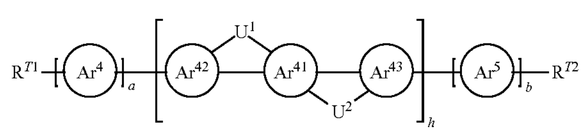

-continued

I5

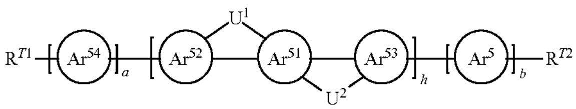

I6

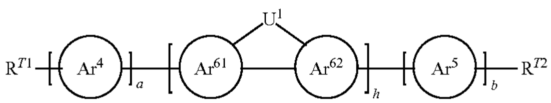

wherein the individual radicals, independently of each other and on each occurrence identically or differently, have the following meanings $Ar^{11}$, $Ar^{12}$, $Ar^{13}$, $Ar^{32}$, $Ar^{33}$ arylene or heteroarylene that has from 5 to 20 ring atoms, is mono- or polycyclic, optionally contains fused rings, and is unsubstituted or substituted by one or more identical or different groups L, $Ar^{21}$ arylene or heteroarylene that has from 6 to 20 ring atoms, is mono- or polycyclic, optionally contains fused rings, and is substituted by one or more identical or different groups $R^{21}$, wherein $Ar^{21}$ contains at least one benzene ring that is connected to $U^2$, $Ar^{23}$

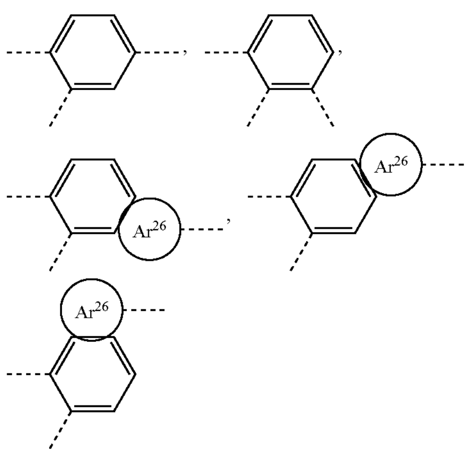

or wherein the benzene ring is substituted by one or more identical or different groups $R^{1-4}$, $Ar^{22}$, $Ar^{26}$ arylene or heteroarylene that has from 5 to 20 ring atoms, is mono- or polycyclic, optionally contains fused rings, and is substituted by one or more identical or different groups $R^{1-4}$, $Ar^{41}$ benzene or a group consisting of 2, 3 or 4 fused benzene rings, all of which are unsubstituted or substituted by one or more identical or different groups L, $Ar^{42}$

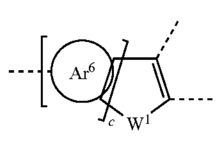

$Ar^{43}$

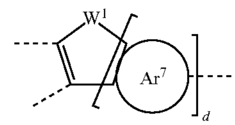

wherein $Ar^{42}$ and $Ar^{43}$ have different meanings and $Ar^{42}$ is not a mirror image of $Ar^{43}$, $Ar^{51}$ benzene or a group consisting of 2, 3 or 4 fused benzene rings, all of which are unsubstituted or substituted by one or more identical or different groups $R^1$, L or $Z^1$, wherein $Ar^{51}$ is substituted by at least one, preferably at least two, groups $R^1$, L or $Z^1$ that are selected from electron withdrawing groups, $Ar^{52, 53}$ arylene or heteroarylene that has from 5 to 20 ring atoms, is mono- or polycyclic, optionally contains fused rings, and is unsubstituted or substituted by one or more identical or different groups $R^1$ or L, $Ar^{61,62}$ arylene or heteroarylene that has from 5 to 20 ring atoms, is mono- or polycyclic, optionally contains fused rings, and is unsubstituted or substituted by one or more identical or different groups $R^1$ or L, wherein $Ar^{61}$ and $Ar^{62}$ are different from each other and are not a mirror image of each other, $Ar^{4,5}$ arylene or heteroarylene that has from 5 to 20 ring atoms, is mono- or polycyclic, optionally contains fused rings, and is unsubstituted or substituted by one or more identical or different groups L, or $CY^1{=}CY^2$ or —C≡C—, $Ar^{54,55}$ arylene or heteroarylene that has from 5 to 20 ring atoms, is mono- or polycyclic, optionally contains fused rings, and is unsubstituted or substituted by one or more identical or different groups $R^1$ or L, or $CY^1{=}CY^2$ or —C≡C—, $Y^1$, $Y^2$ H, F, Cl or CN, $U^1$ $CR^1R^2$, $SiR^1R^2$, $GeR^1R^2$, $NR^1$ or C═O, $U^2$ $CR^3R^4$, $SiR^3R^4$, $GeR^3R^4$, $NR^3$ or C═O, $W^1$ S, O, Se or C═O, preferably S, O or Se, $W^2$ S, O, Se or C═O, preferably S, O or Se, $R^{1-4}$ H, F, Cl, CN or straight-chain, branched or cyclic alkyl with 1 to 30, preferably 1 to 20, C atoms, in which one or more $CH_2$ groups are optionally replaced by —O—, —S—, —C(═O)—, —C(═S)—, —C(═O)—O—, —O—C(═O)—, —$NR^0$—, —$SiR^0R^{00}$—, —$CF_2$—, —$CR^0{=}CR^{00}$—, —$CY^1{=}CY^2$— or —C≡C— in such a manner that O and/or S atoms are not linked directly to one another, and in which one or more H atoms are optionally replaced by F, Cl, Br, I or CN, and in which one or more $CH_2$ or $CH_3$ groups are optionally replaced by a cationic or anionic group, or aryl, heteroaryl, arylalkyl, heteroarylalkyl, aryloxy or heteroaryloxy, wherein each of the aforementioned cyclic groups has 5 to 20 ring atoms, is mono- or polycyclic, does optionally contain fused rings, and is unsubstituted or substituted by one or more identical or different groups L, and the pair of $R^1$ and $R^2$ and/or the pair of $R^3$ and $R^4$ together with the C, Si or Ge atom to which they are attached, may also form a spiro group with 5 to 20 ring atoms which is mono- or polycyclic, does optionally contain fused rings, and is unsubstituted or substituted by one or more identical or different groups L, $R^{T1}$, $R^{T2}$ a carbyl or hydrocarbyl group with 1 to 30 C atoms that is optionally substituted by one or more groups L and optionally comprises one or more hetero atoms, and wherein at least one of $R^{T1}$ and $R^{T2}$ is an electron withdrawing group, L F, Cl, —$NO_2$, —CN, —NC, —NCO, —NCS, —OCN, —SCN, $R^0$, $OR^0$, $SR^0$, —C(═O)$X^0$, —C(═O)$R^0$, —C(═O)—$OR^0$, —O—C(═O)—$R^0$, —$NH_2$, —$NHR^0$, —$NR^0R^{00}$, —C(═O)$NHR^0$, —C(═O)$NR^0R^{00}$, —$SO_3R^0$, $SO_2R$, —OH, —$NO_2$, —$CF_3$, —$SF_5$, or optionally substituted silyl, or carbyl or hydrocarbyl with 1 to 30, preferably 1 to 20 C atoms that is optionally substituted and optionally comprises one or more hetero atoms, preferably F, —CN, $R^0$, —$OR^0$, —$SR^0$, —C(═O)—$R^0$, —C(═O)—$OR^0$, —O—C(═O)—$R^0$, —O—C(═O)—$OR^0$, C(═O)—$NHR^0$, or —C(═O)—$NR^0R^{00}$, $R^{21}$ one of the meanings given for $R^{1-4}$ that is preferably selected from H or from groups that are not electron-withdrawing, $R^0$, $R^{00}$H or straight-chain or branched alkyl with 1 to 20, preferably 1 to 12, C atoms that is optionally fluorinated, $X^0$ halogen, preferably F or Cl, a, b 0, 1, 2 or 3, c, d 0 or 1, h 1, 2 or 3.

Preferred compounds of formula NI, I and IA are those of formula I3, very preferably wherein $W^1$ and $W^2$ are S.

Preferred groups $Ar^{11-13}$ in formula I1 are selected from the following formulae and their mirror images:

$Ar^{11}$

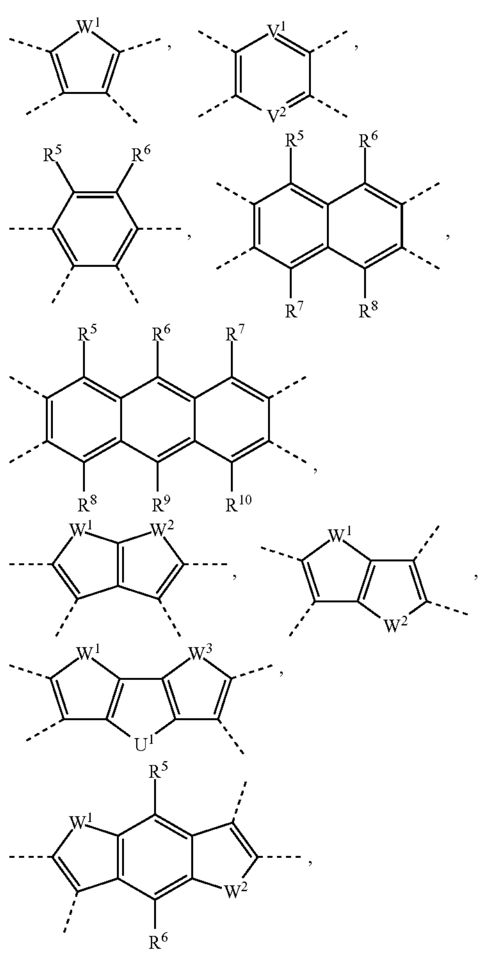

-continued

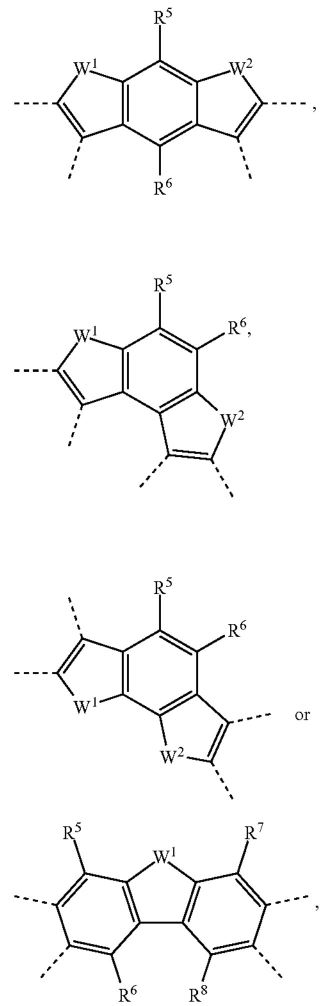

$Ar^{12}$

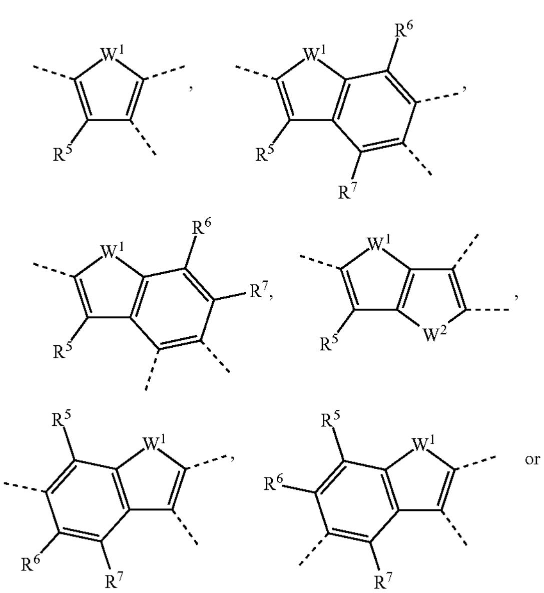

-continued

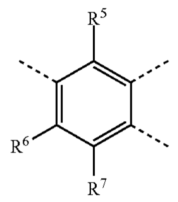

$Ar^{13}$

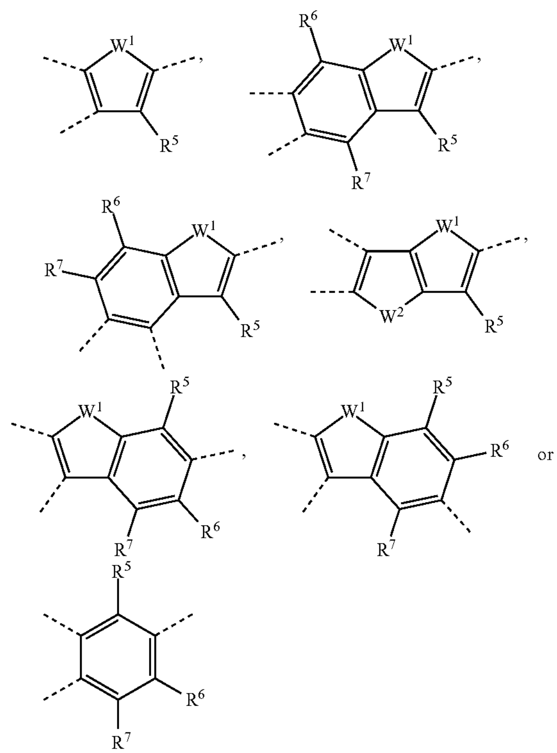

wherein the individual radicals, independently of each other and on each occurrence identically or differently, have the following meanings $U^{1,2}$ one of the meanings of formula I1, $W^{1,2}$ one of the meanings of formula I1, $V^1$ $CR^3$ or N, $V^2$ $CR^4$ or N, $R^{1-4}$ one of the meanings of formula I1, $R^{5-10}$ H, F, Cl, CN, or straight-chain, branched or cyclic alkyl with 1 to 30, preferably 1 to 20, C atoms, in which one or more $CH_2$ groups are optionally replaced by —O—, —S—, —C(=O)—, —C(=S)—, —C(=O)—O—, —O—C(=O)—, $—NR^0—$, $—SiR^0R^{00}—$, $—CF_2—$, $—CR^0=CR^{00}—$, $—CY^1=CY^2—$ or —C≡C— in such a manner that O and/or S atoms are not linked directly to one another, and in which one or more H atoms are optionally replaced by F, Cl, Br, I or CN, and in which one or more $CH_2$ or $CH_3$ groups are optionally replaced by a cationic or anionic group, or aryl, heteroaryl, arylalkyl, heteroarylalkyl, aryloxy or heteroaryloxy, wherein each of the aforementioned cyclic groups has 5 to 20 ring atoms, is mono- or polycyclic, does optionally contain fused rings, and is unsubstituted or substituted by one or more identical or different groups L as defined above and below.

Very preferred groups $Ar^{11-13}$ in formula I1 are selected from the following formulae and their mirror images:

$Ar^{11}$

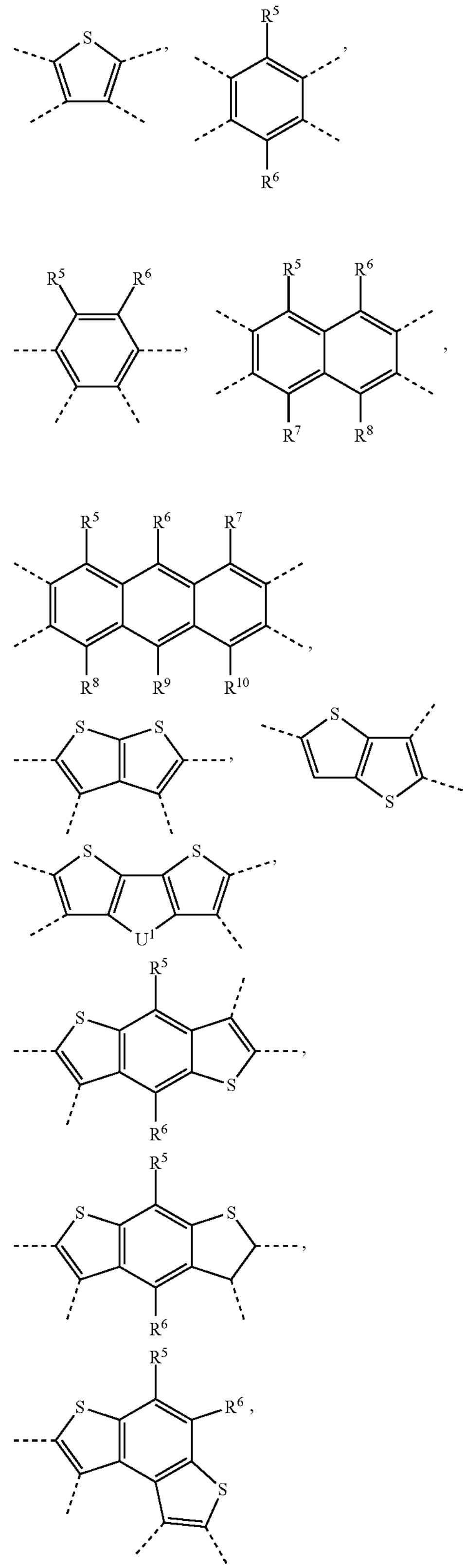

-continued

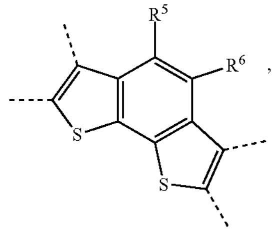

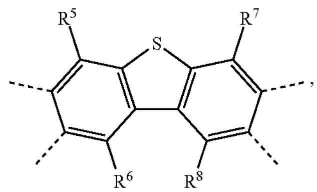

or

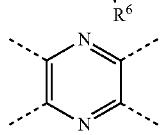

Ar[12]

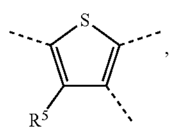

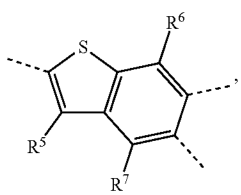

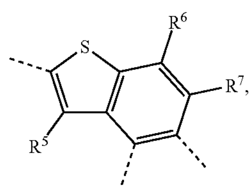

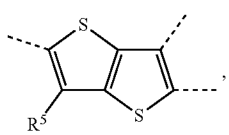

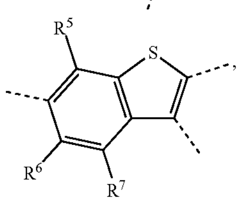

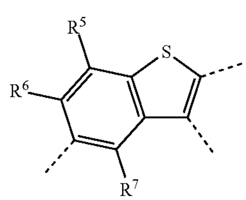

or

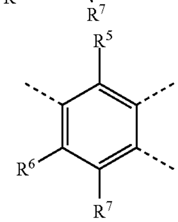

Ar[13]

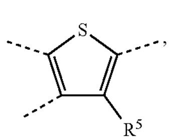

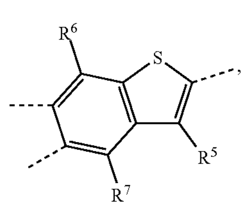

-continued

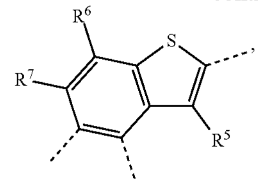

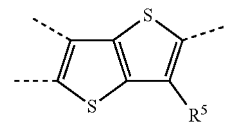

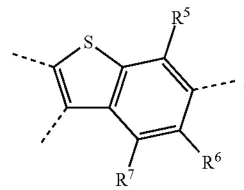

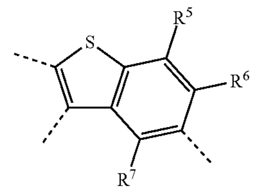

or

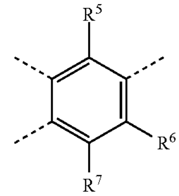

wherein $U^1$ and $R^{5-10}$ have the meanings given above and below.

In the compounds of formula I2 $Ar^{21}$ is preferably selected from the group consisting of benzene, naphthalene, anthracene, phenanthrene and pyrene, all of which are substituted by one or more identical or different groups $R^{21}$.

$R^{21}$ is preferably selected from H or straight-chain, branched or cyclic alkyl with 1 to 30, preferably 1 to 20, C atoms, in which one or more $CH_2$ groups are optionally replaced by —O—, —S—, —$NR^0$—, —$SiR^0R^{00}$—, —$CR^0$═$CR^{00}$— or —C≡C— in such a manner that O and/or S atoms are not linked directly to one another, wherein $R^0$ and $R^{00}$ have the meanings given in formula I2.

$R^{21}$ is very preferably selected from H, straight-chain or branched alkyl with 1 to 30, preferably 1 to 20, C atoms, in which one or more $CH_2$ groups are optionally replaced by —O—, —$CR^0$═$CR^{00}$— or —C≡C— in such a manner that O atoms are not linked directly to one another.

Preferred groups $Ar^{21}$ in formula I2 are selected from the following formulae and their mirror images:

Ar[21]

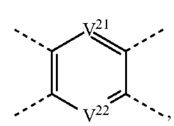

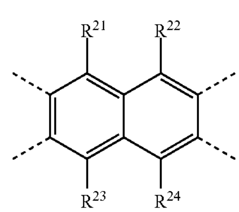

or

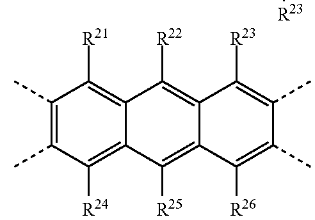

wherein the individual radicals, independently of each other and on each occurrence identically or differently, have the following meanings $V^{21}$ $CR^{21}$ or N, preferably $CR^{21}$, $V^{22}$ $CR^{22}$ or N, preferably $CR^{22}$, $R^{21-26}$ H or straight-chain, branched or cyclic alkyl with 1 to 30, preferably 1 to 20, C atoms, in which one or more $CH_2$ groups are optionally replaced by —O—, —S—, —$NR^0$—, —$SiR^0R^{00}$—, —$CR^0$═$CR^{00}$— or —C≡C— in such a manner that O and/or S atoms are not linked directly to one another, Preferred groups $Ar^{22}$ in formula I2 are selected from the following formulae and their mirror images:

$Ar^{22}$

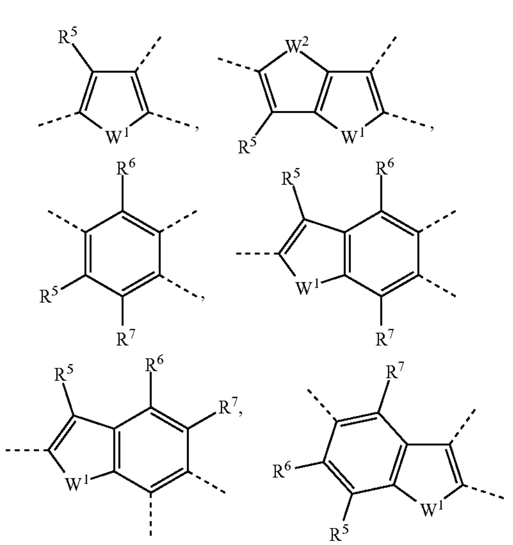

or

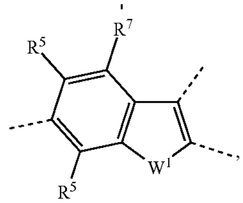

wherein $W^{1,2}$ and $R^{5-7}$ are as defined above.

Preferred groups $Ar^{26}$ in formula I2 are selected from the following formulae and their mirror images:

$Ar^{26}$

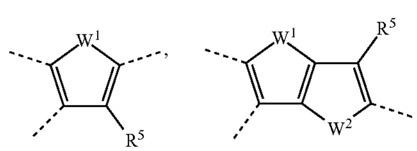

or

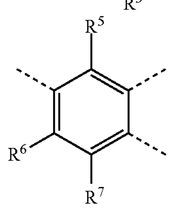

wherein $W^1$, $W^2$, $R^5$, $R^6$ and $R^7$ have the meanings given above.

Preferred groups $Ar^{23}$ in formula I2 are selected from the following formulae and their mirror images:

$Ar^{23}$

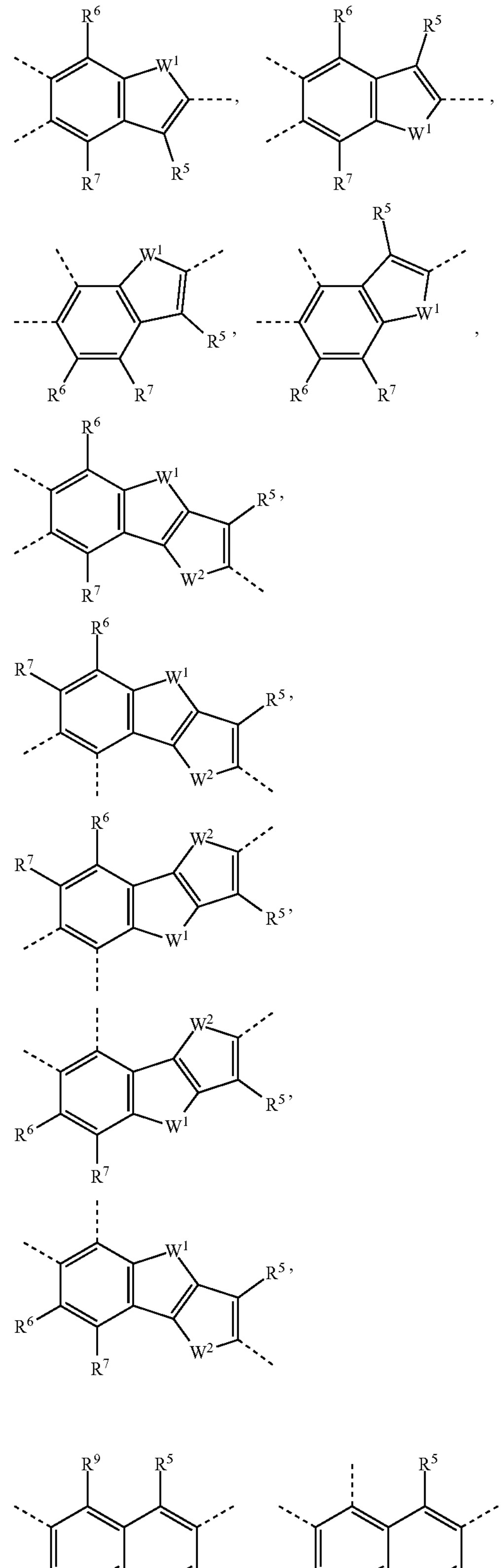

-continued

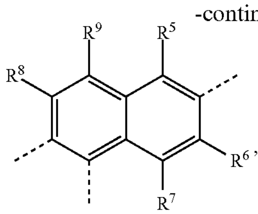
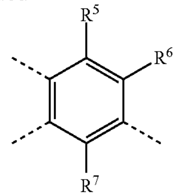
or
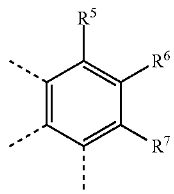

wherein $W^1$, $W^2$, $R^{5-8}$ have the meanings given above and $R^9$ has one of the meanings given for $R^{5-8}$.

Very preferred groups $Ar^{21}$ in formula I2 are selected from the following formulae and their mirror images:

$Ar^{21}$

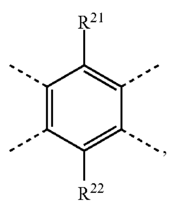
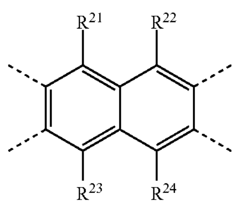
or
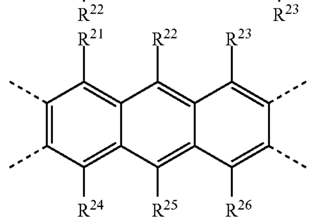

wherein $R^{21-26}$ have the meanings given above.

Very preferably $Ar^{21}$ in formula I2 denotes

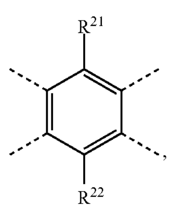

wherein $R^{21}$ and $R^{22}$ have the meanings given above.

Very preferred groups $Ar^{22}$ in formula I2 are selected from the following formulae and their mirror images:

$Ar^{22}$

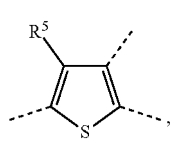
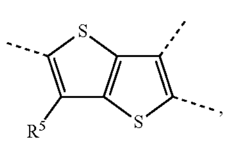

-continued

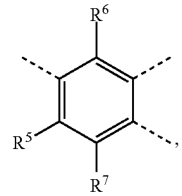
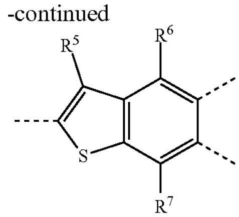
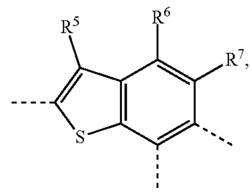
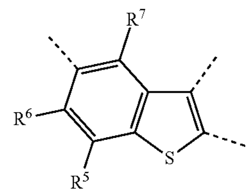
or
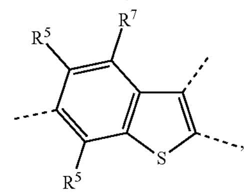

wherein $R^{5-7}$ have the meanings given above.

Very preferred groups $Ar^{26}$ in formula I2 are selected from the following formulae and their mirror images:

$Ar^{26}$

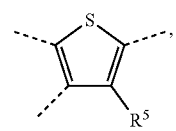
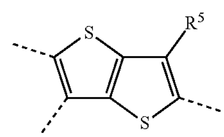
or
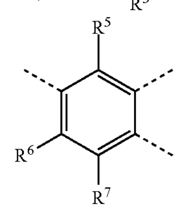

wherein $R^{5-7}$ have the meanings given above and below.

Very preferred groups $Ar^{23}$ in formula I2 are selected from the following formulae and their mirror images:

$Ar^{23}$

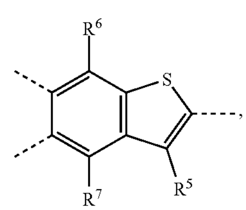
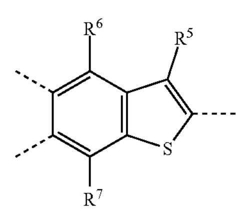
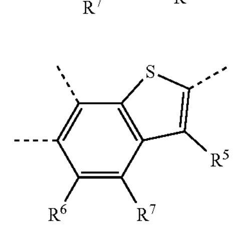
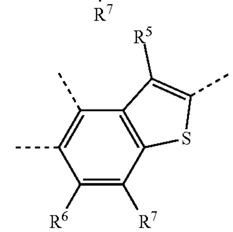

-continued

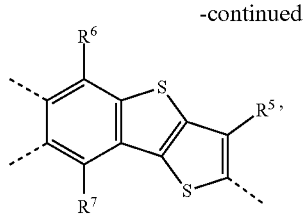

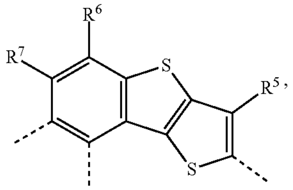

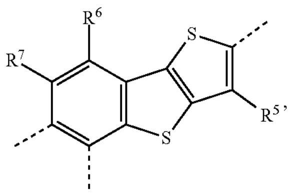

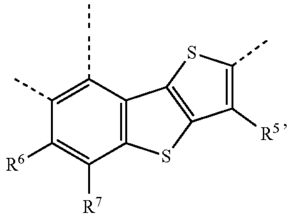

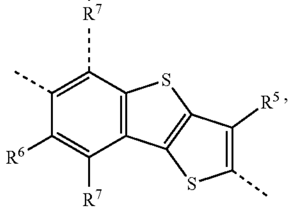

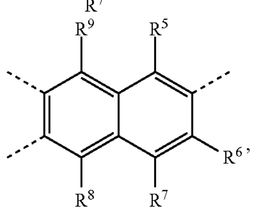

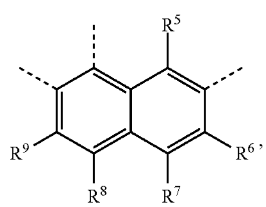

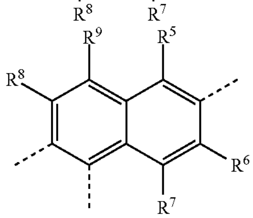

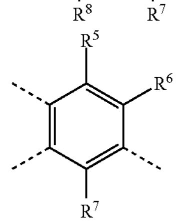

or

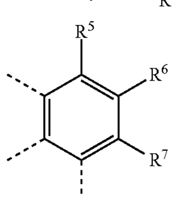

wherein $R^{5-9}$ have the meanings given above.

Preferred compounds of formula I3 are those wherein $W^1$ and $W^2$ denote S or Se, very preferably S.

Further preferred compounds of formula I3 are those wherein $W^1$ and $W^2$ have the same meaning, and preferably both denote S or Se, very preferably S.

Further preferred compounds of formula I3 are those wherein $W^1$ and $W^2$ have different meaning, and preferably one denotes S and the other Se.

Preferred groups $Ar^{32-33}$ in formula I3 are selected from the following formulae and their mirror images:

$Ar^{32}$

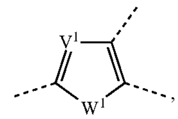

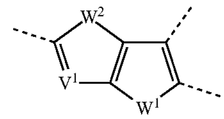

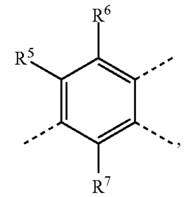

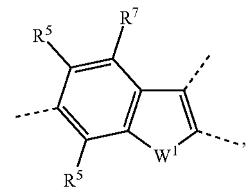

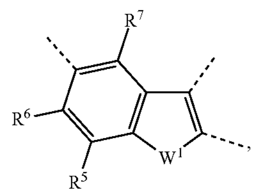

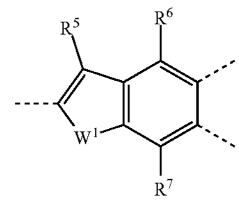

or

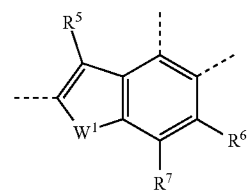

$Ar^{33}$

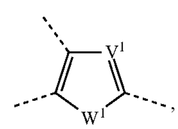

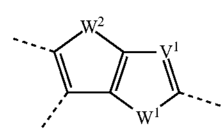

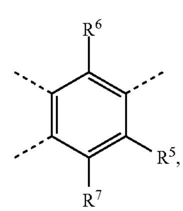

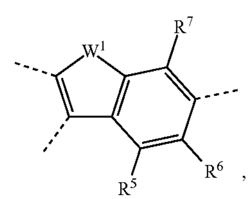

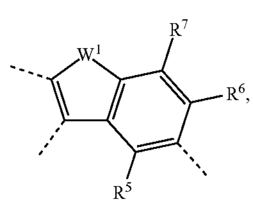

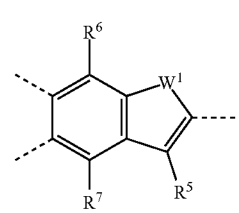

or

-continued

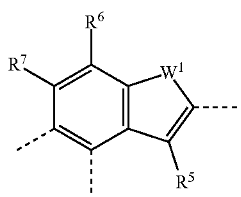

wherein $W^{1,2}$, $V^1$, $R^{5-7}$ are as defined above.

Very preferred groups $Ar^{32}$ and $Ar^{33}$ in formula I3 are selected from the following formulae and their mirror images:

$Ar^{32}$

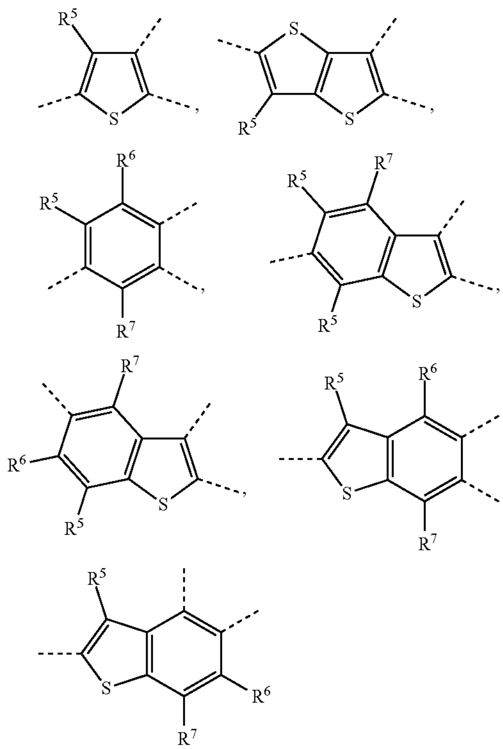

$Ar^{33}$

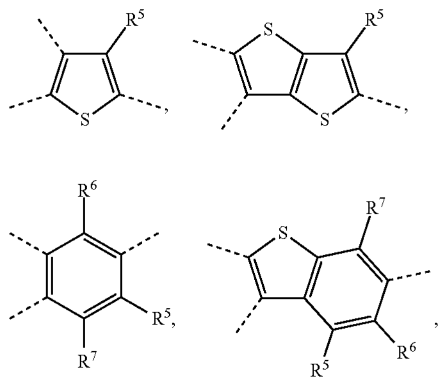

-continued

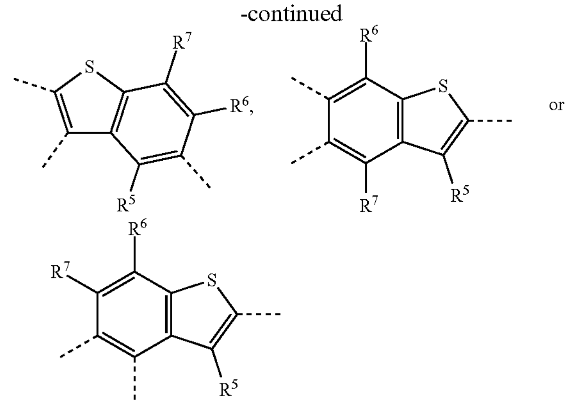

wherein $R^{5-9}$ have the meanings given above and below.

In the compounds of formula I4 $Ar^{41}$ is preferably selected from the group consisting of benzene, naphthalene, anthracene, phenanthrene and pyrene, all of which are unsubstituted or substituted by one or more identical or different groups L.

In the compounds of formula I4 $Ar^6$ and $Ar^7$, if present, are preferably selected from the following formulae and their mirror images

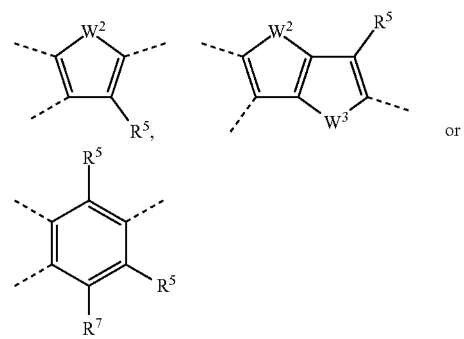

wherein $W^2$ and $W^3$ have independently of each other one of the meanings of $W^1$ in formula I, and preferably denote S, and $R^{5-7}$ are as defined below.

In the compounds of formula I4 preferred groups $Ar^{41-43}$ are selected from the following formulae and their mirror images:

$Ar^{41}$

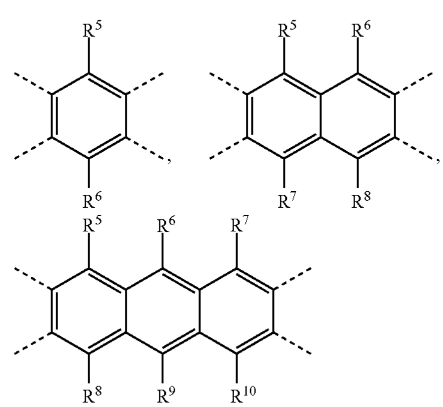

$Ar^{42}$

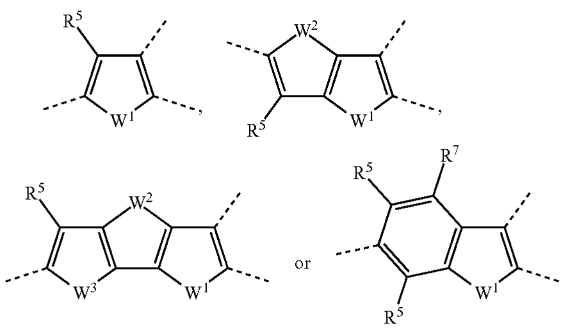

$Ar^{43}$

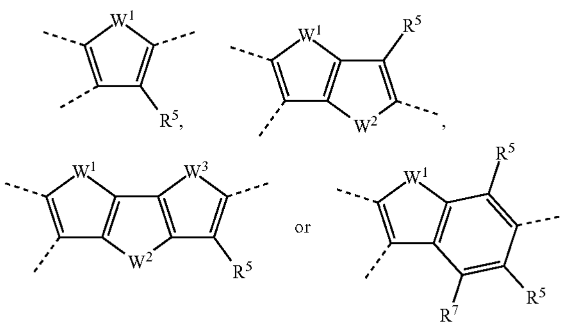

wherein $W^{1,2}$ and $R^{1-10}$ are as defined above, and $W^3$ has one of the meanings given for $W^1$.

Very preferred groups $Ar^{41-43}$ in formula I4 are selected from the following formulae and their mirror images:

$Ar^{41}$

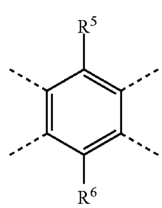

$Ar^{42}$

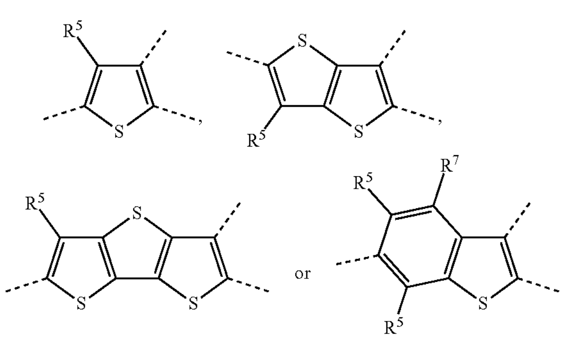

$Ar^{43}$

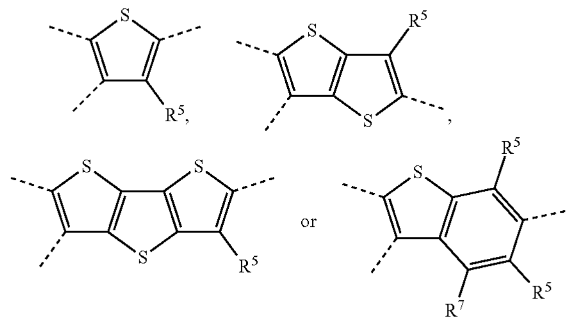

wherein $R^{5-10}$ have the meanings given above and below.

In the compounds of formula I5 $Ar^{51}$ is preferably selected from the group consisting of benzene, naphthalene, anthracene, phenanthrene and pyrene, all of which are substituted by at least one, preferably at least two, groups $Z^1$, and are optionally further substituted by one or more identical or different groups L or $R^1$.

Preferred groups $Ar^{51}$ in formula I5 are selected from the following formulae and their mirror images:

$Ar^{51}$

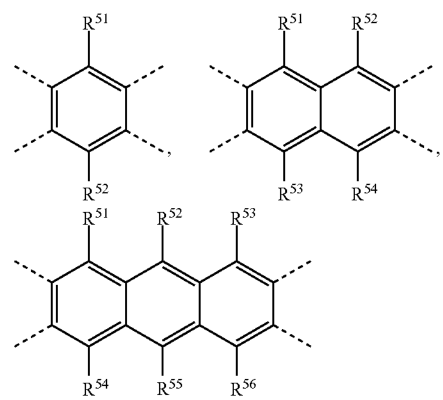

wherein the individual radicals, independently of each other and on each occurrence identically or differently, have the following meanings $R^{51-56}$ $Z^1$, H, F, Cl, CN, or straight-chain, branched or cyclic alkyl with 1 to 30, preferably 1 to 20, C atoms, in which one or more $CH_2$ groups are optionally replaced by —O—, —S—, —C(═O)—, —C(═S)—, —C(═O)—O—, —O—C(═O)—, —$NR^0$—, —$SiR^0R^{00}$—, —$CF_2$—, —$CR^0$═$CR^{00}$—, —$CY^1$═$CY^2$— or —C≡C— in such a manner that O and/or S atoms are not linked directly to one another, and in which one or more H atoms are optionally replaced by F, Cl, Br, I or CN, and in which one or more $CH_2$ or $CH_3$ groups are optionally replaced by a cationic or anionic group, or aryl, heteroaryl, arylalkyl, heteroarylalkyl, aryloxy or heteroaryloxy, wherein each of the aforementioned cyclic groups has 5 to 20 ring atoms, is mono- or polycyclic, does optionally contain fused rings, and is unsubstituted or substituted by one or more identical or different groups L as defined above and below, wherein at least one, preferably at least two of the substituents $R^{51}$ to $R^{56}$ denote $Z^1$, $Z^1$ an electron withdrawing group.

More preferred groups $Ar^{51}$ are selected from the following formula:

$Ar^{51}$

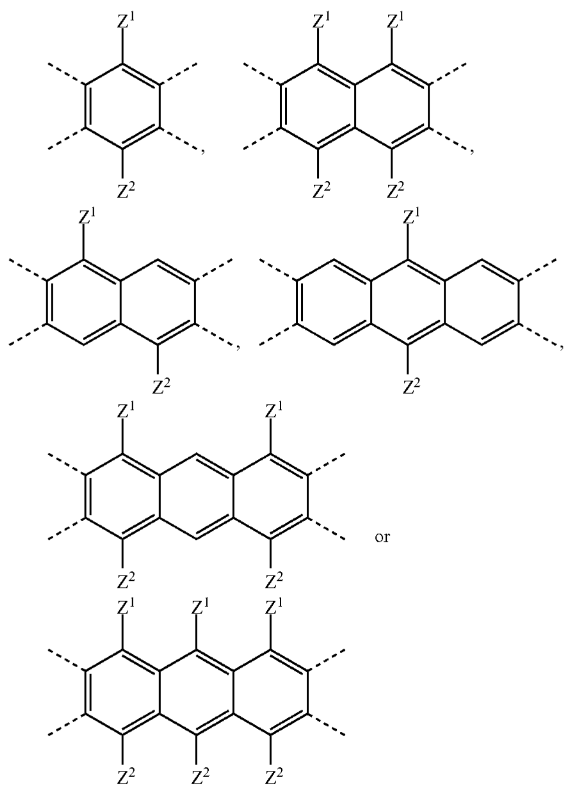

wherein $Z^1$ and $Z^2$ are, independently of each other and on each occurrence identically or differently, an electron withdrawing group.

Very preferred groups $Ar^{51}$ are selected from the following formula:

$Ar^{51}$

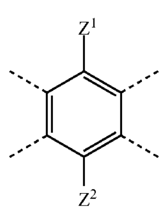

wherein $Z^1$ and $Z^2$ are independently of each other, and on each occurrence identically or differently, an electron withdrawing group.

Preferred groups $Ar^{52}$ and $Ar^{53}$ in formula I5 are selected from the following formulae and their mirror images:

$Ar^{52}$

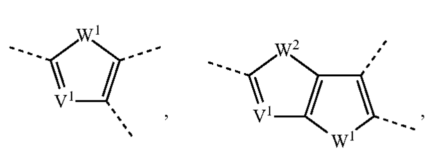

-continued

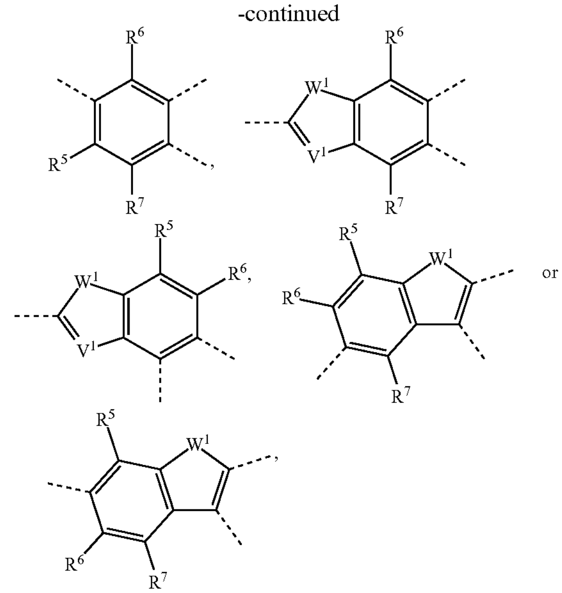

$Ar^{53}$

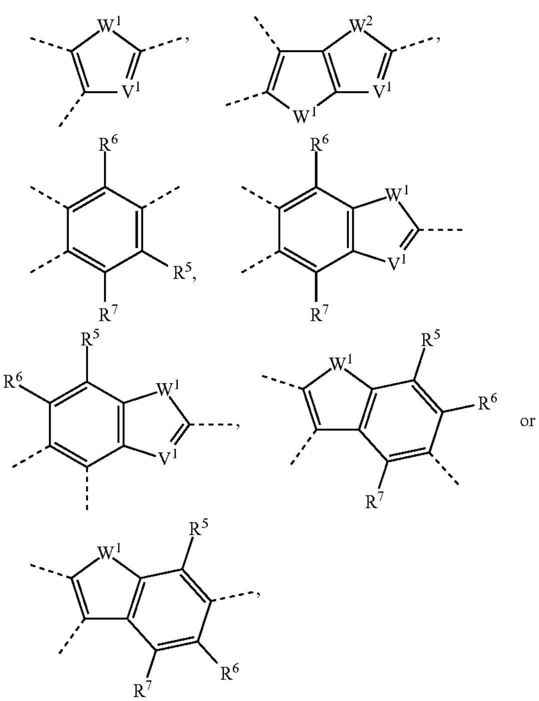

wherein $W^{1,2}$, $V^1$, $R^{5-7}$ are as defined above.

Very preferred groups $Ar^{52}$ and $Ar^{53}$ in formula I5 are selected from the following formulae and their mirror images:

$Ar^{52}$

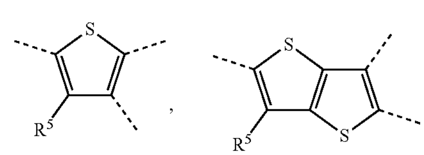

-continued
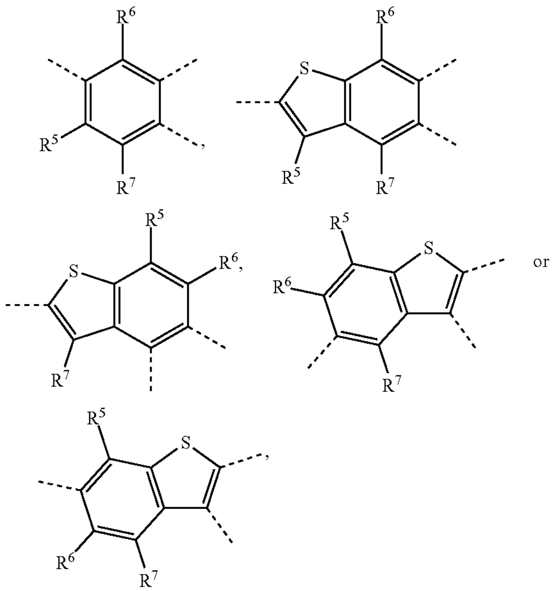
Ar[53]
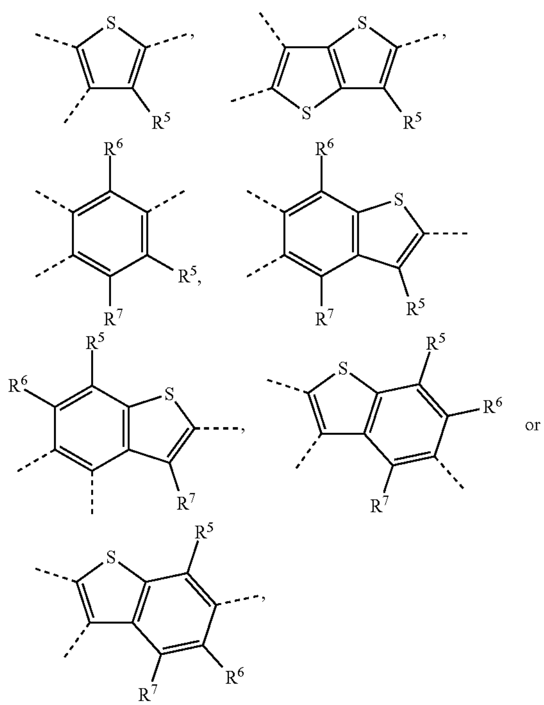
wherein $R^{5-7}$ have the meanings given above and below.
Preferred groups $Ar^{61}$ and $Ar^{62}$ in formula I6 are selected from the following formulae and their mirror images:
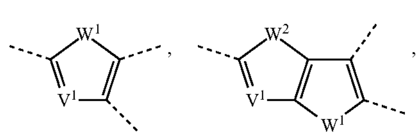
-continued
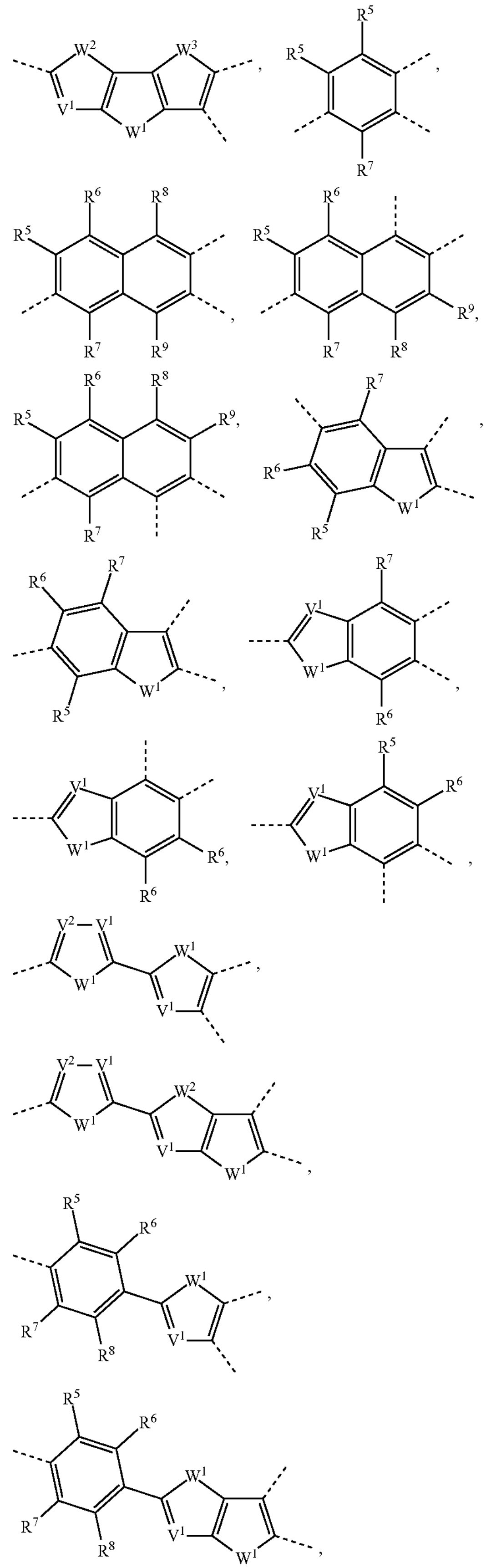

-continued
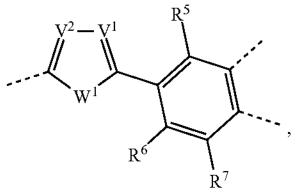
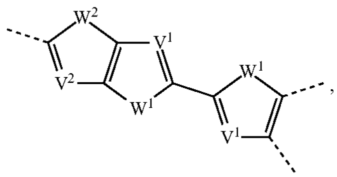
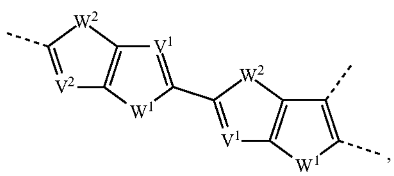
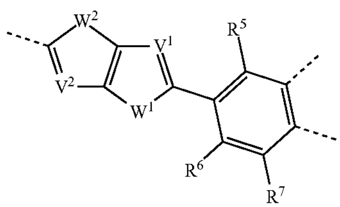
wherein $W^{1,2}$, $V^1$, $R^{5-9}$ are as defined above, and $V^2$ is $CR^4$ with $R^4$ being as defined above.
Very preferred groups $Ar^{61}$ and $Ar^{62}$ in formula I6 are selected from the following formulae and their mirror images:
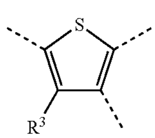
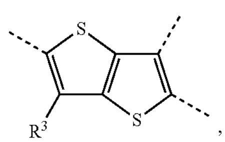
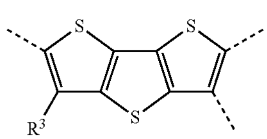
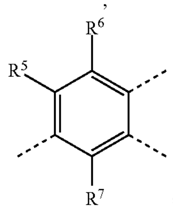
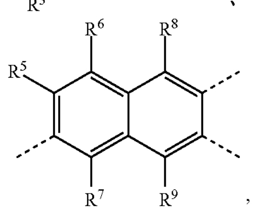
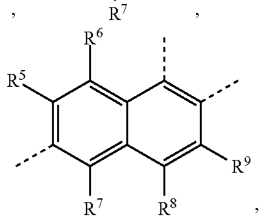
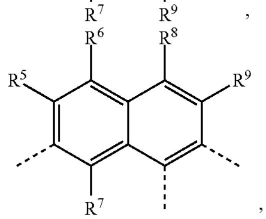
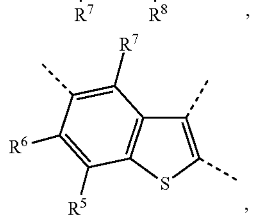
-continued
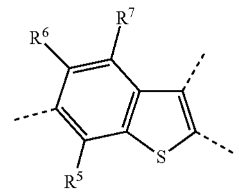
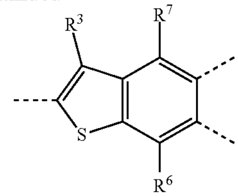
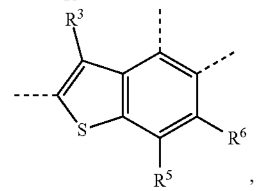
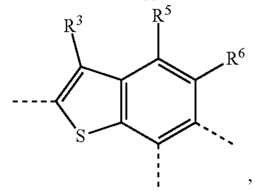
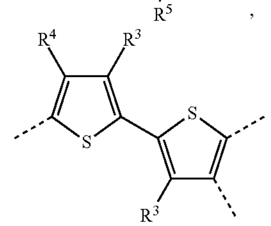
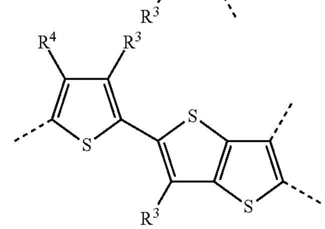
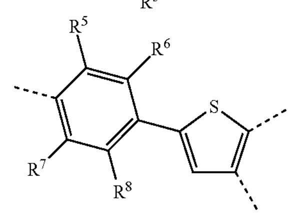
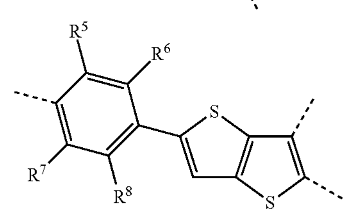
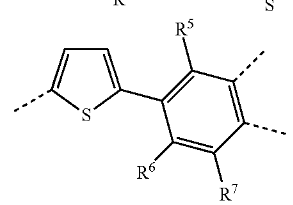
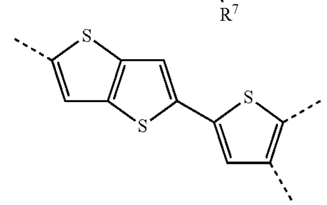
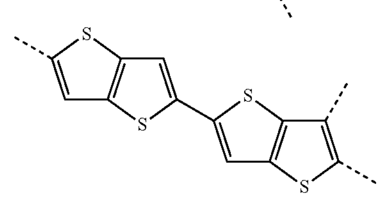

-continued

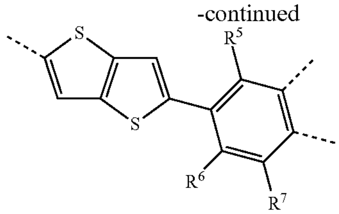

wherein $R^{3-9}$ have the meanings given above and below.

In a preferred embodiment one or more of the groups $R^{39}$ in the preferred formulae of $Ar^{61}$ and $Ar^{62}$ denote an electron withdrawing group $Z^1$. Very preferably in this preferred embodiment $Ar^{61}$ and/or $Ar^{62}$ is selected from the following formulae and their mirror images:

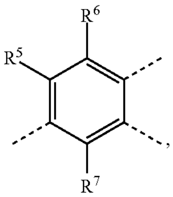

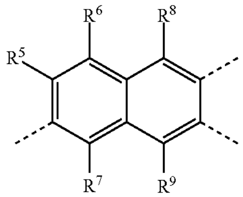

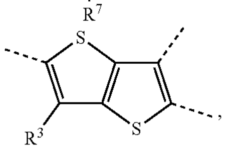

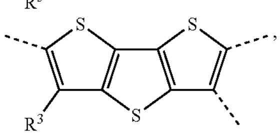

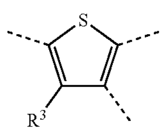

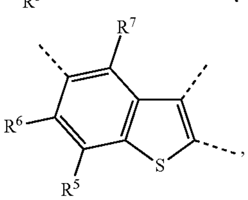

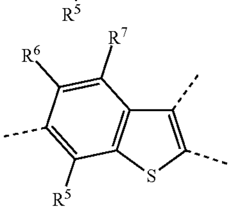

or

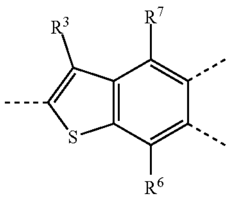

wherein one or two of $R^{3-9}$, very preferably $R^3$ or one or two of $R^5$, $R^6$ and $R^7$ or one or two of $R^8$ and $R^9$ denote an electron withdrawing group $Z^1$.

In the compounds of formula NI, I, IA and I1-I6 and their subformulae $Ar^4$, $Ar^5$, $Ar^{54}$ and $Ar^{55}$ are preferably arylene or heteroarylene as defined above.

Preferred groups $Ar^4$, $Ar^5$, $Ar^{54}$ and $Ar^{55}$ in formula NI, I, IA and I1-I6 and their subformulae are selected from the following formulae and their mirror images:

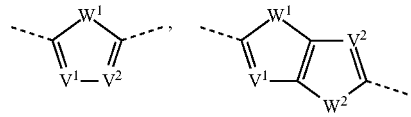

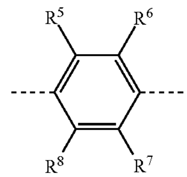

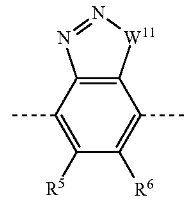

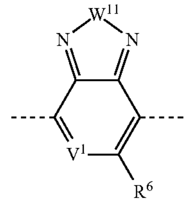

or

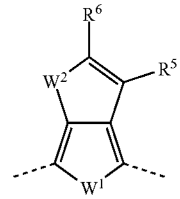

wherein $W^{1,2}$, $V^{1,2}$ and $R^5$ to $R^8$, independently of each other and on each occurrence identically or differently, have the meanings given above and $W^{11}$ $NR^0$, S, O, Se or Te, Very preferred groups $Ar^4$, $Ar^5$, $Ar^{54}$ and $Ar^{55}$ in formula NI, I, IA and I1-I6 and their subformulae are selected from the following formulae and their mirror images.

AR1

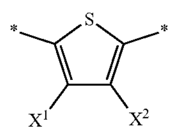

AR2

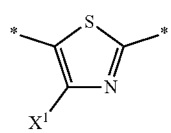

AR3

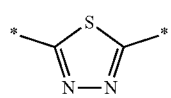

AR4

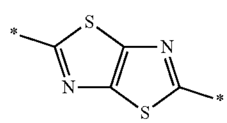

AR5

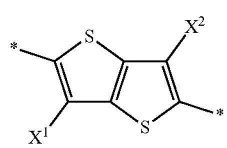

AR6

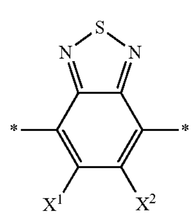

-continued

AR7

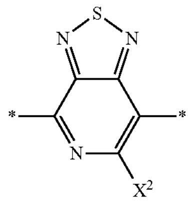

AR8

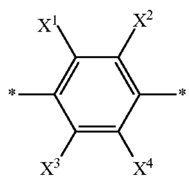

AR9

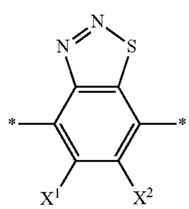

-continued

AR10

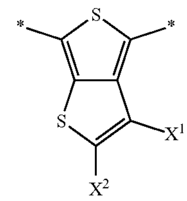

AR11

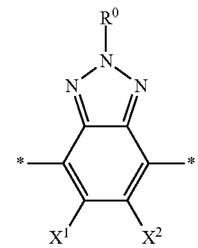

wherein $X^1$, $X^2$, $X^3$ and $X^4$ have one of the meanings given for $R^1$ above and below, and preferably denote alkyl, alkoxy, carbonyl, carbonyloxy, CN, H, F or Cl.

Preferred formulae AR1, AR2, AR5, AR6, AR7, AR8, AR9, AR10 and AR11 are those containing at least one, preferably one, two or four substituents $X^{1-4}$ selected from F and Cl, very preferably F.

Very preferred compounds of formula NI, I, IA and I1-I6 are selected from the following subformulae

I1-1

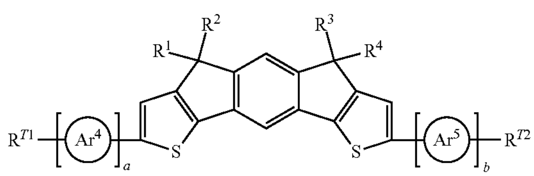

I1-2

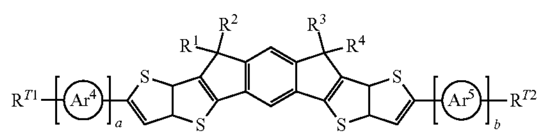

I1-3

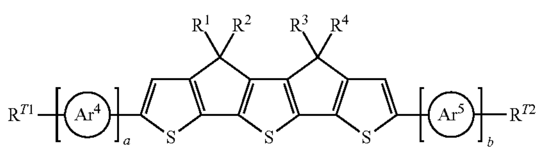

I1-4

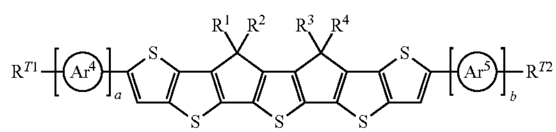

I1-5

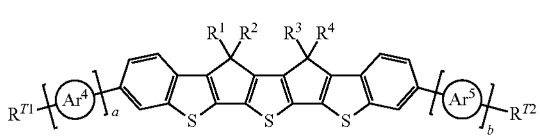

I1-6

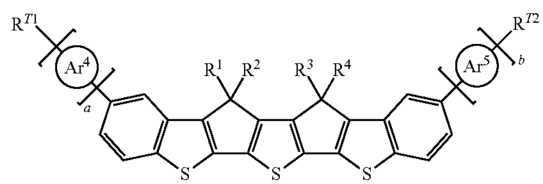

I1-7

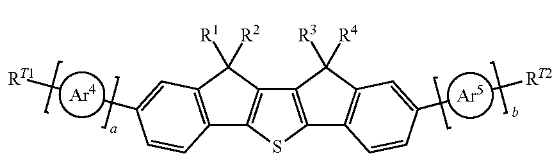

I1-8

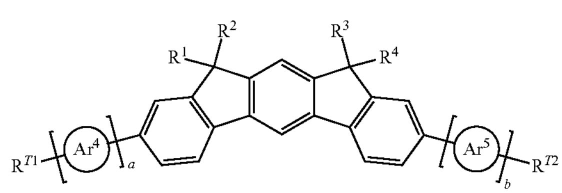

-continued
I1-9
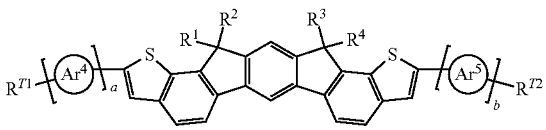
I1-10
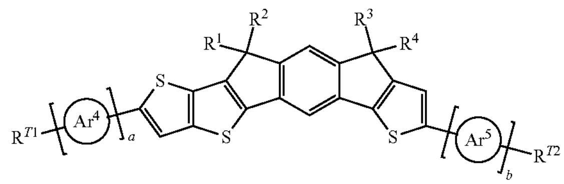
I1-11
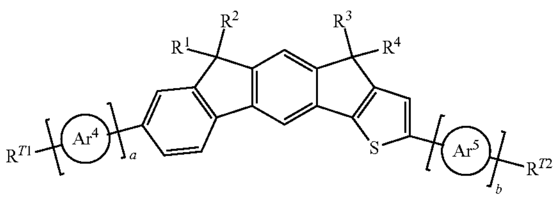
I1-12
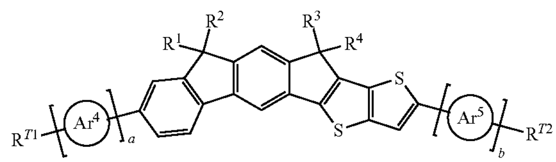
I1-13
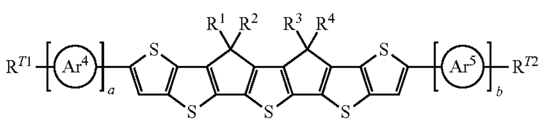
I2-1
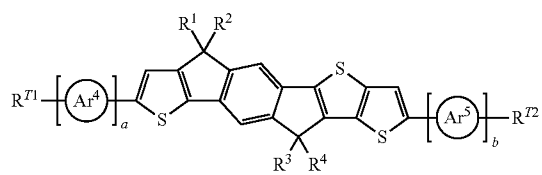
I2-2
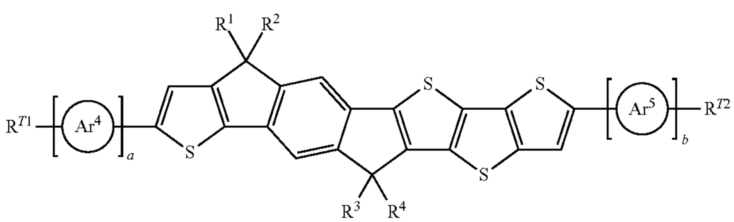
I2-3
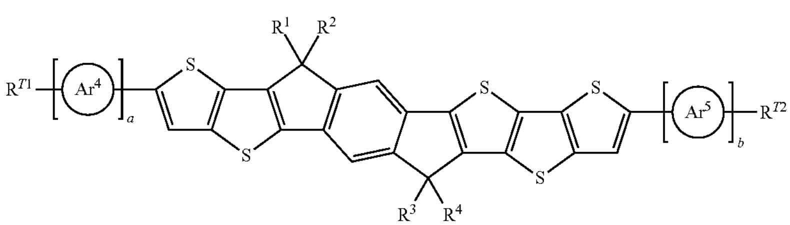
I2-4
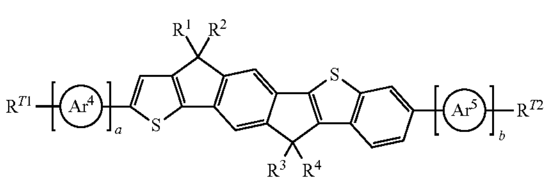
I2-5
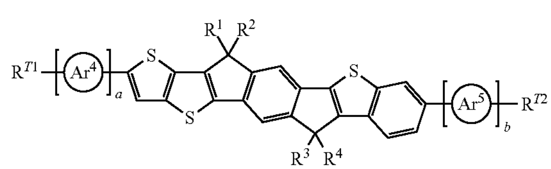
I2-6
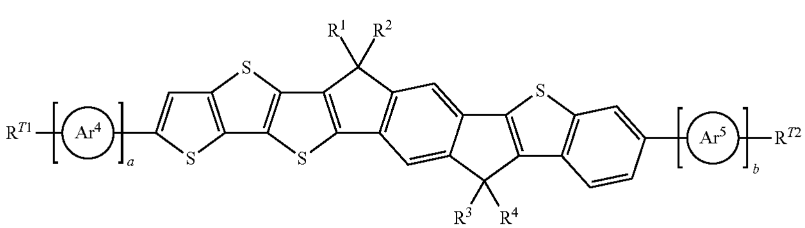

-continued
I2-7
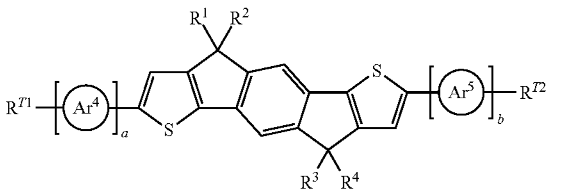
I2-8
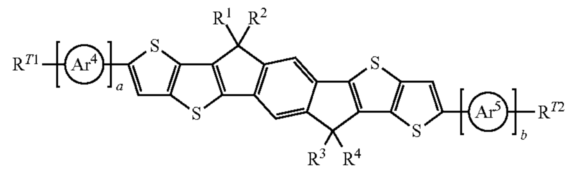
I3-1
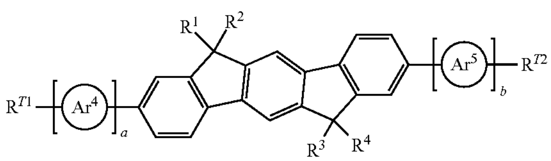
I3-2
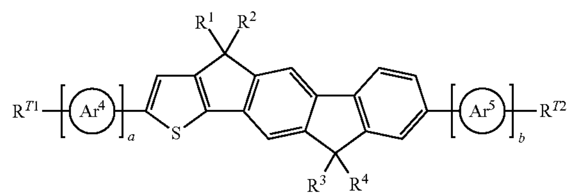
I3-3
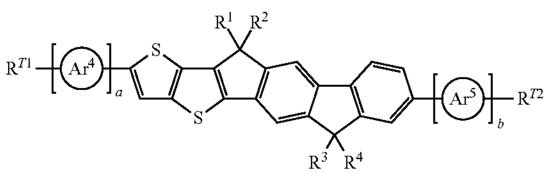
I3-4
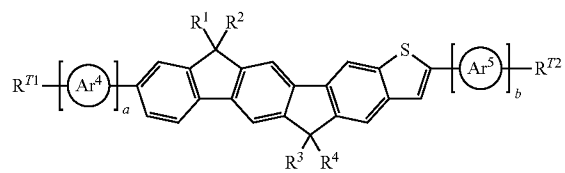
I3-5
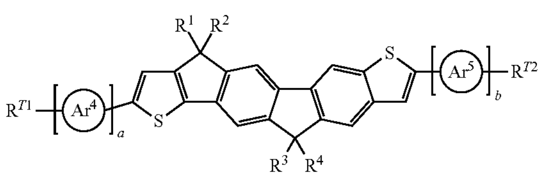
I3-6
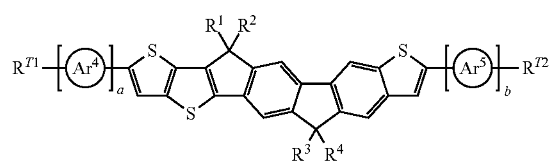
I3-7
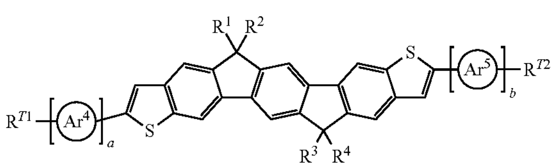
I3-8
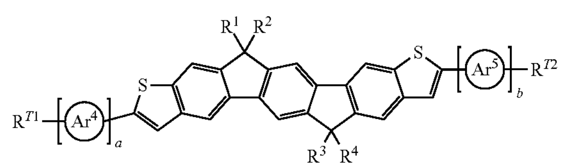
I3-9
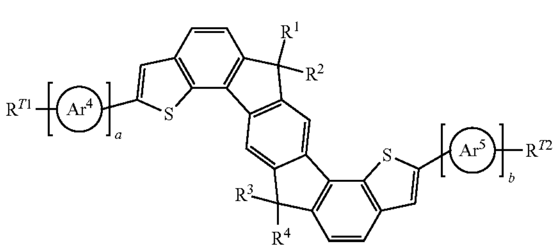
I3-10
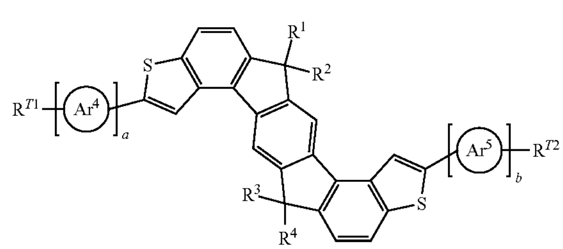
I3-11
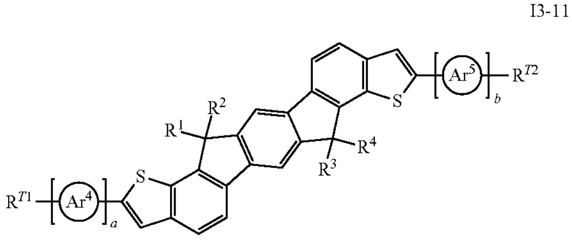
I3-12
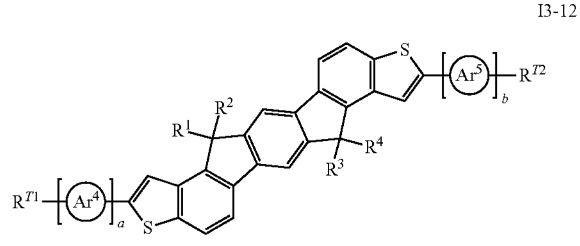

-continued
I4-1
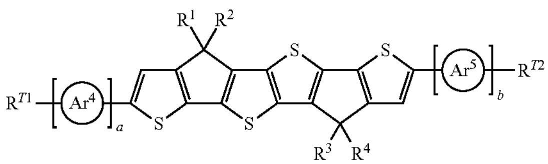
I4-2
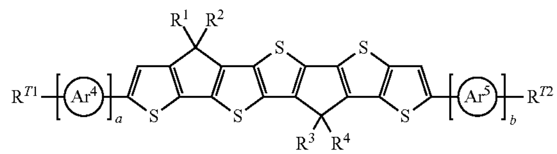
I4-3
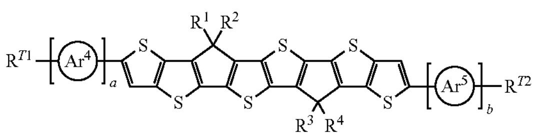
I4-4
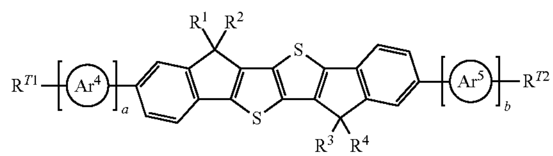
I4-5
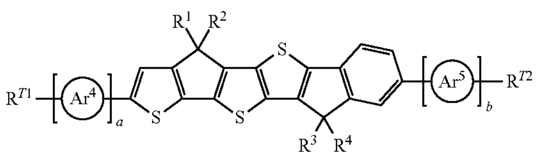
I4-6
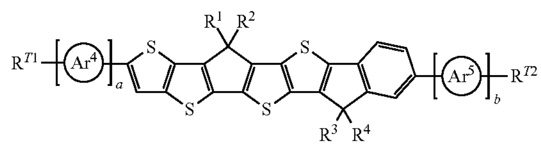
I4-7
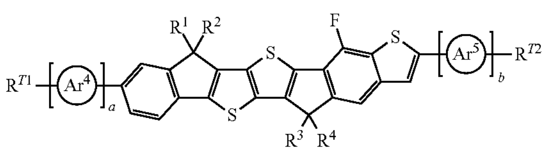
I4-8
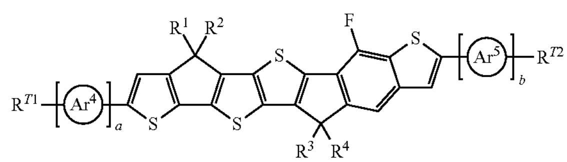
I4-9
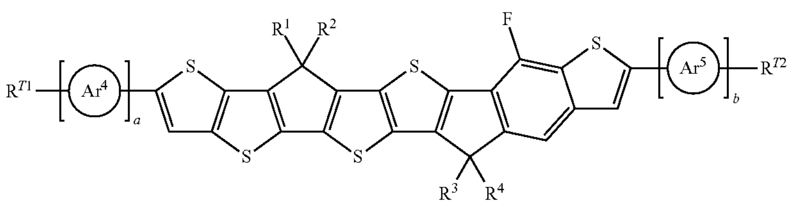
I4-10
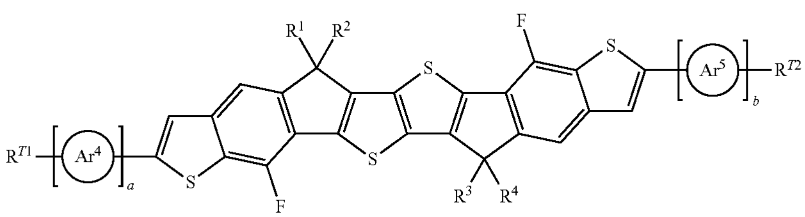
I4-11
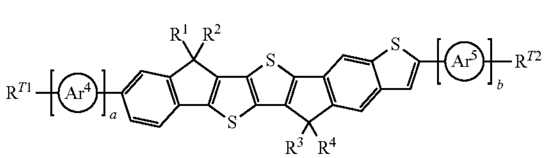
I4-12
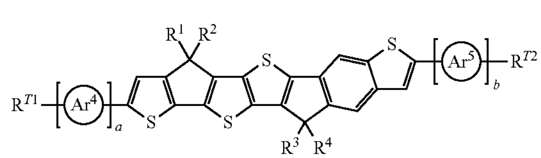
I4-13
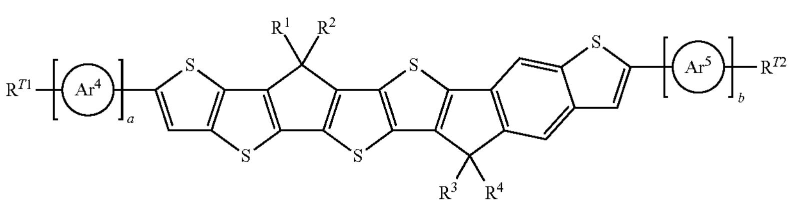

-continued
I4-14
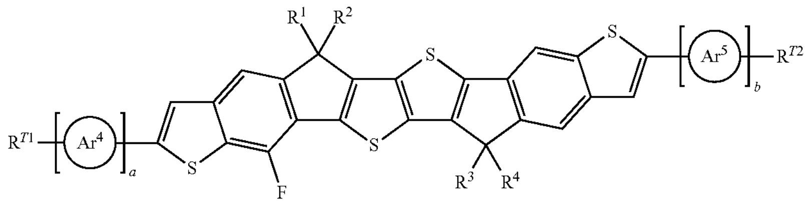
I4-15
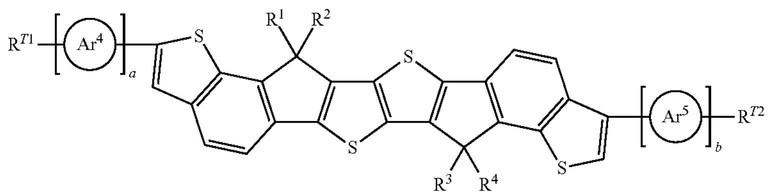
I4-16
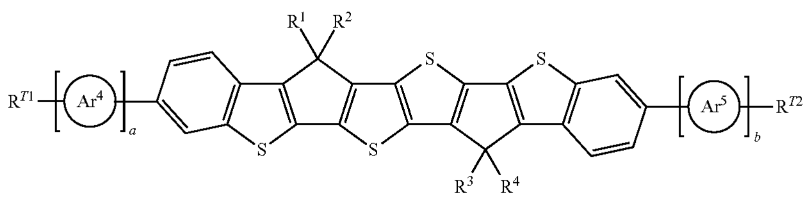
I4-17
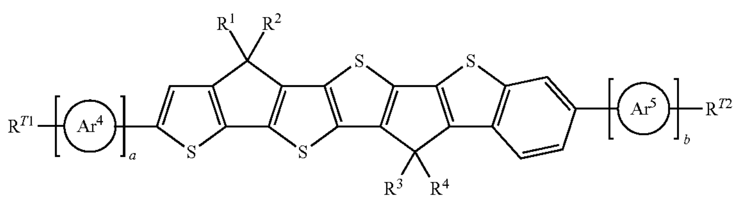
I4-18
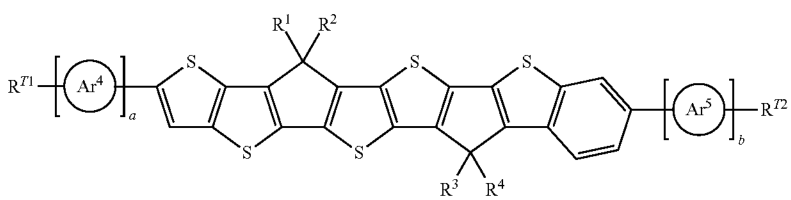
I4-19
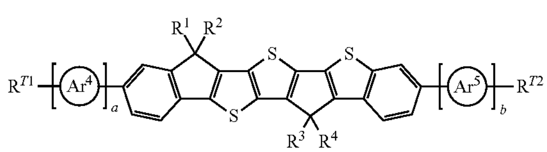
I5-1
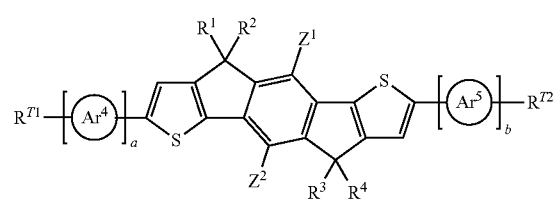
I5-2
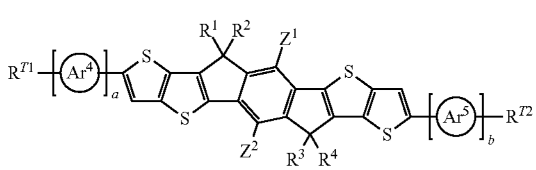
I5-3
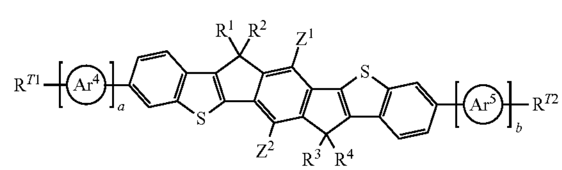
I5-4
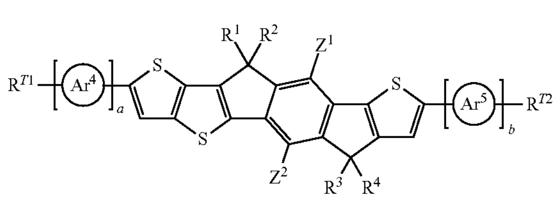
I5-5
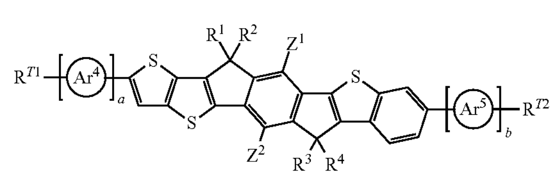

-continued
I5-6
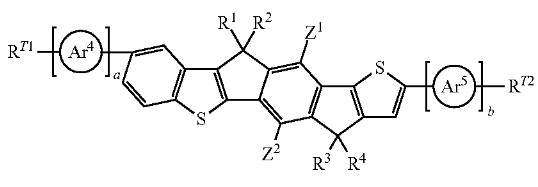
I5-7
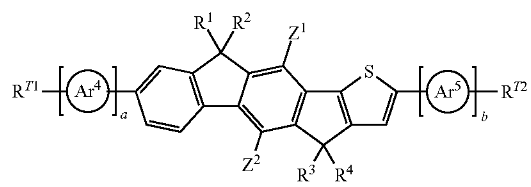
I5-8
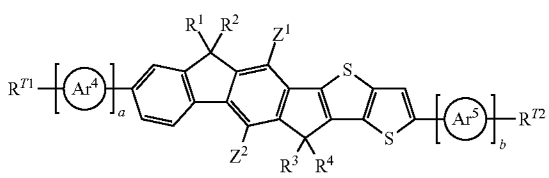
I5-9
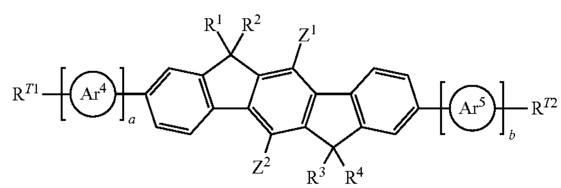
I5-10
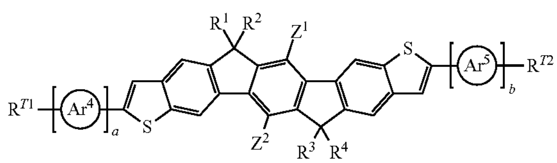
I5-11
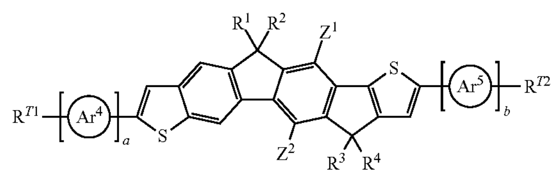
I5-12
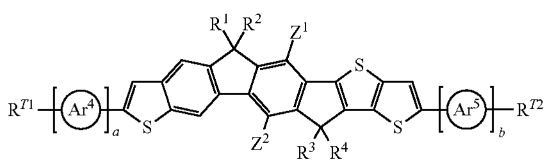
I5-13
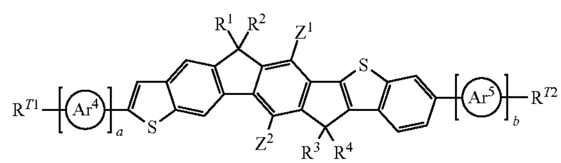
I5-14
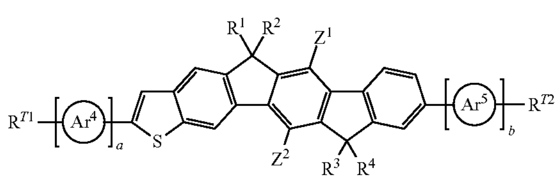
I5-15
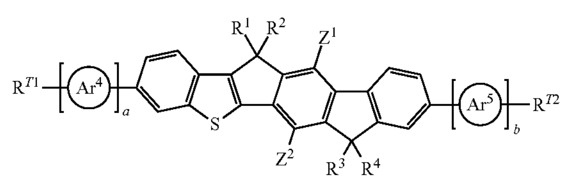
I5-16
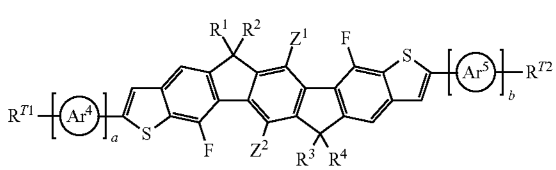
I6-1
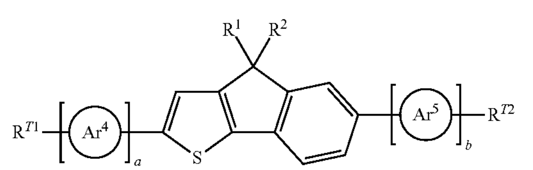
I6-2
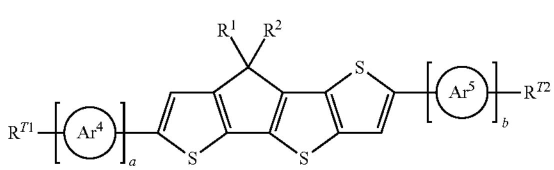
I6-3
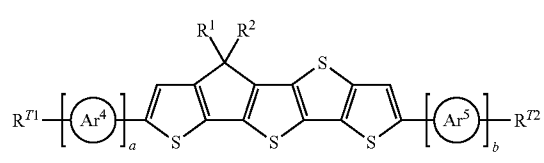
I6-4
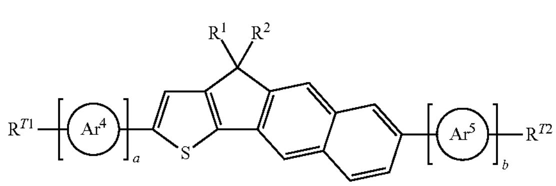
I6-5
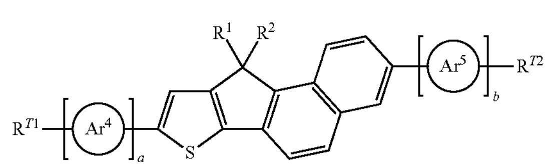

-continued
I6-6
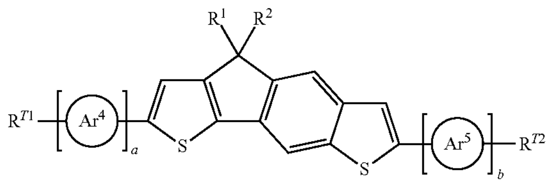
I6-8
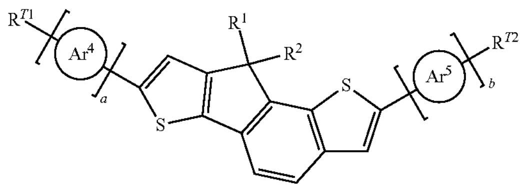
I6-10
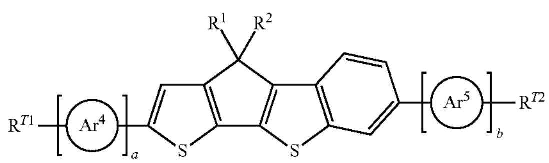
I6-12
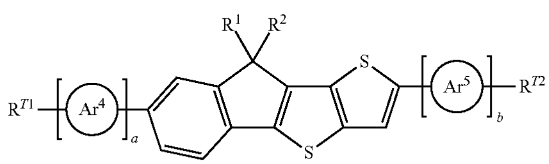
I6-14
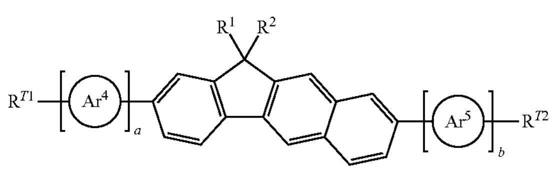
I6-16
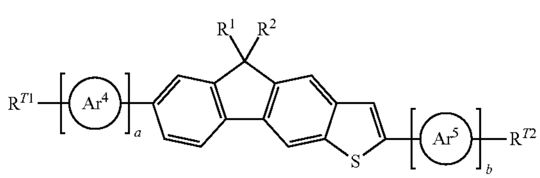
I6-18
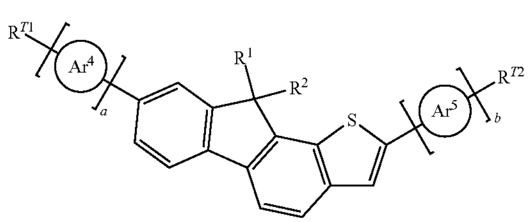
I6-20
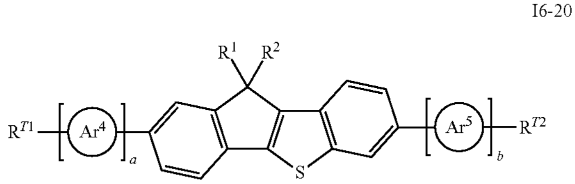
I6-7
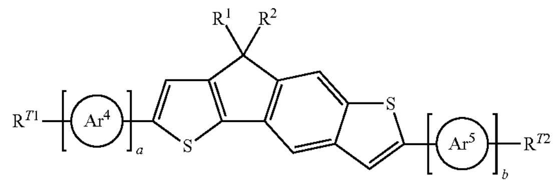
I6-9
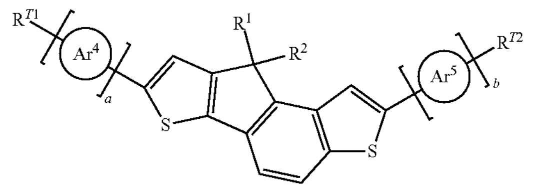
I6-11
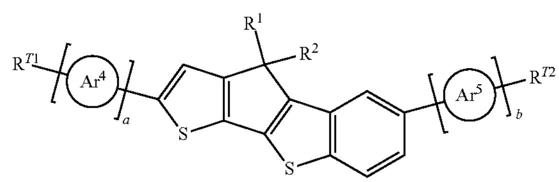
I6-13
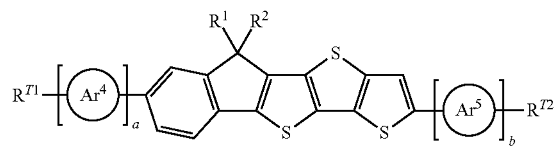
I6-15
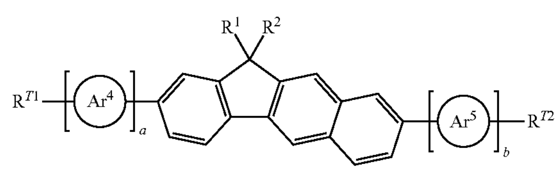
I6-17
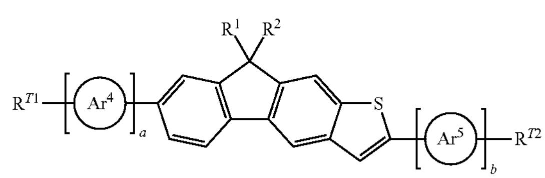
I6-19
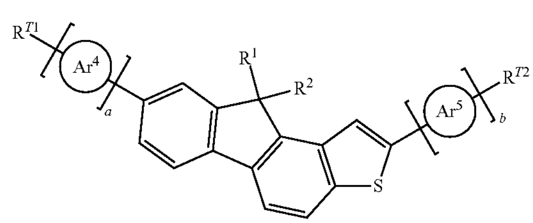
I6-21
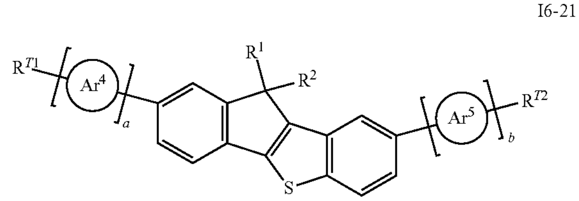

-continued

I6-22

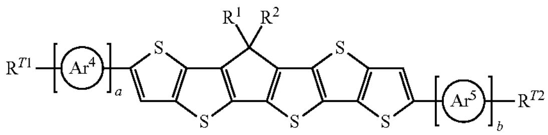

I6-23

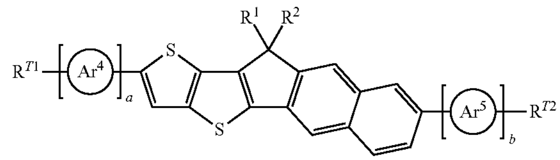

I6-24

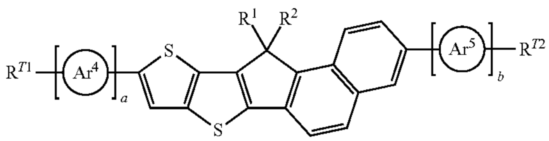

I6-25

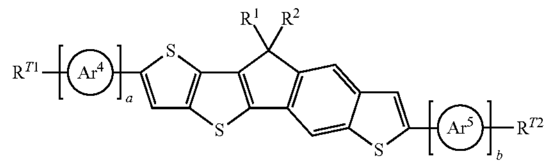

I6-26

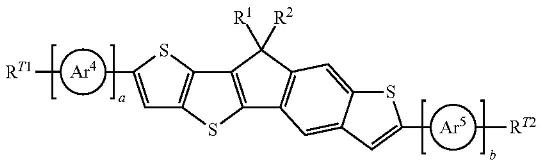

I6-27

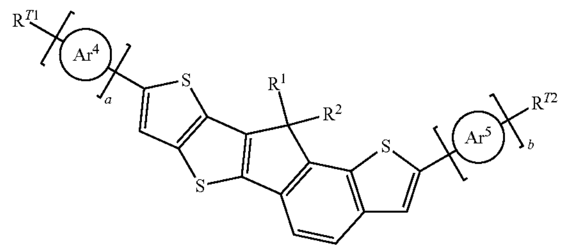

I6-28

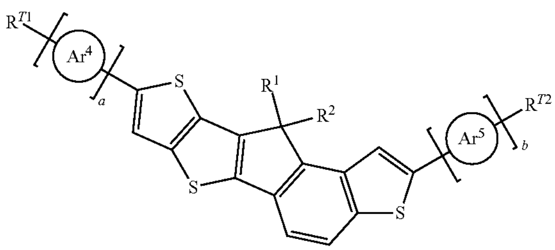

I6-29

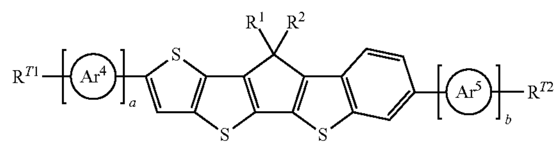

I6-30

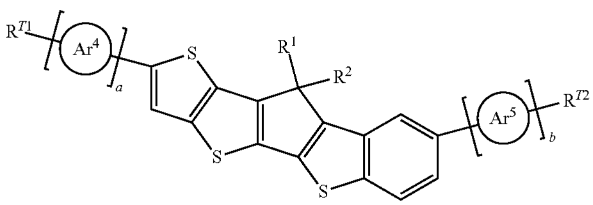

wherein $R^1$, $R^2$, $R^3$, $R^4$, $R^{T1}$, $R^{T2}$, $Ar^4$, $Ar^5$, $Z^1$, $Z^2$, a and b have the meanings given above.

In the compounds of formula NI, I, IA and I1-I6 and their subformulae, the electron withdrawing groups $Z^1$ and $Z^2$ are preferably selected from the group consisting of F, Cl, Br, —$NO_2$, —CN, —$CF_3$, —$CF_2$—R*, —$SO_2$—R*, —$SO_3$—R*, —C(═O)—H, —C(═O)—R*, —C(═S)—R*, —C(═O)—$CF_2$—R*, —C(═O)—OR*, —C(═S)—OR*, —O—C(═O)—R*, —O—C(═S)—R*, —C(═O)—SR*, —S—C(═O)—R*, —C(═O)NR*R**, —NR*—C(═O)—R*, —CH═CH(CN), —CH═C$(CN)_2$, —C(CN)═C$(CN)_2$, —CH═C(CN)($R^a$), CH═C(CN)—C(═O)—OR*, —CH═C$(CO—OR^*)_2$, —CH═C$(CO—NR^*R^{**})_2$, wherein $R^a$ is aryl or heteroaryl, each having from 4 to 30 ring atoms, optionally containing fused rings and being unsubstituted or substituted with one or more groups L as defined above, or $R^a$ has one of the meanings of L, R* and R** independently of each other denote alkyl with 1 to 20 C atoms which is straight-chain, branched or cyclic, and is unsubstituted, or substituted with one or more F or Cl atoms or CN groups, or perfluorinated, and in which one or more C atoms are optionally replaced by —O—, —S—, —C(═O)—, —C(═S)—, —$SiR^0R^{00}$—, —$NR^0R^{00}$—, —$CHR^0$═$CR^{00}$— or —C≡C-such that O- and/or S-atoms are not directly linked to each other, or R* and R** have one of the meanings given for $R^a$, and $R^0$ and $R^{00}$ are as defined above.

Preferably $Z^1$ and $Z^2$ denote F, Cl, Br, $NO_2$, CN or $CF_3$, very preferably F, Cl or CN, most preferably F.

In the compounds of formula NI, I, IA and I1-I6 and their subformulae, the groups $R^{T1}$ and $R^{T2}$ are preferably selected from H, F, Cl, Br, —$NO_2$, —ON, —$CF_3$, R*, —$CF_2$—R*, —O—R*, —S—R*, —$SO_2$—R*, —$SO_3$—R*, —C(═O)—H, —C(═O)—R*, —C(═S)—R*, —C(═O)—$CF_2$—R*, —C(═O)—OR*, —C(═S)—OR*, —O—C(═O)—R*, —O—C(═S)—R*, —C(═O)—SR*, —S—C(═O)—R*, —C(═O)NR*R**, —NR*—C (═O)—R*, —NHR*, —NR*R**, —CR*═CR*R**, —C≡C—R*, —C≡C—SiR*RR*, —SiR*RR*, —CH═CH(CN), —CH═C(CN)$_2$, —C(CN)═C(CN)$_2$, —CH═C(CN)(R$^a$), CH═C(CN)—C(═O)—OR*, —CH═C(CO—OR*)$_2$, —CH═C(CO—NR*R**)$_2$, and the group consisting of the following formulae
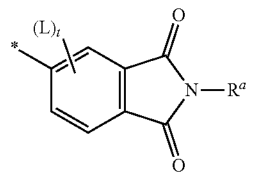
T1
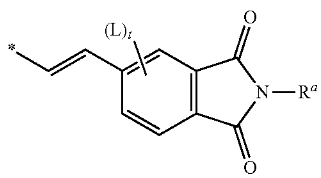
T2
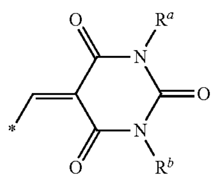
T3
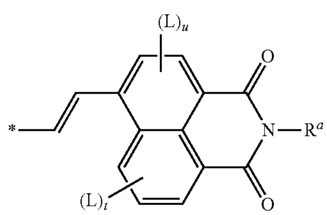
T4
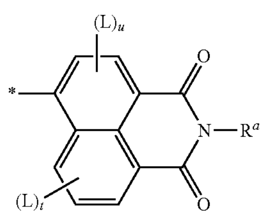
T5
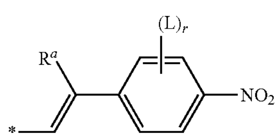
T6
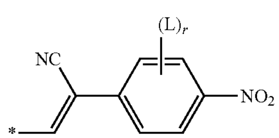
T7
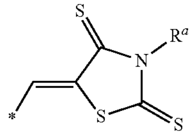
T8
-continued
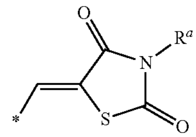
T9
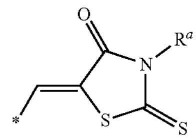
T10
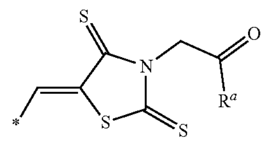
T11
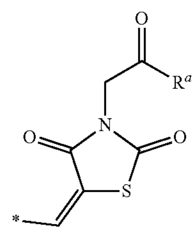
T12
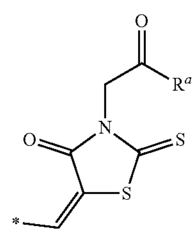
T13
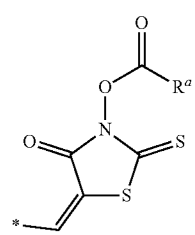
T14
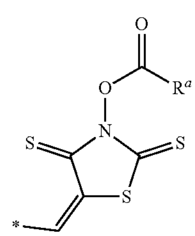
T15
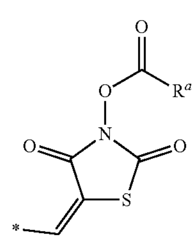
T16

-continued
T17
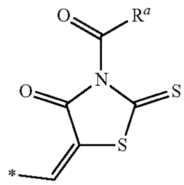
T18
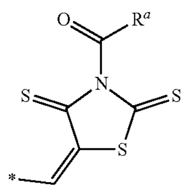
T19
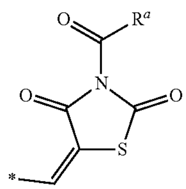
T20
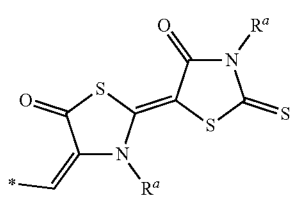
T21
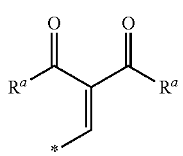
T22
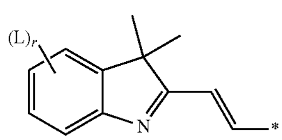
T23
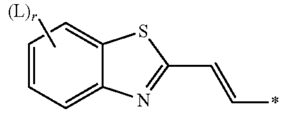
T24
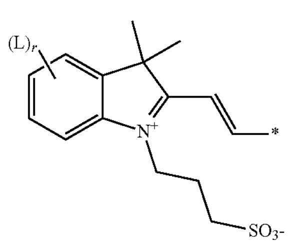
-continued
T25
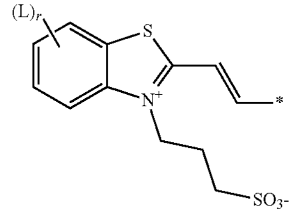
T26
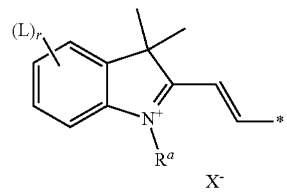
T27
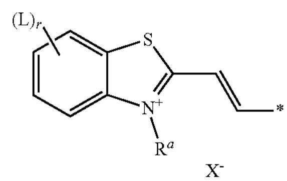
T28
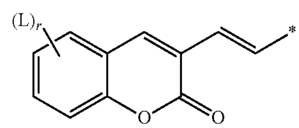
T29
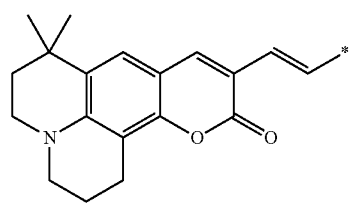
T30
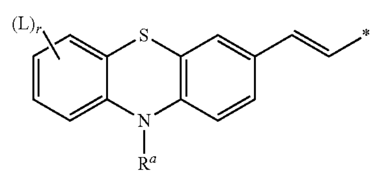
T31
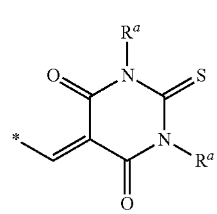
T32
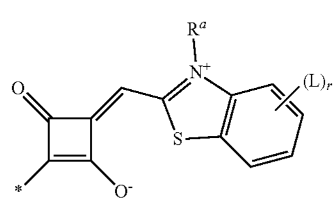

-continued
T33
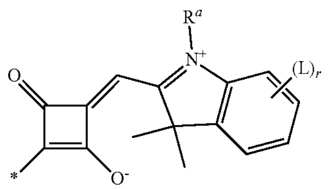
T34
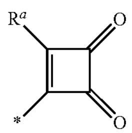
T35
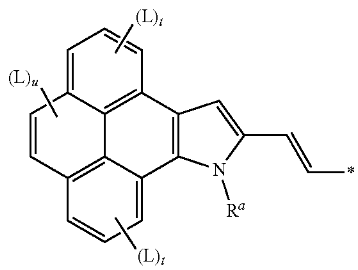
T36
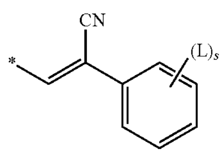
T37
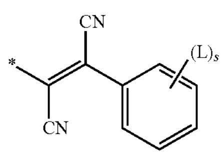
T38
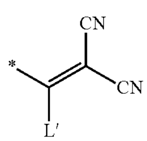
T39
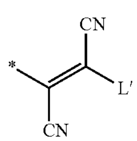
T40
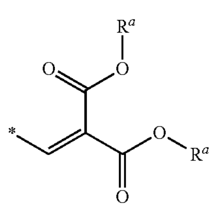
T41
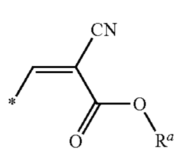
-continued
T42
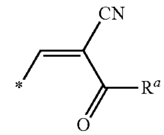
T43
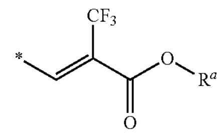
T44
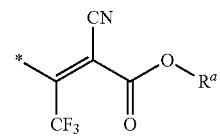
T45
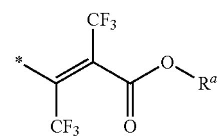
T46
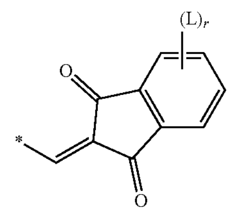
T47
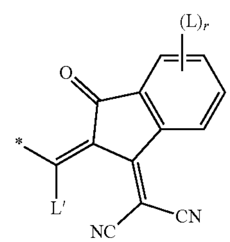
T48
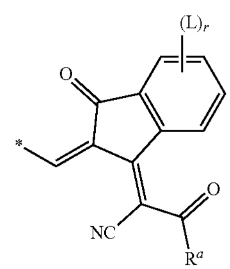
T49
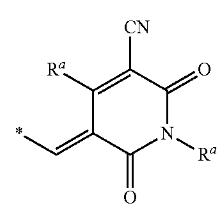

-continued

T50

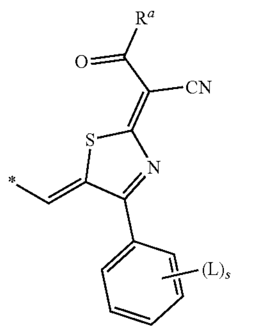

T51

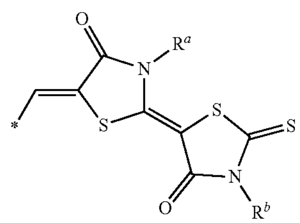

T52

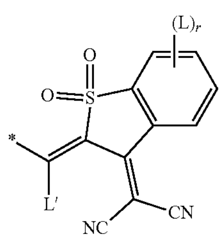

T53

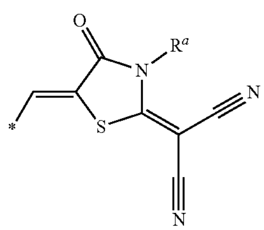

T54

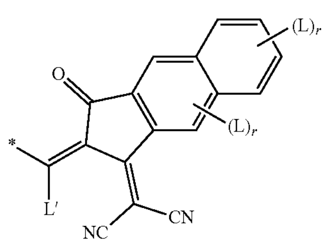

wherein the individual radicals, independently of each other and on each occurrence identically or differently, have the following meanings $R^a$, $R^b$ aryl or heteroaryl, each having from 4 to 30 ring atoms, optionally containing fused rings and being unsubstituted or substituted with one or more groups L, or one of the meanings given for L, R*, R, R* alkyl with 1 to 20 C atoms which is straight-chain, branched or cyclic, and is unsubstituted, or substituted with one or more F or Cl atoms or CN groups, or perfluorinated, and in which one or more C atoms are optionally replaced by —O—, —S—, —C(═O)—, —C(═S)—, $—SiR^0R^{00}—$, $—NR^0R^{00}—$, $—CHR^0═CR^{00}—$ or —C≡C— such that 0- and/or S-atoms are not directly linked to each other, or R*, R and R* have one of the meanings given for $R^a$, L F, Cl, $—NO_2$, —CN, —NC, —NCO, —NCS, —OCN, —SCN, $R^0$, $OR^0$, $SR^0$, $—C(═O)X^0$, $—C(═O)R^0$, $—C(═O)—OR^0$, $—O—C(═O)—R^0$, $—NH_2$, $—NHR^0$, $—NR^0R^{00}$, $—C(═O)NHR^0$, $—C(═O)NR^0R^{00}$, $—SO_3R^0$, $SO_2R^0$, —OH, $—NO_2$, $—CF_3$, $—SF_5$, or optionally substituted silyl, or carbyl or hydrocarbyl with 1 to 30, preferably 1 to 20 C atoms that is optionally substituted and optionally comprises one or more hetero atoms, preferably F, —CN, $R^0$, $—OR^0$, $—SR^0$, $—C(═O)—R^0$, $—C(═O)—OR^0$, $—O—C(═O)—R^0$, $—O—C(═O)—OR^0$, $C(═O)—NHR^0$, $—C(═O)—NR^0R^{00}$, L' H or one of the meanings of L, $R^0$, $R^{00}$H or straight-chain or branched alkyl with 1 to 20, preferably 1 to 12 C atoms that is optionally fluorinated, $Y^1$, $Y^2$H, F, Cl or CN, $X^0$ halogen, preferably F or Cl, r 0, 1, 2, 3 or 4, s 0, 1, 2, 3, 4 or 5, t 0, 1, 2 or 3, u 0, 1 or 2, and wherein at least one of $R^{T1}$ and $R^{T2}$ denotes an electron withdrawing group.

Preferred compounds of formula NI, I, IA and I1-I6 and their subformulae are those wherein both of $R^{T1}$ and $R^{T2}$ denote an electron withdrawing group.

Preferred electron withdrawing groups $R^{T1}$ and $R^{T2}$ are selected from —CN, —C(═O)—OR*, —C(═S)—OR*, —CH═CH(CN), $—CH═C(CN)_2$, $—C(CN)═C(CN)_2$, $—CH═C(CN)(R^a)$, CH═C(CN)—C(═O)—OR*, $—CH═C(CO—OR*)_2$, and formulae T1-T54.

Very preferred groups $R^{T1}$ and $R^{T2}$ are selected from the following formulae

T3

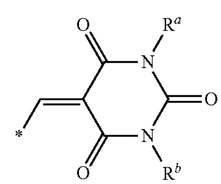

T10

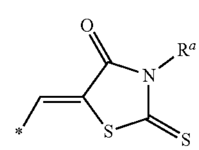

T31

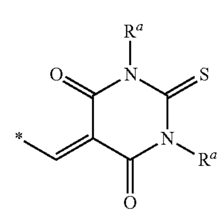

T36

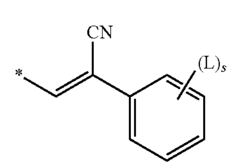

-continued

T37

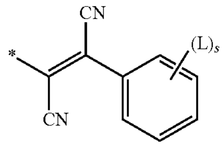

T38

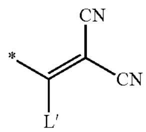

T39

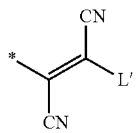

T47

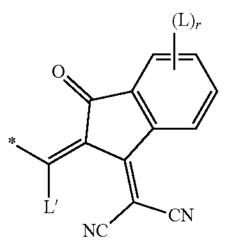

T52

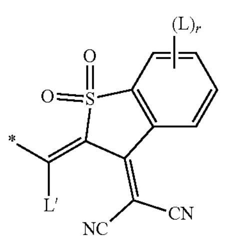

wherein L, L', $R^a$ r and s have the meanings given above and below. Preferably in these formulae L' is H. Further preferably in these formulae r is 0.

The above formulae T1-T54 are meant to also include their respective E- or Z-stereoisomer with respect to the C═C bond in α-position to the adjacent group $Ar^4$ or $Ar^5$, thus for example the group

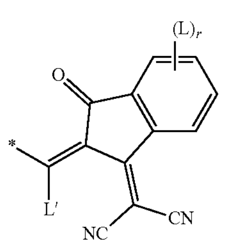

may also denote

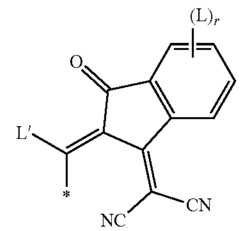

In the compounds of formula NI, I, IA, I1-I6 and their subformulae preferably $R^{1-4}$ are different from H.

In a preferred embodiment of the present invention, $R^{1-4}$ in formula NI, I, IA, I1-I6 and their subformulae are selected from F, Cl or straight-chain or branched alkyl, alkoxy, sulfanylalkyl, sulfonylalkyl, alkylcarbonyl, alkoxycarbonyl and alkylcarbonyloxy, each having 1 to 20 C atoms and being unsubstituted or substituted by one or more F atoms.

In another preferred embodiment of the present invention, $R^{1-4}$ in formula NI, I, IA, I1-I6 and their subformulae are selected from mono- or polycyclic aryl or heteroaryl, each of which is optionally substituted with one or more groups L as defined in formula NI and I and has 4 to 30 ring atoms, and wherein two or more rings may be fused to each other or connected with each other by a covalent bond.

In a preferred embodiment of the present invention, $R^{5-10}$ in formula NI, I, IA, I1-I6 and their subformulae denote H.

In another preferred embodiment of the present invention, at least one of $R^{5-10}$ in formula NI, I, IA, I1-I6 and their subformulae is different from H.

In a preferred embodiment of the present invention, $R^{5-10}$ in formula NI, I, IA, I1-I6 and their subformulae, when being different from H, are selected from F, Cl or straight-chain or branched alkyl, alkoxy, sulfanylalkyl, sulfonylalkyl, alkylcarbonyl, alkoxycarbonyl and alkylcarbonyloxy, each having 1 to 20 C atoms and being unsubstituted or substituted by one or more F atoms.

In another preferred embodiment of the present invention, $R^{5-10}$ in formula NI, I, IA, I1-I6 and their subformulae, when being different from H, are selected from aryl or heteroaryl, each of which is optionally substituted with one or more groups $R^S$ as defined in formula NI, I and has 4 to 30 ring atoms.

Preferred aryl and heteroaryl groups $R^{1-10}$ are selected from the following formulae

C1

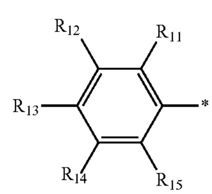

C2

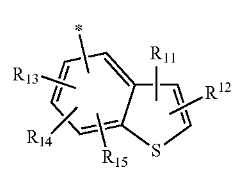

-continued
C3
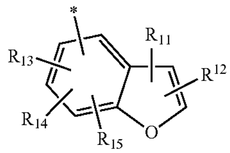
C4
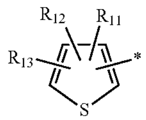
C5
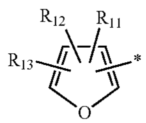
C6
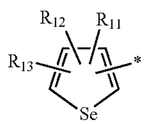
C7
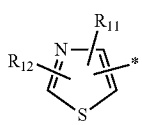
C8
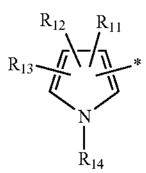
C9
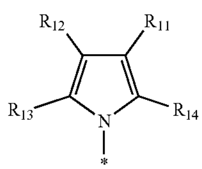
C10
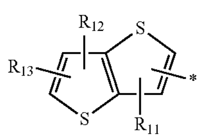
C11
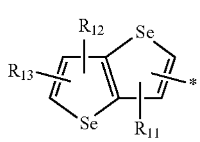
C12
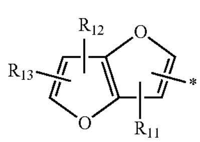
C13
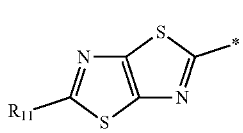
-continued
C14
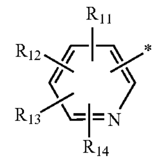
C15
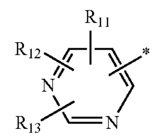
C16
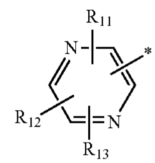
C17
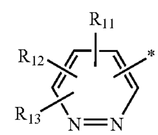
C18
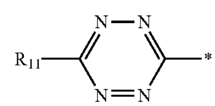
C19
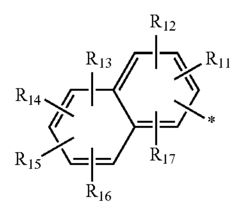
C20
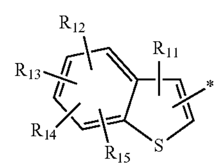
C21
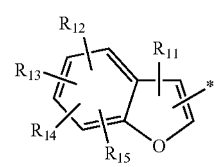
C22
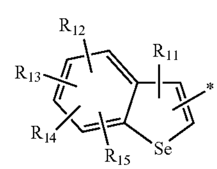

-continued

C23

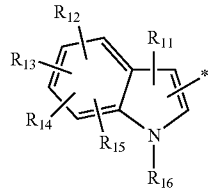

C24

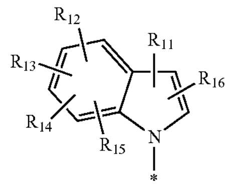

C25

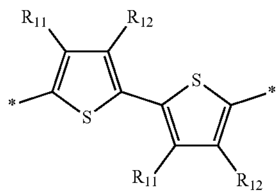

C26

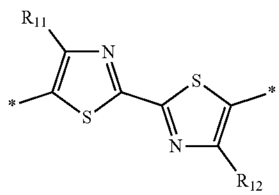

C27

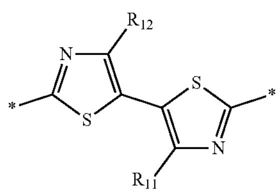

wherein $R^{11-17}$, independently of each other, and on each occurrence identically or differently, denote H or have one of the meanings of L or $R^1$ as given above and below.

Very preferred aryl and heteroaryl groups $R^{1-10}$ are selected from the following formulae

C1-1

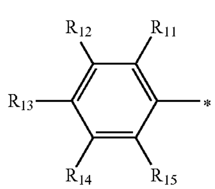

C4-1

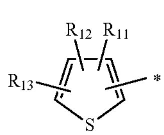

C5-1

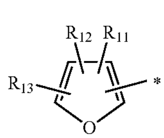

-continued

C7-1

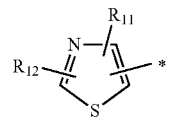

C10-1

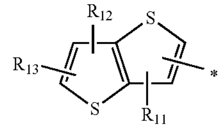

wherein $R^{11-15}$ are as defined above. Most preferably $R_1$-$R_{10}$ are selected from formulae SUB7-SUB14 as defined above.

In another preferred embodiment one or more of $R^{1-10}$ in the compounds of formula NI, I, IA, I1-I6 and their subformulae denote a straight-chain, branched or cyclic alkyl group with 1 to 50, preferably 2 to 50, very preferably 2 to 30, more preferably 2 to 24, most preferably 2 to 16 C atoms, in which one or more $CH_2$ or $CH_3$ groups are replaced by a cationic or anionic group.

The cationic group is preferably selected from the group consisting of phosphonium, sulfonium, ammonium, uronium, thiouronium, guanidinium or heterocyclic cations such as imidazolium, pyridinium, pyrrolidinium, triazolium, morpholinium or piperidinium cation.

Preferred cationic groups are selected from the group consisting of tetraalkylammonium, tetraalkylphosphonium, N-alkylpyridinium, N,N-dialkylpyrrolidinium, 1,3-dialkylimidazolium, wherein "alkyl" preferably denotes a straight-chain or branched alkyl group with 1 to 12 C atoms and very preferably is selected from formulae SUB1-6.

Further preferred cationic groups are selected from the group consisting of the following formulae

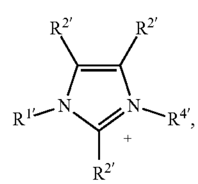

imidazolium

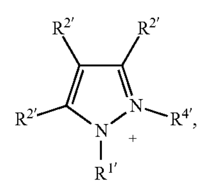

1H-pyrazolium

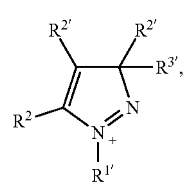

3H-pyrazolium

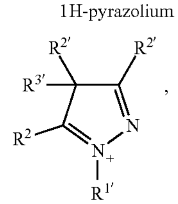

4H-pyrazolium

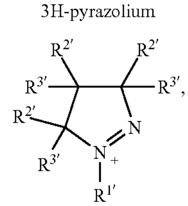

1-pyrazolinium

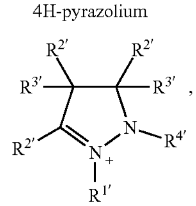

2-pyrazolinium

-continued

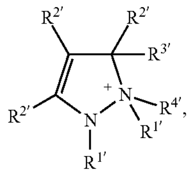
3-pyrazolinium

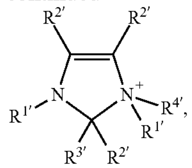
2,3-dihydroimidazolinium

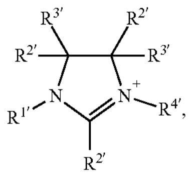
4,5-dihyroimidazolinium

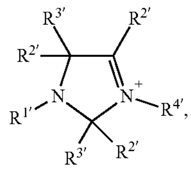
2,5-dihyroimidazolinium

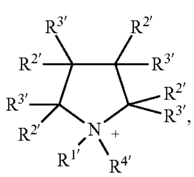
pyrrolidinium

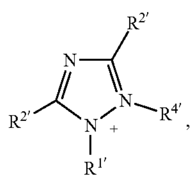
1,2,4-triazolium

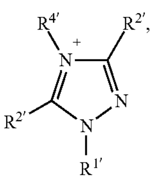
1,2,4-triazolium

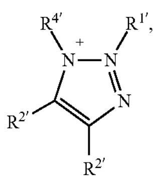
1,2,3-triazolium

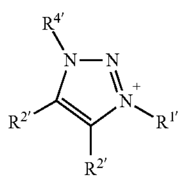
1,2,3-triazolium

,

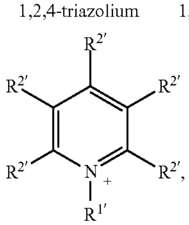
pyridinium

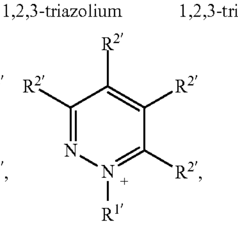
pyridazinium

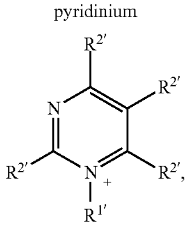
pyrimidinium

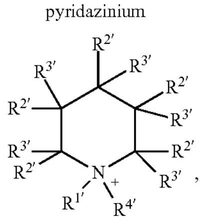
piperidinium

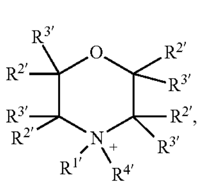
morpholinium

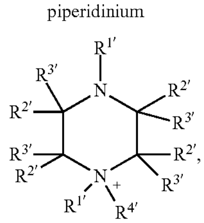
piperazinium

-continued

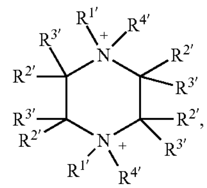
piperazinium

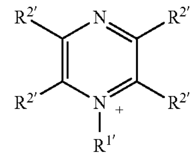
pyrazinium

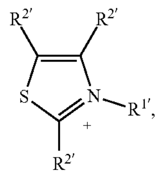
thiazolium

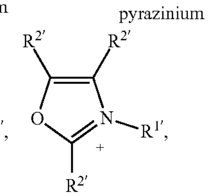
oxazolium

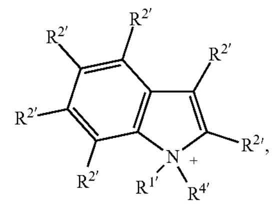
indolium

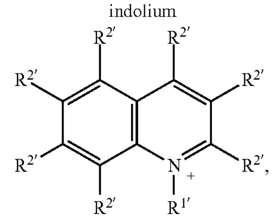
quinolinium

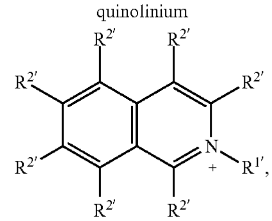
isoquinolinium

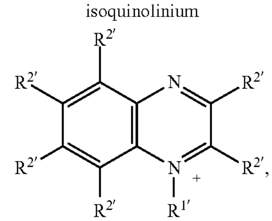
or quinoxalinium

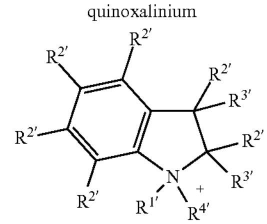
indolinium wherein $R^{1\prime}$, $R^{2\prime}$, $R^{3\prime}$ and $R^{4\prime}$ denote, independently of each other, H, a straight-chain or branched alkyl group with 1 to 12 C atoms or non-aromatic carbo- or heterocyclic group or an aryl or heteroaryl group, each of the aforementioned groups having 3 to 20, preferably 5 to 15, ring atoms, being mono- or polycyclic, and optionally being substituted by one or more identical or different substituents L as defined above, or denote a link to the respective group $R^{1-10}$.

In the above cationic groups of the above-mentioned formulae any one of the groups $R^{1'}$, $R^{2'}$, $R^{3'}$ and $R^{4'}$ (if they replace a $CH_3$ group) can denote a link to the respective group $R^{1-10}$, or two neighbored groups $R^{1'}$, $R^{2'}$, $R^{3'}$ or $R^{4'}$ (if they replace a $CH_2$ group) can denote a link to the respective group $R^{1-10}$.

The anionic group is preferably selected from the group consisting of borate, imide, phosphate, sulfonate, sulfate, succinate, naphthenate or carboxylate, very preferably from phosphate, sulfonate or carboxylate.

In a preferred embodiment of the present invention the groups $R^{T1}$ and $R^{T2}$ in formula NI, I, IA, I1-I6 and their subformulae are selected from alkyl with 1 to 16 C atoms which is straight-chain, branched or cyclic, and is unsubstituted, substituted with one or more F or Cl atoms or CN groups, or perfluorinated, and in which one or more C atoms are optionally replaced by —O—, —S—, —C(O)—, —C(S)—, —$SiR^0R^{00}$—, —$NR^0R^{00}$—, —$CHR^0$═$CR^{00}$— or —C≡C-such that O- and/or S-atoms are not directly linked to each other.

Further preferred compounds of formula NI, I, IA, I1-I6 and their subformulae are selected from the following preferred embodiments or any combination thereof:

U, $U^1$ and $U^2$ are $CR^1R^2$ or $SiR^1R^2$, or $CR^3R^4$ or $SiR^3R^4$, respectively, U, $U^1$ and $U^2$ are $CR^1R^2$ or $CR^3R^4$, respectively, V, $V^1$ and $V^2$ are $CR^3$ or $CR^4$, respectively, V, $V^1$ and $V^2$ are N, m is 1, m is 2, m is 3, m is 4, m is 5, a and b are 1 or 2, a and b are 0, in one or both of $Ar^4$ and $Ar^5$ at least one, preferably one or two of $R^{5-8}$ are different from H, $Ar^4$ and $Ar^5$ denote thiophene, thiazole, thieno[3,2-b]thiophene, thiazolo[5,4-d]thiazole, benzene, 2,1,3-benzothiadiazole, 1,2,3-benzothiadiazole, thieno[3,4-b]thiophene, benzotriazole or thiadiazole[3,4-c]pyridine, $Ar^4$ and $Ar^5$ denote thiophene, thiazole, thieno[3,2-b]thiophene, thiazolo[5,4-d]thiazole, benzene, 2,1,3-benzothiadiazole, 1,2,3-benzothiadiazole, thieno[3,4-b]thiophene, benzotriazole or thiadiazole[3,4-c]pyridine, wherein $X^1$, $X^2$, $X^3$ and $X^4$ are H, $Ar^4$ and $Ar^5$ denote thiophene, thiazole, thieno[3,2-b]thiophene, thiazolothiazole, benzene, 2,1,3-benzothiadiazole, 1,2,3-benzothiadiazole, thieno[3,4-b]thiophene, benzotriazole or thiadiazole[3,4-c]pyridine, wherein one or more of $X^1$, $X^2$, $X^3$ and $X^4$ are different from H, $Z^1$ and $Z^2$ are selected from the group consisting of F, Cl, Br, —$NO_2$, —ON, —$CF_3$, —$CF_2$—R*, —$SO_2$—R*, —$SO_3$—R*, —C(═O)—H, —C(═O)—R*, —C(═S)—R*, —C(═O)—$CF_2$—R*, —C(═O)—OR*, —C(═S)—OR*, —O—C(═O)—R*, —O—C(═S)—R*, —C(═O)—SR*, —S—C(═O)—R*, —C(═O)NR*R**, —NR*—C(═O)—R*, —CH═CH(CN), —CH═C(CN)$_2$, —C(CN)═C(CN)$_2$, —CH═C(CN)($R^a$), CH═C(CN)—C(═O)—OR*, —CH═C(CO—OR*)$_2$, —CH═C(CO—NR*R**)$_2$, wherein R* and $R^a$ have the meanings given above, $Z^1$ and $Z^2$ are F, Cl, Br, —$NO_2$, —ON or —$CF_3$, very preferably F, Cl or CN, most preferably F, $R^1$, $R^2$, $R^3$ and $R^4$ are different from H, $R^1$, $R^2$, $R^3$ and $R^4$ are selected from H, F, Cl or straight-chain or branched alkyl, alkoxy, sulfanylalkyl, sulfonylalkyl, alkylcarbonyl, alkoxycarbonyl and alkylcarbonyloxy, each having 1 to 20 C atoms and being unsubstituted or substituted by one or more F atoms, or alkyl or alkoxy having 1 to 12 C atoms that is optionally fluorinated, $R^1$, $R^2$, $R^3$ and $R^4$ are selected from aryl or heteroaryl, each of which is optionally substituted with one or more groups L as defined in formula NI and I and has 4 to 30 ring atoms, $R^1$, $R^2$, $R^3$ and $R^4$ are selected from phenyl that is optionally substituted, preferably in 3- or 4-position or 3,5-positions, very preferably in 4-position or 3,5-positions, with alkyl or alkoxy having 1 to 20 C atoms, preferably 1 to 16 C atoms, very preferably 4 to 16 C atoms, or thienyl that is optionally substituted, preferably in 5-position with alkyl or alkoxy having 1 to 20 C atoms, preferably 1 to 16 C atoms, very preferably 4 to 16 C atoms, R1, R2, R3 and R4 are selected from 4-alkylphenyl wherein alkyl is C1-16 alkyl, very preferably 4-methylphenyl, 4-hexylphenyl, 4-octylphenyl or 4-dodecylphenyl, or 4-alkoxyphenyl wherein alkoxy is C1-16 alkoxy, most preferably 4-hexyloxyphenyl, 4-octyloxyphenyl or 4-dodecyloxyphenyl or 3,5-dialkylphenyl wherein alkyl is C1-16 alkyl, most preferably 3,5-dihexylphenyl or 3,5-dioctylphenyl or 3,5-dialkoxyphenyl wherein alkoxy is C1-16 alkoxy, most preferably 3,5-dihexyloxyphenyl or 3,5-dioctyloxyphenyl, or 4-thioalkylphenyl wherein thioalkyl is C1-16 thioalkyl, most preferably 4-thiohexylphenyl, 4-thiooctylphenyl or 4-thiododecylphenyl or 3,5-dithioalkylphenyl wherein thioalkyl is C1-16 thioalkyl, most preferably 3,5-dithiohexylphenyl or 3,5-dithiooctylphenyl, or 5-alkylthienyl wherein alkyl is C1-16 alkyl, very preferably 5-hexylthienyl or 5-octylthienyl, L' is H, L, L' denote F, Cl, CN, $NO_2$, or alkyl or alkoxy with 1 to 16 C atoms that is optionally fluorinated, $R^a$ and $R^b$ denote phenyl that is optionally substituted with one or more groups L, $R^a$ and $R^b$ denote alkyl with 1 to 20 C atoms which is straight-chain, branched or cyclic, and is unsubstituted, or substituted with one or more F or Cl atoms or CN groups, or perfluorinated, and in which one or more C atoms are optionally replaced by —O—, —S—, —C(═O)—, —C(═S)—, —$SiR^0R^{00}$—, —$NR^0R^{00}$—, —$CHR^0$═$CR^{00}$— or —C≡C— such that O- and/or S-atoms are not directly linked to each other, $R^{5-10}$, when being different from H, are selected from F, Cl or straight-chain or branched alkyl, alkoxy, sulfanylalkyl, sulfonylalkyl, alkylcarbonyl, alkoxycarbonyl and alkylcarbonyloxy, each having 1 to 20 C atoms and being unsubstituted or substituted by one or more F atoms, without being perfluorinated, preferably from F, or alkyl or alkoxy having 1 to 16 C atoms that is optionally fluorinated.

In another preferred embodiment of the present invention the photoactive layer of the OPD contains an n-type OSC compound which does not contain a fullerene moiety, which is selected from naphthalene or perylene derivatives.

Preferred naphthalene or perylene derivatives for use as n-type OSC compounds are described for example in *Adv. Sci.* 2016, 3, 1600117, *Adv. Mater.* 2016, 28, 8546-8551, *J. Am. Chem. Soc.,* 2016, 138, 7248-7251 and *J. Mater. Chem.* A, 2016, 4, 17604.
Preferred n-type OSC compounds of this preferred embodiment are selected from the following formulae
NDI1
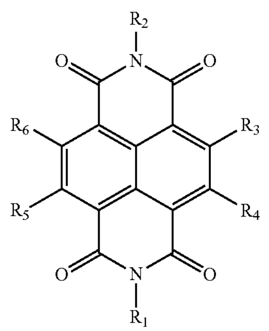
NDI2
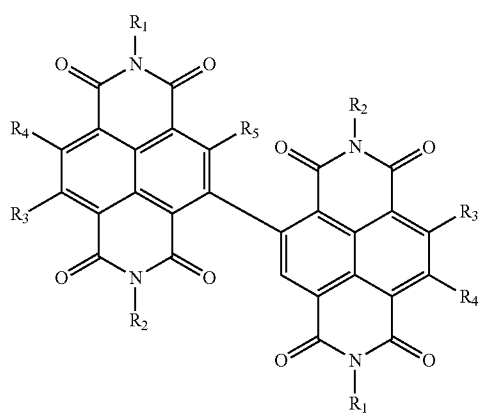
NDI3
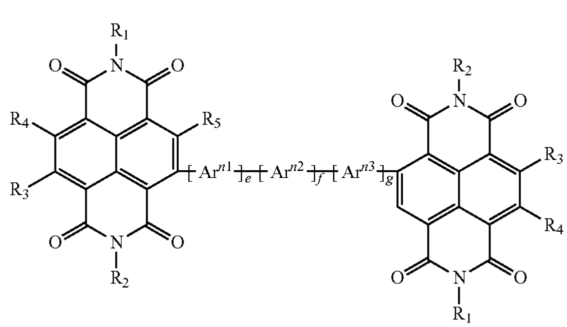
-continued
NDI4
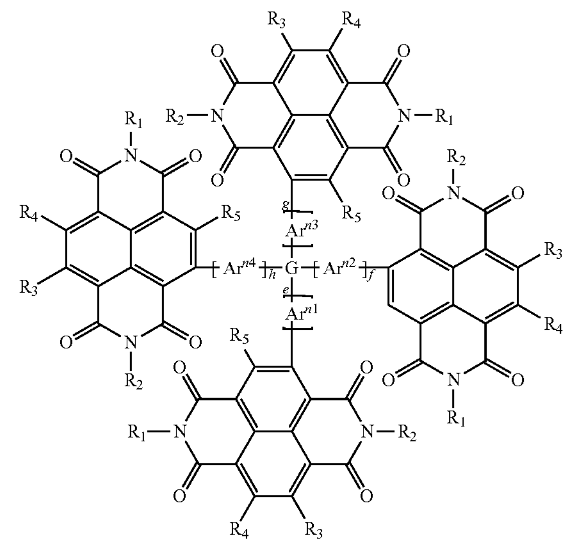
PDI1
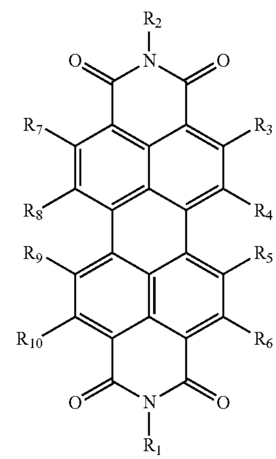
PDI2
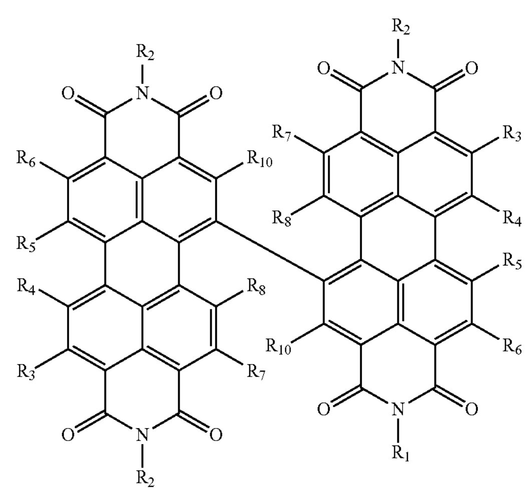

-continued
PDI3
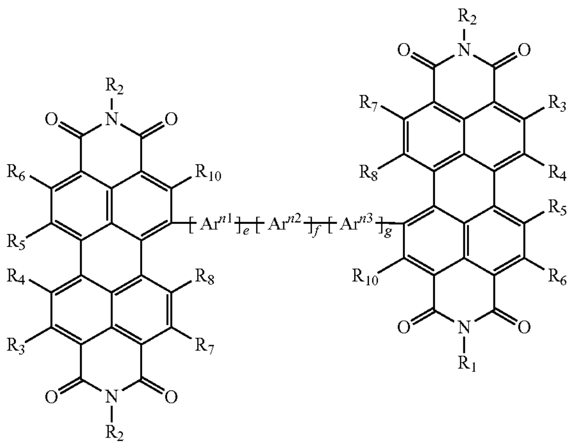
PDI4
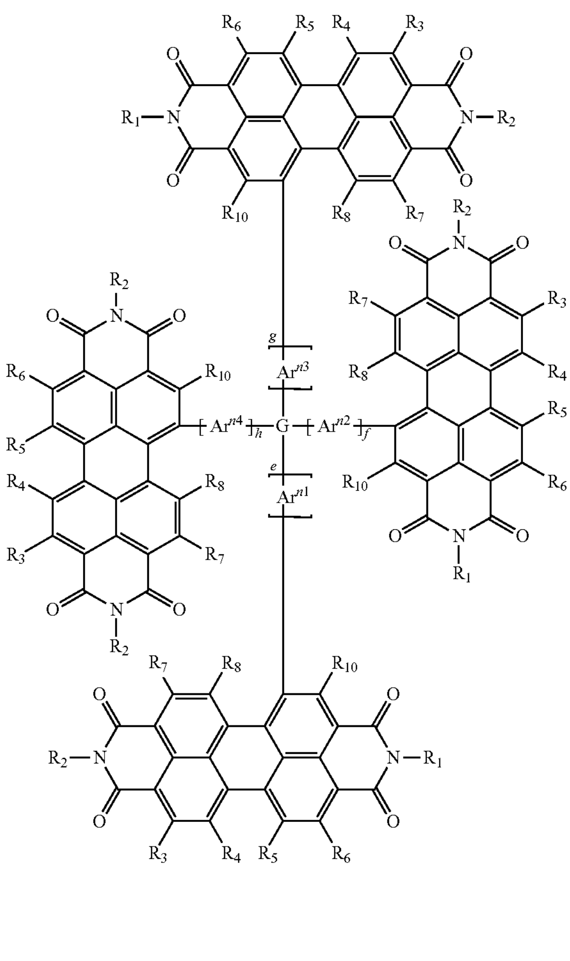
-continued
PDI5
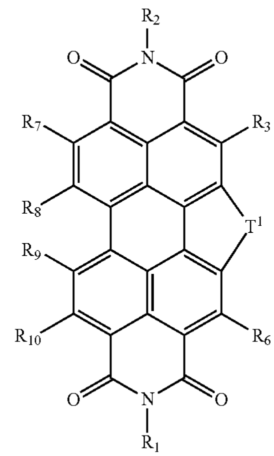
PDI6
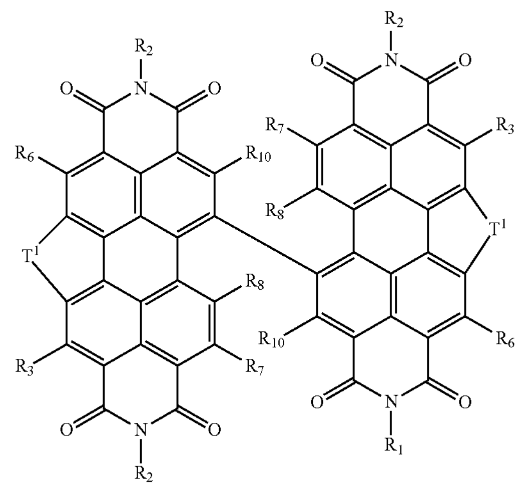
PDI7
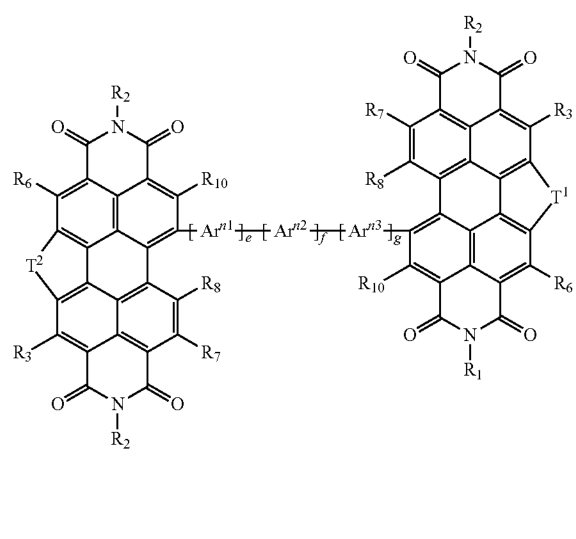

-continued

PDI8

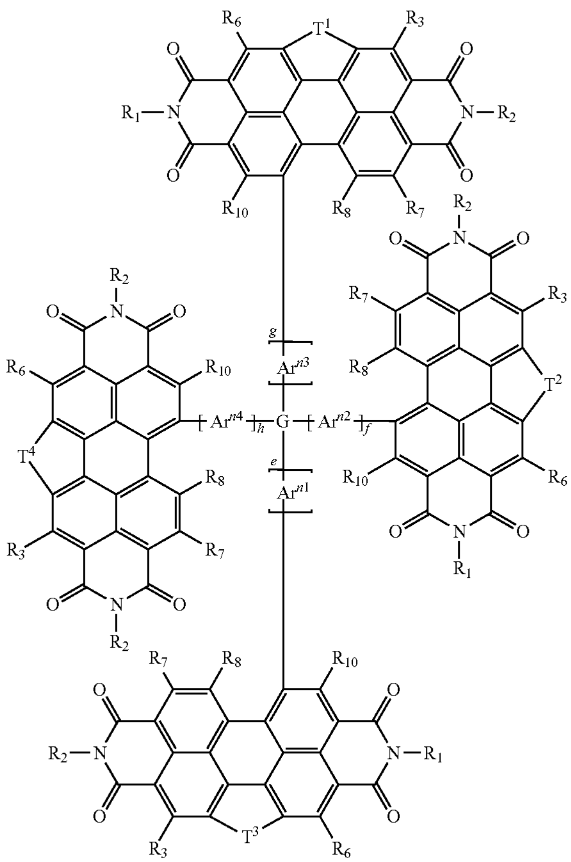

PDI9

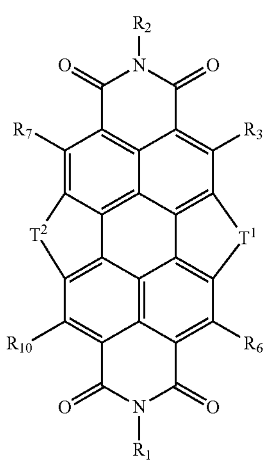

wherein the individual radicals, independently of each other and on each occurrence identically or differently, have the following meanings $R^{1-10}$ $Z^1$, H, F, Cl, or straight-chain, branched or cyclic alkyl with 1 to 30, preferably 1 to 20, C atoms, in which one or more $CH_2$ groups are optionally replaced by —O—, —S—, —C(═O)—, —C(═S)—, —C(═O)—O—, —O—C(═O)—, —$NR^0$—, —$SiR^0R^{00}$—, —$CF_2$—, —$CR^0$═$CR^{00}$—, —$CY^1$═$CY^2$— or —C≡C— in such a manner that O and/or S atoms are not linked directly to one another, and in which one or more H atoms are optionally replaced by F, Cl, Br, I or CN, and in which one or more $CH_2$ or $CH_3$ groups are optionally replaced by a cationic or anionic group, or aryl, heteroaryl, arylalkyl, heteroarylalkyl, aryloxy or heteroaryloxy, wherein each of the aforementioned cyclic groups has 5 to 20 ring atoms, is mono- or polycyclic, does optionally contain fused rings, and is unsubstituted or substituted by one or more identical or different groups L, $Z^1$ an electron withdrawing group, preferably having one of the preferred meanings as given above for formula I, very preferably CN, $Y^1$, $Y^2$H, F, Cl or CN, L F, Cl, —$NO_2$, —CN, —NC, —NCO, —NCS, —OCN, —SCN, $R^0$, $OR^0$, $SR^0$, —C(═O)$X^0$, —C(═O)$R^0$, —C(═O)—$OR^0$, —O—C(═O)—$R^0$, —$NH_2$, —$NHR^0$, —$NR^0R^{00}$, —C(═O)$NHR^0$, —C(═O)$NR^0R^{00}$, —$SO_3R^0$, $SO_2R$, —OH, —$NO_2$, —$CF_3$, —$SF_5$, or optionally substituted silyl, or carbyl or hydrocarbyl with 1 to 30, preferably 1 to 20 C atoms that is optionally substituted and optionally comprises one or more hetero atoms, preferably F, —CN, $R^0$, —$OR^0$, —$SR^0$, —C(═O)—$R^0$, —C(═O)—$OR^0$, —O—C(═O)—$R^0$, —O—C(═O)—$OR^0$, C(═O)—$NHR^0$, or —C(═O)—$NR^0R^{00}$, $T^{1-4}$ —O—, —S—, —C(═O)—, —C(═S)—, —$CR^0R^{00}$—, —$SiR^0R^{00}$—, —$NR^0$—, —$CR^0$═$CR^{00}$— or —C≡C—, G C, Si, Ge, C═C or a four-valent aryl or heteroaryl group that has from 5 to 20 ring atoms, is mono- or polycyclic, optionally contains fused rings, and is unsubstituted or substituted by one or more identical or different groups $R^1$ or L, $Ar^{n1-n4}$ independently of each other, and on each occurrence identically or differently arylene or heteroarylene that has from 5 to 20 ring atoms, is mono- or polycyclic, optionally contains fused rings, and is unsubstituted or substituted by one or more identical or different groups $R^1$ or L, or $CY^1$═$CY^2$ or —C≡C—, e, f, g, h 0 or an integer from 1 to 10.

In a preferred embodiment of the present invention the photoactive layer of the OPD contains two or more n-type OSC compounds.

Preferably the photoactive layer of this preferred embodiment contains two or more n-type OSC compounds which do not contain a fullerene moiety.

Very preferably the photoactive layer of this preferred embodiment contains two or more n-type OSC compounds, at least one of which is a compound of formula NI, I, IA, I1-I6 or their subformulae.

Further very preferably the photoactive layer of this preferred embodiment contains two or more n-type OSC compounds, at least one of which is a compound of formula NI, I, IA, I1-I6 or their subformulae, and at least one other of which is a naphthalene or perylene derivative as described above and below.

In another preferred embodiment of the present invention the photoactive of the OPD contains two or more n-type OSC compounds, at least one of which does not contain a fullerene moiety, and is very preferably selected of formula NI, I, IA, I1-I6 or their subformulae, and at least one other of which is a fullerene or substituted fullerene.

The substituted fullerene is for example an indene-$C_{60}$-fullerene bisadduct like ICBA, or a (6,6)-phenyl-butyric acid methyl ester derivatized methano $C_{60}$ fullerene, also known as "PCBM-$C_{60}$" or "C60PCBM", as disclosed for example in G. Yu, J. Gao, J. C. Hummelen, F. Wudl, A. J. Heeger, Science 1995, Vol. 270, p. 1789 ff and having the structure shown below, or structural analogous compounds with e.g. a $C_{61}$ fullerene group, a $C_{70}$ fullerene group, or a $C_{71}$ fullerene group, or an organic polymer (see for example Coakley, K. M. and McGehee, M. D. Chem. Mater. 2004, 16, 4533).

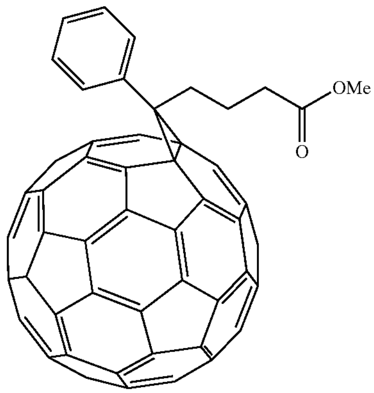

PCBM-$C_{60}$

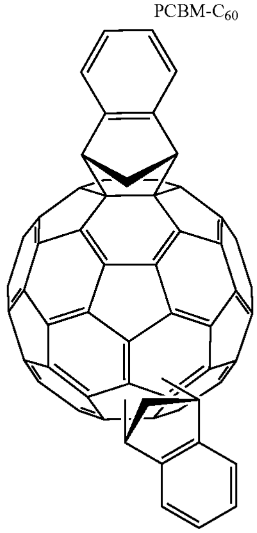

ICBA-$C_{60}$

Preferably the polymer according to the present invention is blended with an n-type semiconductor such as a fullerene or substituted fullerene of formula Full-I to form the active layer in an OPV or OPD device wherein, Full-I

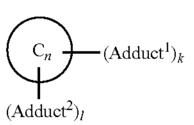

$C_n$ denotes a fullerene composed of n carbon atoms, optionally with one or more atoms trapped inside, $Adduct^1$ is a primary adduct appended to the fullerene $C_n$ with any connectivity, $Adduct^2$ is a secondary adduct, or a combination of secondary adducts, appended to the fullerene $C_n$ with any connectivity, k is an integer ≥1, and l is 0, an integer ≥1, or a non-integer >0.

In the formula Full-I and its subformulae, k preferably denotes 1, 2, 3 or, 4, very preferably 1 or 2.

The fullerene $C_n$ in formula Full-I and its subformulae may be composed of any number n of carbon atoms Preferably, in the compounds of formula XII and its subformulae the number of carbon atoms n of which the fullerene $C_n$ is composed is 60, 70, 76, 78, 82, 84, 90, 94 or 96, very preferably 60 or 70.

The fullerene $C_n$ in formula Full-I and its subformulae is preferably selected from carbon based fullerenes, endohedral fullerenes, or mixtures thereof, very preferably from carbon based fullerenes.

Suitable and preferred carbon based fullerenes include, without limitation, ($C_{60\text{-}Ih}$)[5,6]fullerene, ($C_{70\text{-}D5h}$)[5,6]fullerene, ($C_{76\text{-}D2*}$)[5,6]fullerene, ($C_{84\text{-}D2*}$)[5,6]fullerene, ($C_{84\text{-}D2d}$)[5,6]fullerene, or a mixture of two or more of the aforementioned carbon based fullerenes.

The endohedral fullerenes are preferably metallofullerenes. Suitable and preferred metallofullerenes include, without limitation, La@$C_{60}$, La@$C_{82}$, Y@$C_{82}$, $Sc_3N$@$C_{80}$, $Y_3N$@$C_{80}$, $Sc_3C_2$@$C_{80}$ or a mixture of two or more of the aforementioned metallofullerenes.

Preferably the fullerene $C_n$ is substituted at a [6,6] and/or [5,6] bond, preferably substituted on at least one [6,6] bond.

Primary and secondary adduct, named "Adduct" in formula Full-I and its subformulae, is preferably selected from the following formulae

S-1

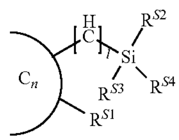

S-2

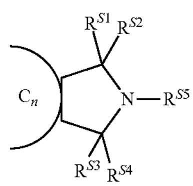

S-3

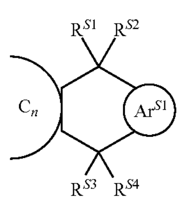

S-4

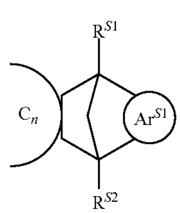

S-4

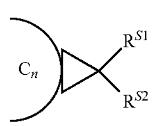

-continued

S-5

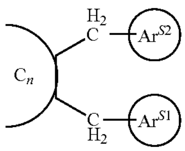

S-6

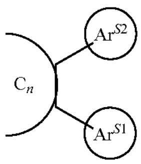

S-7

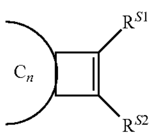

S-8

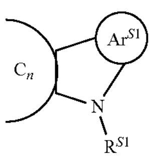

S-9

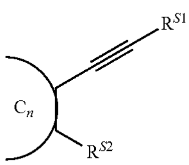

S-10

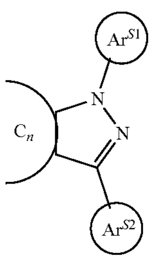

S-11

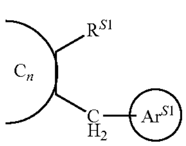

S-12

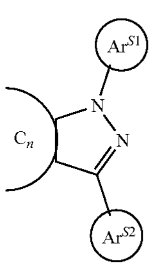

-continued

S-13

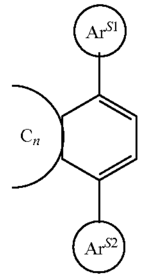

S-14

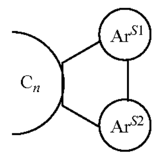

wherein $Ar^{S1}$, $Ar^{S2}$ denote, independently of each other, and on each occurrence identically or differently, an aryl or heteroaryl group with 5 to 20, preferably 5 to 15, ring atoms, which is mono- or polycyclic, and which is optionally substituted by one or more identical or different substituents having one of the meanings of L as defined above and below.

$R^{S1}$, $R^{S2}$, $R^{S3}$, $R^{S4}$ and $R^{S5}$ independently of each other, and on each occurrence identically or differently, denote H, CN or have one of the meanings of $R^{S}$ as defined above and below.

Preferred compounds of formula Full-I are selected from the following subformulae:

Full-Ia

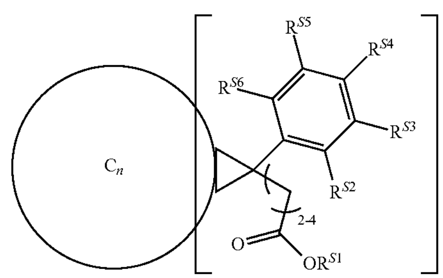

Full-Ib

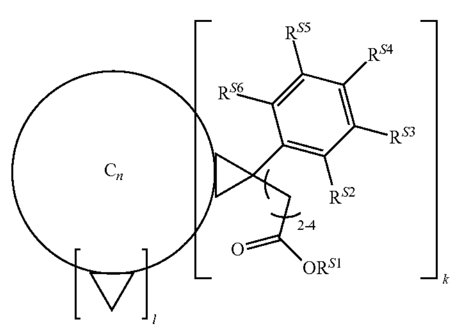

-continued

Full-Ic

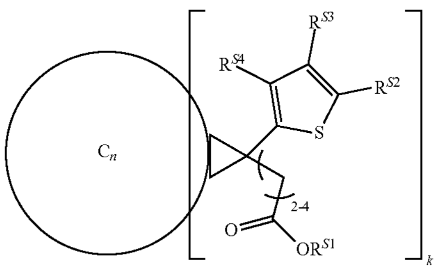

Full-Id

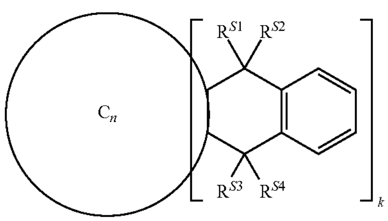

Full-Ie

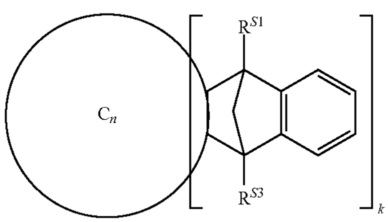

Full-If

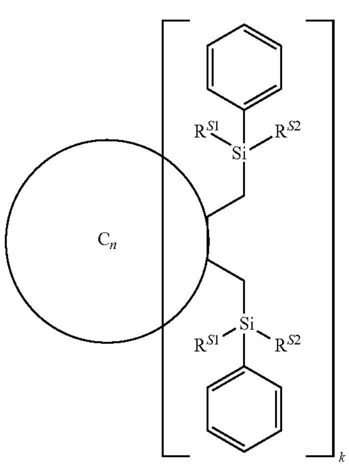

-continued

Full-Ig

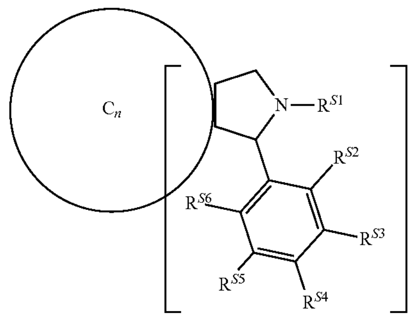

Full-Ih

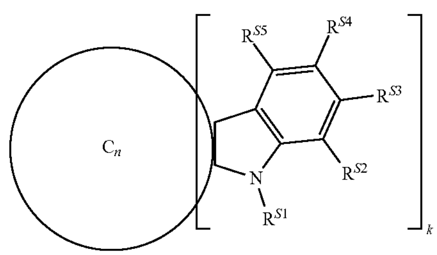

wherein $R^{S1}$, $R^{S2}$, $R^{S3}$, $R^{S4}$ $R^{S5}$ and $R^{S6}$ independently of each other, and on each occurrence identically or differently, denote H or have one of the meanings of $R^{S}$ as defined above and below.

Most preferably the substituted fullerene is PCBM-C60, PCBM-C70, bis-PCBM-C60, bis-PCBM-C70, ICMA-c60 (1',4'-dihydro-naphtho[2',3':1,2][5,6]fullerene-C60), ICBA, oQDM-C60 (1',4'-dihydro-naphtho[2',3':1,9][5,6]fullerene-C60-lh), or bis-oQDM-C60.

In another preferred embodiment of the present invention, the photoactive layer, in addition or alternatively to the small molecules, comprises one or more n-type OSC compounds selected from conjugated OSC polymers. Preferred OSC polymers are described, for example, in Acc. Chem. Res., 2016, 49 (11), pp 2424-2434 and WO2013142841 A1.

Preferred n-type conjugated OSC polymers for use in this preferred embodiment comprise one or more units derived from perylene or naphthalene are poly[[N,N'-bis(2-octyldodecyl)naphthalene-1,4,5,8-bis(dicarboximide)-2,6-diyl]-alt-5,5'-(2,2'-bithiophene)], poly[[N,N'-bis(2-hexyldecyl)naphthalene-1,4,5,8-bis(dicarboximide)-2,6-diyl]-alt-5,5'-thiophene].

The n-type OSC compounds used in the OPD according to the present invention can be synthesized according to or in analogy to methods that are known to the skilled person and are described in the literature. Other methods of preparation can be taken from the examples.

Especially suitable and preferred synthesis methods of the n-type OSC compounds of formula NI, I, IA, I1-I6 and their subformulae are illustrated in the synthesis schemes shown hereinafter.

Scheme 1A
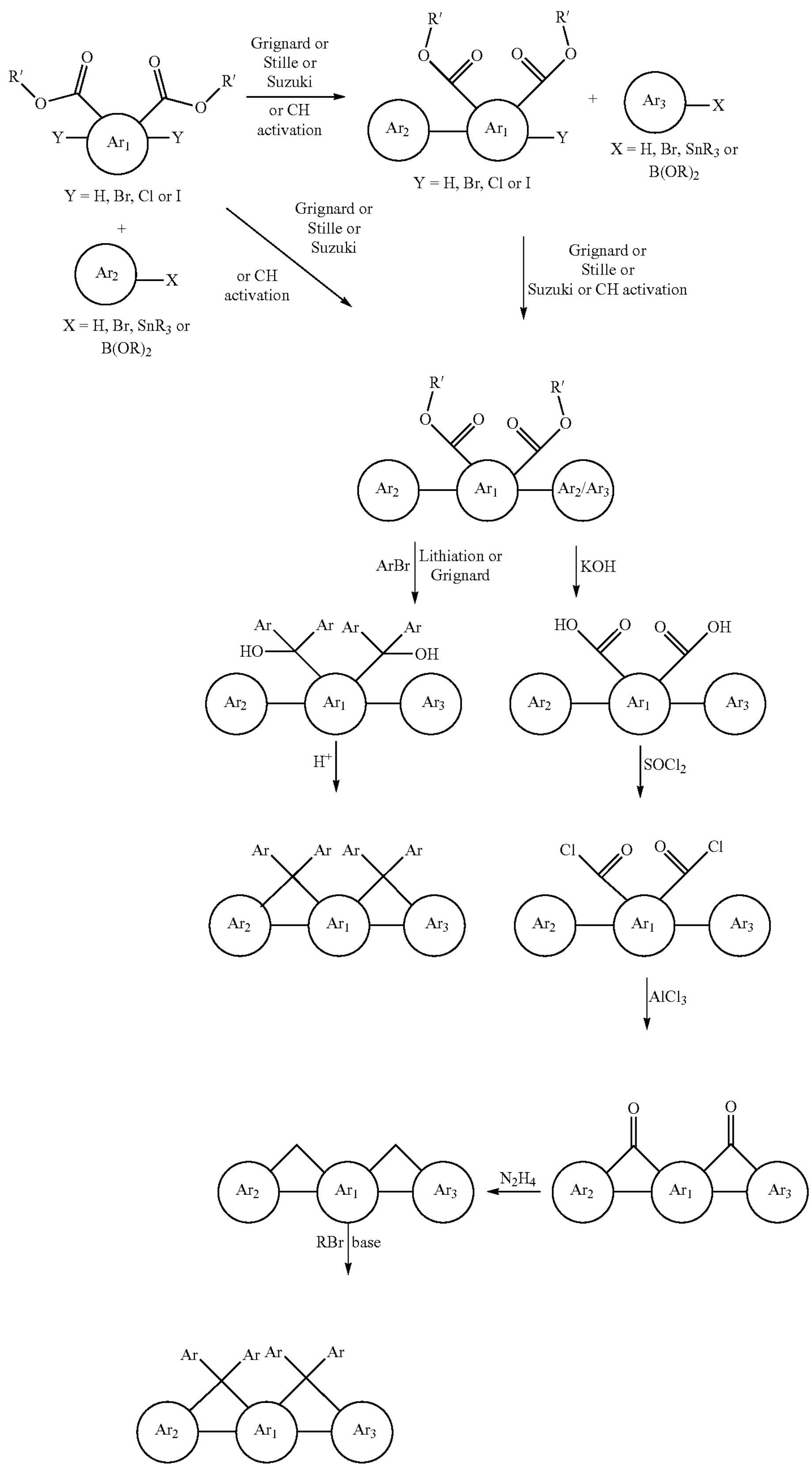

Scheme 1B
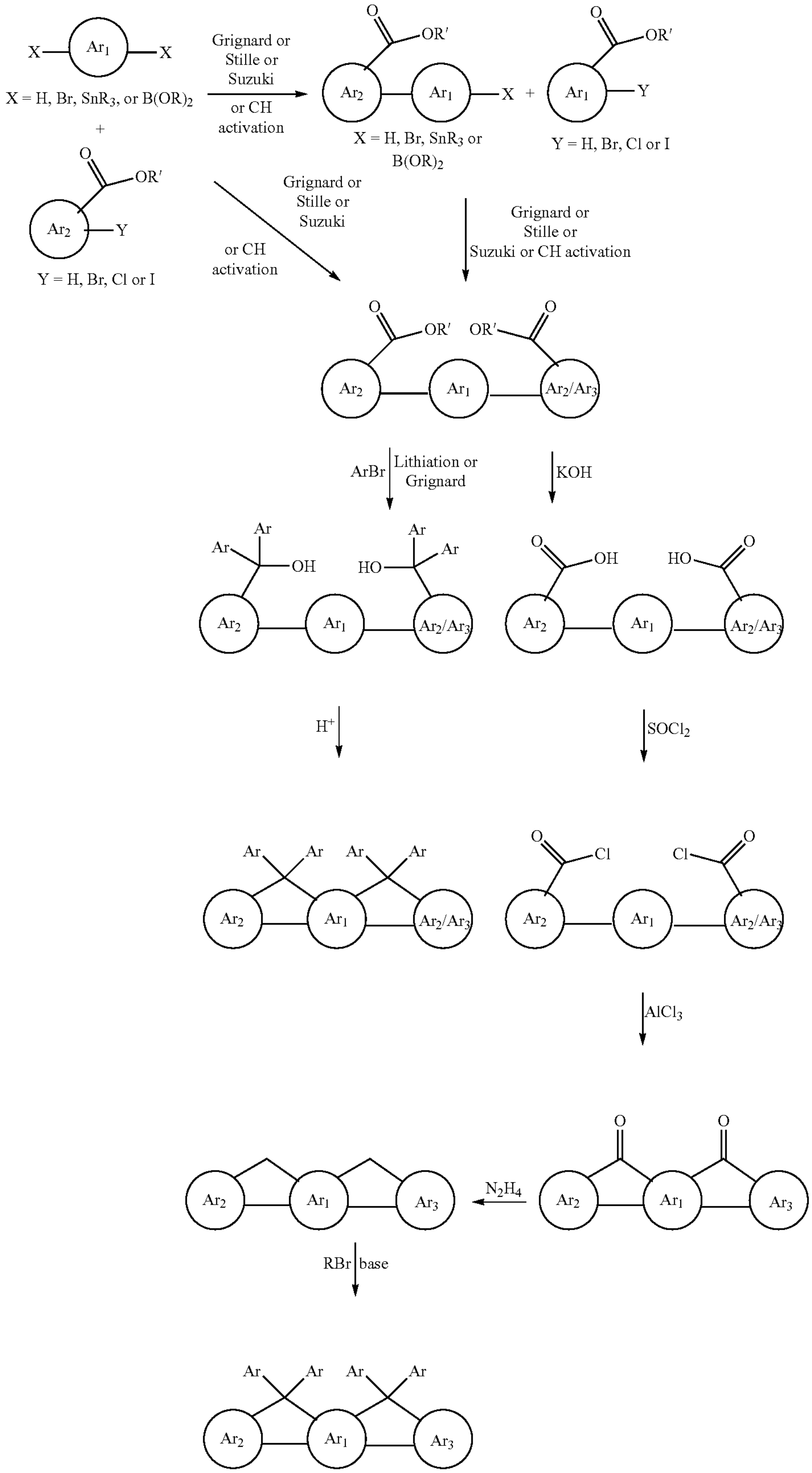

Scheme 1C
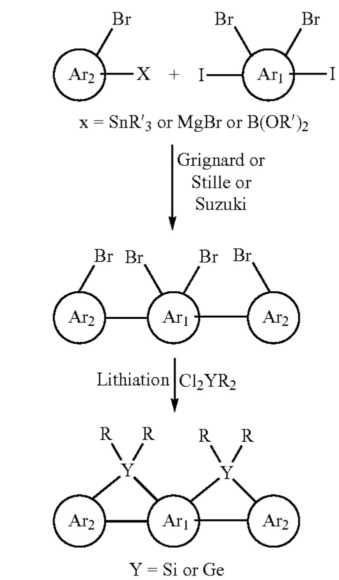
Scheme 2A
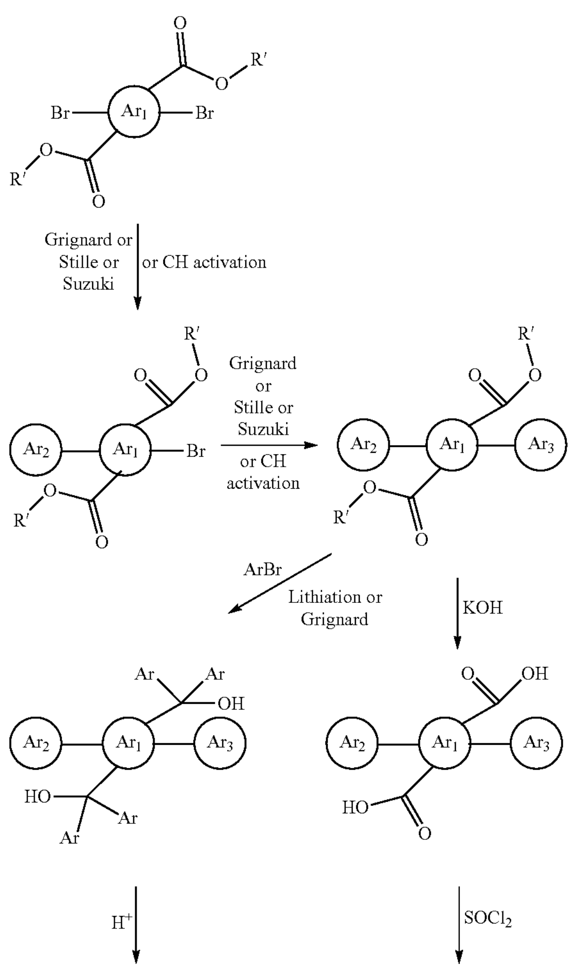
-continued
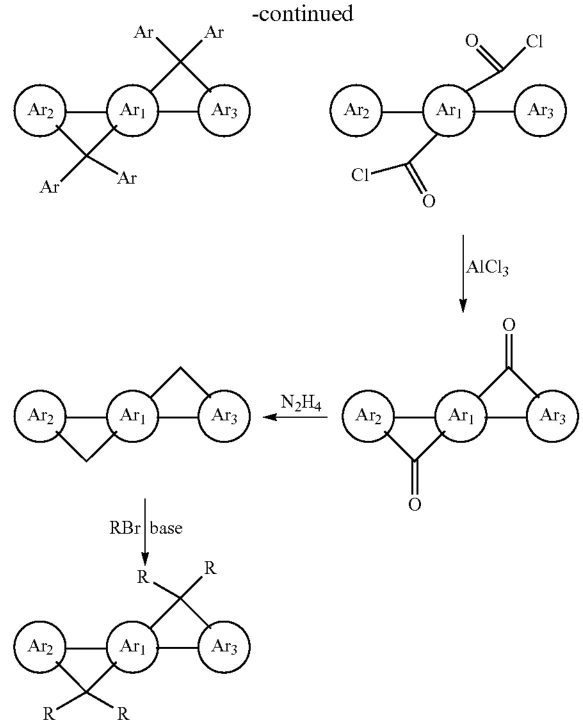
Scheme 2B
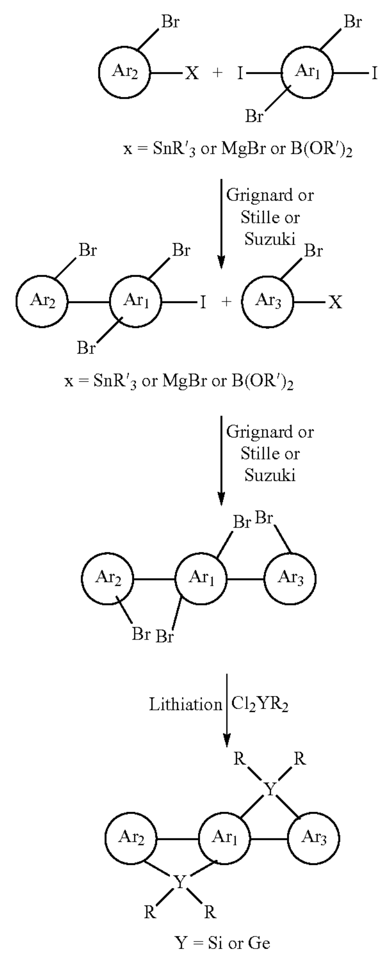

Scheme 3A
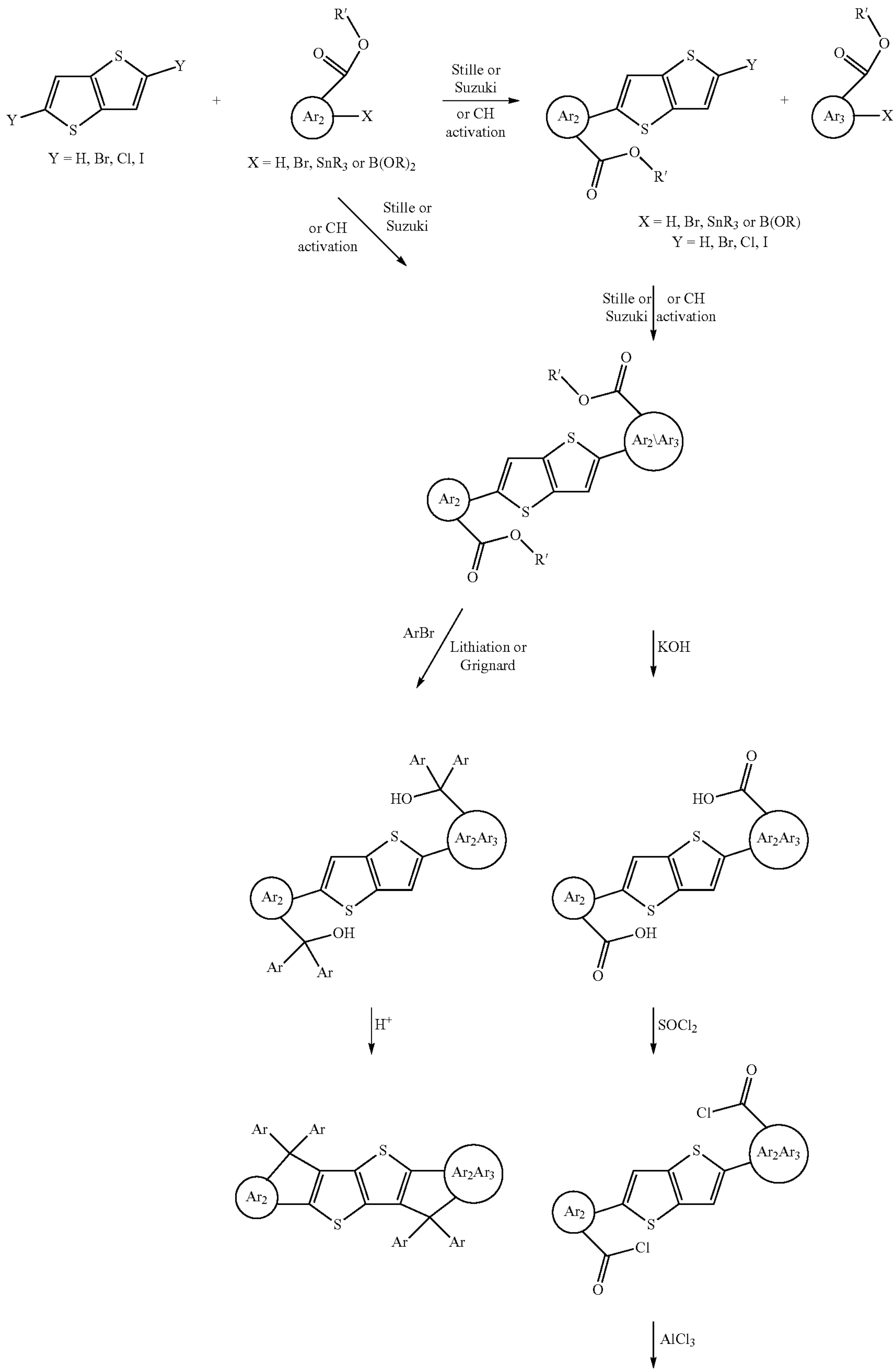

-continued
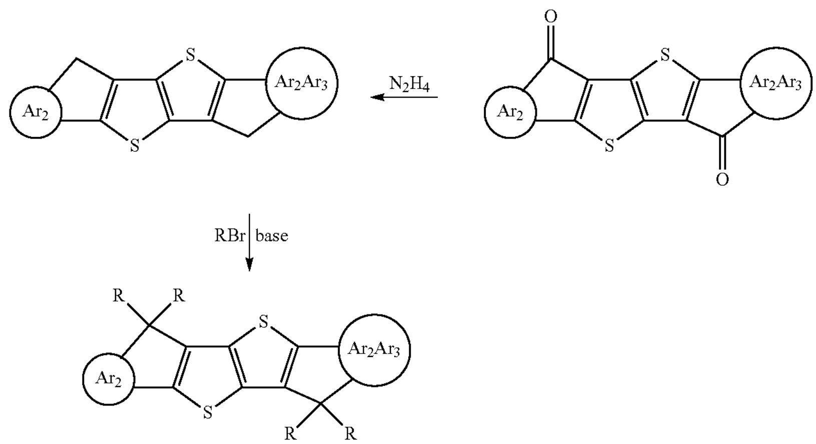
Scheme 3B
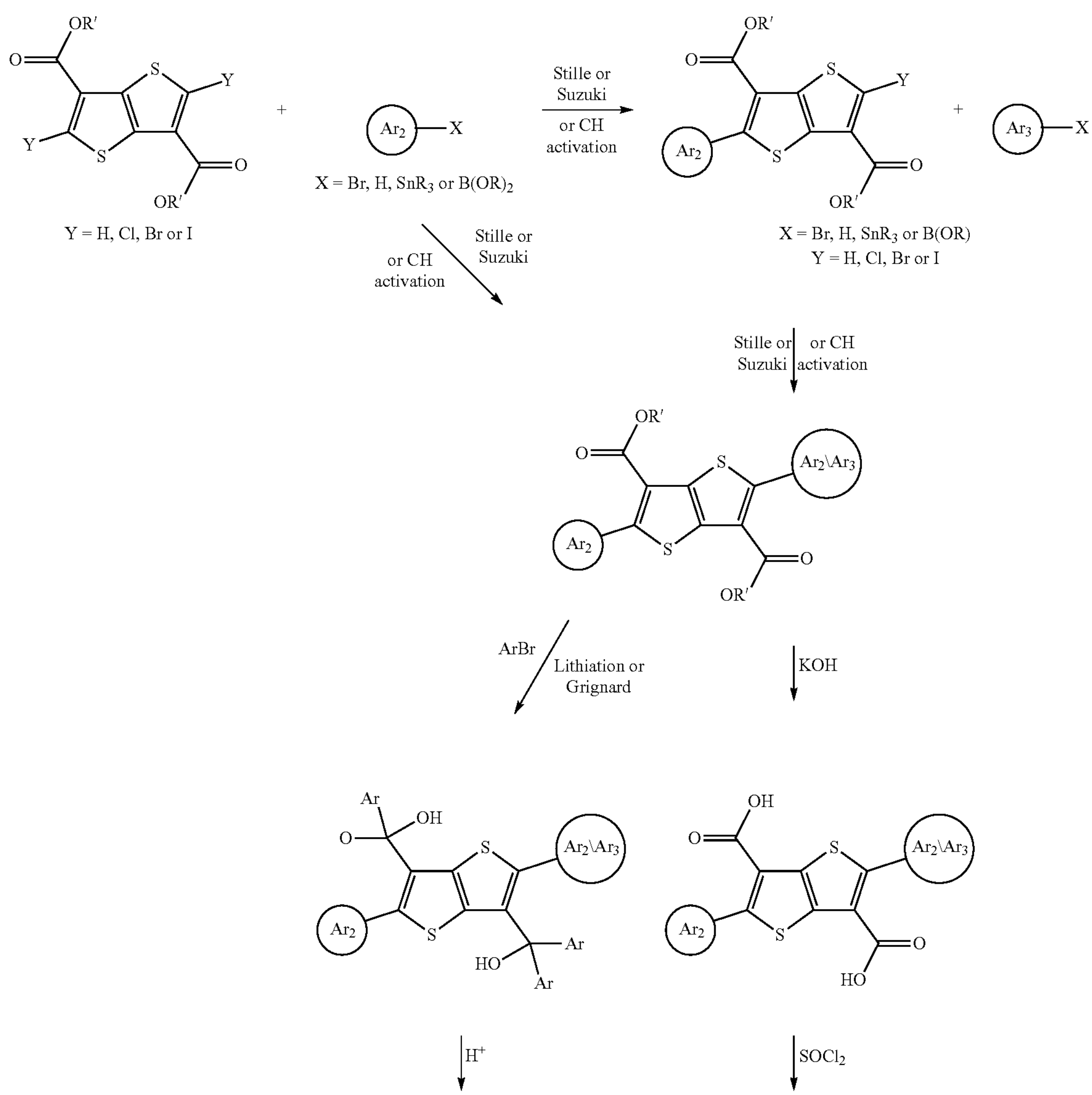

-continued
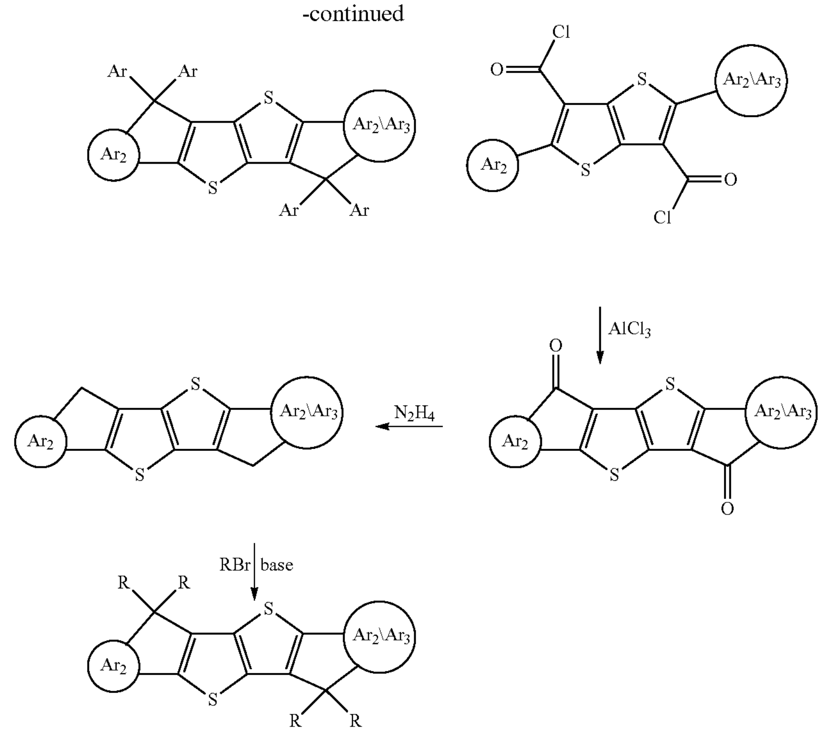
Scheme 3C
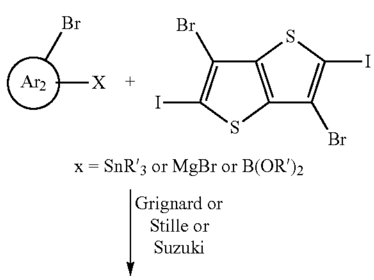
-continued
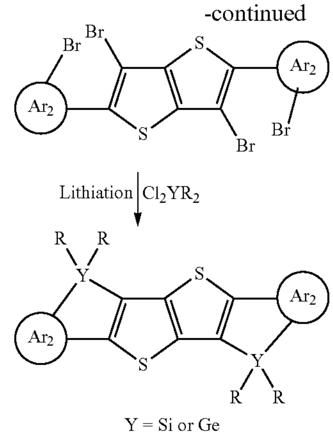
Scheme 4
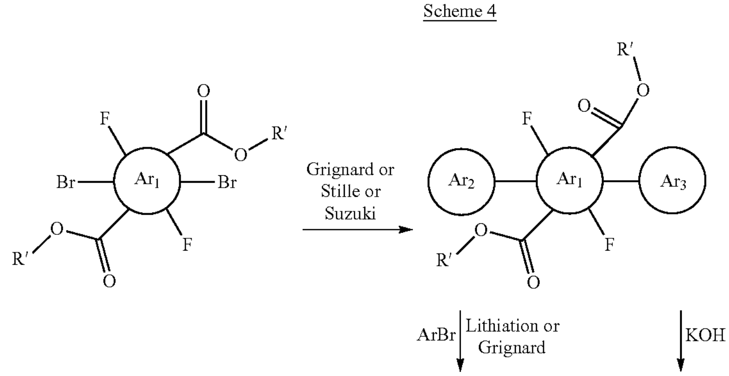

-continued
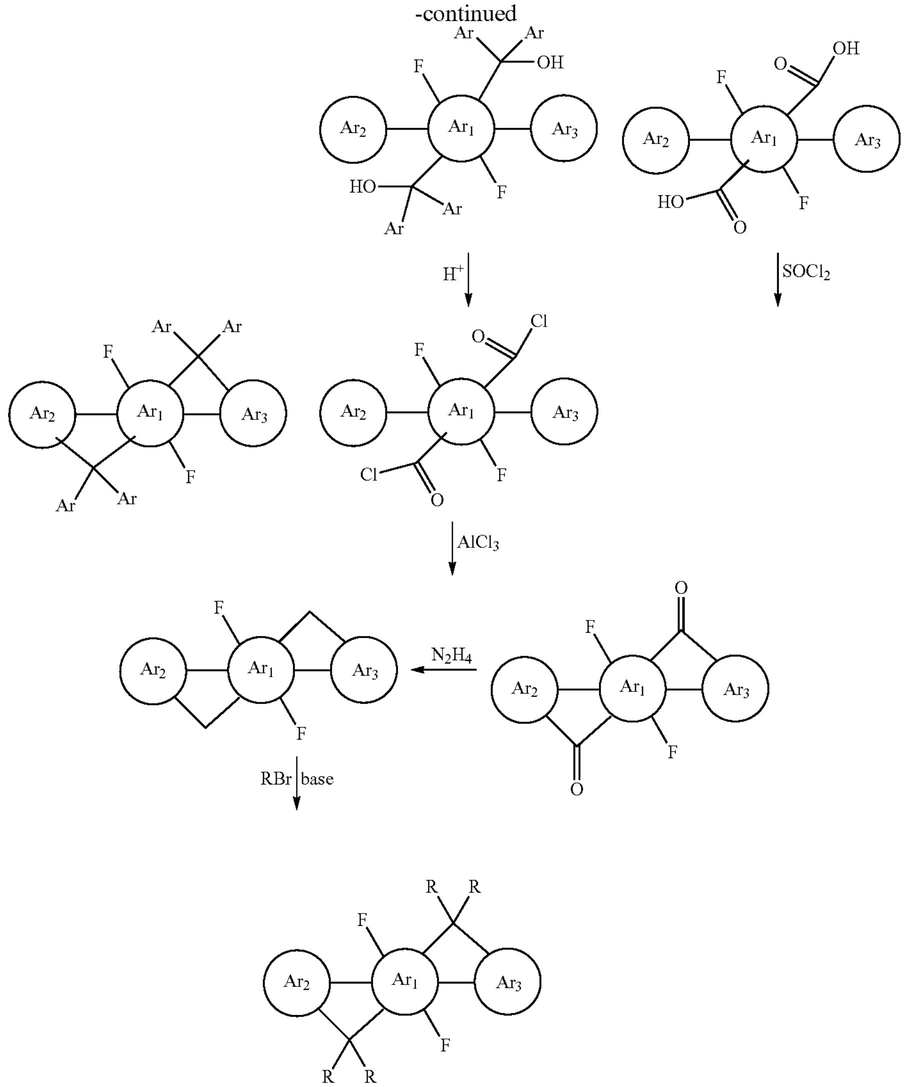
Scheme 5A
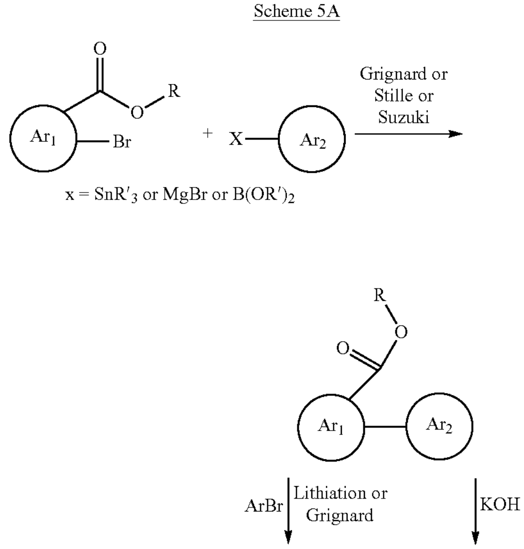
-continued
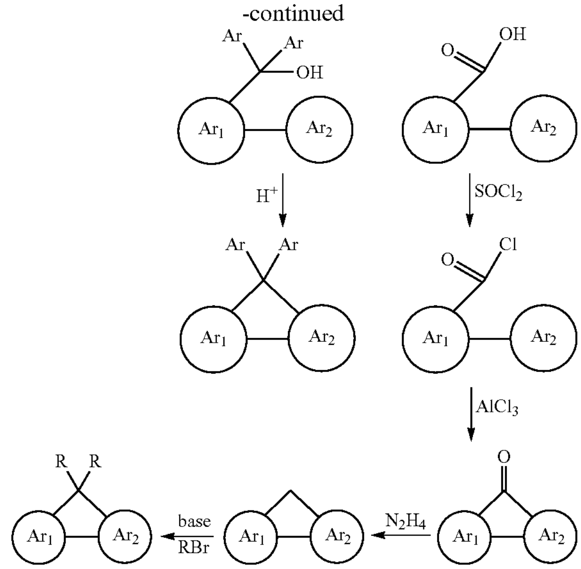

Scheme 5B
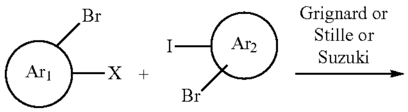
x = $SnR'_3$ or MgBr or $B(OR')_2$
-continued
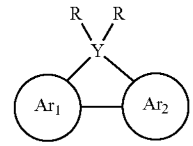
Y = Si or Ge
In Schemes 6 and 7, "core" means a polycyclic core formed by the reactions described in Schemes 1A-5B.
Scheme 6
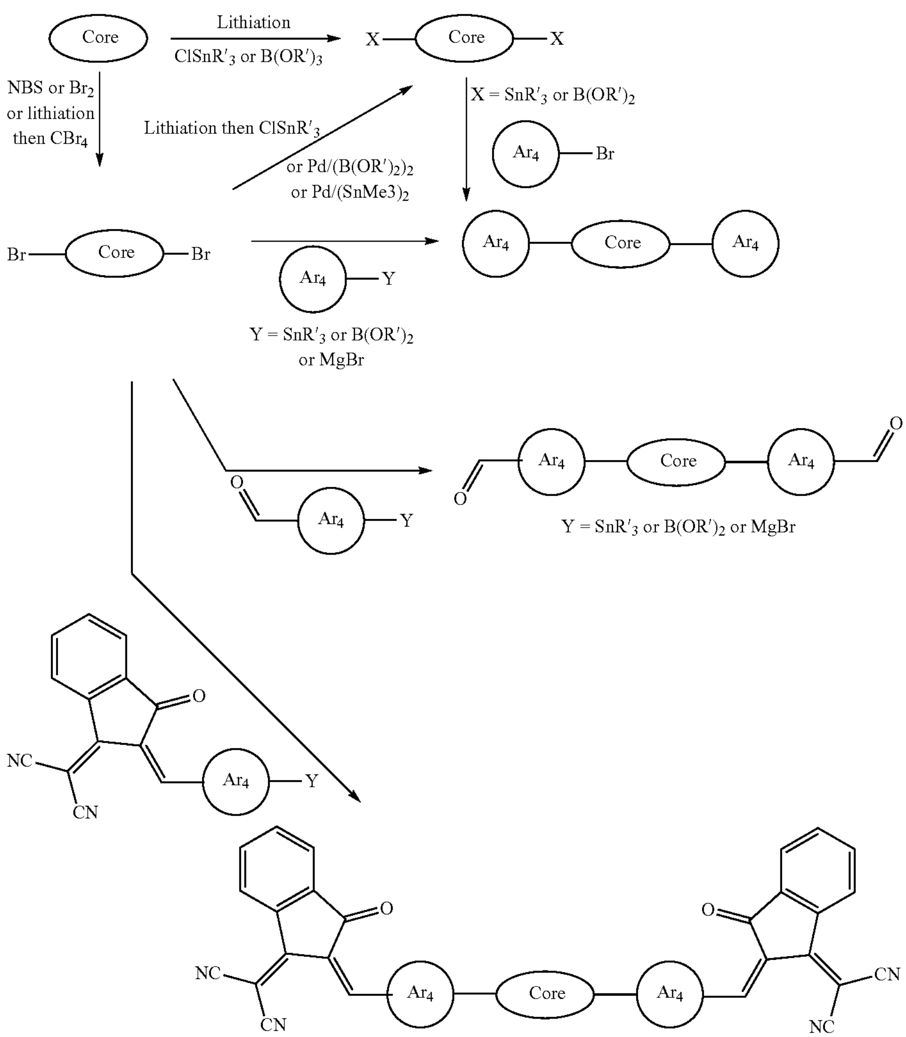
-continued
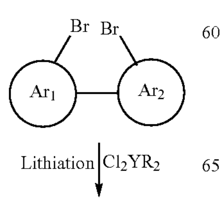
Scheme 7
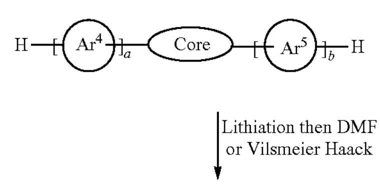

-continued

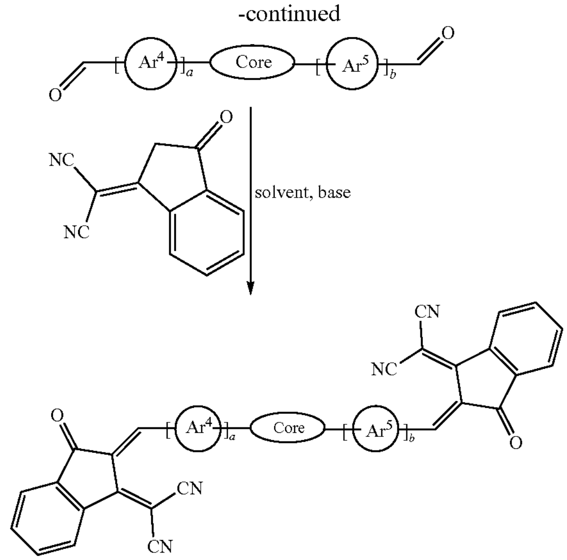

In the photoactive layer of the OPD according to the present invention, preferably the p-type OSC compound is a conjugated copolymer comprising donor and acceptor units, which are very preferably distributed in random sequence along the polymer chain.

Preferably the donor and acceptor units are selected from arylene or heteroarylene that has from 5 to 20 ring atoms, is mono- or polycyclic, optionally contains fused rings, and is unsubstituted or substituted by one or more identical or different groups L as defined above.

Further preferably the conjugated copolymer additionally comprises one or more spacer units, which are selected from arylene or heteroarylene that has from 5 to 20 ring atoms, is mono- or polycyclic, optionally contains fused rings, is unsubstituted or substituted by one or more identical or different groups L as defined above, and wherein these spacer units are located between the donor and acceptor units such that a donor unit and an acceptor unit are not directly connected to each other.

In a preferred embodiment the conjugated p-type OSC polymer comprises one or more donor units selected from formula DA and DB

DA

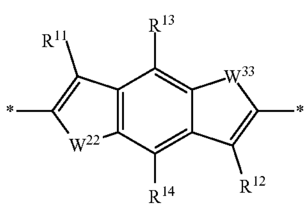

DB

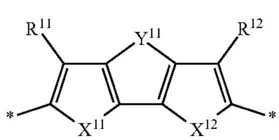

wherein $X^{11}$, $X^{12}$ independently of each other denote S, O or Se, $W^{22}$, $W^{33}$ independently of each other denote S, O or Se, $Y^{11}$ is $CR^{11}R^{12}$, $SiR^{11}R^{12}$, $GeR^{11}R^{12}$, $NR^{11}$, C═O, —O—C($R^{11}R^{12}$)—, —C($R^{11}R^{12}$)—O—, —C($R^{11}R^{12}$)—C(═O)—, —C(═O)—C($R^{11}R^{12}$)—, or —$CR^{11}$═$CR^{12}$—, and $R^{11}$, $R^{12}$, $R^{13}$ and $R^{14}$ independently of each other denote H or have one of the meanings of L or $R^1$ as defined above and below.

In another preferred embodiment the conjugated p-type OSC polymer comprises one or more acceptor units of formula AA

AA

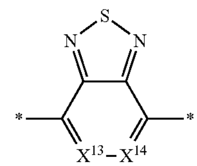

wherein $X^{13}$ and $X^{14}$ independently of each other denote $CR^{11}$ or N and $R^{11}$ has the meanings given in formula DA.

Preferred acceptor units of formula AA are selected from the following subformulae

AA1

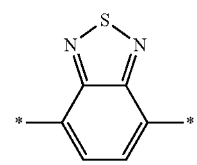

AA2

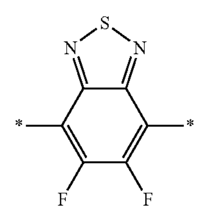

AA3

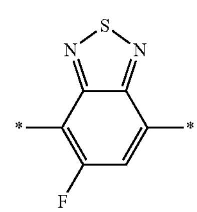

AA4

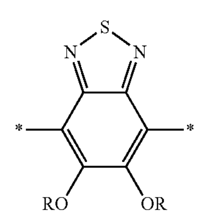

AA5

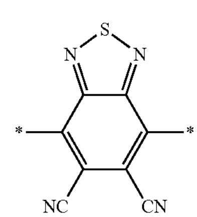

-continued

AA6

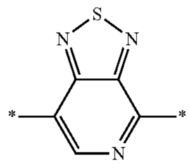

AA7

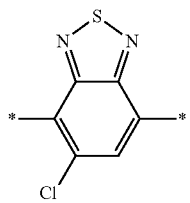

wherein R denotes alkyl with 1 to 20 C atoms, preferably selected from formulae SUB1-6.

In another preferred embodiment the conjugated p-type OSC polymer comprises one or more spacer units of formula Sp1 and/or Sp6

Sp1

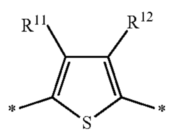

Sp6

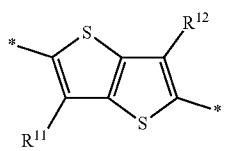

wherein $R^{11}$ and $R^{12}$ have the meanings given in formula DA.

Preferably the conjugated p-type OSC polymer consists of donor units selected from formulae DA and DB, acceptor units selected from formula AA and its subformulae AA1-AA7, and one or more spacer units of formula Sp1-Sp6.

In another preferred embodiment the p-type OSC conjugated polymer comprises, very preferably consists of, one or more units selected from the following formulae -(D-Sp)- U1

-(A-Sp)- U2

-(D-A)- U3

-(D)- U4

-(A)- U5

-(D-A-D-Sp)- U6

-(D-Sp-A-Sp)- U7

-(Sp-A-Sp)- U8

-(Sp-D-Sp)- U9 wherein D denotes, on each occurrence identically or differently, a donor unit, A denotes, on each occurrence identically or differently, an acceptor unit and Sp denotes, on each occurrence identically or differently, a spacer unit, all of which are selected from arylene or heteroarylene that has from 5 to 20 ring atoms, is mono- or polycyclic, optionally contains fused rings, are is unsubstituted or substituted by one or more identical or different groups L as defined above, and wherein the polymer contains at least one unit selected from formulae U1-U9 containing a unit D and at least one unit selected from formulae U1-U9 containing a unit A.

Preferably in formulae U1-U9 D is selected of formula DA or DB, A is selected of formula AA or AA1-AA6, and Sp is selected of formula Sp1.

Very preferred are conjugated polymers selected from the following formulae $-[(D-Sp)_x-(A-Sp)_y]_n-$ Pi $-[(D-A)_x-(Sp-A)_y]_n-$ Pii $-[(D-A^1)_x-(D-A^2)_y]_n-$ Piii $-[(D^1-A)_x-(D^2-A)_y]_n-$ Piv $-[(D)_x-(Sp-A-Sp)_y]_n-$ Pv $-[(D-Sp^1)_x-(Sp^1-A-Sp^2)_y]_n-$ Pvi $-[(D-Sp-A^1-Sp)_x-(A^2-Sp)_y]_n-$ Pvi $-[(D-Sp-A^1-Sp)^x-(D-A^2)_y]_n-$ Pvii $-[(D-A^1-D-Sp)^x-(A^2-Sp)_y]_n-$ Pviii $-[(D-Sp-A^1-Sp)_x-(D-Sp-A^2-Sp)_y]_n-$ Pix $-[(D-A^1)_x-(Sp-A^1)_y-(D-Sp^1-A^2-Sp^1)_z-(Sp^2-A^2-Sp^1)_{xx}]_n-$ Px $-[(D^1-A^1)_x-(D^2-A^1)_y-(D^1-A^2)_z-(D^2-A^2)_{xx}]_n-$ Pxi wherein A, D and Sp are as defined in formula U1-U9, $A^1$ and $A^2$ are different acceptor units having one of the meanings of A, $D^1$ and $D^2$ are different donor units having one of the meanings of D, $Sp^1$ and $Sp^2$ are different spacer units having one of the meanings of Sp, x, y, z and xx denote the molar fraction of the respective unit and are each, independently of one another >0 and <1, with x+y+z+xx=1, and n is an integer >1.

In the polymers of formula Pi-Pxi and their subformulae, x, y, z and xx are preferably from 0.1 to 0.9, very preferably from 0.25 to 0.75, most preferably from 0.4 to 0.6.

Preferably in the conjugated polymers of formulae Pi-Pxi the donor units D, $D^1$ and $D^2$ are selected from formulae DA or DB.

Further preferably in the conjugated polymers of formulae Pi-Pxi the acceptor units A, $A^1$ and $A^2$ are selected from formula AA or AA1-AA7.

Further preferably in the conjugated p-type OSC polymer, including but not limited to the polymers of formulae Pi-Pxi, the donor units or units D, $D^1$ and $d^2$ are selected from the following formulae (D1)

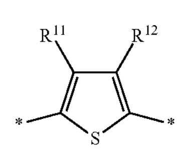

-continued
(D2)
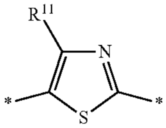
(D3)
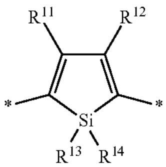
(D4)
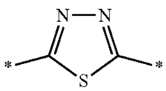
(D5)
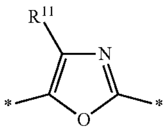
(D6)
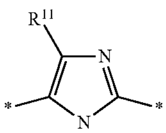
(D7)
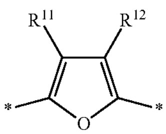
(D8)
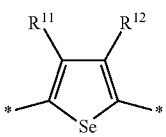
(D9)
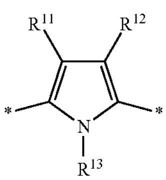
(D10)
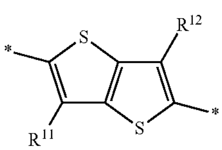
(D11)
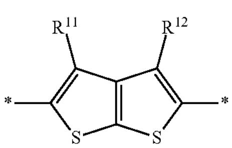
(D12)
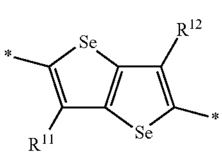
-continued
(D13)
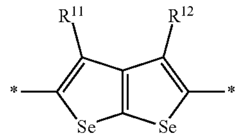
(D14)
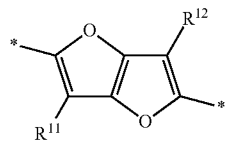
(D15)
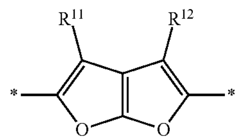
(D16)
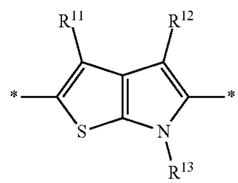
(D17)
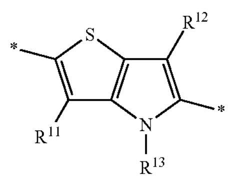
(D18)
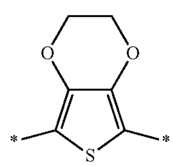
(D19)
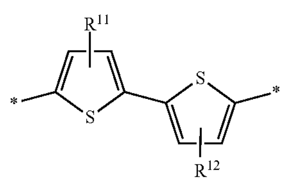
(D20)
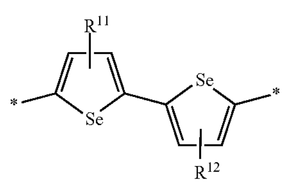
(D21)
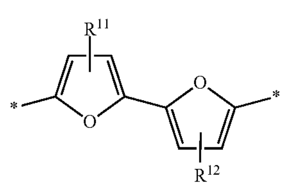

(D22)
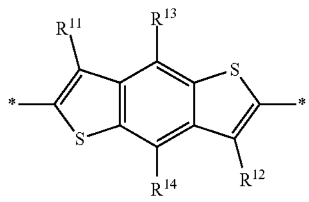
(D23)
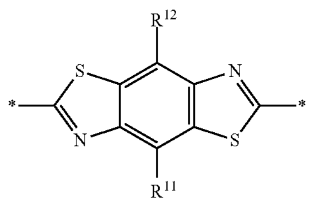
(D24)
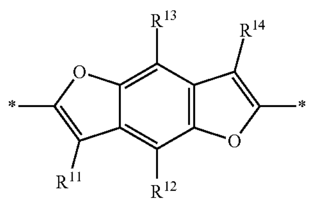
(D25)
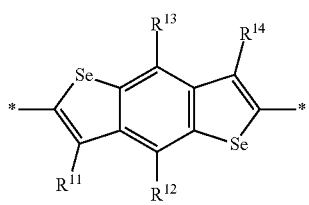
(D26)
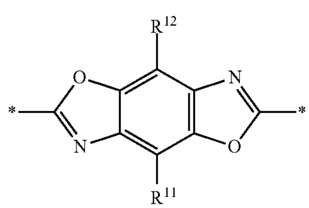
(D27)
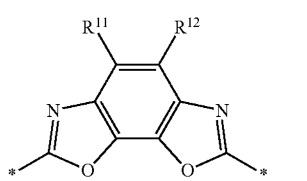
(D28)
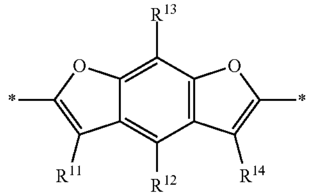
(D29)
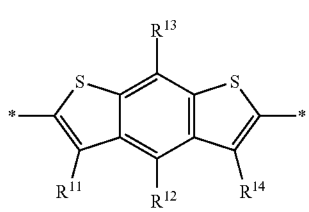
(D30)
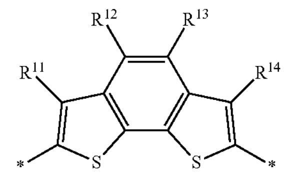
(D31)
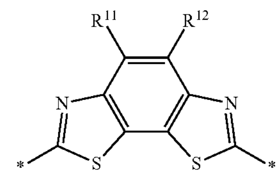
(D32)
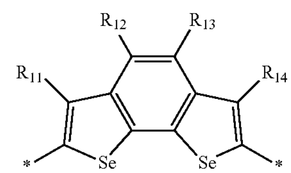
(D33)
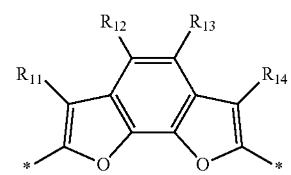
(D34)
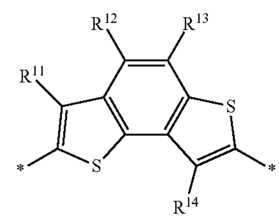
(D35)
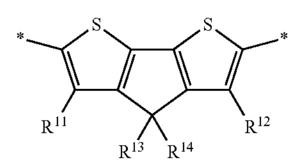
(D36)
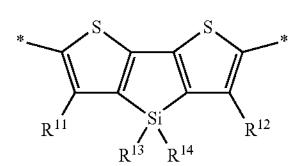
(D37)
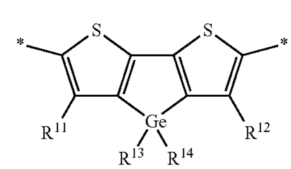
(D38)
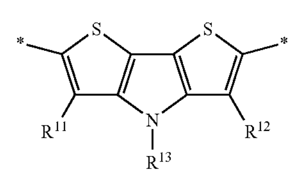

-continued
(D39)
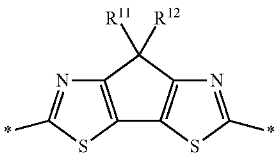
(D40)
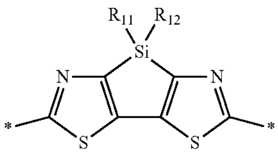
(D41)
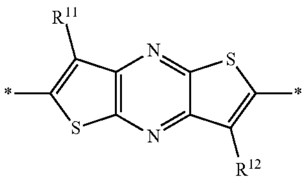
(D42)
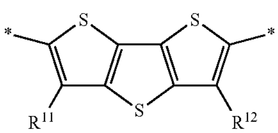
(D43)
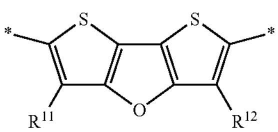
(D44)
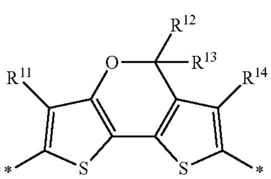
(D45)
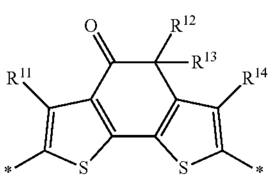
(D46)
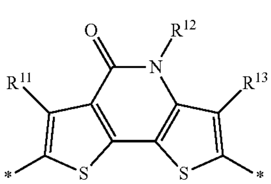
(D47)
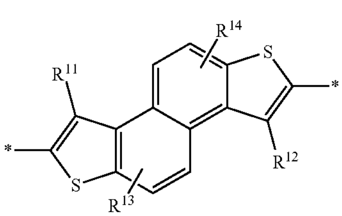
-continued
(D48)
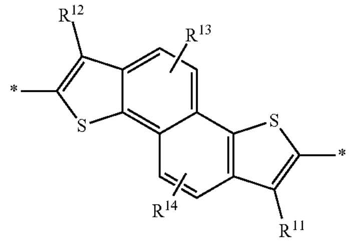
(D49)
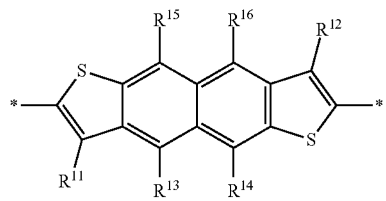
(D50)
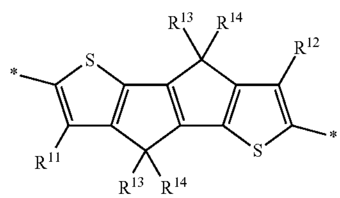
(D51)
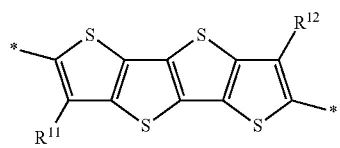
(D52)
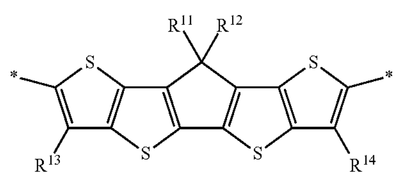
(D53)
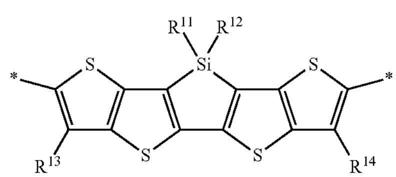
(D54)
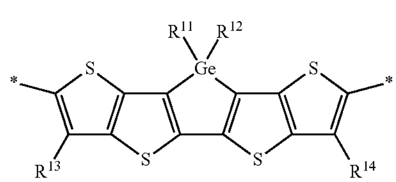
(D55)
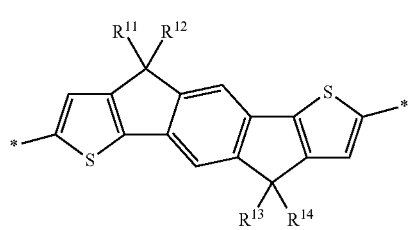

-continued
(D56)
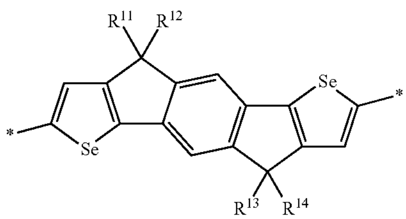
(D57)
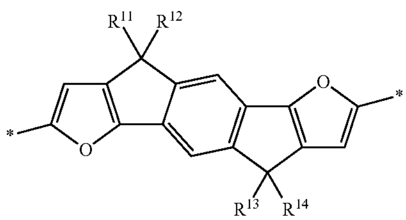
(D58)
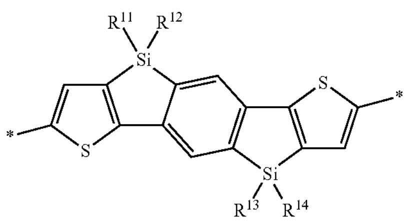
(D59)
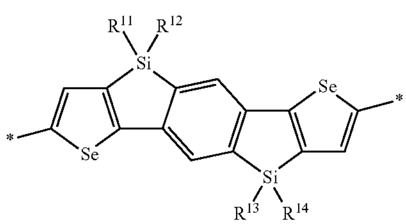
(D60)
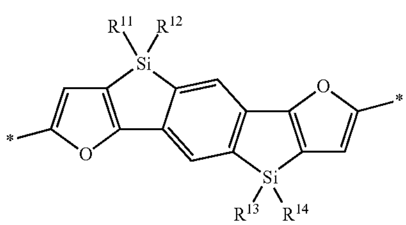
(D61)
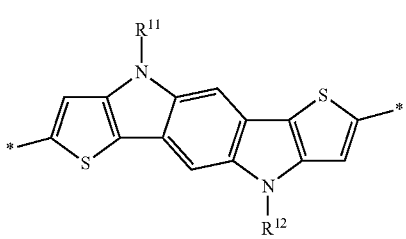
(D62)
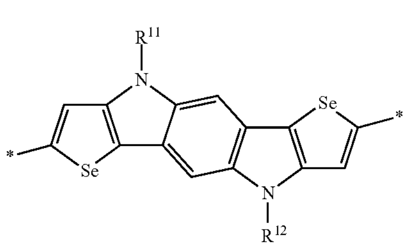
-continued
(D63)
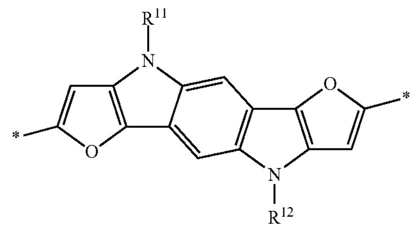
(D64)
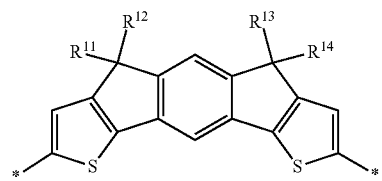
(D65)
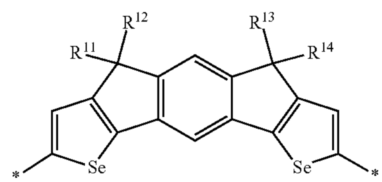
(D66)
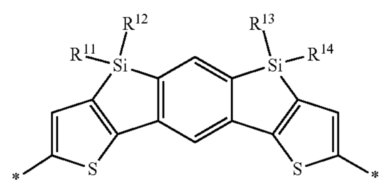
(D67)
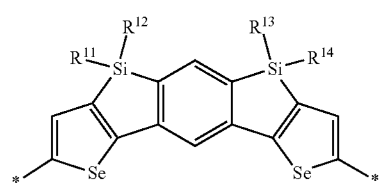
(D68)
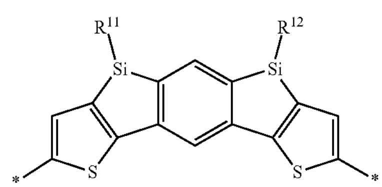
(D69)
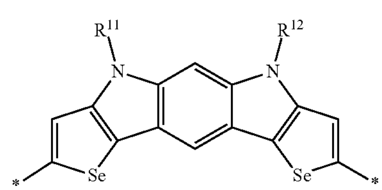
(D70)
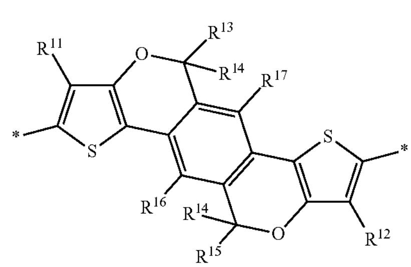

-continued
(D71)
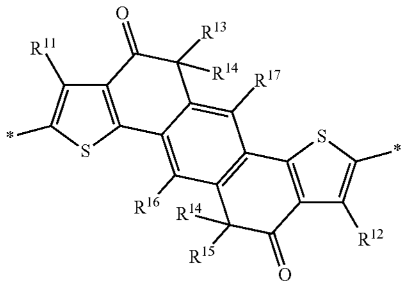
(D72)
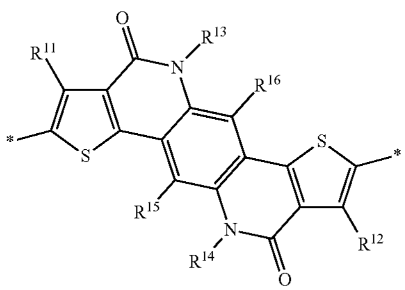
(D73)
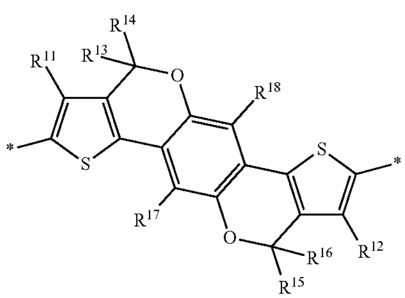
(D74)
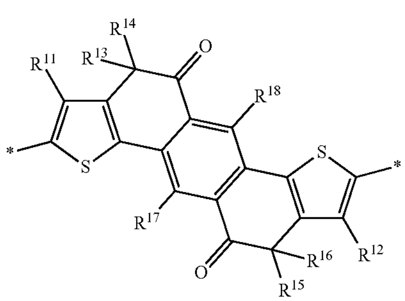
(D75)
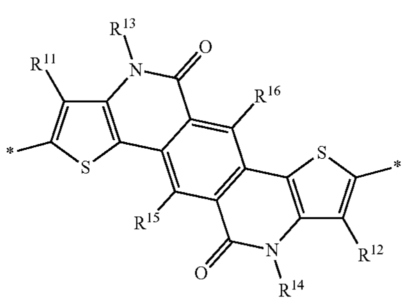
-continued
(76)
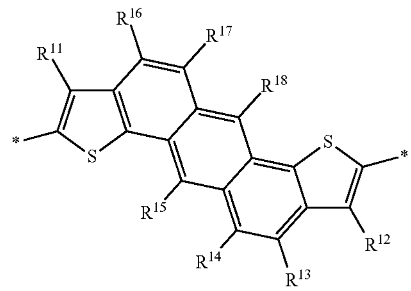
(D77)
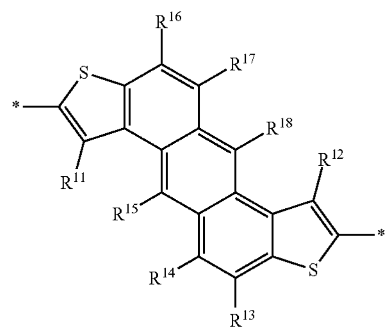
(D78)
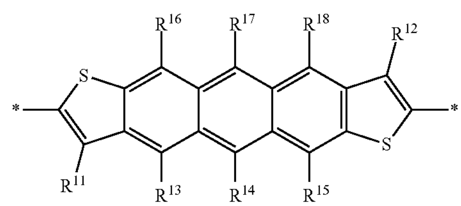
(D79)
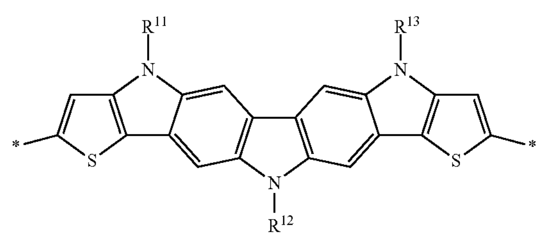
(D80)
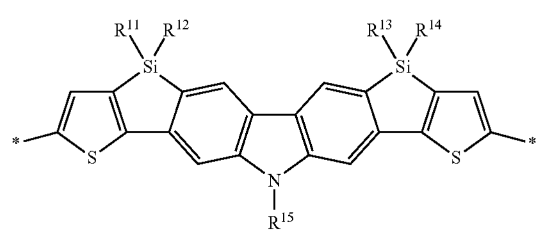
(D81)
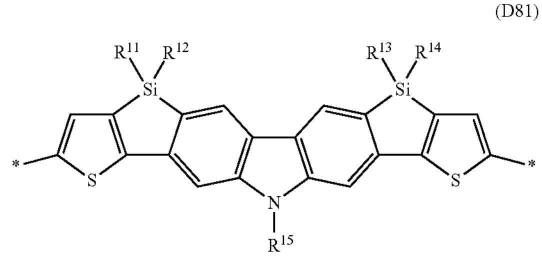

-continued
(D82)
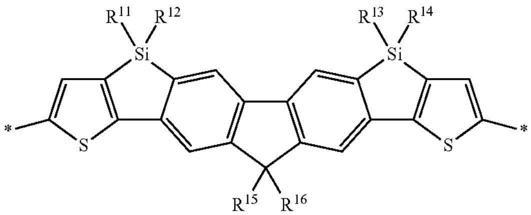
(D83)
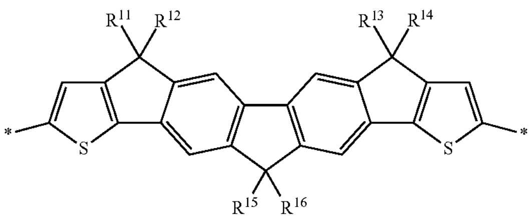
(D84)
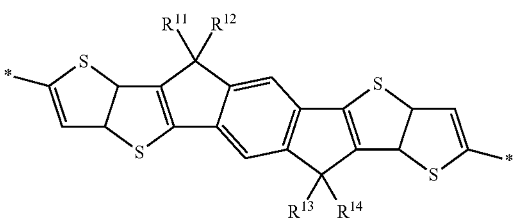
(D85)
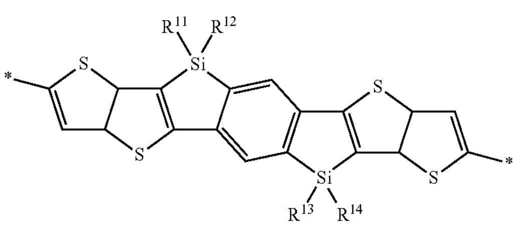
(D86)
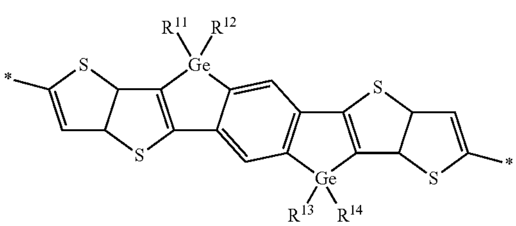
(D87)
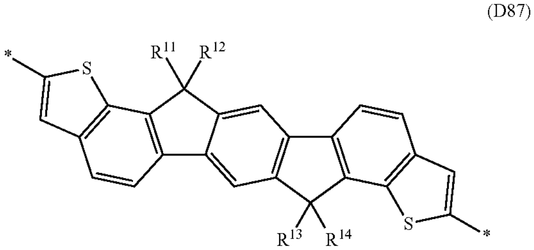
-continued
(D88)
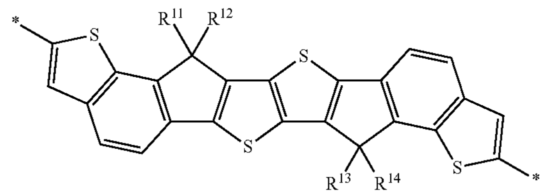
(D89)
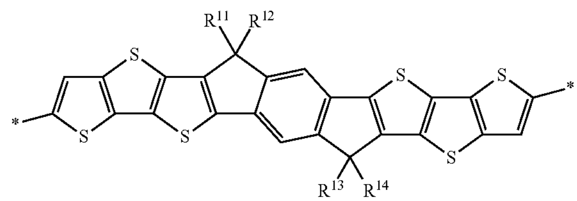
(D90)
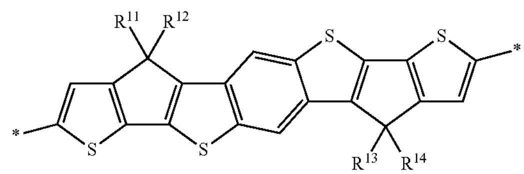
(D91)
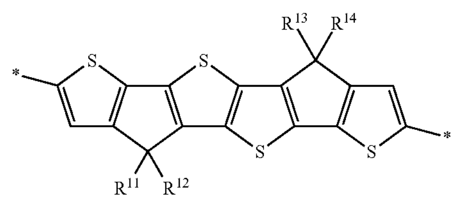
(D92)
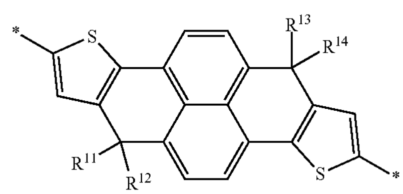
(D93)
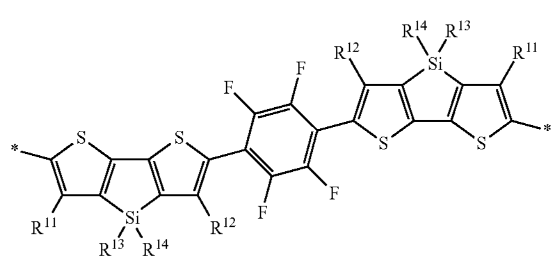
(D94)
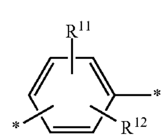
(D95)
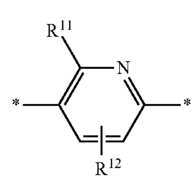

(D96)
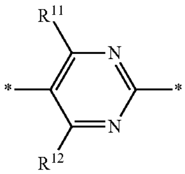
(D97)
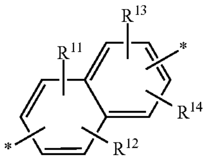
(D98)
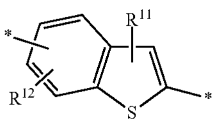
(D99)
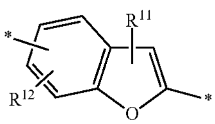
(D100)
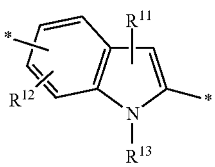
(D101)
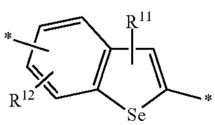
(D102)
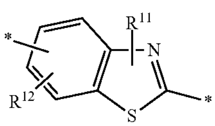
(D103)
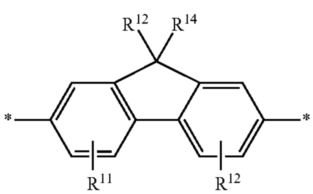
(D104)
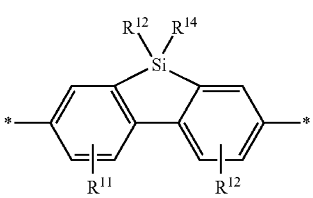
(D105)
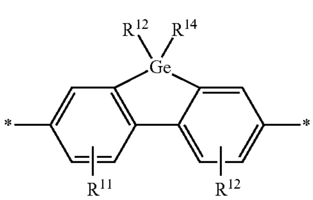
(D106)
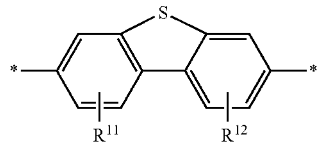
(D107)
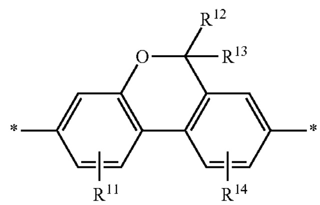
(D108)
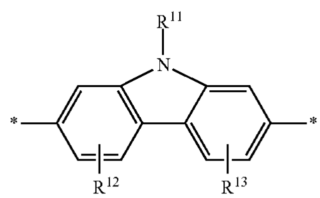
(D109)
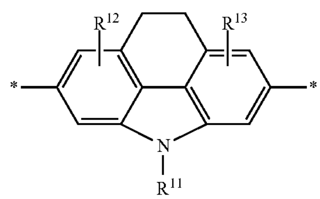
(D110)
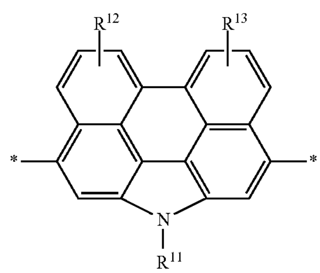
(D111)
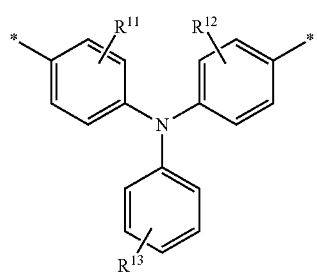
(D112)
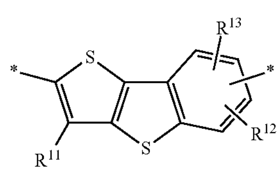

-continued
(D113)
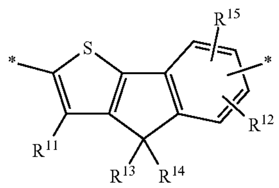
(D114)
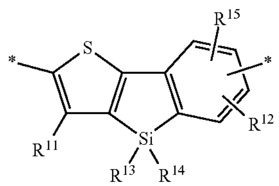
(D115)
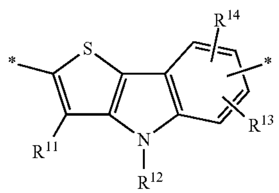
(D116)
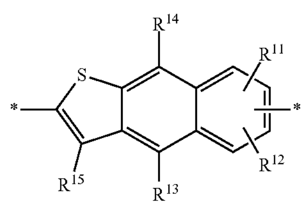
(D117)
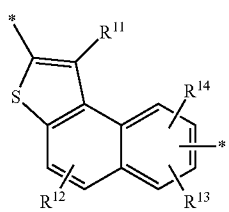
(D118)
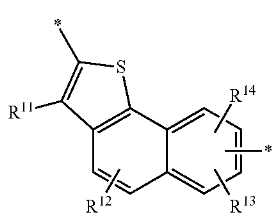
(D119)
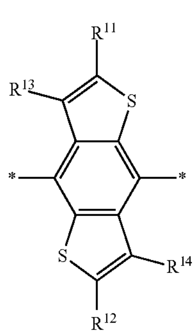
-continued
(D120)
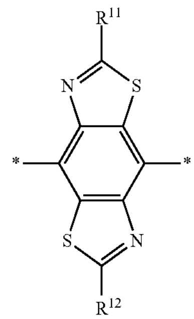
(D121)
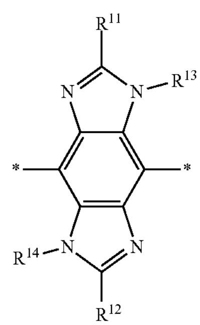
(D122)
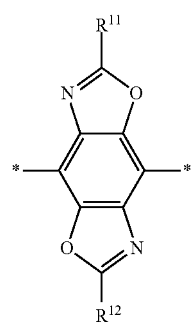
(D123)
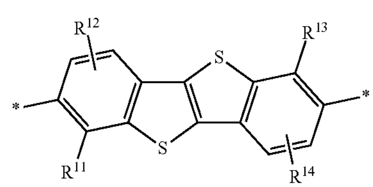
(D124)
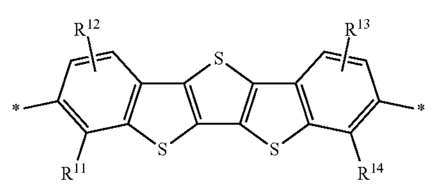
(D125)
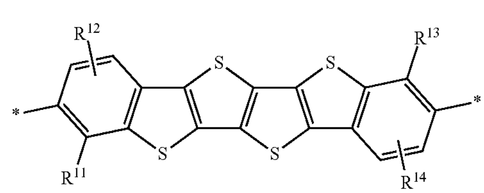

-continued
(D126)
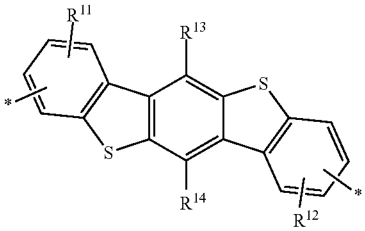
(D127)
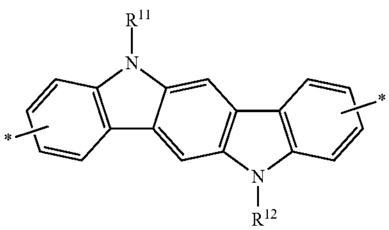
(D128)
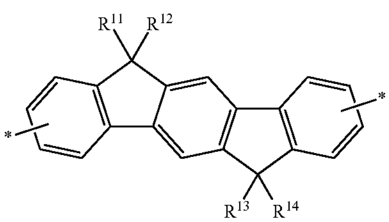
(D129)
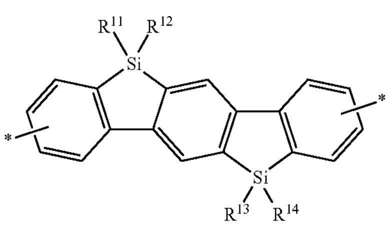
(D130)
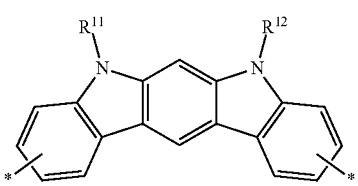
(D131)
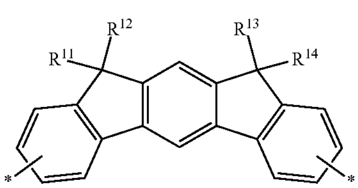
(D132)
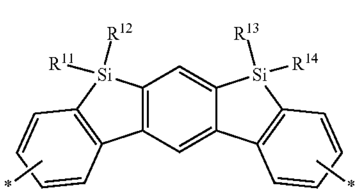
-continued
(D133)
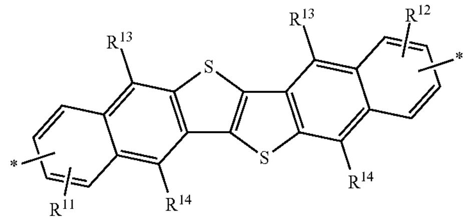
(D134)
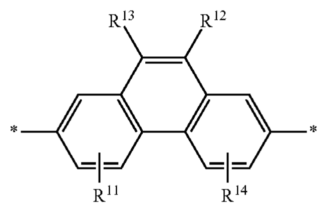
(D135)
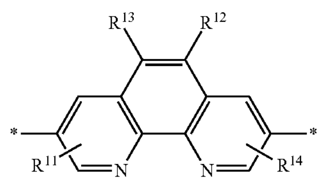
(D136)
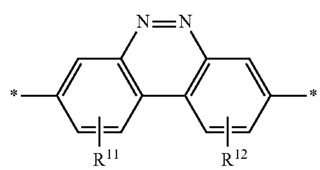
(D137)
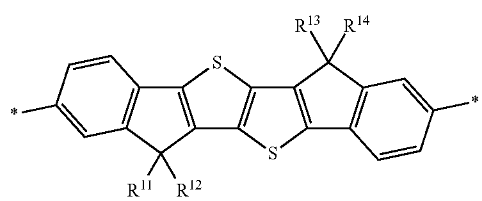
(D138)
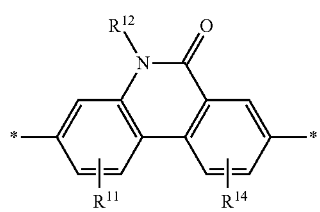
(D139)
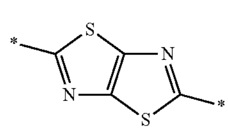
(D140)
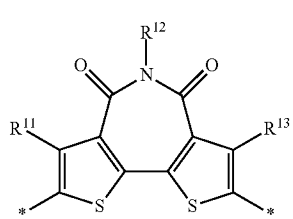

-continued (D141)

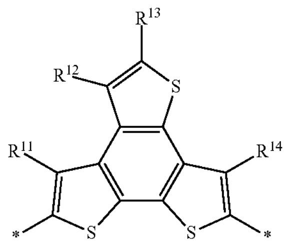

(D142)

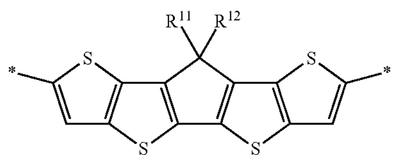

(D143)

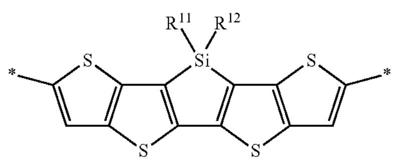

(D144)

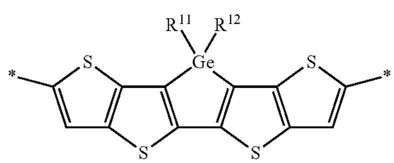

(D145)

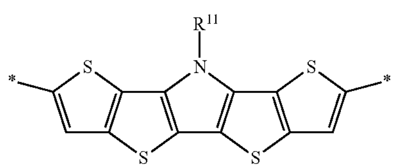

(D146)

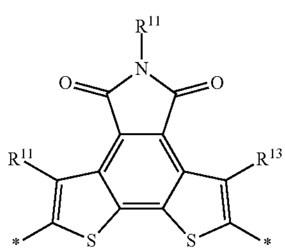

(D147)

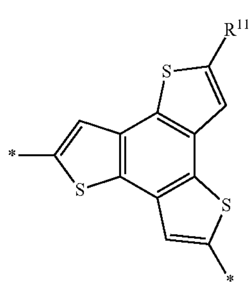

-continued (D148)

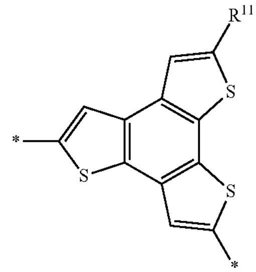

(D149)

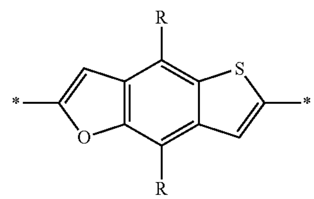

(D150)

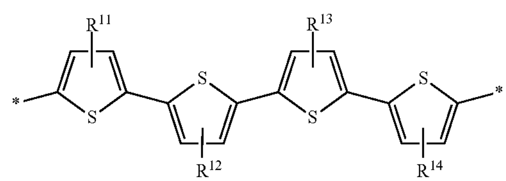

(D151)

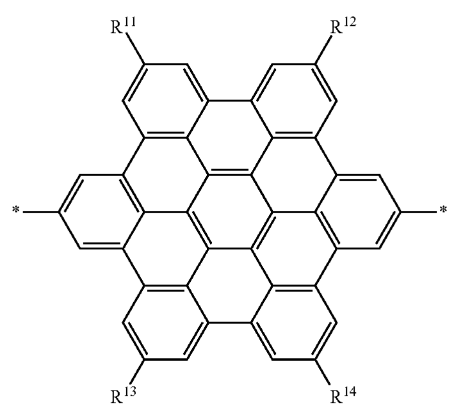

wherein $R^{11}$, $R^{12}$, $R^{13}$, $R^{14}$, $R^{15}$, $R^{16}$, $R^{17}$ and $R^{18}$ independently of each other denote H or have one of the meanings of L or $R^1$ as defined above and below.

Preferably the conjugated p-type OSC polymer contains one or more donor units selected from the group consisting of the formulae D1, D7, D10, D11, D19, D22, D29, D30, D35, D36, D37, D44, D55, D84, D87, D88, D89, D93, D106, D111, D119, D140, D141, D146 and D150.

Further preferably in the conjugated p-type OSC polymer, including but not limited to the polymers of formulae Pi-Pxi, the acceptor units or units A, $A^1$ and $A^2$ are selected from the following formulae (A1)
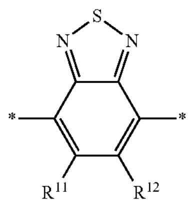
(A2)
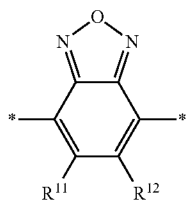
(A3)
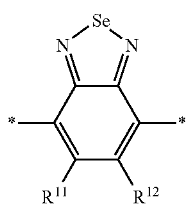
(A4)
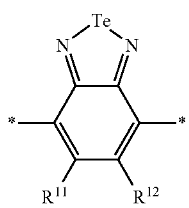
(A5)
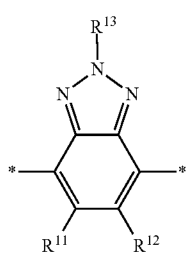
(A6)
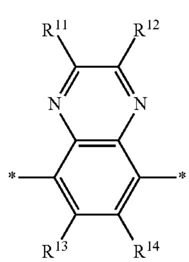
(A7)
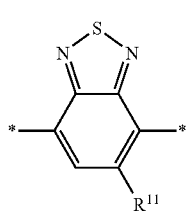
-continued
(A8)
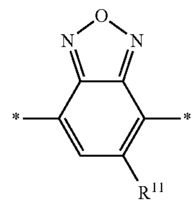
(A9)
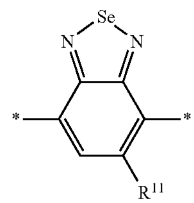
(A10)
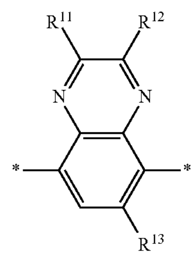
(A11)
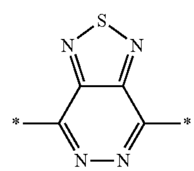
(A12)
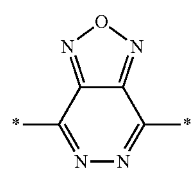
(A13)
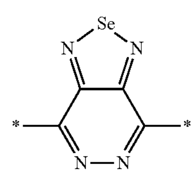
(A14)
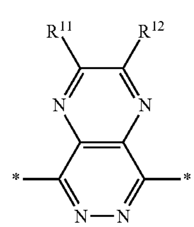
(A15)
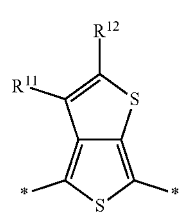

-continued
(A16)
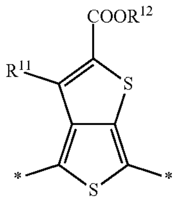
(A17)
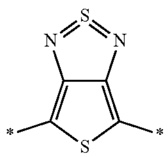
(A18)
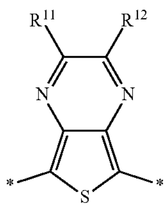
(A19)
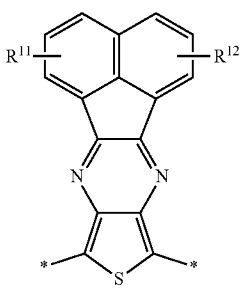
(A20)
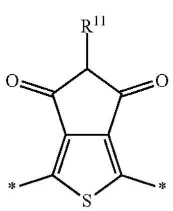
(A21)
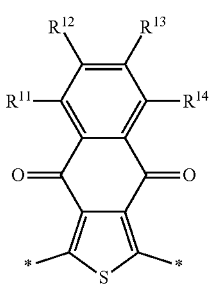
(A22)
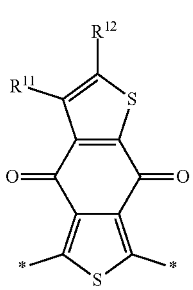
-continued
(A23)
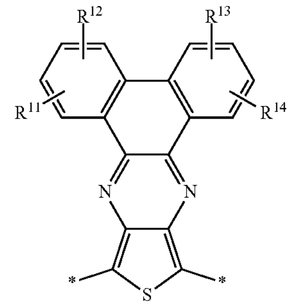
(A24)
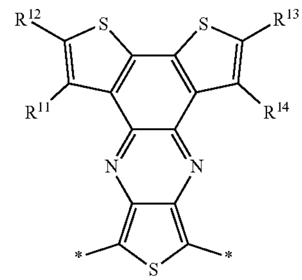
(A25)
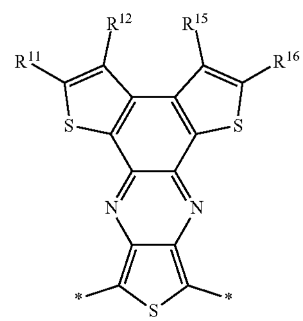
(A26)
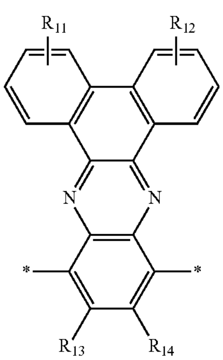
(A27)
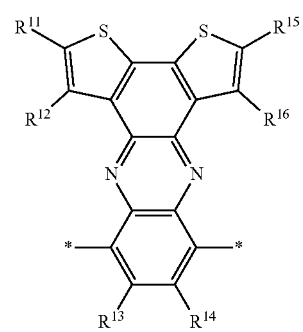

-continued
(A28)
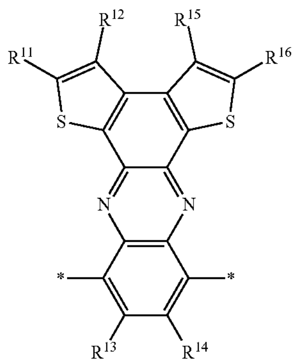
(A29)
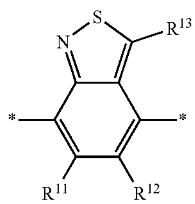
(A30)
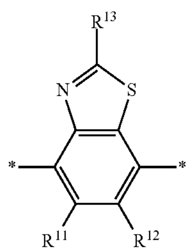
(A31)
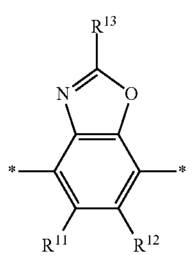
(A32)
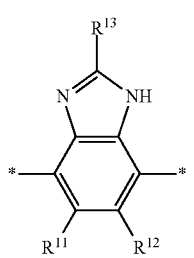
(A33)
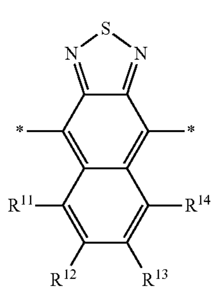
-continued
(A34)
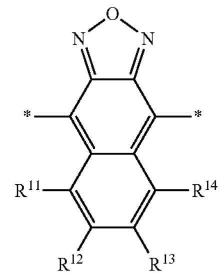
(A35)
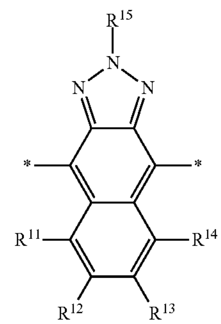
(A36)
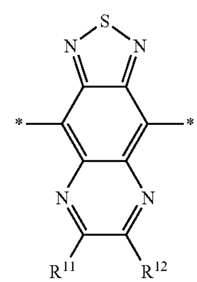
(A37)
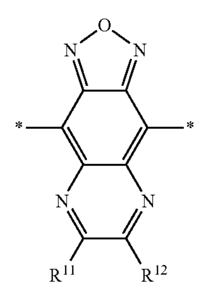
(A38)
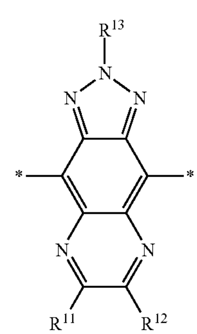

-continued
(A39)
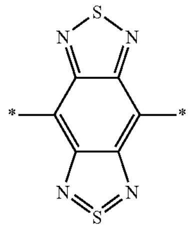
(A40)
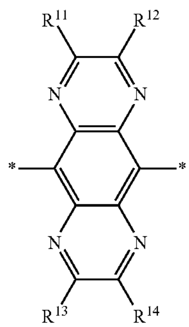
(A41)
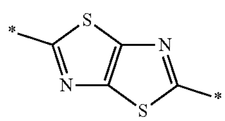
(A42)
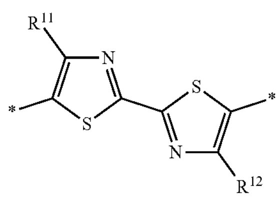
(A43)
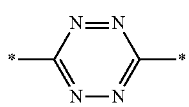
(A44)
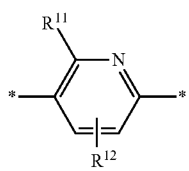
(A45)
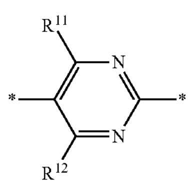
(A46)
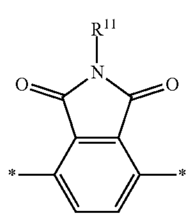
-continued
(A47)
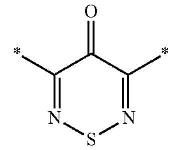
(A48)
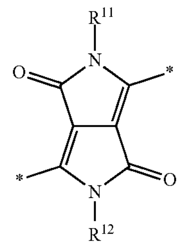
(A49)
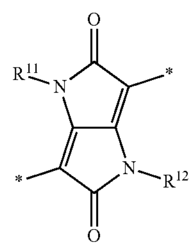
(A50)
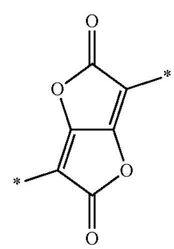
(A51)
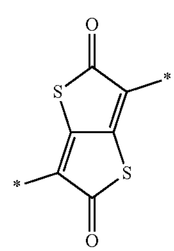
(A52)
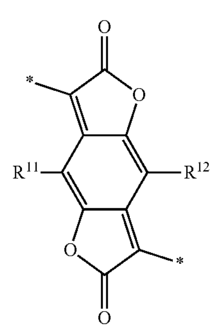

-continued
(A53)
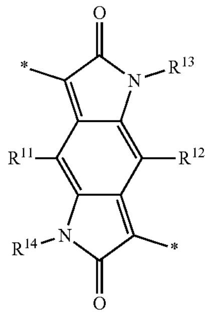
(A54)
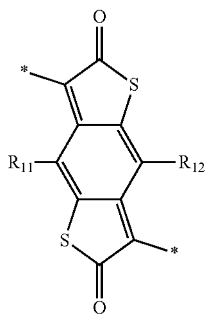
(A55)
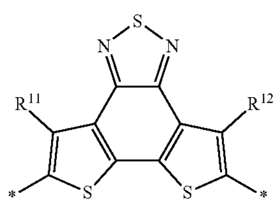
(A56)
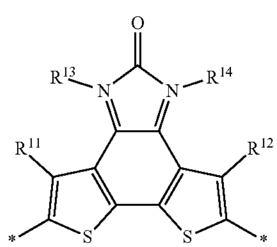
(A57)
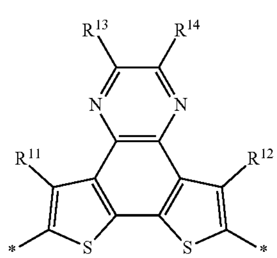
-continued
(A58)
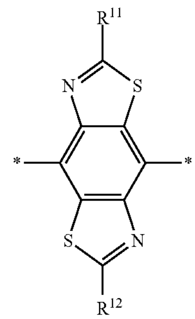
(A59)
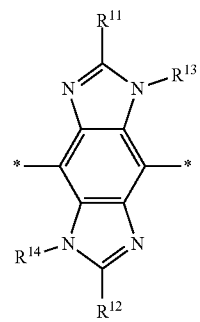
(A60)
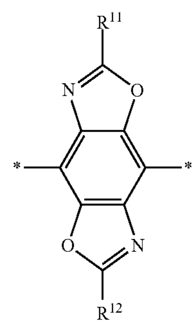
(A61)
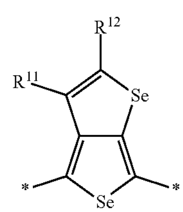
(A62)
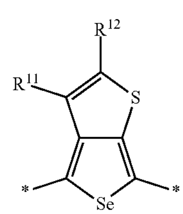
(A63)
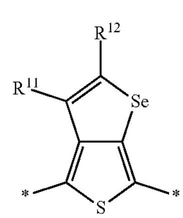

-continued
(A64)
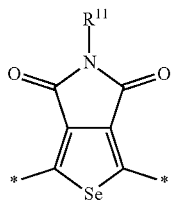
(A65)
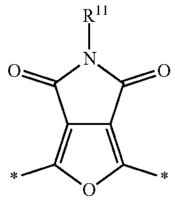
(A66)
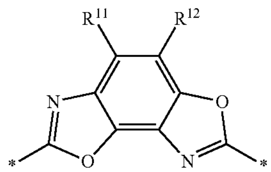
(A67)
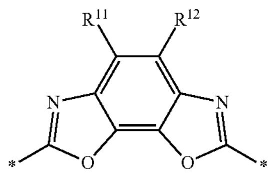
(A68)
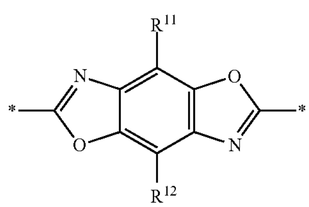
(A69)
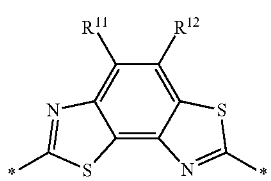
(A70)
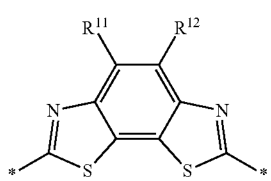
(A71)
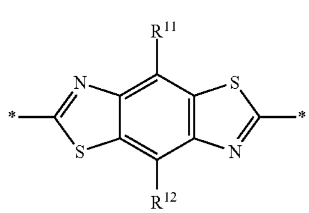
-continued
(A72)
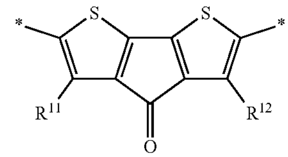
(A73)
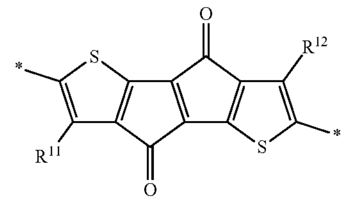
(A74)
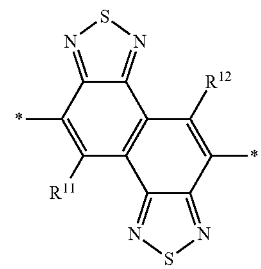
(A75)
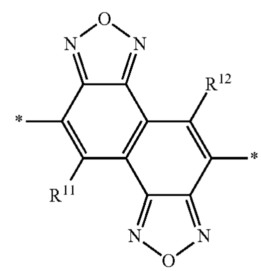
(A76)
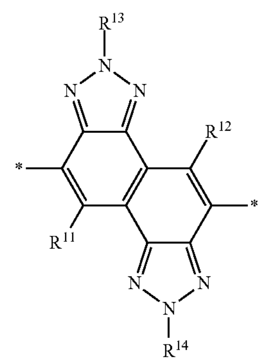
(A77)
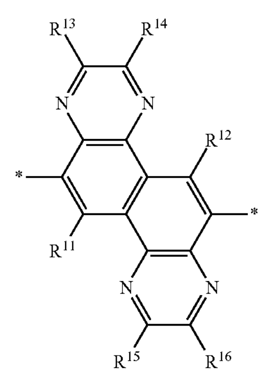

-continued
(A78)
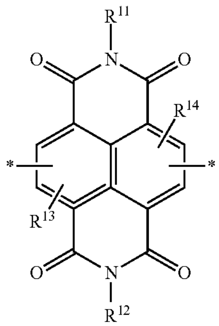
(A79)
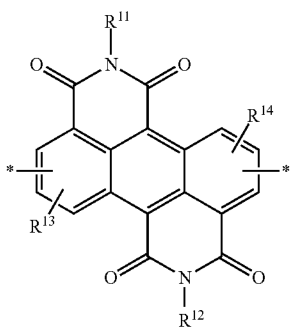
(A80)
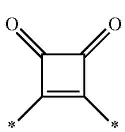
(A81)
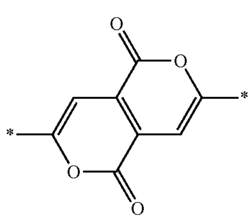
(A82)
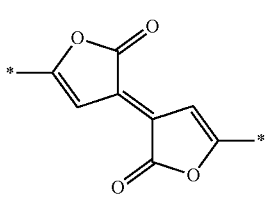
(A83)
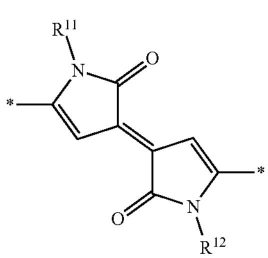
-continued
(A84)
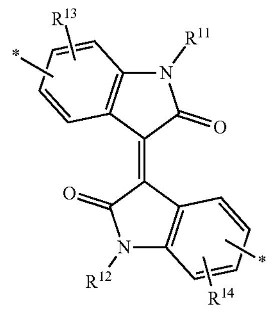
(A85)
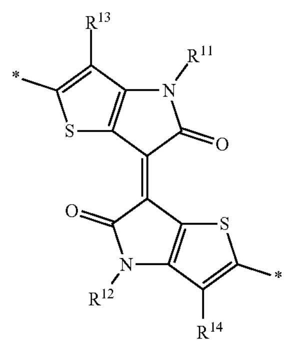
(A86)
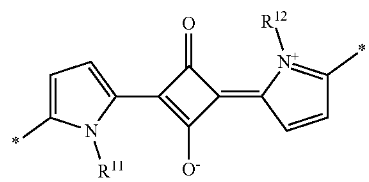
(A87)
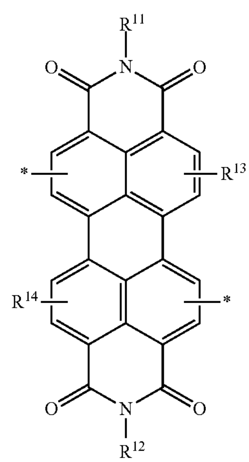
(A88)
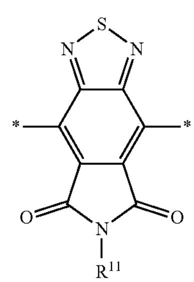

-continued
(A89)
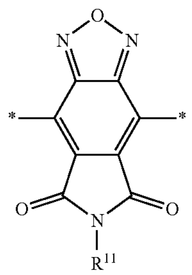
(A90)
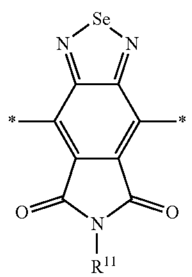
(A91)
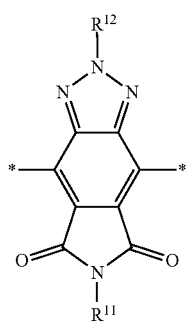
(A92)
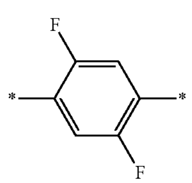
(A93)
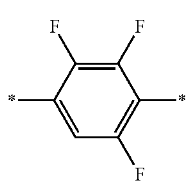
(A94)
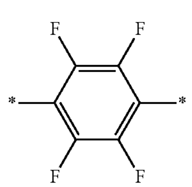
(A95)
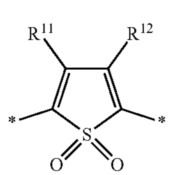
-continued
(A96)
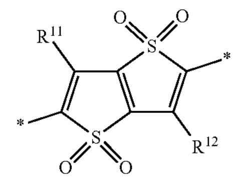
(A97)
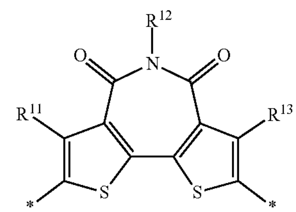
(A98)
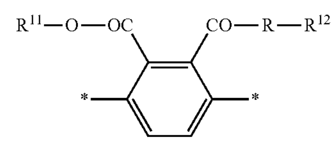
(A99)
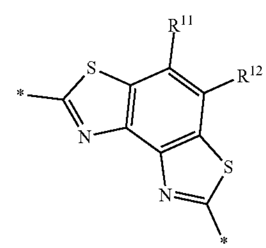
(A100)
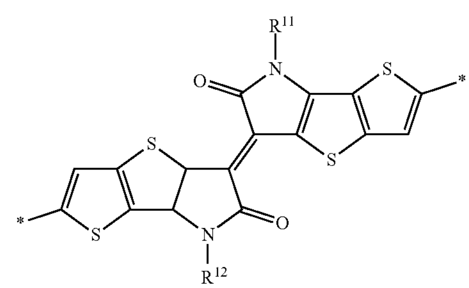
(A101)
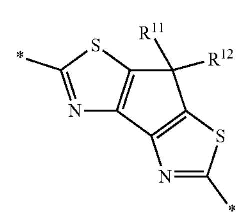

-continued (A102)

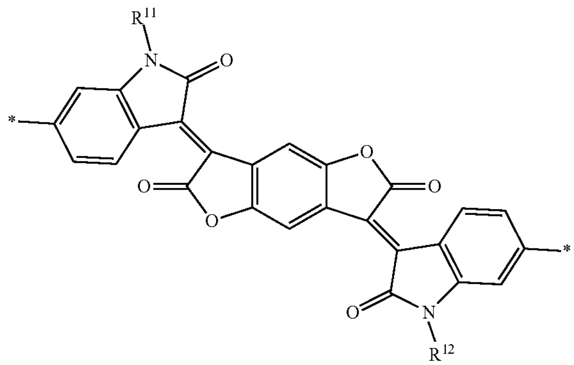

(A103)

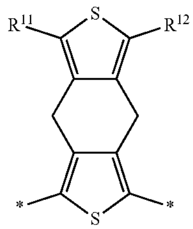

(A104)

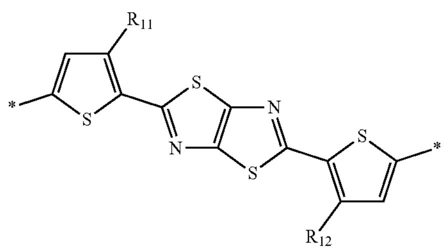

wherein $R^{11}$, $R^{12}$, $R^{13}$, $R^{14}$, $R^{15}$ and $R^{16}$ independently of each other denote H or have one of the meanings of L or $R^1$ as defined above and below.

Preferably the conjugated p-type OSC polymer contains one or more acceptor units selected from the group consisting of the formulae A1, A5, A7, A15, A16, A20, A74, A88, A92, A94, A98, A99, A103 and A104.

Further preferably in the conjugated p-type OSC polymer, including but not limited to the polymers of formulae Pi-Pxi, the spacer units or units Sp, $Sp^1$ and $Sp^2$ are selected from the following formulae Sp1

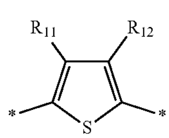

Sp2

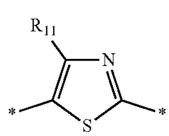

Sp3

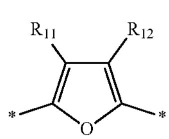

-continued

Sp4

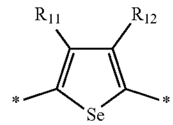

Sp5

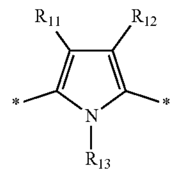

Sp6

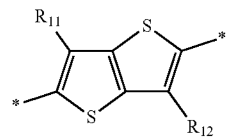

Sp7

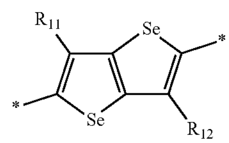

Sp8

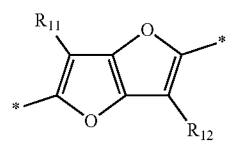

Sp9

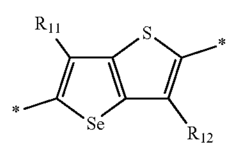

Sp10

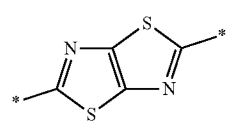

Sp11

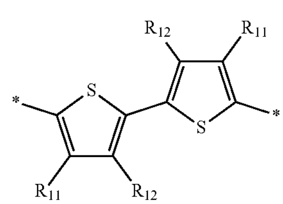

Sp12

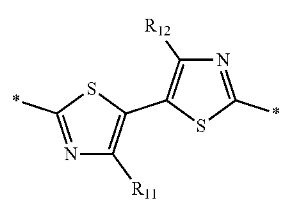

Sp13

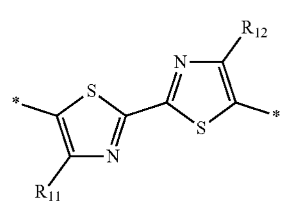

-continued

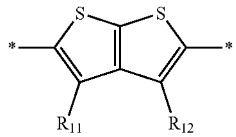

Sp14

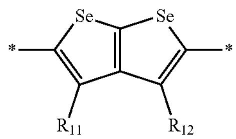

Sp15

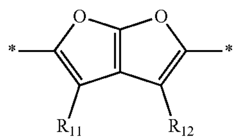

Sp16

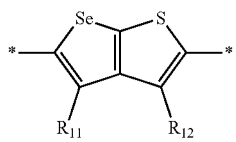

Sp17

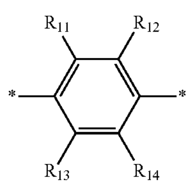

Sp18 wherein $R^{11}$, $R^{12}$, $R^{13}$, $R^{14}$ independently of each other denote H or have one of the meanings of L or $R^1$ as defined above.

In the formulae Sp1 to Sp17 preferably $R^{11}$ and $R^{12}$ are H. In formula Sp18 preferably $R^{11-14}$ are H or F.

Preferably the conjugated p-type OSC polymer contains one or more spacer units selected from the group consisting of formulae Sp1, Sp6, Sp11 and Sp14.

Preferably the conjugated p-type OSC polymer contains, preferably consists of a) one or more donor units selected from the group consisting of the formulae D1, D7, D10, D11, D19, D22, D29, D30, D35, D36, D37, D44, D55, D84, D87, D88, D89, D93, D106, D111, D119, D140, D141, D146 and D150, and/or b) one or more acceptor units selected from the group consisting of the formulae A1, A5, A7, A15, A16, A20, A74, A88, A92, A94, A98, A99, A103 and A104, and c) optionally one or more spacer units selected from the group consisting of the formulae Sp1-Sp18, very preferably of the formulae Sp1, Sp6, Sp11 and Sp14, wherein the spacer units, if present, are preferably located between the donor and acceptor units such that a donor unit and an acceptor unit are not directly connected to each other.

In another preferred embodiment the conjugated p-type OSC polymer comprises, preferably consists of one or more, preferably one, two, three or four, distinct repeating units D, and one or more, preferably one, two or three, distinct repeating units A.

Preferably the conjugated p-type OSC polymer according to this preferred embodiment contains from one to six, very preferably one, two, three or four distinct units D and from one to six, very preferably one, two, three or four distinct units A, wherein d1, d2, d3, d4, d5 and d6 denote the molar ratio of each distinct unit D, and a1, a2, a3, a4, a5 and a6 denote the molar ratio of each distinct unit A, and each of d1, d2, d3, d4, d5 and d6 is from 0 to 0.6, and d1+d2+d3+d4+d5+d6 is from 0.2 to 0.8, preferably from 0.3 to 0.7, and each of a1, a2, a3, a4, a5 and a6 is from 0 to 0.6, and a1+a2+a3+a4+a5+d6 is from 0.2 to 0.8, preferably from 0.3 to 0.7, and d1+d2+d3+d4+d5+d6+a1+a2+a3+a4+a5+a6 is from 0.8 to 1, preferably 1.

Preferably the conjugated p-type OSC polymer according to this preferred embodiment contains, preferably consists of a) one or more donor units selected from the group consisting of the formulae D1, D7, D10, D11, D19, D22, D29, D30, D35, D36, D37, D44, D55, D84, D87, D88, D89, D93, D106, D111, D119, D140, D141, D146 and D150, and/or b) one or more acceptor units selected from the group consisting of the formulae A1, A5, A7, A15, A16, A20, A74, A88, A92, A94, A98, A99, A103 and A104.

In the above conjugated polymers, like those of formula Pi and Pii, the total number of repeating units n is preferably from 2 to 10,000. The total number of repeating units n is preferably ≥5, very preferably ≥10, most preferably ≥50, and preferably ≤500, very preferably ≤1,000, most preferably ≤2,000, including any combination of the aforementioned lower and upper limits of n.

Very preferred conjugated polymers comprise one or more of the following subformulae as one or more repeating unit

P1

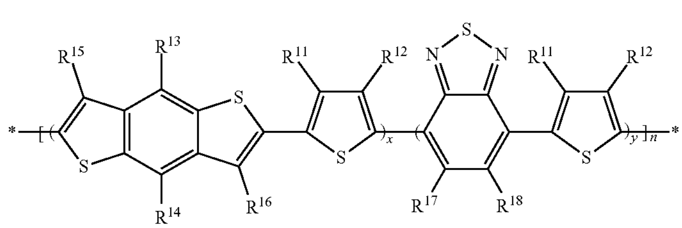

-continued
P2
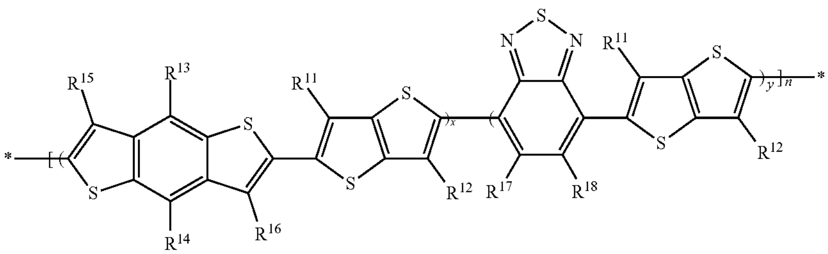
P3
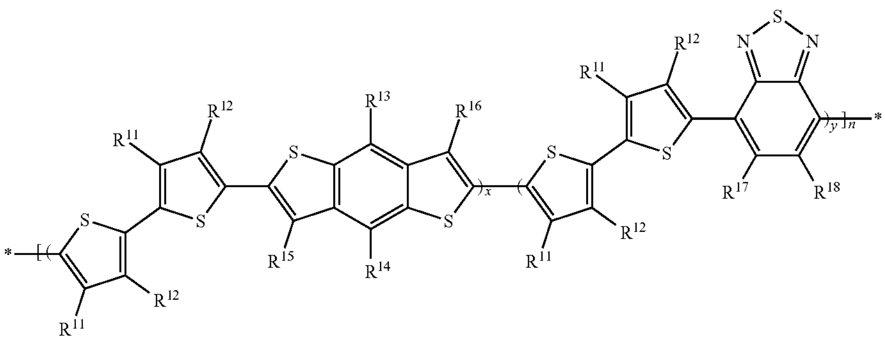
P4
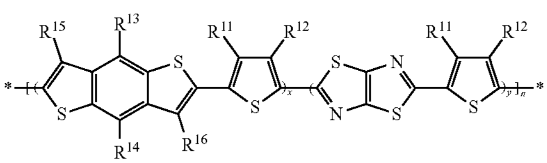
P5
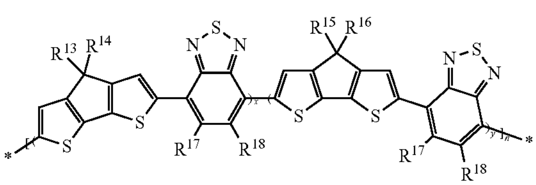
P6
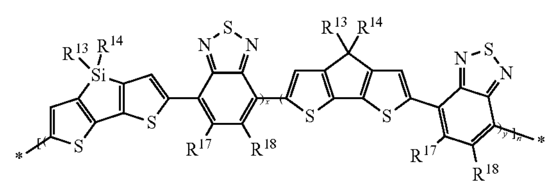
P7
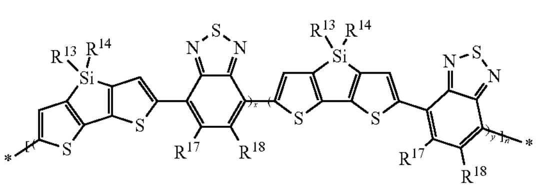
P8
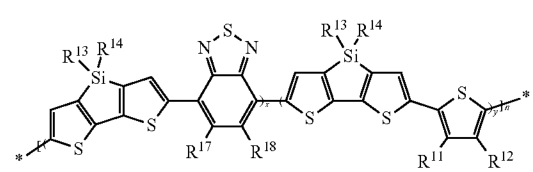
P9
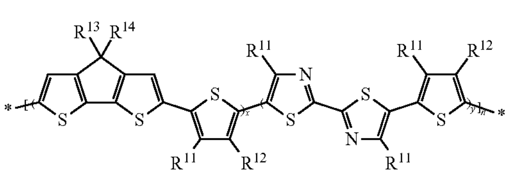
P10
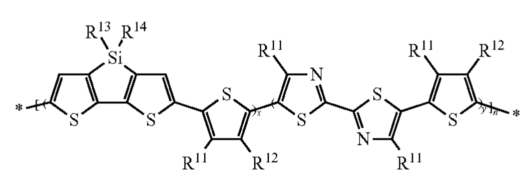
P11
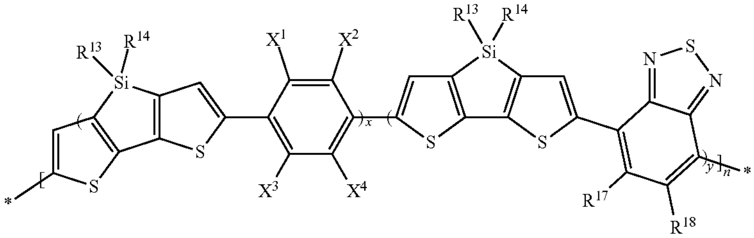

-continued
P12
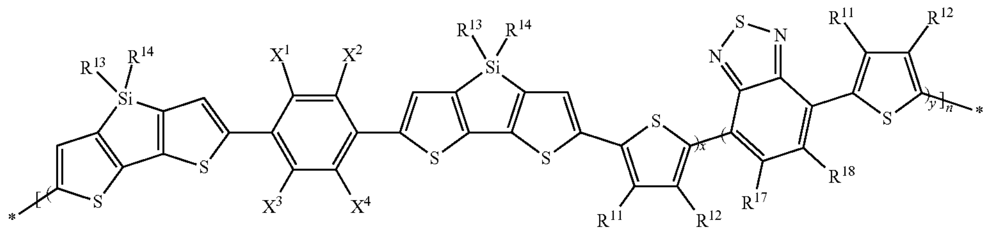
P13
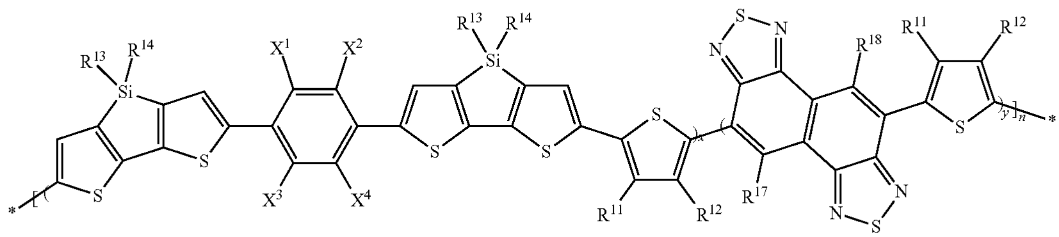
P14
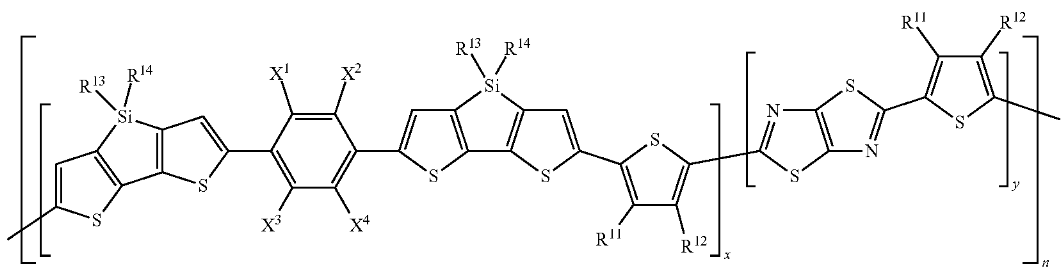
P15
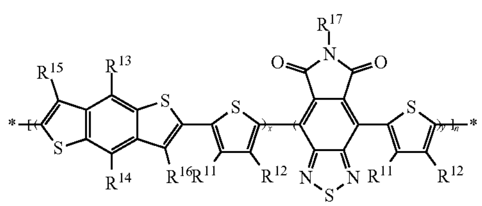
P16
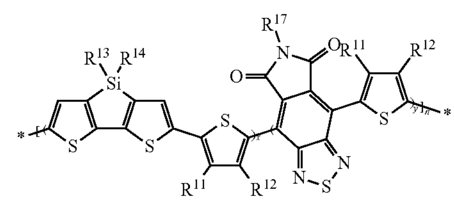
P17
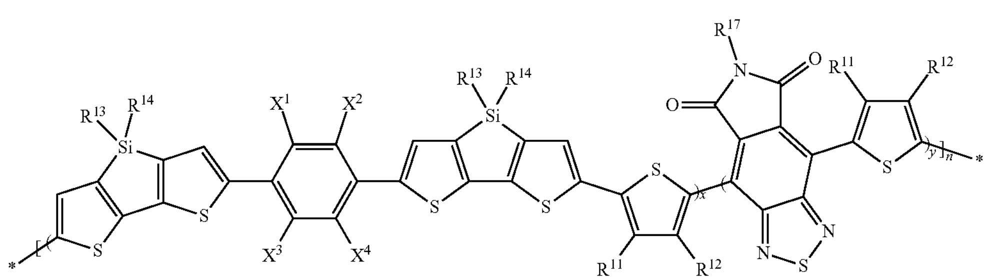
P18
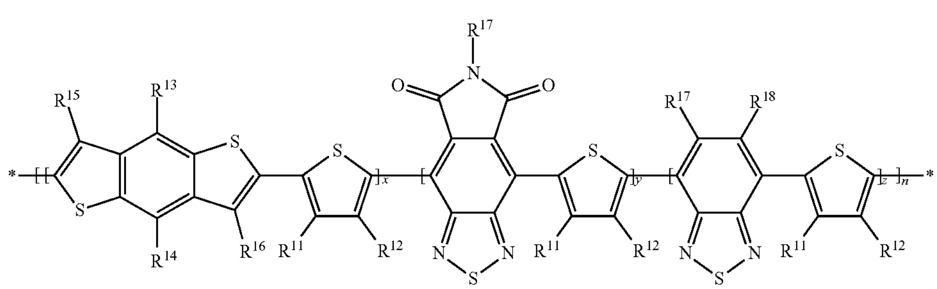

-continued
P19
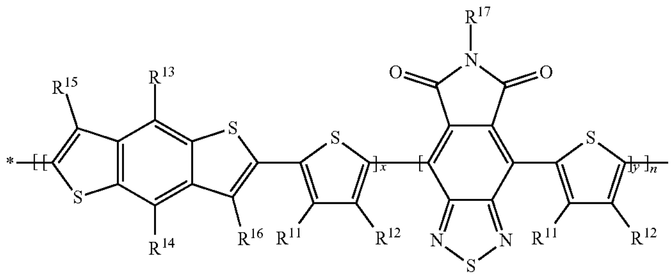
P20
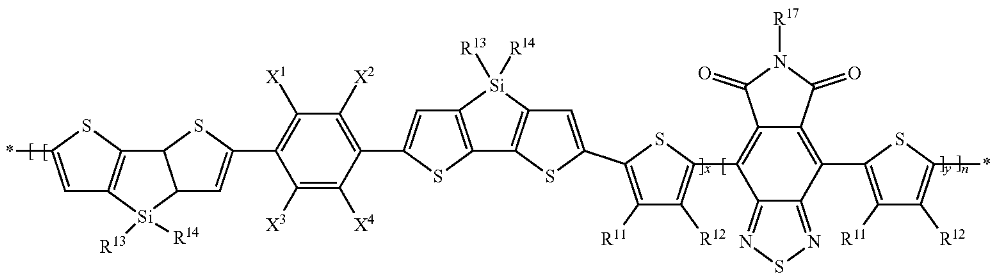
P21
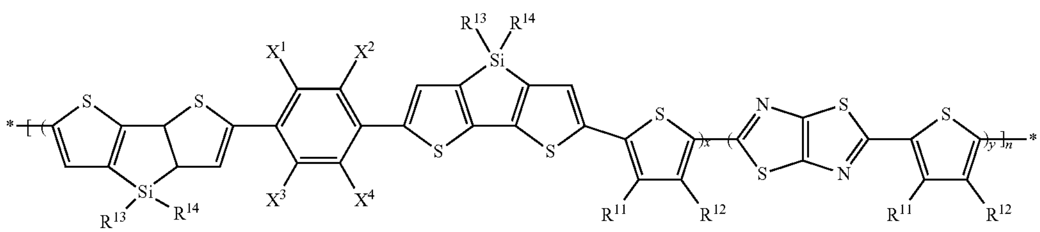
P22
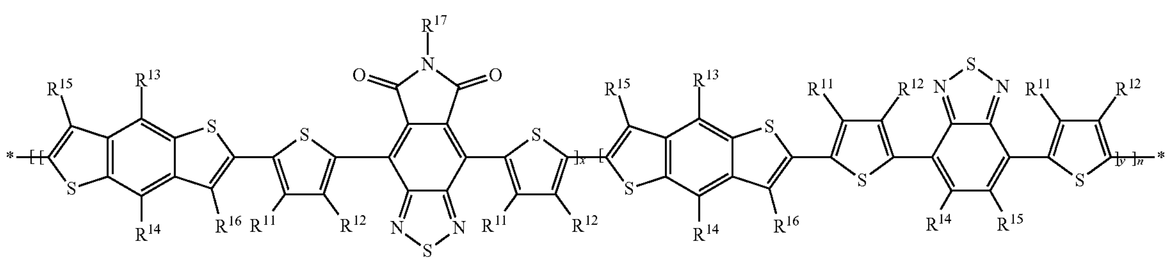
P23
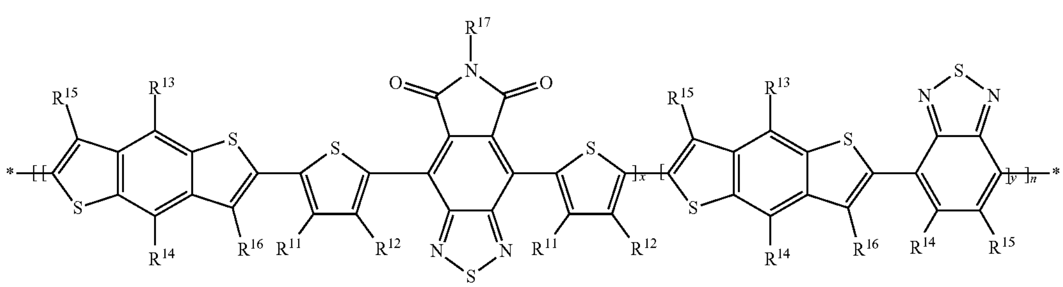
P24
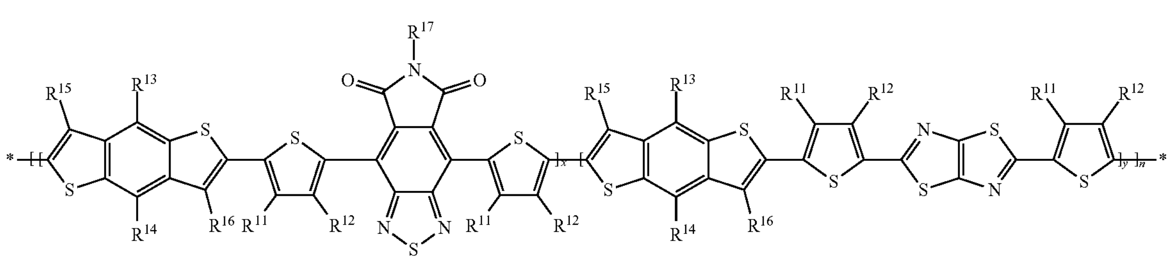

-continued
P25
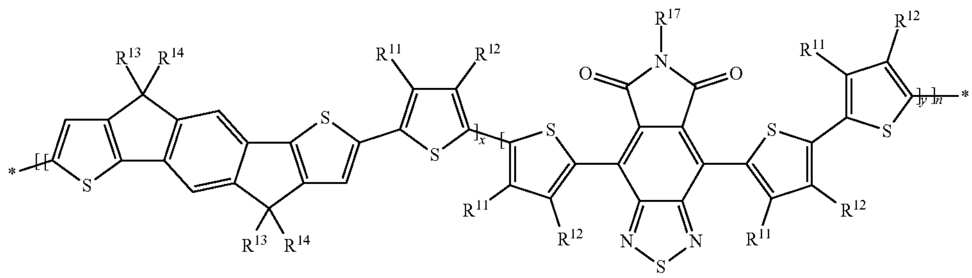
P26
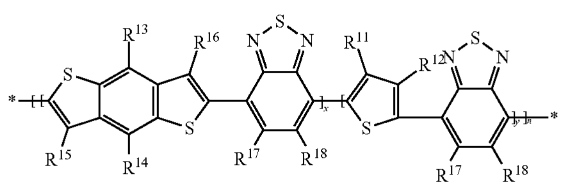
P27
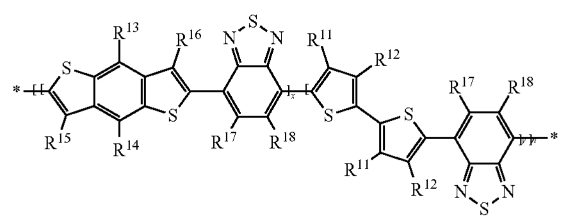
P28
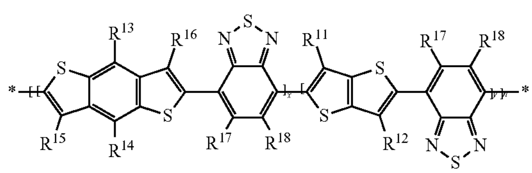
P29
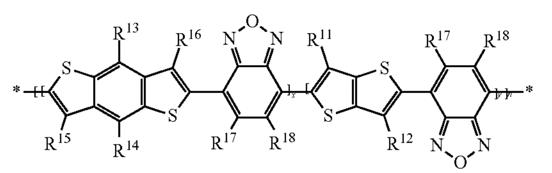
P30
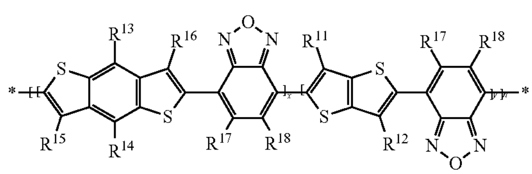
P31
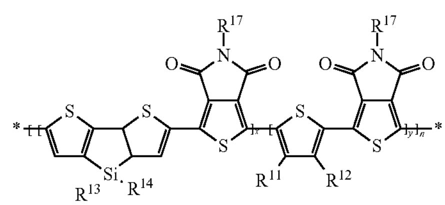
P32
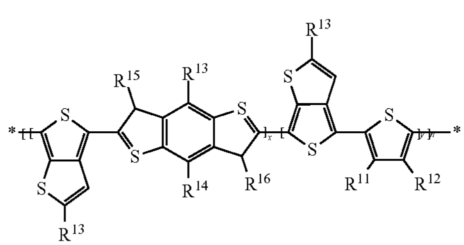
P33
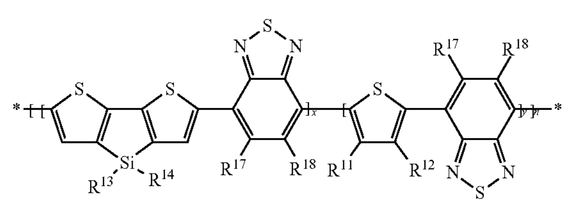
P34
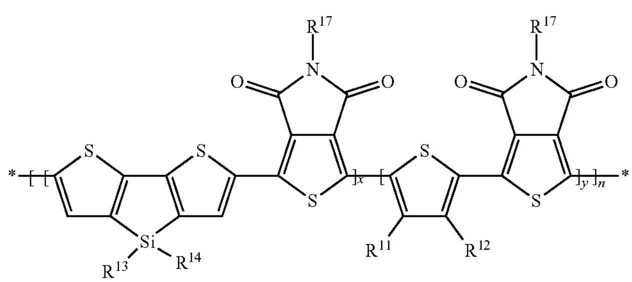

-continued
P35
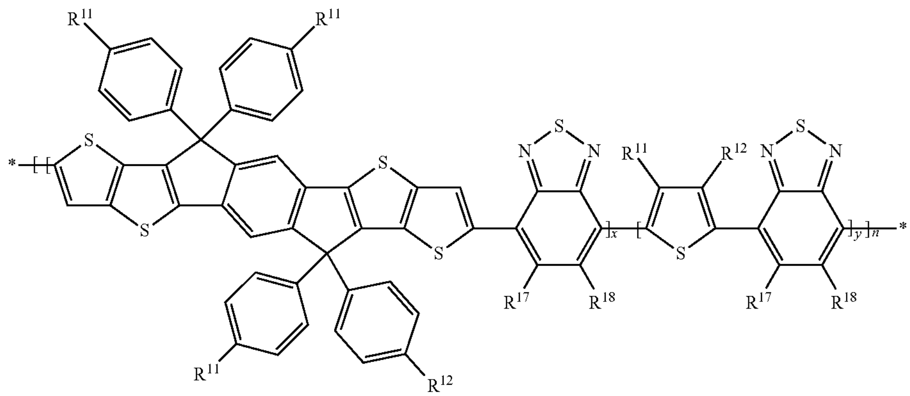
P36
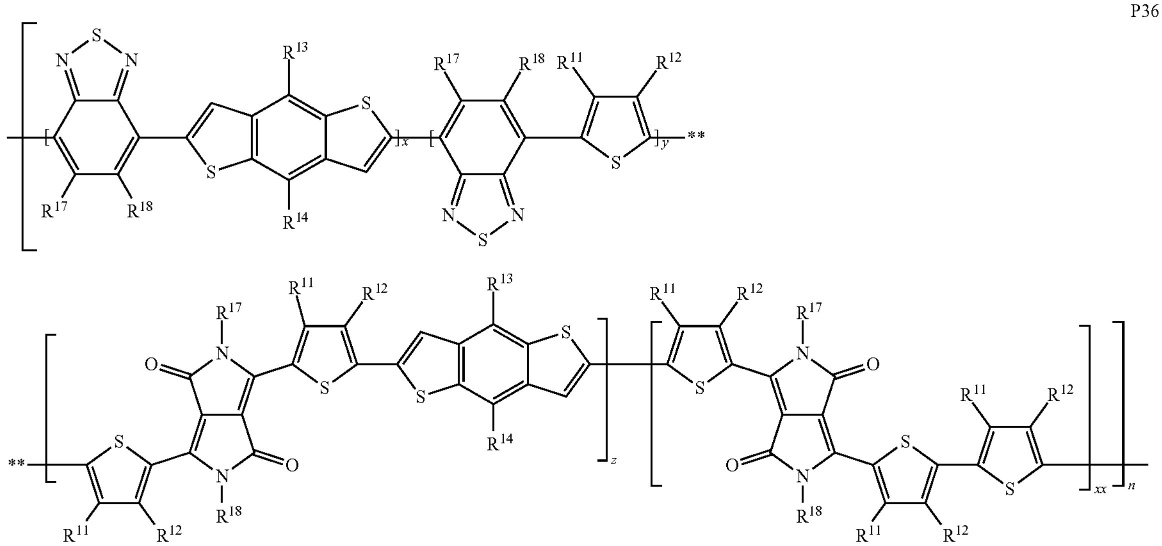
P37
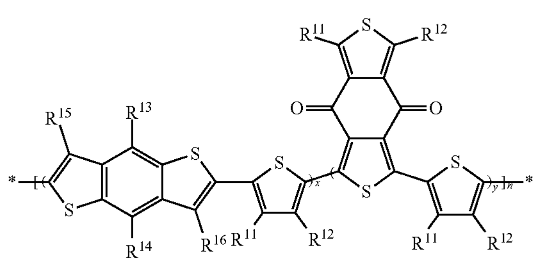
P38
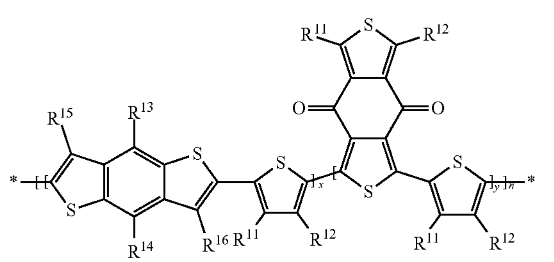
P39
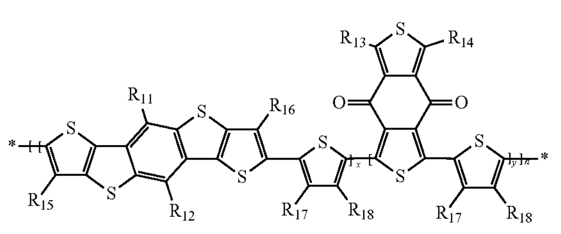
P40
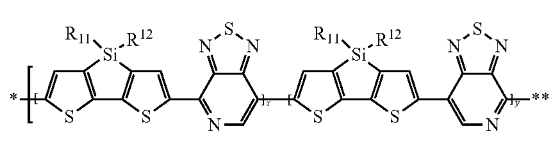
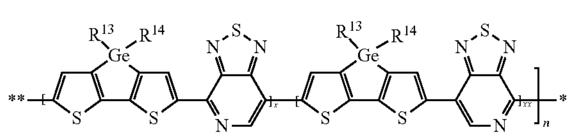
P41
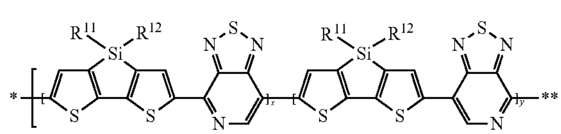

-continued
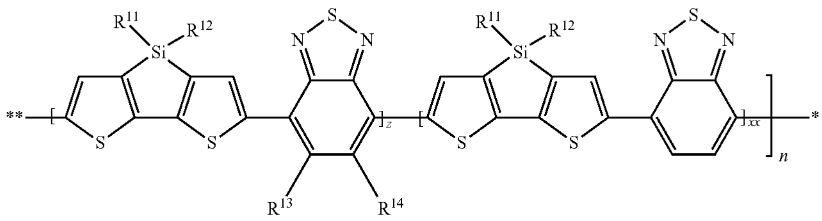
P42
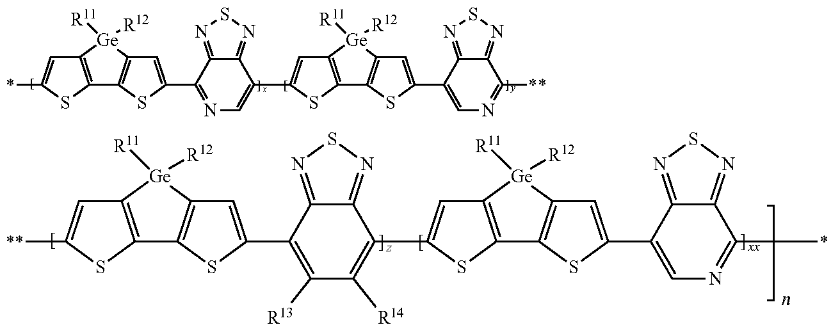
P43
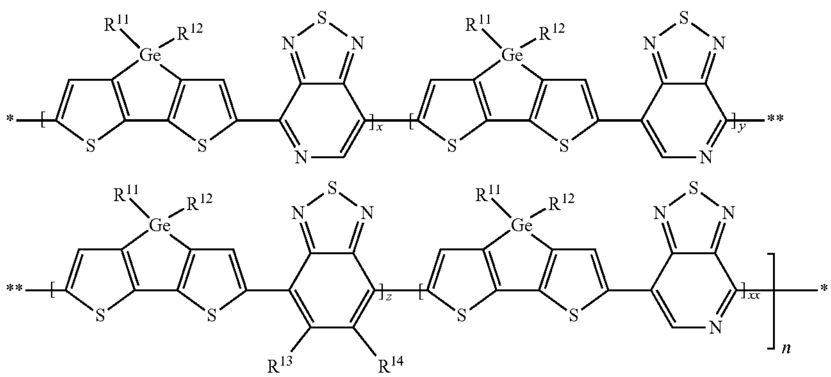
P44
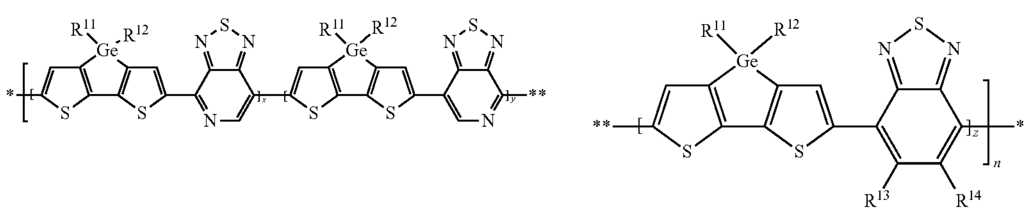
P45
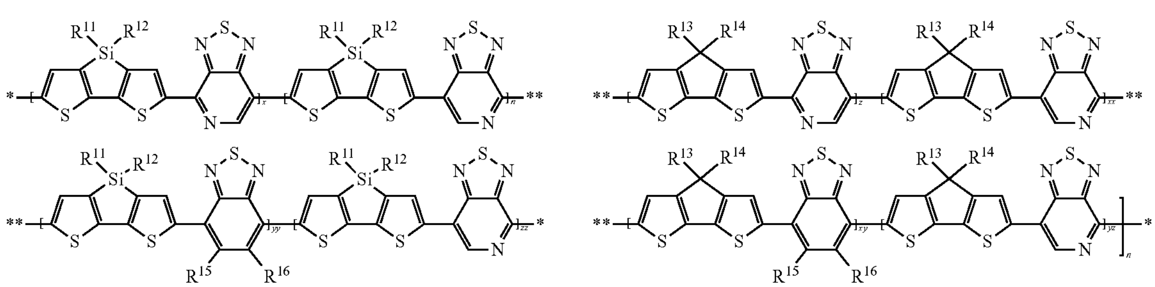
P46
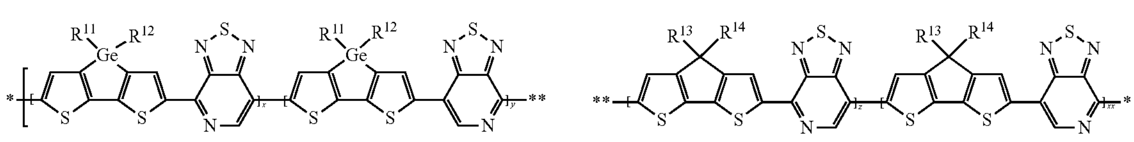

-continued

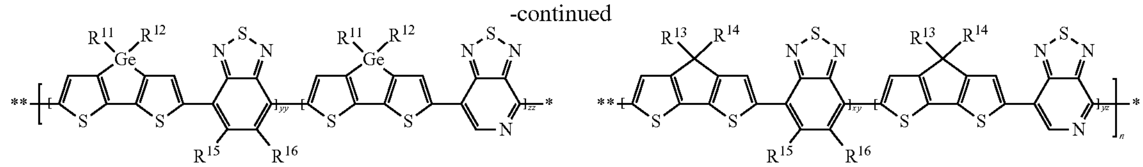

P47

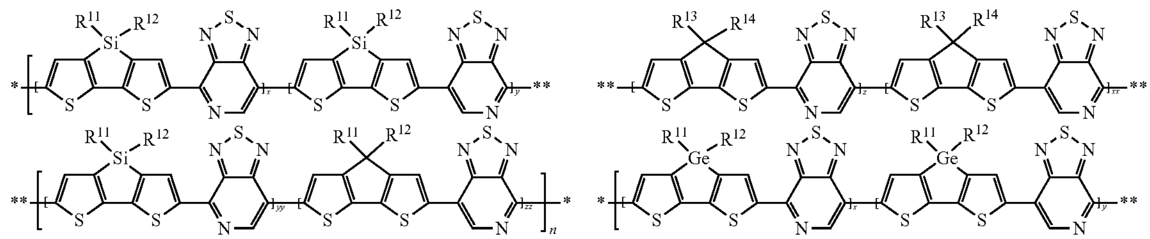

P48

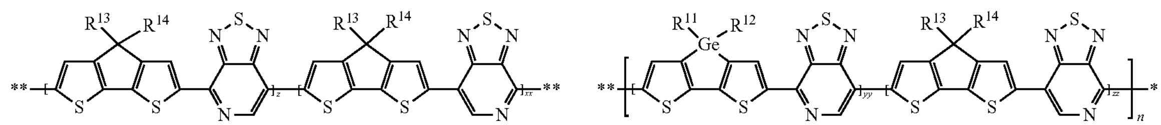

P49

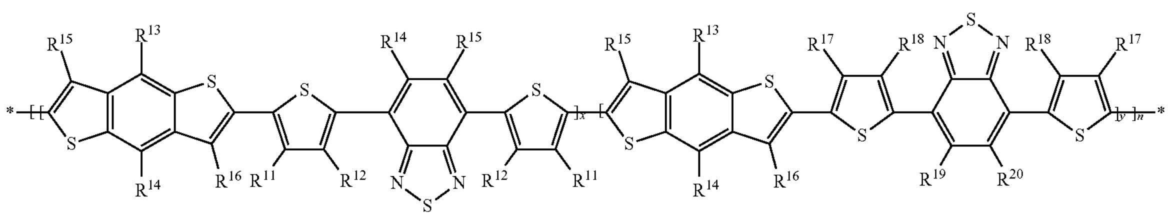

wherein $R^{11-20}$ independently of each other, and on each occurrence identically or differently denote H or have one of the meanings of L or $R^1$ as defined above, x, y, z, xx, yy, zz, xy and xz are each, independently of one another >0 and <1, with x+y+z+xx+yy+zz+xy+xz=1, n is an integer >1, and $X^1$, $X^2$, $X^3$ and $X^4$ denote H, F or Cl, and in formula P5 and P7 at least one of $R^{13}$ and $R^{14}$ is different from at least one of $R^{15}$ and $R^{16}$.

In the formulae P1-P49 preferably one or more of $X^1$, $X^2$, $X^3$ and $X^4$ denote F, very preferably all of $X^1$, $X^2$, $X^3$ and $X^4$ denote F or $X^1$ and $X^2$ denote H and $X^3$ and $X^4$ denote F.

In the formulae P1-P39 and P49, preferably $R^{11}$ and $R^{12}$, when being different from H, are independently of each other, and on each occurrence identically or differently selected from the following groups:

the group consisting of straight-chain or branched alkyl, alkoxy or sulfanylalkyl with 1 to 30, preferably 1 to 20, C atoms that is optionally fluorinated, the group consisting of straight-chain or branched alkylcarbonyl or alkylcarbonyloxy with 2 to 30, preferably 2 to 20, C atoms, that is optionally fluorinated.

the group consisting of F and Cl.

Further preferably $R^{11}$ and $R^{12}$, when being different from H, denote F or formulae SUB1-6 with 2 to 30, preferably 2 to 20, C atoms that is optionally fluorinated.

In the formulae P1-P39 and P49, preferably $R^{15}$ and $R^{16}$ are H, and $R^{13}$ and $R^{14}$ are different from H.

In the formulae P1-P39 and P49, preferably $R^{13}$, $R^{14}$, $R^{15}$ and $R^{16}$, when being different from H, are independently of each other, and on each occurrence identically or differently selected from the following groups:

the group consisting of straight-chain or branched alkyl, alkoxy or sulfanylalkyl with 1 to 30, preferably 1 to 20, C atoms that is optionally fluorinated, the group consisting of straight-chain or branched alkylcarbonyl or alkylcarbonyloxy with 2 to 30, preferably 2 to 20, C atoms, that is optionally fluorinated.

Further preferably $R^{13}$, $R^{14}$, $R^{15}$ and $R^{16}$, when being different from H, independently of each other, and on each occurrence identically or differently denote a structure of formulae SUB1-6 with 2 to 30, preferably 2 to 20, C atoms that is optionally fluorinated.

In the formulae P1-P49, preferably $R^{17}$, $R^{18}$, $R^{19}$ and $R^{20}$ when being different from H, independently of each other, and on each occurrence identically or differently are selected from the following groups:

the group consisting of straight-chain or branched alkyl, alkoxy or sulfanylalkyl with 1 to 30, preferably 1 to 20, C atoms that is optionally fluorinated, the group consisting of straight-chain or branched alkylcarbonyl or alkylcarbonyloxy with 2 to 30, preferably 2 to 20, C atoms, that is optionally fluorinated.

the group consisting of F and Cl.

In the formulae P40-P48, preferably $R^{11}$, $R^{12}$, $R^{13}$ and $R^{14}$, are independently of each other, and on each occurrence identically or differently selected from the following groups:

the group consisting of straight-chain or branched alkyl, alkoxy or sulfanylalkyl with 1 to 30, preferably 1 to 20, C atoms that is optionally fluorinated, the group consisting of straight-chain or branched alkylcarbonyl or alkylcarbonyloxy with 2 to 30, preferably 2 to 20, C atoms, that is optionally fluorinated.

Further preferably $R^{11}$, $R^{12}$, $R^{13}$ and $R^{14}$ independently of each other, and on each occurrence identically or differently denote a structure of formulae SUB1-6 with 2 to 30, preferably 2 to 20, C atoms that is optionally fluorinated.

Further preferred are conjugated p-type OSC polymers of formula PT $R^{31}$-chain-$R^{32}$ PT wherein "chain" denotes a polymer chain selected of formula Pi, Pii or P1-P49, and $R^{31}$ and $R^{32}$ have independently of each other one of the meanings of $R^{11}$ as defined above, or denote, independently of each other, H, F, Br, Cl, I, —$CH_2$Cl, —CHO, —CR'═CR"$_2$, —SiR'R"R'", —SiR'X'X", —SiR'R"X', —SnR'R"R'", —BR'R", —B(OR')(OR"), —B(OH)$_2$, —O—$SO_2$—R', —C≡CH, —C≡C—SiR'$_3$, —ZnX' or an endcap group, X' and X" denote halogen, R', R" and R'" have independently of each other one of the meanings of $R^0$ given in formula 1, and preferably denote alkyl with 1 to 12 C atoms, and two of R', R" and R'" may also form a cyclosilyl, cyclostannyl, cycloborane or cycloboronate group with 2 to 20 C atoms together with the respective hetero atom to which they are attached.

Preferred endcap groups $R^{31}$ and $R^{32}$ are H, $C_{1-20}$ alkyl, or optionally substituted $C_{6-12}$ aryl or $C_{2-10}$ heteroaryl, very preferably H, phenyl or thiophene.

In another preferred embodiment of the present invention, the photoactive layer of the OPD device, in addition to the p-type OSC conjugated polymer, further comprises one or more p-type OSC compounds selected from small molecules.

The p-type OSC compounds used in the OPD according to the present invention can be synthesized according to or in analogy to methods that are known to the skilled person and are described in the literature. Other methods of preparation can be taken from the examples.

For example, the compounds of the present invention can be suitably prepared by aryl-aryl coupling reactions, such as Yamamoto coupling, Suzuki coupling, Stille coupling, Sonogashira coupling, Heck coupling or Buchwald coupling. The educts can be prepared according to methods which are known to the person skilled in the art.

Preferred aryl-aryl coupling methods used in the synthesis methods as described above and below are Yamamoto coupling, Kumada coupling, Negishi coupling, Suzuki coupling, Stille coupling, Sonogashira coupling, Heck coupling, C-H activation coupling, Ullmann coupling or Buchwald coupling. Especially preferred are Suzuki coupling, Negishi coupling, Stille coupling and Yamamoto coupling. Suzuki coupling is described for example in WO 00/53656 A1. Negishi coupling is described for example in *J. Chem. Soc., Chem. Commun.,* 1977, 683-684. Yamamoto coupling is described in for example in T. Yamamoto et al., *Prog. Polym. Sci.,* 1993, 17, 1153-1205, or WO 2004/022626 A1. Stille coupling is described for example in Z. Bao et al., J. Am. Chem. Soc., 1995, 117, 12426-12435 and C-H activation is described for example in M. Leclerc et al, *Angew. Chem. Int. Ed.,* 2012, 51, 2068-2071. For example, when using Yamamoto coupling, educts having two reactive halide groups are preferably used. When using Suzuki coupling, educts having two reactive boronic acid or boronic acid ester groups or two reactive halide groups are preferably used. When using Stille coupling, edcuts having two reactive stannane groups or two reactive halide groups are preferably used. When using Negishi coupling, educts having two reactive organozinc groups or two reactive halide groups are preferably used.

Preferred catalysts, especially for Suzuki, Negishi or Stille coupling, are selected from Pd(O) complexes or Pd(II) salts. Preferred Pd(O) complexes are those bearing at least one phosphine ligand such as $Pd(Ph_3P)_4$. Another preferred phosphine ligand is tris(ortho-tolyl)phosphine, i.e. Pd(o-$Tol_3P)_4$. Preferred Pd(II) salts include palladium acetate, i.e. $Pd(OAc)_2$. Alternatively the Pd(O) complex can be prepared by mixing a Pd(O) dibenzylideneacetone complex, for example tris(dibenzyl-ideneacetone)dipalladium(0), bis(dibenzylideneacetone)palladium(0), or Pd(II) salts e.g. palladium acetate, with a phosphine ligand, for example triphenylphosphine, tris(ortho-tolyl)phosphine or tri(tert-butyl) phosphine. Suzuki coupling is performed in the presence of a base, for example sodium carbonate, potassium carbonate, cesium carbonate, lithium hydroxide, potassium phosphate or an organic base such as tetraethylammonium carbonate or tetraethylammonium hydroxide. Yamamoto coupling employs a Ni(0) complex, for example bis(1,5-cyclooctadienyl) nickel(0).

As alternatives to halogens as described above, leaving groups of formula —O—$SO_2Z^0$ can be used wherein $Z^0$ is an alkyl or aryl group, preferably $C_{1-10}$ alkyl or $C_{6-12}$ aryl. Particular examples of such leaving groups are tosylate, mesylate and triflate.

The OPD according to the present invention can be of any type known from the literature, such as organic photodiode [Nature Photonics, 4, 438-446 (2010)], organic photovoltaic cell [Nature Materials, 12, 5-6 (2013)], or organic photoresistor sensor [Semicond. Sci. Technol. 25, (2010), 075014].

Preferably the OPD is of the organic photodiode type.

Figure 3:
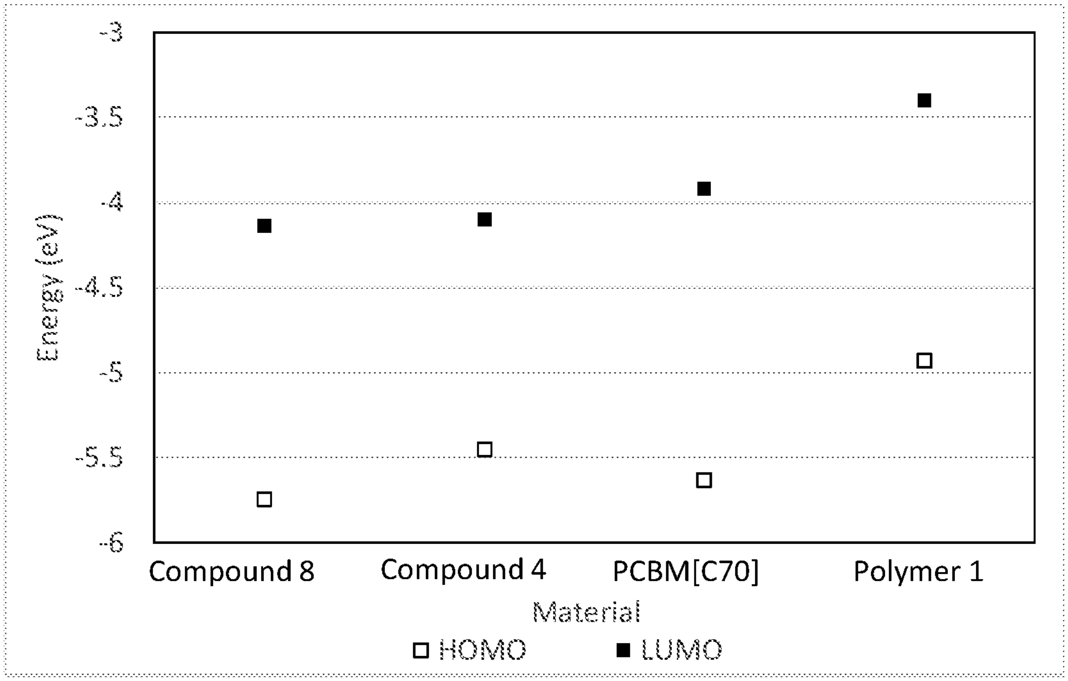
FIG. 3 shows the HOMO (open square) and LUMO (filled square) values of donor Polymer 1, and the acceptors PCBM[C70], Compound 8 and Compound 4 as used in Use Example A.

FIG. 3 shows a cross-sectional view of an exemplary OPD of the photodiode type according to the present invention 300 that includes an optional substrate 310, an electrode 320, optionally a hole transport (or electron blocking) layer 330, a photoactive layer 340 containing an electron donor material and an electron acceptor material, optionally an electron transport (or hole blocking) layer 350, an electrode 360, and an optional substrate 370. Alternatively, optional layer 330 can be an electron transport (or hole blocking) layer and optional layer 350 can be a hole transport (or electron blocking) layer. The overall stack may be encapsulated within a flexible or rigid casing.

In general, during use, light can impinge on the surface of substrate 310, and passes through substrate 310, electrode 320 and hole (or electron) transport layer 330. The light then interacts with the photoactive layer 340, causing electrons to be transferred from the electron donor material (e.g. a conjugated polymer) to the electron acceptor material (e.g. a substituted fullerene). The electron acceptor material then transmits the electrons through electron transport layer 350 (or 330) to electrode 360 (or 320), and the electron donor material transfers holes through hole carrier layer 330 (or 350) to electrode 320 (or 360). Electrodes 320 and 360 are in electrical connection via an external load so that electrons pass from electrode 320 through the load to electrode 360.

In a preferred embodiment OPD 300 comprises a first transparent or semi-transparent electrode 320 on a transparent or semi-transparent substrate 310 on one side of the photoactive layer, and a second metallic or semi-transparent electrode 360 on the other side of the photoactive layer, wherein one of the electrodes serves as anode and the other electrode serves as cathode.

In a preferred embodiment OPD cell 300 includes a cathode as a bottom electrode (i.e. electrode 320) and an anode as a top electrode (i.e. electrode 360). In another preferred embodiment OPD cell 300 includes an anode as a bottom electrode and a cathode as a top electrode.

Preferably substrate 310 and/or 370 is formed of a transparent material. As referred to herein, a transparent material is a material which, at the thickness generally used in photodiode 300, transmits at least about 60% (preferably at least 70%, more preferably at least 75%, very preferably at least 80%, most preferably at least 85%) of incident light at a wavelength or a range of wavelengths used during operation of the photodiode.

Exemplary materials from which substrate 310 can be formed include silicon, glass, paper and plastics like polyethylene terephthalates (PET), polyimides, polyethylene naphthalates (PEN), polymeric hydrocarbons, cellulosic polymers, polycarbonates, polyamides, polyethers, and polyether ketones. In certain embodiments, the polymer can be a fluorinated polymer. In some embodiments, combinations of polymeric materials are used. In certain embodiments, different regions of substrate 310 can be formed of different materials.

Preferred materials from which substrate 310 can be formed are silicon, glass, paper and plastics such as polyimide, PET or PEN.

If present, substrate 310 or 370 may also be a non-transparent material. Exemplary non-transparent materials are metal foils, such as for example steel foil or aluminium foil.

Substrate 370 can be identical to or different from substrate 310.

In a preferred embodiment, only one of substrates 310 and 370 is transparent. In another preferred embodiment, both of substrates 310 and 370 are transparent.

In general, substrate 310 or 370 can be flexible, semi-rigid or rigid (e.g., glass). In some embodiments, substrate 310 or 370 has a flexural modulus of less than about 5,000 mPa (e.g., less than about 1,000 mPa or less than about 500 mPa). In certain embodiments, different regions of substrate 310 can be flexible, semi-rigid, or inflexible (e.g., one or more regions flexible and one or more different regions semi-rigid, one or more regions flexible and one or more different regions inflexible).

Preferably, substrate 310 and/or 370 has a thickness at least about one micron (e.g., at least about five microns or at least about 10 microns) and/or at most about 5,000 microns (e.g., at most about 2,000 microns, at most about 1,000 microns, at most about 500 microns, at most about 300 microns, at most about 200 microns, at most about 100 microns, or at most about 50 microns).

Generally, substrate 310 or 370 can be colored or non-colored. In some embodiments, one or more portions of substrate 310 or 370 is/are colored while one or more different portions of substrate 310 or 370 is/are non-colored.

Substrate 310 or 370 can have one planar surface (e.g., the surface on which light impinges), two planar surfaces (e.g., the surface on which light impinges and the opposite surface), or no planar surface. A non-planar surface of substrate 310 or 370 can, for example, be curved or stepped. In some embodiments, a non-planar surface of substrate 310 or 370 is patterned (e.g., having patterned steps to form a Fresnel lens, a lenticular lens or a lenticular prism).

Electrodes 320 and 360 are generally formed of an electrically conductive material. Suitable and preferred electrically conductive materials include electrically conductive metals, electrically conductive alloys, electrically conductive polymers, electrically conductive metal oxides, and any combination of one or more of the aforementioned materials.

Exemplary electrically conductive metals include gold, silver, copper, aluminum, nickel, palladium, platinum, and titanium or nanoparticle or nanowire or nanorods of metals which can be used neat or as a blend with an electrically conducting polymer or neutral binder. Exemplary electrically conductive alloys include stainless steel (e.g., 332 stainless steel, 316 stainless steel), alloys of gold, alloys of silver, alloys of copper, alloys of aluminum, alloys of nickel, alloys of palladium, alloys of platinum, and alloys of titanium. Exemplary electrically conducting polymers include polythiophenes, e.g., doped poly(3,4-ethylenedioxythiophene) (also known as PEDOT), polyanilines, e.g., doped polyanilines, polypyrroles, e.g., doped polypyrroles. Exemplary electrically conducting metal oxides include indium tin oxide, fluorinated tin oxide, tin oxide and zinc oxide or nanoparticle or nanowire or nanorods of metal oxides such as zinc oxide which can be used neat or as a blend with an electrically conducting polymer or neutral binder. In some embodiments, combinations of electrically conductive materials are used.

Preferred electrode materials for forming electrode 320 or 360 are metals such as silver, aluminum, gold, molybdenum and transparent electrodes such as indium tin oxide, and printable conductive materials such as poly(3,4-ethylenedioxythiophene)-poly(styrenesulfonate) PEDOT-PSS, or any combination of one or more of the above materials.

Electrode 360 is preferably formed of an electrically conductive material selected from the materials described above for electrode 320.

In a preferred embodiment, electrode 320 and/or 360 includes a mesh electrode. Examples of mesh electrodes are described in US2004/0187911 A1 and US2006/0090791 A1.

Further preferably the OPD device comprises, between the photoactive layer 340 and the first 320 electrode or the second electrode 360, one or more additional buffer layers 330 or 350 acting as hole transporting layer (HTL) and/or electron blocking layer (EBL), and/or one or more additional buffer layers acting as hole blocking layer (HBL) and/or electron transporting layer (ETL).

Suitable and preferred materials for use in the HTL or EBL include, without limitation, metal oxides, like for example, ZTO, $MoO_x$, WOx, $NiO_x$, or their nano particles, conjugated polymer electrolytes, like for example PEDOT:PSS, polymer acids such as polyacryl acid, conjugated polymers, like for example polytriarylamine (PTAA), insulating polymers, like for example nafion, polyethyleneimine or polystyrenesulphonate, and organic compounds, like for example N,N'-diphenyl-N,N'-bis(1-naphthyl)(1,1'-biphenyl)-4,4'diamine (NPB), N,N'-diphenyl-N,N'-(3-methylphenyl)-1,1'-biphenyl-4,4'-diamine (TPD), or a combination of one or more of the above materials.

Suitable and preferred materials for use in the HBL or ETL include, without limitation, metal oxides, like for example, $ZnO_x$, aluminium-doped ZnO (AZO), $TiO_x$, or their nano particles, salts, like for example LiF, NaF, CsF, $CsCO_3$, amines (e.g., primary, secondary, or tertiary amines), conjugated polymer electrolytes, such as polyethylenimine, conjugated polymers, like for example poly[3-(6-trimethylammoniumhexyl)thiophene], poly(9,9-bis(2-ethylhexyl)-fluorene]-b-poly[3-(6-trimethylammoniumhexyl)thiophene], or poly [(9,9-bis(3'-(N,N-dimethylamino)propyl)-2,7-fluorene)-alt-2,7-(9,9-dioctylfluorene)], and organic compounds, like for example tris(8-quinolinolato)-aluminium(III) ($Alq_3$), 4,7-diphenyl-1,10-phenanthroline, or a combination of one or more of the above materials.

Examples of amines suitable for use in a HBL have been described, for example, in U.S. Pat. No. 8,242,356. Without wishing to be bound by theory, it is believed that, when OPD cell 300 includes a HBL made of amines, the hole blocking layer can facilitate the formation of ohmic contact between photoactive layer 340 and electrode 360 without being exposed to UV light, thereby reducing damage to photovoltaic cell 300 resulting from UV exposure.

In a preferred embodiment, the buffer layer 330 and/or 350 has a thickness of at least about 1 nm (e.g., at least about 2 nm, at least about 5 nm, or at least about 10 nm).

Photoactive layer 340 generally comprises an electron acceptor material and an electron donor material.

Preferably the electron donor material and the electron acceptor material in the photoactive layer 340 form a self-assembled interconnected network, in particular a bulk heterojunction (BHJ).

Alternatively, photoactive layer 340 may comprise the electron acceptor material and the electron donor material in respective separate layers, i.e. the photoactive layer 340 comprises two adjacent layers, one of which essentially consists of an electron donor material and the other essentially consists of an electron acceptor material.

In addition to the donor and acceptor the photoactive layer 340 may also comprise further components, such as for example one or more additives selected from the group consisting of radical scavengers, anti-oxidants, getters/dessicants, and UV absorbers.

An OPD according to the present invention preferably comprises the following sequence of layers:

optionally a substrate 310, an anode 320, an electron transport layer 330, a photoactive layer 340 containing an n-type and a p-type OSC compound as described above and below, which are preferably forming a BHJ, a hole transport layer 350, and a cathode 360.

A first preferred OPD (standard structure) according to the invention comprises the following layers (in the sequence from bottom to top):

optionally a substrate 310, a high work function electrode 320, preferably comprising a metal oxide, like for example ITO, serving as anode, an optional conducting polymer layer or hole transport layer 330, preferably comprising an organic polymer or polymer blend, for example of PEDOT:PSS (poly(3,4-ethylenedioxythiophene):poly(styrene-sulfonate), or TBD (N,N'-dyphenyl-N—N'-bis(3-methylphenyl)-1,1'biphenyl-4,4'-diamine) or NBD (N,N'-dyphenyl-N—N'-bis(1-napthylphenyl)-1,1'biphenyl-4,4'-diamine), a photoactive layer 340 comprising a blend of a p-type and an n-type OSC compound, which can exist for example as a p-type/n-type bilayer or as distinct p-type and n-type layers, or as blend or p-type and n-type semiconductor, forming a BHJ, optionally an electron transport layer 350, for example comprising LiF or PFN, ZnO a low work function electrode 360, preferably comprising a metal like for example aluminium, or silver serving as cathode, wherein at least one of the electrodes, preferably the anode 320, is transparent to visible light, and wherein in the photoactive layer 340 the n-type OSC compound is a small molecule that does not contain a fullerene moiety as described above and below, and the p-type OSC compound is a conjugated copolymer comprising donor and acceptor units as described above and below.

A second preferred OPD (inverted structure) device according to the invention comprises the following layers (in the sequence from bottom to top):

optionally a substrate 310, a high work function electrode 320, preferably comprising a metal or metal oxide, like for example ITO, serving as cathode, a hole blocking layer 330, preferably comprising a metal oxide like $TiO_x$ or $ZnO_x$, or a poly(ethyleneimine), a photoactive layer 340 comprising a blend of a p-type and an n-type OSC compound, situated between the electrodes, which can exist for example as a p-type/n-type bilayer or as distinct p-type and n-type layers, or as blend or p-type and n-type semiconductor, forming a BHJ, an optional conducting polymer layer or hole transport layer 350, preferably comprising an organic polymer or polymer blend, for example of PEDOT:PSS, nafion or a substituted triaryl amine derivative like for example TBD or NBD, MoOx, WO3, NiOx an high work function electrode 360, preferably comprising a metal like for example silver, serving as anode, wherein at least one of the electrodes, preferably the cathode 320, is transparent to visible light, and wherein in the photoactive layer 340 the n-type OSC compound is a small molecule that does not contain a fullerene moiety as described above and below, and the p-type OSC compound is a conjugated copolymer comprising donor and acceptor units as described above and below.

The OPD according to the present invention can also comprise a device layer (e.g. layer 320, 330, 340, or 360) which is a patterned layer. For applications in modern microelectronics it is generally desirable to generate small structures or patterns to reduce cost (more devices/unit area), and power consumption. Patterning of thin layers comprising a compound according to the present invention can be carried out for example by photolithography, electron beam lithography or laser patterning.

The photoactive layer 340 of the OPD is preferably formed from a blend containing the n-type OSC and the p-type OSC compound as described above and below, or from a formulation containing the n-type OSC and the p-type OSC compound as described above and below and further containing a solvent, preferably an organic solvent. The formulation is preferably a solution of the n-type OSC and the p-type OSC compound in the solvent.

The blend or formulation can be prepared from the single OSC compounds by conventional methods that are described in prior art and known to the skilled person. Typically the OSC compounds are mixed with each other or dissolved in suitable solvents and the solutions combined.

In a blend, formulation or solution according to the present invention comprising a p-type OSC and an n-type OSC compound, the ratio p-type OSC compound:n-type OSC compound is preferably from 5:1 to 1:5 by weight, more preferably from 1:1 to 1:3 by weight, most preferably 1:1 to 1:2 by weight.

In a blend, formulation or solution according to the present invention comprising an p-type OSC and/or an n-type OSC compound, the total concentration of the solid compounds, including n-type and p-type OSC compounds, in the formulation or solution is preferably 0.1 to 10% by weight, more preferably 0.5 to 5% by weight.

In a preferred embodiment of the present invention, a blend, formulation or solution comprising a p-type OSC and/or an n-type OSC compound further contains a polymeric binder, preferably from 5 to 95% by weight. Examples of suitable and preferred binders include polystyrene (PS), polydimethylsilane (PDMS), polypropylene (PP) and polymethylmethacrylate (PMMA).

A binder to be used in the blend, formulation or solution as described above, which is preferably a polymer, may comprise either an insulating binder or a semiconducting binder, or mixtures thereof, and is referred to hereinafter as "organic binder", "polymeric binder" or simply "binder".

Preferably, the polymeric binder comprises a weight average molecular weight in the range of 1000 to 5,000,000 g/mol, especially 1500 to 1,000,000 g/mol and more preferable 2000 to 500,000 g/mol. Surprising advantageous effects can be achieved with polymeric binders having a weight average molecular weight of at least 10,000 g/mol, more preferably at least 100,000 g/mol.

Preferably, the polymeric binder has a polydispersity index $M_w/M_n$ in the range of 1.0 to 10.0, more preferably in the range of 1.1 to 5.0 and most preferably in the range of 1.2 to 3.

Preferably, the inert binder is a polymer having a glass transition temperature in the range of −70 to 160° C., preferably 0 to 150° C., more preferably 50 to 140° C. and most preferably 70 to 130° C. The glass transition temperature can be determined by measuring the DSC of the polymer (DIN EN ISO 11357, heating rate 10° C. per minute).

The weight ratio of the polymeric binder to the OSC compound(s), is preferably in the range of 30:1 to 1:30, particularly in the range of 5:1 to 1:20 and more preferably in the range of 1:2 to 1:10.

According to a preferred embodiment the binder preferably comprises repeating units derived from styrene monomers and/or olefin monomers. Preferred polymeric binders can comprise at least 80%, preferably 90% and more preferably 99% by weight of repeating units derived from styrene monomers and/or olefins.

Styrene monomers are well known in the art. These monomers include styrene, substituted styrenes with an alkyl substituent in the side chain, such as α-methylstyrene and α-ethylstyrene, substituted styrenes with an alkyl substituent on the ring such as vinyltoluene and p-methylstyrene, halogenated styrenes such as monochlorostyrenes, dichlorostyrenes, tribromostyrenes and tetrabromostyrenes.

Olefin monomers consist of hydrogen and carbon atoms. These monomers include ethylene, propylene, butylenes, isoprene and 1,3-butadiene.

According to a preferred embodiment of the present invention, the polymeric binder is polystyrene having a weight average molecular weight in the range of 50,000 to 2,000,000 g/mol, preferably 100,000 to 750,000 g/mol, more preferably in the range of 150,000 to 600,000 g/mol and most preferably in the range of 200,000 to 500,000 g/mol.

Further examples of suitable binders are disclosed for example in US 2007/0102696 A1. Especially suitable and preferred binders are described in the following.

The binder should preferably be capable of forming a film, more preferably a flexible film.

Suitable polymers as binders include poly(1,3-butadiene), polyphenylene, polystyrene, poly(c-methylstyrene), poly(c-vinylnaphtalene), poly(vinyltoluene), polyethylene, cis-polybutadiene, polypropylene, polyisoprene, poly(4-methyl-1-pentene), poly (4-methylstyrene), poly (chorotrifluoroethylene), poly(2-methyl-1,3-butadiene), poly(p-xylylene), poly(α-α-α'-α' tetrafluoro-p-xylylene), poly[1,1-(2-methyl propane)bis(4-phenyl)carbonate], poly (cyclohexyl methacrylate), poly(chlorostyrene), poly(2,6-dimethyl-1,4-phenylene ether), polyisobutylene, poly(vinyl cyclohexane), poly(vinylcinnamate), poly(4-vinylbiphenyl), 1,4-polyisoprene, polynorbonene, poly(styrene-block-butadiene); 31% wt styrene, poly(styrene-block-butadiene-block-styrene); 30% wt styrene, poly(styrene-co-maleic anhydride) (and ethylene/butylene) 1-1.7% maleic anhydride, poly(styrene-block-ethylene/butylene-block-styrene) triblock polymer 13% styrene, poly(styrene-block-ethylene-propylene-block-styrene) triblock polymer 37% wt styrene, poly(styrene-block-ethylene/butylene-block-styrene) triblock polymer 29% wt styrene, poly(1-vinylnaphthalene), poly(1-vinylpyrrolidone-co-styrene) 64% styrene, poly(1-vinylpyrrolidone-co-vinyl acetate) 1.3:1, poly(2-chlorostyrene), poly(2-vinylnaphthalene), poly(2-vinylpyridine-co-styrene) 1:1, poly(4,5-Difluoro-2,2-bis(CF3)-1,3-dioxole-co-tetrafluoroethylene) Teflon, poly(4-chlorostyrene), poly (4-methyl-1-pentene), poly(4-methylstyrene), poly(4-vinylpyridine-co-styrene) 1:1, poly(alpha-methylstyrene), poly(butadiene-graft-poly(methyl acrylate-co-acrylonitrile)) 1:1:1, poly(butyl methacrylate-co-isobutyl methacrylate) 1:1, poly(butyl methacrylate-co-methyl methacrylate) 1:1, poly(cyclohexylmethacrylate), poly(ethylene-co-1-butene-co-1-hexene) 1:1:1, poly(ethylene-co-ethylacrylate-co-maleic anhydride); 2% anhydride, 32% ethyl acrylate, poly (ethylene-co-glycidyl methacrylate) 8% glycidyl methacrylate, poly(ethylene-co-methyl acrylate-co-glycidyl meth-acrylate) 8% glycidyl methacrylate 25% methyl acrylate, poly(ethylene-co-octene) 1:1, poly(ethylene-co-propylene-co-5-methylene-2-norbornene) 50% ethylene, poly(ethylene-co-tetrafluoroethylene) 1:1, poly(isobutyl methacrylate), poly(isobutylene), poly(methyl methacrylate)-co-(fluorescein O-methacrylate) 80% methyl methacrylate, poly(methyl methacrylate-co-butyl methacrylate) 85% methyl methacrylate, poly(methyl methacrylate-co-ethyl acrylate) 5% ethyl acrylate, poly(propylene-co-butene) 12% 1-butene, poly(styrene-co-allyl alcohol) 40% allyl alcohol, poly(styrene-co-maleic anhydride) 7% maleic anhydride, poly(styrene-co-maleic anhydride) cumene terminated (1.3:1), poly(styrene-co-methyl methacrylate) 40% styrene, poly(vinyltoluene-co-alpha-methylstyrene) 1:1, poly-2-vinylpyridine, poly-4-vinylpyridine, poly-alpha-pinene, polymethylmethacrylate, polybenzylmethacrylate, polyethylmethacrylate, polyethylene, polyethylene terephthalate, polyethylene-co-ethylacrylate 18% ethyl acrylate, polyethylene-co-vinylacetate 12% vinyl acetate, polyethylene-graft-maleic anhydride 0.5% maleic anhydride, polypropylene, polypropylene-graft-maleic anhydride 8-10% maleic anhydride, polystyrene poly(styrene-block-ethylene/butylene-block-styrene) graft maleic anhydride 2% maleic anhydride 1:1:1 others, poly(styrene-block-butadiene) branched 1:1, poly(styrene-block-butadiene-block-styrene), 30% styrene, poly(styrene-block-isoprene) 10% wt styrene, poly(styrene-block-isoprene-block-styrene) 17% wt styrene, poly(styrene-co-4-chloromethylstyrene-co-4-methoxymethylstyrene 2:1:1, polystyrene-co-acrylonitrile 25% acrylonitrile, polystyrene-co-alpha-methylstyrene 1:1, polystyrene-co-butadiene 4% butadiene, polystyrene-co-butadiene 45% styrene, polystyrene-co-chloromethylstyrene 1:1, polyvinylchloride, polyvinylcinnamate, polyvinylcyclohexane, polyvinylidenefluoride, polyvinylidenefluoride-co-hexafluoropropylene assume 1:1, poly(styrene-block-ethylene/propylene-block-styrene) 30% styrene, poly(styrene-block-ethylene/propylene-block-styrene) 18% styrene, poly (styrene-block-ethylene/propylene-block-styrene) 13% styrene, poly(styrene-block ethylene block-ethylene/propylene-block styrene) 32% styrene, poly(styrene-block ethylene block-ethylene/propylene-block styrene) 30% styrene, poly(styrene-block-ethylene/butylene-block-styrene) 31% styrene, poly(styrene-block-ethylene/butylene-block-styrene) 34% styrene, poly(styrene-block-ethylene/butyleneblock-styrene) 30% styrene, poly(styrene-block-ethylene/butylene-block-styrene) 60%, styrene, branched or non-branched polystyrene-block-polybutadiene, polystyrene-block(polyethylene-ran-butylene)-block-polystyrene, polystyrene-block-polybutadiene-block-polystyrene, poly-styrene-(ethylene-propylene)-diblock-copolymers (e.g. KRATON®-G1701E, Shell), poly(propylene-co-ethylene) and poly(styrene-co-methylmethacrylate).

Preferred insulating binders to be used in the formulations as described above and below are polystryrene, poly(α-methylstyrene), polyvinylcinnamate, poly(4-vinylbiphenyl), poly(4-methylstyrene), and polymethyl methacrylate. Most preferred insulating binders are polystyrene and polymethyl methacrylate.

The binder can also be selected from crosslinkable binders, like e.g. acrylates, epoxies, vinylethers, thiolenes etc. The binder can also be mesogenic or liquid crystalline.

The organic binder may itself be a semiconductor, in which case it will be referred to herein as a semiconducting binder. The semiconducting binder is still preferably a binder of low permittivity as herein defined.

Semiconducting binders for use in the present invention preferably have a number average molecular weight ($M_n$) of at least 1500-2000, more preferably at least 3000, even more preferably at least 4000 and most preferably at least 5000. The semiconducting binder preferably has a charge carrier mobility of at least $10^{-5}$ $cm^2V^{-1}$ $s^{-1}$, more preferably at least $10^{-4}$ $cm^2V^{-1}$ $s^{-1}$.

A preferred semiconducting binder comprises a homopolymer or copolymer (including block-copolymer) containing arylamine (preferably triarylamine).

The fabrication of an OPD 300 can proceed for example as follows: The substrate may be a flexible substrate (such as PEN, PET) or a rigid substrate such as glass. A transparent electrode 320 is applied to this substrate. Typically this may be achieved by sputtering a layer of indium tin-oxide (ITO) or fluorine-doped tin-oxide (FTO) providing an acceptable conductivity. Optionally, a hole-transporting layer (HTL), such as for example PEDOT:PSS, is applied on the conducting substrate, for example by spin-coating, slot-die coating, screen-printing, doctor-blade coating, evaporating or printing. A photoactive layer is then applied by depositing a formulation comprising the donor and acceptor in a solvent, preferably in a non-halogenated solvent using a preferred coating method, optionally followed by an annealing step, thereby forming a randomly organized bulk heterojunction (BHJ) layer. Preferably the optional annealing step is performed at a temperature higher than ambient temperature. Optionally an electron transporting layer (ETL), such as Ca or LiF or ZnO or ZnO nanoparticles is deposited on the photoactive layer, for example via evaporation or solution-based processing. Finally, the device is completed by depositing a metal electrode on top, for example by evaporation through a shadow-mask or by printing.

In some embodiments, OPD 300 can be prepared in a continuous manufacturing process, such as a roll-to-roll process, thereby significantly reducing the manufacturing cost. Examples of roll-to-roll processes have been described in, for example, commonly-owned U.S. Pat. Nos. 7,476,278 and 8,129,616.

In another preferred embodiment, the OPD is formed from two photodiodes which share a common electrode, similar to a tandem photovoltaic cell, as described for example in US2009/0211633 A1, US2007/0181179 A1, US2007/0246094 A1 and US 2007/0272296 A1.

In some embodiments, when a device layer (e.g., layer 320, 330, 340, 350 or 360) includes inorganic semiconductor material, the liquid-based coating process can be carried out by (i') mixing the inorganic semiconductor material with a solvent (e.g., an aqueous solvent or an anhydrous alcohol) to form a dispersion, (ii') coating the dispersion onto a substrate, and (iii') drying the coated dispersion.

In general, the liquid-based coating process used to prepare a layer (e.g., layer 320, 330, 340, 350 or 360) containing an OSC can be the same as or different from that used to prepare a layer containing an inorganic semiconductor. In some embodiments, to prepare a layer including an OSC, the liquid-based coating process can be carried out by mixing the OSC with a solvent (e.g., an organic solvent) to form a solution or a dispersion, coating the solution or dispersion on a substrate, and drying the coated solution or dispersion.

Preferably an OPD device layer in the OPD according to the present invention, in particular the photoactive layer, HTL, EBL, HBL and/or ETL (e.g., layer 330, 340 or 350) is prepared from a formulation, preferably a solution, comprising an n-type and/or p-type OSC compound by a process which comprises:

(i) first mixing an n-type and/or a p-type OSC, optionally a binder or a precursor of a binder as described above, optionally one or more further additives as described above and below and a solvent or solvent mixture as described above and below, (ii) applying such mixture to a substrate, (iii) optionally evaporating the solvent(s) to form a device layer.

In step (i) the solvent may be a single solvent for the n-type and/or p-type OSCs and the organic binder and/or further additives may each be dissolved in a separate solvent followed by mixing the resultant solutions to mix the compounds.

Alternatively, the binder may be formed in situ by mixing or dissolving an n-type and/or p-type OSC in a precursor of a binder, for example a liquid monomer, oligomer or crosslinkable polymer, optionally in the presence of a solvent, and depositing the mixture or solution, for example by dipping, spraying, painting or printing it, on a substrate to form a liquid layer and then curing the liquid monomer, oligomer or crosslinkable polymer, for example by exposure to radiation, heat or electron beams, to produce a solid layer. If a preformed binder is used it may be dissolved together with the OSC compounds in a suitable solvent as described before, and the solution deposited for example by dipping, spraying, painting or printing it on a substrate to form a liquid layer and then removing the solvent to leave a solid layer. It will be appreciated that solvents are chosen which are able to dissolve all ingredients of the formulation, and which upon evaporation from the solution blend give a coherent defect free layer.

In another preferred embodiment, a blend, solution or formulation according to the present invention containing an n-type and/or p-type OSC additionally comprises one or more components or additives selected from surface-active compounds, lubricating agents, wetting agents, dispersing agents, hydrophobing agents, adhesion promoters, flow improvers, defoaming agents, deaerating agents, viscosity modifying agents, conductivity increasing agents, diluents which may be reactive or non-reactive, fillers, processing assistants, auxiliaries, colourants, dyes, pigments, sensitizers, stabilizers, nanoparticles or inhibitors.

Additives can be used to enhance the properties of the electron selective layer and/or the properties of any of the neighbouring layers and/or the performance of the optoelectronic device according to the invention. Additives can also be used to facilitate the deposition, the processing or the formation of the electron selective layer and/or the deposition, the processing or the formation of any of the neighbouring layers. Preferably, one or more additives are used which enhance the electrical conductivity of the electron selective layer and/or passivate the surface of any of the neighbouring layers.

Suitable methods to incorporate one or more additives include, for example exposure to a vapor of the additive at atmospheric pressure or at reduced pressure, mixing a solution or solid containing one or more additives and a material or a formulation as described or preferably described before, bringing one or more additives into contact with a material or a formulation as described before, by thermal diffusion of one or more additives into a material or a formulation as described before, or by ion-implantation of one or more additives into a material or a formulation as described before.

Additives used for this purpose can be organic, inorganic, metallic or hybrid materials. Additives can be molecular compounds, for example organic molecules, salts, ionic liquids, coordination complexes or organometallic compounds, polymers or mixtures thereof. Additives can also be particles, for example hybrid or inorganic particles, preferably nanoparticles, or carbon based materials such as fullerenes, carbon nanotubes or graphene flakes.

Examples for additives that can enhance the electrical conductivity are for example halogens (e.g. $I_2$, $Cl_2$, $Br_2$, ICl, $ICl_3$, IBr and IF), Lewis acids (e.g. $PF_5$, $AsF_5$, $SbF_5$, $BF_3$, $BCl_3$, $SbCl_5$, $BBr_3$ and $SO_3$), protonic acids, organic acids, or amino acids (e.g. HF, HCl, $HNO_3$, $H_2SO_4$, $HClO_4$, $FSO_3H$ and $ClSO_3H$), transition metal compounds (e.g. $FeCl_3$, FeOCl, $Fe(ClO_4)_3$, $Fe(4\text{-}CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid)), anions (e.g. $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3$), cations (e.g. $H^+$, $Li^+$, $Na^+$, $K^+$, $Rb^+$, $Cs^+$, $Co^{3+}$ and $Fe^{3+}$), $O_2$, redox active salts (e.g. $XeOF_4$, $(NO_2^+)(SbF_6^-)$, $(NO_2^+)(SbCl_6^-)$, $(NO_2^+)(BF_4^-)$, $NOBF_4$, $NOPF_6$, $AgClO_4$, $H_2IrCl_6$ and $La(NO_3)_3.6H_2O$), strongly electron-accepting organic molecules (e.g. 2,3,5,6-tetrafluoro-7,7,8,8-tetracyanoquinodimethane (F4-TCNQ)), transition metal oxides (e.g. $WO_3$, $Re_2O_7$ and $MoO_3$), metal-organic complexes of cobalt, iron, bismuth and molybdenum, $(p\text{-}BrC_6H_4)_3NSbCl_6$, bismuth (III) tris(trifluoroacetate), $FSO_2OOSO_2F$, acetylcholine, $R_4N^+$, (R is an alkyl group), $R_4P^+$ (R is a straight-chain or branched alkyl group 1 to 20), $R_6As^+$ (R is an alkyl group), $R_3S^+$ (R is an alkyl group) and ionic liquids (e.g. 1-Ethyl-3-methylimidazolium bis(trifluoromethylsulfonyl)imide). Suitable cobalt complexes beside of tris(2-(1H-pyrazol-1-yl)-4-tert-butylpyridine)-cobalt(III) tris(bis(trifluoromethylsulfonyl)imide)) are cobalt complex salts as described in WO 2012/114315, WO 2012/114316, WO 2014/082706, WO 2014/082704, EP 2883881 or JP 2013-131477.

Suitable lithium salts are beside of lithium bis(trifluoromethylsulfonyl)imide, lithium tris(pentafluoroethyl)trifluorophosphate, lithium dicyanamide, lithium methylsulfate, lithium trifluormethanesulfonate, lithium tetracyanoborate, lithium dicyanamide, lithium tricyanomethide, lithium thiocyanate, lithium chloride, lithium bromide, lithium iodide, lithium hexafluoroposphate, lithium tetrafluoroborate, lithium perchlorate, lithium hexafluoroantimonate, lithium hexafluoroarsenate or a combination of two or more. A preferred lithium salt is lithium bis(trifluoromethylsulfonyl) imide.

After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., *Journal of Paint Technology*, 1966, 38 (496), 296". Solvent blends may also be used and can be identified as described in "Solvents, W. H. Ellis, Federation of Societies for Coatings Technology, p 9-10, 1986". Such a procedure may lead to a blend of 'non' solvents that will dissolve both the polymers of the present invention, although it is desirable to have at least one true solvent in a blend.

For preparation of suitable formulations or solutions containing the n-type and p-type OSC compound, a suitable solvent must be selected to ensure full dissolution of both n-type and p-type OSC compound, and take into account the boundary conditions (for example rheological properties) introduced by the chosen deposition method.

The formulation or solution for forming an OPD device layer, including but not limited to the photoactive layer, preferably contains an organic solvent. Suitable and preferred organic solvents are aromatic solvents, halogenated solvents or both halogenated and aromatic solvents, including chlorinated aromatic solvents. Further preferred solvents are aliphatic hydrocarbons, chlorinated hydrocarbons, aromatic hydrocarbons, ketones, ethers and mixtures thereof.

Examples of suitable and preferred solvents include, but are not limited to chlorobenzene, o-dichlorobenzene, 1,2-dichlorobenzene, 2-chlorofluorobenzene, 3-chlorofluorobenzene, 4-chlorofluorobenzene, 1-chloro-2,4-difluorobenzene, 1-chloro-2,5-difluorobenzene, chloroform, p-xylene, m-xylene, o-xylene or a mixture of o-, m-, and p-xylene, 2-fluoro-m-xylene, 3-fluoro-o-xylene, 1,2,4-trimethylbenzene, 1,2,3,4-tetra-methyl benzene, pentylbenzene, toluene, 2-fluorotoluene, 3-fluorotoluene, 4-fluorotoluene, 2,5-difluorotoluene, 2-chloro-5-fluorotoluene, anisole, 2-methylanisole, 3-methylanisole, 4-methylanisole, 2-fluoroanisole, 3-fluoroanisole, 4-fluoroanisole, 3-trifluoro-methylanisole, 2,4-dimethylanisole, 2,5-dimethylanisole, 2,6-dimethylanisole, 3,5-dimethyl-anisole, 4-fluoro-3-methylanisole, trifluoromethoxy-benzene, 1-fluoro-3,5-dimethoxy-benzene, 4-fluoroveratrol, phenetol, mesitylene, cumene, cymene, cyclohexylbenzene, diethylbenzene, tetralin, 1,5-dimethyltetraline, decaline, indane, 1-methylnaphthalene, 2,6-lutidine, 2-chlorobenzotrifluoride, methyl benzoate, ethyl benzoate. benzonitrile, 2-fluorobenzonitrile, 3-fluorobenzonitrile, N,N-dimethylaniline, N,N-dimethylformamide, ethyl benzoate, N-methylpyrrolidinone, 1,4-dioxane, benzotrifluoride, 3-fluorobenzo-trifluoride, 4-fluorobenzotrifluoride, 3-fluoropyridine, 2-fluorobenzotrifluoride, 4-isopropylbiphenyl, phenyl ether, pyridine, 2-fluoropyridine, 2,3-dimethylpyrazine, 2-methylthiophene, 3-methylthiophene, tetrahydrofuran, cyclohexanone, acetophenone, propiophenone, dichloromethane, carbon tetrachloride, 1,2-dichloroethane, 1,1,1-trichloroethane, 1,1,2,2-tetrachloroethane, ethylacetate, morpholine, acetone, methylethylketone, ethyl acetate, n-butyl acetate, dimethylacetamide, dimethylsulfoxide, and mixtures thereof.

Organic solvents with relatively low polarity are generally preferred. For inkjet printing solvents and solvent mixtures with high boiling temperatures are preferred. For spin coating alkylated benzenes like xylene and toluene are preferred.

Examples of especially preferred solvents include, without limitation, dichloromethane, trichloromethane, chlorobenzene, o-dichlorobenzene, tetrahydrofuran, anisole, 2,4-dimethylanisole, morpholine, toluene, o-xylene, m-xylene, p-xylene, mesitylene, 1,4-dioxane, acetone, methylethylketone, 1,2-dichloroethane, 1,1,1-trichloroethane, 1,1,2,2-tetrachloroethane, ethyl acetate, n-butyl acetate, N,N-dimethylformamide, dimethylacetamide, dimethylsulfoxide, tetraline, 1,5-dimethyltetraline, decaline, indane, 1-methylnaphthalene, 2-methylthiophene, 3-methylthiophene, acetophenone, propiophenone, methyl benzoate, ethyl benzoate, and mixtures thereof.

Each of the individual layers in an OPD according to the present invention is typically applied as thin layer or film. The thickness of such a thin layer or film may is preferably less than 30 microns, very preferably less than 1 micron.

The individual layers in an OPD according to the present invention may be deposited by any suitable method. Liquid coating of devices is more desirable than vacuum deposition techniques. Solution deposition methods are especially preferred.

The formulations of the present invention enable the use of a number of liquid coating techniques. Preferred deposition techniques include, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing. For the fabrication of OPD devices and modules area printing methods compatible with flexible substrates are preferred, for example slot dye coating, spray coating and the like.

Ink jet printing is particularly preferred when high resolution layers and devices needs to be prepared. Selected formulations of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the OSC compounds or polymers should be first dissolved in a suitable solvent.

Solvents must fulfil the requirements stated above and must not have any detrimental effect on the chosen print head. Additionally, solvents should have boiling points >100° C., preferably >140° C. and more preferably >150° C. in order to prevent operability problems caused by the solution drying out inside the print head. Apart from the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing the OSC compounds or polymers by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the compound or polymer, which reduces or prevents clogging of the jets and separation of the components during spraying.

The solvent(s) may include those selected from the following list of examples: dodecylbenzene, 1-methyl-4-tert-butylbenzene, terpineol, limonene, isodurene, terpinolene, cymene, diethylbenzene. The solvent may be a solvent mixture, that is a combination of two or more solvents, each solvent preferably having a boiling point >100° C., more preferably >140° C. Such solvent(s) also enhance film formation in the layer deposited and reduce defects in the layer.

The ink jet fluid (that is mixture of solvent, binder and semiconducting compound) preferably has a viscosity at 20° C. of 1-100 mPa-s, more preferably 1-50 mPa-s and most preferably 1-30 mPa-s.

In a preferred embodiment of the present invention, after depositing the photoactive layer on the substrate the n-type and p-type OSC compound form a BHJ that phase separates at nanoscale level. For discussion on nanoscale phase separation see Dennler et al, *Proceedings of the IEEE,* 2005, 93 (8), 1429 or Hoppe et al, *Adv. Func. Mater,* 2004, 14(10), 1005. An optional annealing step may be then necessary to optimize blend morphology and consequently OPD device performance.

Another method to optimize device performance is to prepare formulations for the fabrication of OPD(BHJ) devices that may include high boiling point additives to promote phase separation in the right way. 1,8-Octanedithiol, 1,8-diiodooctane, nitrobenzene, chloronaphthalene, and other additives have been used to obtain high-efficiency solar cells. Examples are disclosed in J. Peet, et al, *Nat. Mater.,* 2007, 6, 497 or Fréchet et al. *J.* Am. Chem. Soc., 2010, 132, 7595-7597.

The OPD as described above and below can be used in a sensor device, for example a biosensor, or a detector or detector array for vein pattern recognition.

The OPD according to the present invention enables absorption of light >800 nm, and can thus be used to detect NIR light for applications such as bio-metrics, e.g. finger geometrics and vein imaging. The use of wavelengths >800 nm increases the sensitivity due to reduced light interference from background environmental light.

In a preferred embodiment of the present invention the OPD has an EQE of >10% at >800 nm, very preferably an EQE of >10% at >940 nm. Further preferably the OPD shows a flat response at the desired wavelength.

Unless the context clearly indicates otherwise, as used herein plural forms of the terms herein are to be construed as including the singular form and vice versa.

Throughout the description and claims of this specification, the words “comprise” and “contain” and variations of the words, for example “comprising” and “comprises”, mean “including but not limited to”, and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

Above and below, unless stated otherwise percentages are percent by weight and temperatures are given in degrees Celsius.

The invention will now be described in more detail by reference to the following examples, which are illustrative only and do not limit the scope of the invention.

Example 1

Intermediate 1

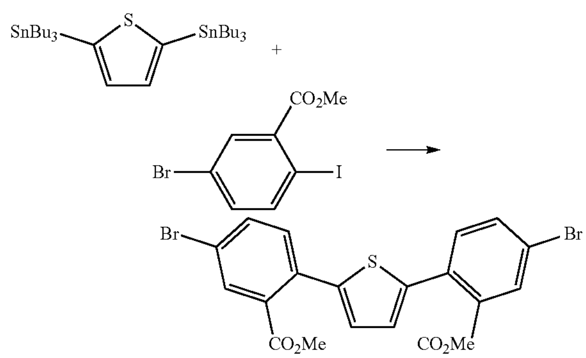

A solution of 2,5-bis(tributylstannyl)thiophene (15 g, 22.7 mmol), methyl 5-bromo-2-iodobenzoate (17.8 g, 52.1 mmol) and anhydrous toluene (350 $cm^3$) is degassed by bubbling through a stream of nitrogen for 30 minutes. Tri-o-tolyl phosphine (0.17 g, 0.57 mmol) and bis(triphenylphosphine)palladium (II) dichloride (0.21 g, 0.29 mmol) are added and the degassing continued for 10 minutes. The reaction is stirred at 80° C. under nitrogen for 20 hours. After cooling to 23° C., the reaction mixture is poured into distilled water (250 $cm^3$) and the organic layer decanted, washed with brine (2×100 $cm^3$), dried over magnesium sulphate and filtered. Removal of the solvent in vacuo followed by purification by silica gel chromatography (dichloromethane:heptanes; 7:3) gave intermediate 1 as a yellow solid (3.6 g, 31%). $^1$H NMR ($CDCl_3$, 400 MHz) 7.89 (2H, d, J 2.3), 7.64 (2H, dd, J 2, 8.3), 7.40 (2H, d, J 8.3), 6.99 (2H, s), 3.80 (6H, s).

Intermediate 2

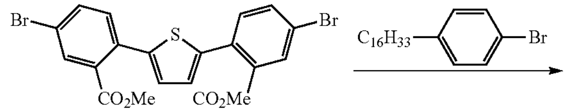

-continued

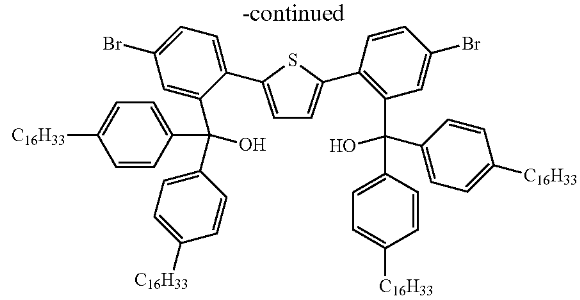

To a mixture of 1-bromo-4-hexadecylbenzene (13.4 g, 35.1 mmol) anhydrous tetrahydrofuran (170 $cm^3$) at −65° C. is added dropwise n-butyllithium (15 $cm^3$, 37.2 mmol, 2.5 M in hexanes) over 30 minutes. The resulting suspension is left to stir at −65° C. for 4 hours before intermediate 1 (3.60 g, 7 mmol) is added in one portion. The reaction mixture is left to stir and to warm up slowly over 17 hours to 23° C. Distilled water (100 $cm^3$) and tert-butyl methyl ether (100 $cm^3$) are added and the mixture stirred for 30 minutes. The organic layer is decanted and the aqueous layer extracted by tert-butyl methyl ether (3×50 $cm^3$). All organics are combined, dried over sulphate magnesium, filtered and the solvent removed in vacuo. The solid is purified by silica gel chromatography (heptane:ethyl acetate; 95:5) to give intermediate 2 as a yellow oil which solidified slowly upon standing (7.0 g, 64%). $^1$H NMR ($CDCl_3$, 400 MHz) 7.39 (2H, dd, J 1.8, 7.8), 7.11 (8H, d, J 8.3), 7.04 (10H, m), 6.94 (2H, d, J 2.3), 5.90 (2H, s), 3.25 (2H, s), 2.61 (8H, m), 1.60 (8H, m), 1.24-1.29 (104H, m), 0.89 (12H, t, J 6.6).

Intermediate 3

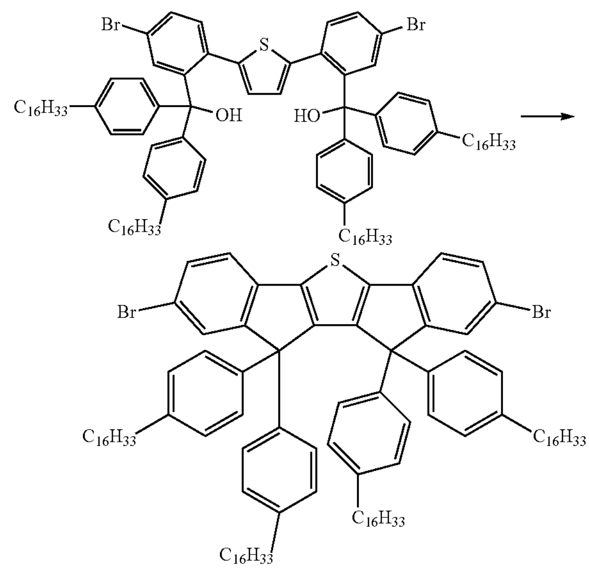

To a mixture of intermediate 2 (7.4 g, 4.5 mmol) and dichloromethane (230 $cm^3$) is added p-toluene sulfonic acid (1.7 g, 9 mmol) and the reaction mixture heated at reflux for 6 hours. After cooling to 23° C., the suspension is filtered off. Purification by recrystallisation (2-butanone) gave intermediate 3 as a beige solid (3.6 g, 50%). $^1$H NMR ($CDCl_3$, 400 MHz) 7.31 (2H, dd, J 1.5, 6.6), 7.24 (2H, d, J 8.1), 7.17

(2H, d, J 1.5), 6.72 (8H, d, J 8.1), 6.61 (8H, d, J 8.1), 2.39-2.45 (8H, m), 1.52 (8H, m), 1.23-1.38 (104H, m), 0.89 (12H, t, J 6.6).

Intermediate 4

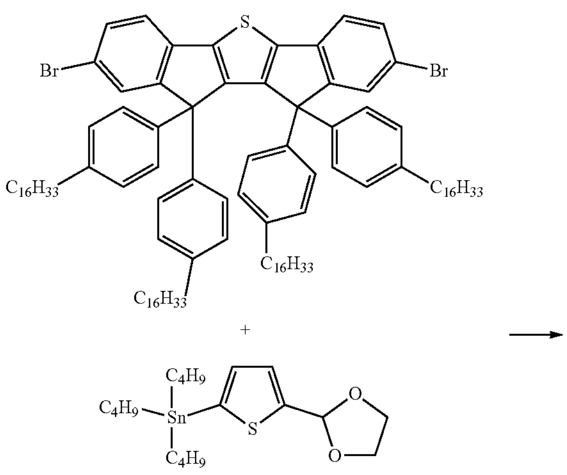

-continued

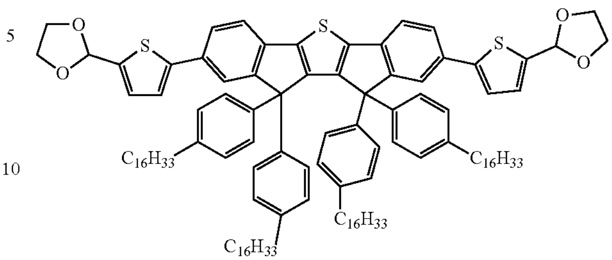

A solution of intermediate 3 (1.0 g, 0.6 mmol), tributyl-(5-[1,3]dioxolan-2-yl-thiophen-2-yl)-stannane (1.1 g, 2.5 mmol), tri-o-tolyl-phosphane (56.4 mg, 0.2 mmol) and anhydrous toluene (50 $cm^3$) is degassed with nitrogen for 30 minutes. Tris(dibenzylideneacetone)dipalladium(0) (42.4 mg, 0.05 mmol) is added and the degassing continued for 20 minutes. The reaction is stirred at 105° C. for 17 hours. The resulting reaction mixture is let cool to 25° C., removal of the solvent in vacuo followed by purification by silica gel chromatography (40-60 petrol:diethyl ether; 7:3) gave intermediate 4 as a yellow/green solid (1.0 g, 92%). $^1H$ NMR ($CD_2Cl_2$, 400 MHz) 7.42-7.56 (4H, m), 7.31 (2H, s), 7.02-7.11 (4H, m) 6.83 (8H, d, J 8.1), 6.68 (8H, d, J 8.3), 6.03 (2H, s), 3.93-4.18 (8H, m), 2.46 (8H, q, J 7.3), 1.46-1.64 (8H, m), 1.21-1.43 (104H, m), 0.86-0.96 (12H, m).

Intermediate 5

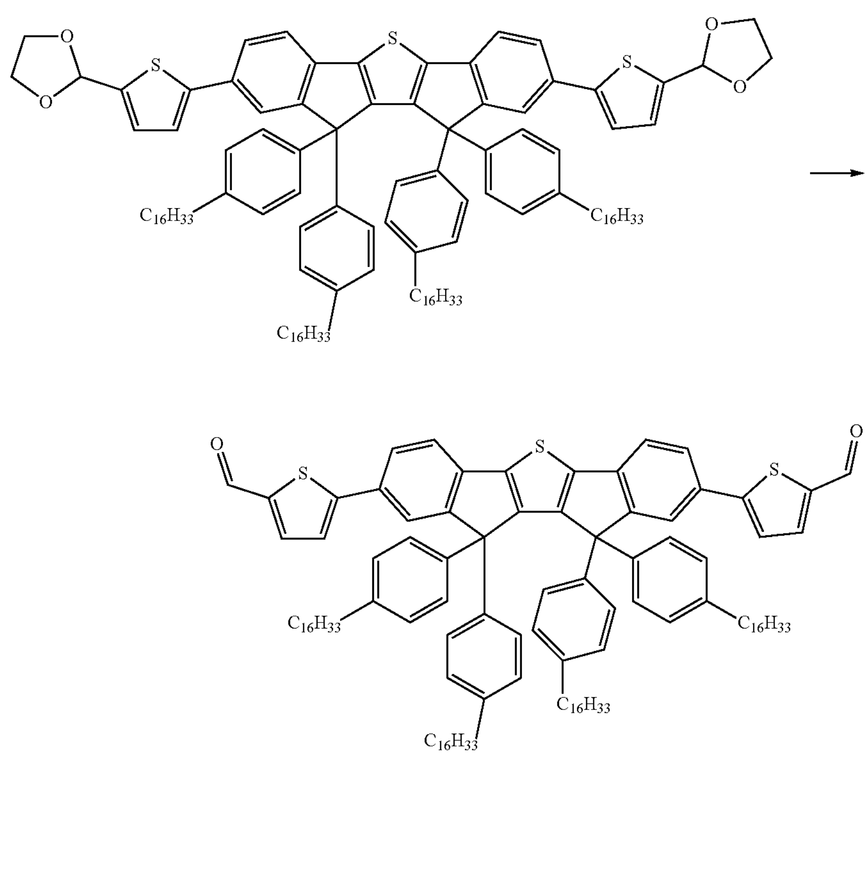

A solution of intermediate 4 (1.0 g, 0.6 mmol) in tetrahydrofuran (5 $cm^3$) at 20° C. is added dropwise concentrated hydrochloric acid (0.3 $cm^3$). The reaction mixture is stirred at 20° C. for 2 hours. The reaction is quenched with ice water (50 $cm^3$). The solution is extracted with diethyl ether (3×30 $cm^3$). The organic layers combined, dried over anhydrous magnesium sulfate and the solvent removed in vacuo. The crude product is dissolved in hot 40-60 petrol (20 $cm^3$) which is added dropwise into acetone (60 $cm^3$) to form a clear solution. On standing over 30 minutes an orange crystalline solid is formed, filtered, washed with ethanol to give intermediate 5 as a light orange solid (850 mg, 90%). $^1H$ NMR ($CD_2Cl_2$, 400 MHz) 9.78-9.88 (2H, s), 7.59-7.72 (4H, m), 7.53 (2H, d, J 8.1), 7.41 (2H, d, J 1.0), 7.31 (2H, d, J 4.2), 6.77-6.92 (8H, m), 6.61-6.75 (8H, m), 2.35-2.58 (8H, m), 1.45-1.64 (10H, m), 1.20-1.42 (104H, m), 0.91 (12H, t, J 6.7).

Compound 1

To a three-necked round-bottomed flask is added intermediate 5 (0.8 g, 0.5 mmol), 2-(3-oxo-indan-1-ylidene)-malononitrile (0.65 g, 3.3 mmol), chloroform (50 $cm^3$) and pyridine (2.6 $cm^3$, 33.3 mmol). The mixture is degassed with nitrogen for 30 minutes and then heated to reflux for 12 hours. The resulting reaction mixture is let cool to 25° C. and poured into methanol (300 $cm^3$), stirred for 1 hour to form a fine suspension which is collected by filtration. The crude product is purified by column chromatography (dichloromethane) to give product 1 as a dark red solid (0.5 g, 52%). $^1H$ NMR ($CD_2Cl_2$, 400 MHz) 8.68 (2H, s), 8.57 (2H, dd, J 6.6 1.2), 7.81 (2H, s), 7.63-7.73 (6H, m), 7.60 (2H, dd, J 8.1, 1.7), 7.35-7.42 (4H, m), 7.26 (2H, d, J 4.4), 6.77 (8H, d, J 8.3), 6.61 (8H, d, J 8.6), 2.36 (8H, m), 1.44 (8H, m), 1.09-1.31 (104H, m), 0.73-0.84 (12H, m).

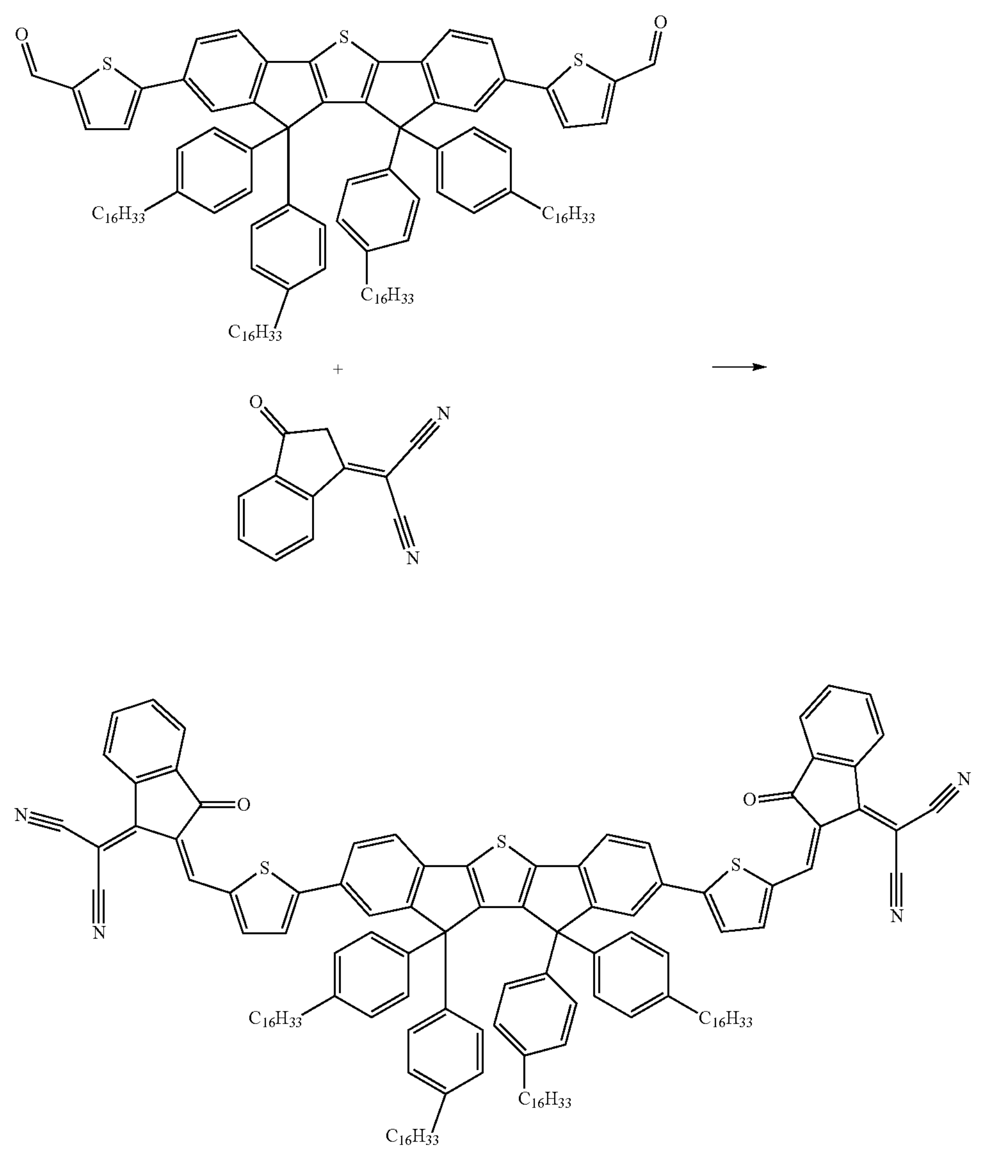

Example 2

Intermediate 6

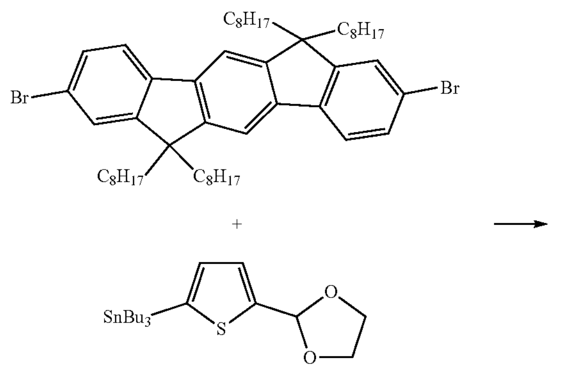

-continued

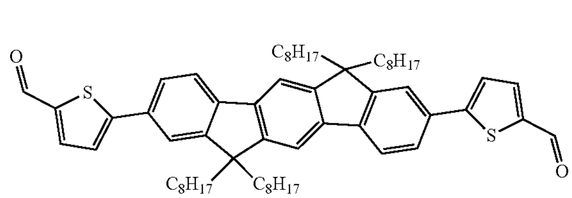

To a mixture of 2,8-dibromo-6,6,12,12-tetraoctyl-6,12-dihydro-indeno[1,2-b]fluorene (1500 mg, 1.74 mmol), tributyl-(5-[1,3]dioxolan-2-yl-thiophen-2-yl)-stannane (3.10 g, 6.97 mmol) and tri-o-tolyl-phosphine (159 mg, 0.523 mmol) is added degassed anhydrous toluene (50 $cm^3$). The resulting solution is degassed with nitrogen for further 30 minutes. Tris(dibenzylideneacetone)dipalladium(0) (120 mg, 0.131 mmol) is then added and the mixture degassed for a further 20 minutes. The reaction mixture is then placed in to a pre-heated block and heated at 105° C. for 17 hours. After cooling to 23° C., the solvent is removed in vacuo. The resulting residue is dissolved in tetrahydrofuran (50 $cm^3$) and concentrated hydrochloric acid (5 $cm^3$) added followed by stirring at 23° C. for 2 hours. The solvent is removed in vacuo and the residue triturated with ethanol. The solid collected by filtration and washed with methanol to give to intermediate 6 (1.55 g, 96%) as a yellow solid. $^1$H NMR ($CDCl_3$, 400 MHz) 0.65-0.83 (20H, m), 1.03-1.24 (40H, m), 2.10-2.19 (8H, m), 7.56 (2H, d, J 3.9), 7.72-7.87 (10H, m), 9.94 (2H, s).

Compound 2

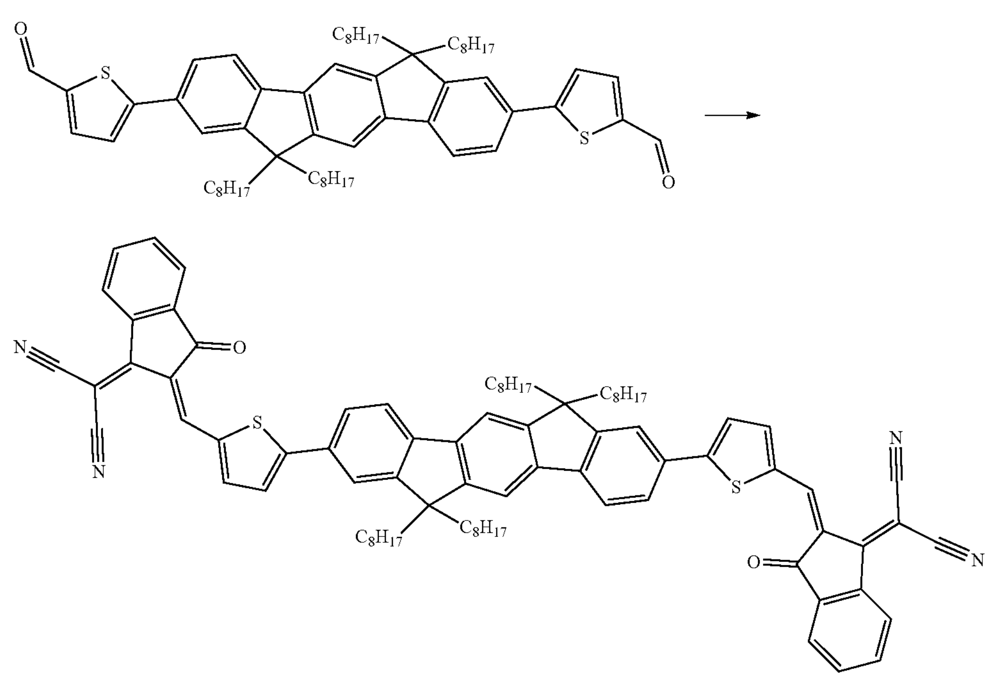

A degassed mixture of intermediate 6 (250 mg, 0.329 mmol), 2-(3-oxo-indan-1-ylidene)-malononitrile (442 mg, 2.27 mmol), chloroform (25 $cm^3$) and pyridine (1.8 $cm^3$) is heated at reflux for 12 hours. After cooling to 23° C., the solvent is removed in vacuo, the residue is stirred in ethanol (150 $cm^3$) at 50° C. for 1 hour and the resulting suspension is filtered through a silica pad and washed well with ethanol followed by acetone. The solvent removed in vacuo and the solid triturated in ethanol. The solid collected by filtration to give compound 2 (356 mg, 86%) as a dark blue solid. $^1$H NMR ($CD_2Cl_2$, 400 MHz) 0.64-0.85 (20H, m), 1.05-1.22 (40H, m), 2.13-2.27 (8H, m), 7.69 (2H, d, J 3.9), 7.79-8.03 (16H, m), 8.74 (2H, d, J 7.3), 8.93 (2H, s).

Example 3

Intermediate 7

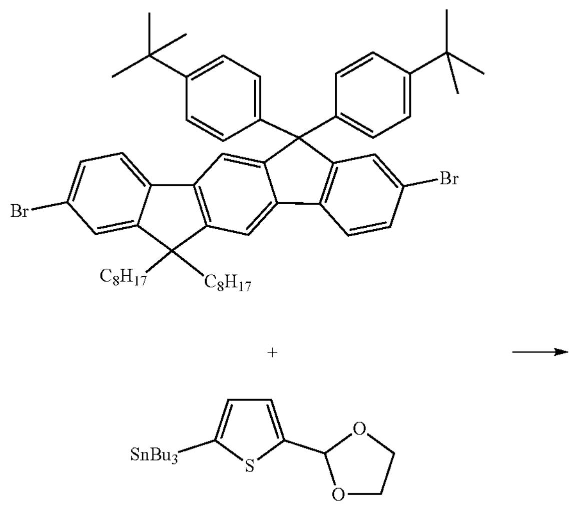

-continued

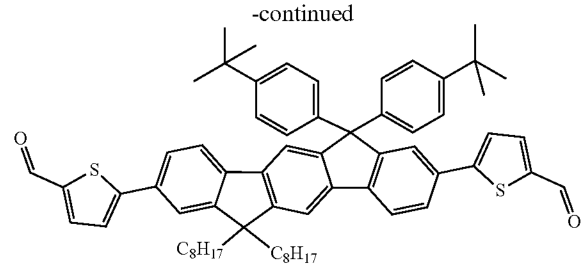

To a mixture of 2,8-dibromo-6,6-bis-(4-tert-butyl-phenyl)-12,12-dioctyl-6,12-dihydro-indeno[1,2-b]fluorene (1500 mg, 1.67 mmol), tributyl-(5-[1,3]dioxolan-2-yl-thiophen-2-yl)-stannane (2.97 g, 6.67 mmol) and tri-o-tolyl-phosphine (152 mg, 0.499 mmol) is added degassed anhydrous toluene (50 $cm^3$). The resulting solution is degassed with nitrogen for further 30 minutes. Tris(dibenzylideneacetone)dipalladium(0) (114 mg, 0.125 mmol) is then added and the mixture degassed for a further 20 minutes. The reaction mixture is then placed in to a pre-heated block and heated at 105° C. for 17 hours. After cooling to 23° C., the solvent is removed in vacuo. The resulting residue is dissolved in tetrahydrofuran (50 $cm^3$) and concentrated hydrochloric acid (5 $cm^3$) added followed by stirring at 23° C. for 2 hours. The solvent is removed in vacuo and the residue triturated with ethanol. The solid collected by filtration and washed with methanol to give to intermediate 7 (1.25 g, 78%) as a yellow solid. $^1H$ NMR ($CDCl_3$, 400 MHz) 0.60-1.35 (48H, m), 1.94-2.04 (4H, m), 7.09-7.22 (8H, m), 7.31-7.40 (2H, m), 7.54-7.82 (10H, m), 9.79 (2H, s), 9.82 (2H, s).

Compound 3

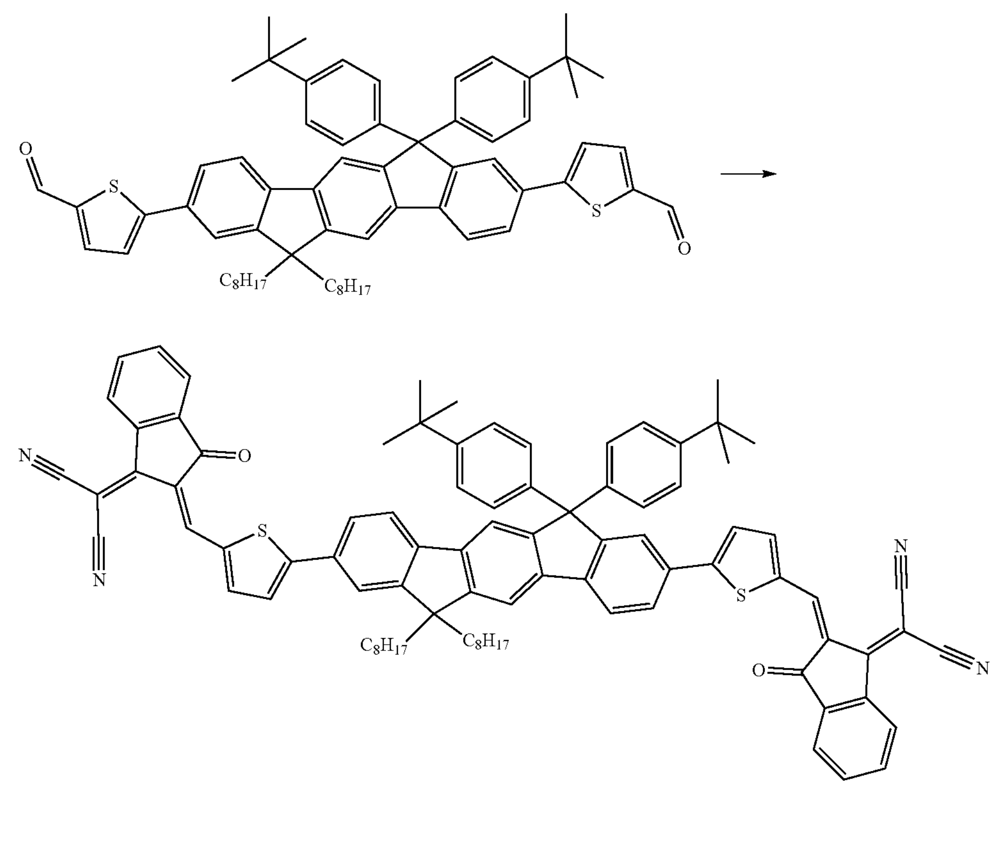

A degassed mixture intermediate 7 (300 mg, 0.311 mmol), 2-(3-oxo-indan-1-ylidene)-malononitrile (423 mg, 2.18 mmol), chloroform (25 $cm^3$) and pyridine (1.7 $cm^3$) is heated at reflux for 12 hours. After cooling to 23° C., the solvent is removed in vacuo, the residue is stirred in ethanol (150 $cm^3$) at 50° C. for 1 hour and the resulting suspension is filtered through a silica pad and washed well with ethanol followed by acetone. The solvent removed in vacuo and the solid triturated in ethanol. The solid collected by filtration to give compound 3 (130 mg, 32%) as a dark purple solid. $^1H$ NMR ($CD_2Cl_2$, 400 MHz) 0.62-0.71 (10H, m), 0.96-1.12 (20H, m), 1.17-1.24 (18H, m), 2.05-2.13 (4H, m), 7.13-7.28 (8H, m), 7.41-7.43 (1H, m), 7.52-7.54 (1H, m), 7.63-7.88 (16H, m), 8.56-8.62 (2H, m), 8.73-8.80 (2H, m).

Example 4

Intermediate 8

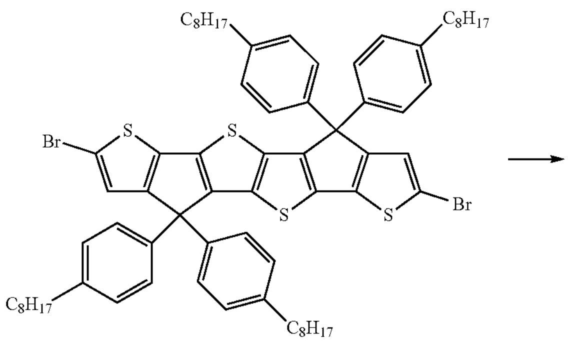

-continued

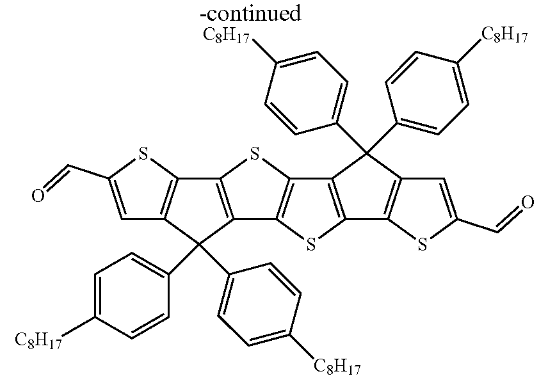

To a solution of 2,7-dibromo-4,4,9,9-tetrakis(4-octylphenyl)-4,9-dihydro-thieno[3',2':4,5]cyclopenta[1,2-b]thieno[2",3":3',4']cyclopenta[1',2':4,5]thieno[2,3-d]thiophene (0.5 g, 0.40 mmol) in anhydrous tetrahydrofuran (20 $cm^3$) at −78° C. is added dropwise n-butyllithium (0.50 $cm^3$, 1.3 mmol, 2.5 M in hexane) over 15 minutes. After addition, the reaction mixture is stirred at −78° C. for 60 minutes before a solution of N,N-dimethylformamide (0.8 $cm^3$, 10.4 mmol) in anhydrous diethyl ether (20 $cm^3$) is added in one go. The mixture is then allowed to warm to 23° C. over 17 hours. Dichloromethane (60 $cm^3$) and water (250 $cm^3$) is added and the mixture stirred at 23° C. for 30 minutes. The product is extracted with dichloromethane (3×60 $cm^3$). The combined organics are washed with brine (30 $cm^3$) and dried over anhydrous magnesium sulfate, filtered and the solvent removed in vacuo to obtain crude. The crude is purified by column chromatography (40-60 petrol:diethyl ether; 9.5:0.5) to give intermediate 8 (0.13 g, 27%) as an orange yellow crystalline solid. $^1H$ NMR (400 MHz, $CDCl_3$) 9.81 (2H, s), 7.69 (2H, s), 7.12 (16H, m), 2.52-2.61 (8H, m), 1.30 (48H, bs), 0.79-0.92 (12H, m).

Compound 4

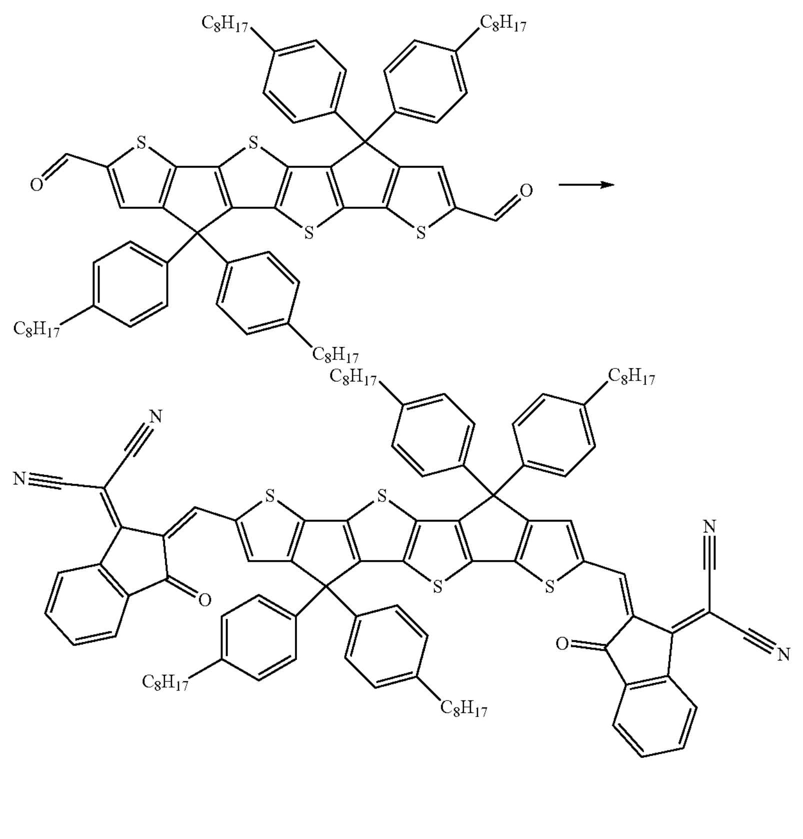

To a degassed solution of intermediate 8 (0.13 g, 0.11 mmol) and 3-(dicyanomethylidene)indan-1-one (1.5 g, 0.77 mmol) in chloroform (12 $cm^3$) is added Pyridine (0.6 $cm^3$, 7.69 mmol). The mixture is then degassed with nitrogen for 30 min and then heated at 70° C. for 15 h. The reaction mixture allowed to cool to 23° C. and the solvent removed in vacuo. The crude is purified by column chromatography (40-60 petrol:chloroform; 1:1) to give desired compound 4 (1.1 g, 65%) as a dark blue crystalline solid. $^1$H NMR (400 MHz, $CDCl_3$) 8.87 (2H, s), 8.69 (2H, J 7.58 Hz, d), 7.91 (2H, J 7.09 Hz, d), 7.68-7.79 (6H, m), 7.08-7.18 (16H, m), 2.60 (8H, J 7.70 Hz, t), 1.62 (8H, J 7.09 Hz, q), 1.21-1.39 (40H, m), 0.88 (12H, J 6.48 Hz, t).

Example 5

Intermediate 9

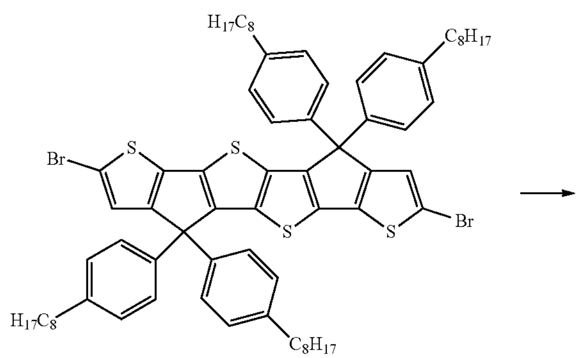

-continued

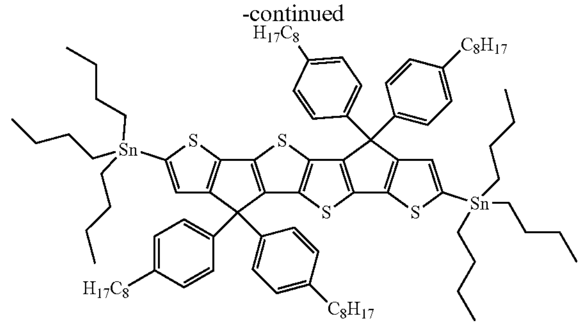

To a solution of 2,7-dibromo-4,4,9,9-tetrakis(4-octylphenyl)-4,9-dihydro-thieno[3',2': 4,5]cyclopenta[1,2-b]thieno[2",3": 3',4']cyclopenta[1',2': 4,5]thieno[2,3-d]thiophene (2.00 g, 1.61 mmol) in anhydrous tetrahydrofuran (100 $cm^3$) at −78° C. is added n-butyllithium (2.6 $cm^3$, 6.5 mmol, 2.5 M in hexanes) over 10 minutes. The mixture is stirred at −78° C. for 1 hour before tributyltin chloride (2.0 $cm^3$, 7.4 mmol) is added and the mixture stirred to 23° C. overnight. Methanol (10 $cm^3$) is added and the material concentrated in vacuo. The crude product is then taken up in pentane (20 $cm^3$), anhydrous magnesium sulfate added, filtered and the solid washed with additional pentane (3×10 $cm^3$). The filtrate is then concentrated in vacuo and the solid triturated with methanol (3×20 $cm^3$) and the product collected by filtration to give intermediate 9 (2.57 g, 96%) as a yellow waxy solid. $^1$H NMR (400 MHz, $CDCl_3$, 45° C.) 7.16 (8H, d, J 8.2), 7.06 (10H, d, J 7.8), 2.55 (8H, t, J 7.8), 1.53-1.67 (20H, m), 1.22-1.41 (56H, m), 1.07-1.14 (8H, m), 0.84-0.97 (30H, m).

Intermediate 10

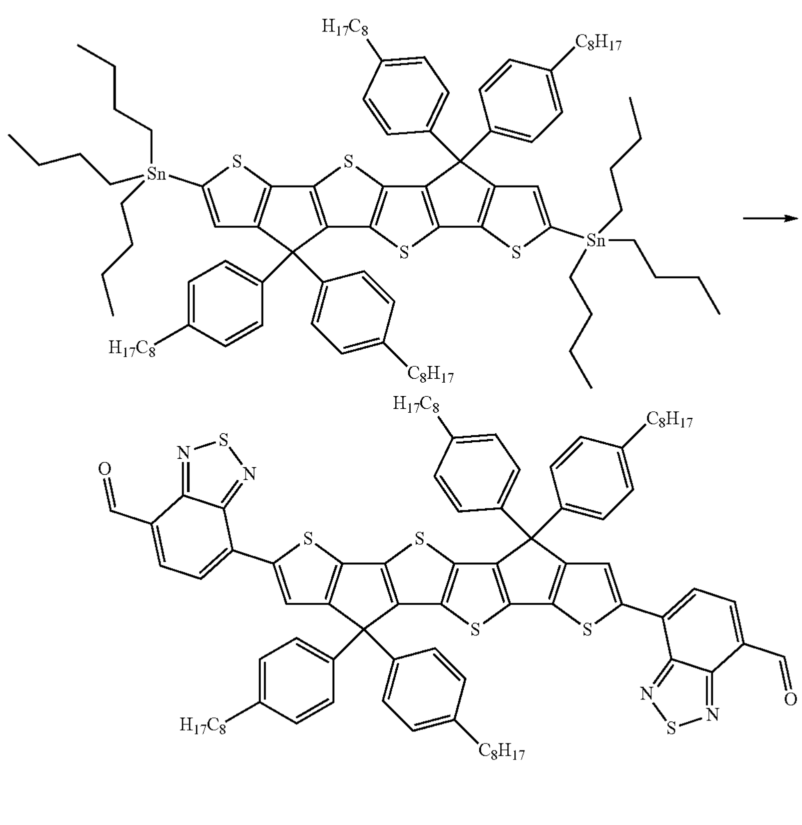

To a degassed solution of intermediate 9 (500 mg, 0.30 mmol) and 7-bromo-benzo[1,2,5]thiadiazole-4-carbaldehyde (161 mg, 0.66 mmol) in anhydrous toluene (36 $cm^3$), tris(dibenzylideneacetone)dipalladium(0) (22 mg, 0.02 mmol) and tris(o-tolyl)phosphine (28 mg, 0.09 mmol) is added. After degassing the reaction mixture for 30 minutes it is heated at 80° C. for 1.5 hours. After cooling to 23° C., the mixture is concentrated in vacuo. The crude is then triturated with methanol (3×25 $cm^3$) and the solid filtered to obtain intermediate 10 (357 mg, 84%) as a blue crystalline solid. $^1$H NMR (400 MHz, $CDCl_3$) 10.69 (2H, s), 8.33 (2H, s), 8.19 (2H, d, J 7.8), 7.95 (2H, d, J 7.6), 7.25 (8H, d, J 8.3), 7.14 (8H, d, J 8.3), 2.58 (8H, t, J 7.8), 1.58-1.64 (8H, m), 1.20-1.38 (40H, m), 0.86 (12H, t, J 6.8).

Compound 5

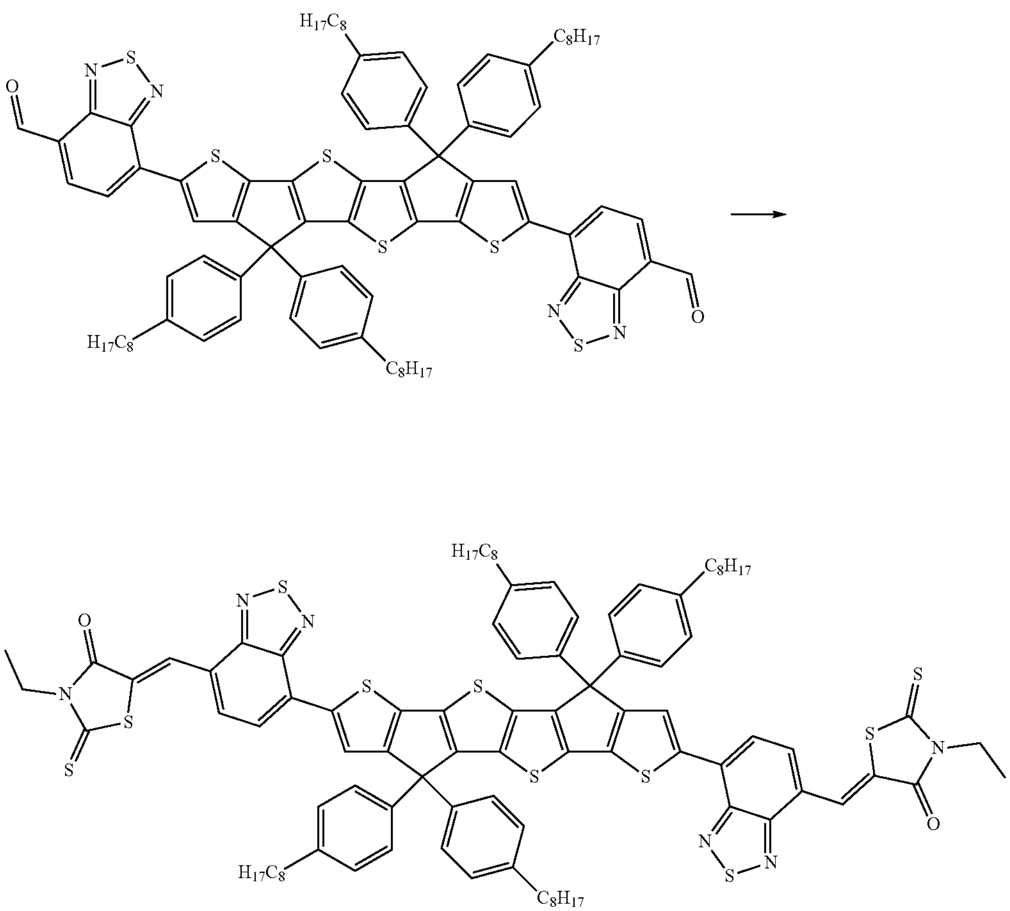

To a solution of intermediate 10 (357 mg, 0.25 mmol) in anhydrous chloroform (27 $cm^3$) is added pyridine (1.4 $cm^3$, 17 mmol). The mixture is degassed with nitrogen before 3-ethyl-2-thioxo-thiazolidin-4-one (286 mg, 1.77 mmol) is added. After further degassing, the reaction mixture is heated at reflux for 2 days. Additional degassed anhydrous chloroform (20 $cm^3$) is added and the reaction heated at reflux for a further 24 hours. Additional 3-ethyl-2-thioxo-thiazolidin-4-one (286 mg, 1.77 mmol) is added and the reaction heated at reflux for 24 hours before the reaction is cooled to 23° C., concentrated in vacuo and triturated with methanol (4×20 $cm^3$) followed by diethyl ether (3×20 $cm^3$). The triturated material is then heated at 90° C. in 2-butanone/water (4:1) (70 $cm^3$) for 30 minutes, cooled to 0° C. and the solid collected by filtration and washed with additional cold 2-butanone (4×10 $cm^3$) to give Compound 5 (233 mg, 54%) as a green/black powder. $^1$H NMR (400 MHz, $CDCl_3$) 8.50 (2H, s), 8.27 (2H, s), 7.89 (2H, d, J 7.8), 7.66 (2H, d, J 7.8), 7.24 (8H, d, J 8.1), 7.13 (8H, d, J 8.3), 4.25 (4H, q, J 6.9), 2.57 (8H, t, J 7.7), 1.58-1.63 (8H, m), 1.20-1.37 (46H, m), 0.86 (12H, t, J 6.7).

Example 6

Compound 6

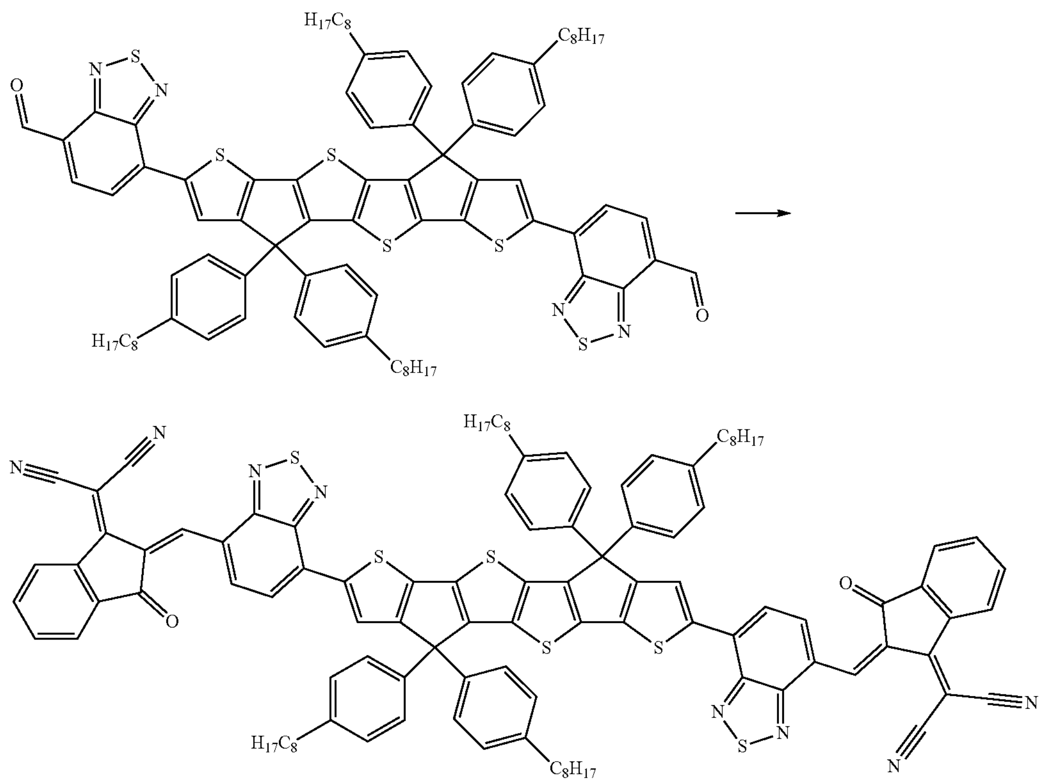

To a solution of intermediate 10 (170 mg, 0.12 mmol) in anhydrous chloroform (13 $cm^3$) is added pyridine (0.7 $cm^3$, 8.7 mmol). The mixture is then degassed with nitrogen before 3-(dicyanomethylidene)indan-1-one (164 mg, 0.84 mmol) is added. The solution is then degassed further before heating at reflux for 40 minutes. The reaction is then added to methanol (150 $cm^3$) and the precipitated product collected by filtration and washed with methanol (5 $cm^3$). The solid is then passed through a silica plug (dichloromethane) to give Compound 6 (36 mg, 17%) as a black solid. $^1$H NMR (400 MHz, $CDCl_3$) 9.56 (2H, s), 9.26 (2H, d, J 8.1), 8.72 (2H, d, J 7.8), 8.36 (2H, s), 7.93 (4H, d, J 7.8), 7.73-7.84 (4H, m), 7.22-7.25 (8H, m), 7.14 (8H, d, J 8.1), 2.57 (8H, t, J 7.7), 1.57-1.64 (8H, m), 1.24 (40H, m), 0.85 (12H, t, J 6.5).

Example 7

Intermediate 11

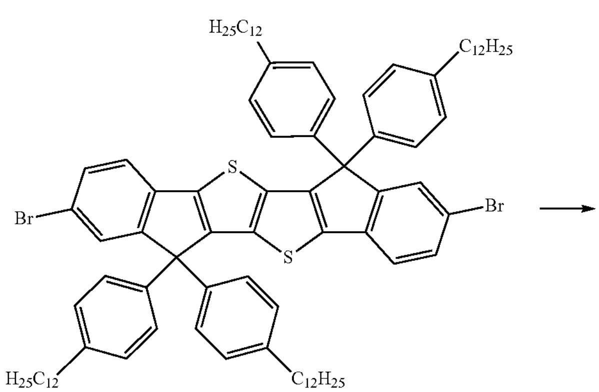

-continued

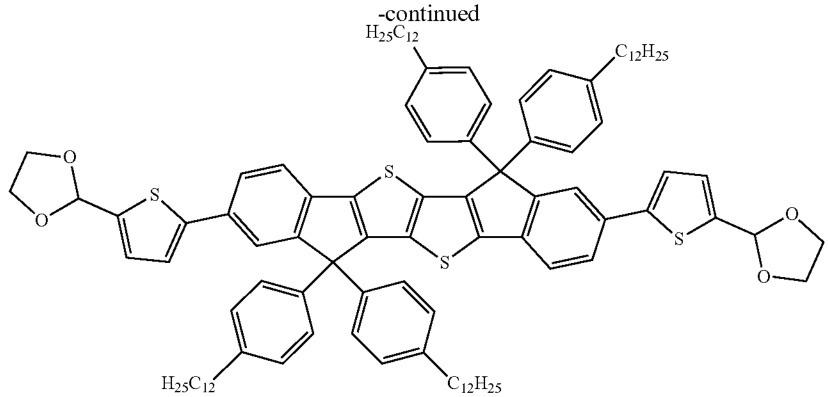

To a solution of 2,8-dibromo-6,12-dihydro-6,6,12,12-tetrakis(4-dodecylphenyl)indeno[1,2-b]indeno[2',1':4,5]thieno[2,3-d]thiophene (500 mg, 0.34 mmol) in anhydrous toluene (41 $cm^3$) is added tributyl-(5-[1,3]dioxolan-2-yl-thiophen-2-yl)-stannane (0.4 $cm^3$, 0.9 mmol) before the solution is degassed with nitrogen. Tris(dibenzylideneacetone)dipalladium(0) (25 mg, 0.03 mmol) and tris(o-tolyl)phosphine (31 mg, 0.10 mmol) are then added and after additional degassing the reaction mixture is heated at 80° C. for 24 hours. The reaction mixture is then concentrated in vacuo and triturated with methanol (3×50 $cm^3$). The solid is then eluted though a silica plug (40-60 petrol:dichloromethane; 4:1 to 0:1) and triturated with 2-propanol (100 $cm^3$) at 80° C., which with cooling to 0° C. and collection by filtration gives intermediate 11 (454 mg, 82%) as a sticky yellow solid. $^1H$ NMR (400 MHz, $CHCl_3$) 7.61 (2H, s), 7.52 (2H, d, J 8.1), 7.35 (2H, d, J 8.1), 7.18 (8H, d, J 7.9), 7.14 (2H, d, J 3.7), 7.09 (10H, d, J 8.1), 6.09 (2H, s), 4.10-4.19 (4H, m), 4.00-4.09 (4H, m), 2.55 (8H, t, J 7.8), 1.57-1.63 (8H, m), 1.21-1.36 (72H, m), 0.87 (12H, t, J 6.7).

Intermediate 12

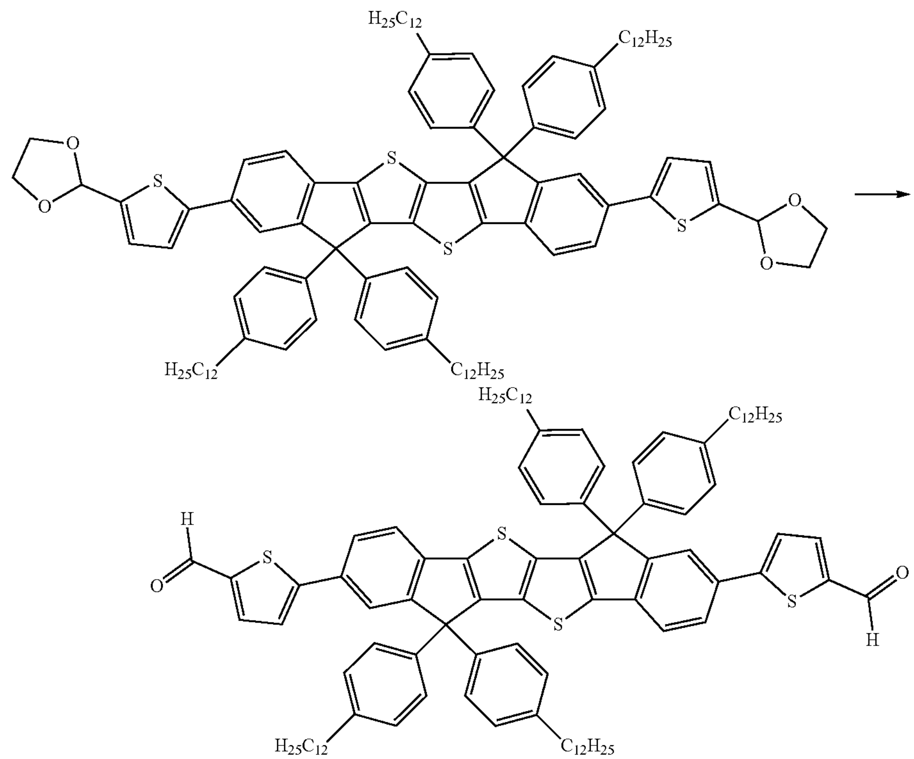

Concentrated hydrochloric acid (0.2 $cm^3$, 1.8 mmol, 32%) is added dropwise to a solution of intermediate 11 (454 mg, 0.28 mmol) in tetrahydrofuran (20 $cm^3$) at 23° C. and the reaction mixture stirred for 2 hours. Water (0.5 $cm^3$) is then added and the reaction mixture stirred for a further hour. Additional water (50 $cm^3$) is then added and the solution extracted with ethyl acetate (50 $cm^3$ then 25 $cm^3$). The combined organic extracts are then washed with water (50 $cm^3$) and brine (50 $cm^3$), extracting the aqueous layer each time with additional ethyl acetate (25 $cm^3$). The combined organic extracts are then dried over anhydrous magnesium sulfate, filtered and concentrated in vacuo. The crude product is then stirred in a mixture of 40-60 petrol (125 $cm^3$) and acetone (10 $cm^3$) at 70° C. The mixture is then cooled to 0° C., filtered and the solid washed with 40-60 petrol (3×10 $cm^3$) to give intermediate 12 (191 mg, 45%) as a yellow solid. $^1H$ NMR (400 MHz, $CDCl_3$) 9.86 (2H, s), 7.68-7.72 (4H, m), 7.63 (2H, d, J 8.1), 7.41 (2H, d, J 7.8), 7.36 (2H, d, J 3.9), 7.18 (8H, d, J 8.1), 7.11 (8H, d, J 8.1), 2.56 (8H, t, J 7.8), 1.58-1.64 (8H, m), 1.19-1.37 (72H, m), 0.87 (12H, t, J 6.6).

Compound 7

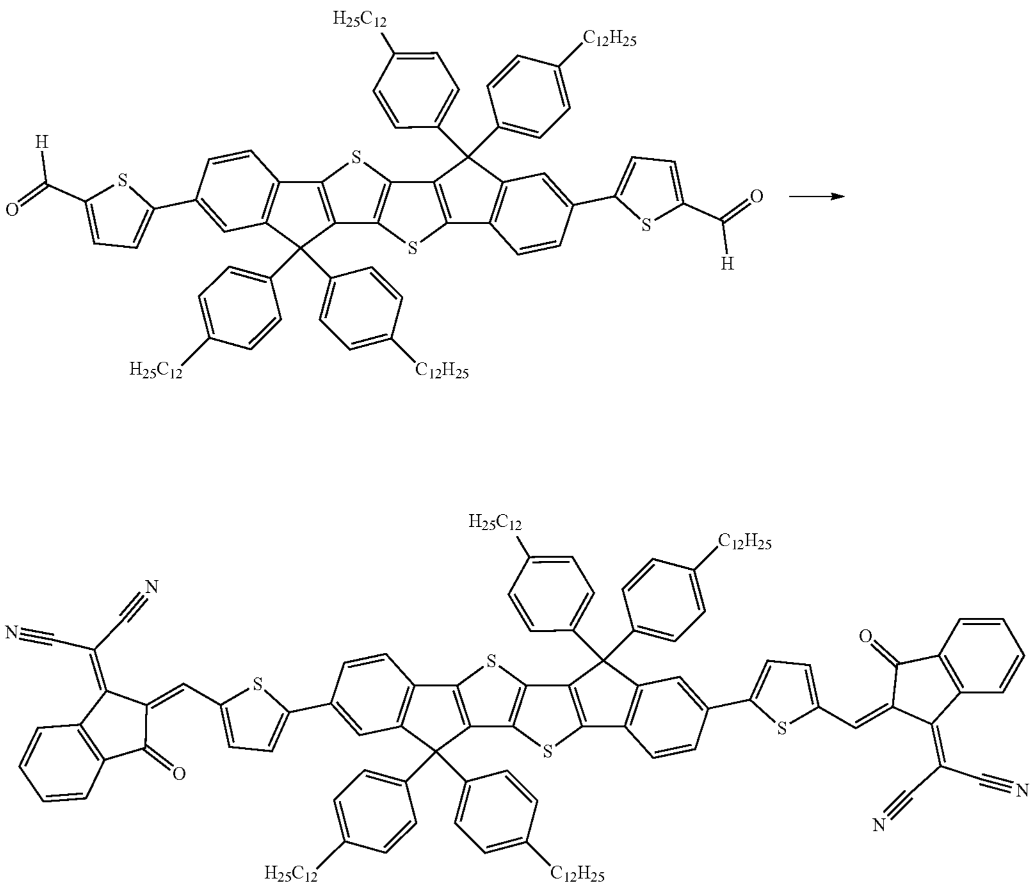

To a solution of intermediate 12 (191 mg, 0.13 mmol) in anhydrous chloroform (13 $cm^3$) is added pyridine (0.7 $cm^3$, 8.7 mmol). The mixture is then degassed with nitrogen before 3-(dicyanomethylidene)indan-1-one (172 mg, 0.89 mmol) is added. The solution is then further degassed and stirred at 23° C. for 200 minutes. The reaction mixture is then added to methanol (200 $cm^3$), the resulting precipitate collected by filtration and washed with methanol (3×10 $cm^3$). The solid is then triturated with diethyl ether (4×10 $cm^3$) to obtain Compound 7 (158 mg, 67%) as a black solid. $^1H$ NMR (400 MHz, $CDCl_3$) 8.86 (2H, s), 8.67-8.72 (2H, m), 7.92-7.97 (2H, m), 7.83 (2H, d, J 4.4), 7.71-7.81 (8H, m), 7.42-7.47 (4H, m), 7.22 (8H, d, J 8.2), 7.13 (8H, d, J 8.3), 2.58 (8H, t, J 7.7), 1.59-1.65 (8H, m), 1.18-1.39 (72H, m), 0.87 (12H, t, J 6.9).

Example 8

Intermediate 13

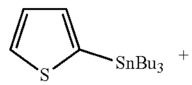

-continued

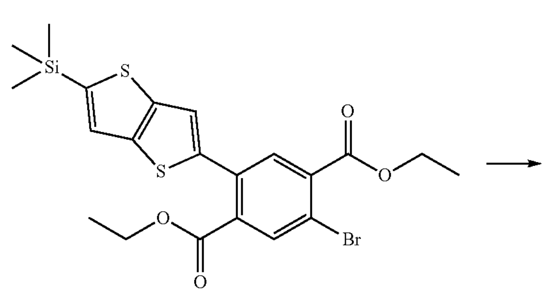

-continued

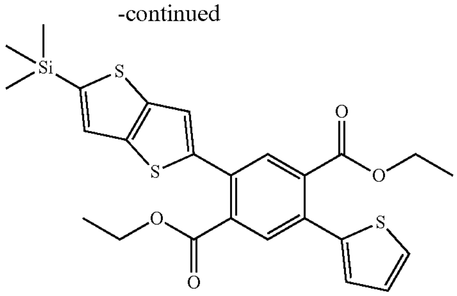

To a degassed mixture of 2-bromo-5-(5-trimethylsilanyl-thieno[3,2-b]thiophen-2-yl)-terephthalic acid diethyl ester (4.77 g, 9.3 mmol), tributyl-thiophen-2-yl-stannane (3.6 $cm^3$, 11 mmol) and anhydrous N,N-dimethylformamide (50 $cm^3$) is added bis(triphenylphosphine)palladium(II) dichloride (330 mg, 0.47 mmol) and the mixture further degassed for 5 minutes. The mixture is then heated at 100° C. for 17 hours. The mixture allowed to cool slightly and the solvent removed in vacuo. The residue is purified by column chromatography (gradient from 40-60 petrol to dichloromethane) to give intermediate 13 (1.89 g, 39%) as a yellow solid. $^1H$ NMR ($CDCl_3$, 400 MHz) 7.78 (1H, s), 7.75 (1H, s), 7.31-7.34 (1H, m), 7.28 (1H, s), 7.20 (1H, s), 7.00-7.04 (2H, m), 4.16 (4H, quin, J 7.2), 1.09 (3H, t, J 7.2), 1.08 (3H, t, J 7.2), 0.30 (9H, s).

Intermediate 14

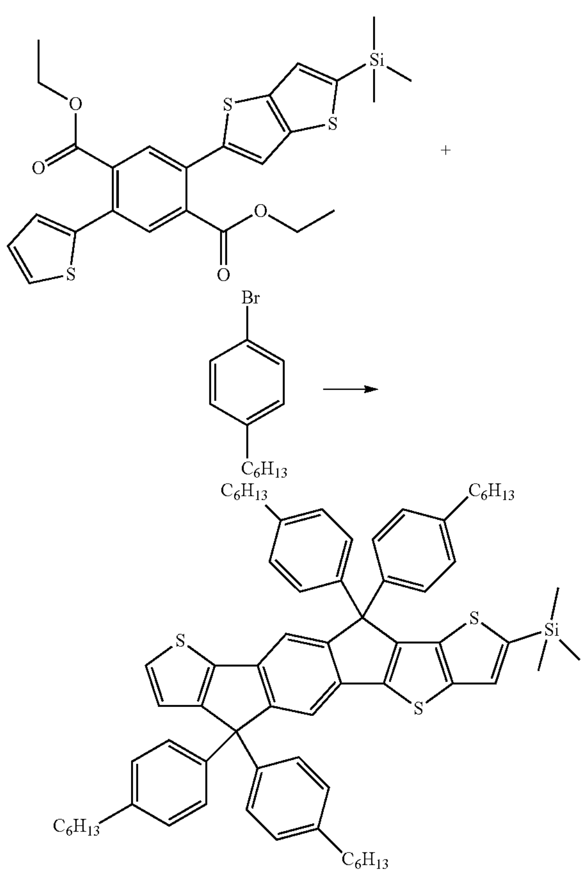

To a solution of 1-bromo-4-hexyl-benzene (5.3 g, 22 mmol) in anhydrous tetrahydrofuran (36 $cm^3$) at −78° C. is added n-butyllithium (8.8 $cm^3$, 22 mmol, 2.5 M in hexanes) dropwise over 30 minutes. The reaction is then stirred for a further 30 minutes. Intermediate 13 (1.89 g, 3.67 mmol) is then added as a solid in one portion and the reaction mixture stirred and allowed to warm to 23° C. over 17 hours. Water (100 $cm^3$) is added and the product extracted with ether (2×100 $cm^3$). The combined organics washed with brine (100 $cm^3$), dried over anhydrous magnesium sulfate and filtered. To the solution is added amberlyst 15 strong acid (25 g) and the mixture degassed by vacuum/nitrogen 3 times. The mixture is then heated at reflux for 3 hours. The mixture allowed to cool to 23° C., filtered, the solid washed with ether (50 $cm^3$) and the solvent removed from the filtrate in vacuo. The crude is purified by column chromatography (gradient from 40-60 petrol to 40-60 petrol:dichloromethane 3:2) to give intermediate 14 (2.45 g, 64%) as an orange solid. $^1H$ NMR ($CD_2Cl_2$, 400 MHz) 7.56 (1H, s), 7.51 (1H, s), 7.33-7.36 (2H, m), 7.10-7.22 (16H, m), 7.05 (1H, d, J 4.7), 2.55-2.64 (8H, m), 1.51-1.66 (8H, m), 1.26-1.42 (24H, m), 0.85-0.95 (12H, m).

Intermediate 15

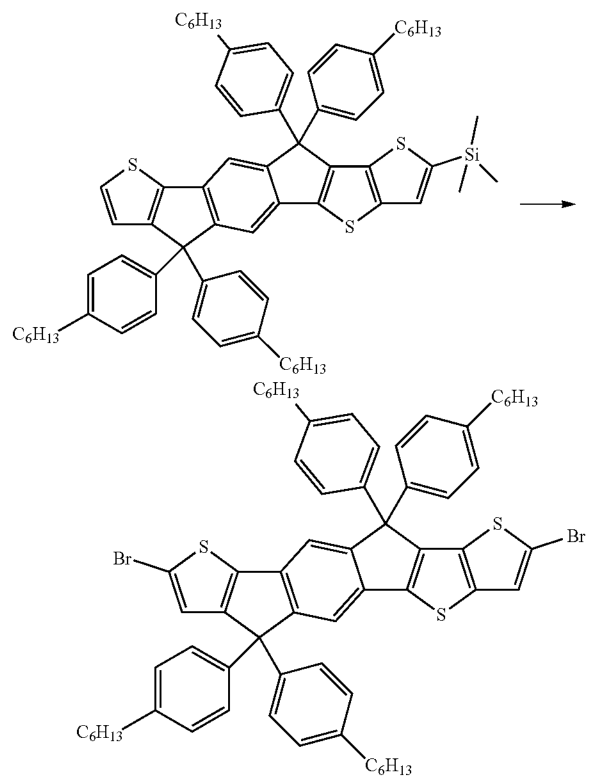

To intermediate 14 (2.45 g, 0.38 mmol) in anhydrous tetrahydrofuran (50 $cm^3$) at 23° C. is added N-bromosuccinimide (880 mg, 178 mmol). The reaction is then stirred at 23° C. for 3 hours. Water (50 $cm^3$) is added and the product extracted with dichloromethane (2×100 $cm^3$). The combined organics dried over anhydrous magnesium sulfate, filtered and the solvent removed in vacuo. The crude is purified by column chromatography (gradient from 40-60 petrol to 40-60 petrol:dichloromethane 7:3) to give intermediate 15

(2.30 g, 87%) as a yellow solid. $^1$H NMR ($CD_2Cl_2$, 400 MHz) 7.50 (2H, s), 7.36 (1H, s), 7.10-7.20 (16H, m), 7.07 (1H, s), 2.55-2.64 (8H, m), 1.54-1.66 (8H, m), 1.28-1.41 (24H, m), 0.86-0.95 (12H, m).

Intermediate 16

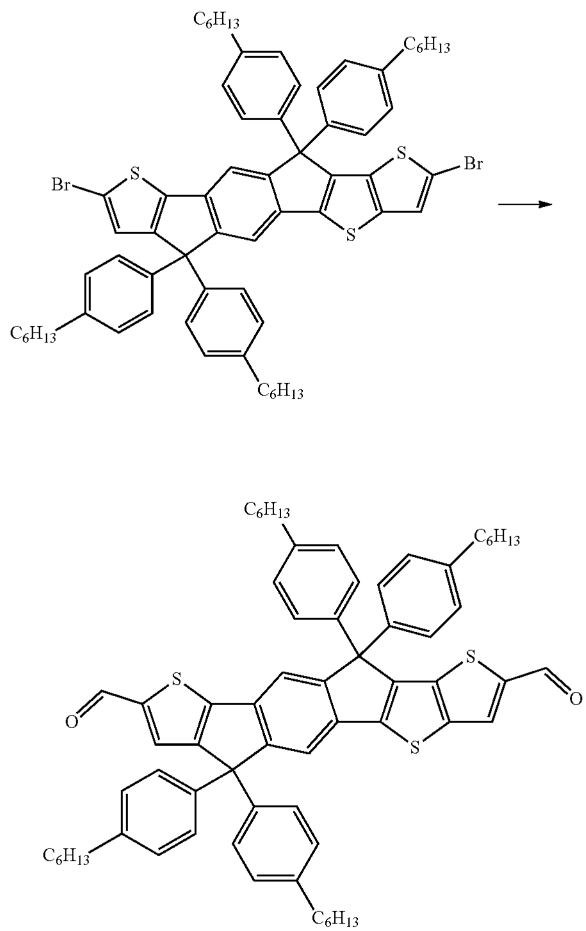

To a solution of intermediate 15 (1.00 g, 0.89 mmol) in anhydrous tetrahydrofuran (30 $cm^3$) at −78° C. is added dropwise n-butyllithium (1.1 $cm^3$, 2.7 mmol, 2.5 M in hexanes) over 20 minutes. The solution is then stirred at −78° C. for 1 hour before addition of anhydrous N,N-dimethylformamide (0.34 $cm^3$, 4.6 mmol). The reaction mixture is stirred and allowed to warm to 23° C. over 17 hours. Water (100 $cm^3$) is added and the product extracted with ether (3×50 $cm^3$). The organic layers are combined, dried over anhydrous magnesium sulfate, filtered and the solvent removed in vacuo. The crude is purified by column chromatography (gradient from 40-60 petrol to dichloromethane) to give intermediate 16 (220 mg, 24%) as a yellow solid. $^1$H NMR ($CD_2Cl_2$, 400 MHz) 9.92 (1H, s), 9.86 (1H, s), 8.01 (1H, s), 7.75 (1H, s), 7.71 (1H, s), 7.64 (1H, s), 7.12-7.22 (16H, m), 2.55-2.64 (8H, m), 1.51-1.66 (8H, m), 1.25-1.42 (24H, m), 0.85-0.95 (12H, m).

Compound 8

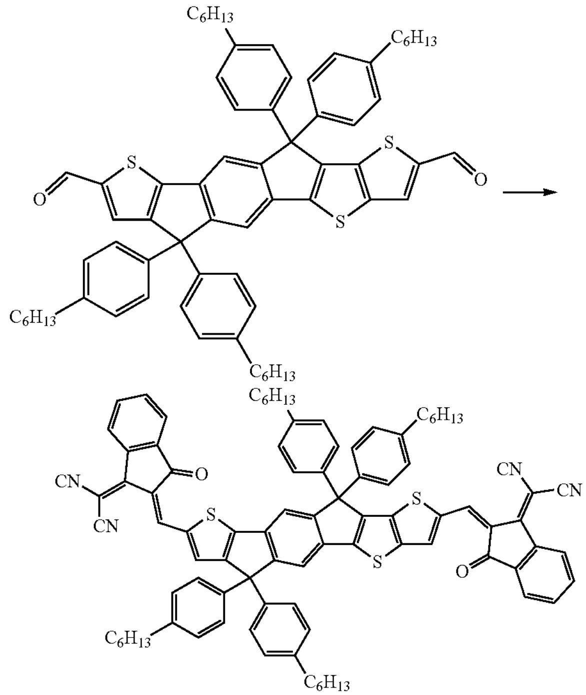

A solution of intermediate 16 (220 mg, 0.22 mmol), 2-(3-oxo-indan-1-ylidene)-malononitrile (293 mg, 1.51 mmol), chloroform (17 $cm^3$) and pyridine (1.2 g, 15 mmol) is degassed with nitrogen for 30 minutes and then heated at reflux for 3 hours. After cooling to 23° C., the mixture is poured into methanol (200 $cm^3$) and the resulting suspension filtered. The solid is washed with methanol (100 $cm^3$), ether (200 $cm^3$) and extracted with dichloromethane (250 $cm^3$). The solvent from the dichloromethane extract removed in vacuo and the residue purified by column chromatography (gradient from 40-60 petrol to 40-60 petrol:dichloromethane 3:7) to give compound 8 (243 mg, 82%) as a black solid. $^1$H NMR ($CD_2Cl_2$, 400 MHz) 8.88-8.93 (2H, m), 8.69-8.74 (2H, m), 8.26 (1H, s), 7.92-7.98 (2H, m), 7.90 (1H, s), 7.76-7.87 (5H, m), 7.69 (1H, s), 7.14-7.30 (16H, m), 2.57-2.66 (8H, m), 1.51-1.69 (8H, m), 1.25-1.42 (24H, m), 0.83-0.96 (12H, m).

Example 9

Intermediate 17

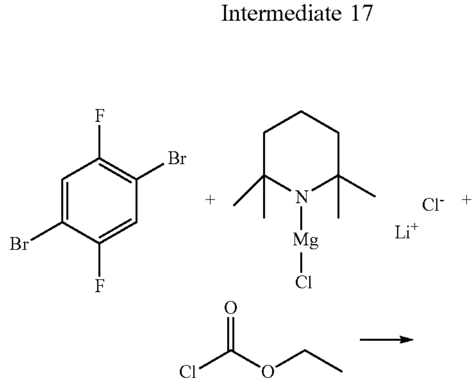

-continued

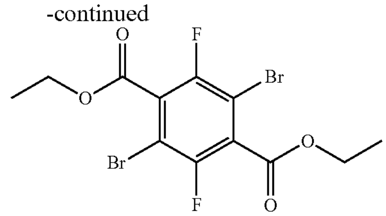

To a 1.0 M solution (tetrahydrofuran 1:1 toluene) of 2,2,6,6-tetramethylpiperidinylmagnesium chloride lithium chloride complex (200 $cm^3$, 200 mmol) at −30° C. under inert atmosphere is added dropwise a solution of 1,4-dibromo-2,5-difluoro-benzene (23.6 g, 86.8 mmol) in anhydrous tetrahydrofuran (150 $cm^3$) over 30 minutes. After addition, the reaction mixture is stirred at −30° C. for 7 hours before ethyl chloroformate (22.6 g, 208 mmol) is added in one go. The mixture is then allowed to warm to 23° C. over 17 hours. Aqueous hydrochloric acid (1.0 M, 500 $cm^3$) is added and the mixture stirred at 23° C. for 30 minutes. The product is extracted with diethyl ether (3×100 $cm^3$). The combined organics are dried over anhydrous magnesium sulfate, filtered and the solvent removed in vacuo. The crude product is triturated with n-pentane to form a suspension. The product is filtered and washed with cold acetone, collected and dried under vacuum to give intermediate 17 (12.0 g, 33%) as a white solid. $^1$H NMR (300 MHz, $CDCl_3$) 1.42 (6H, m), 4.49 (4H, q); $^{19}$F-NMR 108.72 (2F, s).

Intermediate 18

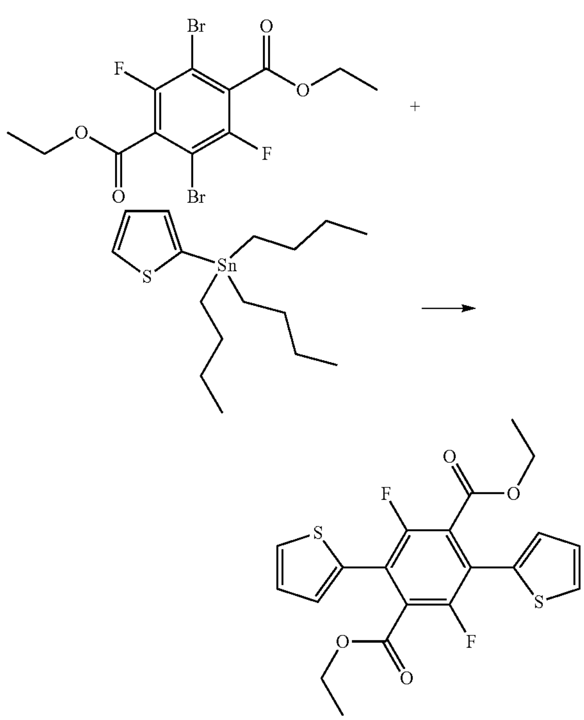

A mixture of intermediate 17 (2.8 g, 6.7 mmol), tributyl-thiophen-2-yl-stannane (6.0 g, 16 mmol), tri-o-tolyl-phosphine (164 mg, 0.54 mmol) and anhydrous toluene (150 $cm^3$) is degassed by nitrogen for 25 minutes. To the mixture is added tris(dibenzylideneacetone) dipalladium(0) (123 mg, 0.14 mmol) and the mixture further degassed for 15 minutes. The mixture is stirred at 100° C. for 17 hours and the solvent removed in vacuo. Dichloromethane (200 $cm^3$) and water (200 $cm^3$) is added and the mixture stirred at 23° C. for 30 minutes. The product is extracted with dichloromethane (3×100 $cm^3$). The combined organics are dried over anhydrous magnesium sulfate, filtered and the solvent removed in vacuo. The crude product is triturated with light petroleum ether to form a suspension. The product is filtered, collected and dried under vacuum to give intermediate 18 (2.45 g, 86%) as a pale yellow solid. $^1$H NMR (300 MHz, $CDCl_3$) 1.16 (6H, t, J 7.16), 4.23 (4H, q), 7.12 (2H, dd, J 5.1, 3.7), 7.21 (2H, dd, J 3.5, 0.9), 7.50 (2H, dd, J 5.1, 1.2).

Intermediate 19

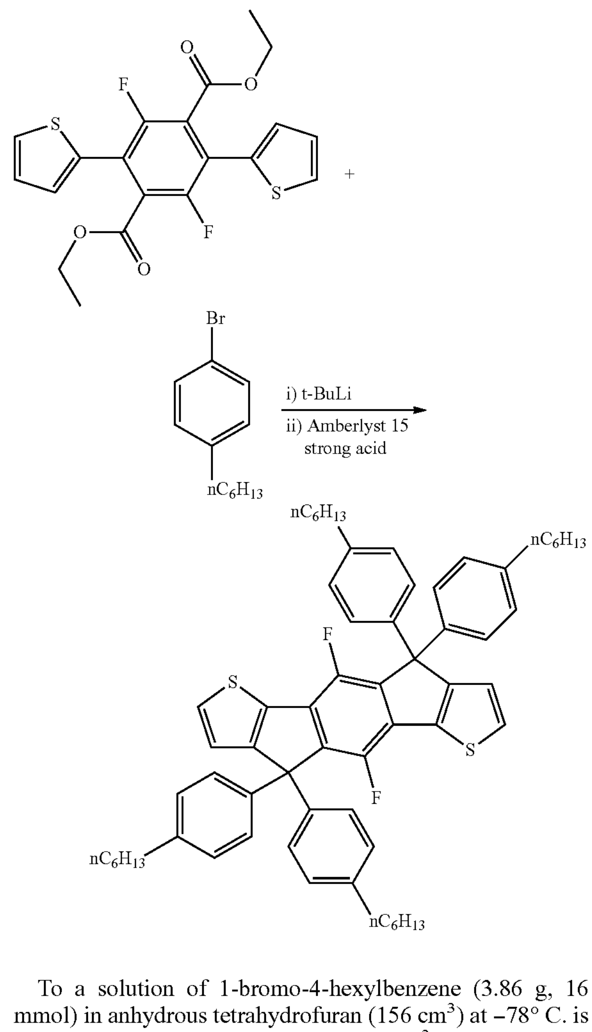

To a solution of 1-bromo-4-hexylbenzene (3.86 g, 16 mmol) in anhydrous tetrahydrofuran (156 $cm^3$) at −78° C. is added dropwise tert-butyllithium (18.8 $cm^3$, 32.0 mmol, 1.7 M in pentane) over 45 minutes. After addition, the reaction mixture is stirred at −78° C. for 20 minutes before it is warmed to −40° C. and stirred for 40 minutes. The mixture is cooled to −78° C. and intermediate 18 (1.4 g, 3.2 mmol) added in one go. The mixture is then allowed to warm to 23° C. over 17 hours. Diethyl ether (200 $cm^3$) and water (200 $cm^3$) is added and the mixture stirred at 23° C. for 30 minutes. The product is extracted with diethyl ether (3×100 $cm^3$). The combined organics are dried over anhydrous magnesium sulfate, filtered and the solvent removed in vacuo to obtain crude diol intermediate as a pale yellow oily residue. To a solution of crude diol in anhydrous diethyl ether (100 $cm^3$) is added amberlyst 15 strong acid (25.0 g). The resulting solution is stirred at 40° C. for 2 hours. The reaction mixture is allowed to cool to 23° C. and the solvent removed in vacuo. The crude is purified using silica gel column chromatography (40-60 petroleum ether). Fractions containing pure product are combined and the solvent removed in vacuo to give intermediate 19 (445 mg, 15%) as a cream solid. $^1$H NMR (400 MHz, $CD_2Cl_2$) 0.79 (12H, m) 1.10-1.32 (24H, m) 1.49 (8H, m) 2.34-2.62 (8H, m) 6.89 (2H, d, J 5.1) 6.93-7.14 (16H, m) 7.31 (2H, d, J 4.9).

Intermediate 20

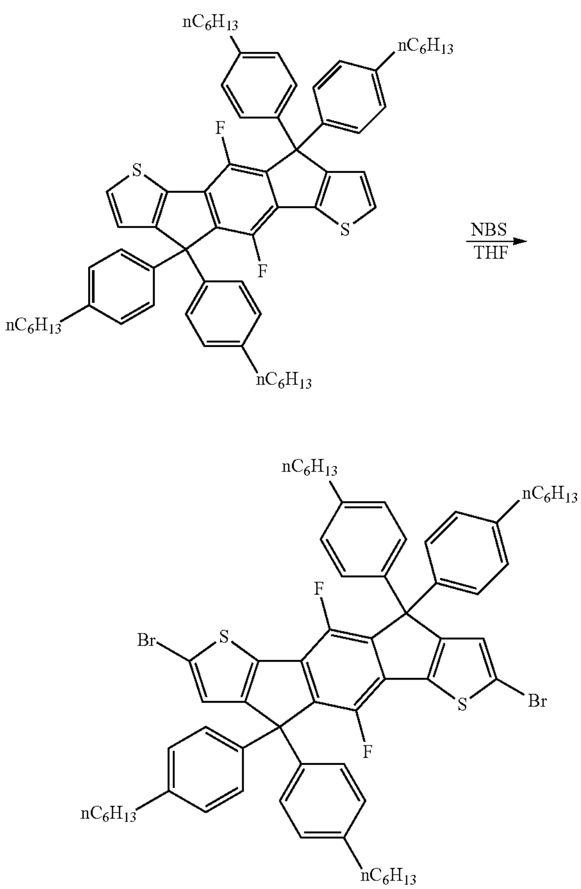

1-Bromo-pyrrolidine-2,5-dione (394 mg, 2.22 mmol) is added portion wise to a solution of intermediate 19 (510 mg, 0.54 mmol) in anhydrous tetrahydrofuran (50 $cm^3$) under a nitrogen atmosphere with absence of light at 0° C. After addition, the reaction mixture is stirred at 23° C. for 17 hours and then the reaction mixture is concentrated in vacuo. The residue is dissolved in warm 40-60 petroleum ether (20 $cm^3$ at 50° C.) and purified using silica gel column chromatography eluting with a mixture of 40-60 petroleum ether and diethyl ether (9:1). Fractions containing pure product are combined and the solvent removed in vacuo to give intermediate 20 (590 mg, 99%) as a pale yellow crystalline solid.

$^1$H NMR (400 MHz, $CDCl_3$) 0.74-0.87 (12H, m) 1.13-1.33 (24H, m) 1.44-1.60 (8H, m) 2.42-2.58 (8H, m) 6.89 (2H, s) 6.96-7.14 (16H, m).

Intermediate 21

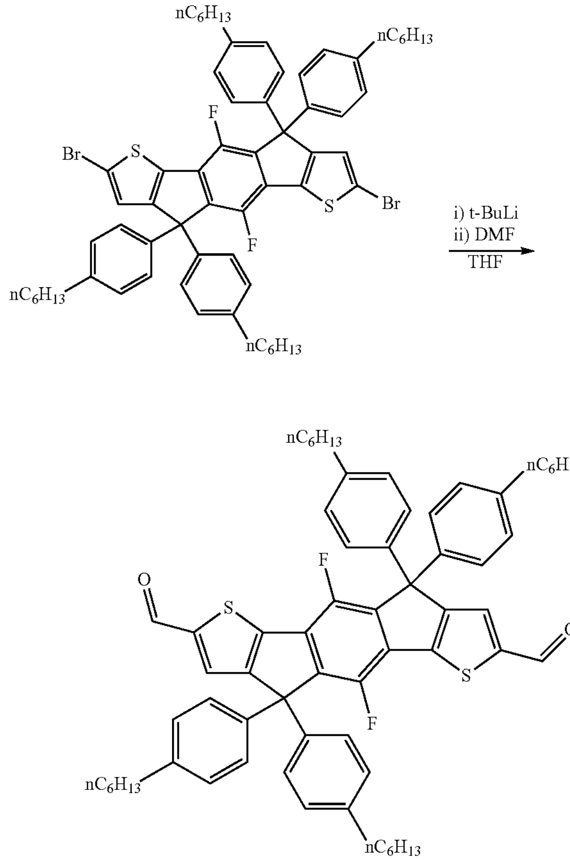

To a solution of intermediate 20 (550 mg, 0.50 mmol) in anhydrous tetrahydrofuran (20 $cm^3$) at −78° C. is added dropwise n-butyllithium (0.6 $cm^3$, 1.5 mmol, 2.5 M in hexane) over 15 minutes. After addition, the reaction mixture is stirred at −78° C. for 60 minutes and N,N-dimethylformamide (0.19 $cm^3$, 2.5 mmol) added in one go. The mixture is then allowed to warm to 23° C. over 17 hours. Dichloromethane (200 $cm^3$) and water (200 $cm^3$) is added and the mixture stirred at 23° C. for 30 minutes. The product is extracted with dichloromethane (3×100 $cm^3$). The combined organics are dried over anhydrous magnesium sulfate, filtered and the solvent removed in vacuo to obtain an oily residue. The crude is triturated with ethanol (40 $cm^3$) to produce a heavy suspension. The solid collected by filtration and washed well with ethanol to give intermediate 21 (110 mg, 22%) as a grey solid. $^1$H NMR (400 MHz, $CDCl_3$) 0.70-0.90 (12H, m) 1.08-1.21 (24H, m) 1.23-1.55 (8H, m) 2.38-2.62 (8H, m) 6.95-7.15 (16H, m) 7.55 (2H, s) 9.77 (2H, s).

Compound 9

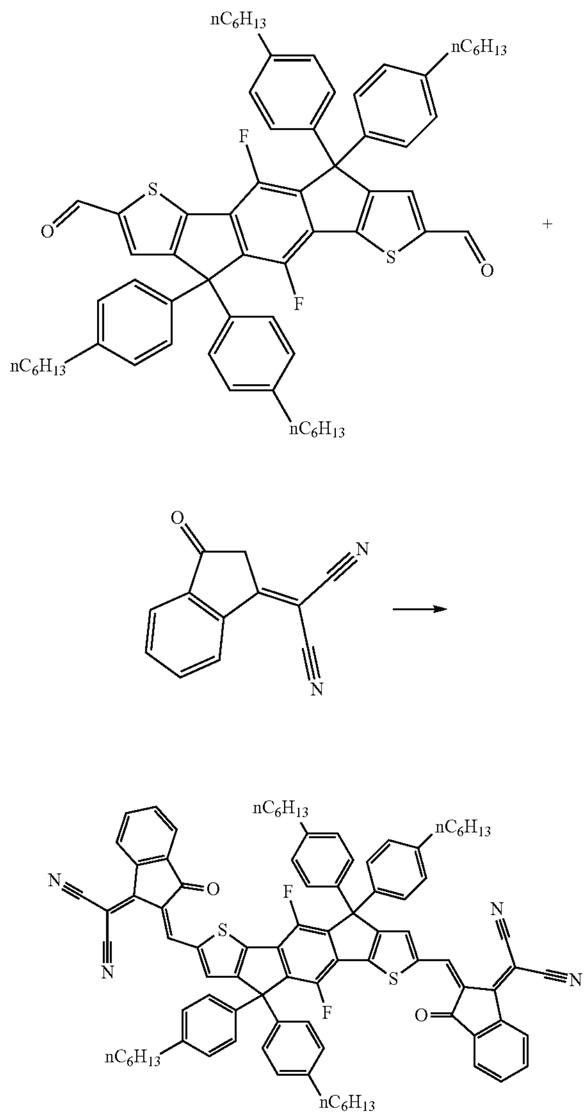

To a solution of intermediate 21 (110 mg, 0.11 mmol) in anhydrous chloroform (13 $cm^3$) is added pyridine (0.6 $cm^3$, 8 mmol). The mixture is then degassed with nitrogen before 3-(dicyanomethylidene) indan-1-one (150 mg, 0.77 mmol) is added. The solution is then further degassed and stirred at 23° C. for 20 minutes. The mixture is stirred at 60° C. for 17 hours. The solvent is removed in vacuo abd the crude is triturated with ethanol (150 $cm^3$) at 60° C. to produce a heavy suspension. The crude is purified using silica gel column chromatography (dichloromethane). Fractions containing pure product are combined and the solvent removed in vacuo to give Compound 9 (120 mg, 81%) as a dark blue solid. $^1$H NMR (400 MHz, $CDCl_3$) 0.80 (12H, m) 1.10-1.35 (24H, m) 1.54 (8H, m) 2.52 (8H, m) 6.99-7.16 (16H, m) 7.55-7.73 (6H, m) 7.77-7.92 (2H, m) 8.61 (2H, d, J 7.3) 8.78 (2H, s).

Example 10

Intermediate 22

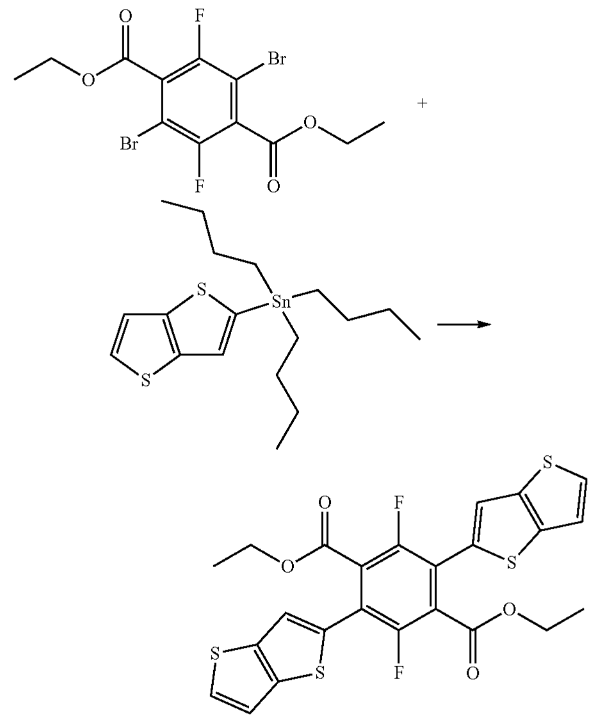

5-Dibromo-3,6-difluoro-terephthalic acid diethyl ester (10.7 g, 25.7 mmol), tributyl-thieno[3,2-b]thiophen-2-yl-stannane (32.4 g; 64.2 mmol) and tri(o-tolyl)-phosphine (63 mg, 0.21 mmol) are dissolved in toluene (43 $cm^3$) and degassed with nitrogen. Bis(dibenzylidene-acetone)palladium(0) (300 mg, 0.51 mmol) is added and the reaction heated to 130° C. externally for 5 hours. The reaction mixture is concentrated in vacuo, dissolved in hot dichloromethane (500 $cm^3$) and filtered through a silica pad. The filtrate is concentrated, suspended in 40-60 petrol and filtered. The filter cake is washed with petrol (3×20 $cm^3$). The resulting solid is recrystallized (chloroform/methanol) to give intermediate 22 (7.45 g, 54%) as a pale yellow solid. $^1$H NMR (400 MHz, $CDCl_3$) 1.14 (6H, t), 4.27 (4H, q), 7.29 (2H, q), 7.40 (2H, d), 7.45 (2H, d).

Intermediate 23

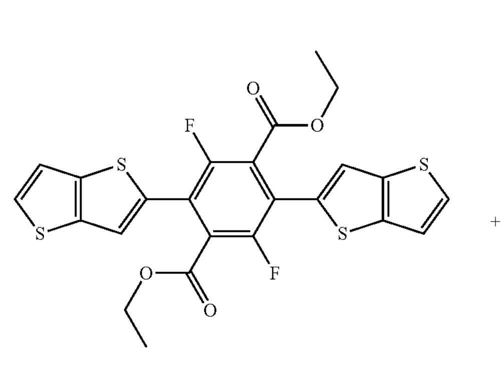

-continued

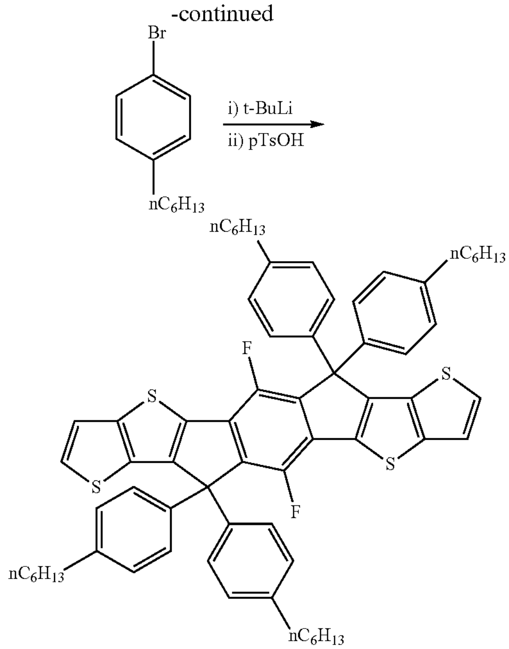

1-Bromo-4-hexyl-benzene (11.3 g, 46.8 mmol) is dissolved in anhydrous tetrahydrofuran (200 $cm^3$) and placed in a cooling bath at −78° C. T-butyllithium (55.0 $cm^3$, 93.5 mmol) is added dropwise over 10 minutes and the solution stirred for 40 minutes. Warmed to between −45° C. and −50° C. for 30 minutes. 2,5-Difluoro-3,6-bis-thieno[3,2-b]thiophen-2-yl-terephthalic acid diethyl ester (5.00 g, 9.35 mmol) is added as a single portion, the resulting suspension maintained at −40° C. to −50° C. for 70 minutes before slowly warming to 23° C. stirring over 17 hours. The reaction is quenched with water (100 $cm^3$), extracted with ether (2×200 $cm^3$) and the combined extracts dried over magnesium sulphate, filtered and concentrated in vacuo. The oil is dissolved in toluene (100 $cm^3$) and degassed with nitrogen for 15 minutes. P-toluenesulphonic acid (3 g) is added and the reaction heated to 80° C. for 6 hours. The reaction mixture is concentrated in vacuo, passed through a silica plug eluting with 40-60 petrol and then dichloromethane to give intermediate 23 as a yellow solid (250 mg, 2.5%). $^1H$ NMR (400 MHz, $CD_2Cl_2$) 0.90 (12H, m), 1.33 (24H, m), 1.62 (8H, m), 2.61 (8H, m), 7.16 (8H, d), 7.25 (8H, d), 7.38 (4H, m). $^{19}F$ NMR 126.4 (2F, s).

Intermediate 24

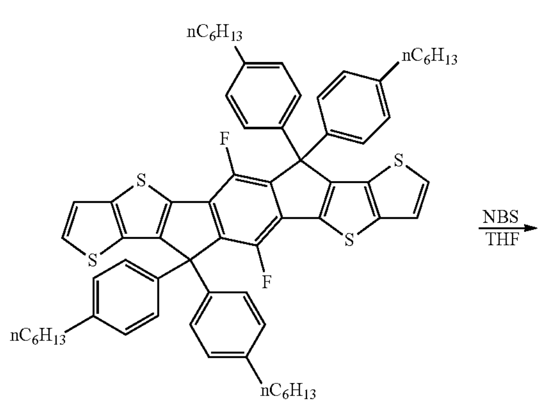

-continued

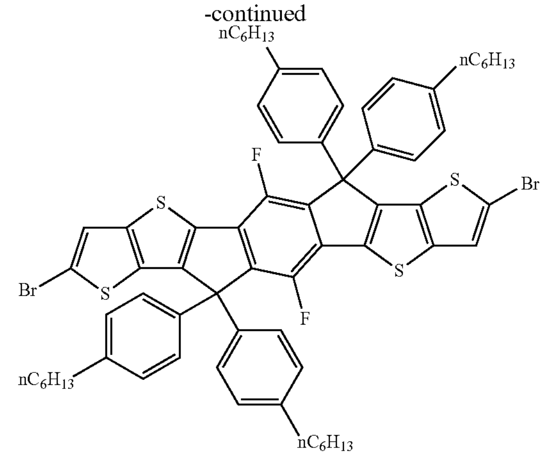

Intermediate 23 (350 mg, 0.33 mmol) is dissolved in tetrahydrofuran (50 $cm^3$), cooled to 0° C. and 1-bromopyrrolidine-2,5-dione (130 mg, 0.73 mmol) added portionwise. The reaction is allowed to warm to 23° C. and stirred over 17 hours. The reaction is concentrated in vacuo to dryness and triturated in methanol (2×10 $cm^3$), filtered and washed with methanol (2×5 $cm^3$) to give intermediate 24 as a yellow solid (257 mg, 64%). $^1H$ NMR (400 MHz, $CDCl_3$) 0.87 (12H, t), 1.26-1.35 (24H, m), 1.56 (8H, m), 2.57 (8H, t), 7.10 (8H, d), 7.17 (8H, d), 7.29 (2H, s).

Intermediate 25

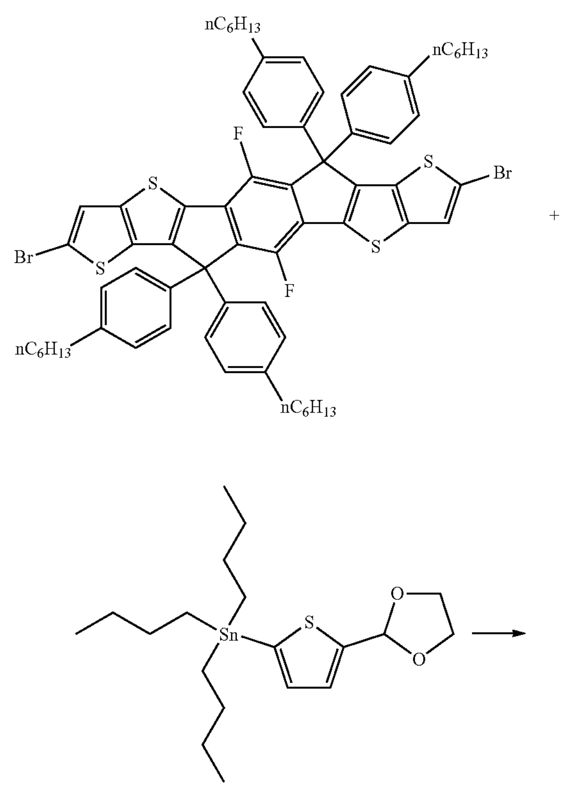

-continued

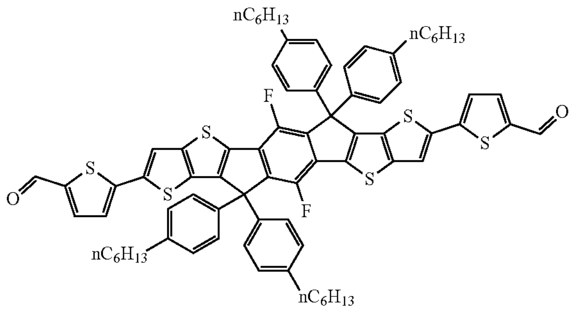

Intermediate 24 (120 mg, 0.10 mmol), tributyl-(5-[1,3] dioxolan-2-yl-thiophen-2-yl)-stannane (0.11 cm$^3$, 0.23 mmol), tris(o-tolyl)phosphine (9 mg, 0.03 mmol) and toluene (18 cm$^3$, 170 mmol) are combined and purged with nitrogen. Tris(dibenzylideneacetone) dipalladium(0) (7 mg, 0.01 mmol) is added, the reaction purged with nitrogen and heated to 140° C. externally over 17 hours. The reaction mixture is concentrated in vacuo, dissolved in 1:1 40-60 petrol:dichloromethane and passed through a silica plug. The resulting yellow solution is concentrated then dissolved in tetrahydrofuran (15 cm$^3$), 2N hydrochloric acid (5 cm$^3$) is added, and the concentrated in vacuo and purified by column chromatography (gradient from 40-60 petrol to dichloromethane) to give intermediate 25 as an orange solid (99 mg, 79%). $^1$H NMR (400 MHz, $CDCl_3$) 0.88 (12H, t), 1.28-1.39 (24H, m), 1.60 (8H, m), 2.60 (8H, t), 7.16 (8H, d), 7.24 (10H, m), 7.60 (2H, s) 7.67 (2H, d) 9.87 (2H, s). $^{19}$F-NMR 124.76 (2F, s).

Compound 10

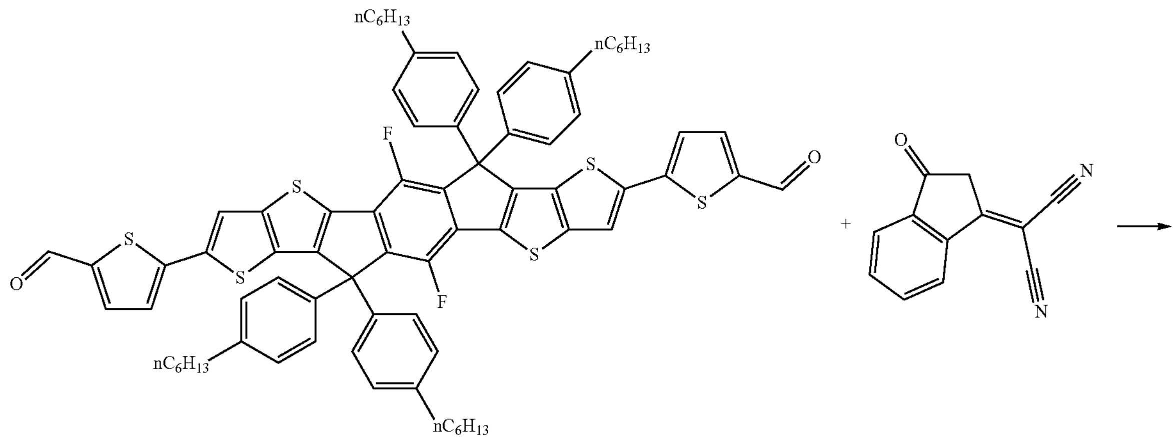

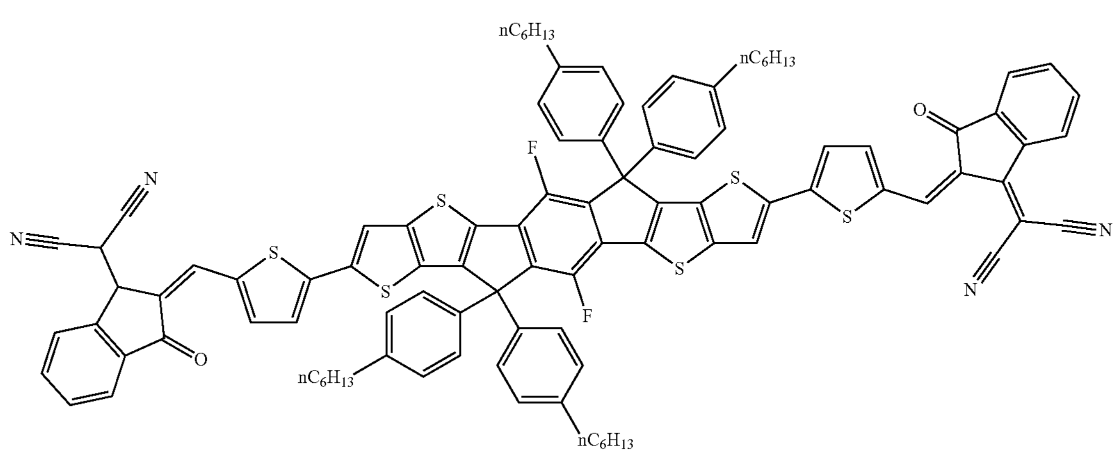

Intermediate 25 (99 mg, 0.08 mmol) is dissolved in anhydrous trichloromethane (8.3 cm$^3$), pyridine (0.4 cm$^3$, 5.4 mmol) is added and the solution purged with nitrogen. 2-(3-Oxo-indan-1-ylidene)-malononitrile (105 mg, 0.54 mmol) is then added. The reaction is purged with nitrogen and stirred at 23° C. for 2 hours, poured onto methanol (100 cm$^3$) and filtered. The filter cake is washed with methanol affording Compound 10 as a blue/black solid (98 mg, 77%)$^1$H NMR (400 MHz, $CDCl_3$) 0.79 (12H, t) 1.19-1.26 (24H, cm), 1.48-1.58 (8H, m), 2.52 (8H, t), 7.06 (8H, d), 7.17 (8H, m), 7.25 (2H, d) 7.68-7.70 (4H, m) 7.86 (2H, d) 8.62 (2H, d) 8.76 (2H, s). $^{19}$F-NMR 124.41 (2F, s).

Example 11

Intermediate 26

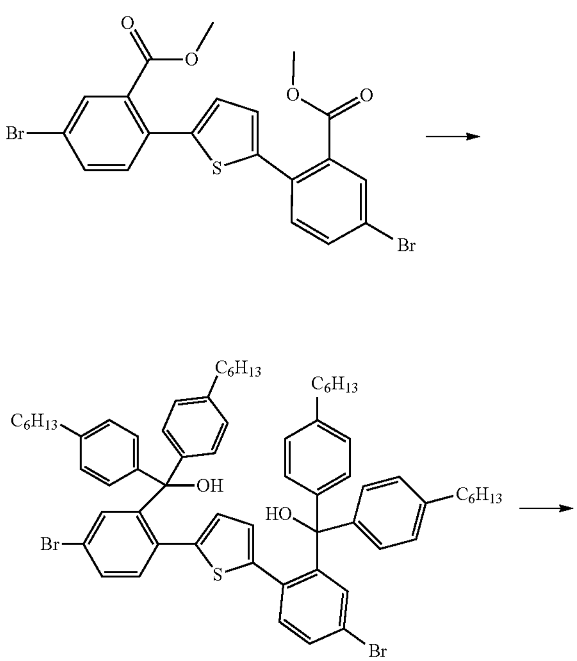

-continued

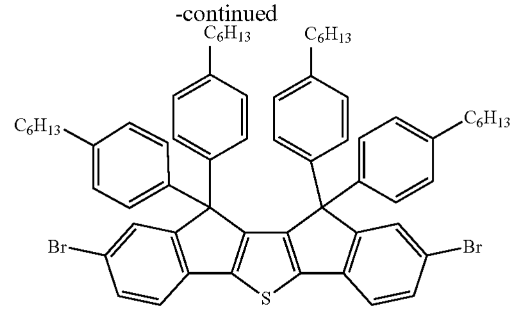

To a solution of 1-bromo-4-hexyl-benzene (6.24 g, 25.9 mmol) in anhydrous tetrahydrofuran (69 cm$^3$) at −78° C., n-butyllithium (10 cm$^3$, 25 mmol, 2.5 M in hexane) is added dropwise over 10 minutes. The reaction is allowed to stir at −78° C. for 80 minutes, before intermediate 1 (1.65 g, 3.23 mmol) is added in one portion. The reaction mixture is stirred at 23° C. for 17 hours, quenched by the addition of water (100 cm$^3$) and stirred for 72 hours. The reaction is then extracted with ethyl acetate (2×50 cm$^3$) and the combined organic extracts washed with water (100 cm$^3$), extracting the aqueous layer with additional ethyl acetate (25 cm$^3$). The combined organic extracts are further washed with brine (100 cm$^3$), again extracting the aqueous layer with additional ethyl acetate (50 cm$^3$), before drying the combined organic extracts over anhydrous magnesium sulfate, filtered and the solvent removed in vacuo. Partial purification is by column chromatography eluting with a graded solvent system (40-60 petrol:dichloromethane; 4:1 to 3:2) to give the intermediate which is taken up in dichloromethane (125 cm$^3$) and the mixture degassed. Toluene-4-sulfonic acid monohydrate (955 mg, 5.02 mmol) is added and the reaction heated at reflux for 17 hours, before cooling to 23° C. diluting with water (100 cm$^3$). The organics are extracted with dichloromethane (2×25 cm$^3$) and the combined organic extracts washed with brine (100 cm$^3$) and the residual aqueous layer extracted with dichloromethane (25 cm$^3$). The combined organic extracts are then dried over anhydrous magnesium sulfate, filtered and the solvent removed in vacuo. Purification is by column chromatography eluting with a graded solvent system (40-60 petrol:dichloromethane; 1:0 to 3:1) followed by a further second column chromatography (40-60 petrol) purification to give intermediate 26 (902 mg, 26%) as a white crystalline solid. $^1$H NMR (400 MHz, $CDCl_3$) 7.31 (2H, dd, J 8.1, 1.4), 7.24 (2H, d, J 8.1), 7.17 (2H, d, J 1.2), 6.69-6.76 (8H, m), 6.57-6.63 (8H, m), 2.35-2.49 (8H, m), 1.47-1.55 (8H, m), 1.26-1.38 (24H, m), 0.86-0.94 (12H, m).

Intermediate 27

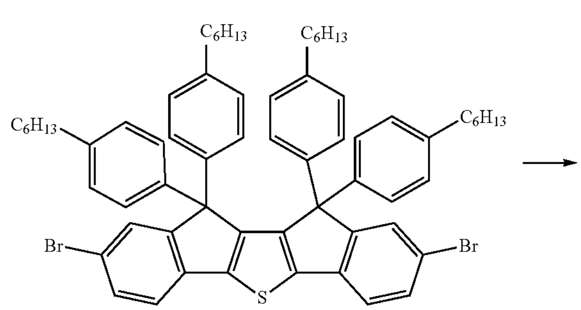

-continued

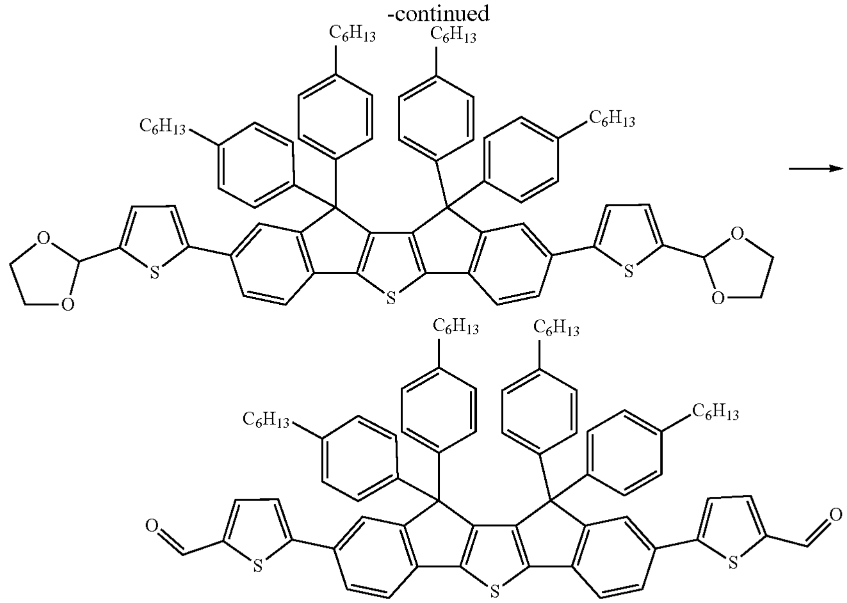

An oven dried nitrogen flushed flask is charged with intermediate 26 (902 mg, 0.85 mmol) and anhydrous toluene (150 $cm^3$). Tributyl-(5-[1,3]dioxolan-2-yl-thiophen-2-yl)-stannane (0.93 $cm^3$, 2.0 mmol) is added. The solution is degassed with nitrogen for 30 minutes before tris(dibenzylideneacetone)dipalladium (62 mg, 0.07 mmol) and tri(o-tolyl)phosphine (78 mg, 0.26 mmol) are added and the degassing continued for a further 30 minutes. The reaction mixture is heated at 80° C. for 17 hours before concentration in vacuo. The resulting solid is triturated with methanol (5×10 $cm^3$) and collected by filtration to give the intermediate which is used without further purification. To a stirred solution of the intermediate in anhydrous tetrahydrofuran (81 $cm^3$) at 23° C., concentrated hydrochloric acid (0.65 $cm^3$, 5.7 mmol, 32%) is added dropwise. After 50 minutes, water (2.0 $cm^3$) is added and the reaction mixture stirred for a further 1 hour. The reaction mixture is then diluted with water (125 $cm^3$) and extracted with dichloromethane (4×25 $cm^3$). The combined organic extracts are then washed with brine (100 $cm^3$), additionally extracting the aqueous layer with dichloromethane (2×25 $cm^3$). The combined organic extracts are dried over anhydrous magnesium sulfate, filtered and the solvent removed in vacuo. Purification by column chromatography eluting with a graded solvent system (40-60 petrol:dichloromethane; 7:3 to 2:3) gives intermediate 27 (586 mg, 61%) as an orange solid. $^1$H NMR (400 MHz, $CDCl_3$) 9.82 (2H, s), 7.64 (2H, d, J 3.9), 7.54 (2H, dd, J 8.0, 1.6), 7.44 (2H, d, J 8.3), 7.35 (2H, d, J 1.2), 7.24 (2H, d, J 3.9), 6.79 (8H, d, J 8.3), 6.63 (8H, d, J 8.3), 2.35-2.49 (8H, m), 1.47-1.56 (8H, m), 1.26-1.37 (24H, m), 0.85-0.92 (12H, m).

Compound 11

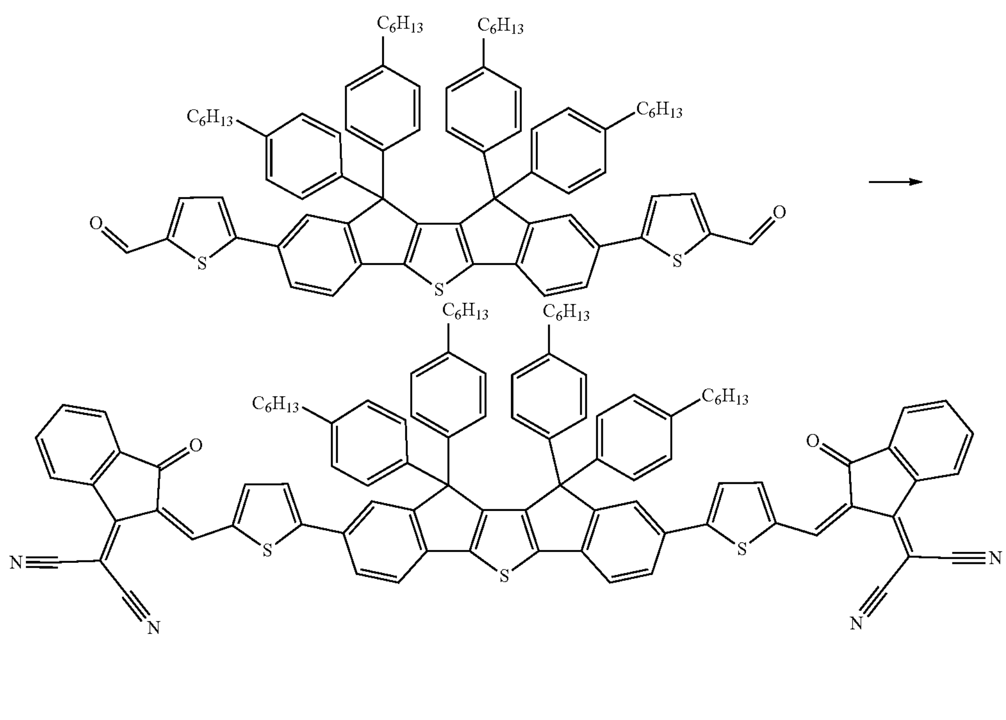

To a solution of intermediate 27 (535 mg, 0.48 mmol) in anhydrous chloroform (51 $cm^3$) is added pyridine (2.7 $cm^3$, 33 mmol). The mixture is degassed with nitrogen for 20 minutes before 3-(dicyanomethylidene)indan-1-one (648 mg, 3.34 mmol) is added. The resulting solution is degassed for a further 10 minutes before stirring for 3 hours. The reaction mixture is then added to stirred methanol (500 $cm^3$), washing in with additional methanol (25 $cm^3$) and dichloromethane (25 $cm^3$). The precipitate is collected by filtration and washed with methanol (5×10 $cm^3$), warm methanol (5×10 $cm^3$), 40-60 petrol (3×10 $cm^3$), diethyl ether (3×10 $cm^3$), 80-100 petrol (3×10 $cm^3$) and acetone (3×10 $cm^3$) to give Compound 11 (645 mg, 92%) as a blue/black solid. $^1H$ NMR (400 MHz, $CDCl_3$) 8.77 (2H, s), 8.64-8.70 (2H, m), 7.89-7.94 (2H, m), 7.71-7.79 (6H, m), 7.61 (2H, dd, J 8.1, 1.7), 7.44 (2H, d, J 1.5), 7.38 (2H, d, J 8.1), 7.29 (2H, d, J 4.2), 6.85 (8H, d, J 8.3), 6.68 (8H, d, J 8.3), 2.38-2.52 (8H, m), 1.49-1.60 (8H, m), 1.24-1.40 (24H, m), 0.88 (12H, t, J 6.9).

Example 12

Intermediate 28

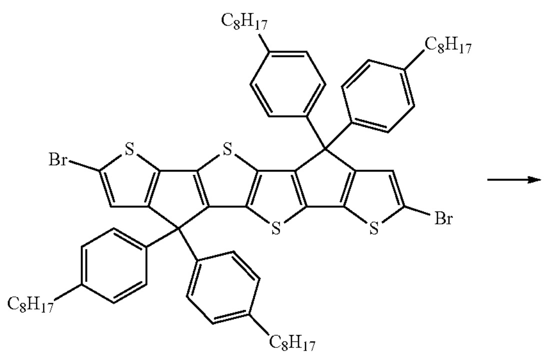

-continued

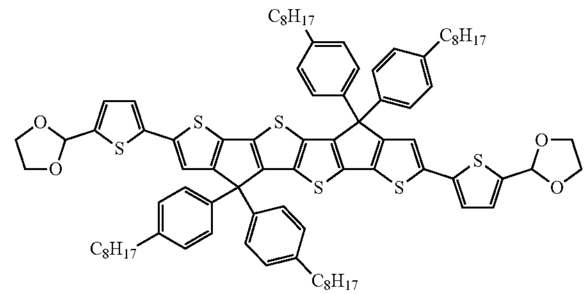

To a solution of 2,7-dibromo-4,4,9,9-tetrakis(4-octylphenyl)-4,9-dihydro-thieno[3',2':4,5]cyclopenta[1,2-b]thieno[2",3":3',4']cyclopenta[1',2':4,5]thieno[2,3-d]thiophene (500 mg, 0.34 mmol) in anhydrous toluene (150 $cm^3$) is added tributyl-(5-[1,3]dioxolan-2-yl-thiophen-2-yl)-stannane (0.88 $cm^3$, 1.94 mmol) before the solution is degassed with nitrogen. Tris(dibenzylideneacetone)dipalladium (59 mg, 0.03 mmol) and tris(o-tolyl)phosphine (74 mg, 0.24 mmol) are then added and after additional degassing, the reaction mixture is heated at 80° C. for 17 hours. The reaction mixture is then concentrated in vacuo and triturated with methanol (5×20 $cm^3$) collecting the solid by filtration to give intermediate 28 (1.1 g, 99%) as an orange solid. $^1H$ NMR (400 MHz, $CDCl_3$) 7.12-7.19 (10H, m), 7.09 (8H, d, J 7.8), 7.00-7.05 (4H, m), 6.08 (2H, s), 4.08-4.17 (4H, m), 3.99-4.08 (4H, m), 2.56 (8H, t, J 7.8), 1.52-1.63 (8H, m), 1.22-1.35 (40H, m), 0.87 (12H, t, J 6.5).

Intermediate 29

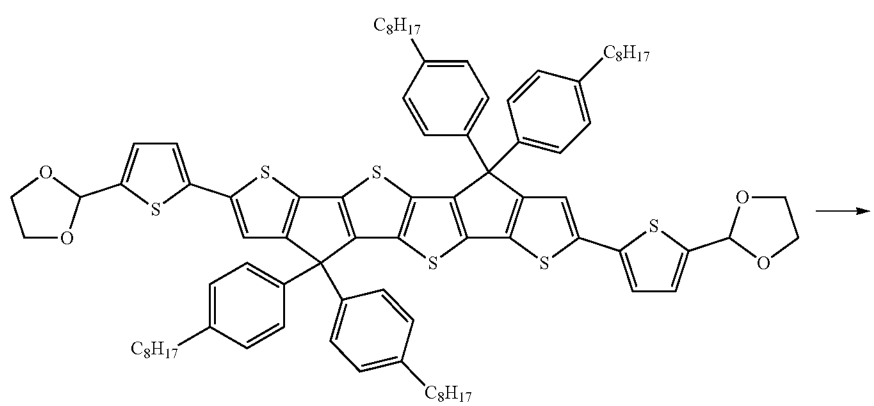

-continued

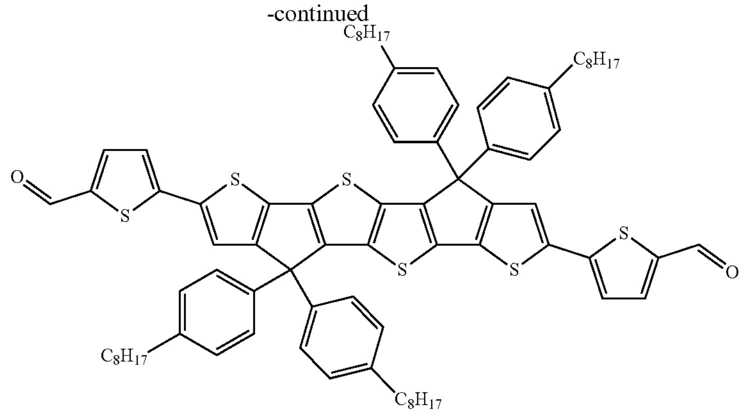

Concentrated hydrochloric acid (0.5 $cm^3$, 4.07 mmol, 32%) is added dropwise to a solution of intermediate 28 (1.1 g, 0.81 mmol) in tetrahydrofuran (57 $cm^3$) at 23° C. and the reaction mixture stirred for 1 hour. Water (0.5 $cm^3$) is then added and the reaction mixture stirred for a further 17 hours. Additional water (100 $cm^3$) is then added and the solution extracted with ethyl acetate (50 $cm^3$ then 25 $cm^3$). The combined organic extracts are then washed with water (50 $cm^3$) and brine (50 $cm^3$), extracting the aqueous layer each time with additional ethyl acetate (20 $cm^3$). The combined organic extracts are then dried over anhydrous magnesium sulfate, filtered and concentrated in vacuo. The crude product is then triturated with methanol (3×15 $cm^3$) with collection by filtration and the solid washed with 40-60 petrol (3×15 $cm^3$) to give intermediate 29 (291 mg, 28%) as an orange solid. $^1$H NMR (400 MHz, $CDCl_3$) 9.83 (2H, s), 7.64 (2H, d, J 3.9), 7.32 (2H, s), 7.20 (2H, d, J 3.9), 7.16 (8H, d, J 8.1), 7.11 (8H, d, J 8.0), 2.57 (8H, t, J 7.6), 1.54-1.64 (8H, m), 1.20-1.38 (40H, m), 0.82-0.92 (12H, m).

Compound 12

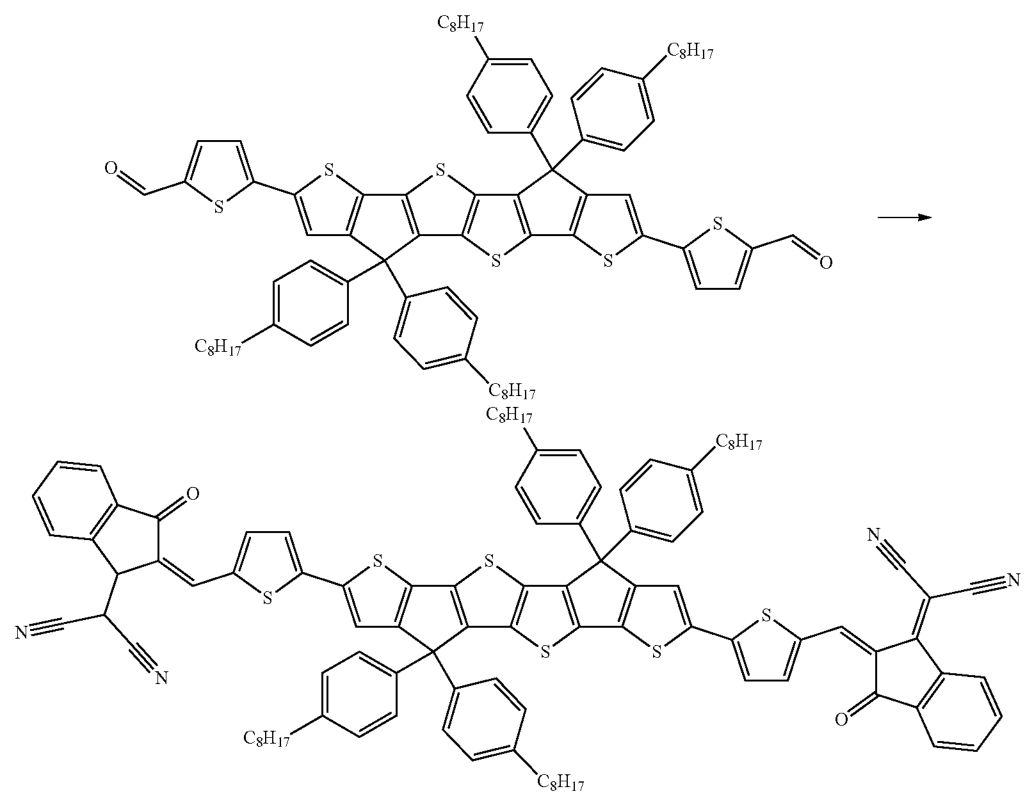

To a solution of intermediate 29 (287 mg, 0.22 mmol) in anhydrous chloroform (23 $cm^3$) is added pyridine (1.3 $cm^3$, 16 mmol). The mixture is then degassed with nitrogen before 3-(dicyanomethylidene)indan-1-one (300 mg, 1.54 mmol) is added. The solution is then further degassed and stirred at 23° C. for 3.25 hours. The reaction mixture is then added to methanol (300 $cm^3$), the mixture concentrated in vacuo and the resulting solid triturated with methanol (3×25 $cm^3$) with collection by filtration. The filtered solid is then washed with diethyl ether (2×10 $cm^3$) and acetone (3×10 cm$^3$). The partially purified product is then subjected to column chromatography, eluting with a graded solvent system (40-60 petrol:dichloromethane; 9.5:0.5 to 2:3) to give Compound 12 (86 mg, 24%) as a green/black solid. $^1$H NMR (400 MHz, $CDCl_3$) 8.83 (2H, s), 8.69 (2H, d, J 7.6), 7.92 (2H, d, J 6.6), 7.69-7.79 (6H, m), 7.54 (2H, s), 7.29 (2H, d, J 4.4), 7.11-7.20 (16H, m), 2.59 (8H, t, J 7.7), 1.58-1.64 (8H, m), 1.21-1.38 (40H, m), 0.87 (12H, t, J 6.5).

Example 13

Intermediate 30

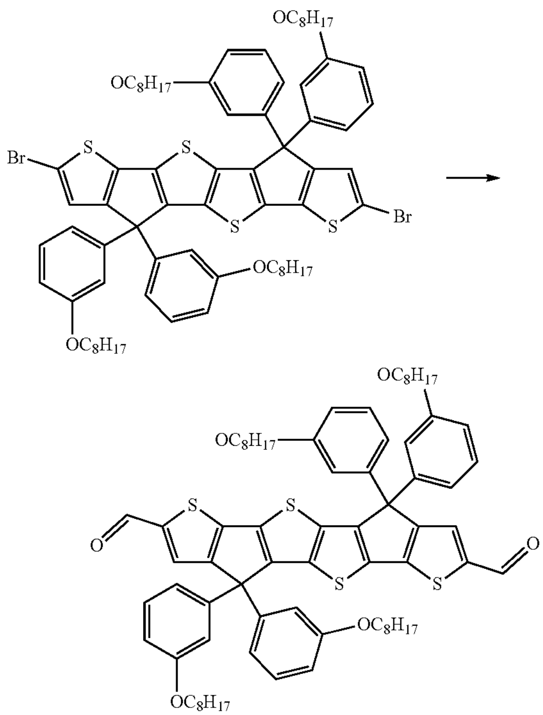

To a solution of 2,7-dibromo-4,4,9,9-tetrakis(3-octylphenyl)-4,9-dihydro-thieno[3',2':4,5]cyclopenta[1,2-b]thieno[2",3":3',4']cyclopenta[1',2':4,5]thieno[2,3-d]thiophene (1.00 g, 0.77 mmol) in tetrahydrofuran (25 cm$^3$) cooled to −78° C. is added dropwise n-butyllithium (0.92 cm$^3$, 2.30 mmol, 2.5 M in hexanes). The reaction is stirred for one hour and quenched with N,N-dimethylformamide (1.13 cm$^3$, 23.0 mmol) in a single portion. The reaction is warmed to 23° C. and stirred for 18 hours. The mixture is quenched with water (50 cm$^3$) and extracted with dichloromethane (3×30 cm$^3$). The resulting combined organic phase is washed with water (2×20 cm$^3$), dried over anhydrous magnesium sulfate, filtered and concentrated in vacuo. The crude is purified by flash chromatography eluting with a graded solvent system (40-60 petrol:dichloromethane; 6:4 to 4:6) to give intermediate 30 (330 mg, 36%) as an orange oil. $^1$H NMR (400 MHz, $CDCl_3$) 9.73 (2H, s), 7.62 (2H, s), 7.14 (4H, t, J 8.0), 6.65-6.77 (m, 12H), 3.80 (8H, t, J 6.6), 1.58-1.69 (8H, m), 1.27-1.38 (8H, m), 1.01-1.30 (32H, m), 0.71-0.87 (12H, m).

Compound 13

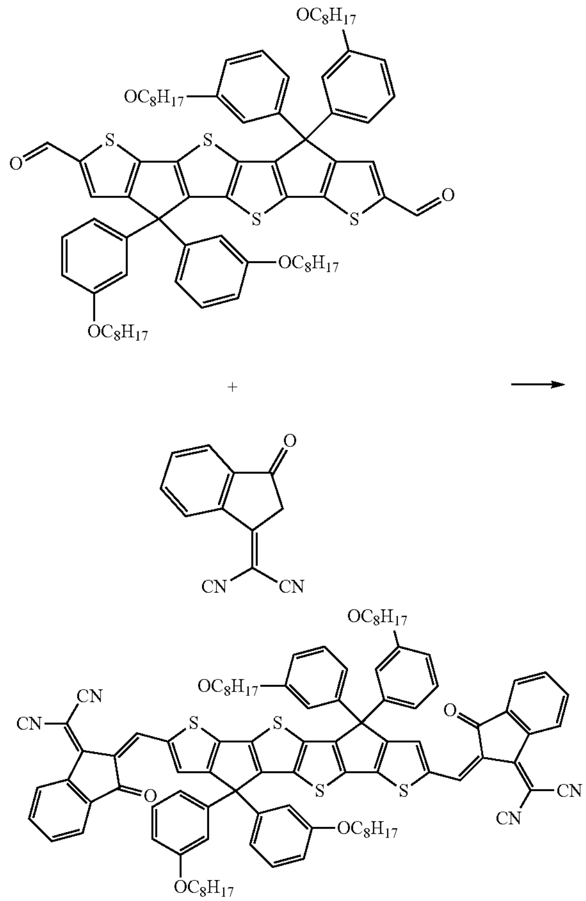

To a degassed solution of intermediate 30 (330 mg, 0.27 mmol) and 3-(dicyanomethylidene)indan-1-one (373 mg, 1.92 mmol) in chloroform (8.25 cm$^3$) is added pyridine (0.55 cm$^3$, 6.86 mmol) and the mixture stirred at 23° C. for 2 hours. Methanol (50 cm$^3$) is added and the resulting suspension filtered and washed with methanol (3×20 cm$^3$). The resulting solid is purified by column chromatography eluting with a graded solvent system (40-60 petrol:dichloromethane; 1:1 to 3:7) to give compound 13 (321 mg, 75%) as a blue solid. $^1$H NMR (400 MHz, $CDCl_3$) 8.79 (2H, s), 8.53-8.67 (2H, m), 7.83 (2H, m), 7.61-7.73 (6H, m), 7.18 (4H, m), 6.67-6.81 (12H, m), 3.83 (8H, t, J 6.7), 1.68 (8H, m), 1.33 (8H, m), 1.12-1.29 (32H, m), 0.78 (12H, t, J 6.7).

Example 14

Intermediate 31

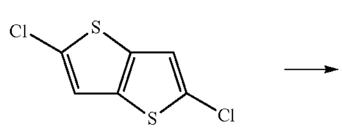

-continued

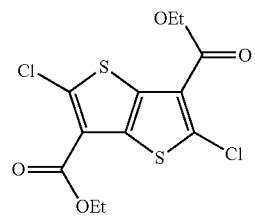

To a solution of 2,5-dichloro-thieno[3,2-b]thiophene (17.3 g, 82.7 mmol) in anhydrous tetrahydrofuran (173 $cm^3$) at 5° C. is added ethyl chloroformate (23.7 $cm^3$, 248 mmol). A solution of 2,2,6,6-tetramethylpiperidinylmagnesium chloride lithium chloride complex (207 $cm^3$; 207 mmol, 1.0 M in tetrahydrofuran) is then added dropwise over 1 hour. The reaction is slowly warmed to 23° C. and stirred for 42 hours. Water (200 $cm^3$) is added, the mixture stirred for 10 minutes and the solid collected by filtration and washed with water (2×100 $cm^3$). The solid is triturated in acetone (200 $cm^3$), the solid collected by filtration and washed with acetone (2×100 $cm^3$) to give intermediate 31 (26.6 g, 91%) as a white solid. $^1$H NMR (400 MHz, $CDCl_3$) 4.46 (4H, q, J 7.1), 1.47 (6H, t, J 7.1).

Intermediate 32

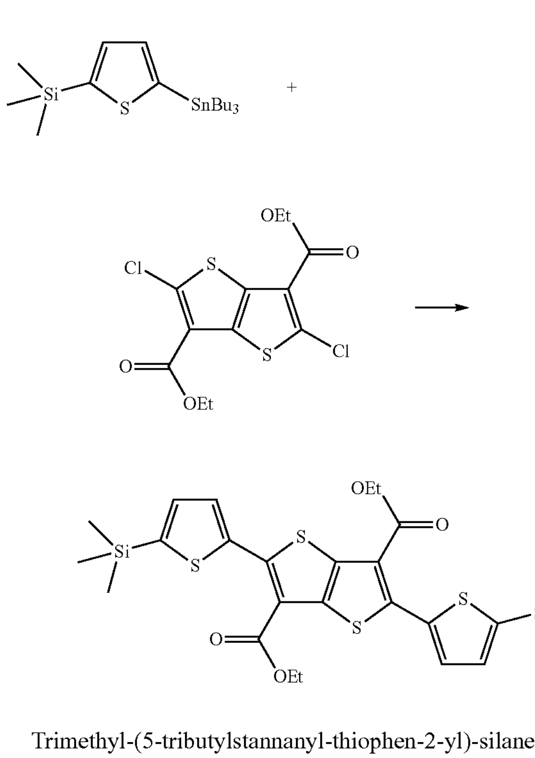

Trimethyl-(5-tributylstannanyl-thiophen-2-yl)-silane (30.5 g, 61.7 mmol), intermediate 31 (10.0 g, 28.3 mmol) and tetrakis(triphenylphosphine)palladium(0) (657 mg, 0.57 mmol) are suspended in anhydrous toluene (100 $cm^3$) and heated at 100° C. for 18 hours. The reaction is cooled to 23° C. and methanol (250 $cm^3$) added. The suspension is cooled in an ice-bath, the solid collected by filtration and washed with methanol (200 $cm^3$). The crude is purified by silica pad (dichloromethane) followed by flash chromatography eluting with 40-60 petrol:dichloromethane; 60:40 to give intermediate 32 (7.68 g, 46%) as a yellow solid. $^1$H NMR (400 MHz, $CDCl_3$) 7.42 (2H, d, J 3.5), 7.02 (2H, d, J 3.5), 4.19 (4H, q, J 7.1), 1.19 (6H, t, J 7.1), 0.15 (18H, s).

Intermediate 33

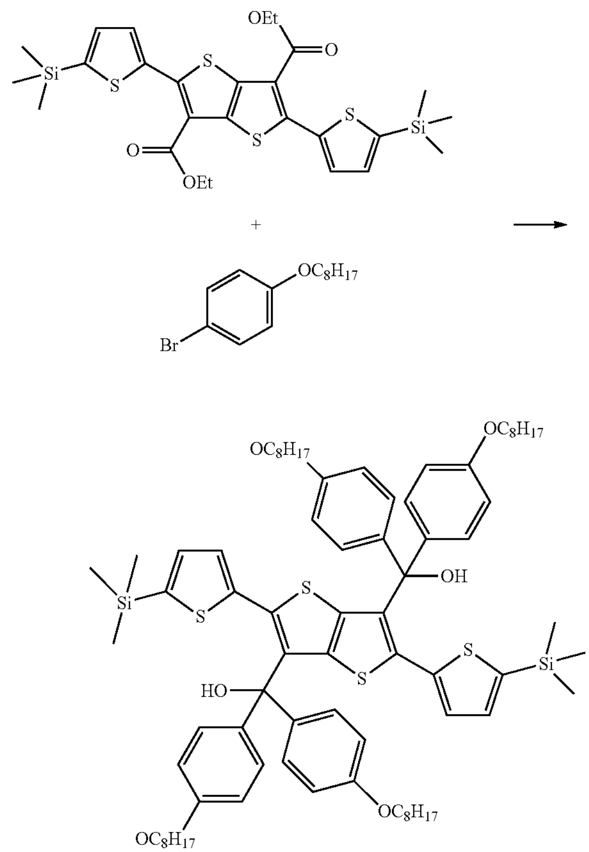

To a solution of 1-bromo-4-octyloxy-benzene (14.1 g, 49.5 mmol) in anhydrous tetrahydro-furan (73 $cm^3$) at −78° C. is added dropwise t-butyllithium (58.2 $cm^3$, 99.0 mmol, 1.7 M in pentane) over 20 minutes. The reaction is warmed to between −28° C. and −35° C. for 30 minutes. A second portion of 1-bromo-4-octyloxy-benzene (3.0 g, 11 mmol) is added and the reaction mixture stirred for 30 minutes. The reaction is cooled to −78° C. and a solution of intermediate 32 (4.89 g, 8.25 mmol) in anhydrous tetrahydrofuran (30 $cm^3$) is rapidly added. The reaction is warmed to 23° C. and stirred for 60 hours. Water (50 $cm^3$) is added and the organics extracted with ether (300 $cm^3$). The organic phase is washed with water (3×100 $cm^3$), dried over anhydrous magnesium sulfate, filtered and the solvent removed in vacuo. The crude purified by column chromatography using a gradient solvent system (40-60 petrol:dichloromethane; 9:1 to 8:2) to give intermediate 33 (3.17 g, 29%) as a pale brown solid. $^1$H NMR (400 MHz, $CDCl_3$) 7.16-7.23 (8H, m), 6.88 (2H, d, J 3.4), 6.78-6.85 (8H, m), 6.51 (2H, d, J 3.4), 3.97 (8H, t, J 6.6), 3.37 (2H, s), 1.75-1.84 (8H, m), 1.27-1.52 (40H, m), 0.82-0.95 (12H, m), 0.25 (18H, s).

Intermediate 34—Route A

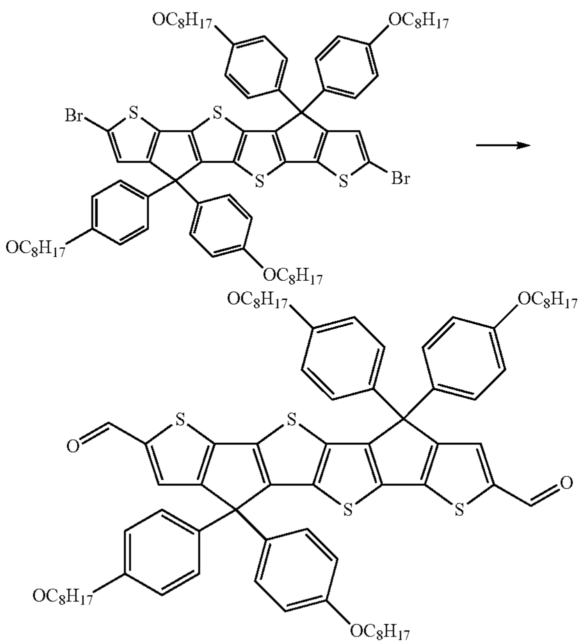

To a solution of 2,7-dibromo-4,4,9,9-tetrakis(4-(octyloxy)phenyl)-4,9-dihydro-thieno[3',2': 4,5]cyclopenta[1,2-b]thieno[2",3": 3',4']cyclopenta[1',2': 4,5]thieno[2,3-d]thiophene (1.00 g, 0.77 mmol) in tetrahydrofuran (25 $cm^3$) cooled to −78° C. is added dropwise n-butyllithium (0.92 $cm^3$, 2.30 mmol, 2.5 M in hexanes). The reaction is stirred for a further 1 hour and quenched with N,N-dimethylformamide (1.13 $cm^3$, 23.0 mmol) as a single portion. The reaction is warmed to 23° C. and stirred for 18 hours. The reaction is quenched with water (50 $cm^3$), extracted with dichloromethane (3×30 $cm^3$). The resulting organic phase is washed with water (2×20 $cm^3$), dried over anhydrous magnesium sulfate, filtered and concentrated in vacuo. The crude is purified by flash chromatography eluting with a graded solvent system (40-60 petrol:dichloromethane; 6:4 to 4:6) to give intermediate 34 (330 mg, 36%) as an orange oil. $^1H$ NMR (400 MHz, $CDCl_3$) 9.72 (2H, s), 7.58 (2H, s), 7.00-7.08 (8H, m), 6.69-6.82 (8H, m), 3.83 (8H, t, J 6.5), 1.61-1.71 (8H, m), 1.34 (8H, m), 1.11-1.33 (32H, m), 0.72-0.90 (12H, m).

Intermediate 34—Route B

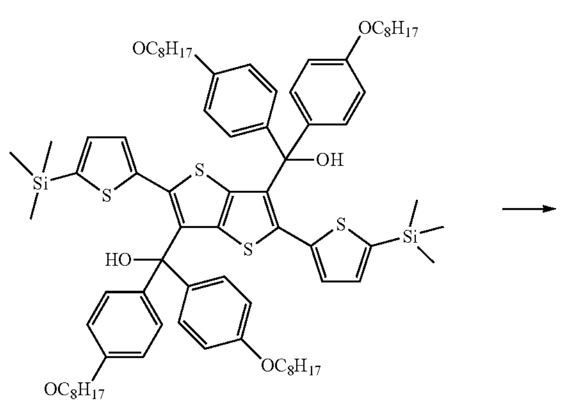

-continued

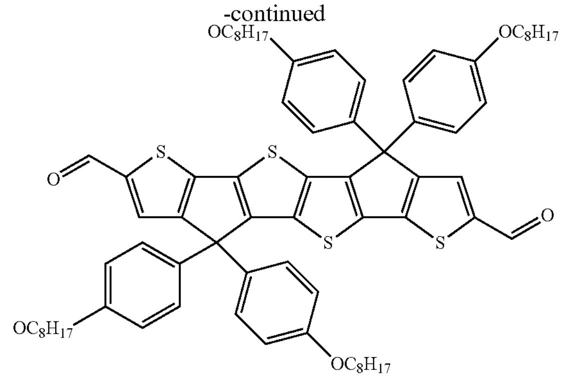

To a degassed solution of intermediate 33 (6.00 g, 4.52 mmol) in toluene (240 $cm^3$) is added amberlyst 15 strong acid (24 g), the mixture further degassed.purged and then heated at 75° C. for 18 hours. The solution is cooled to about 50° C., filtered and the solid washed with toluene (200 $cm^3$). The filtrate is concentrated and triturated with 80-100 petrol (3×30 $cm^3$) with the solid collected by filtration. The solid is dissolved in chloroform (120 $cm^3$), N,N-dimethylformamide (5.3 g, 72 mmol) added and the solution cooled to 0° C. Phosphorus(V) oxychloride (10.4 g, 67.9 mmol) is added over 10 minutes. The reaction mixture is then heated at 65° C. for 18 hours. Aqueous sodium acetate solution (150 $cm^3$, 2 M) is added at 65° C. and the reaction mixture stirred for 1 hour. Saturated aqueous sodium acetate solution is added until the mixture is pH 6 and the reaction stirred for a further 30 minutes. The aqueous phase is extracted with chloroform (2×25 $cm^3$) and the combined organic layers washed with water (50 $cm^3$), dried over anhydrous magnesium sulfate, filtered and the solvent removed in vacuo. The solid is triturated in 80-100 petrol and the solid collected by filtration to give intermediate 34 (3.06 g, 56%) as an orange oil. $^1H$ NMR (400 MHz, $CDCl_3$) 9.72 (2H, s), 7.58 (2H, s), 7.00-7.08 (8H, m), 6.69-6.82 (8H, m), 3.83 (8H, t, J 6.5), 1.61-1.71 (8H, m), 1.34 (8H, m), 1.11-1.33 (32H, m), 0.72-0.90 (12H, m).

Compound 14

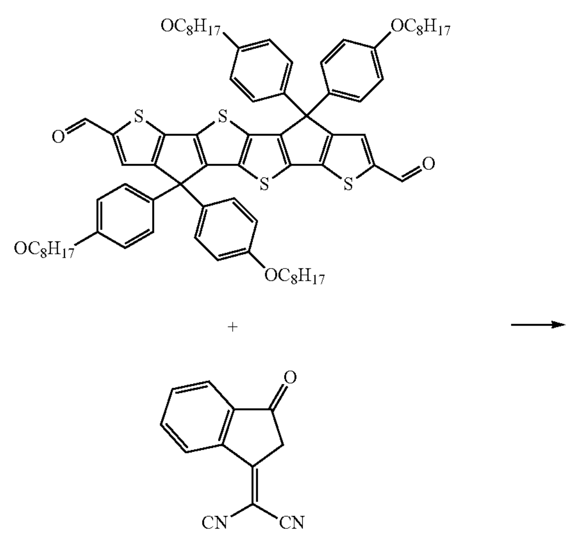

-continued

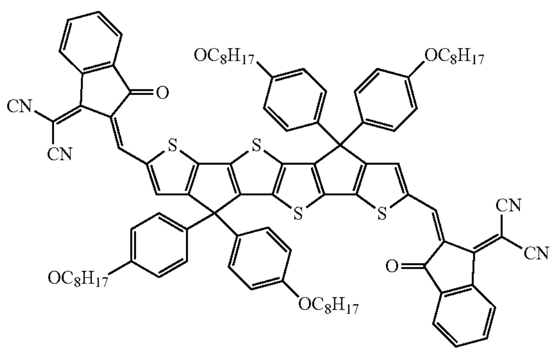

To a degassed solution of intermediate 34 (330 mg, 0.27 mmol) and 3-(dicyanomethylidene)indan-1-one (373 mg, 1.92 mmol) in chloroform (8.25 $cm^3$) is added pyridine (0.55 $cm^3$, 6.86 mmol) and the mixture stirred at 23° C. for 4 hours. Methanol (50 $cm^3$) is added and the resulting suspension is filtered and washed with methanol (3×20 $cm^3$). The crude is purified by column chromatography (40-60 petrol:dichloromethane; 1:1) to give compound 14 (141 mg, 33%) as a blue solid. $^1$H NMR (400 MHz, $CDCl_3$) 8.79 (2H, s), 8.60 (2H, m), 7.75-7.91 (2H, m), 7.67 (4H, m), 7.61 (s, 2H), 7.04-7.12 (8H, m), 6.74-6.81 (8H, m), 3.85 (8H, t, J 6.5), 1.68 (8H, m), 1.11-1.43 (40H, m), 0.72-0.84 (12H, m).

Example 15

Intermediate 35

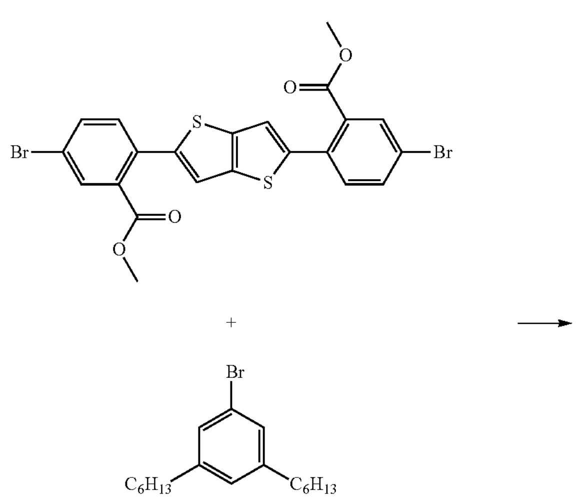

-continued

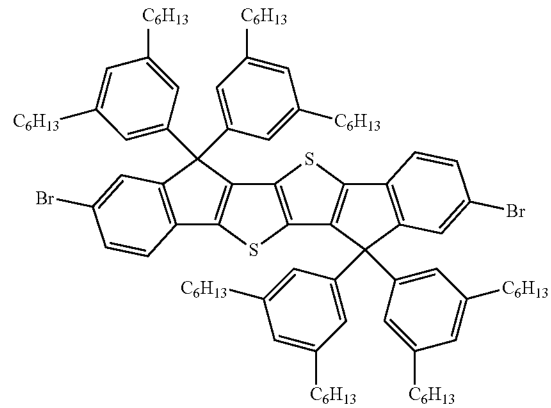

To a solution of 1-bromo-3,5-dihexyl-benzene (9.00 g, 27.7 mmol) in anhydrous tetrahydrofuran (135 $cm^3$) cooled to −78° C. is added dropwise a solution of n-butyllithium (11.1 $cm^3$, 27.7 mmol, 2.5 M in hexanes) over 10 minutes. The reaction is stirred for one hour and methyl 5-bromo-2-[5-(4-bromo-2-methoxycarbonyl-phenyl)thieno[3,2-b]thiophen-2-yl]benzoate (3.13 g, 5.53 mmol) is added as a single portion. The reaction is warmed to 23° C. and stirred for 18 hours. The reaction is partitioned between diethyl ether (50 $cm^3$) and water (100 $cm^3$). The organic phase is washed with water (30 $cm^3$), brine (30 $cm^3$), dried over anhydrous magnesium sulfate, filtered and concentrated in vacuo. The crude is triturated with 40-60 petrol, and the solid suspended in toluene (50 $cm^3$). p-Toluene sulphonic acid (2.5 g) is added and the reaction mixture and stirred for 17 hours. The suspension is filtered, concentrated in vacuo and purified via flash chromatography eluting with a mixture of DCM petroleum ether 40:60. The resulting material is triturated in acetone and the solid collected to give intermediate 35 (2.71 g, 34%) as a yellow solid. $^1$H NMR (400 MHz, $CDCl_3$) 7.42 (2H, d, J 1.7), 7.32 (2H, dd, J 8.1, 1.8), 7.11 (2H, d, J 8.1), 6.80 (4H, t, J 1.5), 6.71 (8H, d, J 1.5), 2.40 (16H, t, J 7.7), 1.38-1.48 (16H, m), 1.11-1.24 (48H, m), 0.70-0.79 (24H, m).

Intermediate 36

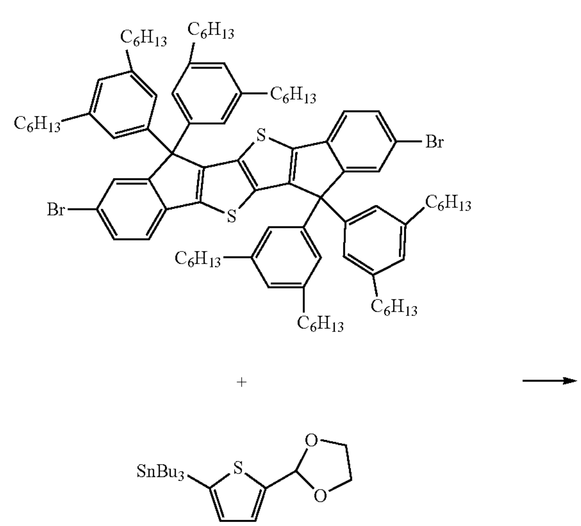

-continued

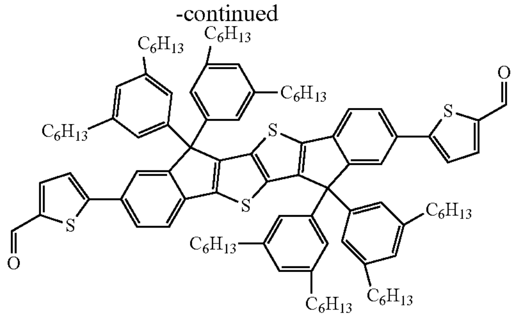

To a degassed solution of intermediate 35 (250 mg, 0.17 mmol), tributyl-(5-[1,3]dioxolan-2-yl-thiophen-2-yl)-stannane (0.18 $cm^3$, 0.40 mmol) and tris(o-tolyl)phosphine (16 mg, 0.05 mmol) in toluene (12.5 $cm^3$) is added bis(dibenzylideneacetone)palladium(0) (16 mg, 0.02 mmol) and the mixture further degassed. The reaction is then heated to an external temperature of 140° C. for 6 hours. The reaction mixture is allowed to cool and concentrated in vacuo. The crude is purified by flash chromatography eluting with a graded solvent system (40-60 petrol:dichloromethane; 1:9 to 3:10). The resulting oil is dissolved in chloroform (30 $cm^3$) and stirred with 2.5 N hydrochloric acid solution (10 $cm^3$) for 18 hours. The organic phase is concentrated in vacuo and the residue purified by flash chromatography eluting with a graded solvent system (40-60 petrol:dichloromethane; 1:4 to 1:4). The resulting solid is triturated in acetone and the solid collected by filtration to give intermediate 36 (170 mg, 65%) as a yellow solid. $^1H$ NMR (400 MHz, $CDCl_3$) 9.78 (2H, s), 7.59-7.65 (4H, m), 7.55 (2H, dd, J 8.0, 1.6), 7.31 (2H, d, J 8.0), 7.24 (2H, d, J 3.9), 6.82 (4H, s), 6.78 (8H, s), 2.41 (16H, t, J 7.6), 1.39-1.49 (16H, m), 1.17 (48H, m), 0.69-0.85 (24H, m).

Compound 15

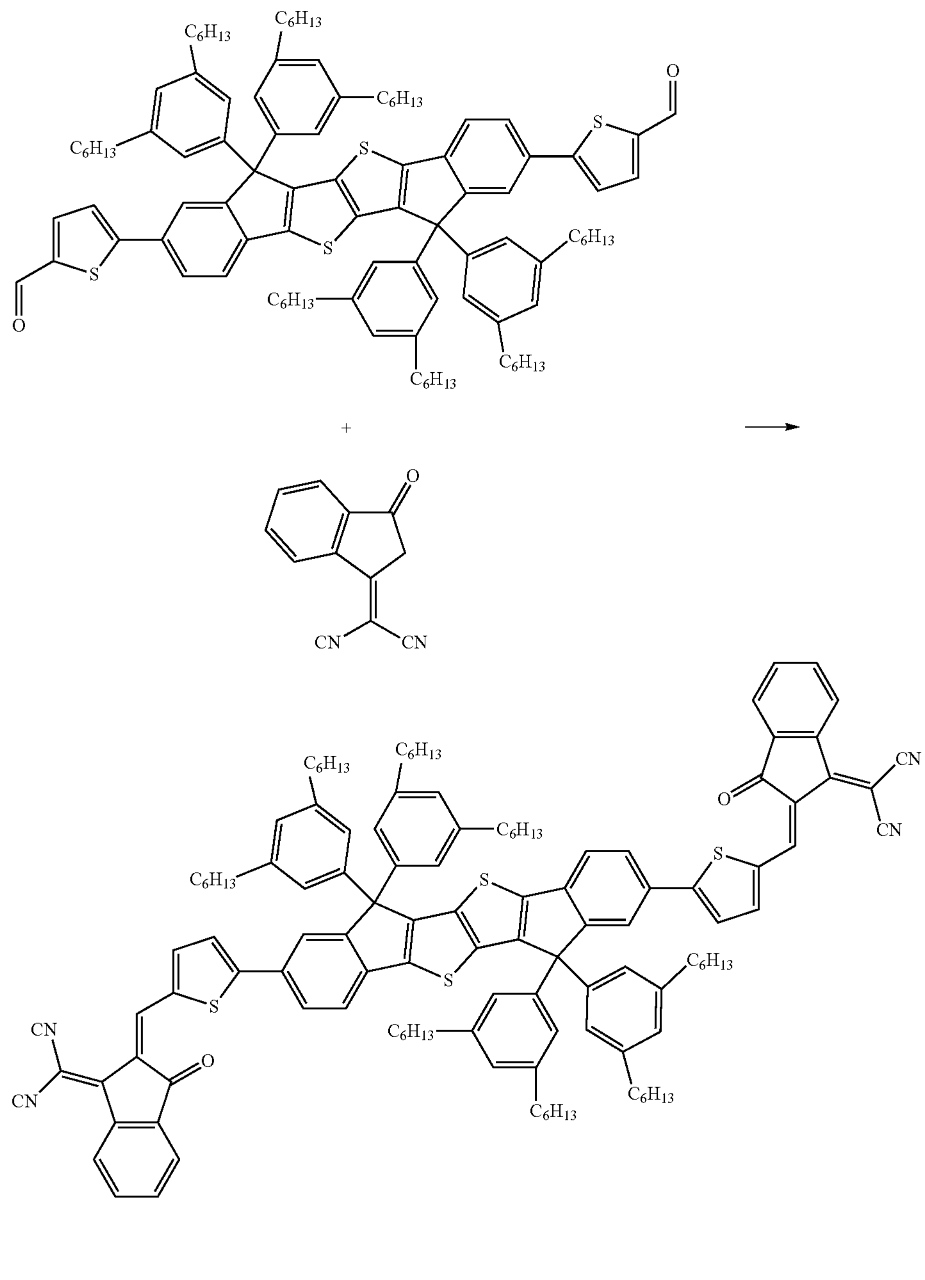

To a degassed solution of intermediate 36 (170 mg, 0.11 mmol) and 3-(dicyanomethylidene)indan-1-one (153 mg, 0.79 mmol) in chloroform (4.25 $cm^3$) is added pyridine (0.63 $cm^3$, 7.86 mmol) and the mixture stirred at 23° C. for 18 hours. Methanol (75 $cm^3$) is added and the resulting suspension filtered and washed with methanol (3×10 $cm^3$). The resulting solid is purified by column chromatography eluting with a graded solvent system (40-60 petrol:dichloromethane; 1:1 to 2:3) to give Compound 15 (32 mg, 15%) as a blue solid. $^1$H NMR (400 MHz, $CD_2Cl_2$) 8.75 (2H, s), 8.55-8.64 (2H, m), 7.82-7.87 (2H, m), 7.64-7.80 (10H, m), 7.25-7.49 (4H, m), 6.80-6.87 (12H, m), 2.42 (16H, t, J 7.6), 1.47 (16H, m), 1.11-1.23 (48H, m), 0.67-0.75 (m, 24H).

Example 16

Intermediate 37

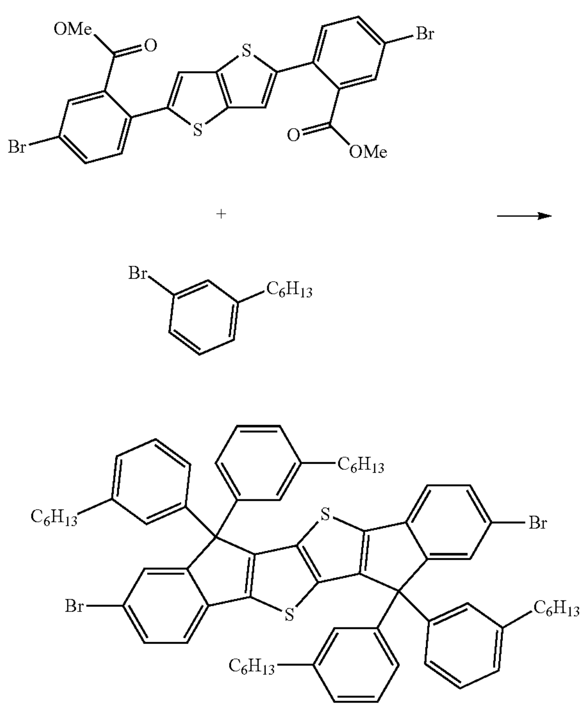

To a solution of 1-bromo-3-hexyl-benzene (6.39 g, 26.5 mmol) and anhydrous tetrahydrofuran (45 $cm^3$) is added and the dropwise a solution of n-butyllithium (10.6 $cm^3$, 26.5 mmol, 2.5 M in hexanes) over 10 minutes. The reaction mixture is stirred for 1 hour and methyl 5-bromo-2-[5-(4-bromo-2-methoxycarbonyl-phenyl)thieno[3,2-b]thiophen-2-yl]benzoate (3.00 g, 5.3 mmol) added as a single portion. The reaction is warmed to 23° C. and stirred for 17 hours. The reaction is partitioned between diethyl ether (100 $cm^3$) and water (100 $cm^3$). The organic phase is washed with water (2×50 $cm^3$), brine (20 $cm^3$), dried over anhydrous magnesium sulfate, filtered and concentrated in vacuo. The resulting oil is triturated with 40-60 petrol and the solid suspended in toluene (40 $cm^3$). p-Toluene sulphonic acid (2.0 g) is added and the reaction mixture stirred for 17 hours. The suspension is filtered and concentrated in vacuo. The resulting material is triturated in acetone at 50° C. and then filtered at 0° C. to give intermediate 37 (1.28 g, 22%) as a yellow solid. $^1$H NMR (400 MHz, $CDCl_3$) 7.51 (2H, d, J 1.7), 7.41 (2H, dd, J 8.1, 1.8), 7.13-7.25 (6H, m), 7.04-7.12 (8H, m), 6.92-6.98 (4H, m), 2.50-2.59 (m, 8H), 1.54 (8H, m), 1.18-1.24 (m, 24H), 0.79-0.88 (m, 12H).

Intermediate 38

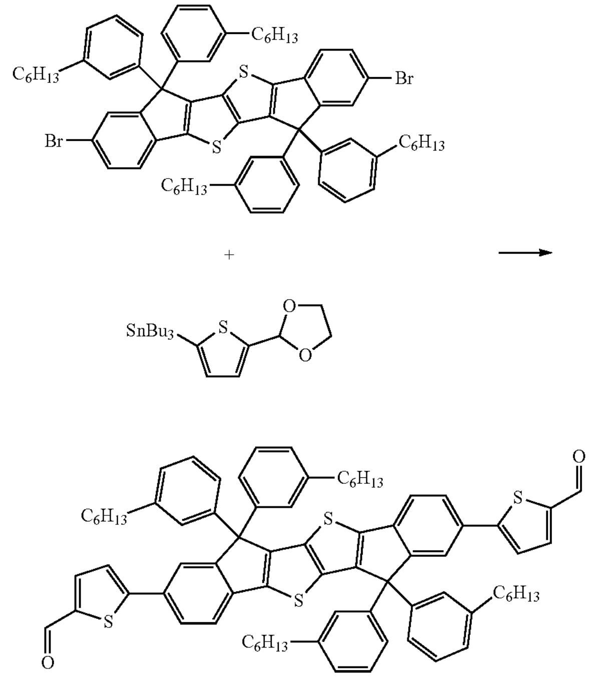

To a degassed solution of intermediate 37 (250 mg, 0.22 mmol), tributyl-(5-[1,3]dioxolan-2-yl-thiophen-2-yl)-stannane (277 mg, 0.52 mmol) and tris(o-tolyl)phosphine (21 mg, 0.07 mmol) in toluene (12.5 $cm^3$) is added bis(dibenzylideneacetone)palladium(0) (21 mg, 0.02 mmol). The solution is further degassed and then heated to an external temperature of 140° C. for 6 hours. The reaction mixture is concentrated in vacuo and purified by flash chromatography eluting with a graded solvent system (40-60 petrol:dichloromethane; 1:1 to 1:3). The resulting oil is dissolved in chloroform (10 $cm^3$) and stirred with 2.5 N hydrochloric acid (10 $cm^3$) for 18 hours. The organic phase is washed with water (10 $cm^3$) and brine (20 $cm^3$) before being concentrated in vacuo. The resulting solid is triturated in acetone to give intermediate 38 (75 mg, 28%) as a yellow solid. $^1$H NMR (400 MHz, $CDCl_3$) 9.86 (2H, s), 7.67-7.74 (4H, m), 7.63 (2H, m), 7.41 (2H, d, J 8.0), 7.34 (2H, d, J 3.9), 7.06-7.23 (12H, m), 6.98-7.06 (4H, m), 2.56 (8H, t, J 7.6), 1.55 (8H, m), 1.19-1.33 (m, 24H), 0.82 (12H, m).

Compound 16

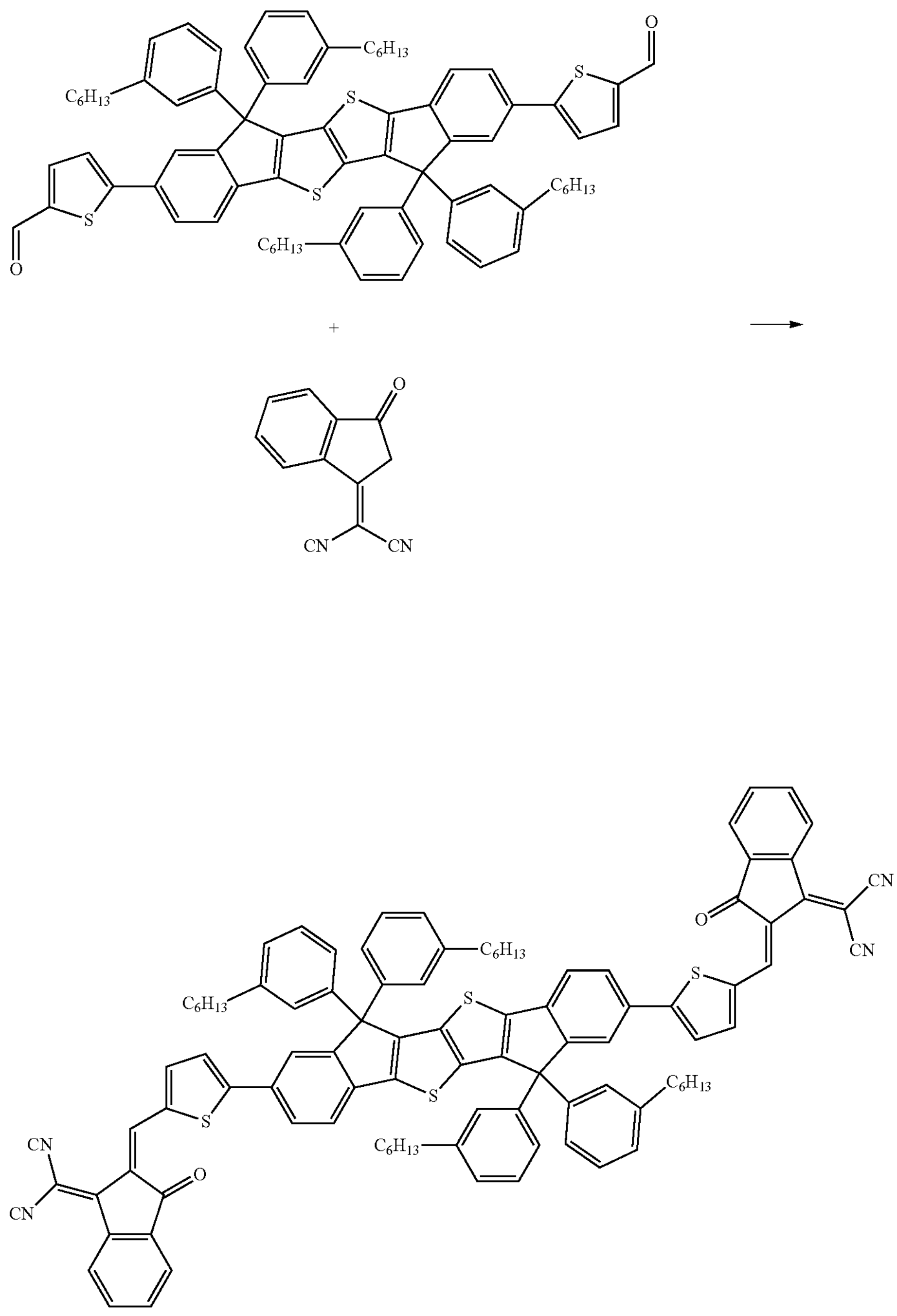

To a degassed solution of intermediate 38 (75 mg, 0.06 mmol) and 3-(dicyanomethylidene)indan-1-one (87 mg, 0.45 mmol) in chloroform (1.9 $cm^3$) is added pyridine (0.36 $cm^3$, 4.46 mmol) and the reaction mixture stirred at 23° C. for 18 hours. Methanol (40 $cm^3$) is added and the resulting suspension filtered and washed with methanol (3×10 $cm^3$). The resulting solid is purified by column chromatography eluting with a graded solvent system (40-60 petrol:dichloromethane; 1:1 to 2:3) to give Compound 16 (63 mg, 65%) as a blue solid. H NMR (400 MHz $CD_2Cl_2$) 8.75 (2H, s), 8.60 (2H, dd, J 7.1, 11.4), 7.84 (2H, dd, J 6.9, 1.8), 7.63-7.80 (8H, m), 7.44 (2H, d, J 8.4), 7.39 (2H, d, J 4.2), 7.08-7.15 (8H, m), 7.04 (4H, d, J 7.6), 6.96 (4H, m), 2.49 (8H, t, J 7.6), 1.49 (8H, t, J 4.2), 1.09-1.26 (24H, m), 0.68-0.76 (12H, m).

Example 17

Compound 17

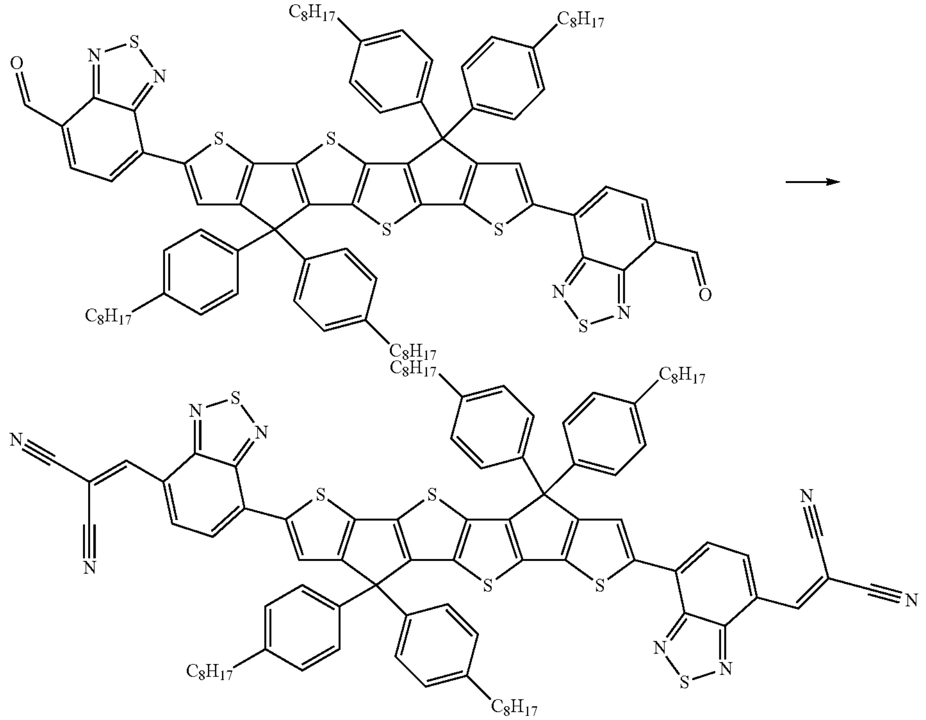

To a solution of intermediate 10 (450 mg, 0.32 mmol) in anhydrous chloroform (34 $cm^3$) is added pyridine (1.8 $cm^3$, 22 mmol). The mixture is then degassed with nitrogen before malononitrile (148 mg, 2.24 mmol) is hours. The reaction mixture is then added to methanol (350 $cm^3$), washing in with additional methanol (2×10 $cm^3$) and dichloromethane (2×5 $cm^3$). Additional methanol (35 $cm^3$) is then added and the mixture stirred at 23° C. for 50 minutes before filtration, washing the solid with methanol (3×20 $cm^3$), 40-60 petrol (3×20 $cm^3$), 80-100 petrol (3×20 $cm^3$), cyclohexane (3×20 $cm^3$), diethyl ether (4×20 $cm^3$) and acetone (4×20 $cm^3$) to give Compound 17 (429 mg, 89%) as a black solid. $^1$H NMR (400 MHz, $CDCl_3$) 8.75 (2H, s), 8.68 (2H, d, J 8.1), 8.29 (2H, s), 7.78 (2H, d, J 7.8), 7.24 (8H, d, J 8.4), 7.14 (8H, d, J 8.3), 2.58 (8H, t, J 7.7), 1.56-1.65 (8H, m), 1.20-1.37 (40H, m), 0.85 (12H, t, J 6.9).

Example 18

Compound 18

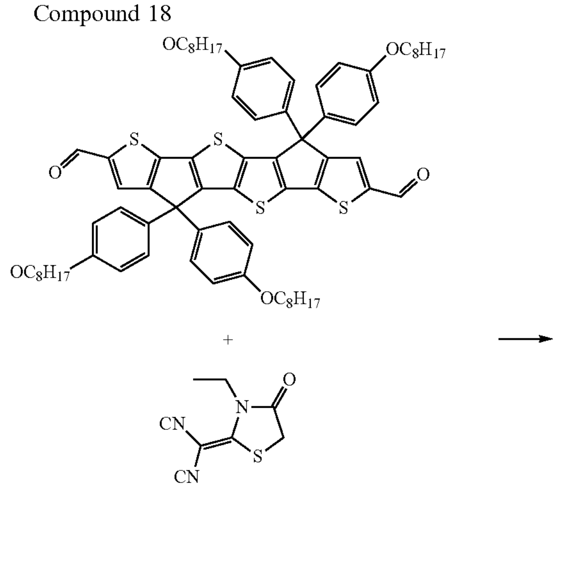

-continued

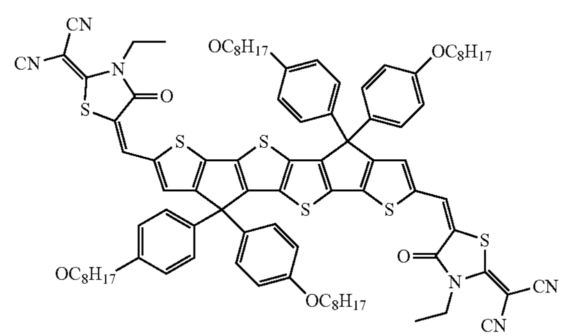

To a degassed solution of intermediate 34 (200 mg, 0.17 mmol) and 2-(3-ethyl-4-oxo-thiazolidin-2-ylidene)-malononitrile (225 mg, 1.16 mmol) in chloroform (5 $cm^3$) is added pyridine (0.94 $cm^3$, 12 mmol) followed by piperidine (992 mg, 11.7 mmol). The reaction is stirred at 23° C. for 18 hours and then precipitated with methanol (50 $cm^3$), filtered and purified by flash chromatography eluting with a graded solvent system (40-60 petrol:dichloromethane; 3:2 to 2:3). The isolated material is then triturated in acetone (10 $cm^3$) and the solid collected by filtration to give Compound 18 (48 mg, 19%) as a blue solid. $^1$H NMR (400 MHz, $CDCl_3$) 7.97 (2H, s), 7.30 (2H, s), 7.01-7.08 (8H, m), 6.72-6.79 (8H, m), 4.24 (4H, q, J 7.1), 3.84 (8H, t, J 6.5), 1.67 (8H, q, J 6.8), 1.30-1.40 (14H, m), 1.11-1.28 (32H, m), 0.76-0.84 (12H, m).

Example 19

Intermediate 39

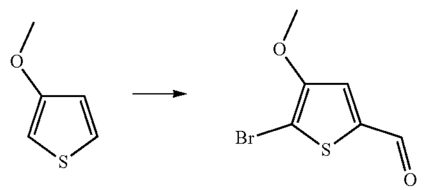

To a solution of 3-methoxy-thiophene (25.0 g, 219 mmol) in anhydrous N,N-dimethylformamide (100 $cm^3$) at 0° C. is added dropwise, over 20 minutes, a solution of 1-bromo-pyrrolidine-2,5-dione (39.0 g, 219 mmol) in anhydrous N,N-dimethylformamide (150 $cm^3$) and the reaction stirred to 23° C. for 65 hours. The reaction mixture is then diluted with diethyl ether (100 $cm^3$), washed with brine (250 $cm^3$) diluted with water (250 $cm^3$) and the organic layer separated. The aqueous layer is then extracted with diethyl ether (2×100 $cm^3$ then 50 $cm^3$) and the combined organic extracts washed with brine (3×100 $cm^3$) extracting the aqueous layer each time with diethyl ether (50 $cm^3$). The combined organic extracts are then dried over anhydrous magnesium sulfate, filtered and concentrated in vacuo. The crude is purified by silica plug, eluting with a graded solvent system (40-60 petrol:dichloromethane; 1:0-4:1). The fractions containing product are concentrated in vacuo at 23° C. and rapidly placed on an ice water bath. Anhydrous tetrahydrofuran (150 $cm^3$) is then added and the flask placed under nitrogen atmosphere. At 0° C. with stirring, additional anhydrous tetrahydrofuran (150 $cm^3$) is added before the solution is cooled to −78° C. and lithium diisopropylamide (120 $cm^3$, 240 mmol, 2.0 M in tetrahydrofuran/heptane/ethylbenzene) is added dropwise over 40 minutes. The reaction mixture is stirred at −78° C. for 2 hours before the reaction is quenched by the dropwise addition of anhydrous N,N-dimethylformamide (202 $cm^3$, 2630 mmol), maintaining the reaction temperature at −78° C. The reaction is then allowed to warm to 23° C. with stirring over 17 hours before addition to ice (600 $cm^3$), followed by the addition of pentane (400 $cm^3$) and stirring for 17 hours. The pentane layer is isolated and the aqueous layer extracted with pentane (2×100 $cm^3$). The combined pentane extracts are then washed with 20 wt % citric acid solution (2×150 $cm^3$), water (150 $cm^3$) and brine (150 $cm^3$), extracting the aqueous layer each time with pentane (50 $cm^3$). The combined pentane extracts are then dried over anhydrous magnesium sulfate, filtered and concentrated in vacuo. The crude is then purified by column chromatography eluting with a graded solvent system (40-60 petrol:dichloromethane; 1:0-3:2) to give intermediate 39 (1.96 g, 4%) as a yellow solid. $^1H$ NMR (400 MHz, $CDCl_3$) 9.84 (1H, s), 6.90 (1H, s), 3.96 (3H, s).

Intermediate 40

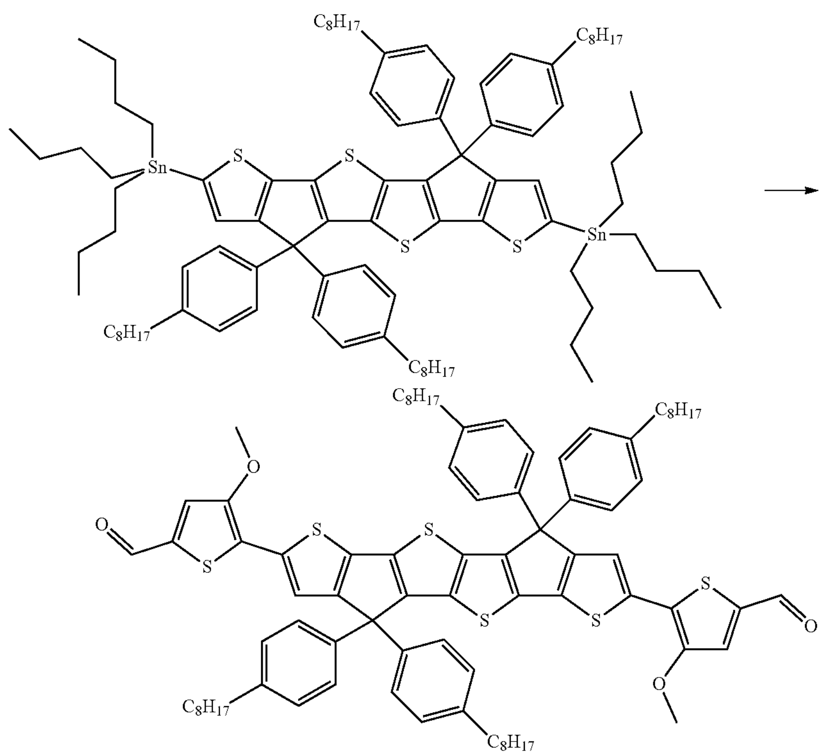

To a degassed solution of intermediate 9 (700 mg, 0.42 mmol) and 2-bromo-3-methoxythiophene-5-carboxaldehyde (205 mg, 0.93 mmol) in anhydrous toluene (45 $cm^3$), tris(dibenzylideneacetone)dipalladium (31 mg, 0.03 mmol) and tris(o-tolyl)phosphine (39 mg, 0.13 mmol) are added. The reaction is then further degassed for 20 minutes before heating to 80° C. for 17 hours. The reaction mixture is then concentrated in vacuo, triturated with methanol (5×20 $cm^3$) and the solid filtered. The crude product is then purified by silica plug eluting with a graded solvent system (40-60 petrol:dichloromethane; 1:1-1:4 then dichloromethane: methanol; 1:0-9.5:0.5). Final purification is achieved by column chromatography eluting with a graded solvent system (40-60 petrol:dichloromethane; 2:3-1:4 then dichloromethane:methanol; 1:0-9:1) to give intermediate 40 (134 mg, 23%) as a dark brown solid. $^1$H NMR (400 MHz, $CDCl_3$) 9.92 (2H, s), 7.31 (2H, s), 7.12-7.17 (8H, m), 7.08-7.12 (8H, m), 6.84 (2H, s), 4.01 (6H, s), 2.53-2.60 (8H, m), 1.54-1.64 (8H, m), 1.20-1.37 (40H, m), 0.87 (12H, t, J 6.9).

Compound 19

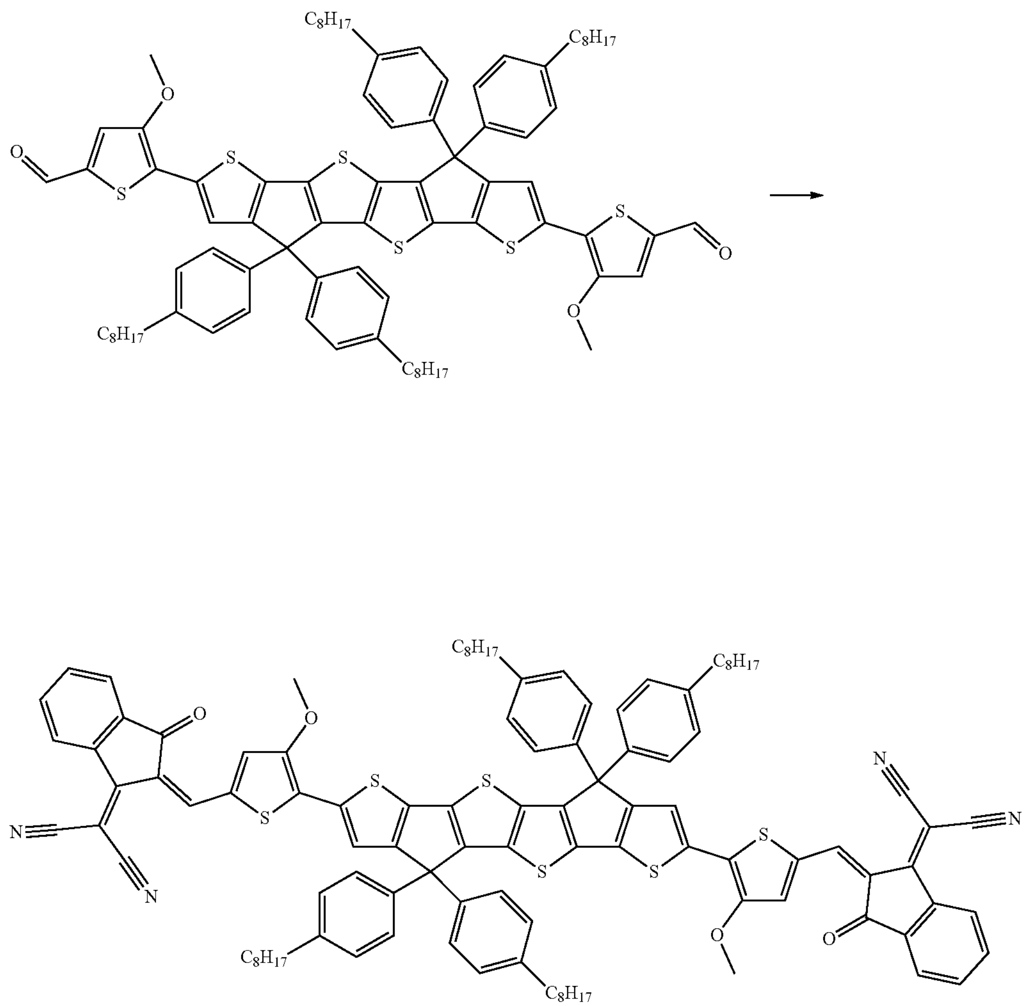

To a solution of intermediate 40 (134 mg, 0.10 mmol) in anhydrous chloroform (10 cm$^3$) is added pyridine (0.6 cm$^3$, 6.9 mmol). The mixture is then degassed with nitrogen before 3-(dicyanomethylidene)indan-1-one (134 mg, 0.69 mmol) is added. The solution is then further degassed and stirred at 23° C. for 20 minutes before additional anhydrous degassed chloroform (5 cm$^3$) is added and the reaction stirred for a further 3 hours 20 minutes. The reaction mixture is then added to methanol (250 cm$^3$), washing in with methanol (2×10 cm$^3$) and dichloromethane (2×5 cm$^3$). Additional methanol (50 cm$^3$) is then added before the solid is filtered and then washed with additional methanol (10×10 cm$^3$). The crude product is then partially purified by column chromatography using a graded solvent system (chloroform then dichloromethane:methanol; 9.5:0.5) with final purification achieved by trituration with methanol (3×10 cm$^3$) washing the filtered solid with 40-60 petrol (3×10 cm$^3$), cyclohexane (3×10 cm$^3$) and diethyl ether (3×10 cm$^3$) to give Compound 19 (58 mg, 34%) as a black solid. $^1$H NMR (400 MHz, $CDCl_3$) 9.16 (2H, s), 8.62-8.67 (2H, m), 7.82-7.87 (2H, m), 7.63-7.72 (4H, m), 7.58 (2H, s), 7.12-7.19 (16H, m), 6.89 (2H, s), 4.13 (6H, s), 2.59 (8H, t, J 7.7), 1.57-1.65 (8H, m), 1.22-1.36 (40H, m), 0.87 (12H, t, J 6.8).

Example 20

Intermediate 41

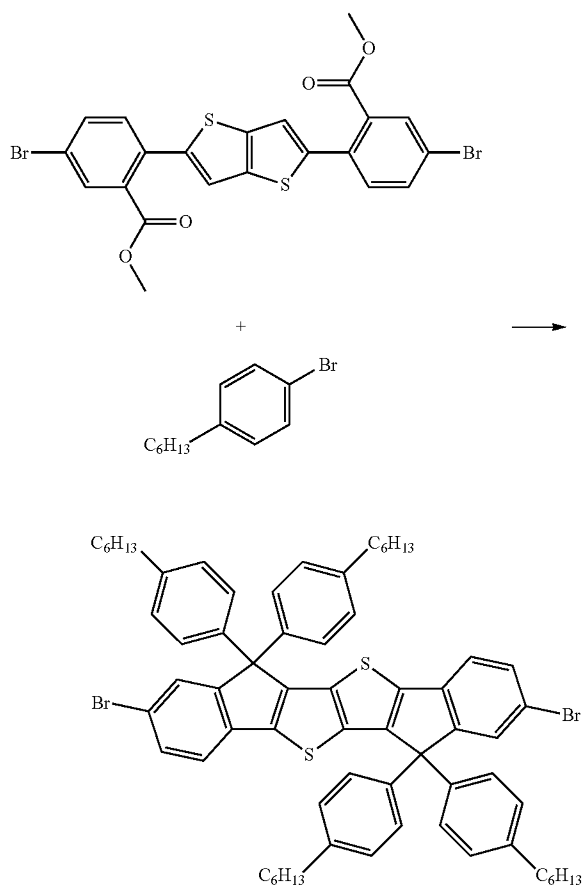

Intermediate 42

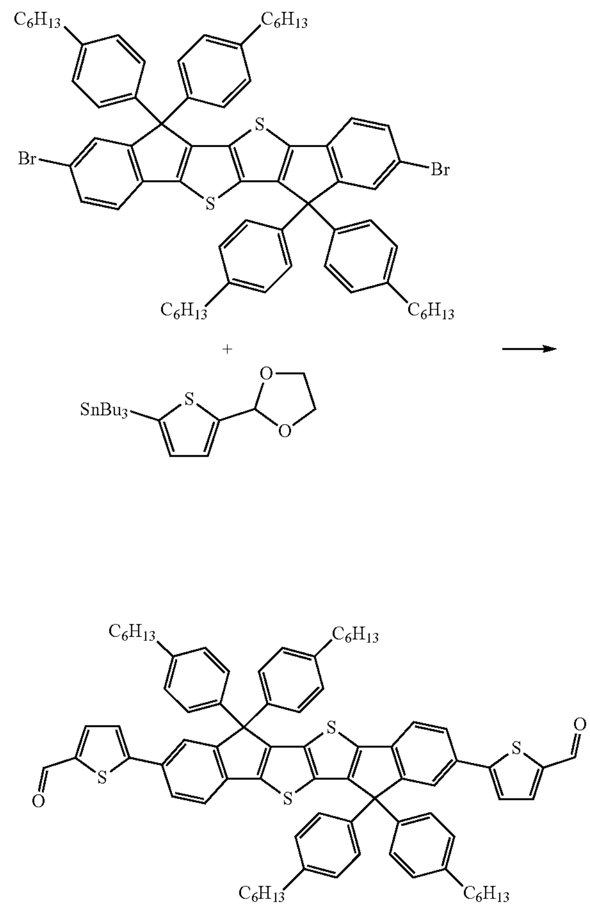

To a solution of 1-bromo-4-hexyl-benzene (10.0 g, 41.5 mmol) in anhydrous tetrahydrofuran (70 $cm^3$) at −78° C. is added n-butyllithium (16.6 $cm^3$, 41.5 mmol, 2.5 M in hexane) portion-wise over 10 minutes. The reaction is stirred for one hour and methyl 5-bromo-2-[5-(4-bromo-2-methoxycarbonyl-phenyl)thieno[3,2-b]thiophen-2-yl]benzoate (4.70 g, 8.29 mmol) added in a single portion. The reaction is warmed to 23° C. and stirred for 17 hours. The reaction is partitioned between diethyl ether (100 $cm^3$) and water (100 $cm^3$). The organic phase is washed with water (2×50 $cm^3$), brine (20 $cm^3$), dried over anhydrous magnesium sulfate, filtered and concentrated in vacuo. The resulting oil is triturated with 40-60 petrol, and the solid suspended in toluene (40 $cm^3$), p-toluene sulphonic acid (2.0 g) added and the reaction mixture stirred at 23° C. for 17 hours. The suspension is filtered and concentrated in vacuo. The resulting material is triturated in acetone at 50° C. then filtered at 0° C. to give intermediate 41 (3.4 g, 37%) as a yellow solid. $^1$H NMR (400 MHz, $CDCl_3$) 7.52 (2H, d, J 1.7), 7.40 (2H, dd, J 8.1, 1.8), 7.21 (2H, d, J 8.1), 7.06-7.15 (m, 16H), 2.52-2.61 (m, 8H), 1.58 (8H, m), 1.22-1.40 (24H, m), 0.83-0.92 (12H, m).

To a degassed solution of intermediate 41 (250 mg, 0.22 mmol), tributyl-(5-[1,3]dioxolan-2-yl-thiophen-2-yl)-stannane (273 mg, 0.51 mmol) and tris(o-tolyl)phosphine (2 mg, 0.01 mmol) in toluene (12.5 $cm^3$) is added bis(dibenzylideneacetone)palladium(0) (20 mg, 0.02 mmol). The solution is further degassed and heated to an external temperature of 140° C. for 18 hours. Methanol (20 $cm^3$) is added, the suspension is stirred for 30 minutes, filtered and the solid washed with methanol (20 $cm^3$). The resulting solid is purified by flash chromatography eluting with 40:60 petrol followed by dichloromethane. The resulting solid is dissolved in chloroform (30 $cm^3$) and stirred with hydrochloric acid (10 $cm^3$, 3 N) for 4 hours. The organic phase is washed with water (10 $cm^3$), dried over anhydrous magnesium sulfate, filtered before being concentrated in vacuo then triturated in acetone to give intermediate 42 (160 mg, 61%) as a yellow solid. $^1$H NMR (400 MHz, $CDCl_3$) 9.78 (2H, s), 7.59-7.66 (4H, m), 7.55 (2H, dd, J 8.0, 1.5), 7.33 (2H, d, J 7.9), 7.28 (2H, d, J 3.9), 7.11 (8H, d, J 8.0), 7.03 (8H, d, J 8.0), 2.49 (8H, t, J 7.9), 1.51 (8H, m), 1.23 (24H, m), 0.71-0.83 (12H, m).

Compound 20

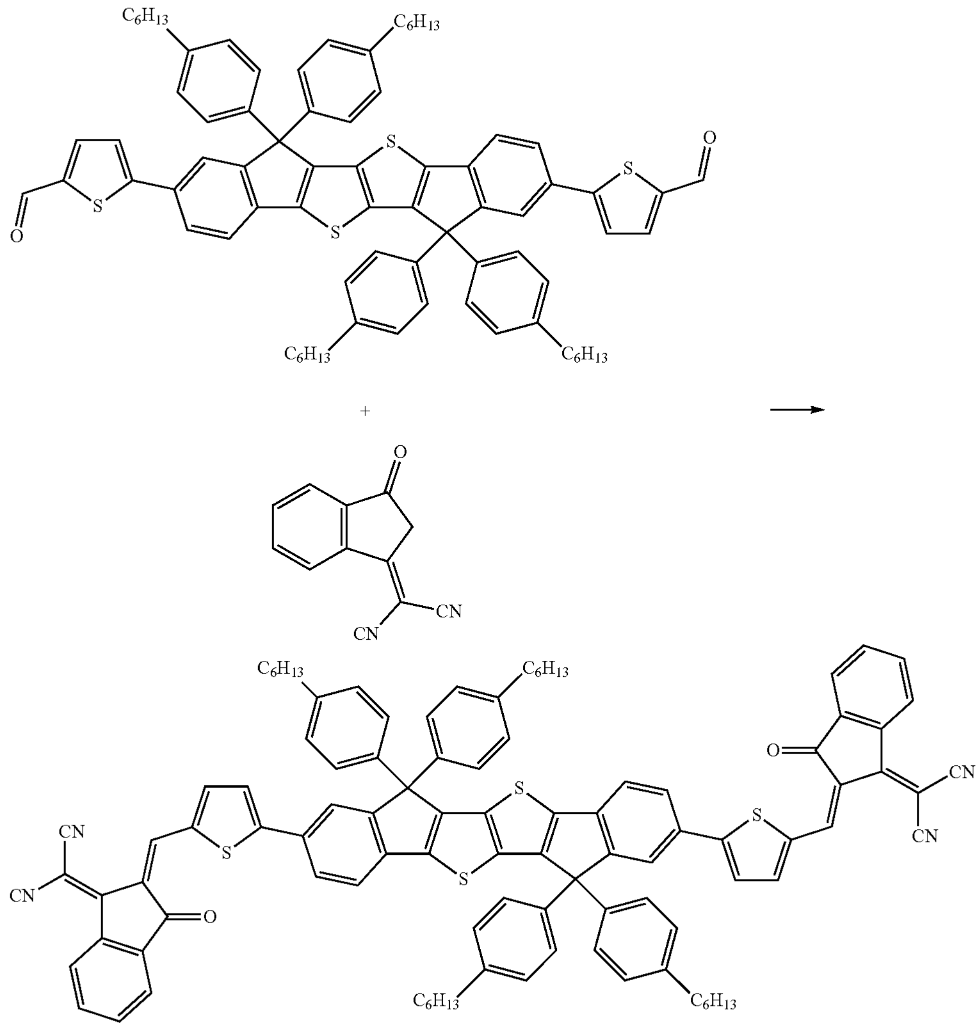

To a degassed solution of intermediate 42 (170 mg, 0.14 mmol) and 3-(dicyanomethylidene)indan-1-one (196 mg, 01.01 mmol) in chloroform (12.3 $cm^3$) is added pyridine (799 mg, 10 mmol) and stirred at 23° C. for 18 hours. Methanol (30 $cm^3$) is added and the resulting suspension filtered and the solid washed with methanol (30 $cm^3$). The solid is triturated in acetone (10 $cm^3$), filtered and washed with acetone (30 $cm^3$) to give Compound 20 (214 mg, 97%) as a blue solid. $^1H$ NMR (400 MHz, $CDCl_3$) 8.87 (2H, s), 8.69-8.74 (2H, m), 7.92-8.00 (2H, m), 7.85 (2H, d, J 4.3), 7.72-7.82 (8H, m), 7.41-7.50 (m, 4H), 7.22 (8H, d, J 8.2), 7.14 (8H, d, J 8.1), 2.58 (8H, t, J 7.9), 1.57 (8H, m), 1.24-1.40 (24H, m), 0.82-0.91 (12H, m).

Example 21

Compound 21

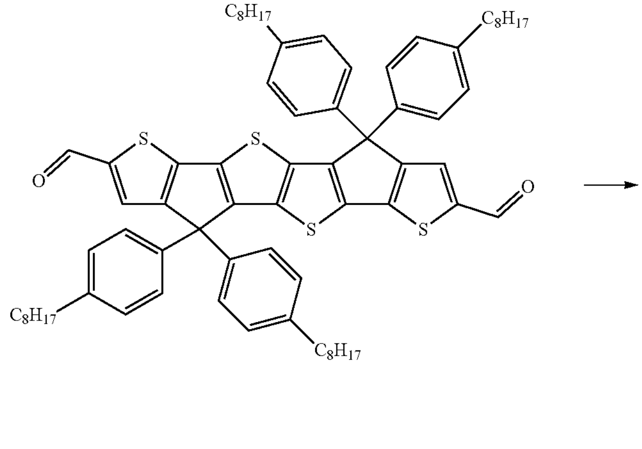

-continued

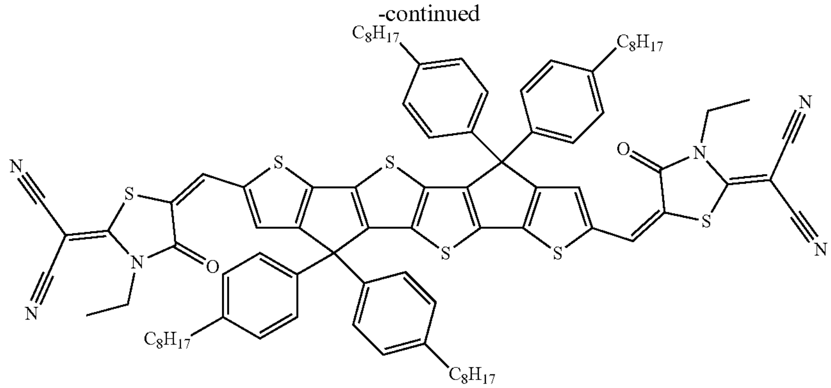

To a solution of intermediate 8 (303 mg, 0.27 mmol) in anhydrous chloroform (28 $cm^3$) is added piperidine (0.1 $cm^3$, 1.0 mmol). The mixture is then degassed with nitrogen before 2-(3-ethyl-4-oxothiazolidin-2-ylidene)malononitrile (134 mg, 0.69 mmol) is added. The solution is then further degassed and stirred at 23° C. for 17 hours. The reaction mixture is then added to methanol (300 $cm^3$) washing in with methanol (3×5 $cm^3$) and dichloromethane (5 $cm^3$), before filtering the precipitate, washing in with methanol (2×10 $cm^3$). The filtered solid is washed with additional methanol (3×10 $cm^3$) and the crude product purified by column chromatography eluting with a graded solvent system (40-60 petrol:dichloromethane; 1:1-2:3). Final purification is achieved by trituration with methanol (3×10 $cm^3$) washing the filtered solid with 40-60 petrol (3×10 $cm^3$), diethyl ether (10 $cm^3$) and acetone (10 $cm^3$) to give Compound 21 (144 mg, 36%) as a dark blue/black solid. $^1H$ NMR (400 MHz, $CDCl_3$) 8.05 (2H, s), 7.41 (2H, s), 7.10-7.16 (16H, m), 4.32 (4H, q, J 7.1), 2.58 (8H, t, J 7.8), 1.56-1.64 (8H, m), 1.40 (6H, t, J 7.1), 1.22-1.36 (40H, m), 0.87 (12H, t, J 6.9).

Example 22

Intermediate 43

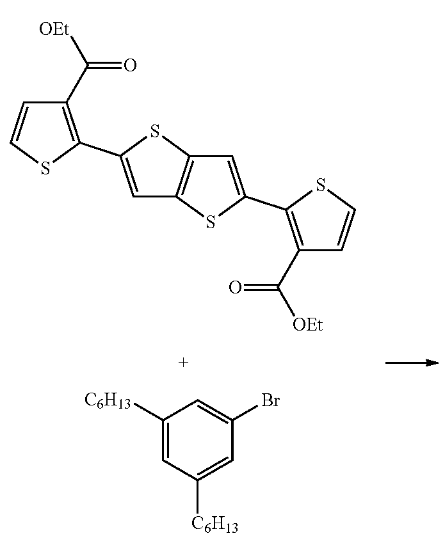

-continued

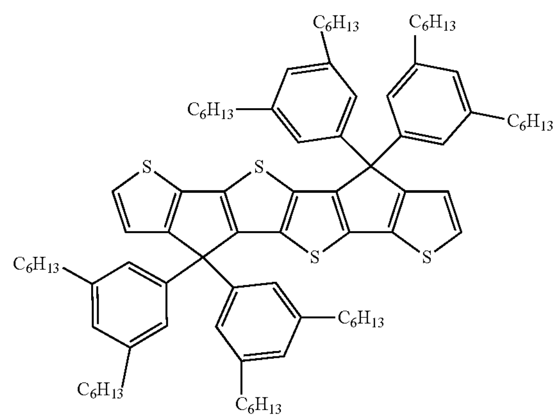

To a solution of 1-bromo-3,5-dihexyl-benzene (14.5 g, 44.6 mmol) in anhydrous tetrahydrofuran (60 $cm^3$) at −78° C. is added dropwise n-butyllithium (17.8 $cm^3$, 44.6 mmol, 2.5 M in hexane) over 10 minutes. The reaction is stirred for 2 hours and ethyl 2-[5-(3-ethoxycarbonyl-2-thienyl)thieno[3,2-b]thiophen-2-yl]thiophene-3-carboxylate (4.00 g, 8.92 mmol) added. The reaction is warmed to 23° C. and stirred for 17 hours. Water (100 $cm^3$) added and the product extracted with ether (100 $cm^3$). The organic phase is washed with water (2×50 $cm^3$), dried over anhydrous magnesium sulfate, filtered and the solvent removed in vacuo. The crude is purified by flash chromatography eluting with 40-60 petrol then dichloromethane. The solid is suspended in toluene (40 $cm^3$), p-toluene sulphonic acid (2.0 g) added and the reaction mixture heated at 60° C. for 4 hours. The solid is collected by filtration, washed with toluene (50 $cm^3$) and purified by flash chromatography using a graded solvent system (40-60 petrol:dichloromethane; 1:0 to 95:5) to give intermediate 43 (2.5 g, 21%) as a pale brown oil. $^1H$ NMR (400 MHz, $CDCl_3$) 7.07 (2H, d, J 4.9), 6.96 (2H, d, J 4.9), 6.78 (4H, d, J 1.6), 6.74 (8H, d, J 1.5), 2.40 (16H, t, J 8.0), 1.40-1.48 (16H, m), 1.10-1.26 (48H, m), 0.69-0.82 (24H, m).

Intermediate 44

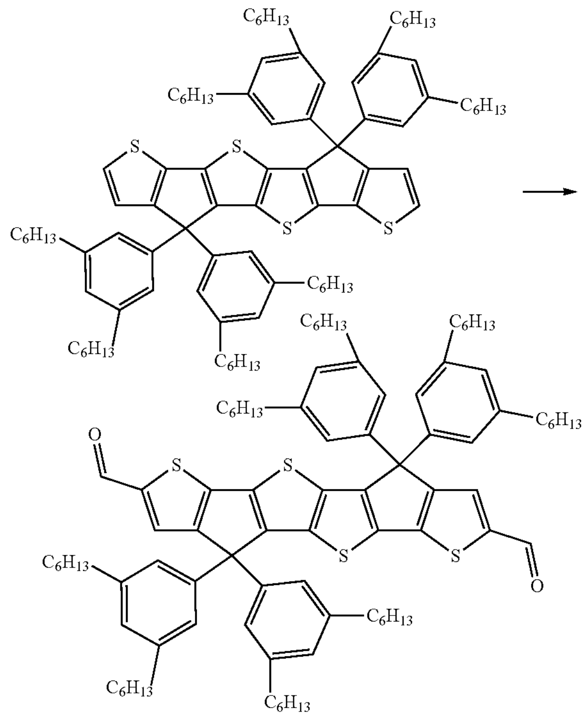

To intermediate 21 (0.50 g, 0.38 mmol), anhydrous N,N-dimethylformamide (0.40 $cm^3$, 5.2 mmol) chloroform (20 $cm^3$) at 0° C. is added dropwise phosphorus oxychloride (0.47 $cm^3$, 5.0 mmol). The reaction is heated at 70° C. for 18 hours before cooling to 60° C., saturated aqueous sodium acetate solution (7 $cm^3$) is added and the mixture stirred for 1 hour. The organic phase is separated and washed with water (20 $cm^3$) dried with anhydrous sodium sulphate, filtered and the solvent removed in vacuo. The solid is triturated in acetone (3×5 $cm^3$) to give intermediate 43 (400 mg, 76%) as a bright orange solid. $^1$H NMR (400 MHz, $CD_2Cl_2$) 9.78 (2H, s), 7.64 (2H, s), 6.90 (4H, d, J 1.6), 6.78 (8H, d, J 1.6), 2.46 (16H, d, J 7.9), 1.42-1.51 (16H, m), 1.17-1.28 (48H, m), 0.76-0.85 (24H, m).

Compound 22

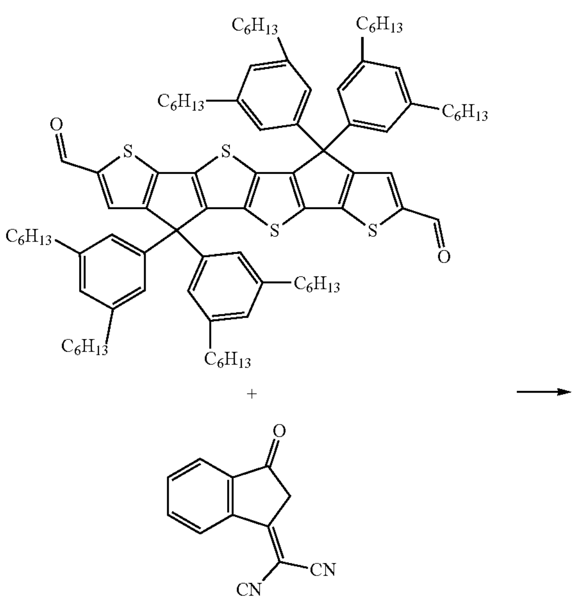

-continued

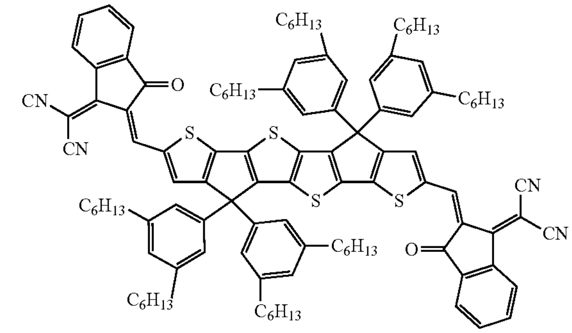

To a degassed mixture of 2-(3-oxo-indan-1-ylidene)-malononitrile (100 mg, 0.5 mmol), intermediate 44 (100 mg, 0.07 mmol) and chloroform (10 $cm^3$) is added pyridine (0.41 $cm^3$, 5.1 mmol) and the mixture further degassed. The reaction mixture is stirred for 4 hours, methanol (40 $cm^3$) added and the suspension filtered. The solid is then washed with methanol (40 $cm^3$) to give Compound 22 (101 mg, 84%) as a dark blue solid. $^1$H NMR (400 MHz, $CDCl_3$) 8.87 (2H, s), 8.64-8.71 (2H, m), 7.84-7.96 (2H, m), 7.67-7.79 (6H, m), 6.93-6.98 (4H, m), 6.77-6.83 (8H, m), 2.52 (16H, t, J 7.8), 1.53 (16H, d, J 7.9), 1.21-1.35 (46H, m), 0.80-0.88 (24H, m).

Example 23

Intermediate 45

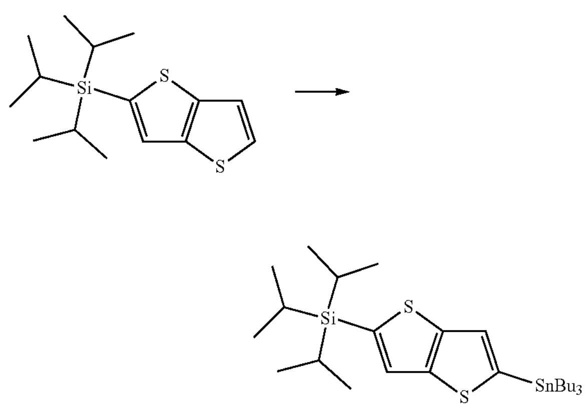

To a solution of triisopropyl-thieno[3,2-b]thiophen-2-yl-silane (11.86 g, 40.0 mmol) in anhydrous tetrahydrofuran (100 $cm^3$) at −78° C. is added dropwise n-butyllithium (20.8 $cm^3$, 52.0 mmol, 2.5 M in hexane) over 20 minutes. After addition, the reaction mixture is stirred at −78° C. for 120 minutes and then tributyltin chloride (15.8 $cm^3$, 56.0 mmol) is added in one go. The mixture is then allowed to warm to 23° C. over 17 hours and the solvent removed in vacuo. The crude is diluted in 40-60 petrol (250 $cm^3$) and filtered through a zeolite plug (50 g). The plug is washed with additional 40-60 petrol (250 $cm^3$). The solvent is removed in vacuo to give intermediate 45 (23.1 g, 99%) as a clear oil.

$^1$H-NMR (400 MHz, $CD_2Cl_2$) 7.27 (1H, d J 0.7), 7.1 (1H, s), 1.35-1.63 (9H, m), 1.17-1.34 (12H, m), 0.98-1.13 (18H, m), 0.65-0.91 (12H, m).

Intermediate 46

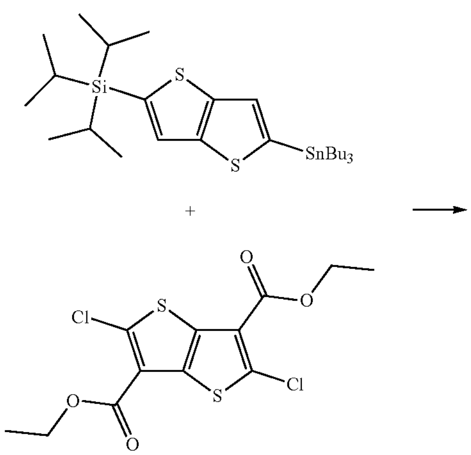

-continued

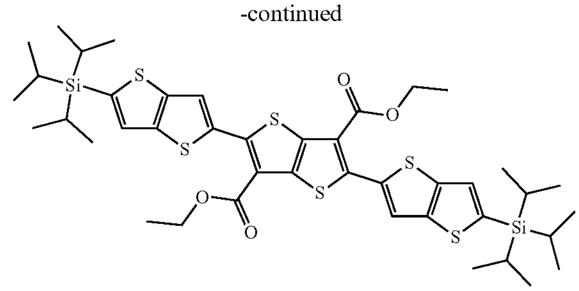

A mixture of intermediate 31 (7.5 g, 21 mmol), intermediate 45 (17.8 g, 30.4 mm) and anhydrous toluene (300 $cm^3$) is degassed by nitrogen for 25 minutes. To the mixture is added tetrakis(triphenylphosphine)palladium(0) (500 mg, 0.43 mmol) and the mixture further degassed for 15 minutes. The mixture is stirred at 85° C. for 17 hours. The reaction mixture is filtered hot through a celite plug (50 g) and washed through with hot toluene (100 $cm^3$). The solvent reduced in vacuo to 100 $cm^3$ and cooled in an ice bath to form a suspension. The product is filtered, washed with water (100 $cm^3$) and methanol (100 $cm^3$), collected and dried under vacuum to give intermediate 46 (9.5 g, 71%) as a yellow crystalline solid. $^1$H-NMR (400 MHz, $CDCl_3$) 7.75 (2H, d, J 0.7), 7.30 (2H, d, J 0.7), 4.36 (4H, q, J 7.2), 1.23-1.43 (12H, m), 1.07 (36H, d, J 7.3).

Intermediate 47

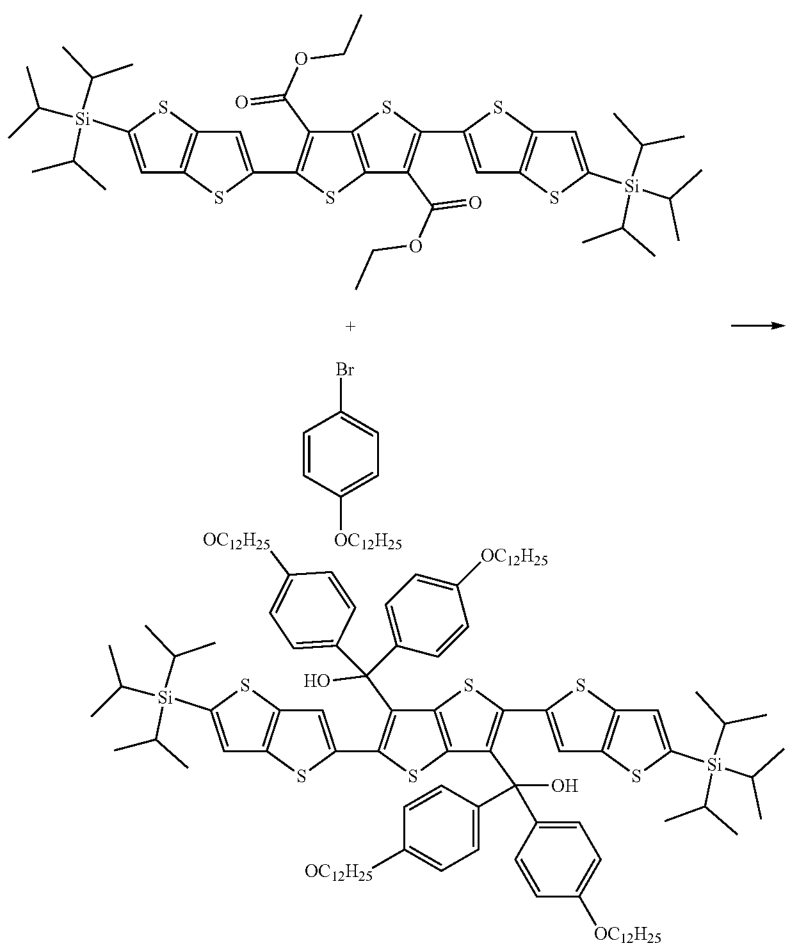

To a suspension of 1-bromo-4-dodecyloxy-benzene (10.6 g, 30.9 mmol) in anhydrous tetrahydrofuran (167 $cm^3$) at −78° C. is added dropwise tert-butyllithium (36.4 $cm^3$, 61.8 mmol, 1.7 M in pentane) over 60 minutes. After addition, the reaction mixture is stirred at −78° C. for 120 minutes. Intermediate 46 (6.0 g, 6.9 mmol) is added in one go. The mixture is then allowed to warm to 23° C. over 17 hours. Diethyl ether (200 $cm^3$) and water (200 $cm^3$) are added and the mixture stirred at 23° C. for 30 minutes. The product is extracted with diethyl ether (3×200 $cm^3$). The combined organics is dried over anhydrous magnesium sulfate, filtered and the solvent removed in vacuo. The crude is purified using silica gel column chromatography (40-60 petrol:diethyl ether; 7:3). The solid triturated with methanol (200 $cm^3$) and collected by filtration to give intermediate 47 (10.3 g, 82%) as a cream solid. $^1$H NMR (400 MHz, $CDCl_3$) 7.15-7.23 (10H, m), 6.77-6.85 (8H, m), 6.65 (2H, d, J 0.7), 3.45 (2H, s), 3.95 (8H, s), 1.71-1.85 (8H, m), 1.20-1.52 (72H, m), 1.11 (36H, d, J 7.3), 0.82-0.95 (12H, m).

Nitrogen gas is bubbled through a solution of intermediate 47 in anhydrous toluene (250 $cm^3$) at 0° C. for 60 minutes. Amberlyst 15 strong acid (50 g) is added and the mixture degassed for a further 30 minutes. The resulting suspension is stirred at 70° C. for 2 hours. The reaction mixture allowed to cool to 23° C., filtered and the solvent removed in vacuo. The crude is triturated with acetone (200 $cm^3$). The solid is filtered to give intermediate 48 (4.2 g, 89%) as a dark orange solid. $^1$H NMR (400 MHz, $CDCl_3$) 7.28 (4H, m), 7.16-7.24 (8H, m), 6.75-6.93 (8H, m), 3.91 (8H, t, J 6.5), 1.67-1.82 (8H, m), 1.37-1.48 (8H, m), 1.19-1.37 (64H, m), 0.80-1.00 (12H, m).

Intermediate 49

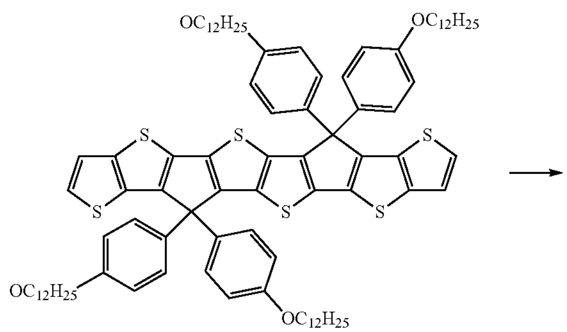

Intermediate 48

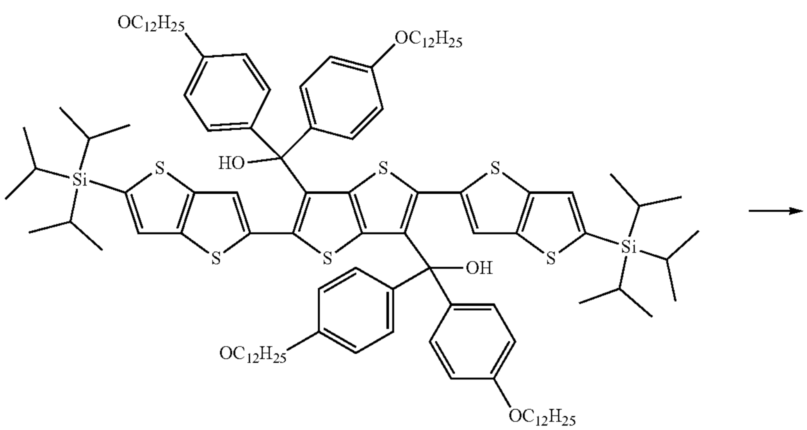

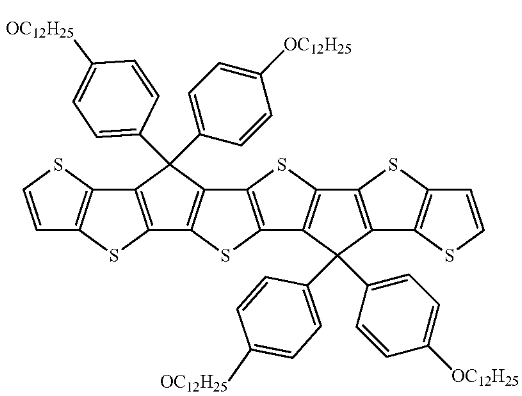

-continued

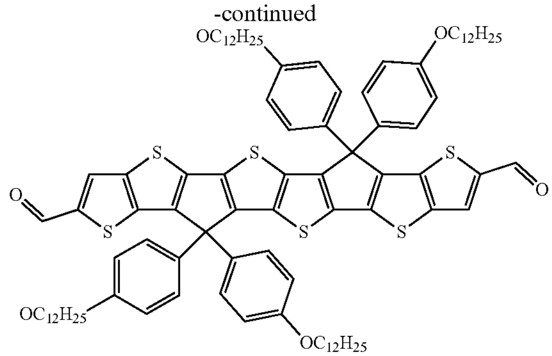

To a solution of intermediate 48 (0.6 g, 0.41 mmol) in anhydrous tetrahydrofuran (24 $cm^3$) at −78° C. is added dropwise n-butyllithium (0.7 $cm^3$, 1.6 mmol, 2.5 M in hexane) over 10 minutes. After addition, the reaction mixture is stirred at −78° C. for 60 minutes. N,N-dimethylformamide (0.16 $cm^3$, 2.4 mmol) is added in one go and the mixture is allowed to warm to 23° C. over 2 hours. Diethyl ether (50 $cm^3$) and water (50 $cm^3$) are added and the mixture stirred at 23° C. for 30 minutes. The product is extracted with diethyl ether (3×100 $cm^3$). The combined organics are dried over anhydrous magnesium sulfate, filtered and the solvent removed in vacuo. The crude is purified using silica gel column chromatography (40-60 petrol:dichloromethane; 8:2) to give intermediate 49 (380 mg, 61%) as a dark red oil. $^1$H NMR (400 MHz, $CDCl_3$) 9.90 (2H, s), 7.94 (2H, s), 7.08-7.23 (8H, m), 6.78-6.93 (8H, m), 3.91 (8H, t, J 6.5), 1.65-1.85 (8H, m), 1.17-1.51 (72H, m), 0.82-0.96 (12H, m).

Compound 23

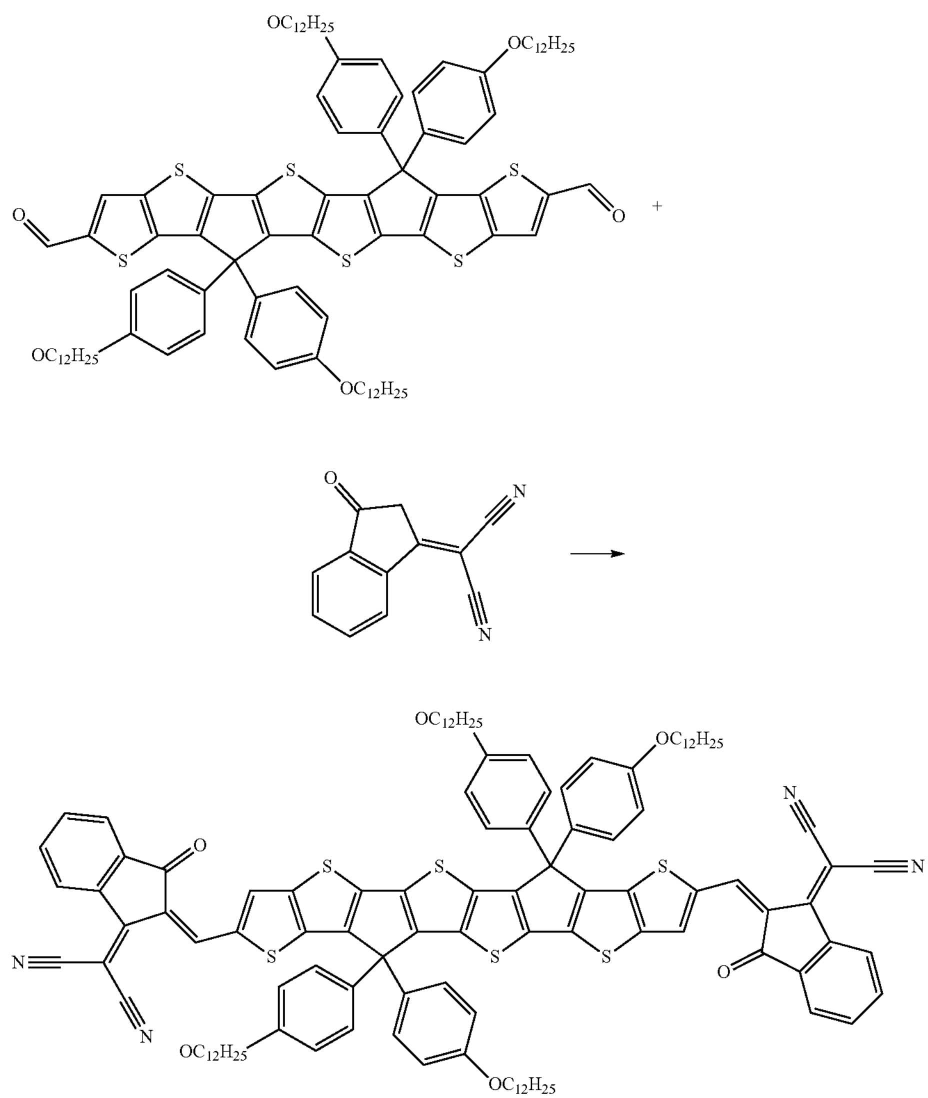

To a solution of intermediate 49 (370 mg, 0.24 mmol) in anhydrous chloroform (26 $cm^3$) is added pyridine (1.4 $cm^3$, 17 mmol). The mixture is then degassed with nitrogen before 3-(dicyanomethylidene) indan-1-one (280 mg, 1.4 mmol) is added. The solution is then further degassed and stirred at 23° C. for 20 minutes. The mixture is stirred at 40° C. for 2 hours and then the solvent is removed in vacuo. The crude is triturated with ethanol (200 $cm^3$) to produce a heavy suspension which is collected by filtration and the solid washed with acetone (50 $cm^3$). The crude is dissolved in dichloromethane (20 $cm^3$) added precipitated into acetone (250 $cm^3$) to form a suspension. The solid collected by filtration to give Compound 23 (437 mg, 96%) as a gray solid. $^1H$ NMR (400 MHz, $CDCl_3$) 8.87 (2H, s), 8.63-8.74 (2H, m), 8.13 (2H, s), 7.87-7.97 (2H, m), 7.68-7.82 (4H, m), 7.23 (8H, d, J 8.8), 6.90 (8H, d, J 9.0), 3.92 (8H, t, J 6.5), 1.69-1.84 (8H, m), 1.16-1.52 (72H, m), 0.80-0.97 (12H, m).

Example 24

Intermediate 50

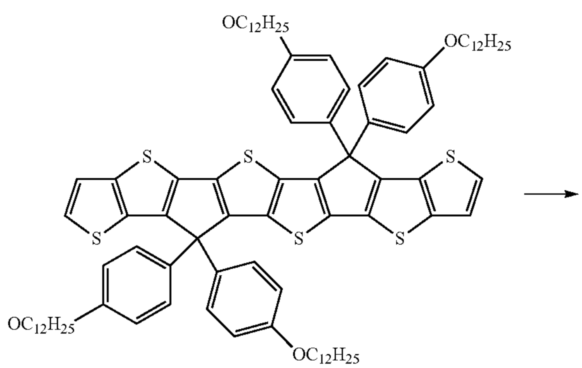

-continued

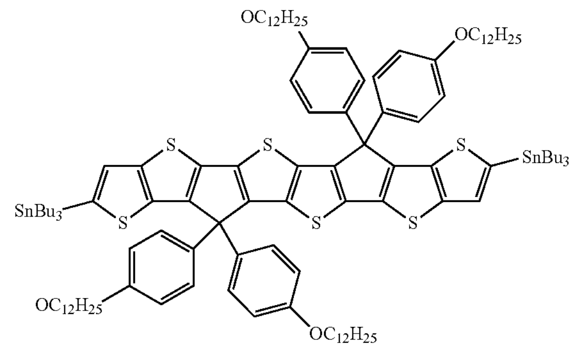

To a solution of intermediate 49 (1.6 g, 1.1 mmol) in anhydrous tetrahydrofuran (47 $cm^3$) at −78° C. is added dropwise n-butyllithium (1.7 $cm^3$, 4.3 mmol, 2.5 M in hexane) over 20 minutes. After addition, the reaction mixture is stirred at −78° C. for 60 minutes. Tributyltin chloride (1.3 $cm^3$, 4.9 mmol) is added in one go and then the mixture is allowed to warm to 23° C. over 72 hours. The solvent removed in vacuo. The crude is purified by passing through a zeolite plug (40-60 petrol) followed by triturating in ethanol (2×100 $cm^3$) to give intermediate 50 (2.0 g, 88%) as a dark red oil. $^1H$ NMR (400 MHz, $CDCl_3$) 7.28 (2H, s), 7.18-7.24 (8H, m), 6.79-6.87 (8H, m), 3.91 (8H, t, J 6.6), 1.51-1.83 (32H, m), 1.20-1.48 (114H, m), 1.07-1.18 (15H, m), 0.76-1.03 (69H, m).

Compound 24

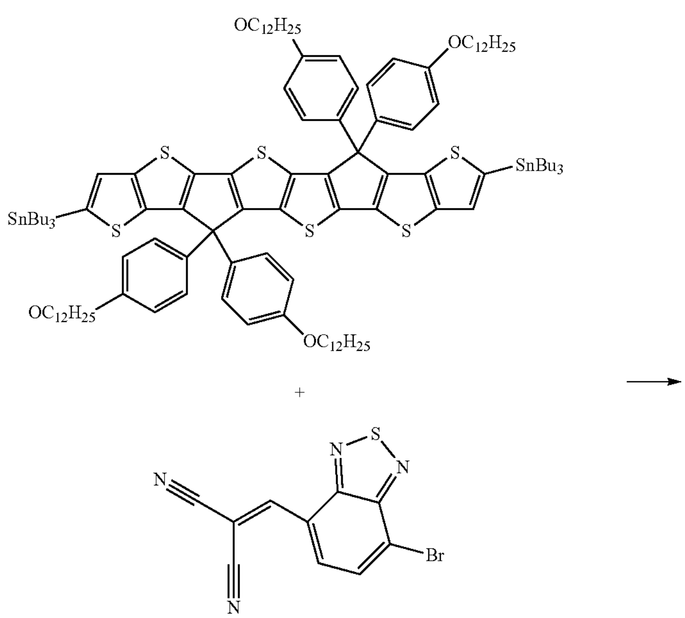

-continued

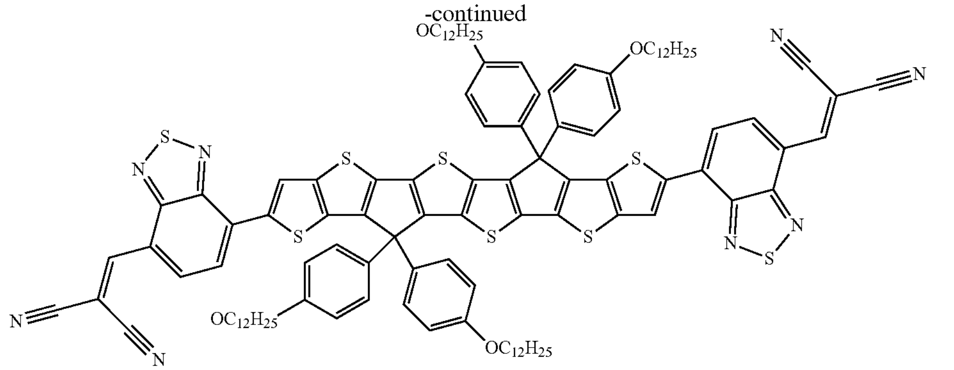

A mixture of intermediate 50 (700 mg, 0.34 mmol), 2-(7-bromo-benzo[1,2,5]thiadiazol-4-ylmethylene)-malononitrile (218 mg, 0.75 mmol), tri-o-tolyl-phosphine (31 mg, 0.75 mmol) and anhydrous toluene (41 $cm^3$) is degassed by nitrogen for 10 minutes. To the mixture is added tris (dibenzylideneacetone) dipalladium(0) (25 mg, 0.03 mmol) and the mixture further degassed for 15 minutes. The mixture is stirred at 80° C. for 17 hours and the solvent removed in vacuo. Dichloromethane (200 $cm^3$) and water (200 $cm^3$) are added and the mixture stirred at 23° C. for 30 minutes. The product is extracted with dichloromethane (3×100 $cm^3$). The combined organics are dried over anhydrous magnesium sulfate, filtered and the solvent removed in vacuo. The crude is dissolved in dichloromethane and precipitated into acetone. The solid collected by filtration to give Compound 24 (451 mg, 70%) as a grey solid. $^1$H NMR (400 MHz, $CD_2Cl_2$) 8.55-8.74 (6H, m), 7.83 (2H, d, J 7.8), 7.14 (8H, d, J 8.8), 6.77 (8H, d, J 8.8), 3.82 (8H, t, J 6.6), 1.58-1.69 (8H, m), 1.07-1.40 (72H, m), 0.68-0.85 (12H, m).

Example 25

Intermediate 51

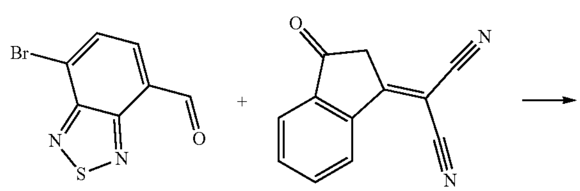

-continued

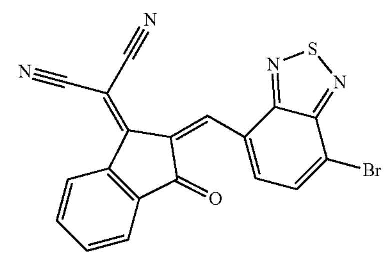

To a solution of 7-bromo-benzo[1,2,5]thiadiazole-4-carbaldehyde (2.0 g, 8.2 mmol) in anhydrous chloroform (875 $cm^3$) is added pyridine (46.5 $cm^3$, 576 mmol). The mixture is then degassed with nitrogen before 3-(dicyanomethylidene) indan-1-one (4.0 g, 21 mmol) is added. The solution is then further degassed and stirred for 20 minutes. The mixture is stirred at 40° C. for 17 hours. The solid collected by filtration and washed with acetone (200 $cm^3$), water (200 $cm^3$), diethyl ether (200 $cm^3$) and dichloromethane (200 $cm^3$) to give intermediate 51 (3.0 g, 86%) as a pale yellow solid with very limited solubility.

Compounds 25 and 26

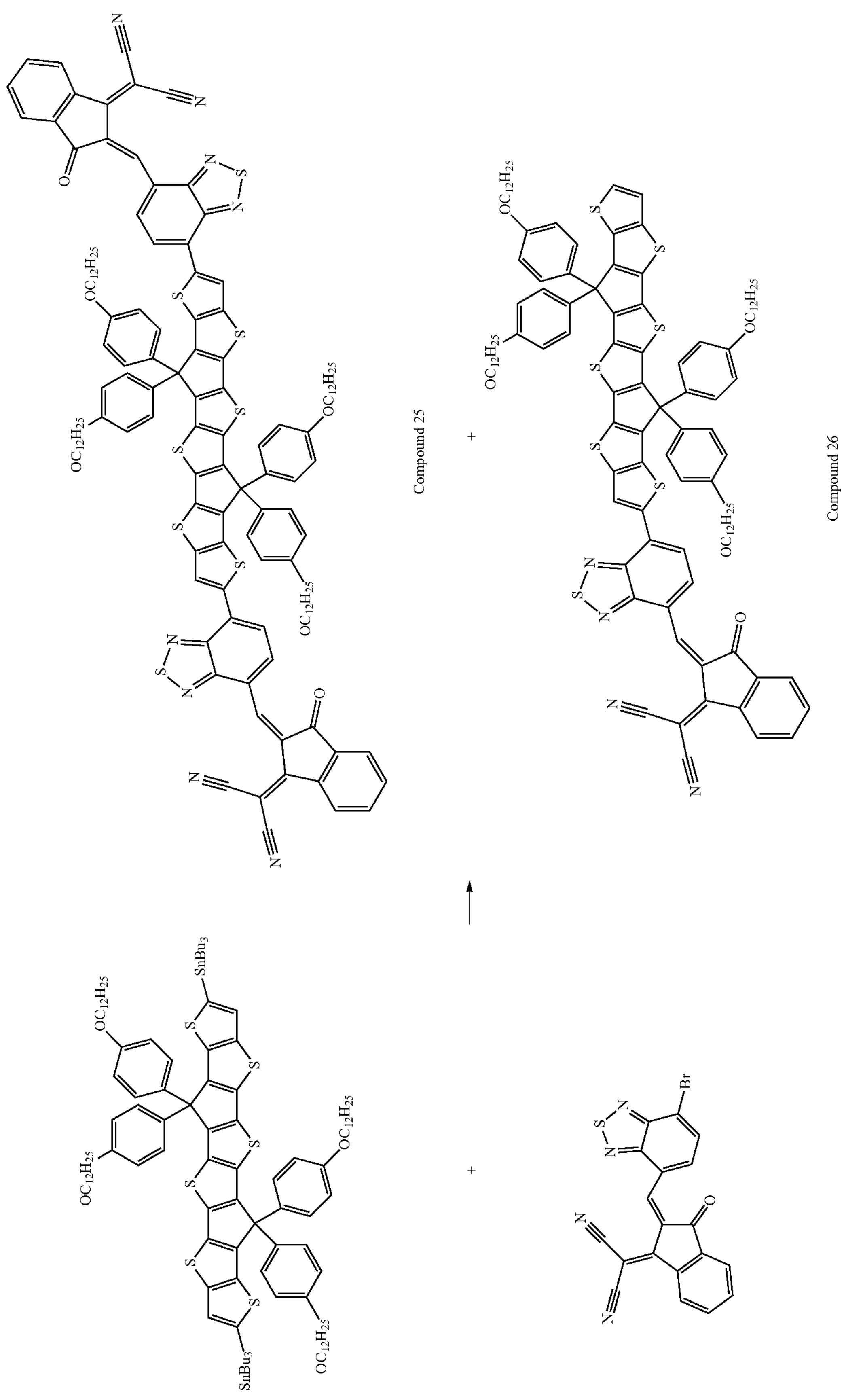
Compound 25
Compound 26

A mixture of intermediate 50 (700 mg, 0.34 mmol), intermediate 51 (356 mg, 0.85 mmol), tri-o-tolyl-phosphine (31 mg, 0.10 mmol) and anhydrous toluene (36 $cm^3$) is degassed by nitrogen for 10 minutes. To the mixture is added tris(dibenzylideneacetone) dipalladium(0) (25 mg, 0.03 mmol) and the mixture further degassed for 15 minutes. The mixture is stirred at 80° C. for 17 hours and the solvent removed in vacuo. The crude is stirred in acetone (200 $cm^3$) to form a suspension and the solid collected by filtration. The crude is purified using silica gel column chromatography eluting with 40-60 petrol:dichloromethane; 8:2 to give compound 25 (217 mg, 30%) and compound 26 (136 mg, 22%) as a dark grey solids. Compound 92: $^1$H NMR (400 MHz, $CD_2Cl_2$) 9.32-9.52 (2H, m), 9.15 (2H, d, J 8.1), 8.52-8.75 (4H, m), 7.61-7.98 (8H, m), 7.16 (8H, d, J 8.8), 6.79 (8H, d, J 8.8), 3.83 (8H, t, J 6.5), 1.56-1.73 (8H, m), 0.94-1.38 (72H, m), 0.77 (12H, t, J 6.6). Compound 93: $^1$H NMR (400 MHz, $CD_2Cl_2$) 9.41 (1H, s), 9.14 (1H, d, J 8.0), 8.56-8.71 (2H, m), 7.57-7.97 (4H, m), 7.02-7.30 (10H, m), 6.74 (8H, dd, J 9.0 18.1), 3.70-3.91 (8H, m), 1.54-1.72 (8H, m), 1.06-1.72 (72H, m), 0.70-0.84 (12H, m).

Example 26

Intermediate 52

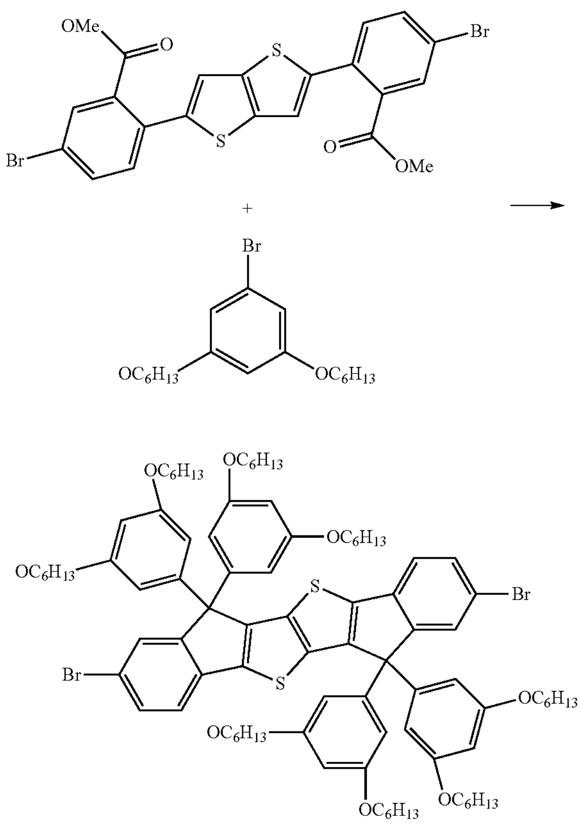

To a solution of 1-bromo-3,5-bis-hexyloxy-benzene (8.96 g, 25.1 mmol) in anhydrous tetrahydrofuran (50 $cm^3$) at −78° C. is added dropwise n-butyllithium (10.0 $cm^3$, 25.1 mmol). The mixture is stirred at −78° C. for 2 hours before methyl 5-bromo-2-[5-(4-bromo-2-methoxycarbonyl-phenyl)-3a,6a-dihydrothieno[3,2-b]thiophen-2-yl]benzoate (2.85 g, 5.0 mmol) is added in one portion. The mixture is allowed to warm to 23° C. and stirred for 17 hours. The reaction is carefully poured onto water (100 $cm^3$) and the organics extracted with dichloromethane (2×100 $cm^3$) is added. The combined organic layer is dried over anhydrous magnesium sulfate, filtered and the solvent removed in vacuo. The residue is purified by column chromatography (40-60 petol:dichloromethane; 6:4). The intermediate diol (3.42 g, 3.65 mmol) is taken up in toluene (200 $cm^3$) and p-toluenesulfonic acid monohydrate (1.39 g, 7.30 mmol) added. The mixture is stirred at 50° C. for 90 minutes and the mixture allowed to cool to 23° C. Water (100 $cm^3$) is added and the organic layer washed with water (100 $cm^3$) and brine (100 $cm^3$). The organic layer is dried over anhydrous magnesium sulfate, filtered and the solvent removed in vacuo. The crude product is triturated in ice-cooled acetone and the solid collected by filtration to give intermediate 52 (3.08 g, 87%) as a yellow solid. $^1$H NMR (400 MHz, $CDCl_3$) 7.54 (2H, d, J 1.8), 7.39 (2H, dd, J 8.1, 1.8), 7.17 (2H, d, J 8.1), 6.32 (12H, bs), 3.83 (16H, td, J 6.6, 1.6), 1.69 (16H, p, J 6.8), 1.37 (16H, tq, J 9.2, 4.9, 2.9), 1.29 (32H, dp, J 7.4, 4.6, 3.8), 0.80-0.91 (24H, m).

Intermediate 53

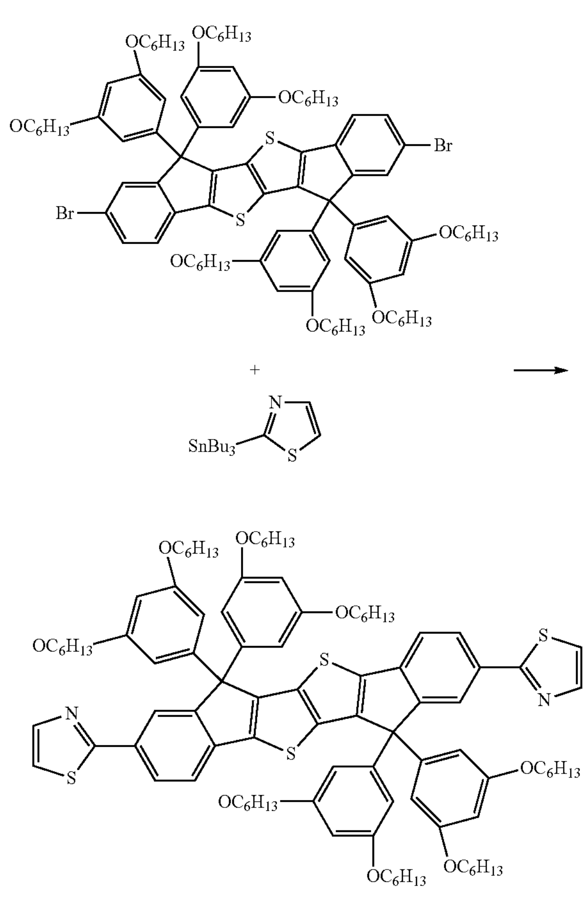

To a degassed solution of intermediate 52 (1.04 g, 0.66 mmol), 2-tributylstannanyl-thiazole (0.62 $cm^3$, 1.97 mmol) in toluene (50 $cm^3$) and N,N-dimethylformamide (10 $cm^3$) is added (tetrakis(triphenylphosphine))palladium(0) (76.1 mg, 0.07 mmol) and the mixture stirred at 110° C. for 5 days. The mixture is allowed to cool to 23° C. and the solvents removed in vacuo. The crude product is purified by column chromatography using a graded solvent system (40-60 petrol:dichloromethane: 6.5:4.5 to 3:7) to give intermediate 53 (973 mg, 93%) as a yellow oil. $^1$H NMR (400 MHz, $CDCl_3$) 8.07 (2H, d, J 1.5), 7.94 (2H, dd, J 8.0, 1.5), 7.82 (2H, d, J 3.3), 7.40 (2H, d, J 7.9), 7.27 (2H, d, J 3.2), 6.43 (8H, d, J 2.2), 6.34 (4H, t, J 2.2), 3.86 (16H, td, J 6.6, 1.8), 1.65-1.73 (16H, m), 1.25-1.42 (48H, m), 0.81-0.89 (24H, m).

Intermediate 54

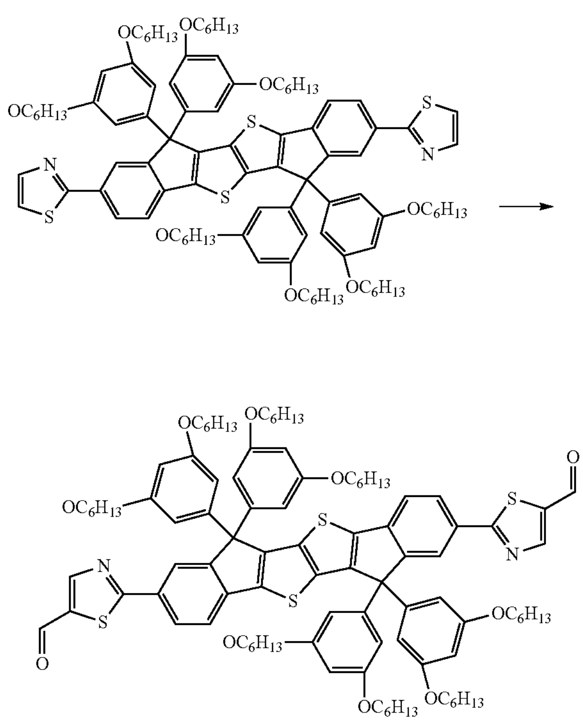

To a stirred solution of intermediate 53 (973 mg, 0.61 mmol) in anhydrous tetrahydrofuran (100 $cm^3$) at −78° C. is added dropwise n-butyllithium (0.98 $cm^3$, 2.5 mmol, 2.5 M in hexane). The reaction mixture is stirred for 2 hours before anhydrous N,N-dimethylformamide (0.21 $cm^3$, 2.8 mmol) is added. The mixture is allowed to warm to 23° C., stirred for 4 hours and methanol (3 $cm^3$) added. The mixture is diluted with $Et_2O$ (100 $cm^3$) and washed with water (2×100 $cm^3$). The organic layer is dried over anhydrous magnesium sulfate, filtered and the solvent removed in vacuo. The crude is purified by column chromatography using a graded solvent system (40-60 petrol:dichloromethane: 4:6 to 1:9) to give intermediate 54 (680 mg, 67%) as a red oil. $^1$H NMR (400 MHz, $CDCl_3$) 10.01 (2H, s), 8.37 (2H, s), 8.12 (2H, d, J 1.5), 7.99 (2H, dd, J 8.0, 1.6), 7.42 (2H, d, J 8.0), 6.40 (8H, d, J 2.2), 6.34 (4H, t, J 2.2), 3.85 (16H, td, J 6.6, 1.7), 1.64-1.73 (16H, m), 1.22-1.47 (48H, m), 0.80-0.89 (24H, m).

Compound 27

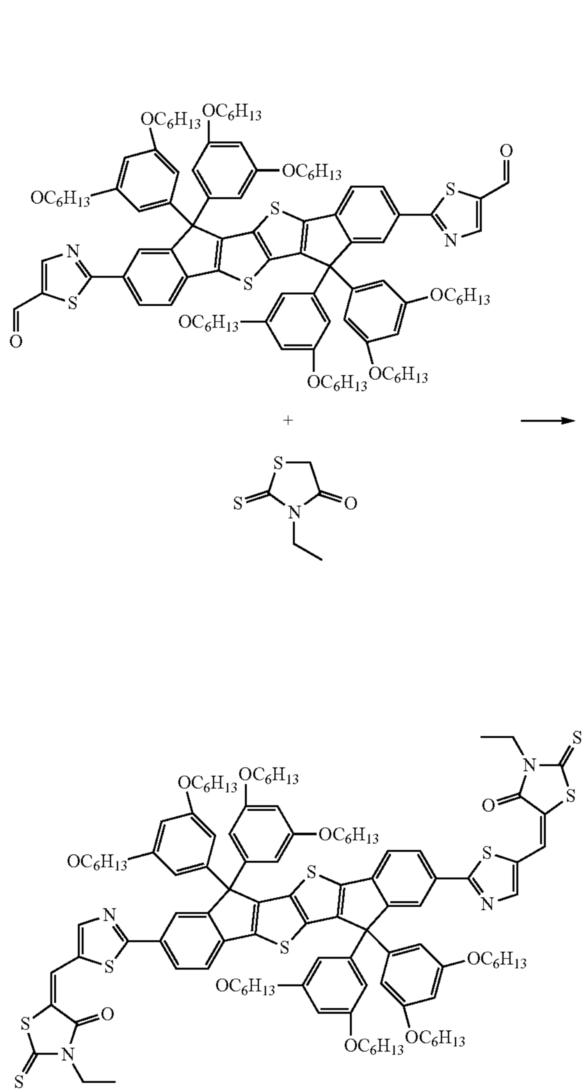

To a degassed solution of intermediate 54 (200 mg, 0.12 mmol), 3-ethyl-2-thioxo-thiazolidin-4-one (59 mg, 0.36 mmol) anhydrous N,N-dimethylformamide (10 $cm^3$) is added potassium carbonate (50 mg, 0.36 mmol) and the mixture is stirred for 16 hours. Dichloromethane is added and the organic layer washed with water (2×100 $cm^3$), brine (100 $cm^3$), dried over anhydrous magnesium sulfate, filtered and the solvent removed in vacuo. The residue is triturated in acetone and the solid collected by filtration to give Compound 27 (69 mg, 29%) as a shiny red solid. $^1$H NMR (400 MHz, $CDCl_3$) 8.11 (2H, d, J 1.7), 8.05 (2H, s), 7.96 (2H, dd, J 8.0, 1.7), 7.89 (2H, s), 7.42 (2H, d, J 8.0), 6.41 (8H, d, J 2.2), 6.35 (4H, t, J 2.2), 4.19 (4H, q, J 7.1), 3.82-3.90 (16H, m), 1.33-1.42 (16H, m), 1.38 (16H, dq, J 14.2, 6.6), 1.20-1.32 (38H, m), 0.85 (24H, t, J 6.8).

Example 27

Compound 28

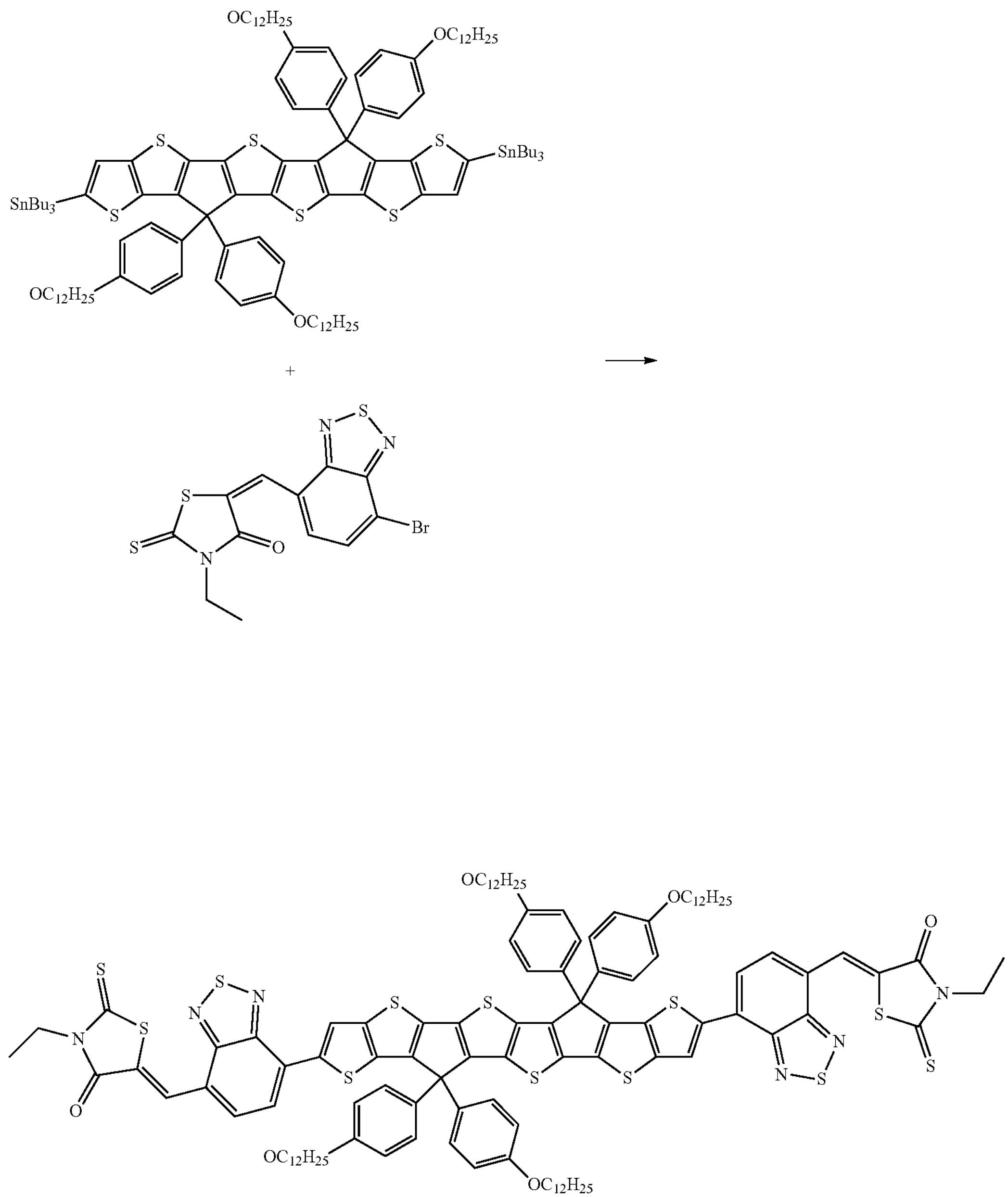

A mixture of intermediate 50 (500 mg, 0.24 mmol), 5-[1-(7-bromo-benzo[1,2,5]thiadiazol-4-yl)-meth-(E)-ylidene]-3-ethyl-2-thioxo-thiazolidin-4-one (197 mg, 0.51 mmol), tri-o-tolyl-phosphine (22 mg, 0.07 mmol) and anhydrous toluene (26 $cm^3$) is degassed by nitrogen for 10 minutes. To the mixture is added tris(dibenzylideneacetone) dipalladium(0) (18 mg, 0.02 mmol) and the mixture further degassed for 15 minutes. The mixture is stirred at 90° C. for 17 hours and the solvent removed in vacuo. The crude is stirred in acetone (200 $cm^3$) to form a suspension and the solid collected by filtration. The crude is purified using silica gel column chromatography eluted with 40-60 petrol:dichloromethane; 1:1 to give Compound 28 (193 mg, 38%) as a dark green solid. $^1$H NMR (400 MHz, $CD_2Cl_2$) 8.57 (2H, s), 8.34 (2H, s), 7.79 (2H, d, J 7.8), 7.58 (2H, d, J 7.8), 7.15 (8H, d, J 8.8), 6.77 (8H, d, J 8.6), 4.13 (4H, q, J 7.3), 3.81 (8H, t, J 6.5), 1.63 (8H, quin, J 6.9), 0.96-1.38 (78H, m), 0.77 (12H, t, J 6.6).

Example 28

Compound 29

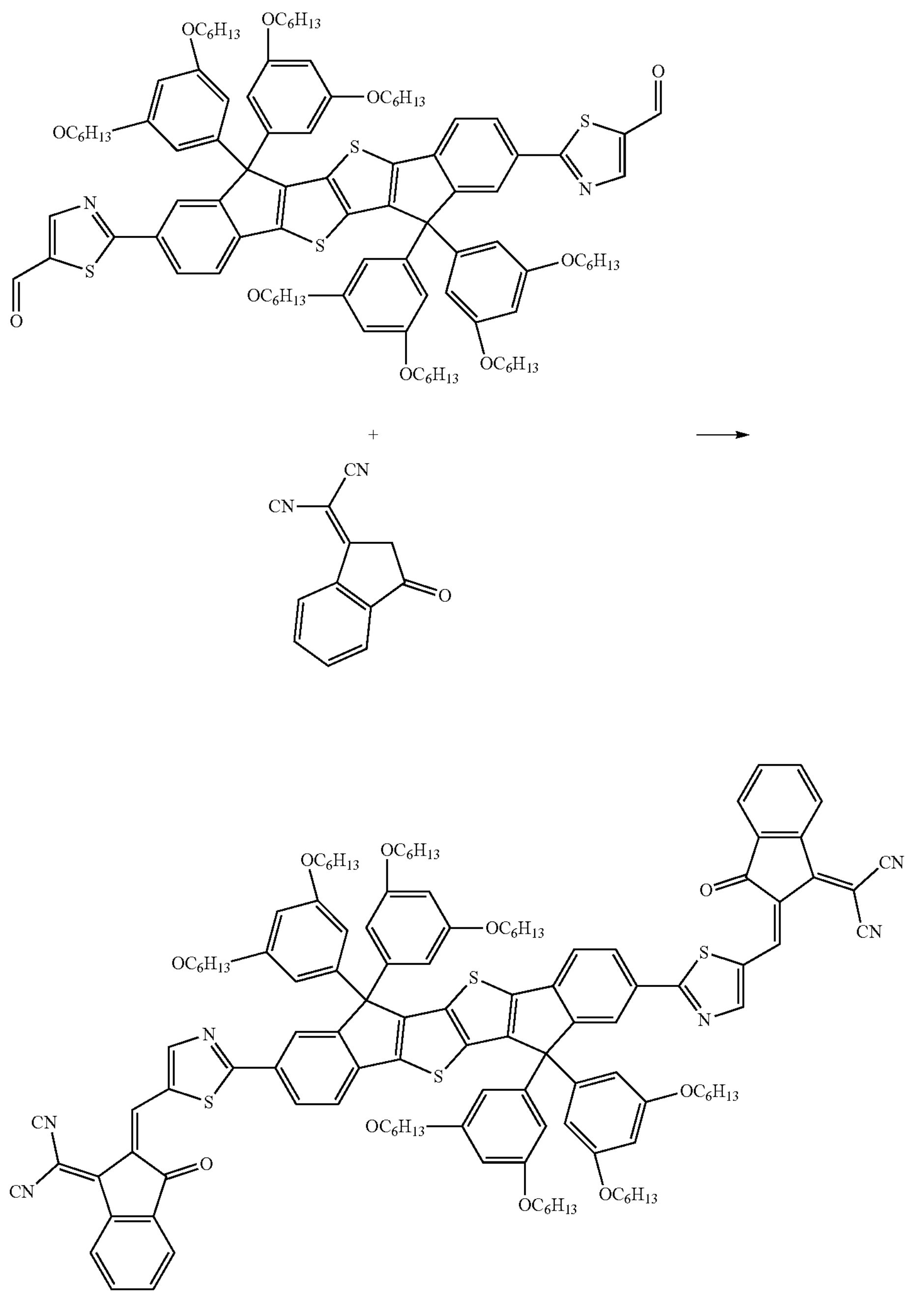

To a degassed solution of intermediate 54 (192 mg, 0.12 mmol) in chloroform (19 $cm^3$) and pyridine (1 $cm^3$) is added 2-(3-oxo-indan-1-ylidene)-malononitrile (68 mg, 0.35 mmol) and the mixture stirred for 2 hours. Aqueous hydrochloric acid (10 $cm^3$, 2 M) is added and the mixture diluted with dichloromethane (50 $cm^3$). The organic layer is washed with water (50 $cm^3$) and brine (50 $cm^3$), dried over anhydrous magnesium sulfate, filtered and the solvent removed in vacuo. The residue is triturated in acetone and the solid collected by filtration to give Compound 29 (182 mg, 78%) as a blue powder. $^1$H NMR (400 MHz, $CDCl_3$) 8.90 (2H, s), 8.74 (2H, d, J 7.2), 8.41 (2H, s), 8.28 (2H, d, J 1.6), 8.14 (2H, dd, J 8.0, 1.6), 7.95 (2H, d, J 7.2), 7.76-7.86 (4H, m), 7.45 (2H, d, J 8.1), 6.43 (8H, d, J 2.2), 6.36 (4H, t, J 2.2), 3.88 (16H, td, J 6.6, 1.7), 1.67-1.74 (16H, m), 1.35-1.42 (16H, m), 1.23-1.31 (32H, m), 0.84 (24H, t, J 7.0).

Example 29

Intermediate 55

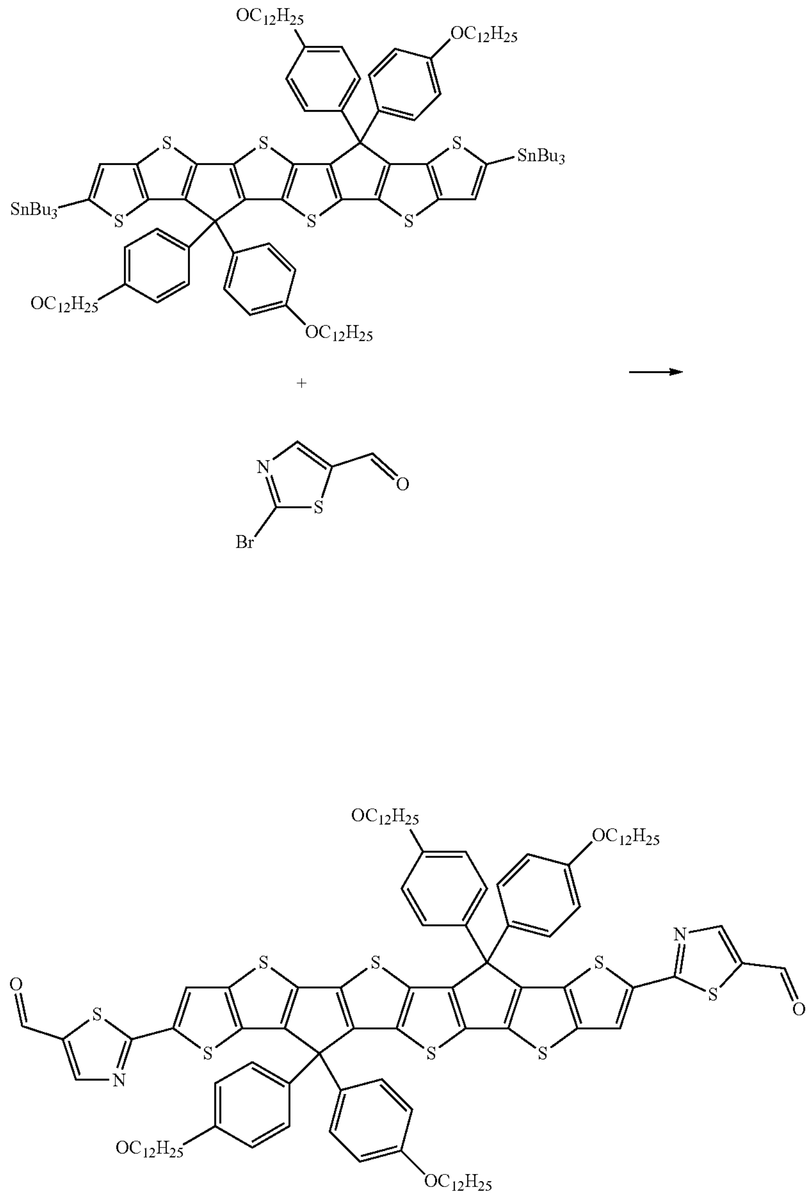

A mixture of intermediate 50 (400 mg, 0.19 mmol), 2-bromo-thiazole-5-carbaldehyde (112 mg, 0.58 mmol), tri-o-tolyl-phosphine (18 mg, 0.06 mmol) and anhydrous toluene (40 $cm^3$) is degassed by nitrogen for 10 minutes. To the mixture is added tris(dibenzylideneacetone) dipalladium(0) (14 mg, 0.02 mmol) and the mixture further degassed for 15 minutes. The mixture is stirred at 90° C. for 17 hours and the solvent removed in vacuo. The crude is stirred in acetone (200 $cm^3$) and the solid collected by filtration to give intermediate 55 (158 mg, 48%) as a dark purple solid. $^1$H-NMR (400 MHz, $CD_2Cl_2$) 9.89 (2H, s), 8.21 (2H, s), 7.82 (2H, s), 7.08 (8H, d, J 8.6), 6.68-6.81 (8H, m), 3.81 (8H, t, J 6.4), 1.64 (8H, brs), 1.10-1.36 (72H, m), 0.78 (12H, t, J 6.5).

Compound 30

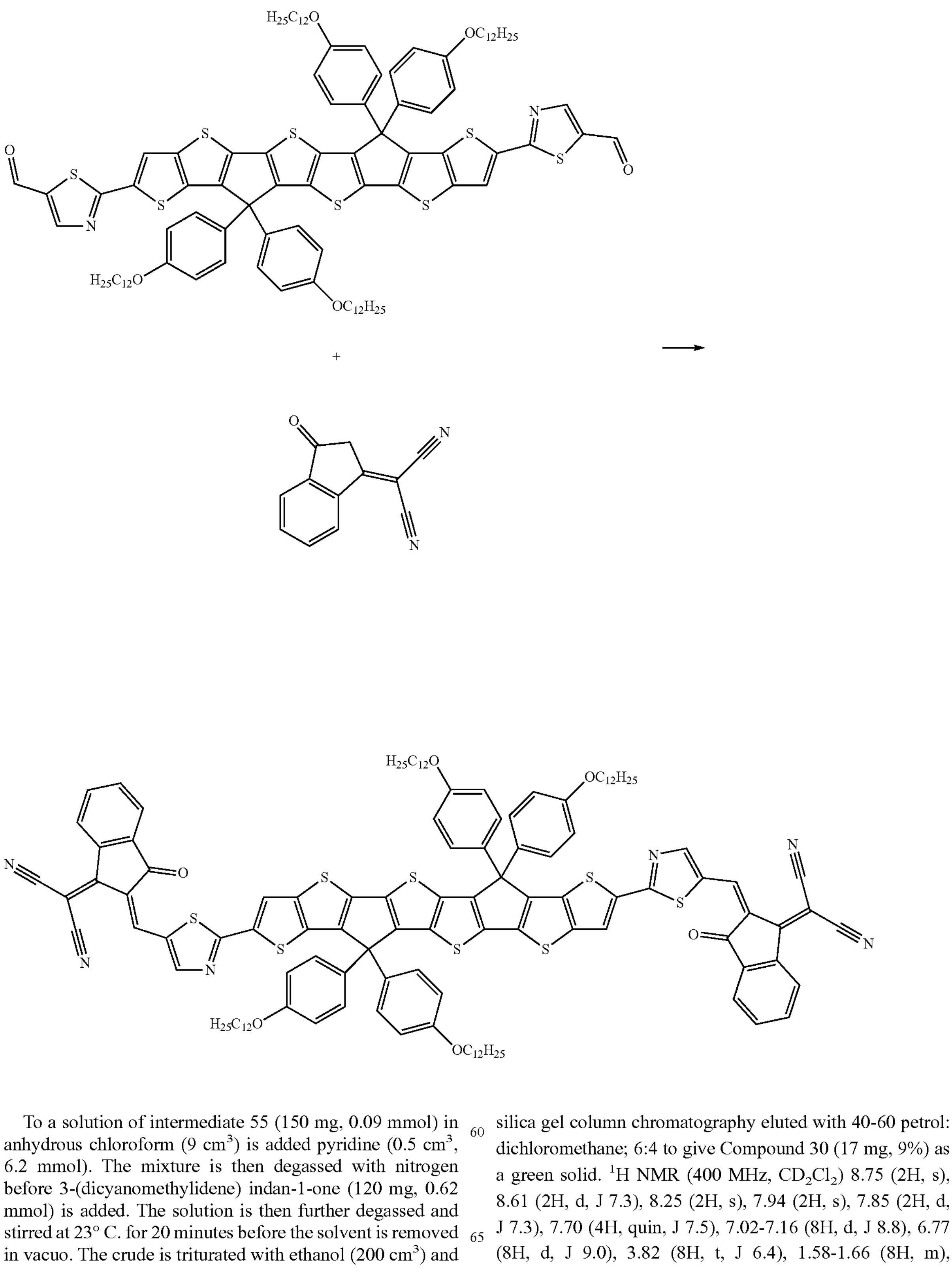

To a solution of intermediate 55 (150 mg, 0.09 mmol) in anhydrous chloroform (9 $cm^3$) is added pyridine (0.5 $cm^3$, 6.2 mmol). The mixture is then degassed with nitrogen before 3-(dicyanomethylidene) indan-1-one (120 mg, 0.62 mmol) is added. The solution is then further degassed and stirred at 23° C. for 20 minutes before the solvent is removed in vacuo. The crude is triturated with ethanol (200 $cm^3$) and the solid collected by filtration. The crude is purified using silica gel column chromatography eluted with 40-60 petrol: dichloromethane; 6:4 to give Compound 30 (17 mg, 9%) as a green solid. $^1$H NMR (400 MHz, $CD_2Cl_2$) 8.75 (2H, s), 8.61 (2H, d, J 7.3), 8.25 (2H, s), 7.94 (2H, s), 7.85 (2H, d, J 7.3), 7.70 (4H, quin, J 7.5), 7.02-7.16 (8H, d, J 8.8), 6.77 (8H, d, J 9.0), 3.82 (8H, t, J 6.4), 1.58-1.66 (8H, m), 1.07-1.39 (72H, m), 0.70-0.84 (12H, m).

Example 30

Compound 31

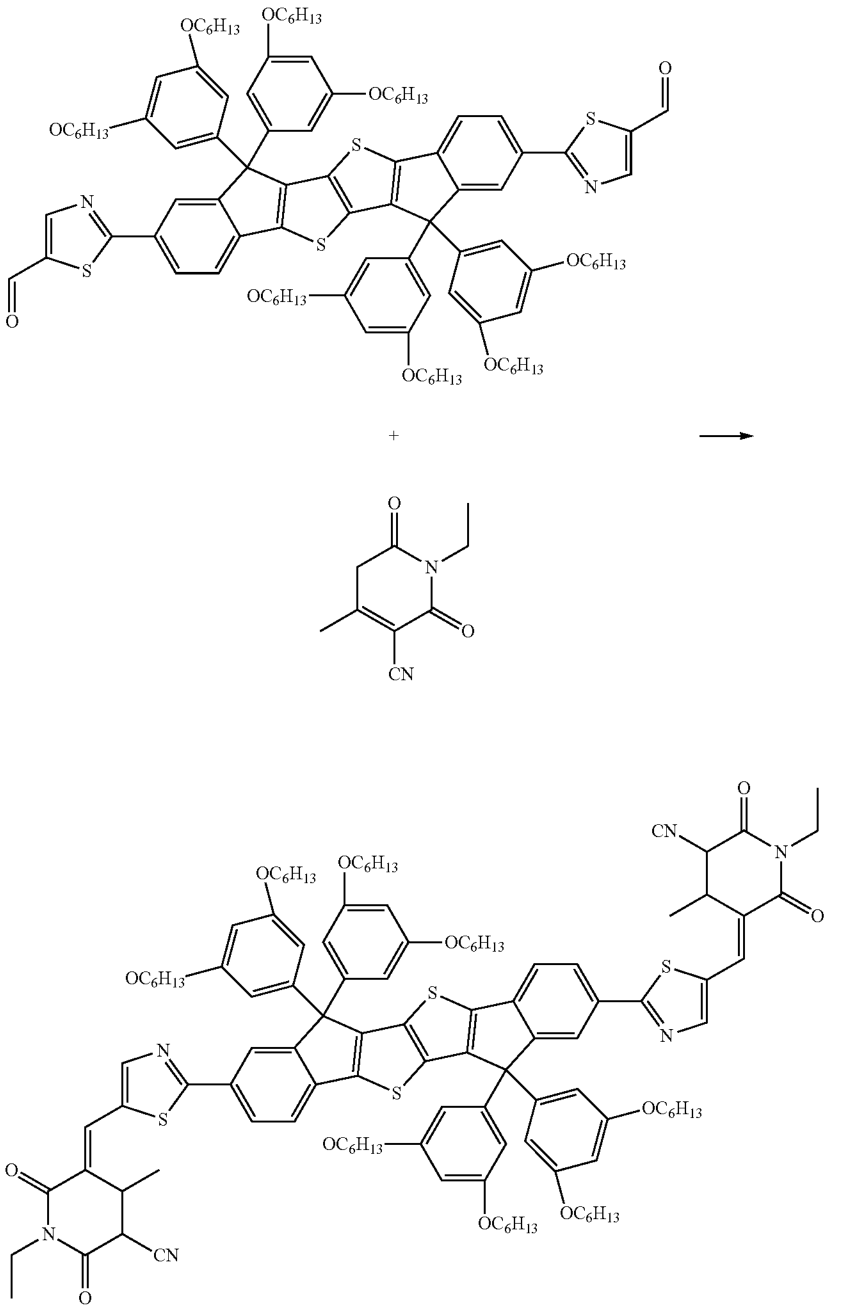

To a degassed solution of intermediate 55 (169 mg, 0.10 mmol), pyridine (2 $cm^3$) and chloroform (10 $cm^3$) is added 1-ethyl-4-methyl-2,6-dioxo-1,2,5,6-tetrahydro-pyridine-3-carbonitrile (55 mg, 0.31 mmol) and the mixture stirred for 20 hours. Aqueous hydrochloric acid (10 $cm^3$, 2 M) is added and the mixture diluted with dichloromethane (50 $cm^3$). The organic layer is washed with water (50 $cm^{3)}$ and brine (50 $cm^3$), dried over anhydrous magnesium sulfate, filtered and the solvent removed in vacuo. The crude is purified by column chromatography using a graded solvent system (40-60 petrol:dichloromethane: 2:8 to 0:1) followed by recrystallization (ethanol/dichloromethane) to give Compound 31 (69 mg, 34%) as a shiny blue solid. $^1H$ NMR (400 MHz, $CDCl_3$) 8.39 (2H, s), 8.24 (2H, d, J 1.5), 8.14 (2H, dd, J 8.1, 1.5), 7.90 (2H, s), 7.43 (2H, d, J 8.0), 6.42 (8H, d, J 2.1), 6.35 (4H, t, J 2.1), 4.07 (4H, q, J 7.1), 3.87 (16H, t, J 6.8), 2.65 (6H, s), 1.66-1.73 (16H, m), 1.32-1.43 (16H, m), 1.23-1.30 (38H, m), 0.85 (24H, t, J 6.9).

Example 31

Intermediate 56

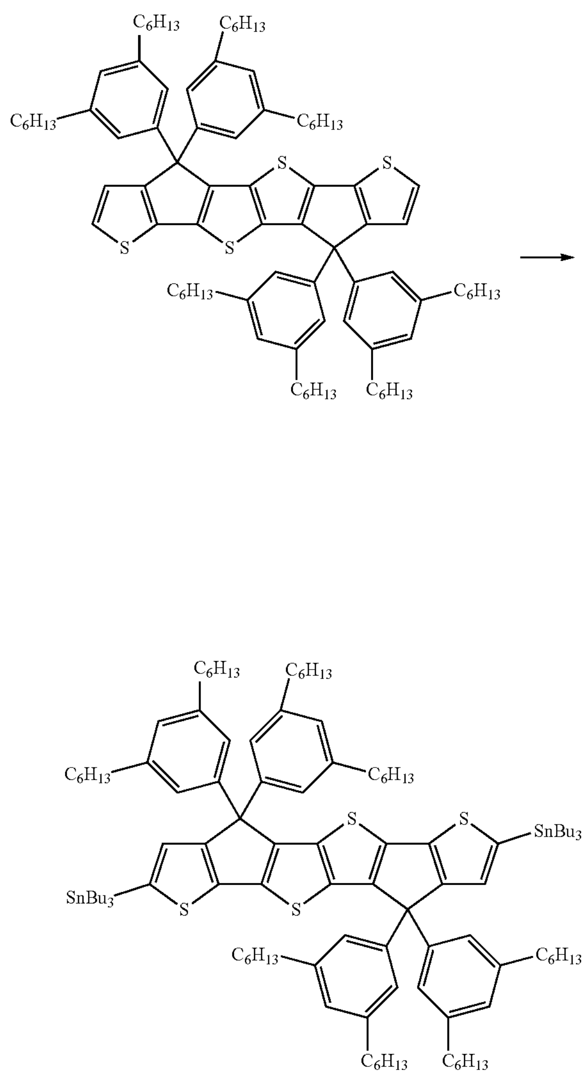

To a solution of intermediate 43 (1.60 g, 1.2 mmol) in anhydrous tetrahydrofuran (47 $cm^3$) at −78° C. is added dropwise n-butyllithium (1.96 $cm^3$, 4.9 mmol, 2.5 M in hexane) over 20 minutes. After addition, the reaction mixture is stirred at −78° C. for 60 minutes and then tributyltin chloride (1.5 $cm^3$, 5.5 mmol) is added in one go. The mixture is then allowed to warm to 23° C. over 72 hours and the solvent removed in vacuo. The crude is purified by passing through a zeolite plug (40-60 petrol) followed by trituration in ethanol (2×100 $cm^3$) to give a mixture of intermediate 56 and tributyltin chloride (2.7 g) as a dark brown oil. $^1H$ NMR (400 MHz, $CD_2Cl_2$) 6.99 (2H, s), 6.64-6.85 (12H, m), 2.38 (16H, t, J 7.7), 0.57-1.69 (98H, m).

Intermediate 57

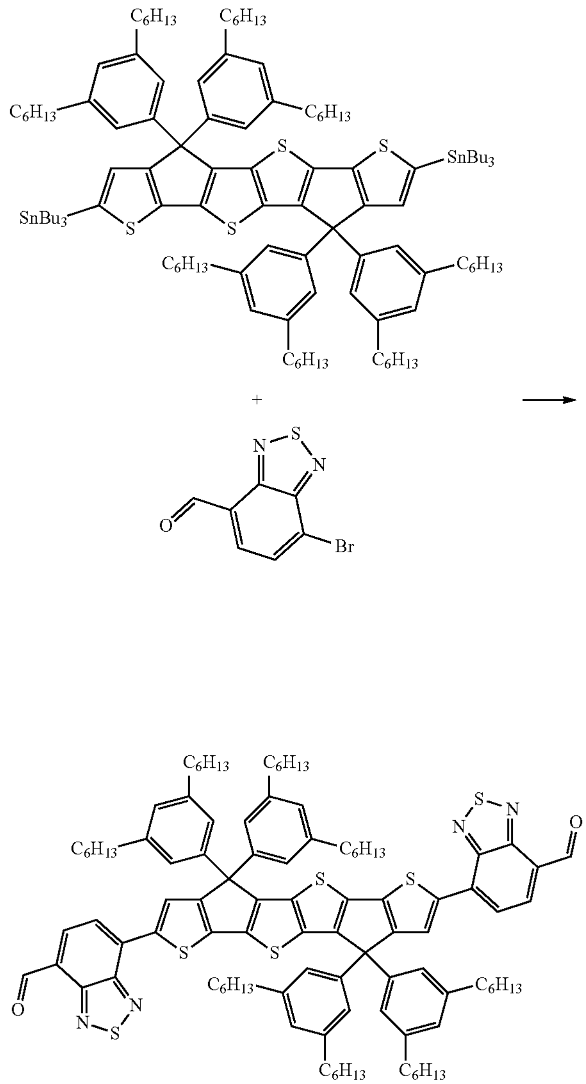

A mixture of intermediate 56 (1.5 g, 0.48 mmol), 7-bromo-benzo[1,2,5]thiadiazole-4-carbaldehyde (232 mg, 0.96 mmol), tri-o-tolyl-phosphine (44 mg, 0.14 mmol) and anhydrous toluene (51 $cm^3$) is degassed by nitrogen for 10 minutes. To the mixture is added tris(dibenzylideneacetone) dipalladium(0) (35 mg, 0.04 mmol) and the mixture further degassed for 15 minutes. The mixture is stirred at 100° C. for 17 hours and the solvent removed in vacuo. The crude is purified using silica gel column chromatography eluting with 40-60 petrol:dichloromethane; 7:3 to give intermediate 57 (650 mg, 84%) as a dark blue solid. $^1H$ NMR (400 MHz, $CDCl_3$) 10.67-10.73 (2H, m), 8.34 (2H, s), 8.20 (2H, d, J 7.6), 7.93 (2H, d, J 7.6), 6.94 (12H, s), 2.54 (16H, t, J 7.7), 1.51-1.64 (16H, m), 1.20-1.36 (48H, m), 0.77-0.88 (24H, m).

Compound 32

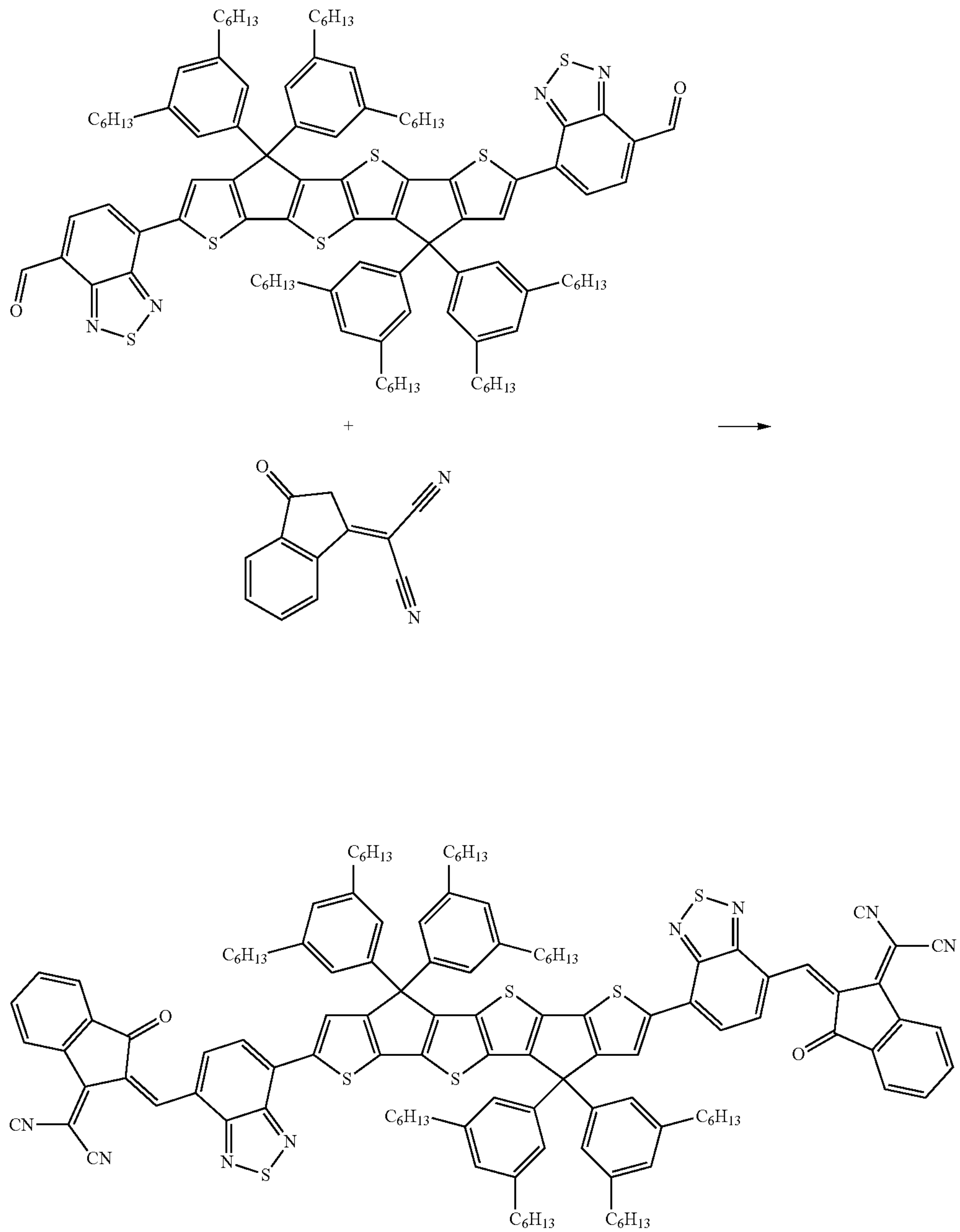

To a solution of intermediate 57 (500 mg, 0.31 mmol) in anhydrous chloroform (33 $cm^3$) at −30° C. is added pyridine (1.7 $cm^3$, 22 mmol). The mixture is then degassed with nitrogen before 3-(dicyanomethylidene) indan-1-one (417 mg, 2.15 mmol) is added. The solution is then further degassed and stirred at −30° C. for 30 minutes. The ice bath is removed, the reaction is allowed to warm to 20° C. over 60 minutes and the solvent removed in vacuo. The crude is triturated with ethanol and the solid collected by filtration. The crude is purified using silica gel column chromatography eluted with 40-60 petrol:dichloromethane; 1:1 to give Compound 32 (205 mg, 34%) as a green solid. $^1$H NMR (400 MHz, $CDCl_3$) 9.61 (2H, s), 9.32 (2H, d, J 8.1), 8.75 (2H, d, J 7.8), 8.39 (2H, s), 7.94-8.03 (4H, m), 7.76-7.91 (4H, m), 6.95 (12H, s), 2.56 (16H, t, J 7.7), 1.48-1.68 (m, 16H), 1.20-1.40 (48H, m), 0.76-0.95 (24H, m).

Example 23

Intermediate 58

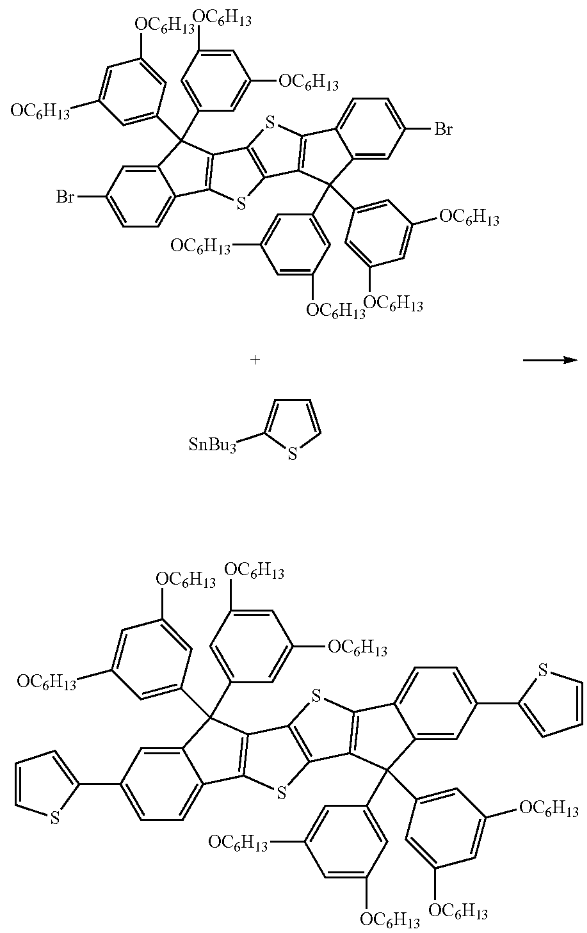

To a degassed solution of intermediate 52 (350 mg, 0.22 mmol), tributyl-thiophen-2-yl-stannane (248 mg, 0.66 mmol) and anhydrous toluene (20 $cm^3$) are added tris (dibenzylideneacetone)dipalladium(0) (10 mg, 0.01 mmol) and 2-dicyclohexylphosphino-2',4',6'-triisopropylbiphenyl (42 mg, 0.09 mmol) and the mixture stirred at 80° C. for 17 hours. The mixture is allowed to cool to 23° C. and the solvent removed in vacuo. The crude is purified by column chromatography using a graded solvent system (40-60 petrol:dichloromethane: 9:1 to 1:1) followed by trituration in ice-cold acetone. The solid is collected by filtration to give intermediate 58 (216 mg, 61%) as a yellow powder. $^1H$ NMR (400 MHz, $CDCl_3$) 7.68 (2H, d, J 1.6), 7.53 (2H, dd, J 7.9, 1.6), 7.32 (2H, d, J 7.9), 7.20-7.26 (4H, m), 7.04 (2H, dd, J 5.1, 3.6), 6.41 (8H, d, J 2.2), 6.32 (4H, t, J 2.2), 3.84

(16H, td, J 6.6, 2.2), 1.62-1.73 (16H, m), 1.32-1.42 (16H, m), 1.27 (32H, dq, J 7.3, 3.7, 3.0), 0.82-0.88 (24H, m).

Intermediate 59

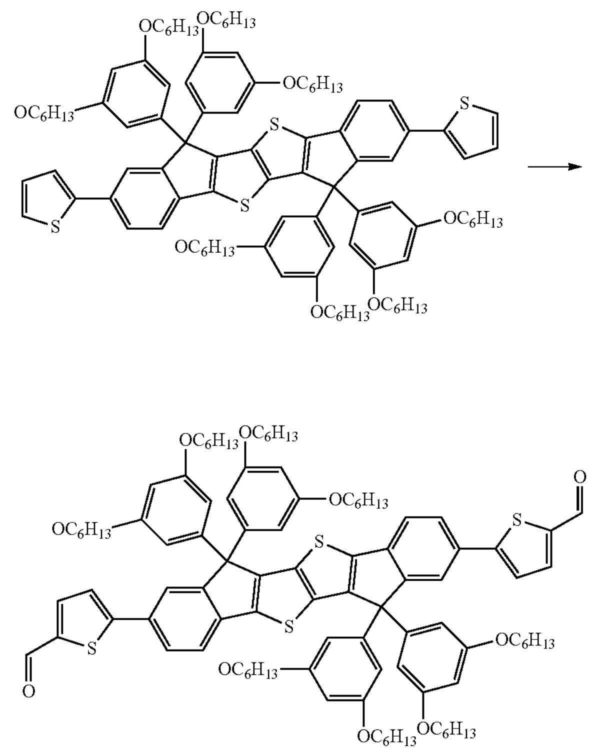

To a mixture of anhydrous N,N-dimethylformamide (1 $cm^3$) and anhydrous chloroform (10 $cm^3$) at 0° C. is added phosphoroxychloride (0.04 $cm^3$, 0.41 mmol). The mixture is allowed to warm up at 23° C. and stirred for 1 hour before cooling to 0° C. where intermediate 58 (216 mg, 0.14 mmol) is added. The mixture is then stirred at 60° C. for 17 hours. The mixture is allowed to cool to 23° C. and poured on saturated aqueous sodium bicarbonate solution (50 $cm^3$) and stirred at 23° C. for 30 minutes. The aqueous layer is extracted with dichloromethane (100 $cm^3$). The organic layer is washed with brine (50 $cm^3$), dried over anhydrous magnesium sulfate, filtered and the solvent removed in vacuo. The crude is purified by column chromatography using a graded solvent system (40-60 petrol:dichloromethane: 1:1 to 0:1) to give intermediate 59 (49 mg, 22%) as a red solid. $^1H$ NMR (400 MHz, $CDCl_3$) 9.86 (2H, s), 7.73 (2H, d, J 1.7), 7.70 (2H, d, J 4.0), 7.61 (2H, dd, J 8.0, 1.7), 7.37 (2H, d, J 8.0), 7.34 (2H, d, J 4.0), 6.39 (8H d, J 2.2), 6.34 (4H, t, J 2.2), 3.85 (16H, m), 1.69 (16H, p, J 6.8), 1.23-1.45 (48H, m), 0.76-0.92 (24H, m).

Compound 33

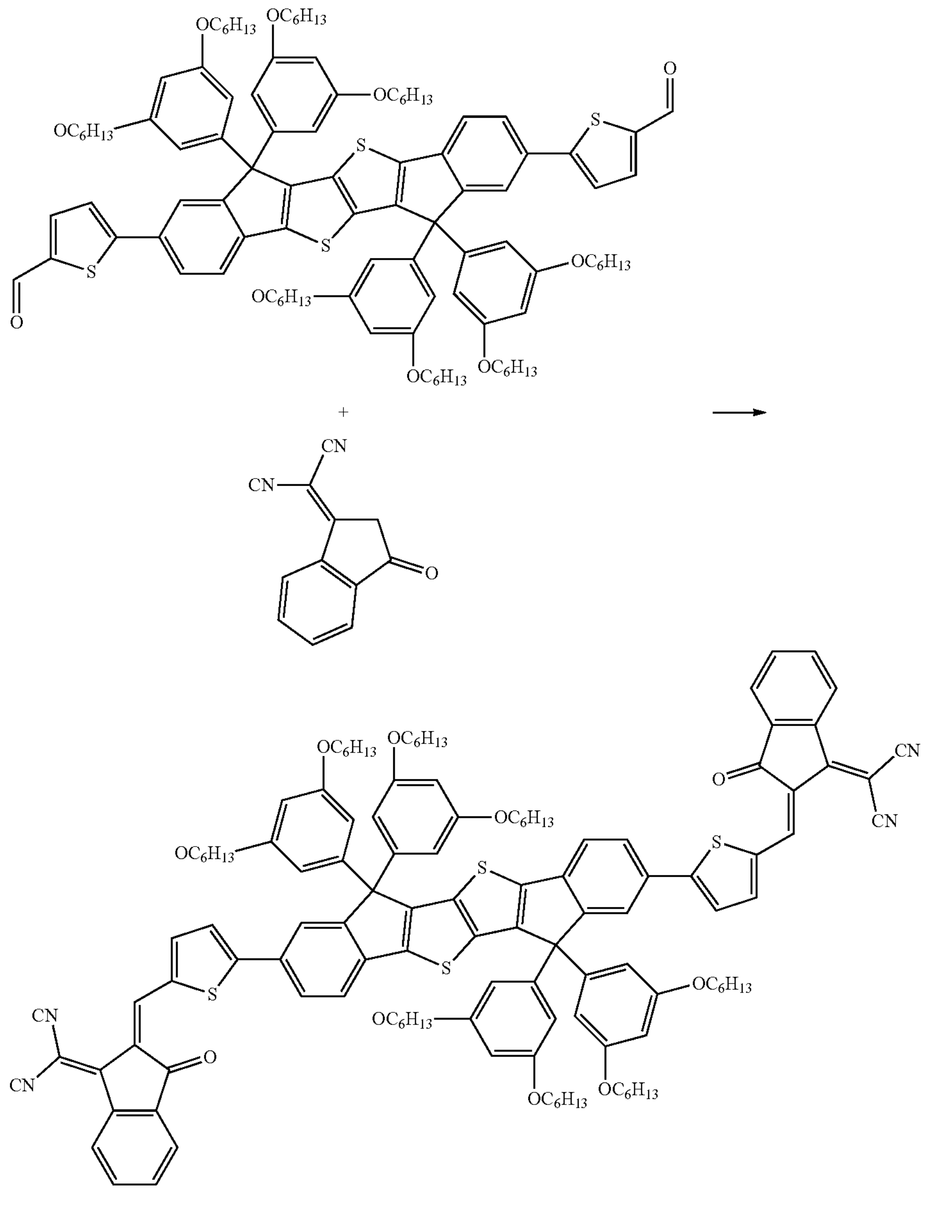

To a degassed solution of intermediate 59 (59 mg, 0.04 mmol), anhydrous chloroform (10 $cm^3$) and anhydrous pyridine (2 $cm^3$) at 0° C. is added 2-(3-oxo-indan-1-ylidene)-malononitrile (21 mg, 0.11 mmol) and the reaction mixture is stirred at 0° C. for 2 hours. The reaction is quenched by addition of aqueous hydrochloric acid (5 $cm^3$, 2 M). Dichloromethane (50 $cm^3$) is added and the organic layer is washed with water (2×50 $cm^3$) and brine (50 $cm^3$), dried over anhydrous magnesium sulfate, filtered and the solvent removed in vacuo. The residue is triturated in acetone and the solid collected by filtration to give Compound 33 (18 mg, 25%) as a black powder. $^1H$ NMR (400 MHz, $CDCl_3$) 8.86 (2H, s), 8.69-8.73 (2H, m), 7.91-7.94 (2H, m), 7.88 (2H, d, J 1.6), 7.84 (2H, d, J 4.3), 7.73-7.81 (6H, m), 7.46 (2H, d, J 4.2), 7.40 (2H, d, J 8.0), 6.42 (8H, d, J 2.2), 6.36 (4H, t, J 2.2), 3.88 (16H, td, J 6.5, 1.8), 1.71 (16H, p, J 6.7), 1.31-1.47 (16H, m), 1.22-1.32 (32H, m), 0.79-0.88 (24H, m).

Example 33

Intermediate 60

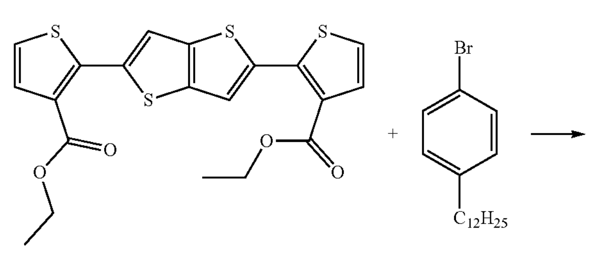

-continued

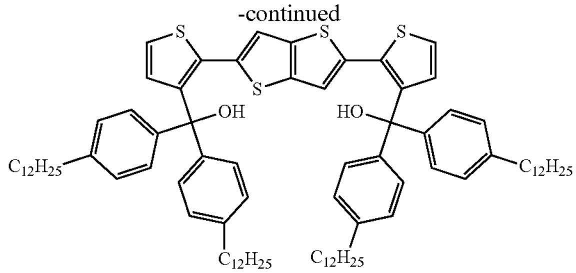

To a suspension of 1-bromo-4-dodecylbenzene (3.626 g, 11.15 mmol) in anhydrous tetrahydrofuran (48 $cm^3$) at −78° C., tert-butyllithium (13 $cm^3$, 22 mmol, 1.7 M in pentane) is added dropwise over 30 minutes. After 40 minutes the reaction is allowed to warm to −30° C. before the reaction mixture is then re-cooled to −78° C. Additional 1-bromo-4-dodecylbenzene (362 mg, 1.11 mmol) is added and after 15 minutes ethyl 2-[5-(3-ethoxycarbonyl-2-thienyl)thieno[3,2-b]thiophen-2-yl]thiophene-3-carboxylate (1.00 g, 2.23 mmol) is added in one portion to the reaction mixture. This mixture is then allowed to stir at −78° C. for 20 minutes before removing allowing the mixture to warm to 23° C. Water (100 $cm^3$) is added and the mixture stirred for 5 minutes. Diethyl ether (50 $cm^3$) is then added and the organic layer extracted. The organic extract is then washed with saturated ammonium chloride solution (100 $cm^3$), water (100 $cm^3$) and brine (100 $cm^3$), dried over anhydrous magnesium sulfate, filtered and concentrated in vacuo. The crude is purified by column chromatography eluting with a graded solvent system (40-60 petrol:dichloromethane; 1:0 to 3:2) with final purification achieved by trituration with methanol (3×10 $cm^3$), washing the filtered solid with 40-60 petrol (2×10 $cm^3$), diethyl ether (10 $cm^3$) and acetone (10 $cm^3$) to give intermediate 60 (2.09 g, 70%) as a yellow solid. $^1$H NMR (400 MHz, $CDCl_3$) 7.12-7.17 (10H, m), 7.07-7.12 (8H, m), 6.64 (2H, s), 6.45 (2H, d, J 5.2), 3.24 (2H, s), 2.60 (8H, t, J 7.7), 1.57-1.65 (8H, m), 1.25-1.35 (72H, m), 0.89 (12H, t, J 6.8).

Intermediate 61

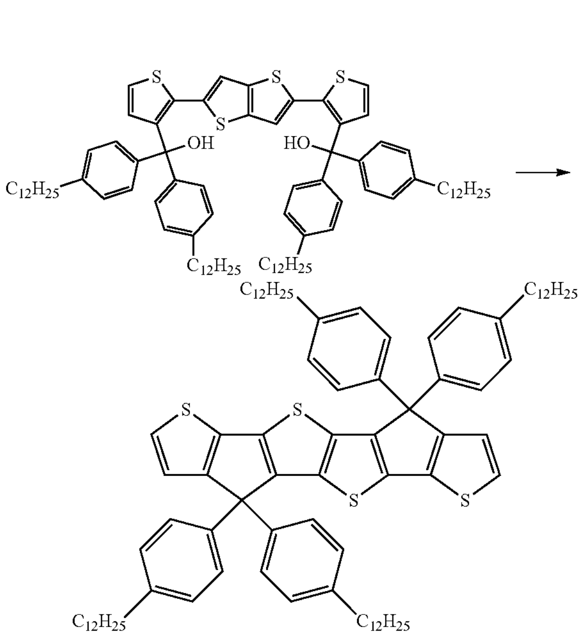

A degassed solution of intermediate 60 (1.00 g, 0.75 mmol) in anhydrous toluene (17 $cm^3$) is added to a degassed suspension of Amberlist 15 strong acid (4.00 g) in toluene (18 $cm^3$) and the reaction stirred at 50° C. for 80 minutes. After cooling the mixture to 23° C., the solid is removed by filtration and washed with toluene (3×50 $cm^3$) and diethyl ether (3×50 $cm^3$) and the filtrate concentrated in vacuo. Purification is achieved by column chromatography eluting with a graded solvent system (40-60 petrol:dichloromethane; 1:0 to 4:1) to give intermediate 61 (582 mg, 60%) as a brown oil. $^1$H NMR (400 MHz, $CD_2Cl_2$) 7.23 (2H, d, J 4.9), 7.11-7.16 (8H, m), 7.05-7.10 (10H, m), 2.54 (8H, t, J 7.8), 1.53-1.61 (8H, m), 1.22-1.33 (72H, m), 0.87 (12H, t, J 6.9).

Intermediate 62

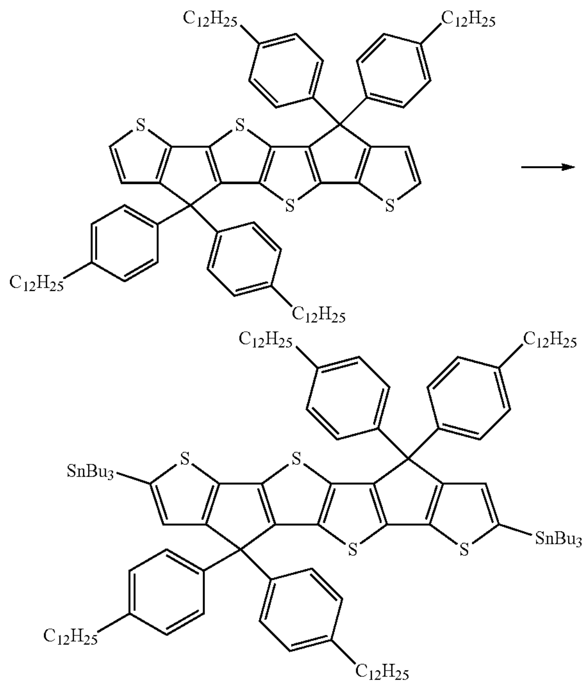

To a solution of intermediate 61 (582 mg, 0.45 mmol) in anhydrous tetrahydrofuran (27 $cm^3$) at −78° C. is added n-butyllithium (0.43 $cm^3$, 1.1 mmol, 2.5 M in hexanes) over 5 minutes. The mixture is stirred at −78° C. for 45 minutes before additional n-butyllithium (0.10 $cm^3$, 0.25 mmol) is added. The mixture is stirred for an additional 5 minutes before tributyltin chloride (0.42 $cm^3$, 1.56 mmol) is added and the mixture stirred to 23° C. over 17 hours. Methanol (15 $cm^3$) is added and the material concentrated in vacuo. The crude product is then taken up in pentane and the suspension filtered through celite washing though with additional pentane. The filtrate is then concentrated in vacuo, the solid triturated with methanol (3×10 $cm^3$) and the product collected by filtration to give intermediate 62 (790 mg, 94%) as a brown sticky solid. $^1$H NMR (400 MHz, $CDCl_3$) 7.13-7.18 (8H, m), 7.03-7.09 (10H, m), 2.54 (8H, t, J 7.8), 1.51-1.60 (20H, m), 1.21-1.38 (84H, m), 1.06-1.13 (12H, m), 0.85-0.91 (30H, m).

Intermediate 63

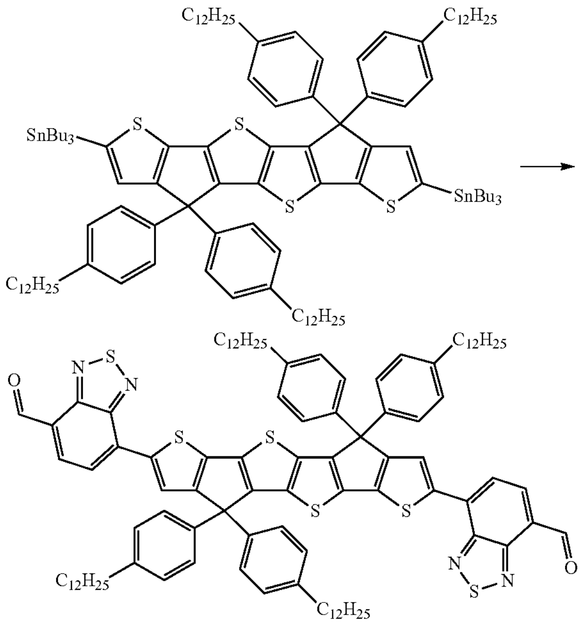

To a degassed solution of intermediate 62 (438 mg, 0.23 mmol) and 7-bromo-benzo[1,2,5]thiadiazole-4-carbaldehyde (124 mg, 0.51 mmol) in anhydrous toluene (28 cm$^3$), tris(dibenzylideneacetone)dipalladium (17 mg, 0.02 mmol) and tris(o-tolyl)phosphine (21 mg, 0.07 mmol) are added. After degassing the reaction mixture for a further 20 minutes it is heated at 80° C. for 17 hours. After cooling to 23° C., the mixture is concentrated in vacuo. The crude is then triturated with methanol (3×10 cm$^3$) and the solid filtered, washing with acetone (3×10 cm$^3$) to give intermediate 63 (320 mg, 84%) as a blue/black solid. $^1$H NMR (400 MHz, $CDCl_3$) 10.69 (2H, s), 8.33 (2H, s), 8.19 (2H, d, J 7.6), 7.94 (2H, d, J 7.8), 7.22-7.27 (8H, m), 7.11-7.17 (8H, m), 2.58 (8H, t, J 7.9), 1.51-1.65 (8H, m), 1.18-1.38 (72H, m), 0.86 (12H, t, J 6.9).

Compound 34

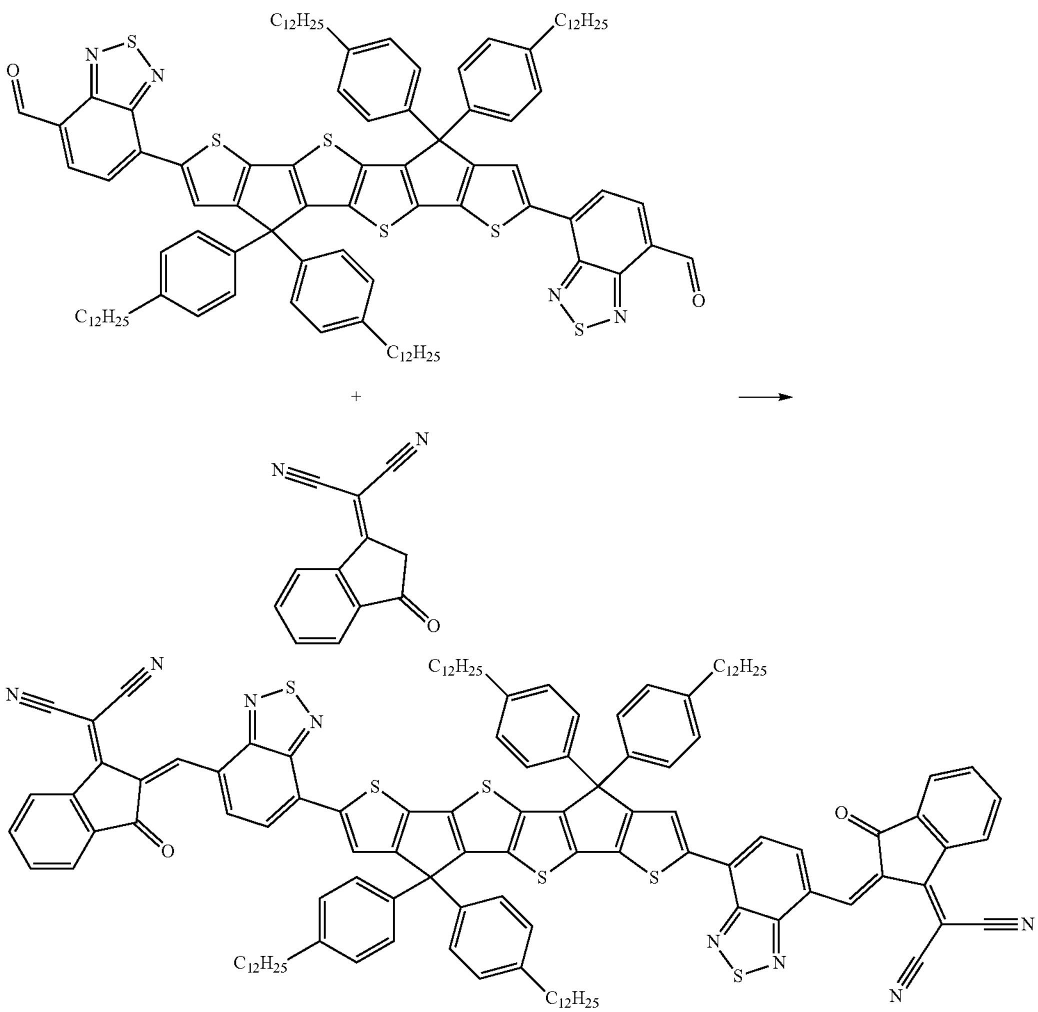

To a solution of intermediate 63 (319 mg, 0.20 mmol) in anhydrous chloroform (21 $cm^3$) is added anhydrous pyridine (1.1 $cm^3$, 14 mmol). The mixture is then degassed with nitrogen before 3-(dicyanomethylidene)indan-1-one (266 mg, 1.37 mmol) is added and the reaction cooled to −40° C. The solution is further degassed for 10 minutes and with stirring, is allowed to warm before being held at −15 to −20° C. After 5 hours the reaction mixture is then added to methanol (100 $cm^3$) washing in with dichloromethane (10 $cm^3$) and methanol (2×10 $cm^3$). Additional methanol (50 $cm^3$) is added before the suspension is filtered. The crude product is purified by column chromatography, eluting with a graded solvent system (40-60 petrol:dichloromethane; 1:0 to 1:1) to give Compound 34 (24 mg, 6%) as a black solid. $^1H$ NMR (400 MHz, $CDCl_3$) 9.58 (2H, s), 9.28 (2H, d, J 8.1), 8.73 (2H, d, J 7.8), 8.37 (2H, s), 7.94 (4H, d, J 7.6), 7.74-7.85 (4H, m), 7.23-7.27 (8H, m), 7.15 (8H, d, J 8.3), 2.58 (8H, t, J 7.8), 1.53-1.65 (8H, m), 1.18-1.38 (72H, m), 0.83-0.90 (12H, m).

Example 34

Compound 35

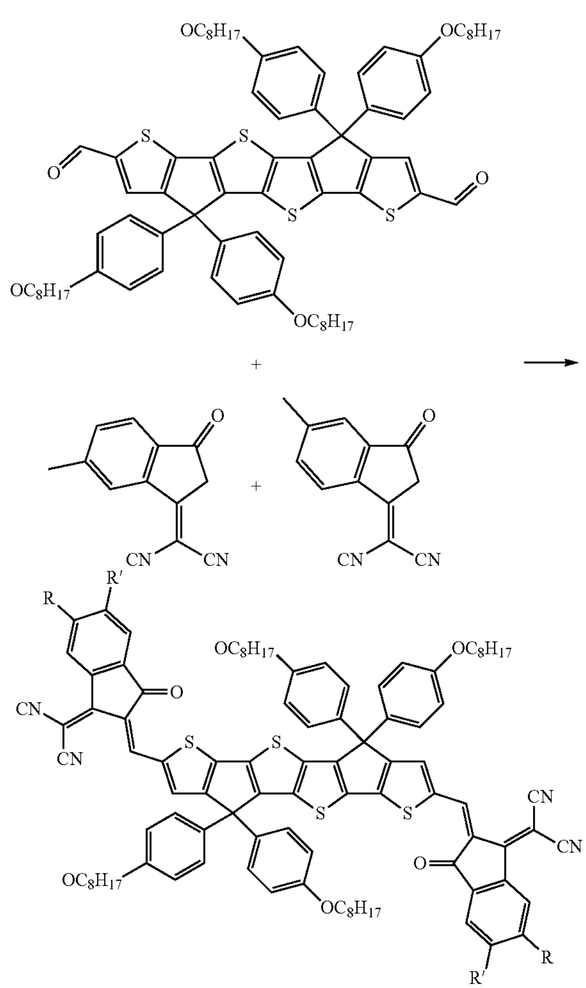

R = H or Me, R′ = H or Me

To a degassed mixture of intermediate 34 (100 mg, 0.08 mmol) and 2:3 regiomeric mix of 2-(5-methyl-3-oxo-indan-1-ylidene)-malononitrile and 2-(6-methyl-3-oxo-indan-1-ylidene)-malononitrile (121 mg, 0.58 mmol) and chloroform (2.5 $cm^3$) is added pyridine (0.47 $cm^3$, 5.8 mmol). The solution is bubbled with nitrogen for 10 minutes and then stirred for 3 hours at 23° C. Methanol (20 $cm^3$) is added and the suspension filtered and washed with methanol (20 $cm^3$). The resulting solid is stirred in methyl ethyl ketone (5 $cm^3$) at 95° C. for 2 hours, cooled to 23° C. and the solid collected by filtration. The solid is washed with methyl ethyl ketone (5 $cm^3$) to give Compound 35 (107 mg, 81%) as a dark blue solid. $^1H$ NMR (400 MHz, $CD_2Cl_2$) 8.85 (2H, m), 8.40-8.66 (2H, m), 7.49-7.93 (6H, m), 7.20 (8H, d, J 8.6), 6.87 (8H, d, J 8.5), 3.95 (8H, t, J 6.5), 2.54-2.61 (6H, m), 1.73-1.82 (8H, m), 1.41-1.52 (8H, m), 1.24-1.40 (32H, m), 0.90 (12H, t, J 6.6).

Example 35

Intermediate 64

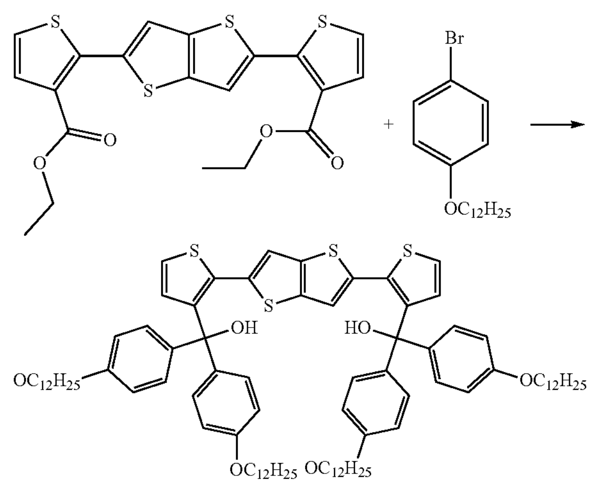

To a suspension of 1-bromo-4-dodecyloxybenzene (7.25 g, 21.2 mmol) in anhydrous tetrahydrofuran (91 $cm^3$) at −78° C., tert-butyllithium (25 $cm^3$, 42 mmol, 1.7 M in pentane) is added dropwise over 30 minutes. After 2 hours the reaction mixture is allowed to warm to −30° C. before re-cooling to −78° C. Additional 1-bromo-4-dodecyloxybenzene (720 mg, 2.11 mmol) and after 10 minutes ethyl 2-[5-(3-ethoxycarbonyl-2-thienyl)thieno[3,2-b]thiophen-2-yl]thiophene-3-carboxylate (1.91 g, 4.25 mmol) is added in one portion to the reaction mixture. This mixture is then allowed to stir to 23° C. over 17 hours. Water (50 $cm^3$) and diethyl ether (25 $cm^3$) are then added and the organic layer extracted. The residual aqueous layer is then additionally extracted with diethyl ether (50 $cm^3$) and the combined organic extracts washed with brine (75 $cm^3$), dried over anhydrous magnesium sulfate, filtered and concentrated in vacuo. The crude is purified by column chromatography eluting with a graded solvent system (40-60 petrol:dichloromethane; 1:0 to 3:7) to give intermediate 64 (4.10 g, 69%) as a brown oil which solidifies on standing to a yellow/brown solid. $^1H$ NMR (400 MHz, $CDCl_3$) 7.09-7.17 (10H, m), 6.79-6.85 (8H, m), 6.76 (2H, s), 6.43 (2H, d, J 5.1), 3.95 (8H, t, J 6.6), 3.25 (2H, s), 1.73-1.83 (8H, m), 1.41-1.50 (8H, m), 1.24-1.39 (64H, m), 0.89 (12H, t, J 6.9).

Intermediate 65

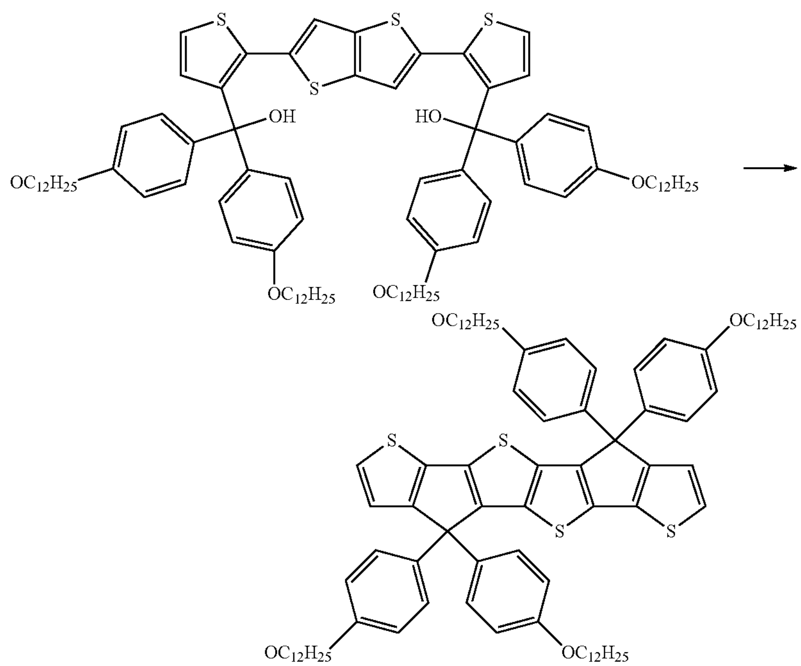

To a degassed solution of intermediate 64 (1.20 g, 0.85 mmol) in anhydrous toluene (20 $cm^3$) is added a degassed suspension of Amberlist 15 strong acid (5.00 g) in toluene (20 $cm^3$) and the reaction mixture stirred at 100° C. for 3 hours. The solid is removed through filtration and washed with toluene (3×50 $cm^3$) and diethyl ether (3×50 $cm^3$) before the filtrate is concentrated in vacuo. Purification is achieved by column chromatography eluting with a graded solvent system (40-60 petrol:dichloromethane; 1:0 to 3:7) to give intermediate 65 (221 mg, 19%) as a brown oil. $^1$H NMR (400 MHz, $CDCl_3$) 7.12-7.19 (10H, m), 7.04 (2H, d, J 4.9), 6.75-6.82 (8H, m), 3.89 (8H, t, J 6.48), 1.74 (8H, quin, J 7.1), 1.37-1.46 (8H, m), 1.19-1.36 (64H, m), 0.88 (12H, t, J 6.9).

Intermediate 66

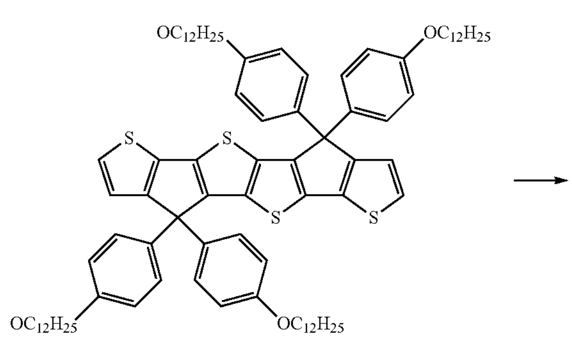

-continued

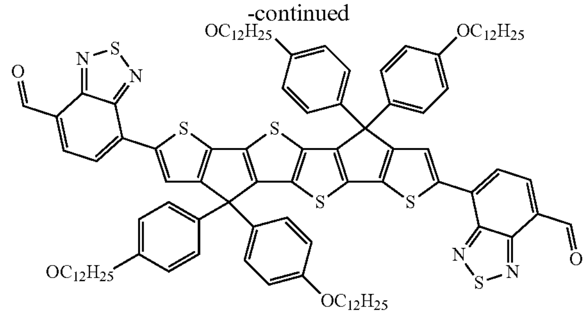

To a solution of intermediate 65 (493 mg, 0.36 mmol) in anhydrous tetrahydrofuran (22 $cm^3$) at −78° C. is added n-butyllithium (0.43 $cm^3$, 1.1 mmol, 2.5 M in hexanes) over 5 minutes. The mixture is stirred at −78° C. for 1 hour. Tributyltin chloride (0.34 $cm^3$, 1.3 mmol) is added and the mixture stirred to 23° C. over 17 hours. Methanol (15 $cm^3$) is added and the material concentrated in vacuo. The crude product is then taken up in pentane and the suspension filtered through celite washing through with additional pentane. The filtrate is then concentrated in vacuo, to give the crude product 2,7-bis(tributylstannyl)-4,4,9,9-tetrakis(4-dodecyloxyphenyl)-4,9-dihydro-thieno[3',2': 4,5]cyclopenta[1,2-b]thieno[2",3": 3',4']cyclopenta[1',2': 4,5]thieno[2,3-d]thiophene (948 mg, 0.49 mmol) as a dark brown oil, used without further purification. To a degassed solution of 2,7-bis(tributylstannyl)-4,4,9,9-tetrakis(4-dodecyloxyphenyl)-4,9-dihydro-thieno[3',2': 4,5]cyclopenta[1,2-b]thieno[2",3": 3',4']cyclopenta[1',2': 4,5]thieno[2,3-d]thiophene (701 mg, 0.36 mmol) and 7-bromo-benzo[1,2,5]thiadiazole-4-carbaldehyde (192 mg, 0.79 mmol) in anhydrous toluene (43 $cm^3$), tris(dibenzylideneacetone)dipalladium (26 mg, 0.03 mmol) and tris(o-tolyl)phosphine (33 mg, 0.11 mmol) is added.

After degassing the reaction mixture for a further 20 minutes it is heated at 80° C. for 17 hours. After cooling to 23° C., the mixture is concentrated in vacuo. The crude is triturated with methanol (4×10 $cm^3$) and the solid filtered. The crude product is then twice partially purified by column chromatography, eluting with two graded solvent systems (40-60 petrol:dichloromethane; 1:0 to 1:4) (40-60 petrol:diethyl ether; 1:0 to 9:1) isolating partially pure fractions. Final purification is then achieved by trituration with warm acetone and warm diethyl ether to give intermediate 66 (255 mg, 42%) as a blue/black solid. $^1$H NMR (400 MHz, $CDCl_3$) 10.69 (2H, s), 8.31 (2H, s), 8.19 (2H, d, J 7.8), 7.94 (2H, d, J 7.6), 7.22-7.27 (8H, m), 6.82-6.88 (8H, m), 3.91 (8H, t, J 6.5), 1.75 (8H, quin, J 7.2), 1.37-1.46 (8H, m), 1.20-1.35 (64H, m), 0.87 (12H, t, J 6.9).

Compound 36

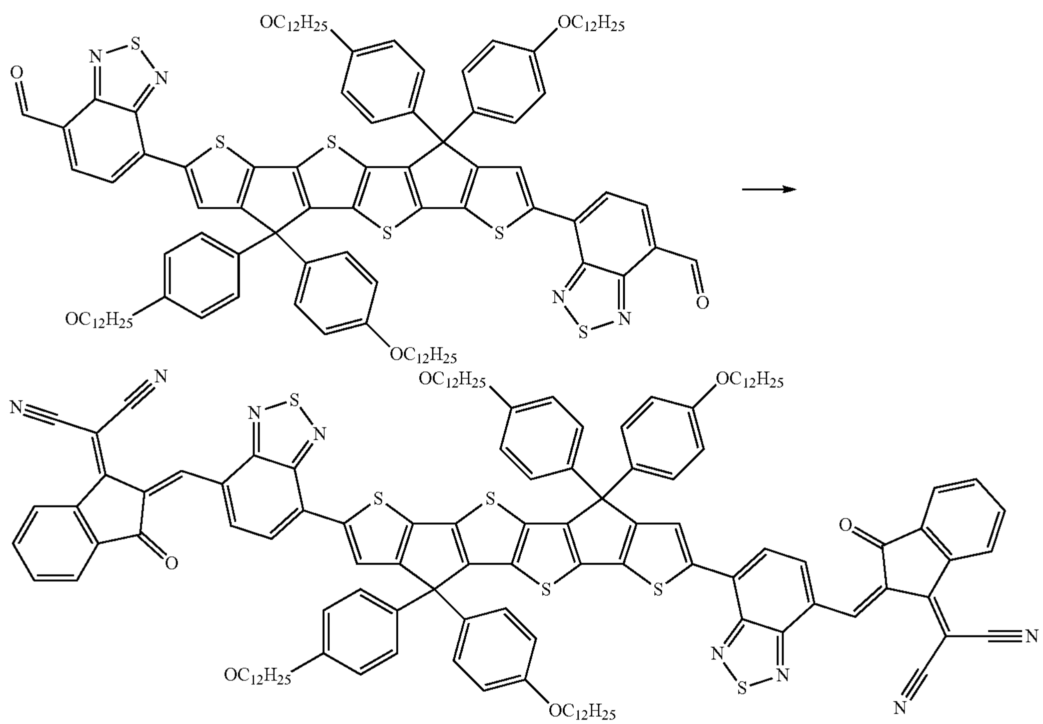

To a solution of intermediate 66 (255 mg, 0.15 mmol) in anhydrous chloroform (16 $cm^3$) is added pyridine (0.85 $cm^3$, 11 mmol). The mixture is then degassed with nitrogen before cooling to −40° C. 3-(Dicyanomethylidene)indan-1-one (205 mg, 1.05 mmol) is added and the solution is further degassed for 10 minutes and with stirring, is allowed to warm before being held at −15 to −20° C. After 4 hours the reaction mixture is then added to methanol (100 $cm^3$) washing in with methanol (2×10 $cm^3$) and dichloromethane (10 $cm^3$). Additional methanol (50 $cm^3$) is added and the suspension stirred for 10 minutes before the solid is collected by vacuum filtration, washing the solid with additional methanol (3×10 $cm^3$). The crude product is purified by silica plug (40-60 petrol:dichloromethane; 1:4), concentrating the product in vacuo. The solid is then triturated with methanol (3×10 $cm^3$) and collected by filtration, before being additionally washed with cyclohexane (3×10 $cm^3$), diethyl ether (3×10 $cm^3$), acetone (3×10 $cm^3$), methyl ethyl ketone (10 $cm^3$) and ethyl acetate (3×10 $cm^3$) to give Compound 36 (203 mg, 66%) as a partially pure black solid.

$^1$H NMR (400 MHz, $CDCl_3$) 9.58 (2H, s), 9.28 (2H, d, J 8.6), 8.74 (2H, d, J 7.8), 8.36 (2H, s), 7.93-8.00 (4H, m), 7.75-7.86 (4H, m), 7.23-7.27 (8H, m), 6.83-6.89 (8H, m), 3.92 (8H, t, J 6.5), 1.70-1.80 (8H, m), 1.38-1.46 (8H, m), 1.18-1.37 (64H, m), 0.87 (12H, t, J 6.9).

Example 36

Intermediate 67

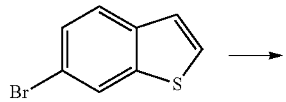

-continued

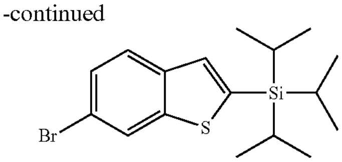

To a solution of 6-bromo-benzo[b]thiophene (9.09 g, 42.6 mmol) in anhydrous tetrahydrofuran (150 $cm^3$) at −30° C. is added dropwise lithium diisopropylamide (23.5 $cm^3$, 46.9 mmol, 2.0 M in tetrahydrofuran/heptane/ethylbenzene). The mixture is stirred at −30° C. for 1 hour before triisopropylsilyltrifluoromethanesulfonate (14.4 g, 46.9 mmol) is added in one portion. The mixture is allowed to warm to 23 C and stirred for 15 hours. Water (150 $cm^3$) is added and the mixture diluted with diethyl ether (100 $cm^3$). The aqueous layer is extracted with diethyl ether (2×50 $cm^3$). The combined organic layer is washed with brine (50 $cm^3$), dried over anhydrous magnesium sulphate, filtered and the solvent removed in vacuo. The residue slowly crystallises which is triturated in ethanol (150 $cm^3$) to give intermediate 67 (11.5 g, 72%) as an off-white solid. $^1$H NMR (400 MHz, $CDCl_3$) 8.04 (1H, d, J 1.8), 7.69 (1H, d, J 8.5), 7.46 (1H, s), 7.46 (1H, dd, J 8.6, 1.9), 1.37-1.47 (3H, m), 1.16 (18H, d, J 7.5).

Intermediate 68

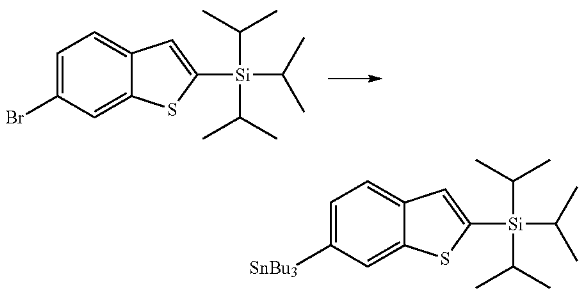

To a solution of intermediate 67 (5.00 g, 13.5 mmol) in anhydrous tetrahydrofuran (100 $cm^3$) at −78° C. is added dropwise n-butyllithium (6.0 $cm^3$, 14.9 mmol; 2.5 M in hexane). The mixture is stirred at −78° C. for 2 hours before tributyl(chloro)stannane (4.0 $cm^3$, 15 mmol) is added. The mixture is stirred at −78° C. for 30 minutes before it is allowed to warm to 23° C. and stirred for 20 hours. Water (100 $cm^3$) is added and the mixture diluted with diethyl ether (100 $cm^3$). The aqueous layer is extracted with diethylether (2×50 $cm^3$). The combined organic layer is washed with brine (50 $cm^3$), dried over anhydrous magnesium sulphate, filtered and the solvent removed in vacuo to give 8.90 g of crude intermediate 68 as a yellow oil. The residue is used for the next step without any further purification. $^1$H NMR (400 MHz, $CDCl_3$) 8.01 (1H, d, J 0.9), 7.82 (1H, dd, J 7.7, 0.7), 7.49 (1H, d, J 0.9), 7.43 (1H, dd, J 7.7, 0.7), 1.54-1.67 (9H, m), 1.33-1.44 (12H, m), 1.17 (18H, d, J 7.3), 0.92 (12H, t, J 7.3).

Intermediate 69

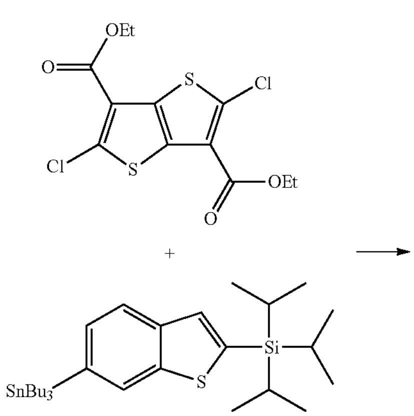

-continued

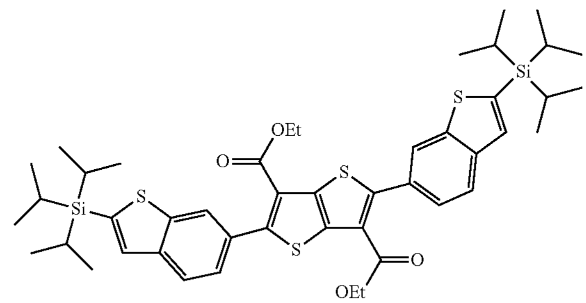

To a degassed solution of intermediate 68 (1.80 g, 5.10 mmol) and intermediate 46 (7.8 g, 12 mmol, 90% purity) in anhydrous toluene (60 $cm^3$) and anhydrous N,N-dimethylformamide (10 $cm^3$) is added 2-dicyclohexylphosphino-2',4',6'-triisopropylbiphenyl (850 mg, 1.78 mmol) and tris(dibenzylideneacetone)dipalladium(0) (187 mg, 0.20 mmol) and the mixture stirred at 80° C. for 20 hours. The reaction mixture is allowed to cool to 23° C. and the solvents removed in vacuo. The residue is triturated in ice-cooled diethyl ether (50 $cm^3$), filtered off and the solid washed with 40-60 petrol (2×20 $cm^3$) to give intermediate 69 (3.01 g, 68%) as a yellow solid. $^1$H NMR (400 MHz, $CDCl_3$) 8.15 (2H, d, J 1.6), 7.90 (2H, d, J 8.2), 7.62 (2H, dd, J 8.2, 1.6), 7.57 (2H, s), 4.34 (4H, q, J 7.1), 1.40-1.49 (6H, m), 1.32 (6H, t, J 7.1), 1.19 (36H, d, J 7.5).

Intermediate 70

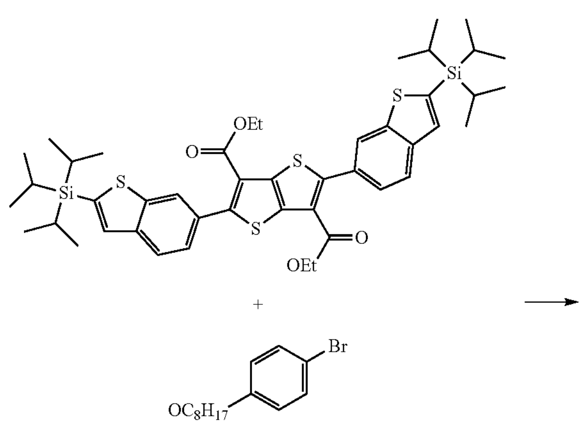

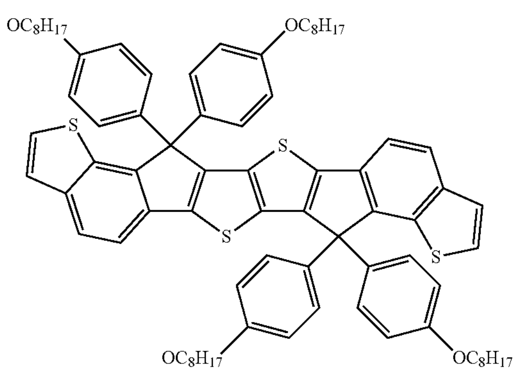

To a solution of 1-bromo-4-octyloxy-benzene (2.48 g, 8.71 mmol) in anhydrous tetrahydrofuran (60 $cm^3$) at −78° C. is added dropwise n-butyllithium (3.48 $cm^3$, 8.71 mmol, 2.5 M in hexanes). The mixture is stirred for 2 hours before intermediate 69 (1.50 g, 1.74 mmol) is added. The cooling bath is removed and the mixture is allowed to warm up at 23° C. over 17 hours. The reaction mixture is poured onto water (100 $cm^3$) and diluted with dichloromethane (150 $cm^3$). The aqueous layer is extracted twice with dichloromethane (2×50 $cm^3$). The combined organic layer is washed with brine (50 $cm^3$), dried over anhydrous magnesium sulphate, filtered and the solvent removed in vacuo. The residue is taken up in anhydrous toluene (300 $cm^3$) and 4-methylbenzenesulfonic acid hydrate (662 mg, 3.48 mmol) is added. The mixture is stirred at 80° C. for 4 hours. After cooling to 23° C., the reaction is quenched by addition of saturated aqueous sodium hydrogenocarbonate solution (50 $cm^3$), and diluted with water (50 $cm^3$) and dichloromethane (150 $cm^3$). The aqueous layer is extracted with dichloromethane (50 $cm^3$). The combined organic layer is washed with brine (50 $cm^3$), dried over anhydrous magnesium sulphate, filtered and the solvent removed in vacuo. The residue is taken up in anhydrous tetrahydrofuran (40 $cm^3$) and tetrabutylammonium fluoride (2.73 g, 10.4 mmol) added. The mixture is stirred for 2 hours and then diluted with water (50 $cm^3$) and dichloromethane (100 $cm^3$). The aqueous layer is extracted with dichloromethane (50 $cm^3$). The combined organic layer is washed with brine (50 $cm^3$), dried over anhydrous magnesium sulphate, filtered and the solvent removed in vacuo. The residue is purified by column chromatography using a graded solvent system (40-60 petrol:dichloromethane; 19:1 to 7:3) to give intermediate 70 (990 mg, 45%) as a yellow gummy solid. $^1$H NMR (400 MHz, $CDCl_3$) 7.80 (2H, d, J 8.1), 7.47 (2H, d, J 8.0), 7.36 (2H, d, J 5.5), 7.28 (2H, d, J 7.27), 7.16-7.23 (8H, m), 6.77-6.84 (8H, m), 3.90 (8H, t, J 6.5), 1.69-1.78 (8H, m), 1.37-1.46 (8H, m), 1.22-1.36 (32H, m), 0.88 (12H, t, J 7.0).

Intermediate 71

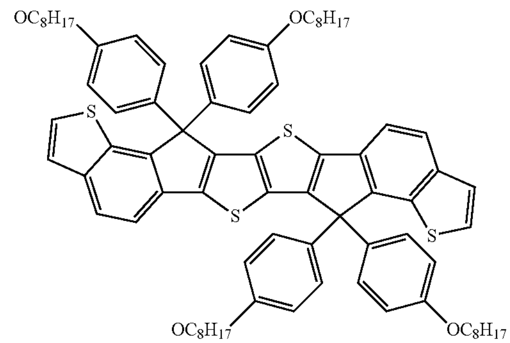

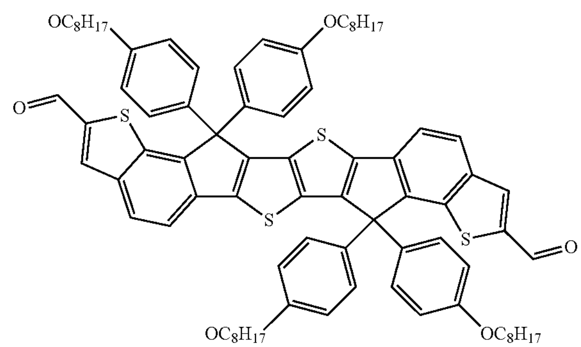

To a stirred solution of intermediate 70 (574 mg, 0.46 mmol) in anhydrous tetrahydrofuran (20 $cm^3$) at −78° C. is added dropwise n-butyllithium (0.74 $cm^3$, 1.8 mmol, 2.5 M in hexane). The mixture is stirred for 1 hour before anhydrous N,N-dimethylformamide (0.14 $cm^3$, 1.8 mmol) is added. The mixture is allowed to warm up at 23° C. and is stirred for 3 hours. The reaction mixture is poured onto saturated aqueous ammonium chloride solution (20 $cm^3$) and diluted with dichloromethane (100 $cm^3$). The aqueous layer is extracted with dichloromethane (20 $cm^3$). The combined organic layer is washed with brine (50 $cm^3$), dried over anhydrous magnesium sulphate, filtered and the solvent removed in vacuo. The residue is purified by column chromatography using a graded solvent system (cyclohexane: dichloromethane; 3:7 to 2:3) to give intermediate 71 (280 mg; 46%) as an orange solid. $^1$H NMR (400 MHz, $CDCl_3$) 10.02 (2H, s), 8.03 (2H, s), 7.94 (2H, d, J 8.2), 7.54 (2H, d, J 8.1), 7.14-7.24 (8H, m), 6.79-6.85 (8H, m), 3.90 (8H, t, J 6.5), 1.67-1.79 (8H, m), 1.39-1.44 (8H, m), 1.20-1.36 (32H, m), 0.88 (12H, t, J 7.1).

Compound 37

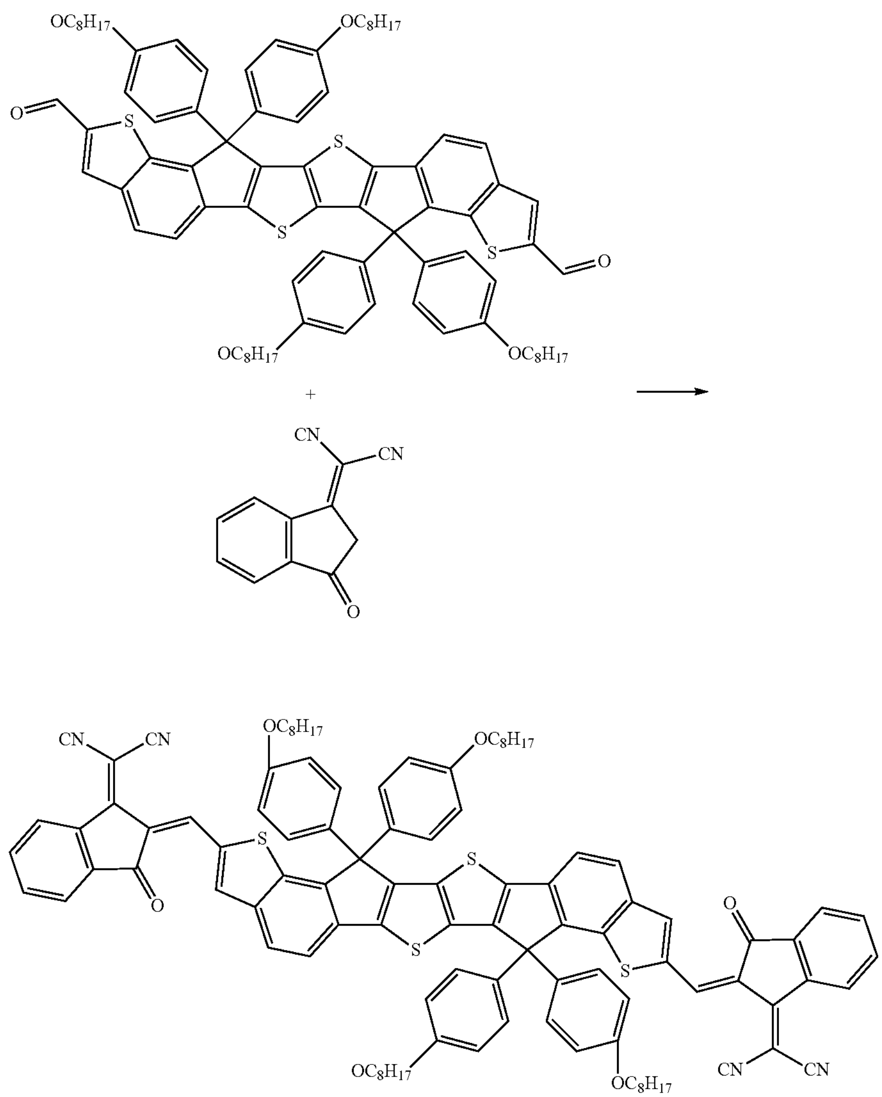

To a degassed solution of intermediate 71 (250 mg, 0.19 mmol) in a mixture of pyridine (2 $cm^3$) and chloroform (18 $cm^3$) at 0° C. is added 2-(3-oxo-indan-1-ylidene)-malononitrile (112 mg, 0.58 mmol) is added and the mixture stirred at 0° C. for 3 hours. The reaction is quenched by addition of aqueous hydrochloric acid solution (10 $cm^3$, 2 M) and the aqueous layer extracted with dichloromethane (20 $cm^3$). The combined organic layer is washed with brine (50 $cm^3$), dried over anhydrous magnesium sulphate, filtered and the solvent removed in vacuo. This residue is purified by column chromatography using a graded solvent system (40-60 petrol:dichloromethane; 3:2 to 3:7). The solid is triturated in ice-cooled acetone (30 $cm^3$) and with diethylether (20 $cm^3$) to give Compound 37 (135 mg, 42%) as a blue solid. $^1$H NMR (400 MHz, $CD_2Cl_2$) 8.85 (2H, s), 8.67 (2H, d, J 7.5), 8.24 (2H, s), 7.95 (4H, t, J 9.2), 7.75-7.83 (4H, m), 7.59 (2H, d, J 8.3), 7.23 (8H, d, J 8.4), 6.83 (8H, d, J 8.4), 3.87 (8H, t, J 6.6), 1.63-1.74 (8H, m), 1.31-1.39 (8H, m), 1.18-1.31 (32H, m), 0.82 (12H, t, J 7.0).

Example 37

Intermediate 72

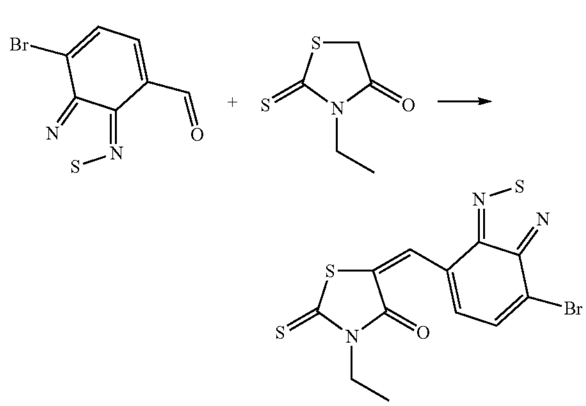

To a degassed mixture of 7-bromo-benzo[1,2,5]thiadiazole-4-carbaldehyde (500 mg, 2.0 mmol) and 3-ethyl-2-thioxo-thiazolidin-4-one (2.32 g, 14.4 mmol) and chloroform (220 $cm^3$) is added pyridine (5.8 $cm^3$, 72 mmol) and the reaction mixture further degassed for a 30 minutes. The reaction is then heated at 60° C. for 7 hours. The reaction is cooled to 23° C., filtered and the solid washed with dichloromethane (100 $cm^3$) to give intermediate 72 (534 mg, 67%) as a green/brown solid. $^1$H NMR (400 MHz, $CDCl_3$) 8.44 (1H, s), 7.98 (1H, d, J 7.7), 7.55 (1H, d, J 7.7), 4.25 (2H, q, J 7.2), 1.33 (3H, t, J 7.1).

Intermediate 73

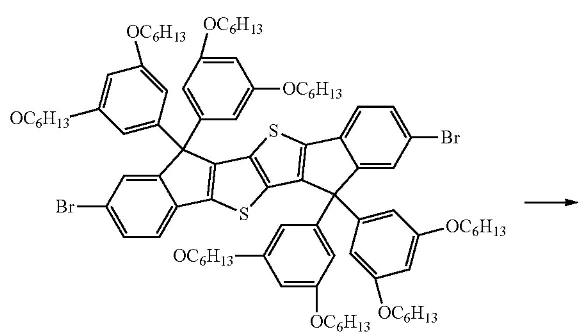

-continued

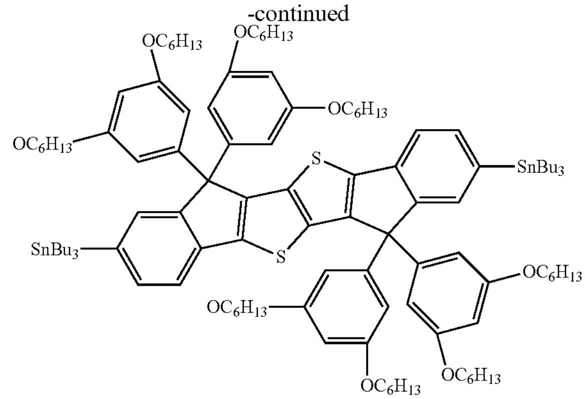

To a solution of intermediate 52 (3.09 g, 1.96 mmol) in anhydrous tetrahydrofuran (200 $cm^3$) at −78° C. is added dropwise n-butyllithium (3.1 $cm^3$, 7.8 mmol, 2.5 M in hexane) and the mixture stirred for 90 minutes. Tributyltin chloride (2.4 $cm^3$, 8.8 mmol) is added and the reaction mixture is allowed to warm to 23° C. and stirred for 15 hours. Methanol (2 $cm^3$) is added followed by water (50 $cm^3$) and diethyl ether (100 $cm^3$). The aqueous layer is extracted with diethyl ether (2×20 $cm^3$) and the combined organic layer is dried over anhydrous magnesium sulphate, filtered and the solvent removed in vacuo. The solid is washed with 40-60 petrol (2×10 $cm^3$) and taken up in dichloromethane. Evaporation of the solvents under vacuum gives a yellow oil that slowly crystallises at 23° C. Trituration in ice cooled acetone (20 $cm^3$) gives intermediate 73 (2.95 g, 75%) as a yellow solid. $^1$H NMR (400 MHz, $CDCl_3$) 7.57 (s, 2H), 7.36 (2H, d, J 7.4), 7.32 (2H, d, J 7.4), 6.39 (8H, d, J 2.2), 6.32 (4H, d, J 2.2), 3.73-3.91 (16H, m), 1.60-1.74 (16H, m), 1.43-1.55 (12H, m), 1.34-1.42 (16H, m), 1.20-1.34 (44H, m), 0.92-1.12 (12H, m), 0.84-0.89 (30H, m).

Compound 38

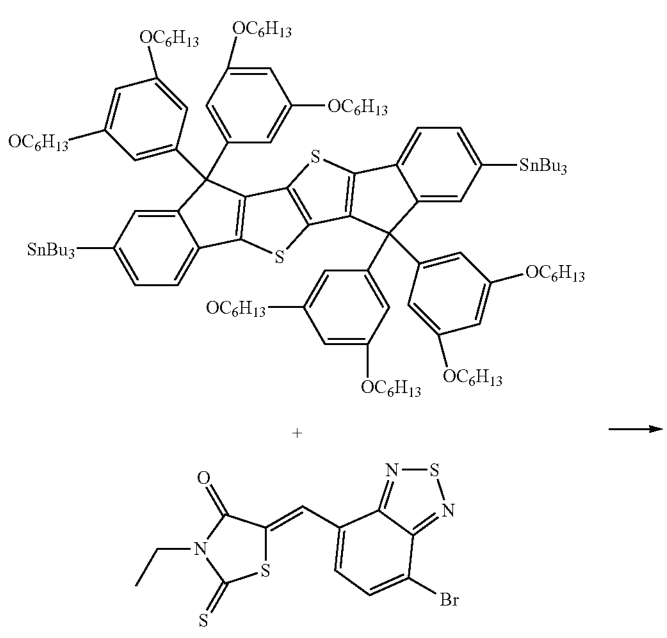

-continued

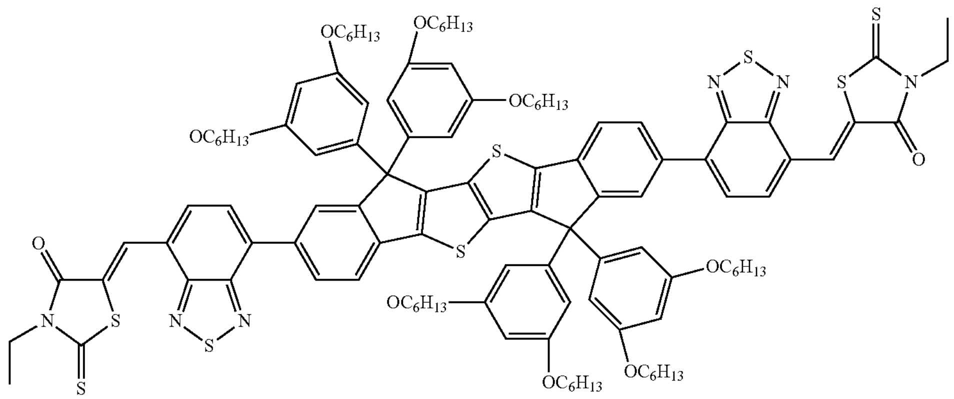

To a degassed solution of intermediate 73 (300 mg, 0.15 mmol) and intermediate 50 (174 mg, 0.45 mmol) in a mixture of anhydrous toluene (18 $cm^3$) and anhydrous N,N-dimethylformamide (2 $cm^3$) is added 2-dicyclohexylphosphino-2',4',6'-triisopropylbiphenyl (57 mg, 0.12 mmol) and tris(dibenzylideneacetone)dipalladium(0) (13 mg, 0.01 mmol) and the reaction mixture heated at 80° C. for 5 days. The reaction mixture cooled to 23° C. and the solvents removed in vacuo. The residue is purified by column chromatography using a graded solvent system (40-60 petrol:dichloromethane; 7:3 to 1:4). This solid is recrystallized (ethanol/dichloromethane) to give Compound 38 (20 mg, 6%) as a deep red solid. $^1$H NMR (400 MHz, $CDCl_3$) 8.55 (2H, s), 8.20 (2H, d, J 1.6), 8.02 (2H, dd, J 8.0, 1.6), 7.83 (2H, d, J 7.6), 7.76 (2H, d, J 7.6), 7.54 (2H, d, J 7.9), 6.50 (8H, d, J 2.2), 6.37 (4H, t, J 2.2), 4.27 (4H, q, J 7.1), 3.78-3.97 (16H, m), 1.64-1.77 (16H, m), 1.33-1.43 (22H, m), 1.26-1.31 (32H, m), 0.83-0.89 (24H, m).

Example 38

Compound 39

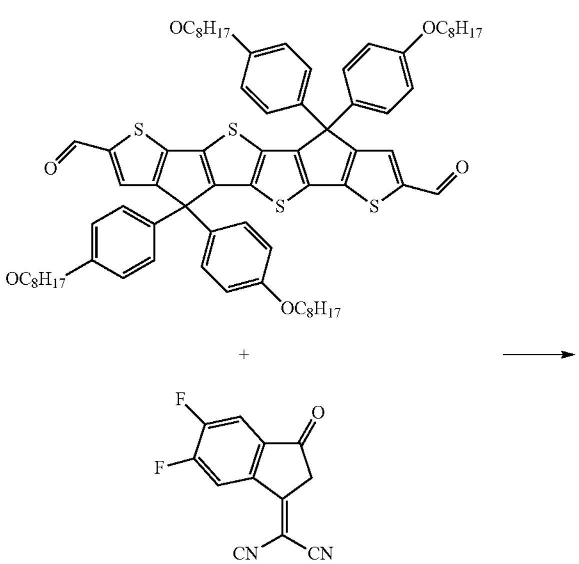

-continued

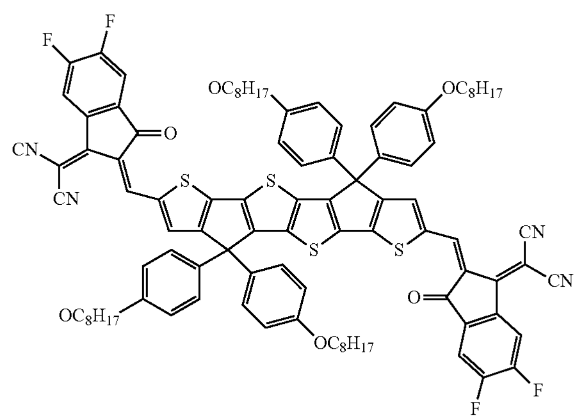

To a degassed mixture of intermediate 34 (100 mg, 0.08 mmol) and 2-(5,6-difluoro-3-oxo-indan-1-ylidene)-malononitrile (96 mg, 0.42 mmol) are dissolved in chloroform (2.5 $cm^3$) is added pyridine (0.47 $cm^3$, 5.8 mmol). The solution is stirred at 23° C. for 6 hours. Methanol (35 $cm^3$) is added, the solid collected by filtration and washed with methanol (20 $cm^3$). The solid is triturated in acetone (2 $cm^3$), filtered and washed with acetone (2×1 $cm^3$) to give Compound 39 (133 mg, 98%) as a dark blue solid. $^1$H NMR (400 MHz, $CDCl_3$) 8.77 (2H, s), 8.46 (2H, dd, J 9.5, 6.5), 7.55-7.65 (4H, m), 7.02-7.11 (8H, m), 6.71-6.81 (8H, m), 3.85 (8H, t, J 6.5), 1.62-1.74 (8H, m), 1.35 (8H, p, J 7.3, 6.8), 1.13-1.31 (32H, m), 0.73-0.84 (12H, m).

Example 39

Compound 40

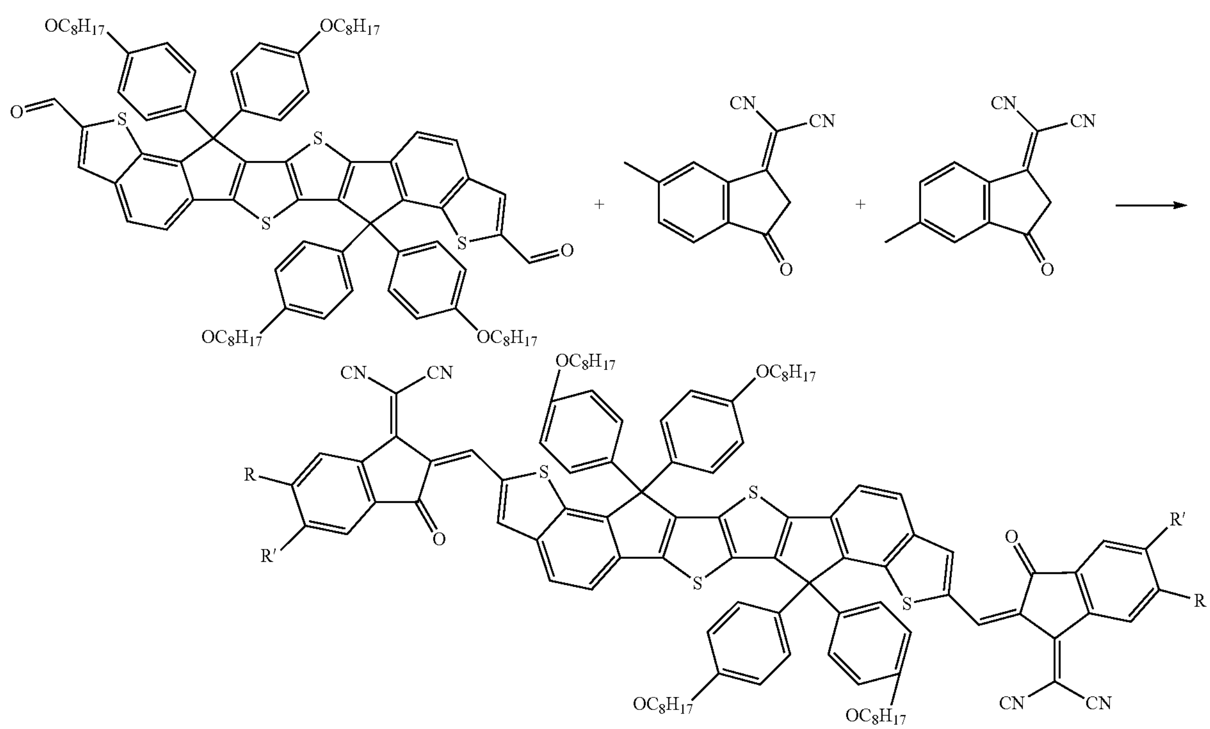

R = H or Me, R′ = H or Me

To a degassed solution of intermediate 71 (215 mg; 0.17 mmol; 1.00 eq.) in a mixture of pyridine (1 $cm^3$) and chloroform (10 $cm^3$) is added an equimolar mixture of 2-(5-methyl-3-oxo-indan-1-ylidene)-malononitrile and 2-(6-methyl-3-oxo-indan-1-ylidene)-malononitrile (103 mg, 0.50 mmol) and the mixture stirred for 4 hours. The reaction is quenched by addition of aqueous hydrochloric acid solution (10 $cm^3$, 2 M) and the aqueous layer extracted with dichloromethane (20 $cm^3$). The combined organic layer is washed with brine (50 $cm^3$), dried over anhydrous magnesium sulphate, filtered and the solvent removed in vacuo. The residue is purified column chromatography using a graded solvent system (cyclohexane:dichloromethane; 3:7 to 1:4). The solid is triturated in acetone (30 $cm^3$) and filtered off to give Compound 40 (73 mg, 23%) as a blue powder. $^1$H NMR (400 MHz, $CDCl_3$) 8.84 (2H, d, J 2.5), 8.59 (1H, d, J 8.1), 8.50 (1H, s), 8.29 (2H, s), 7.94 (2H, d, J 8.2), 7.86 (1H, d, J 7.8), 7.77 (1H, d, J 1.6), 7.55 (2H, d, J 8.2), 7.28 (8H, d, J 8.7), 6.87 (8H, d, J 8.7), 3.91 8H, (t, J 6.5), 1.67-1.80 (8H, m), 1.35-1.47 (8H, m), 1.18-1.35 (32H, m), 0.87 (12H, t, J 6.6).

Example 40

Intermediate 74

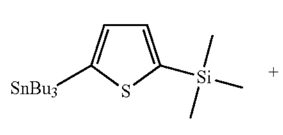

-continued

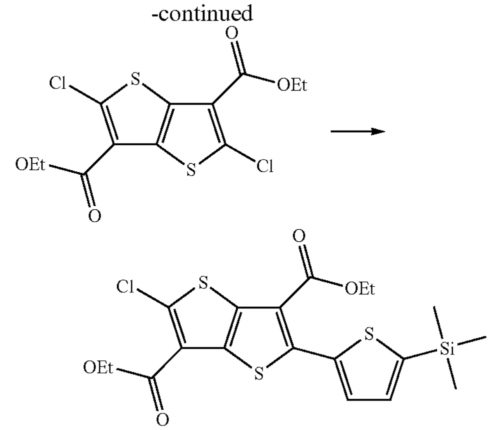

A mixture of intermediate 31 (7.1 g, 20 mmol), trimethyl-(5-tributylstannanyl-thiophen-2-yl)-silane (10 g, 23 mmol) and anhydrous toluene (300 $cm^3$) is degassed by nitrogen for 25 minutes. To the mixture is added tetrakis(triphenylphosphine)palladium(0) (0.5 g, 0.4 mmol) and the mixture further degassed for 15 minutes. The mixture is stirred at 85° C. for 17 hours. The reaction mixture is filtered hot through a celite plug and washed through with hot toluene. The crude product is purified using silica gel column chromatography (40-60 petrol:dichloromethane: 4:1) to give intermediate 74 (2.3 g, 21%) as a pale yellow solid. $^1$H-NMR (400 MHz, $CDCl_3$) 7.40 (1H, d, J 3.7), 6.99-7.03 (1H, m), 4.13-4.29 (4H, m), 1.15-1.28 (6H, m), 0.10-0.37 (9H, s).

Intermediate 75

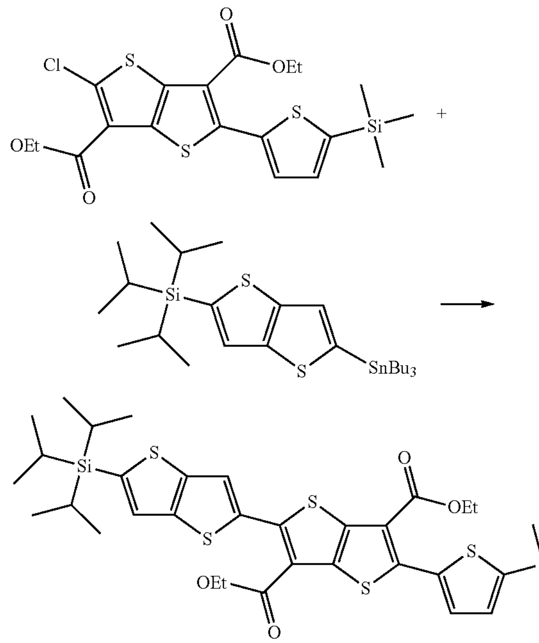

A mixture of intermediate 74 (2.2 g, 4.6 mmol), intermediate 23 (3.4 g, 5.8 mmol) and anhydrous toluene (300 $cm^3$) is degassed by nitrogen for 25 minutes. To the mixture is added tetrakis(triphenylphosphine)palladium(0) (0.5 g, 0.4 mmol) and the mixture further degassed for 15 minutes. The mixture is stirred at 85° C. for 17 hours. The reaction mixture is filtered hot through a celite plug and washed through with hot toluene. The crude product is stirred in acetone (100 $cm^3$) for 1 hour to form a heavy suspension. The solid is collected by filtration to give intermediate 75 (3.2 g, 75%) as a pale brown solid. $^1$H NMR (400 MHz, $CDCl_3$) 7.80-7.86 (1H, s), 7.65 (1H, d, J 3.4), 7.38 (1H, s), 7.24 (1H, d, J 3.4), 4.43 (4H, m), 1.31-1.51 (10H, m), 1.15 (18H, d, J 7.3), 0.38 (9H, s).

Intermediate 76

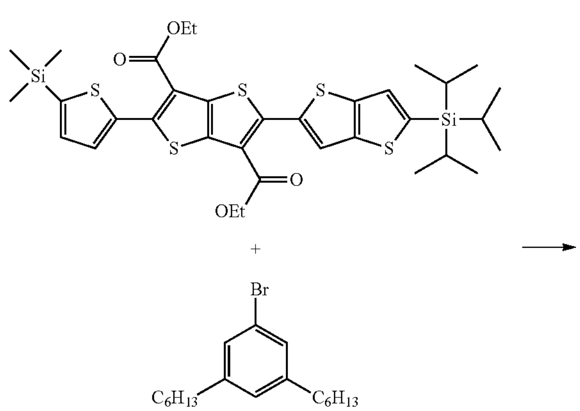

-continued

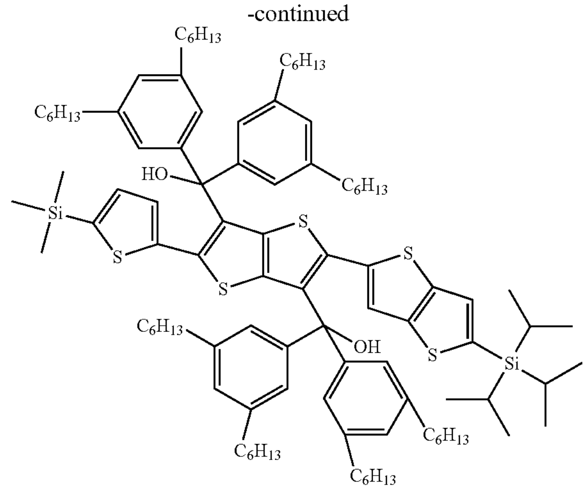

To a solution of 1-bromo-3,5-dihexyl-benzene (4.9 g, 15 mmol) in anhydrous tetrahydrofuran (100 $cm^3$) at −78° C. is added dropwise n-butyllithium (6.0 $cm^3$, 15.0 mmol, 2.5 M in hexane) over 30 minutes. After addition, the reaction mixture is stirred at −78° C. for 120 minutes. Intermediate 75 (2.2 g, 3.0 mmol) is added and the mixture allowed to warm to 23° C. over 17 hours. Diethyl ether (100 $cm^3$) and water (100 $cm^3$) are added and the mixture stirred at 23° C. for 30 minutes. The product is extracted with diethyl ether (3×100 $cm^3$). The organics are combined and dried over anhydrous magnesium sulfate, filtered and the solvent removed in vacuo to give intermediate 76 (2.30 g, 47%) as a brown oil. $^1$H NMR (400 MHz, $CD_2Cl_2$) 7.21 (1H, s), 7.06 (1H, s), 6.80-7.03 (12H, m), 6.42-6.55 (2H, m), 3.36 (2H, d, J 4.4), 2.44-2.62 (16H, m), 1.48-1.65 (16H, m), 1.24-1.35 (49H, m), 1.11-1.17 (18H, m), 0.83-0.94 (24H, m), 0.26 (9H, s).

Intermediate 77

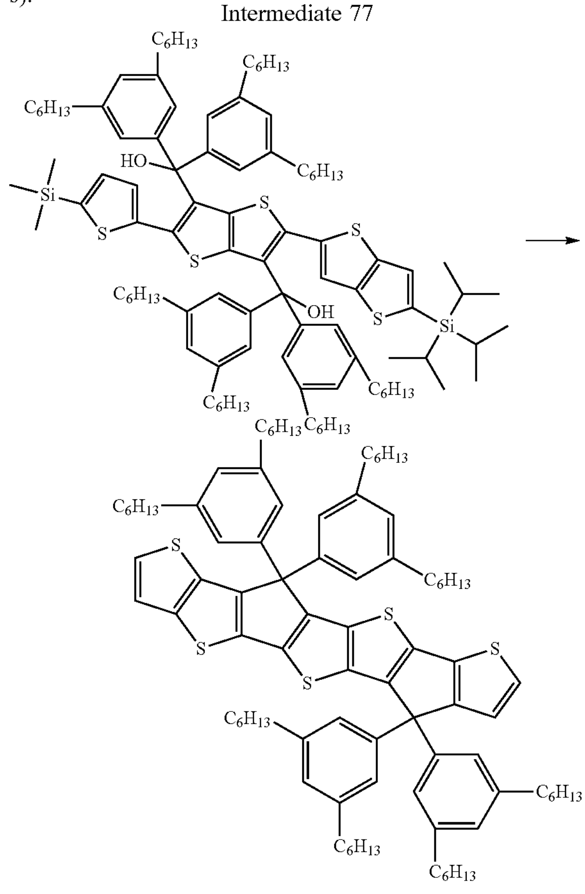

Nitrogen gas is bubbled through a suspension of amberlyst 15 strong acid (8.8 g) in anhydrous diethyl ether (100 $cm^3$) at 0° C. for 60 minutes. Intermediate 76 (2.2 g, 1.4 mmol) is added whilst the mixture is degassed for a further 30 minutes. The resulting suspension is stirred at 23° C. for 2 hours. The reaction mixture is filtered and the solvent removed in vacuo. The crude is taken up in anhydrous tetrahydrofuran (50 $cm^3$) and tetrabutylammonium fluoride (2.7 $cm^3$, 2.7 mmol, 1 M in tetrahydrofuran) added. The mixture is stirred for 1 hour. Diethyl ether (100 $cm^3$) and water (200 $cm^3$) are added and the mixture stirred for 30 minutes. The product is extracted with diethyl ether (3×100 $cm^3$). The organics are combined and dried over anhydrous magnesium sulfate, filtered and the solvent removed in vacuo. The crude is purified using silica gel column chromatography (40-60 petrol:dichloromethane; 9:1) to give intermediate 77 (1.0 g, 54%) as a dark orange solid. $^1$H NMR (400 MHz, $CDCl_3$) 7.25-7.31 (1H, m), 7.21-7.25 (1H, m), 7.17 (1H, d, J 4.9), 7.05 (1H, d, J 4.9), 6.81-6.91 (12H, m), 2.40-2.57 (16H, m), 1.54 (16H, d, J 6.8), 1.25 (48H, d, J 7.3), 0.85 (24H, q, J 6.2).

Intermediate 78

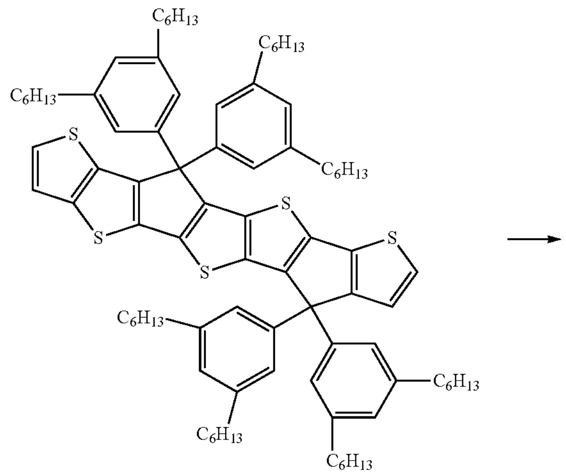

-continued

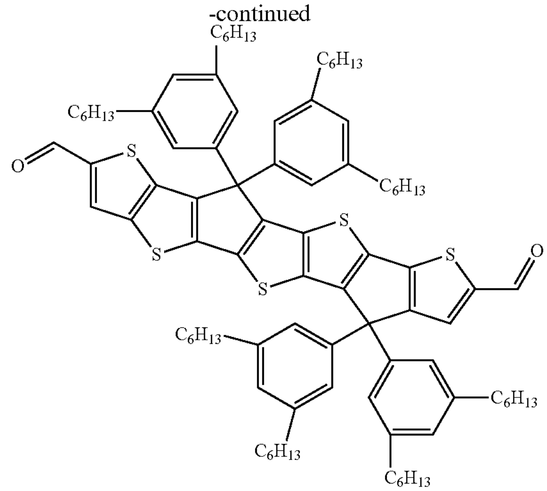

To a solution of intermediate 77 (500 mg, 0.37 mmol) in anhydrous tetrahydrofuran (22 $cm^3$) at −78° C. is added dropwise n-butyllithium (0.6 $cm^3$, 1.5 mmol, 2.5 M in hexane) over 10 minutes. After addition, the reaction mixture is stirred at −78° C. for 60 minutes. N,N-Dimethylformamide (0.15 $cm^3$, 2.2 mmol) is added and the mixture allowed to warm to 23° C. over 17 hours. Diethyl ether (50 $cm^3$) and water (50 $cm^3$) are added and the mixture stirred at 23° C. for 30 minutes. The product is extracted with diethyl ether (3×100 $cm^3$). The combined organics are dried over anhydrous magnesium sulfate, filtered and the solvent removed in vacuo. The crude is purified using silica gel column chromatography (40-60 petrol:dichloromethane; 8:2) to give intermediate 78 (95 mg, 18%) as a dark red oil. $^1$H NMR (400 MHz, $CDCl_3$) 9.70-9.85 (1H, s), 9.69-9.75 (1H, s), 7.83-7.87 (1H, s), 7.56 (1H, s), 6.83 (4H, s), 6.71 (8H, dd, J 12.8, 1.3), 2.29-2.53 (16H, m), 1.36-1.55 (16H, m), 1.05-1.27 (48H, m), 0.76 (24H, q, J 6.8).

Compound 41

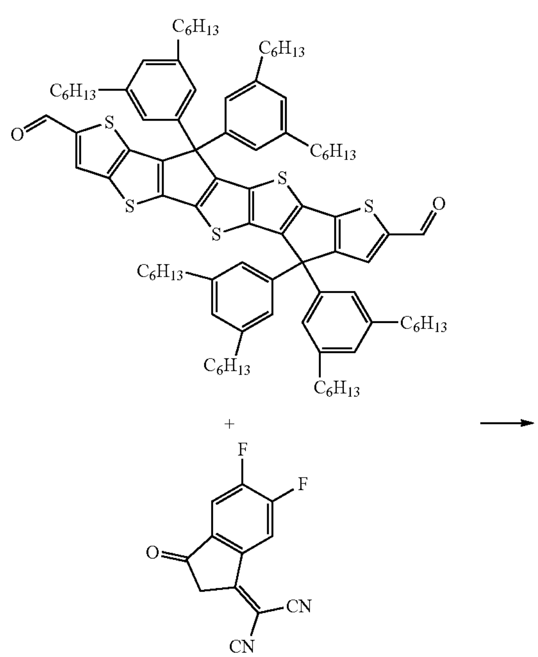

-continued

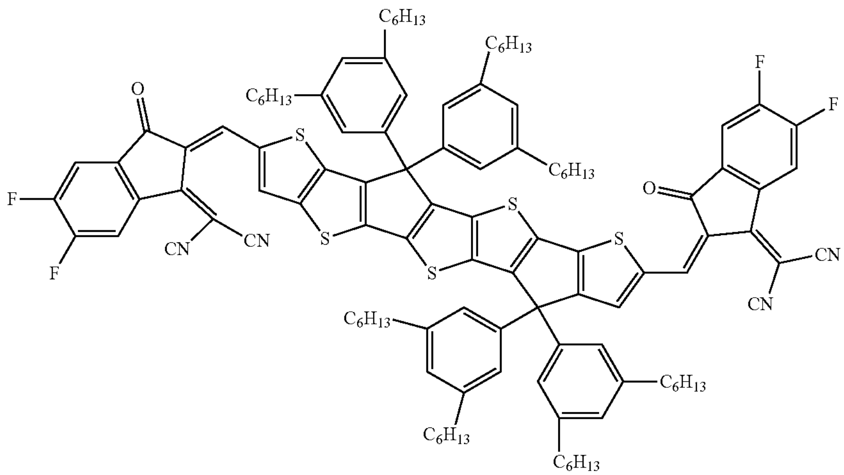

To a solution of intermediate 78 (100 mg, 0.07 mmol) in anhydrous chloroform (40 $cm^3$) at 0° C. is added pyridine (0.4 $cm^3$, 4.5 mmol). The mixture is then degassed with nitrogen before 2-(5,6-difluoro-3-oxo-indan-1-ylidene)-malononitrile (65 mg, 0.28 mmol) is added. The solution is further degassed and then stirred at 0° C. for 30 minutes. The ice bath is removed and the reaction is allowed to warm to 40° C. over 120 minutes. The mixture is diluted with 2-propanol (300 $cm^3$) to form a suspension and the solid collected by filtration. The crude is dissolved in dichloromethane (100 $cm^3$) then diluted with ethanol (300 $cm^3$) to produce a heavy suspension which is collected by filtration to give Compound 41 (82 mg, 63%) as a blue/green solid. $^1H$ NMR (400 MHz, $CD_2Cl_2$) 8.77 (2H, s), 8.42 (2H, dt, J 9.8, 6.1), 8.06 (1H, s), 7.67 (1H, s), 7.56 (2H, dt, J 11.4, 7.6), 6.66-6.96 (12H, m), 2.32-2.56 (16H, m), 1.35-1.57 (16H, m), 1.05-1.26 (48H, m), 0.63-0.80 (24H, m).

Example 41

Intermediate 79

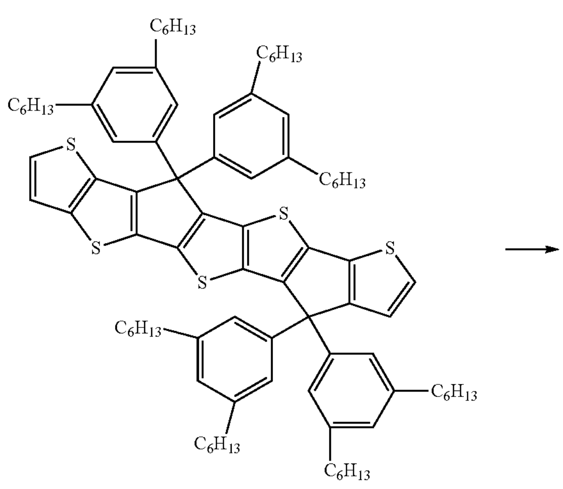

-continued

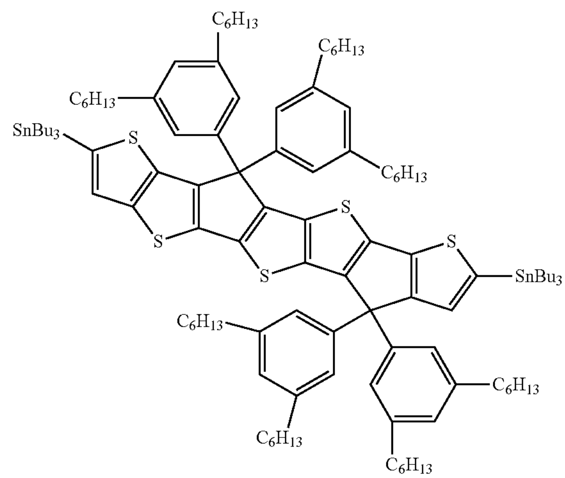

To a solution of intermediate 77 (500 mg, 0.37 mmol) in anhydrous tetrahydrofuran (22 $cm^3$) at −78° C. is added dropwise n-butyllithium (0.6 $cm^3$, 1.5 mmol, 2.5 M in hexane) over 10 minutes. After addition, the reaction mixture is stirred at −78° C. for 60 minutes before tributyltin chloride (0.4 $cm^3$, 1.6 mmol) is added. The mixture is then allowed to warm to 23° C. over 72 hours. The solvent removed in vacuo, and the residue passed through a zeolite plug (40-60 petrol). The crude is suspended in ethanol (100 $cm^3$) stirred for 30 minutes and the solvent decanted. This procedure is repeated twice to give partially purified intermediate 79 (860 mg) as a dark red oil. $^1H$ NMR (400 MHz, $CD_2Cl_2$) 7.02-7.16 (1H, m), 6.82-6.93 (1H, m), 6.57-6.72 (12H, m), 2.20-2.32 (16H, m), 0.96-1.53 (48H, m), 0.54-0.78 (24H, m).

Intermediate 80

-continued

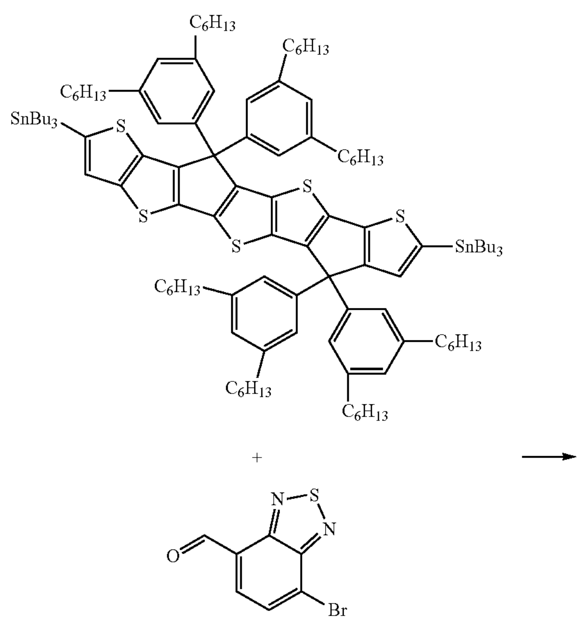

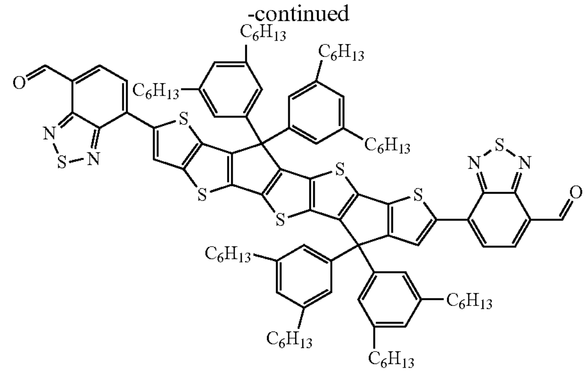

A mixture of intermediate 79 (712 mg, 0.37 mmol), 2-bromo-thiazole-5-carbaldehyde (178 mg, 0.73 mmol), tri-o-tolyl-phosphine (34 mg, 0.11 mmol) and anhydrous toluene (39 $cm^3$) is degassed by nitrogen for 10 minutes. To the mixture is added tris(dibenzylideneacetone) dipalladium(0) (27 mg, 0.03 mmol) and the mixture further degassed for 15 minutes. The mixture is stirred at 80° C. for 17 hours and, after cooling to 23° C., the solvent removed in vacuo. The crude is stirred in 2-propanol (100 $cm^3$) to form a suspension and the solid collected by filtration. The crude is purified using silica gel column chromatography (40-60 petrol:dichloromethane; 8:2) to give intermediate 80 (545 mg, 88%) as a dark blue solid. $^1$H NMR (400 MHz, $CD_2Cl_2$) 10.61 (2H, s), 8.67 (1H, s), 8.27 (1H, s), 8.10 (2H, d, J 7.6), 7.86 (2H, dd, J 11.9, 7.7), 6.84 (12H, d, J 12.0), 2.43 (16H, m), 1.43-1.57 (16H, m), 1.03-1.29 (48H, m), 0.63-0.80 (24H, m).

Compound 42

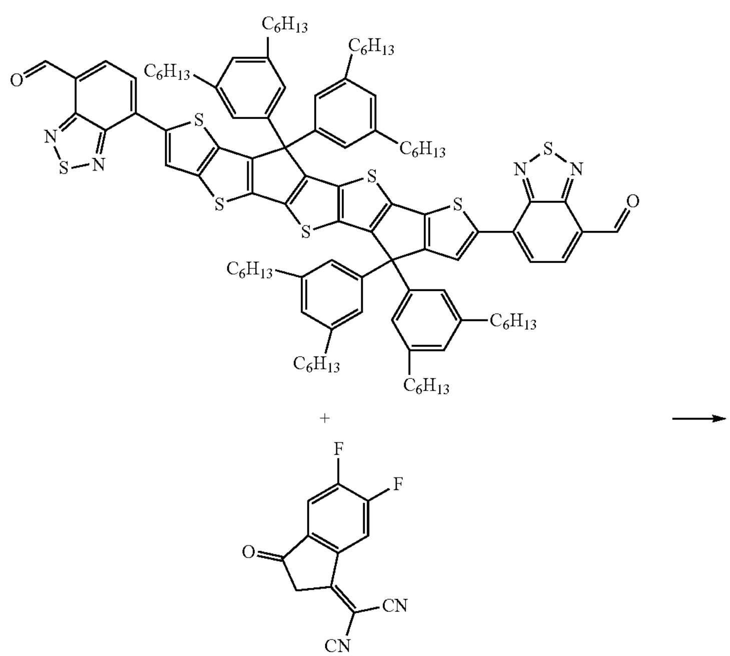

-continued

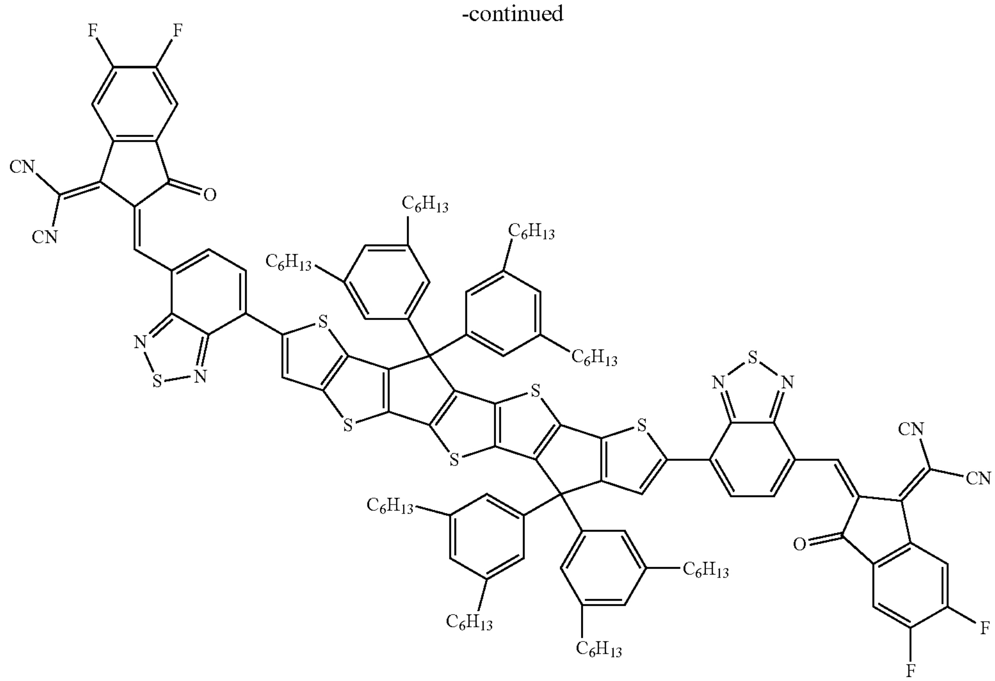

To a solution of intermediate 80 (120 mg, 0.07 mmol) in anhydrous chloroform (48 $cm^3$) at 0° C. is added pyridine (0.2 $cm^3$). The mixture is then degassed with nitrogen before 2-(5,6-difluoro-3-oxo-indan-1-ylidene)-malononitrile (66 mg, 0.29 mmol) is added. The solution is then further degassed and stirred at 0° C. for 20 minutes and at 23° C. for 3 hours. The mixture is diluted with ethanol (200 $cm^3$) to produce a heavy suspension. The solid is collected by filtration and washed with methanol (50 $cm^3$). The crude is suspended in a 1:1 mixture of acetone:diethyl ether (200 $cm^3$) to form a suspension and stirred for 30 minutes. The solid is collected by filtration to give Compound 42 (110 mg, 73%) as a black solid. $^1$H NMR (400 MHz, $CD_2Cl_2$) 9.60 (2H, s), 9.31 (2H, t, J 8.4), 8.84 (1H, s), 8.57-8.65 (2H, m), 8.45 (1H, s), 8.04 (2H, dd, J 12.0, 8.1), 7.78 (2H, t, J 7.7), 6.93-7.03 (12H, m), 2.51-2.63 (16H, m), 1.57-1.66 (16H, m), 1.23-1.36 (48H, m), 0.79-0.90 (24H, m).

Example 42

Compound 43

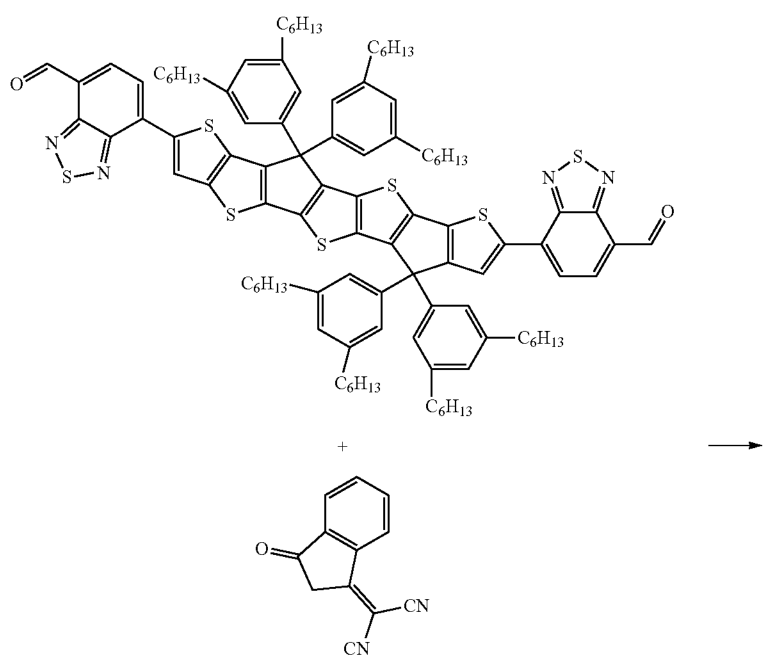

-continued

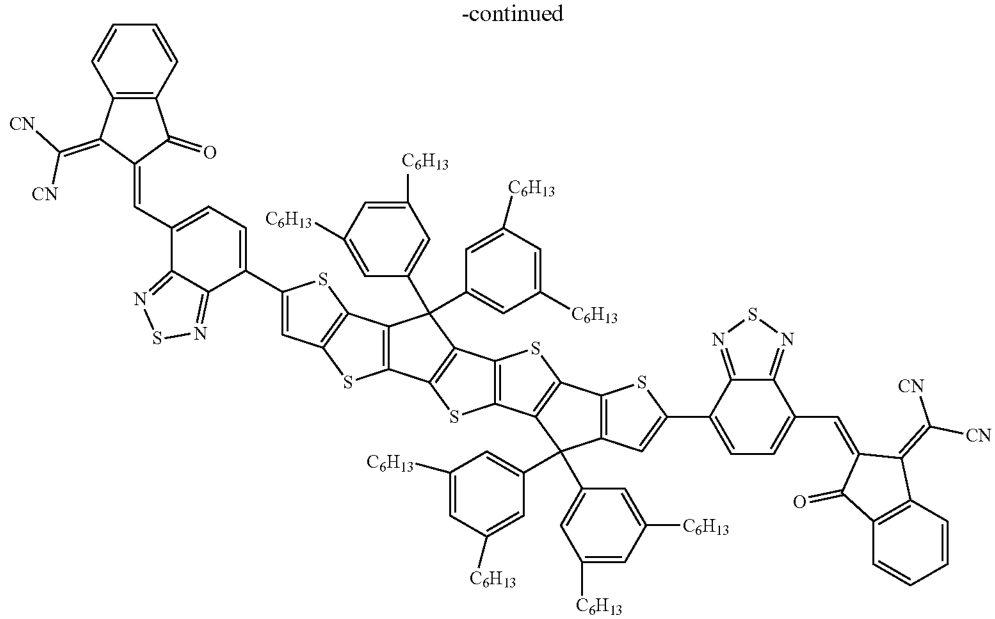

To a solution of intermediate 80 (150 mg, 0.09 mmol) in anhydrous chloroform (48 $cm^3$) at 0° C. is added pyridine (0.3 $cm^3$). The mixture is then degassed with nitrogen before a solution of 3-(dicyanomethylidene) indan-1-one (69 mg, 0.36 mmol) in chloroform (10 $cm^3$) is added. The solution is then further degassed and stirred at 23° C. for 4 hours. The mixture is diluted with ethanol (500 $cm^3$) to produce a heavy suspension. The solid is collected by filtration and washed with acetone (50 $cm^3$) to give Compound 43 (98 mg, 54%) as a black solid. $^1$H NMR (400 MHz, $CD_2Cl_2$) 9.57 (2H, s), 9.33 (2H, t, J 7.9), 8.82 (1H, s), 8.76 (2H, d, J 7.3), 8.44 (1H, s), 8.01-8.07 (2H, m), 7.99 (2H, d, J 7.1), 7.78-7.90 (4H, m), 6.98 (12H, d, J 11.7), 2.48-2.62 (16H, m), 1.50-1.65 (24H, m), 1.20-1.41 (48H, m), 0.78-0.92 (24H, m).

Example 43

Intermediate 81

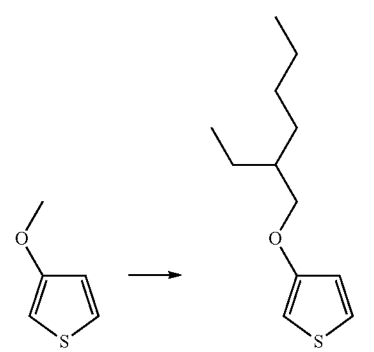

3-Methoxy-thiophene (25.0 g, 219 mmol) and 2-ethyl-hexan-1-ol (51.4 $cm^3$, 329 mmol) are dissolved in anhydrous toluene (500 $cm^3$). With stirring 4-methylbenzenesulfonic acid hydrate (4.17 g, 21.9 mmol) is added and after 35 minutes at 23° C. the reaction is heated at reflux for 20 hours. The reaction is then cooled to 23° C. before additional toluene (50 $cm^3$) is added. The solution is washed with water (2×250 $cm^3$) and brine (250 $cm^3$) before drying over magnesium sulfate, filtered and concentrated in vacuo. The crude product is purified by silica plug (40-60 petrol) followed by column chromatography (40-60 petrol), to give intermediate 81 (23.4 g, 50% yield) as a yellow tinged oil. $^1$H NMR (400 MHz, $CDCl_3$) 7.18 (1H, dd, J 5.3, 3.1), 6.77 (1H, dd, J 5.3, 1.6), 6.24 (1H, dd, J 3.2, 1.5), 3.84 (2H, dd, J 5.8, 0.9), 1.72 (1H, spt, J 6.1), 1.26-1.56 (8H, m), 0.88-0.97 (6H, m).

Intermediate 82

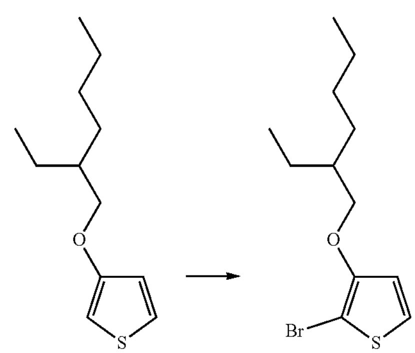

To a solution of intermediate 81 (23.1 g, 109 mmol) in anhydrous N,N-dimethylformamide (330 $cm^3$) at 0° C. is added a solution of 1-bromo-pyrrolidine-2,5-dione (19.4 g, 109 mmol) in anhydrous N,N-dimethylformamide (110 $cm^3$). The reaction mixture is then stirred at 23° C. for 41 hours before adding to ice (2000 $cm^3$) with stirring. Once melted, half of the aqueous suspension is extracted with 40-60 petrol (300 $cm^3$). The aqueous layer is removed and the second half of the aqueous suspension extracted. The aqueous layers are additionally extracted in this manner with a second washing of 40-60 petrol (200 $cm^3$). The organic extracts are then combined and washed with brine (2×200 $cm^3$), dried over magnesium sulfate and filtered. Due to stability concerns, the bulk sample is not concentrated in vacuo and is allowed to remain in solution until immediately prior to use. $^1$H NMR of sample suggests quantitative yield of intermediate 82 as a yellow oil. 1H NMR (400 MHz, $CDCl_3$) 7.19 (1H, d, J 5.9), 6.75 (1H, d, J 5.9), 3.93 (2H, d, J 5.9), 1.71 (1H, sept, J 6.1), 1.24-1.60 (8H, m), 0.88-0.98 (6H, m).

Intermediate 83

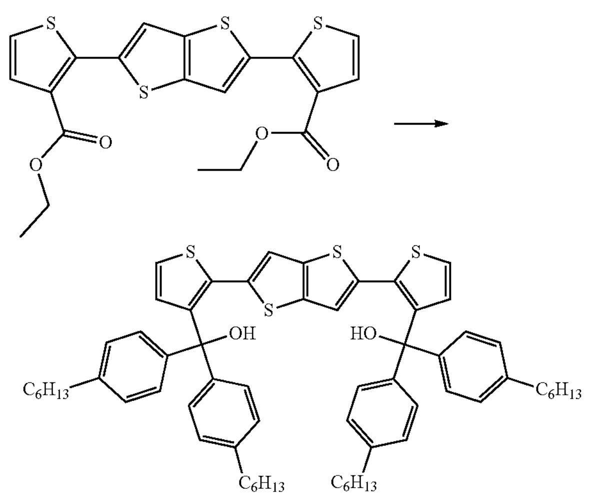

To a suspension of 1-bromo-4-hexylbenzene (10.3 g, 42.5 mmol) in anhydrous tetrahydrofuran (180 $cm^3$) at −78° C. is added tert-butyllithium (50 $cm^3$, 85 mmol, 1.7 M in pentane) over 30 minutes. The reaction is then allowed to warm to −30° C., before re-cooling to −78° C. Additional 1-bromo-4-hexylbenzene (1.00 g, 4.15 mmol) is then added to ensure consumption of any residual tert-butyllithium. Ethyl 2-[5-(3-ethoxycarbonyl-2-thienyl)thieno[3,2-b]thiophen-2-yl] thiophene-3-carboxylate (3.81 g, 8.50 mmol) is then added in one portion to the reaction mixture and the mixture allowed to stir at 23° C. for 17 hours. The reaction is diluted with diethyl ether (100 $cm^3$) and washed with water (200 $cm^3$). The organic layer is diluted with diethyl ether (100 $cm^3$) then further washed with water (200 $cm^3$) and brine (100 $cm^3$). The organic layer is then dried over anhydrous magnesium sulfate, filtered and concentrated in vacuo. The crude product is then purified by column chromatography using a graded solvent system (40-60 petrol:dichloromethane; 1:0 to 2:3) to give intermediate 83 (5.61 g, 66% yield) as a light yellow oil. $^1$H NMR (400 MHz, $CDCl_3$) 7.07-7.18 (18H, m), 6.65 (2H, s), 6.45 (2H, d, J 5.4), 3.25 (2H, s), 2.60 (8H, t, J 7.7), 1.58-1.66 (8H, m), 1.24-1.39 (24H, m), 0.87-0.92 (12H, m).

Intermediate 84

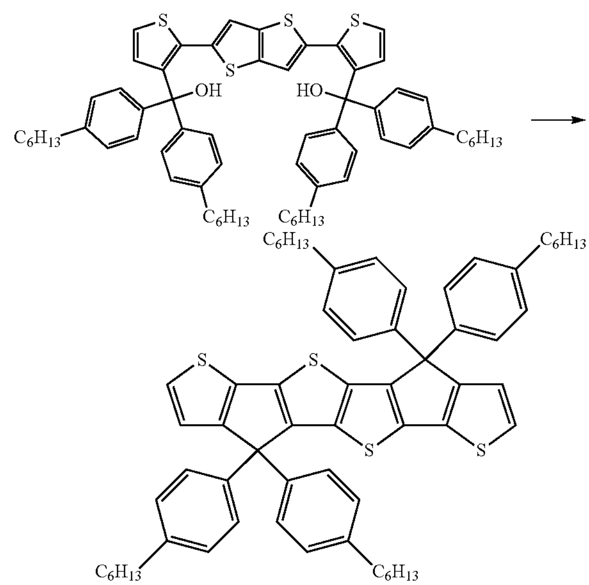

To a degassed suspension of amberlyst 15 strong acid (10.8 g) in anhydrous toluene (65 $cm^3$) is added a degassed solution of intermediate 83 (2.69 g, 2.68 mmol) in anhydrous toluene (64 $cm^3$) and the reaction mixture stirred at 23° C. for 15 minutes. The reaction mixture is then heated at 40° C. for 70 minutes and at 50° C. for a further 45 minutes. The reaction is then filtered through a layered bed of celite:magnesium sulfate:celite washing with toluene (3×40 $cm^3$) and diethyl ether (5×50 $cm^3$). The mixture is then concentrated in vacuo and purified by column chromatography, eluting with a graded solvent system (40-60 petrol: dichloromethane; 1:0 to 1:9) to give intermediate 84 (540 mg, 21%) as a yellow solid. $^1$H NMR (400 MHz, $CDCl_3$) 7.12-7.18 (10H, m), 7.05-7.10 (10H, m), 2.55 (8H, t, J 7.8), 1.51-1.63 (8H, m), 1.23-1.37 (24H, m), 0.84-0.90 (12H, m).

Intermediate 85

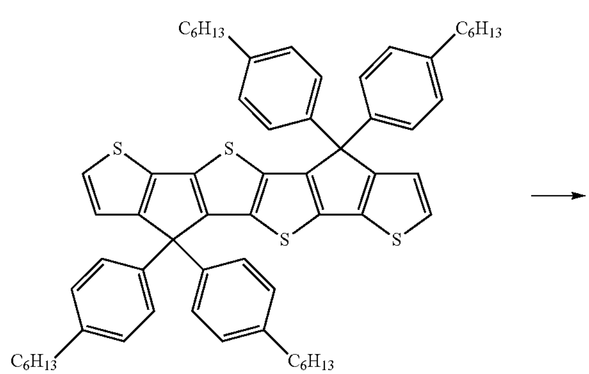

-continued

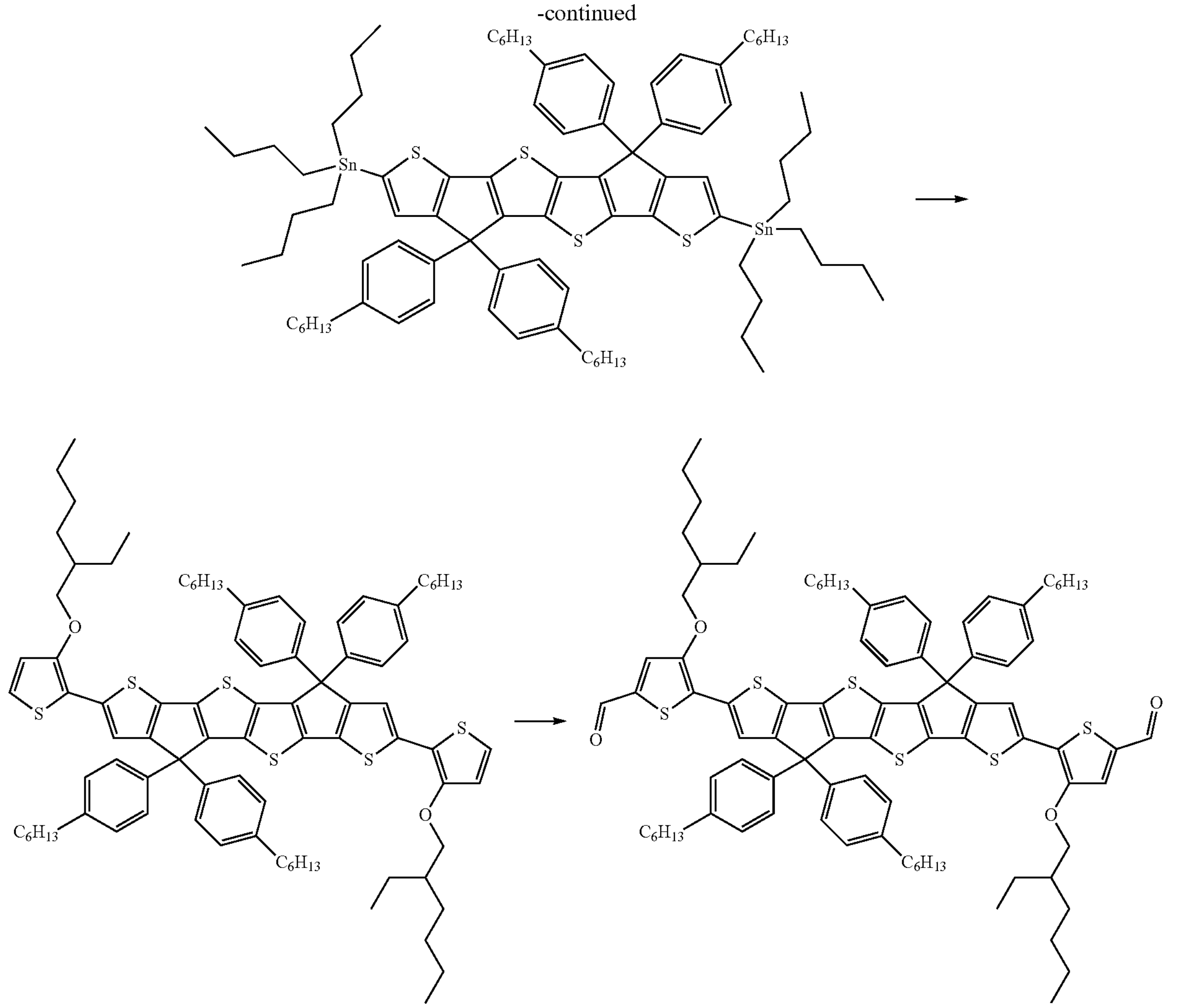

A solution of intermediate 84 (1.15 g, 1.19 mmol) in anhydrous tetrahydrofuran (70 $cm^3$) is cooled to −78° C. before n-butyllithium (1.4 $cm^3$, 3.6 mmol, 2.5 M in hexanes) is added via syringe. The mixture is then stirred at −78° C. for 1 hour before tributyltin chloride (1.1 $cm^3$, 4.2 mmol) is added. The mixture is stirred at 23° C. for 17 hours, methanol (20 $cm^3$) added and after stirring for 6 hours the reaction mixture is concentrated in vacuo. The crude is triturated with methanol (3×10 $cm^3$) and then added to a solution of intermediate 61 (785 mg, 2.69 mmol) (freshly concentrated in vacuo) in anhydrous toluene (150 $cm^3$). The solution is then degassed with nitrogen before tris(dibenzylideneacetone)dipalladium (90 mg, 0.10 mmol) and tris(o-tolyl)phosphine (112 mg, 0.368 mmol) are added. The reaction mixture is then further degassed before heating at 80° C. with continued degassing for 19 hours. The reaction is then stirred at 23° C. for 4 days after which it is concentrated in vacuo. The crude material is then partially purified by silica plug using a graded solvent system (petrol 40-60:dichloromethane; 1:0-2:3). The partially purified material is then triturated with methanol (6×10 $cm^3$), taken up in anhydrous tetrahydrofuran (58 $cm^3$) and cooled to −78° C. To this mixture is added dropwise n-butyllithium (1.4 $cm^3$, 3.5 mmol, 2.5 M in hexanes) and the reaction mixture stirred for 1 hour. The reaction is then quenched by the addition of N,N-dimethylformamide (2.3 $cm^3$, 30 mmol) and after 1 hour at −78° C. the reaction is allowed to stir at 23° C. for 15 hours. The reaction is diluted with diethyl ether (150 $cm^3$) and washed with water (150 $cm^3$) with added brine (20 $cm^3$). The organic layer is then isolated and the aqueous layer additionally extracted with diethyl ether (50 $cm^3$). The combined organic layers are then further washed with water (100 $cm^3$) with added brine (20 $cm^3$) and brine (100 $cm^3$) before they are dried over magnesium sulfate, filtered and concentrated in vacuo. The crude product is purified by column chromatography using a graded solvent system (40-60 petrol:dichloromethane; 1:0 to 2:3) followed by further column chromatography using a graded solvent system (80-100 petrol:diethyl ether; 1:0 to 6:3) to give intermediate 85 (285 mg, 17% yield over 3 steps) as a black solid. $^1H$ NMR (400 MHz, $CDCl_3$) 9.73 (2H, s), 7.44 (2H, s), 7.41 (2H, s), 7.17 (8H, d, J 8.2), 7.11 (8H, d, J 8.2), 4.08 (4H, d, J 5.1), 2.57 (8H, t, J 7.8), 1.81 (2H, spt, J 6.0), 1.43-1.66 (16H, m), 1.22-1.40 (32H, m), 0.82-1.00 (24H, m).

Compound 44

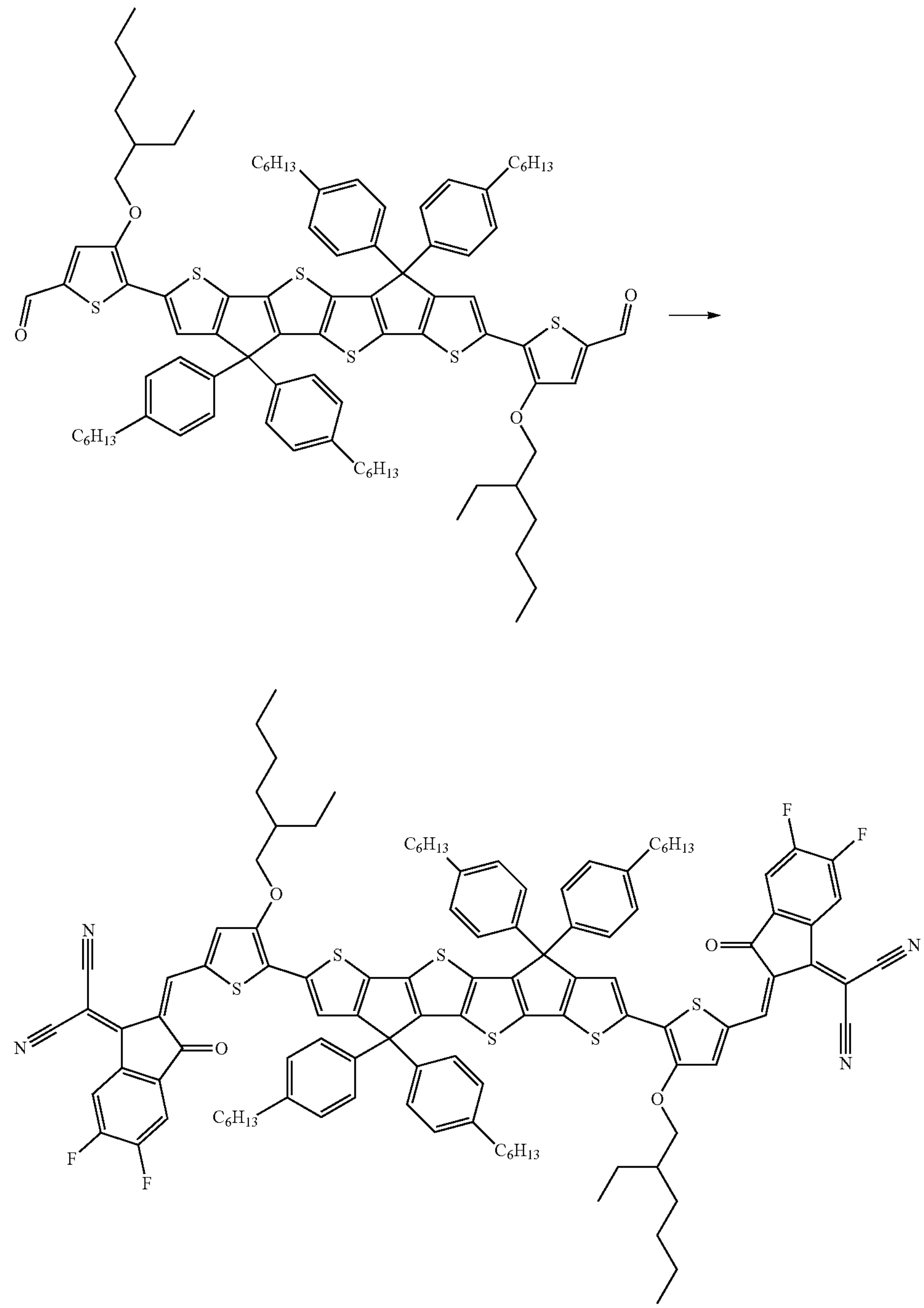

To a solution of intermediate 85 (150 mg, 0.104 mmol) in anhydrous chloroform (11 $cm^3$) is added pyridine (0.59 $cm^3$) and the solution degassed for 25 minutes. The reaction mixture is then cooled to −20° C. and 2-(5,6-difluoro-3-oxo-indan-1-ylidene)-malononitrile (95 mg, 0.41 mmol) is added. The reaction mixture is then degassed for a further 15 minutes and allowed to warm to 23° C. over 3 hours. The cooling bath is then removed and the reaction stirred at 23° C. for a further 2 hours before the reaction is added to stirring methanol (200 $cm^3$) washing in with dichloromethane (10 $cm^3$). After 30 minutes the precipitate is collected by filtration, washed with methanol (3×10 $cm^3$) to give Compound 44 (132 mg, 68% yield) as a black solid. $^1H$ NMR (400 MHz, $CDCl_3$) 8.67 (2H, s), 8.52 (2H, dd, J 10.2, 6.5), 7.67 (2H, s), 7.61-7.66 (2H, m), 7.51 (2H, s), 7.16-7.21 (8H, m), 7.11-7.16 (8H, m), 4.15 (4H, d, J 5.4), 2.60 (8H, t, J 7.7), 1.86 (2H, spt, J 6.1), 1.50-1.69 (16H, m), 1.25-1.43 (32H, m), 1.01 (6H, t, J 7.5), 0.92-0.97 (6H, m), 0.85-0.92 (12H, m).

Example 44

Intermediate 86

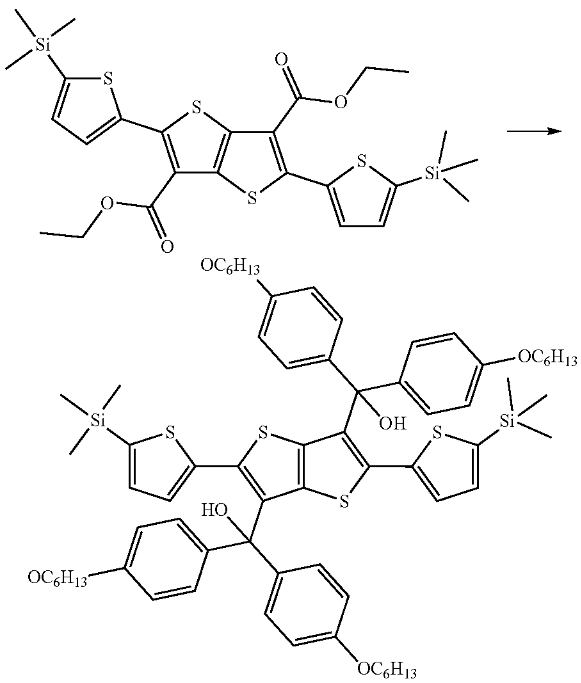

To a solution of 1-bromo-4-hexyloxy-benzene (1.43 g, 5.57 mmol) in anhydrous tetrahydrofuran (20 $cm^3$) at −78° C. is added tert-butyllithium (6.55 $cm^3$, 11.1 mmol, 1.7 M in pentane) over 5 minutes. The reaction mixture is then stirred for 45 minutes. Intermediate 32 (550 mg, 0.93 mmol) is added as a single portion, the cooling removed and the reaction mixture stirred at 23° C. for 17 hours. Water (50 $cm^3$) and diethyl ether (50 $cm^3$) are added. The organic phase is washed with water (2×30 $cm^3$), dried over magnesium sulphate, filtered and concentrated in vacuo. The resulting solid is slurried in 40-60 petrol (10 $cm^3$), filtered and washed with 40-60 petrol (2×10 $cm^3$) to give intermediate 86 (1.13 g, 76%) as a pale green solid. $^1$H NMR (400 MHz, $CDCl_3$) 7.11-7.22 (8H, m), 6.85 (2H, d, J 3.4), 6.75-6.82 (7H, m), 6.49 (2H, d, J 3.4), 3.94 (8H, t, J 6.6), 3.34 (2H, s), 1.67-1.84 (8H, m), 1.39-1.52 (8H, m), 1.25-1.38 (16H, m), 0.86-0.95 (12H, m), 0.22 (s, 18H).

Intermediate 87

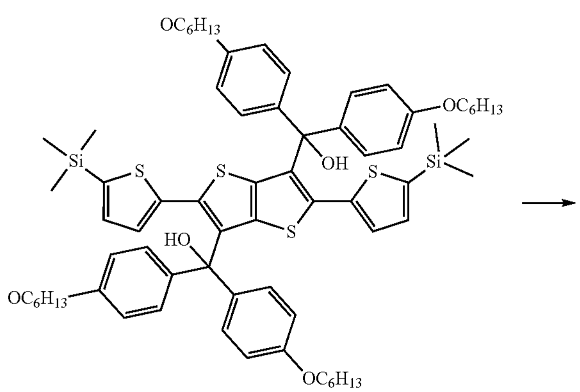

-continued

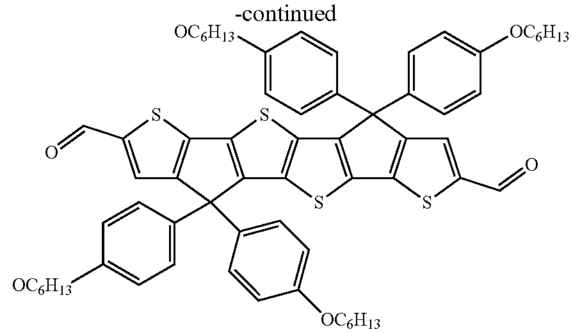

A solution of intermediate 86 (850 mg, 0.70 mmol) dissolved in toluene (34 $cm^3$) at 75° C. is degassed with a flow of nitrogen for 20 minutes. Amberlyst 15 strong acid (4.0 g) is added and the reaction mixture degassed for a further 10 minutes and stirred for 17 hours. The reaction is allowed to cool to 23° C., filtered and the solid washed with toluene (50 $cm^3$). The combined organic phases is concentrated in vacuo. The intermediate material is dissolved in chloroform (17 $cm^3$), N,N-dimethylformamide (819 mg, 11.2 mmol) is added and the solution cooled to 0° C. Phosphoryl chloride (1.61 g, 10.5 mmol) is added over 10 minutes, the cooling removed and the reaction stirred at 65° C. for 17 hours. An aqueous solution of sodium acetate (100 $cm^3$, 6 M) is added and the biphasic solution stirred at 65° C. for 2 hours. The mixture extracted with dichloromethane (15 $cm^3$) and the combined organic phases washed with water (2×20 $cm^3$), dried over anhydrous magnesium sulphate, filtered and concentrated in vacuo. The solid is triturated in 40-60 petrol (10 $cm^3$) and collected by filtration to give intermediate 87 (763 mg, 63%) as an orange solid. $^1$H NMR (400 MHz, $CD_2Cl_2$) 9.80 (2H, s), 7.69 (2H, s), 7.00-7.28 (8H, m), 6.60-6.91 (8H, m), 3.91 (8H, t, J 6.6), 1.61-1.85 (8H, m), 1.38-1.51 (8H, m), 1.32 (16H, m), 0.82-0.98 (12H, m).

Compound 45

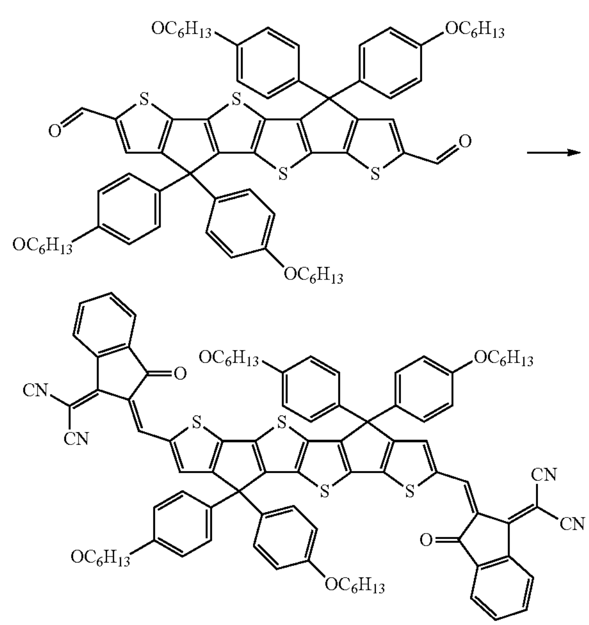

Intermediate 87 (200 mg, 0.18 mmol) and 2-(3-oxo-indan-1-ylidene)-malononitrile (250 mg, 1.28 mmol) are dissolved in chloroform (5 $cm^3$) and nitrogen bubbled through the suspension for 20 minutes. Pyridine (30.6 $cm^3$; 379 mmol) is added and nitrogen passed through the solution for a further 20 minutes. The solution is stirred for 17 hours. Methanol (35 $cm^3$) is added and the solid collected by filtration and washed with methanol (3×10 $cm^3$). The solid is triturated in acetone (5 $cm^3$), filtered and washed with acetone (3×2 $cm^3$). The material is purified on silica gel eluting with a graded solvent system (40-60 petrol:dichloromethane; 11:9 to 2:3) to give Compound 45 (66 mg, 25%) as a blue solid. $^1$H NMR (400 MHz, $CDCl_3$) 8.86 (2H, s), 8.68 (2H, d, J 7.4), 7.86-7.95 (2H, m), 7.70-7.78 (4H, m), 7.68 (2H, s), 7.14 (8H, d, J 8.7), 6.84 (8H, d, J 8.5), 3.92 (8H, t, J 6.5), 1.75 (8H, m), 1.39-1.47 (8H, m), 1.27-1.35 (16H, m), 0.88 (12H, m).

Example 45

Compound 46

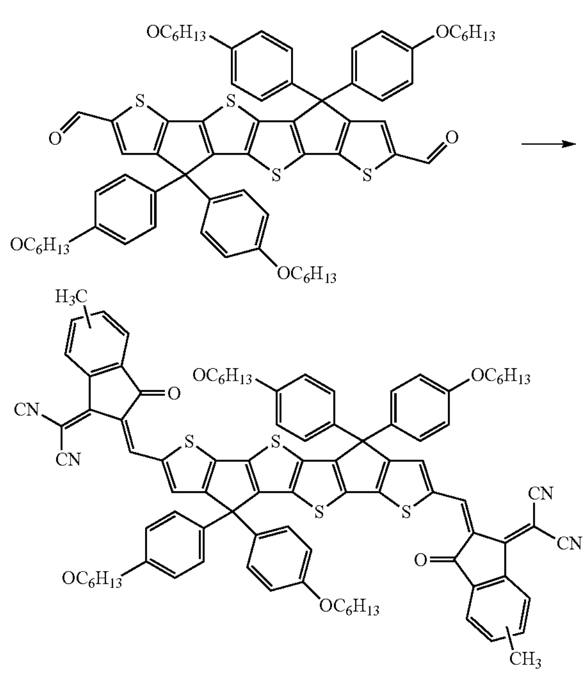

Intermediate 87 (200 mg, 0.18 mmol) and 2-(5-methyl-3-oxo-indan-1-ylidene)-malononitrile (268 mg, 1.28 mmol) are dissolved in chloroform (5 $cm^3$) and nitrogen bubbled through the suspension for 20 minutes. Pyridine (1.04 $cm^3$, 12.9 mmol) is added and nitrogen passed through the solution for a further 20 minutes. The solution is stirred for 17 hours. Methanol (35 $cm^3$) added and the solid collected by filtration and washed with methanol (3×10 $cm^3$). The solid is triturated in acetone (5 $cm^3$), filtered and washed with acetone (3×2 $cm^3$). The material is purified on silica gel eluting with a graded solvent system (40-60 petrol:dichloromethane; 11:9 to 2:3) to give Compound 46 (69 mg, 26%) as a blue solid. $^1$H NMR (400 MHz, $CD_2Cl_2$) 8.82-8.88 (2H, m), 8.48-8.59 (2H, m), 7.55-7.86 (6H, m), 7.16-7.25 (8H, m), 6.82-6.91 (8H, m), 3.95 (8H, t, J 6.6), 2.55-2.59 (6H, m), 1.71-1.83 (8H, m), 1.42-1.52 (8H, m), 1.31-1.40 (16H, m), 0.88-0.95 (12H, m).

Example 46

Intermediate 88

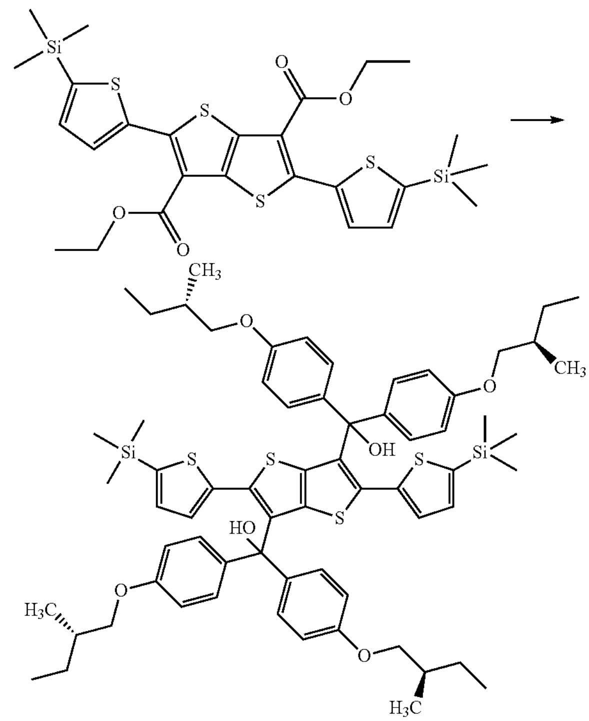

To a solution of 1-bromo-4-((S)-2-methyl-butoxy)-benzene (1.21 g, 4.98 mmol) in anhydrous tetrahydrofuran (20 $cm^3$) at −78° C. is added tert-butyllithium (5.9 $cm^3$, 10.0 mmol, 1.7 M in pentane) over 5 minutes and the reaction mixture stirred for 1 hour. Intermediate 32 (531 mg, 0.90 mmol) is added as a single portion, the cooling removed and the reaction mixture stirred for 65 hours. Water (25 $cm^3$) is added, the mixture stirred for 20 minutes and extracted with ether (25 $cm^3$). The organic portion is washed with water (2×15 $cm^3$), dried over anhydrous magnesium sulphate, filtered, concentrated in vacuo and azeotroped with 40-60 petrol (10 $cm^3$). The solid is collected by filtration and triturated in 40-60 petrol (10 $cm^3$), filtered and washed with 40-60 petrol (2×10 $cm^3$) to give intermediate 88 (785 mg, 68%) as a white solid. $^1$H NMR (400 MHz, $CD_2Cl_2$) 7.15-7.23 (m, 8H), 6.92 (4H, dd, J 3.4, 1.94), 6.83 (8H, dd, J 8.8, 2.1), 6.56 (2H, dd, J 3.5, 1.9), 3.70-3.91 (8H, m), 3.33 (2H, d, J 2.0), 1.82-1.95 (4H, m), 1.48-1.67 (4H, m), 1.22-1.38 (4H, m), 1.00-1.07 (12H, m), 0.87-1.00 (12H, m), 0.24-0.30 (18H, m).

Intermediate 89

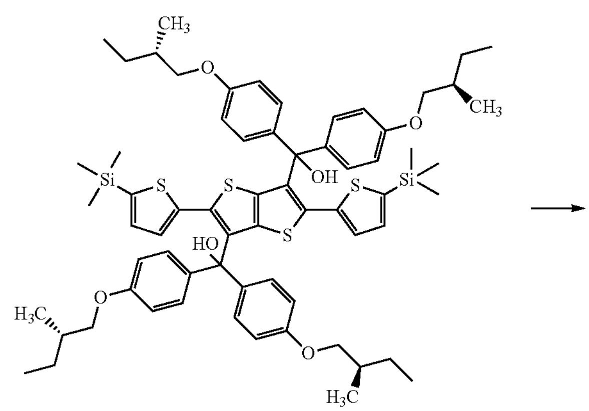

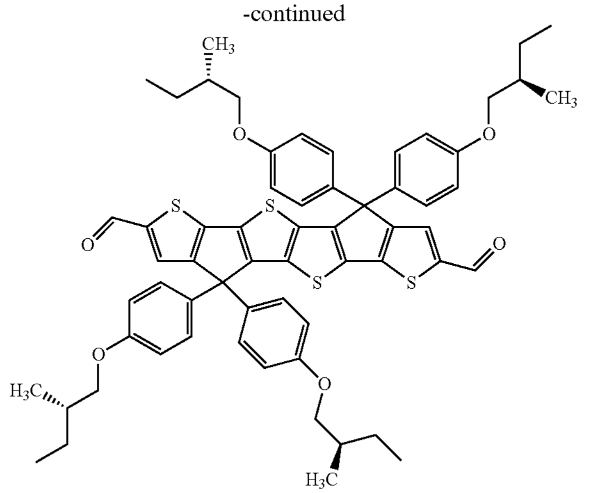

To a degassed mixture of intermediate 88 (785 mg, 0.68 mmol) and toluene (31 $cm^3$) at 75° C. is added Amberlyst 15 strong acid (3.20 g) and the mixture further degassed for 10 minutes. The reaction mixture is then stirred for 17 hours. The suspension is filtered, washed with toluene (50 $cm^3$) and the solvent removed in vacuo. The solid is dissolved in chloroform (15.7 $cm^3$) and N,N-dimethylformamide (793 mg, 10.9 mmol) added. The solution is cooled to 0° C. and phosphorus oxychloride (1.56 g, 10.2 mmol) added over 10 minutes. The cooling is removed and the reaction heated at 65° C. for 17 hours. An aqueous sodium acetate solution (50 $cm^3$, 10 M) is added and the mixture stirred for 3 hours. The solution is extracted with chloroform (15 $cm^3$). The combined organic phases are washed with water (2×20 $cm^3$), dried over anhydrous magnesium sulfate, filtered and the solvent removed in vacuo. The crude is purified by flash chromatography eluting with a graded solvent system (40-60 petrol:dichloromethane; 2:3 to 4:1) to give intermediate 89 (260 mg, 37%) as an orange solid. $^1$H NMR (400 MHz, $CD_2Cl_2$) 9.83 (2H, d, J 0.9), 7.72 (2H, s), 7.17 (8H, d, J 8.6), 6.85 (8H, d, J 8.7), 3.68-3.85 (8H), 1.79-1.91 (4H, m), 1.49-1.61 (4H, m), 1.21-1.34 (4H, m), 1.01 (12H, d, J 6.7), 0.95 (12H, t, J 7.5).

Compound 47

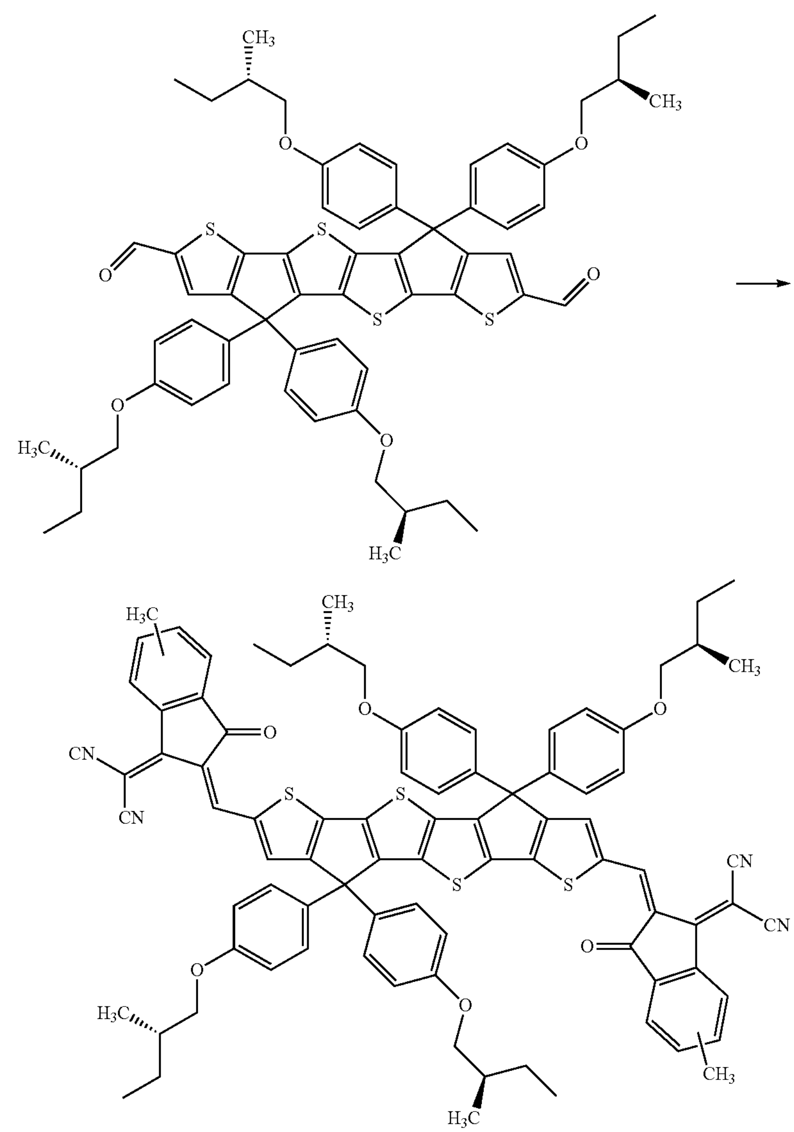

To a degassed mixture of intermediate 89 (108 mg, 0.10 mmol), 2-(5-methyl-3-oxo-indan-1-ylidene)-malononitrile (152 mg, 0.73 mmol) and chloroform (2.7 $cm^3$) is added pyridine (0.59 $cm^3$, 7.3 mmol) and the mixture degassed for a further 10 minutes. The reaction mixture stirred for 5 hours and methanol (30 $cm^3$) added. The solid is collected by filtration and washed with methanol (2×10 $cm^3$). The crude is purified by flash chromatography eluting with a graded solvent system (40-60 petrol:dichloromethane; 9:11 to 1:3) to give Compound 47 (75 mg, 51%) as a blue solid. $^1$H NMR (400 MHz, $CDCl_3$) 8.75 (2H, s), 8.37-8.51 (2H, s), 7.41-7.75 (6H, s), 7.04-7.12 (8H, s), 6.74-6.82 (8H, m), 3.58-3.77 (8H, m), 2.44-2.50 (6H, m), 1.70-1.82 (4H, m), 1.39-1.55 (4H, m), 1.09-1.23 (4H, m), 0.92 (12H, d, J 6.7), 0.85 (12H, t, J 7.5).

Example 47

Compound 48

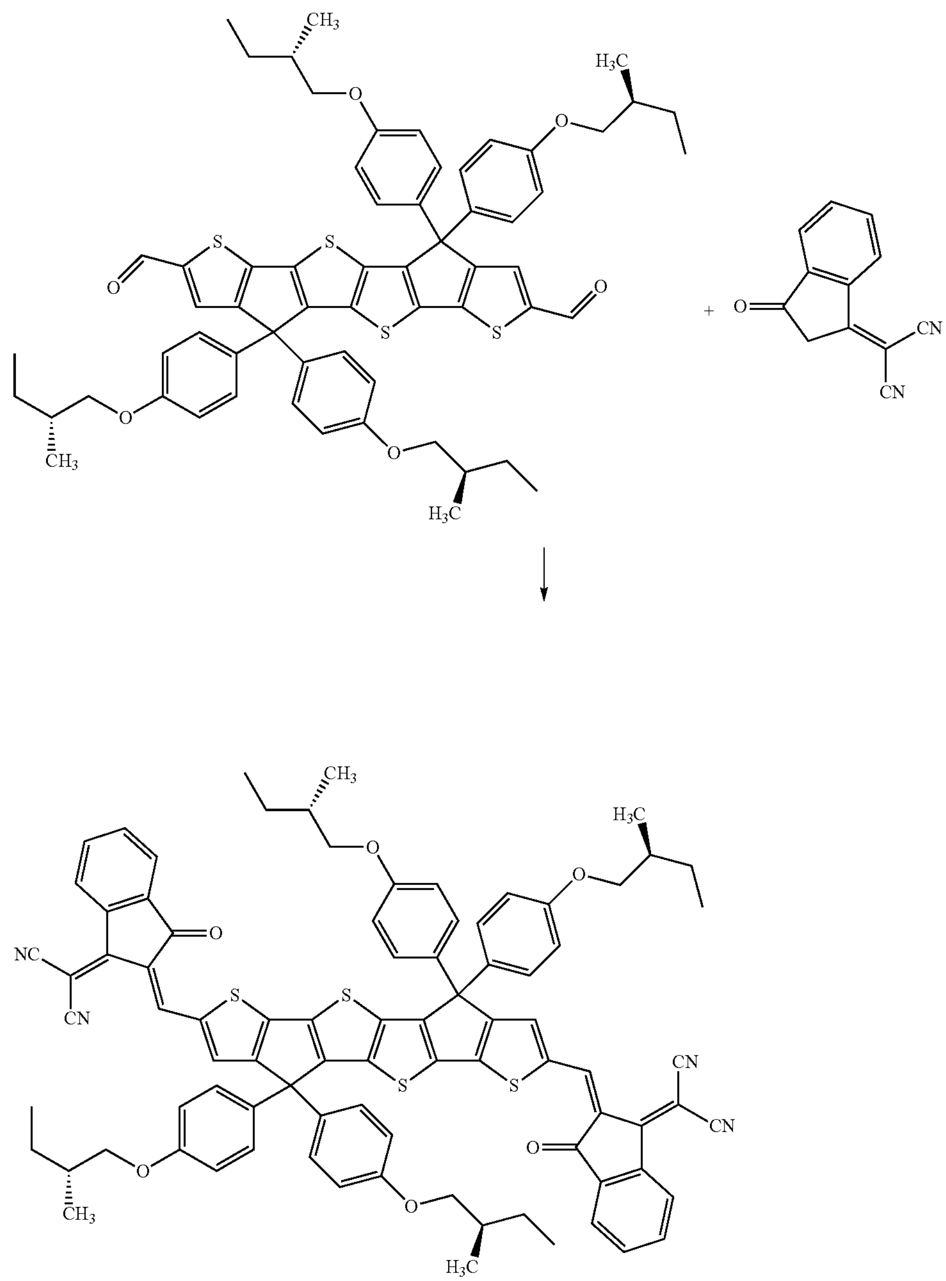

A solution of intermediate 89 (135 mg, 0.130 mmol) in chloroform (10 $cm^3$) and pyridine (0.75 $cm^3$) is degassed for 10 minutes with nitrogen. 2-(3-Oxo-indan-1-ylidene)-malononitrile (180 mg, 0.91 mmol) is added in one portion and the reaction mixture is stirred at 23° C. for 150 minutes. Methanol (15 $cm^3$) is added and the obtained precipitate is collected by filtration and washed with methanol (3×10 $cm^3$). The solid is filtered through a pad of silica (40-60 petrol:dichloromethane; 2:3). Concentration in vacuo followed by trituration in refluxing acetone (20 $cm^3$) and then in a 3:1 mixture of acetone:chloroform (40 $cm^3$) gives Compound 48 (144 mg, 79%) as a dark blue powder. $^1H$ NMR (400 MHz, $CDCl_3$) 8.84 (2H, s), 8.61-8.67 (2H, m), 7.84-7.90 (2H, m), 7.63-7.72 (6H, m), 7.13-7.21 (8H, m), 6.83-6.90 (8H, m), 3.81 (4H, m), 3.72 (4H, m), 1.78-1.92 (4H, m, J 6.6), 1.56 (4H, m), 1.26 (4H, m), 1.00 (12H, d, J 6.7), 0.94 (12H, t, J 7.5).

Example 48

Compound 49

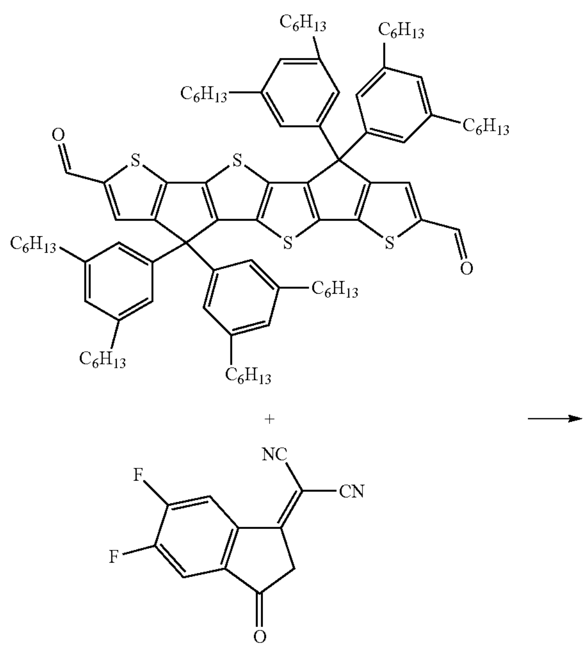

-continued

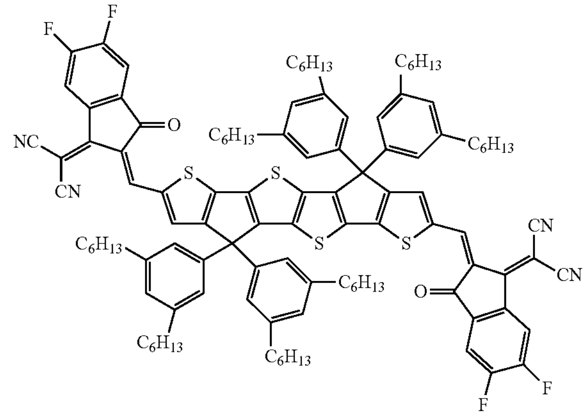

To a degassed solution of intermediate 44 (200 mg, 0.147 mmol) and pyridine (0.83 $cm^3$, 10 mmol) in anhydrous chloroform (40 $cm^3$) at −10° C. is added a degassed solution of 2-(5,6-difluoro-3-oxo-indan-1-ylidene)-malononitrile (135 mg, 0.587 mmol) in anhydrous chloroform (8 $cm^3$) over 10 minutes. The resulting solution is then degassed for a further 30 minutes, warmed to 23° C. and stirred for 4 hours. The reaction mixture is diluted with 2-propanol (300 $cm^3$) and stirred for 1 hour. The resulting solid is collected by filtration and washed with 2-propanol (100 $cm^3$) and ethanol (100 $cm^3$). The solid is then suspended in dichloromethane (50 $cm^3$) and then poured into methanol (500 $cm^3$). The solid is collected by filtration and washed with methanol (100 $cm^3$) and ice-cold acetone (100 $cm^3$) to give Compound 49 (108 mg, 41%) as a dark blue solid. $^1H$ NMR (400 MHz, $CDCl_3$) 8.77 (2H, s), 8.45 (2H, dd, J 9.9, 6.5), 7.52-7.66 (4H, m), 6.88 (4H, s), 6.72 (8H, d, J 1.5), 2.34-2.52 (16H, m), 1.38-1.48 (16H, m), 1.19 (48H, d, J 2.0), 0.67-0.88 (24H, m).

Example 49

Intermediate 90

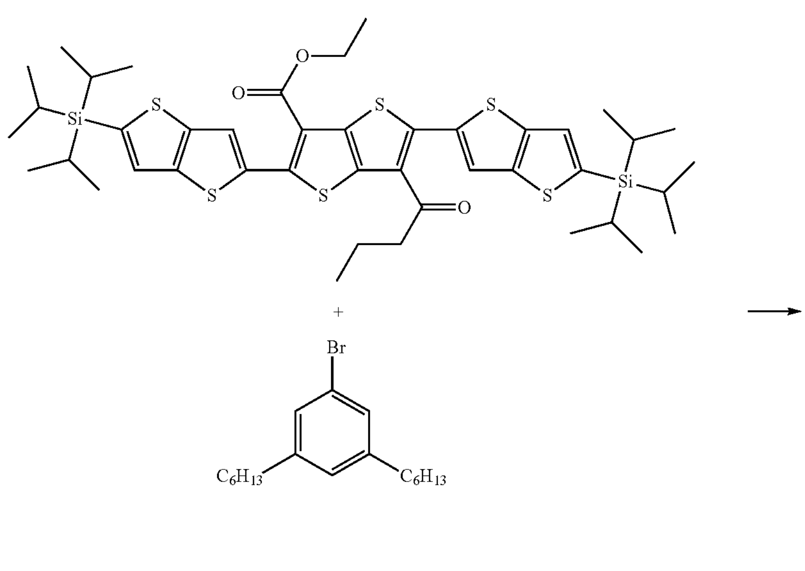

-continued

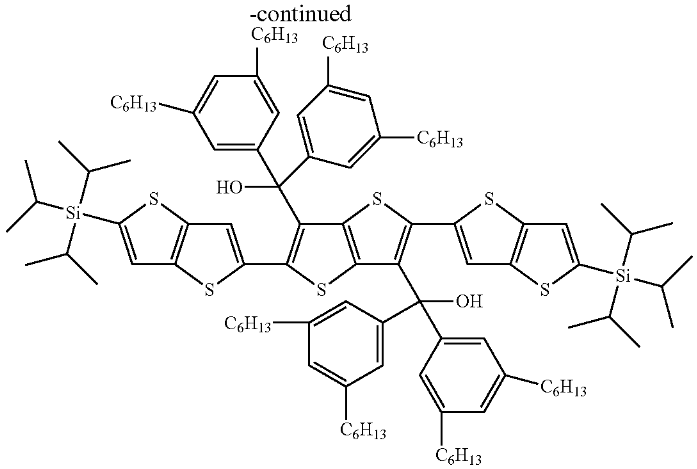

To a solution of 1-bromo-3,5-dihexyl-benzene (5.21 g, 16.0 mmol) in anhydrous tetrahydrofuran (100 $cm^3$) at −78° C. is added dropwise n-butyllithium (6.4 $cm^3$, 16 mmol, 2.5 M in hexane) over 30 minutes. The reaction mixture is then stirred for 2 hours. Intermediate 46 (2.80 g, 3.21 mmol) is then added and the reaction mixture allowed to warm to 23° C. and stirred for 17 hours. Water (100 $cm^3$) is added and the mixture stirred for a further 1 hour. Diethyl ether (100 $cm^3$) is added and the organic layer washed with water (2×50 $cm^3$), dried over anhydrous magnesium sulfate, filtered and the solvent removed in vacuo. The crude is purified by column chromatography using a graded solvent system (40-60 petrol:dichloromethane; 19:1 to 1:4) to give intermediate 90 (3.54 g, 63%) as a pale yellow oil. $^1$H NMR (400 MHz, $CD_2Cl_2$) 7.23 (2H, s), 6.86-7.01 (12H, m), 6.51 (2H, s), 3.41 (2H, s), 2.42-2.61 (16H, m), 1.49-1.61 (16H, m), 1.22-1.45 (54H, m), 1.15 (36H, d, J 7.3), 0.78-0.95 (24H, m).

Intermediate 91

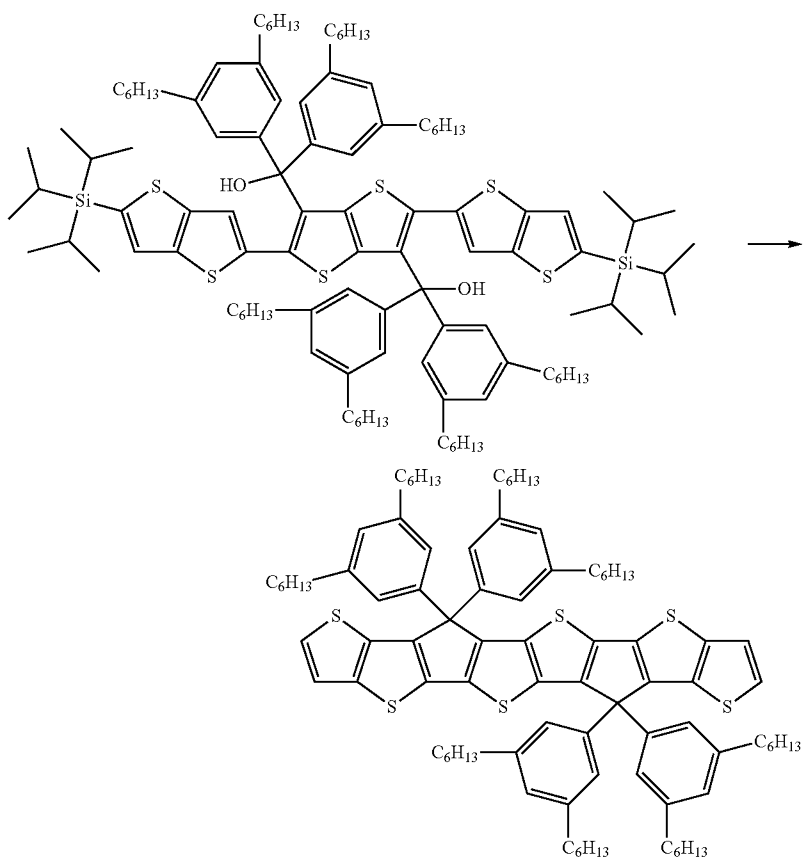

To a degassed suspension of amberlyst 15 strong acid (12 g) in anhydrous diethyl ether (100 $cm^3$) at 0° C. is added intermediate 90 (2.95 g, 1.67 mmol) followed by degassing for a further 30 minutes. The resulting suspension is allowed to warm to 23° C. and stirred for 1 hour. The reaction mixture is filtered through a thin celite plug and washed well with diethyl ether (200 $cm^3$). The crude is then purified by column chromatography (40-60 petrol) and then taken up in anhydrous tetrahydrofuran (50 $cm^3$) and cooled to 0° C. To the mixture is added a solution of tetrabutylammonium fluoride (3.34 $cm^3$, 3.34 mmol, 1 M in tetrahydrofuran) and the resulting mixture stirred for 30 minutes at 23° C. The solvent is then removed in vacuo and the residue suspended in methanol (200 $cm^3$) and stirred for 30 minutes. The solid collected by filtration to give intermediate 91 (2.02 g, 85%) as a dark orange solid. $^1$H NMR (400 MHz, $CDCl_3$) 7.13-7.21 (4H, m), 6.71-6.84 (12H, m), 2.33-2.49 (16H, m), 1.38-1.48 (16H, m), 1.08-1.22 (48H, m), 0.70-0.80 (24H, m).

Intermediate 92

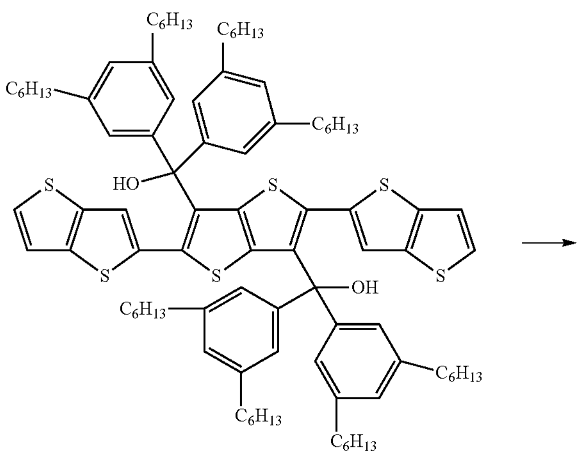

-continued

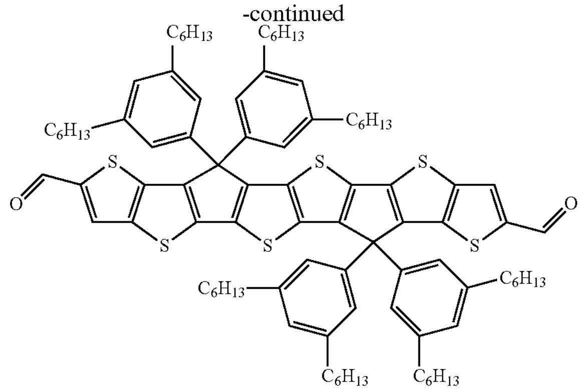

To a solution of intermediate 91 (600 mg, 0.42 mmol) in anhydrous tetrahydrofuran (25 $cm^3$) at −78° C. is added dropwise n-butyllithium (0.68 $cm^3$, 1.7 mmol, 2.5 M in hexane) over 10 minutes. The mixture is then stirred at −78° C. for 1 hour before anhydrous N,N-dimethylformamide (0.17 $cm^3$, 2.5 mmol) is added. The cooling is then removed and the reaction mixture stirred at 23° C. for 2 hours. Water (50 $cm^3$) is added and the mixture stirred for 30 minutes. The organics are extracted with diethyl ether (3×50 $cm^3$), combined, dried over anhydrous magnesium sulfate, filtered and the solvent removed in vacuo. The crude product is purified by column chromatography using a graded solvent system (40-60 petrol:dichloromethane; 1:0 to 4:1) to give intermediate 92 (450 mg, 72%) as a dark red sticky solid. $^1$H NMR (400 MHz, $CDCl_3$) 9.79 (2H, s), 7.85 (2H, s), 6.83 (4H, s), 6.71 (8H, d, J 1.0), 2.41 (16H, t, J 7.6), 1.39-1.50 (16H, m), 1.15 (48H, br. s), 0.70-0.80 (24H, m).

Compound 50

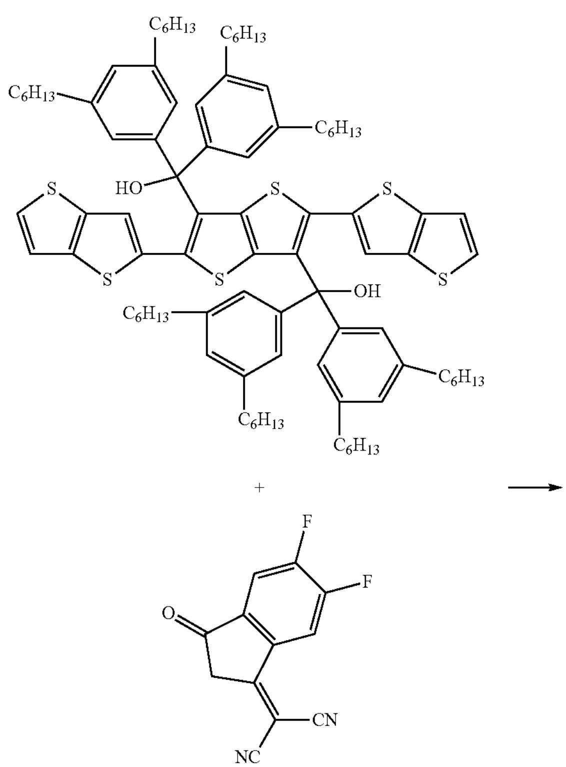

-continued

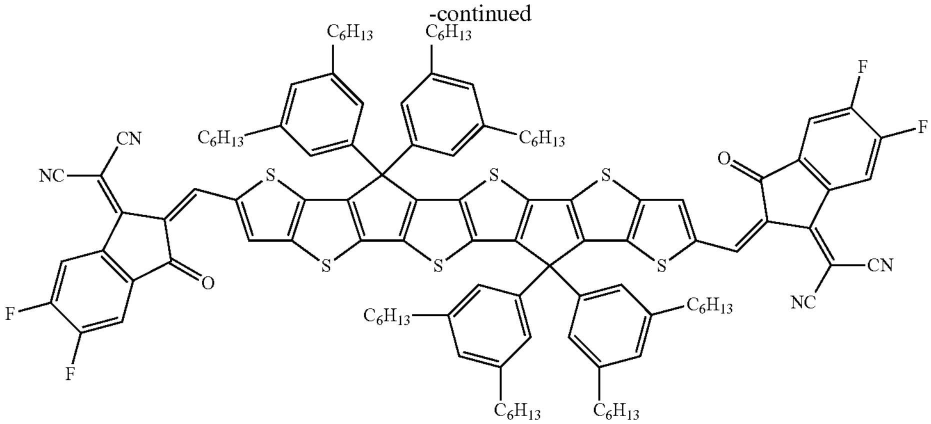

To a degassed solution of intermediate 92 (300 mg, 0.20 mmol) and pyridine (1.15 $cm^3$) in anhydrous chloroform (40 $cm^3$) at −10° C. is added a degassed solution of 2-(5,6-difluoro-3-oxo-indan-1-ylidene)-malononitrile (187 mg, 0.814 mmol) in anhydrous chloroform (8 $cm^3$) over 10 minutes. The reaction mixture is then degassed for a further 30 minutes, warmed to 23° C. and stirred for 5 hours. The reaction mixture is diluted with methanol (300 $cm^3$) and stirred for 65 hours. The solid collected by filtration, washed with ethanol (100 $cm^3$) and methanol (100 $cm^3$) to give Compound 117 (62 mg, 16%) as a dark green solid. $^1$H NMR (400 MHz, $CD_2Cl_2$) 8.90 (2H, s), 8.55 (2H, dd, J 10.1, 6.5), 8.19 (2H, s), 7.67 (2H, t, J 7.5), 6.85-7.10 (12H, m), 2.56 (16H, t, J 7.6), 1.46-1.67 (16H, m), 1.13-1.45 (48H, m), 0.70-0.93 (24H, m).

Use Example A—Donor/Acceptor Systems

Absorption and Energy Levels

A LOT EQE system was used for absorption spectra measurement. The materials were dissolved in o-xylene and drop-cast onto ITO glass substrates. The sheet resistance of the ITO is 10-20 ohm square. The films were dried on a hot plate for 10 minutes and the film thickness was <100 nm. For absorption spectra, the ITO glass substrate was used as reference. The materials measured were PCBM[C70], Compound 8 from Example 8, Compound 4 from Example 4, and Polymer 1 having the structure shown below.

Polymer 1

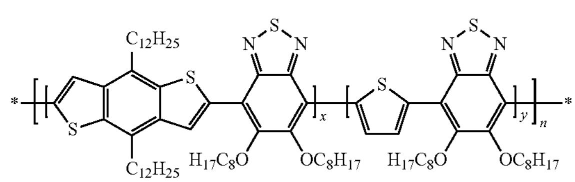

Polymer 1 and its preparation are disclosed in WO 2011/131280 A1.

Figure 2:
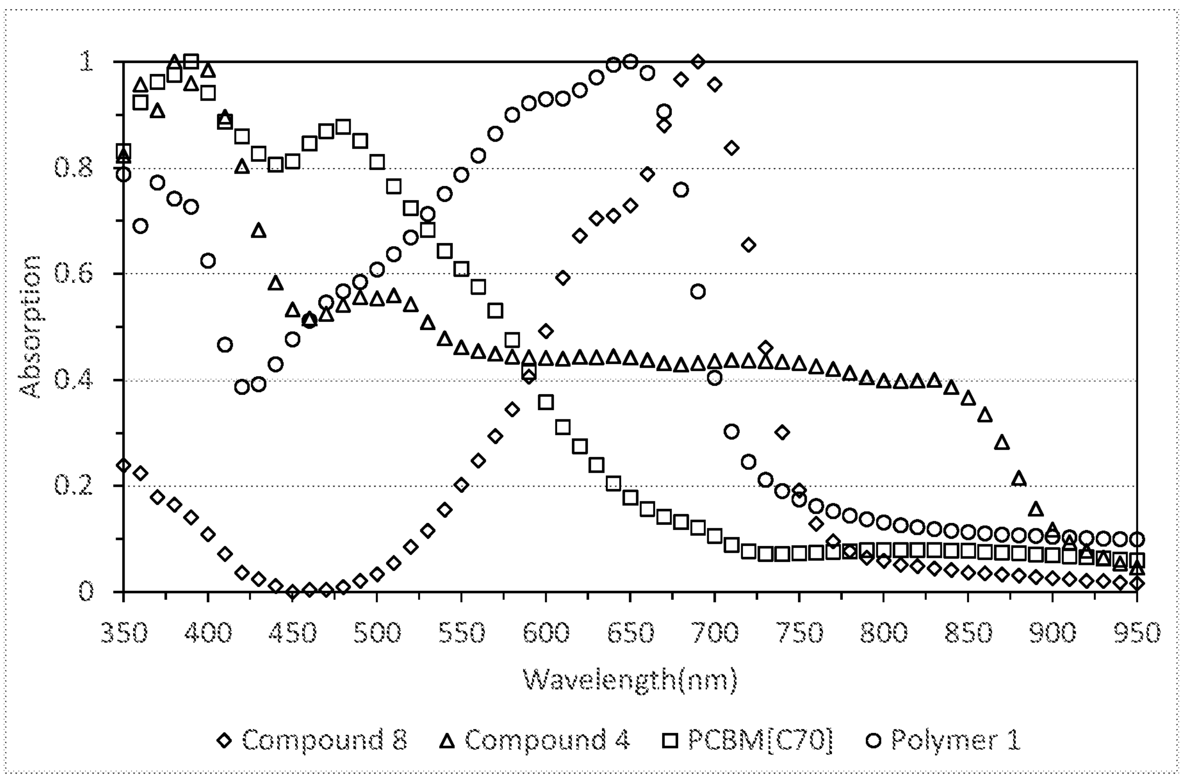
FIG. 2 shows the normalised absorption spectra of donor Polymer 1 (open circle) and the acceptors PCBM[C70] (open square), Compound 8 (open diamond) and Compound 4 (open triangle) as used in Use Example A.

FIG. 2 shows the normalised absorption spectra of Polymer 1 (open circle), PCBM[C70] (open square), Compound 8 (open diamond) and Compound 4 (open triangle).

From FIG. 2 it can be seen that, in the visible and near infrared (NIR) range, the absorption curve of Compound 4 is relatively flat with only one obvious peak located at 830 nm, and another peak at 730-750 nm which is less pronounced. There are two absorption peaks of Compound 8 located at 690 nm and 630 nm, and two absorption peaks of Polymer 1 located at 650 nm and 580 nm respectively. There are no absorption peaks from PCBM[C70] in the visible or NIR range, only one long decreasing tail ending up at 700 nm. This demonstrates that both Compound 8 and even more so Compound 4 absorb in the NIR region.

The optical band gaps, taken as the onset to absorption of the four materials are summarised in Table 1:

TABLE 1

Optical Bandgap Values

| Material | Optical Bandgap (eV) |
|---|---|
| Polymer 1 | 1.70 |
| PCBM[C70] | 1.72 |
| Compound 8 | 1.54 |
| Compound 4 | 1.29 |

Table 1 demonstrates that especially Compound 4 has a bandgap that permits significant absorption in the NIR region whereas both Polymer 1 and PCBM[C70] have bandgaps around 1.7 eV which allows little, if any, NIR absorption.

Kelvin probe (KP) photoemission measurements were carried out using the same four samples as above. ITO was used as a conductor to ground the film. Principally this technique utilises a very sensitive KP tip to collect electrons emitting from the surface excited by high energy UV photons in the air. The Air KP photoemission spectra is the intensity of photoelectron current vs the UV photo energy. The highest occupied molecular orbital (HOMO) is the intersection of the slope of KP photoemission spectra at low energy side (cube root of the emission intensity), with the base line. The KP photoemission system has the software for such calculation. The density of state (DOS) is calculated by dividing the photoemission current. The lowest unoccupied molecular orbital (LUMO) is obtained by subtracting the optical bandgap from the HOMO level.

The energy levels of the four materials are summarised in Table 2:

TABLE 2

| HOMO/LUMO Values | | |
|---|---|---|
| Material | HOMO (eV) | LUMO (eV) |
| Polymer 1 | 4.92 | 3.40 |
| PCBM[C70] | 5.63 | 3.91 |
| Compound 8 | 5.71 | 4.17 |
| Compound 4 | 5.45 | 4.16 |

From Table 2 it is possible to draw an energy diagram which can predict if a donor and acceptor pair will work in an OPD device. In order for efficient charge transfer (electron) from donor to acceptor to occur, the LUMO level of a donor should be ~0.3 eV higher than that of the acceptor, as demonstrated in Brabec, C., J. Adv. Mater., 2006, 18, 789.

FIG. 3 shows the HOMO (open rectangle) and LUMO (filled rectangle) values of donor Polymer 1 and the acceptors PCBM[C70], Compound 8 and Compound 4.

According to the energy diagram as shown in FIG. 3, all three acceptors Compound 8, Compound 4 and PCBM[C70] should work with donor Polymer 1 due to the energy difference (>0.3 eV) promoting exciton to transfer from the donor to the acceptor. In such a case Polymer 1 will work as a photon absorber, generating excitons, which will transfer onto the interface between Polymer 1 and the respective acceptor before dissociating there.

Both Compound 8 and Compound 4 are electron transport (n-type) semiconductors, while Polymer 1 is a hole transport (p-type) semiconductor. Most p/n type BHJ systems are considered to have the majority of photon absorption in the p-type semiconductor, with only a minimal contribution from the n-type semiconductor. If Compound 8 or Compound 4 in a BHJ film together with Polymer 1 (which has only visible absorption) is able to produce current under NIR light irradiation, then this means that Compound 8 or Compound 4 are acting as photon absorbers and generate excitons. Accordingly the exciton is then able to dissociate at the interface between Compound 8 or Compound 4 and Polymer 1. Energetically, it can be concluded that for the exciton to dissociate, the hole must hop from Compound 8 or 4 to the p-type Polymer 1, while the electrons will remain in the Compound 8 or Compound 4 phase. From Table 2 and FIG. 3 it can be concluded that the energy difference between the HOMO level of the acceptor (Compound 8 or Compound 4) and that of the donor (Polymer 1) is adequate to achieve efficient charge transfer (hole) from acceptor to donor.

In conclusion the energy levels show that Compound 8 and Compound 4 can successfully replace PCBM as an n-type acceptor. Moreover, due to optimisation of the energy levels of the non-fullerenes, absorption into the NIR region, as well as visible absorption, can be obtained, as demonstrated for example for Compound 4.

Use Example B—Organic Photodetectors

Devices are fabricated onto glass substrates with six pre-patterned ITO dots of 5 mm diameter to provide the bottom electrode. The ITO substrates are cleaned using a standard process of ultrasonication in Decon90 solution (30 minutes) followed by washing with de-ionized water (×3) and ultrasonication in de-ionized water (30 minutes). The ZnO ETL layer was deposited by blade coating or spin coating a ZnO nanoparticle dispersion onto the substrate and drying on a hotplate for 10 minutes at a temperature between 100 and 140° C. A formulation of polymer 1 and compound as disclosed herein was prepared at a ratio of between 1:2 and 2:1 in o-dichlorobezene or o-xylene with 0-10% co-solvent at a concentration of between 18 and 40 mg/ml, and stirred for 17 hours at a temperature of between 23° C. and 60° C. The active layer was deposited using blade coating (K101 Control Coater System from RK). The stage temperature was set to 30° C. or 70° C., the blade gap set between 2-15 μm and the speed set between 2-8 m/min targeting a final dry film thickness of 500-1000 nm. Following coating the active layer was annealed at 100° C. for 10-15 minutes. The HTL layer was either $MoO_3$ or $WO_3$. Where the HTL was $WO_3$ nanoparticles ($WO_3$ NPs, Nanograde Ltd) it was coated by the blade coating technique, with a thickness of 50 nm. Where the HTL was $MoO_3$, it was deposited by E-beam vacuum deposition from $MoO_3$ pellets at a rate of 1 Å/s, targeting 15 nm thickness. Finally, the top silver electrode was deposited by thermal evaporation through a shadow mask, to achieve Ag thickness between 30-80 nm. The J-V curves were measured using a Keithley 4200 system under light and dark conditions at a bias from +5 to −5 V. The light source was a 580 nm LED with power 0.5 mW/cm$^2$.

The EQE of OPD devices were characterized between 400 and 1100 nm under −2V bias, using an External Quantum Efficiency (EQE) Measurement System from LOT-QuantumDesign Europe.

Table 3 shows the characteristics of the individual formulations. The polymer used is polymer 1. The solvent is either o-dichlorobenzene (oDCB) or o-xylene with 0-10% co-solvent (oXyl).

TABLE 3

| Formulation characteristics | | | | | |
|---|---|---|---|---|---|
| No. | Acceptor | Ratio Polymer: Acceptor | Concentration g/L | Solvent | HTL |
| OD1 | PCBM[C70] | 1.0:2.0 | 30 | oXyl | $WO_3$ |
| OD2 | Compound 8 | 1.0:2.0 | 30 | oXyl | $WO_3$ |
| OD3 | Compound 4 | 1.0:2.0 | 30 | oXyl | $WO_3$ |
| OD4 | Compound 6 | 1.0:1.0 | 18 | oDCB | $MoO_3$ |
| OD5 | Compound 9 | 1.5:1.0 | 18 | oXyl | $MoO_3$ |
| OD6 | Compound 10 | 1.0:2.0 | 18 | oXyl | $MoO_3$ |
| OD7 | Compound 14 | 1.0:1.0 | 18 | oXyl | $MoO_3$ |
| OD8 | Compound 23 | 1.0:1.0 | 18 | oXyl | $MoO_3$ |
| OD9 | Compound 24 | 1.0:1.0 | 18 | oXyl | $MoO_3$ |
| OD10 | Compound 25 | 1.0:1.0 | 18 | oXyl | $MoO_3$ |
| OD11 | Compound 31 | 1.0:1.0 | 18 | oXyl | $MoO_3$ |
| OD12 | Compound 36 | 1.0:1.0 | 40 | oXyl | $MoO_3$ |
| OD13 | Compound 41 | 1.0:1.0 | 40 | oXyl | $MoO_3$ |
| OD14 | Compound 42 | 1.0:1.0 | 20 | oXyl | $MoO_3$ |
| OD15 | Compound 50 | 1.0:1.0 | 20 | oXyl | $MoO_3$ |

Tables 4, 5 and 6 show the EQE values for the individual OPD devices comprising a photoactive layer with a BHJ formed from the photoactive acceptor/polymer formulations of Table 3.

TABLE 4

| EQEs for the devices at 650 nm | |
|---|---|
| No. | EQE % |
| OD1 | 50 |
| OD2 | 38 |
| OD3 | 32 |
| OD4 | 4 |
| OD5 | 33 |
| OD6 | 7 |

TABLE 4-continued

| EQEs for the devices at 650 nm | |
|---|---|
| No. | EQE % |
| OD7 | 42 |
| OD8 | 4 |
| OD9 | 4 |
| OD10 | 2 |
| OD11 | 8 |
| OD12 | 3 |
| OD13 | 60 |
| OD14 | 17 |
| OD15 | 40 |

TABLE 5

| EQEs for the devices at 850 nm | |
|---|---|
| No. | EQE % |
| OD3 | 24 |
| OD4 | 3 |
| OD6 | 5 |
| OD7 | 33 |
| OD8 | 1 |
| OD9 | 1 |
| OD10 | 1 |
| OD11 | 4 |
| OD12 | 4 |
| OD13 | 59 |
| OD14 | 12 |
| OD15 | 35 |

TABLE 6

| EQEs for the devices at 940 nm | |
|---|---|
| No. | EQE % |
| OD4 | 3 |
| OD10 | 1 |
| OD11 | 4 |
| OD12 | 4 |
| OD13 | 6 |
| OD14 | 11 |
| OD15 | 12 |

Figure 4:
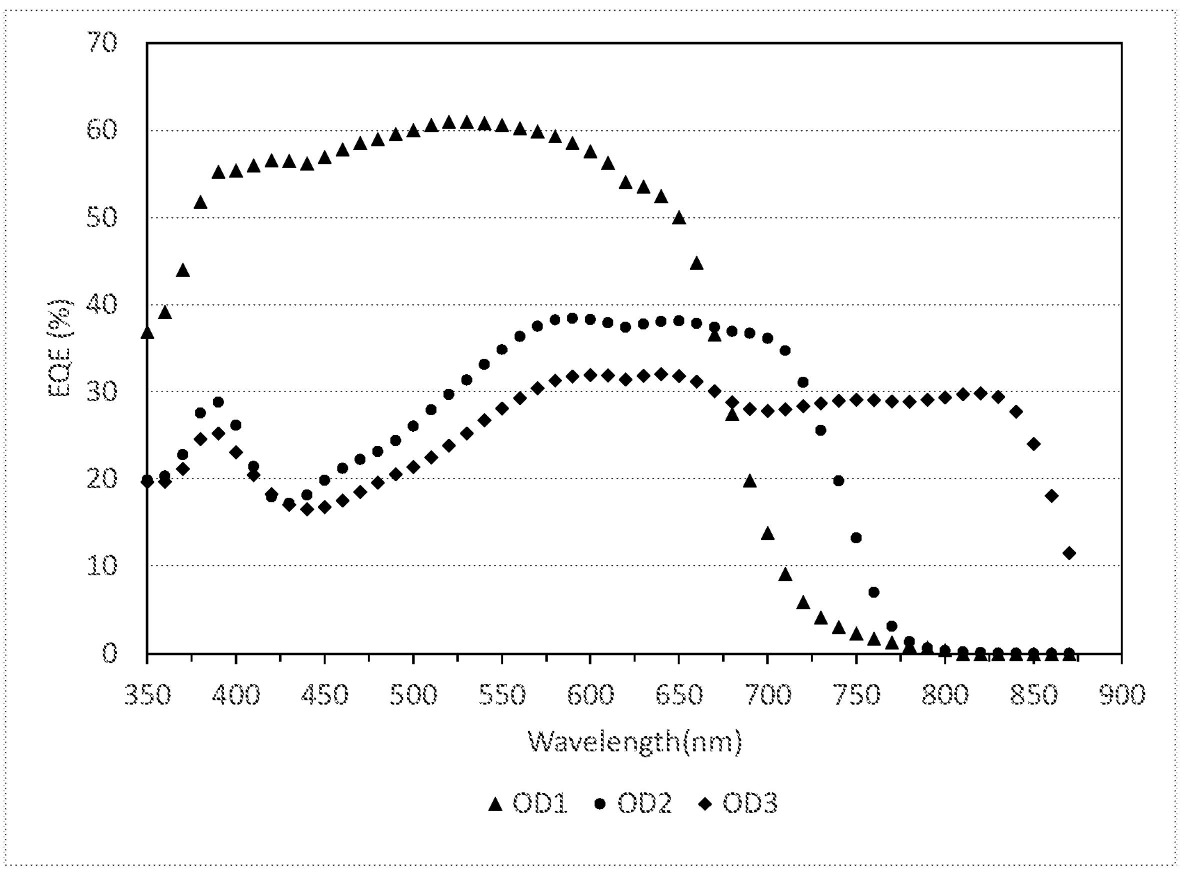
FIG. 4 shows the external quantum efficiency (EQE) spectra of the devices OD1 (solid diamond), OD2 (solid triangle), and OD3 (solid circle) according to Use Example B.

FIG. 4 shows the external quantum efficiency (EQE) spectra of device OD1 (solid diamond), device OD2 (solid triangle), and device OD3 (solid circle).

From FIG. 4 it can be seen that in device OD1 the EQE in the visible light region has the signature response from Polymer 1 (absorption peaks at 650 nm and 580 nm). The broad response in the 450-500 nm region is believed to respond to the absorption of PCBM[C70] which has an absorption peak at 478 nm.

In device OD2 the EQE spectra shows a response at 690 nm from the absorption peak of Compound 8. Compound 8 has a further absorption peak located at 630 nm, which is however close to the two absorption peaks of Polymer 1 that the response in the EQE cannot be distinguished.

In device OD3 the EQE response shows a fairly flat response between 600 nm and 830 nm with two minor peaks at 730 nm and 830 nm in the NIR region with a tail continuing to 920 nm. These peaks and tail correspond to the Compound 4 absorption. In both devices OD2 and OD3 the EQE response originating from the Polymer 1 absorption, located at 650 nm and 580 nm can be seen.

Figure 5:
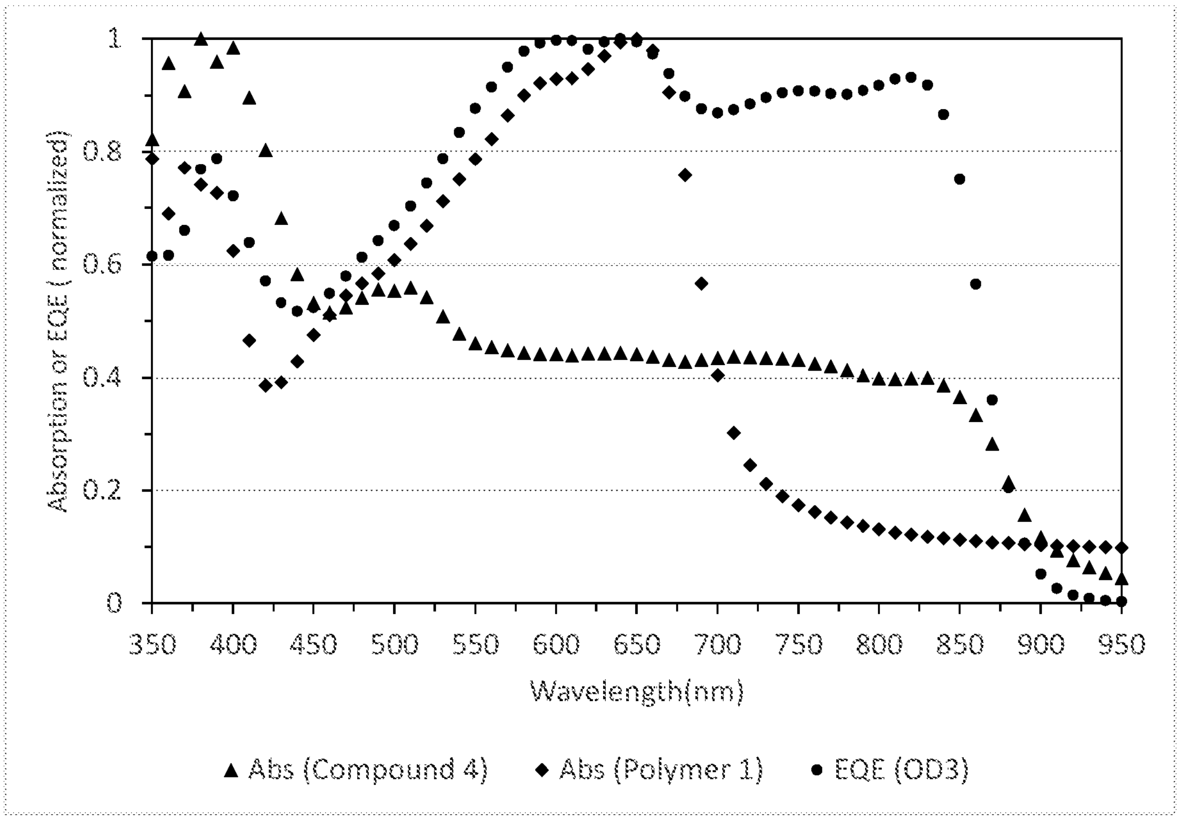
FIG. 5 shows the normalised absorption spectra of the acceptor Compound 4 (solid triangle) and the donor Polymer 1 (solid diamond), and the normalised EQE spectrum of the device OD3 based on the blend Compound 4:Polymer 1 (solid circle) according to Use Example B.

In order to show the contribution of each individual absorption component to the EQE more clearly, a normalised absorption graph of Polymer 1 and Compound 4 was combined with the EQE graph of device OPD3 as shown in FIG. 5.

Thus, FIG. 5 shows the normalised absorption spectra of the acceptor Compound 4 (solid triangle) and the donor Polymer 1 (solid diamond) and the normalised EQE spectrum of device OD3 based on Compound 4:Polymer 1 (solid circle).

FIG. 5 shows that the EQE response peaks located at 580 nm and 650 nm are resulting from Polymer 1. There are no absorption peaks from Compound 4 in this region. The EQE response peaks at 830 nm and 750 nm are resulting from Compound 4 as Polymer 1 does not absorb light at a wavelength greater than 720 nm. This is similarly seen in device OD2 where the long wavelength EQE peak at 630 nm is attributed to the acceptor Compound 8.

The examples demonstrate that NIR OPD devices can be prepared using a blend of donor polymer and small molecular acceptor, as disclosed herein, which is not a fullerene. The absorption peaks of small molecular acceptors are coincident with those appearing in the EQE spectra of OPDs in the NIR region, where there is no absorption from the donor polymer.

The EQE of the OPD is also high; at over 30% at 830 nm and −2 V bias for an OPD with Compound 4 as an acceptor, and over 35% at 720 nm, at −2 V bias for an OPD with Compound 8 as acceptor. Furthermore the EQE response in the NIR region can be favourably tuned by chemically modifying the non-fullerene acceptor to give a desired absorption without modifying the donor polymer, as shown by device examples OD1-OD15.

In comparison to OPD devices disclosed in the prior art which use PCBM as acceptor, the use of Compounds 4, 6, 10, 14, 23, 24, 25, 31, 36, 41, 42 or 50 as the n-type non-fullerene acceptor within an OPD results in a device which has a response >800 nm. Furthermore, the use of Compounds 6, 25, 31, 36, 41, 42 or 50 as the n-type non-fullerene acceptor within an OPD results in a device which has a response >940 nm. Additionally in OD2, OD3 and OD5-OD15 the solvent used is a commercially viable non-chlorinated solvent. Furthermore the thickness of the active layer can be >300 nm thereby the dark current can be reduced and the device fabrication yield increased. Additionally in OD2-OD15 a low driving bias of −2 V is used in comparison to up to −15 V in the prior art. This use of low driving bias increases the application capability as low voltage batteries can be utilised, whereas the use of higher driving voltages such as −15 V as disclosed in prior art can decrease the device lifetime.

The invention claimed is:

1. An organic photodetector (OPD) comprising:

a photoactive layer, characterized in that said photoactive layer contains an n-type organic semiconducting (OSC) compound and a p-type OSC compound, wherein the p-type OSC compound is a conjugated copolymer comprising donor and acceptor units, the n-type OSC compound does not contain a fullerene moiety, and the n-type OSC compound contains a polycyclic electron donating core and attached thereto one or two terminal electron withdrawing groups, as shown in formula N

N

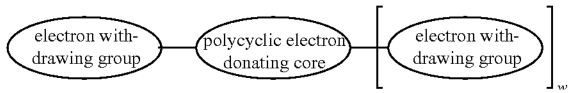

wherein w is 0 or 1;

wherein the n-type OSC compound is of one of the following formulae:

I1

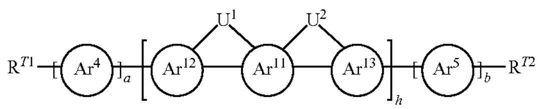

I2

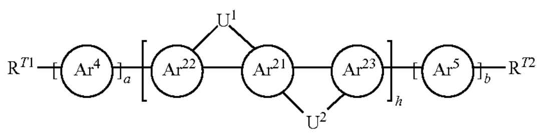

I3

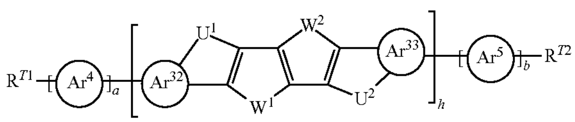

I4

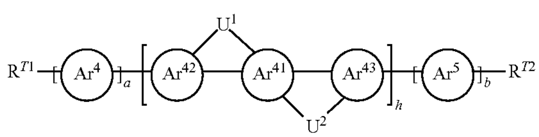

I5

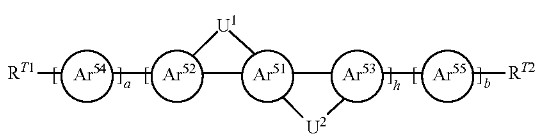

I6

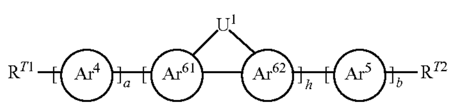

wherein the individual radicals, independently of each other and on each occurrence identically or differently, have the following meanings $Ar^{11}$, $Ar^{12}$, $Ar^{13}$, $Ar^{32}$, $Ar^{33}$ is each independently arylene or heteroarylene that has from 5 to 20 ring atoms, is mono- or polycyclic, optionally contains fused rings, and is unsubstituted or substituted by one or more identical or different groups L, $Ar^{21}$ is arylene or heteroarylene that has from 6 to 20 ring atoms, is mono- or polycyclic, optionally contains fused rings, and is substituted by one or more identical or different groups $R^{21}$, wherein $Ar^{21}$ contains at least one benzene ring that is connected to $U^2$, $Ar^{23}$ is

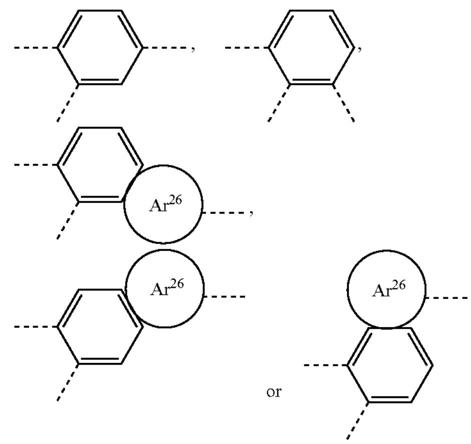

wherein the benzene ring is substituted by one or more identical or different groups $R^{1-4}$, $Ar^{22}$, $Ar^{26}$ is each independently arylene or heteroarylene that has from 5 to 20 ring atoms, is mono- or polycyclic, optionally contains fused rings, and is substituted by one or more identical or different groups $R^{1-4}$, $Ar^{41}$ is benzene or a group consisting of 2, 3 or 4 fused benzene rings, all of which are unsubstituted or substituted by one or more identical or different groups L, $Ar^{42}$ is

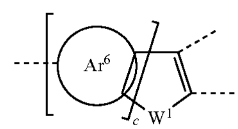

$Ar^{43}$ is

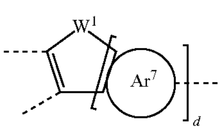

wherein $Ar^{42}$ and $Ar^{43}$ have different meanings and $Ar^{42}$ is not a mirror image of $Ar^{43}$, $Ar^{51}$ is benzene or a group consisting of 2, 3 or 4 fused benzene rings, all of which are unsubstituted or substituted by one or more identical or different groups $R^1$, L or $Z^1$, wherein $Ar^{51}$ is substituted by at least one group $R^1$, L or $Z^1$ that are selected from electron withdrawing groups, $Ar^{52, 53}$ is each independently arylene or heteroarylene that has from 5 to 20 ring atoms, is mono- or polycyclic, optionally contains fused rings, and is unsubstituted or substituted by one or more identical or different groups $R^1$ or L, $Ar^{54,55}$ is each independently arylene or heteroarylene that has from 5 to 20 ring atoms, is mono- or polycyclic, optionally contains fused rings, and is unsubstituted or substituted by one or more identical or different groups $R^1$ or L, or $CY^1{=}CY^2$ or —C≡C—, $Ar^{61,62}$ is each independently arylene or heteroarylene that has from 5 to 20 ring atoms, is mono- or polycyclic, optionally contains fused rings, and is unsubstituted or substituted by one or more identical or different groups $R^1$ or L, wherein $Ar^{61}$ and $Ar^{62}$ are different from each other and are not a mirror image of each other, $Ar^{6,7}$ is each independently arylene or heteroarylene that has from 5 to 20 ring atoms, is mono- or polycyclic, optionally contains fused rings, and is unsubstituted or substituted by one or more identical or different groups L, $U^1$ is $CR^1R^2$, $SiR^1R^2$, $GeR^1R^2$, $NR^1$ or C═O, $U^2$ is $CR^3R^4$, $SiR^3R^4$, $GeR^3R^4$, $NR^3$ or C═O, $R^{21}$ have one of the meanings given for $R^{1-4}$, $W^1$ is S or Se, $W^2$ is S or Se, c, d is each independently 0 or 1, h is 1, 2 or 3, $Ar^{4,5}$ is each independently each arylene or heteroarylene that has from 5 to 20 ring atoms, is mono- or polycyclic, optionally contains fused rings, and is unsubstituted or substituted by one or more identical or different groups $R^1$ or L, or $CY^1$═$CY^2$ or —C≡C—, $R^{1-4}$ is each independently $Z^1$, H, F, Cl, CN, or straight-chain, branched or cyclic alkyl with 1 to 30 C atoms, in which one or more $CH_2$ groups are optionally replaced by —O—, —S—, —C(═O)—, —C(═S)—, —C(═O)—O—, —O—C(═O)—, —$NR^0$—, —$SiR^0R^{00}$—, —$CF_2$—, —$CR^0$═$CR^{00}$—, —$CY^1$═$CY^2$— or —C≡C— in such a manner that 0 and/or S atoms are not linked directly to one another, and in which one or more H atoms are optionally replaced by F, Cl, Br, I or CN, and in which one or more $CH_2$ or $CH_3$ groups are optionally replaced by a cationic or anionic group, or aryl, heteroaryl, arylalkyl, heteroarylalkyl, aryloxy or heteroaryloxy, wherein each of the aforementioned cyclic groups has 5 to 20 ring atoms, is mono- or polycyclic, does optionally contain fused rings, and is unsubstituted or substituted by one or more identical or different groups L, or a pair of $R^1$ and $R^2$ together with the C, Si or Ge atom to which they are attached, may also form a spiro group with 5 to 20 ring atoms which is mono- or polycyclic, does optionally contain fused rings, and is unsubstituted or substituted by one or more identical or different groups L, $Z^1$ is an electron withdrawing group, $R^{T1,T2}$ is each independently H, a carbyl or hydrocarbyl group with 1 to 30 C atoms that is optionally substituted by one or more groups L and optionally comprises one or more hetero atoms, wherein at least one of $R^{T1}$ and $R^{T2}$ is an electron withdrawing group, $Y^{1,2}$ is each independently H, F, Cl or CN, L is F, Cl, —$NO_2$, —CN, —NC, —NCO, —NCS, —OCN, —SCN, $R^0$, $OR^0$, $SR^0$, —C(═O)$X^0$, —C(═O)$R^0$, —C(═O)—$OR^0$, —O—C(═O)—$R^0$, —$NH_2$, —$NHR^0$, —$NR^0R^{00}$, —C(═O)$NHR^0$, —C(═O)$NR^0R^{00}$, —$SO_3R^0$, —$SO_2R^0$, —OH, —$NO_2$, —$CF_3$, —$SF_5$, or optionally substituted silyl, or carbyl or hydrocarbyl with 1 to 30 C atoms that is optionally substituted and optionally comprises one or more hetero atoms, $R^0$, $R^{00}$ is each independently H or straight-chain or branched alkyl with 1 to 20 C atoms that is optionally fluorinated, $X^0$ is halogen, and a, b is each independently each independently 0, 1, 2 or 3;

wherein the p-type conjugated OSC polymer of the photoactive layer is selected from the following formulae:

P1

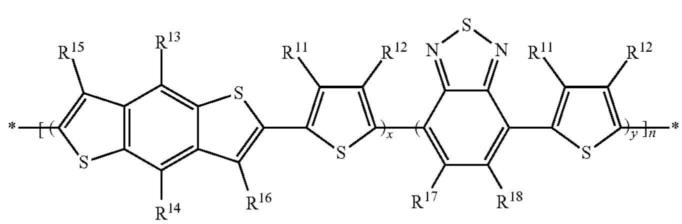

P2

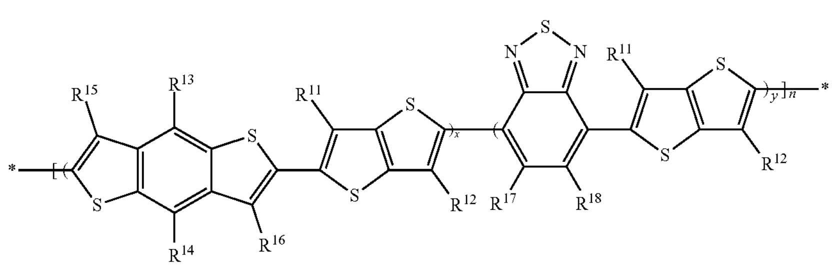

-continued
P3
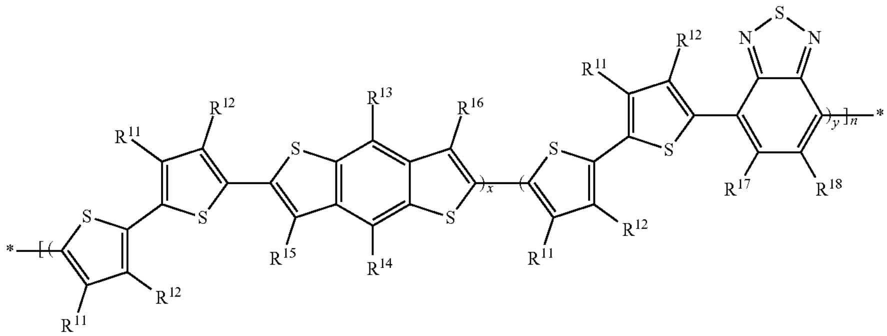
P4
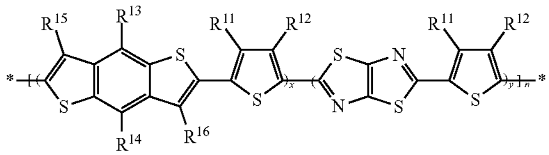
P5
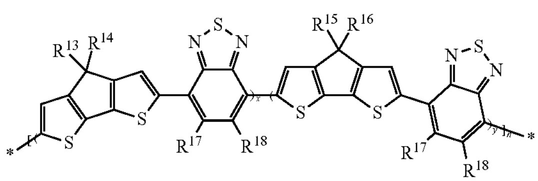
P6
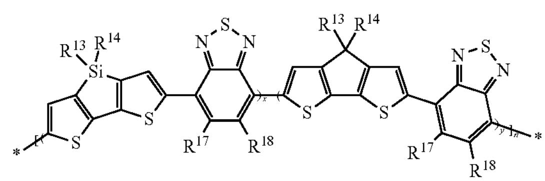
P7
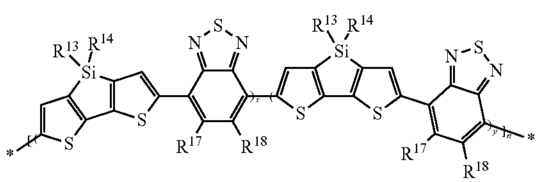
P8
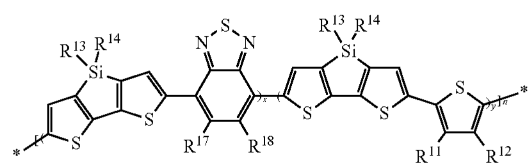
P9
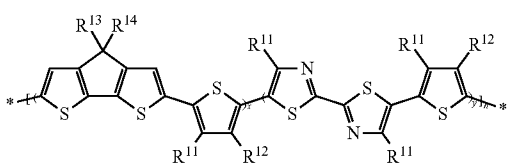
P10
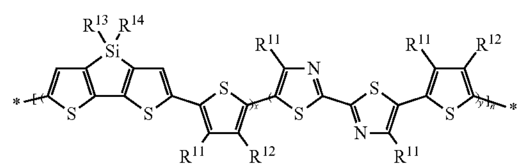
P11
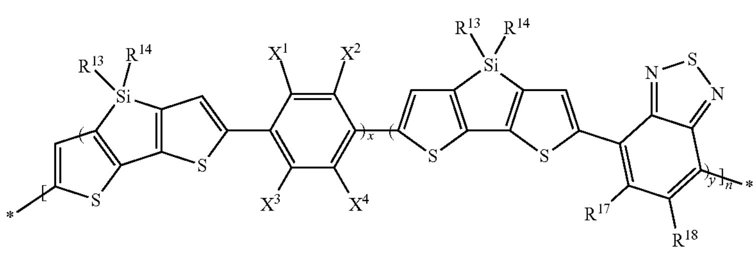
P12
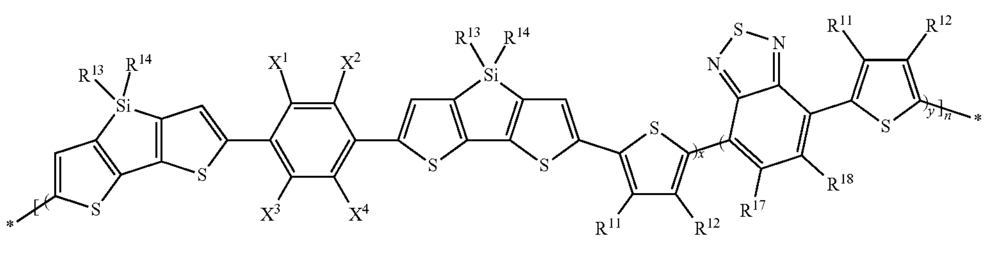

-continued
P13
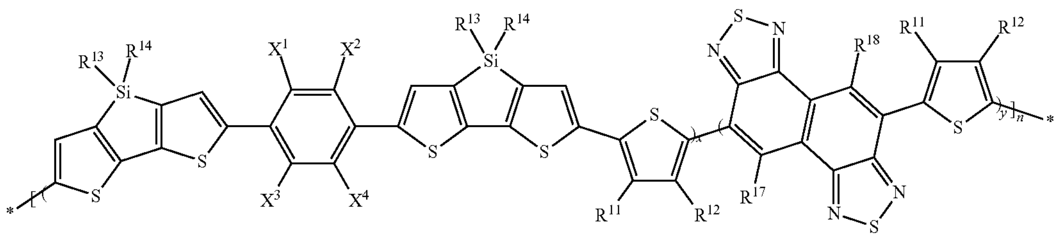
P14
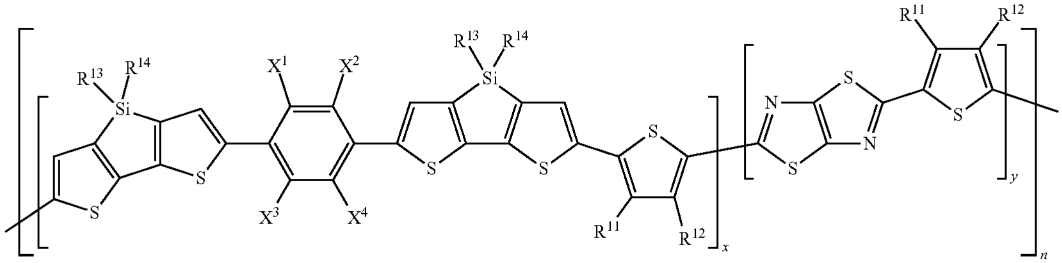
P15
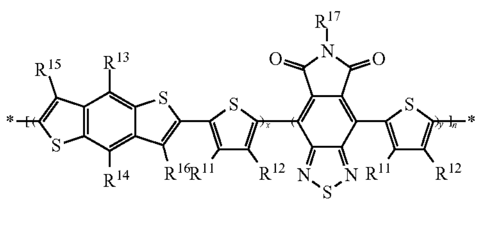
P16
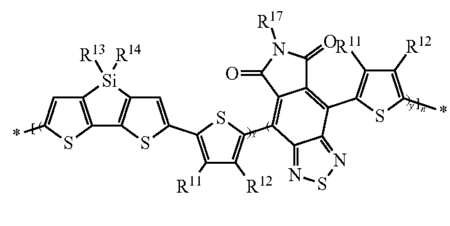
P17
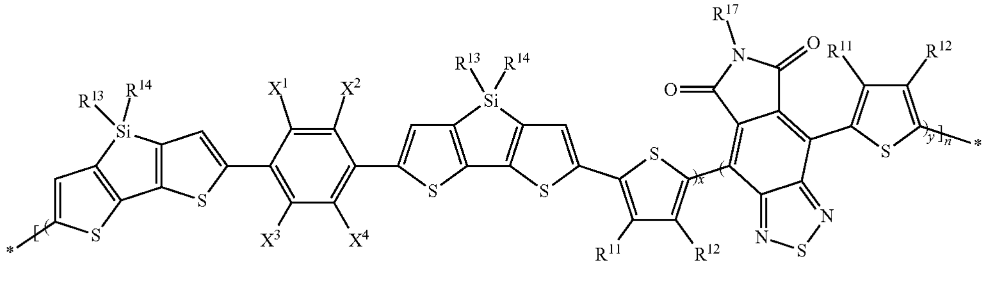
P18
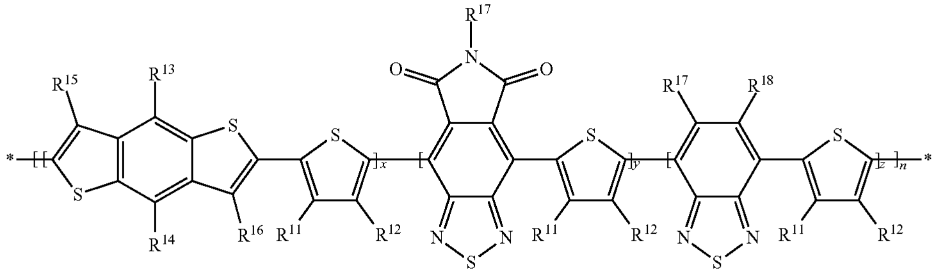
P19
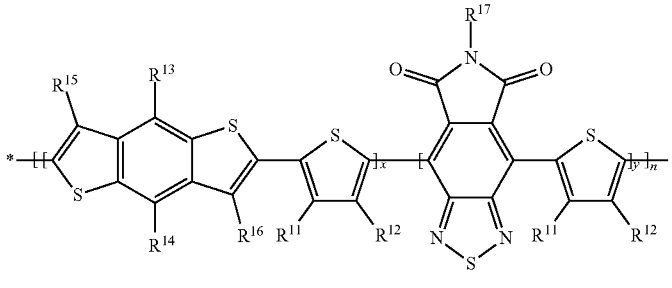

-continued
P20
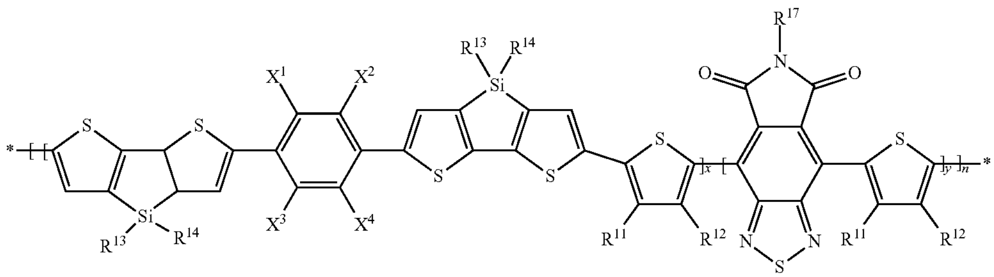
P21
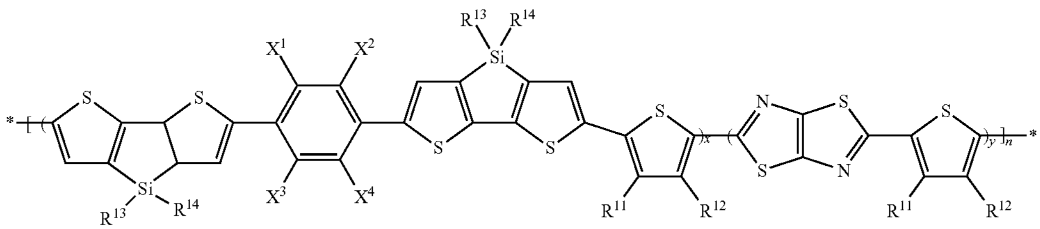
P22
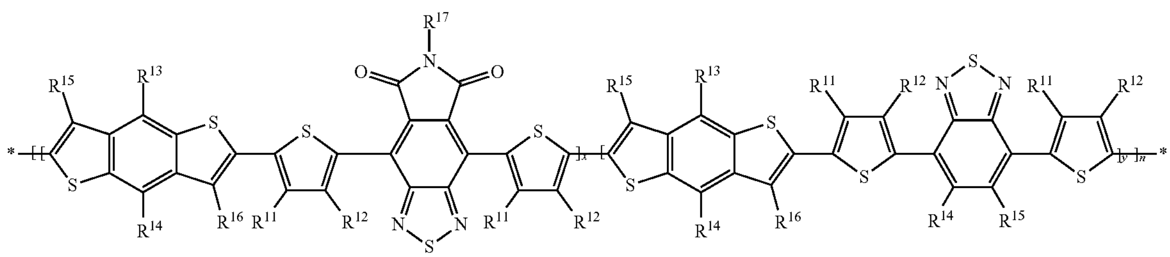
P23
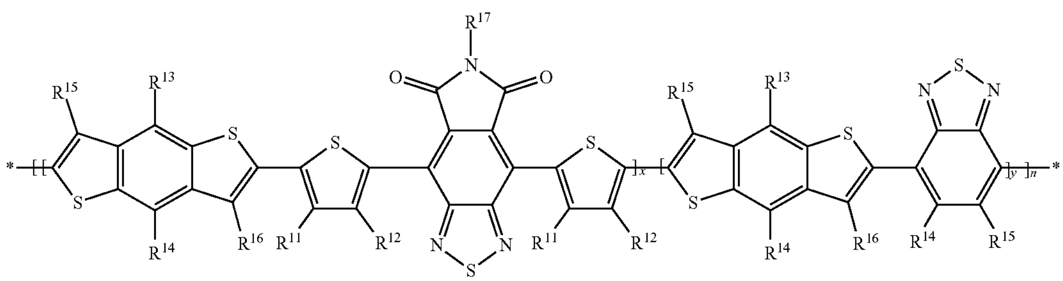
P24
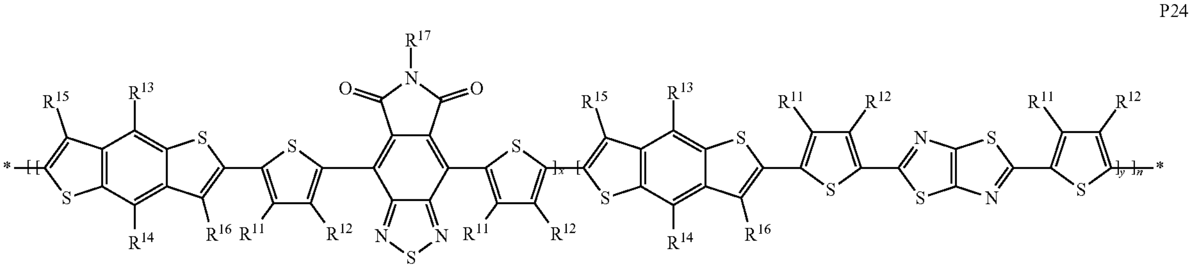
P25
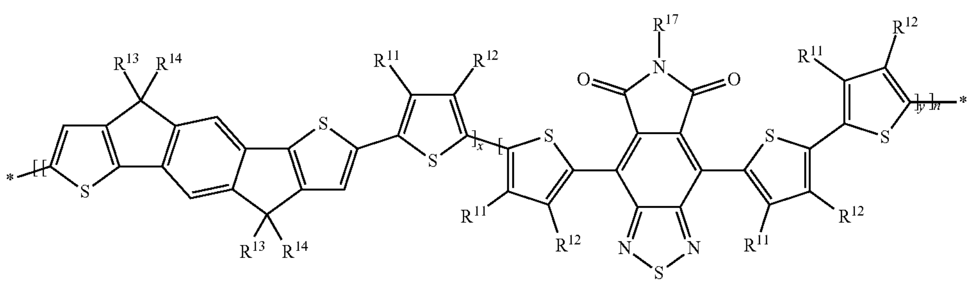

-continued
P26
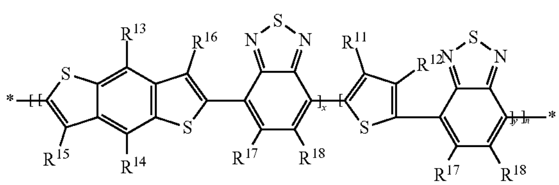
P27
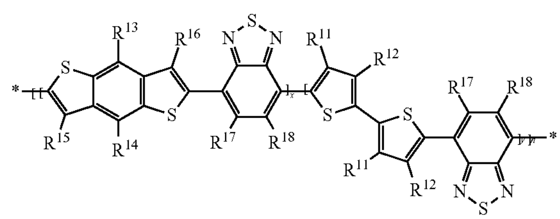
P28
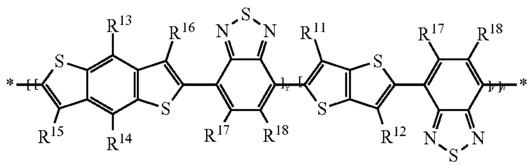
P29
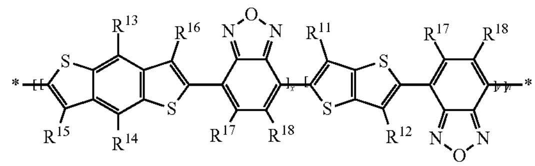
P30
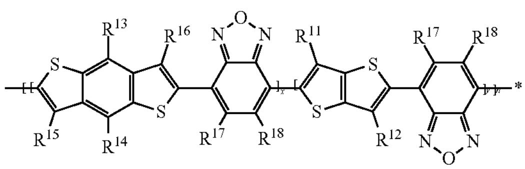
P31
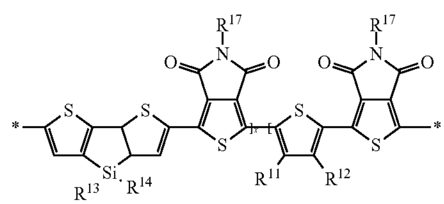
P32
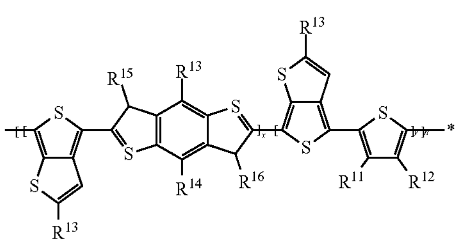
P33
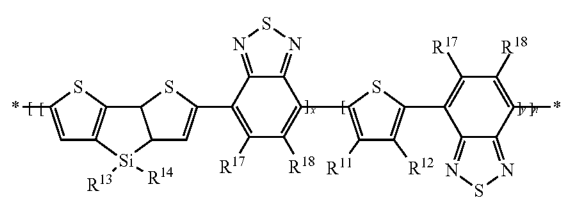
P34
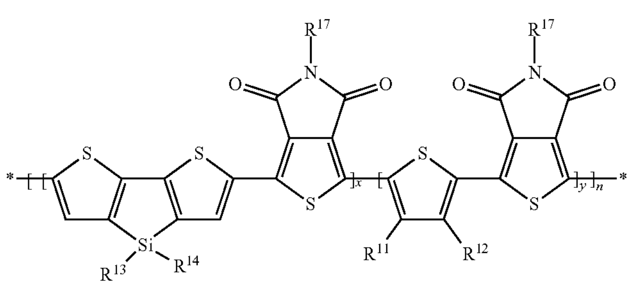
P35
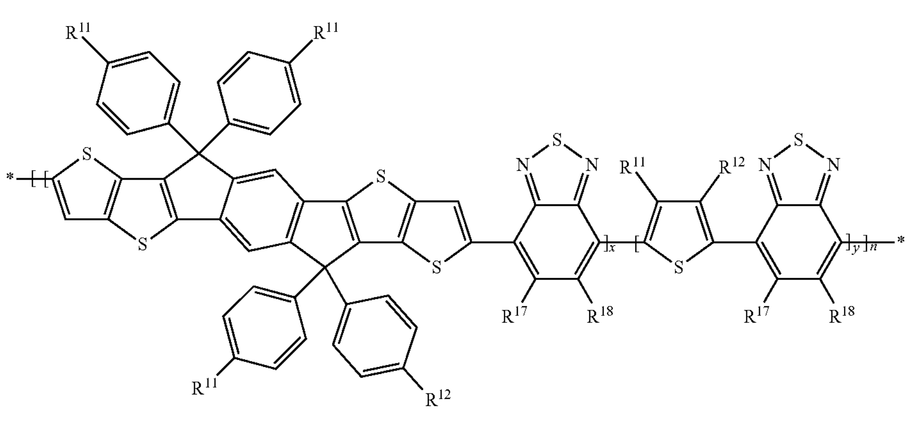

-continued
P36
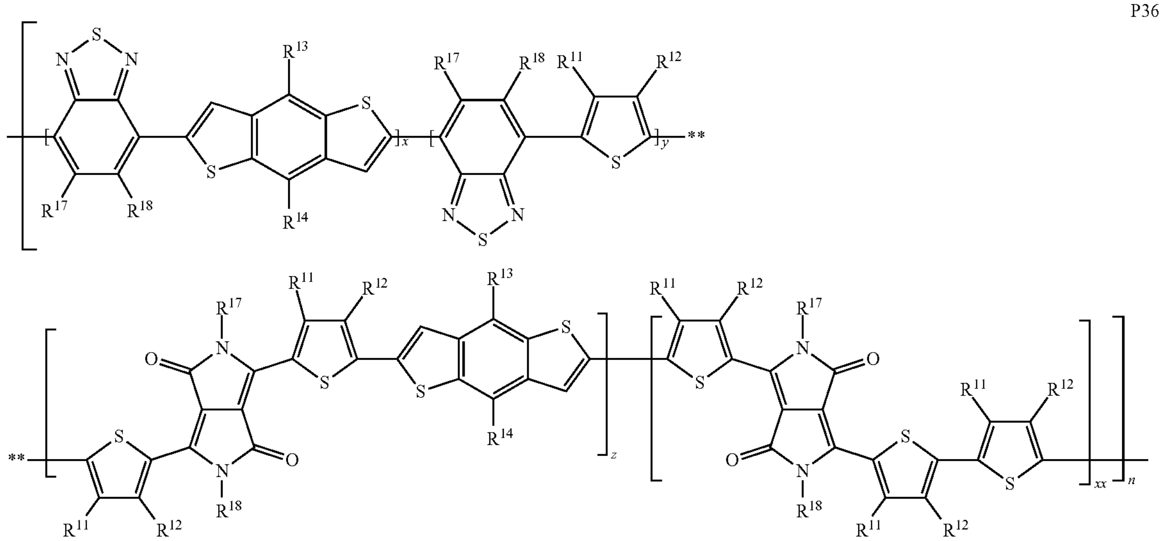
P37
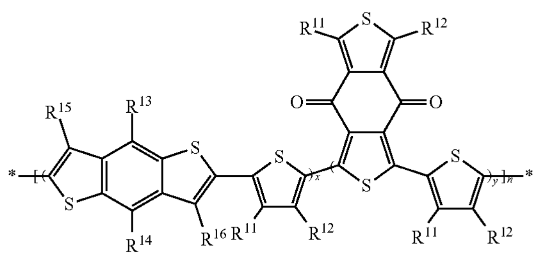
P38
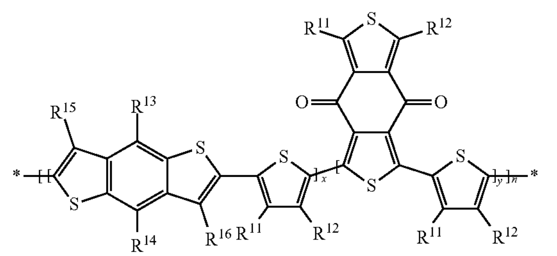
P39
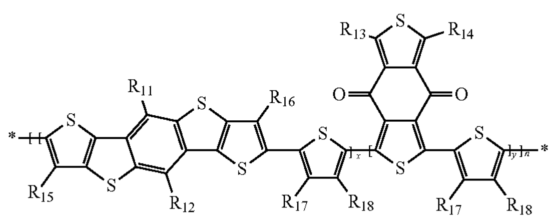
P40
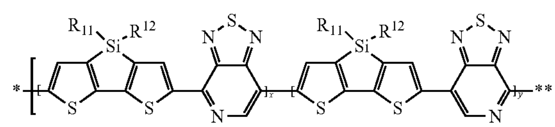
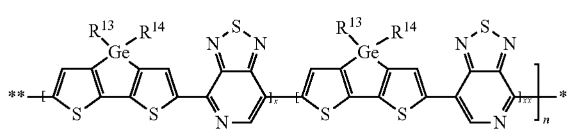
P41
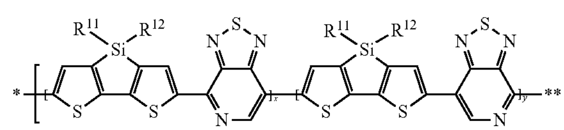
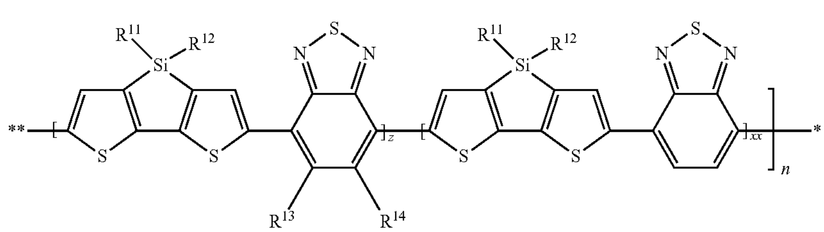
P42
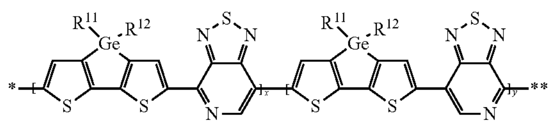

-continued
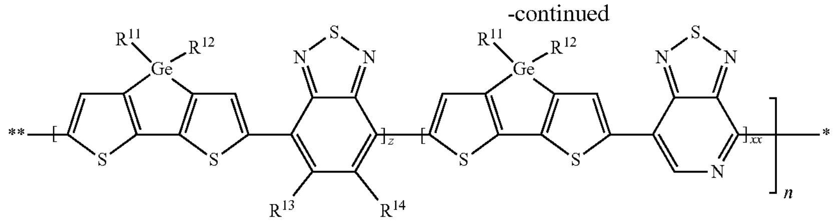
P43
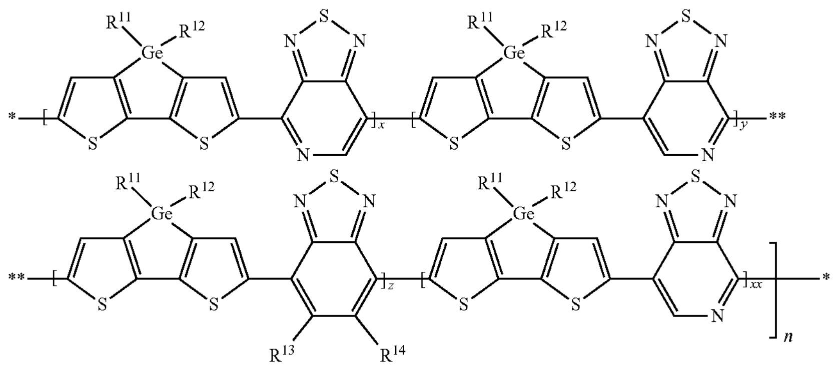
P44
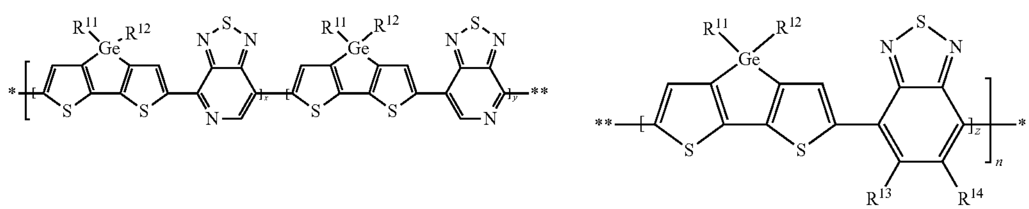
P45
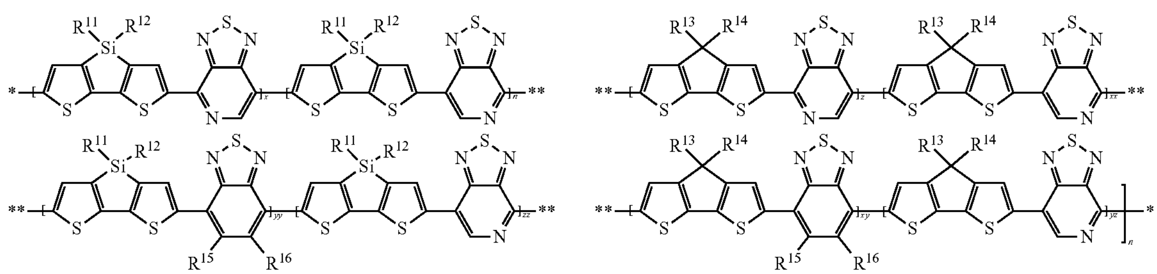
P46
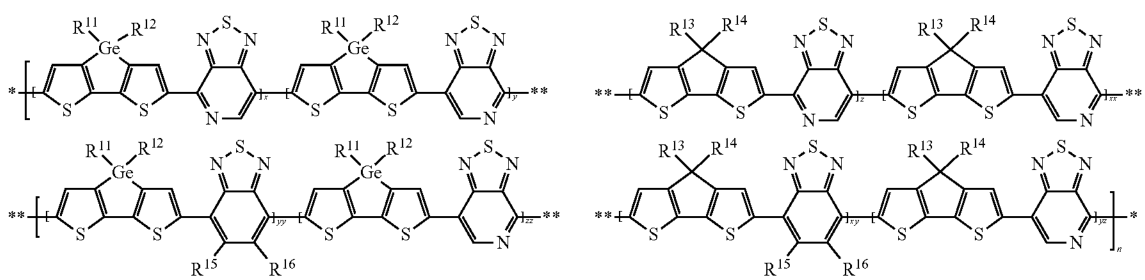
P47
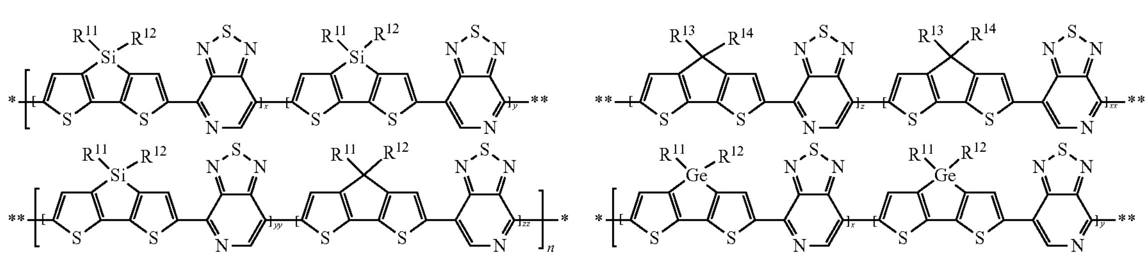

-continued

P48

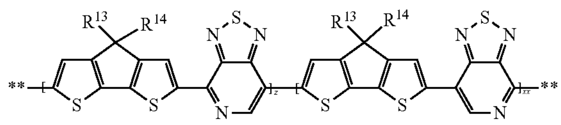

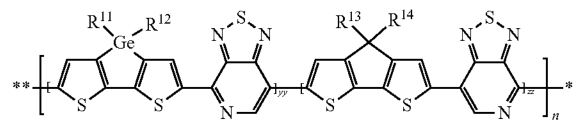

P49

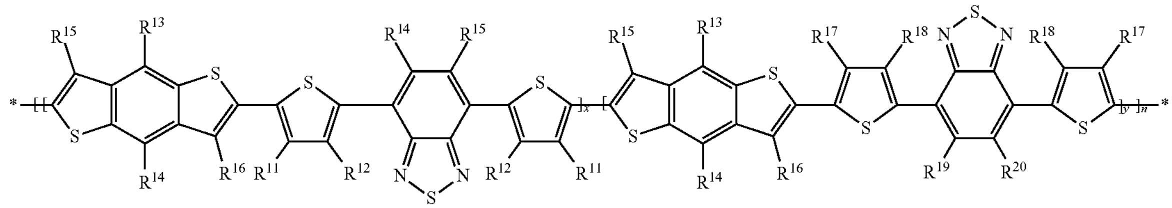

wherein $R^{11-20}$ independently of each other, and on each occurrence identically or differently denote H or have one of the meanings of L, $X^1$, $X^2$, $X^3$ and $X^4$ denote H, F or Cl, x, y, z, xx, yy, zz, xy and xz are each, independently of one another >0 and <1, with x+y+z+xx+yy+zz+xy+xz=1, n is an integer >1, and wherein in formula P5 and P7 at least one of $R^{13}$ and $R^{14}$ is different from at least one of $R^{15}$ and $R^{16}$.

2. The OPD of claim 1, wherein the n-type OSC compound of the photoactive layer is of formula NI

NI

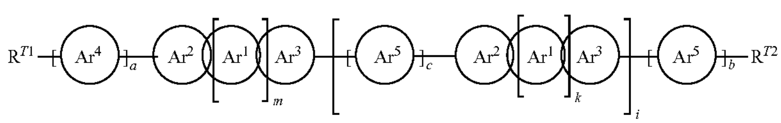

or wherein the n-type OSC compound of the photoactive layer is of formula I

I

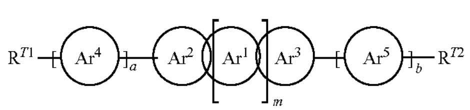

or, wherein the n-type OSC compound of the photoactive layer is of formula IA

IA

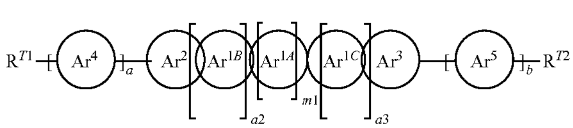

wherein, in formula NI, I and IA, the individual radicals, independently of each other and on each occurrence identically or differently, have the following meanings $Ar^1$ is one of the following

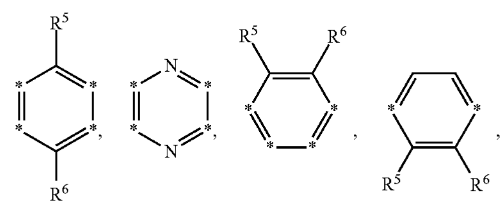

-continued

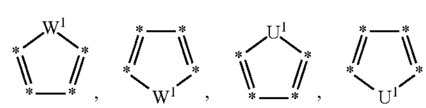

wherein a group

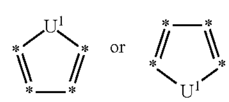

is not adjacent to another group

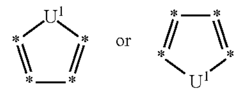

$Ar^2$ is one of the following

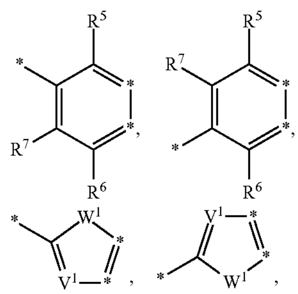

$Ar^3$ is one of the following

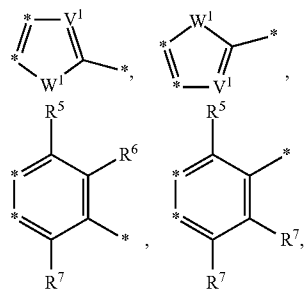

$Ar^{4,5}$ is each independently arylene or heteroarylene that has from 5 to 20 ring atoms, is mono- or polycyclic, optionally contains fused rings, and is unsubstituted or substituted by one or more identical or different groups $R^1$ or L, or $CY^1{=}CY^2$ or —C≡C—, $U^1$ is $CR^1R^2$, $SiR^1R^2$, $GeR^1R^2$, $NR^1$ or C═O, $V^1$ is $CR^3$ or N, $W^1$ is S, O, Se or C═O, $R^{1-7}$ is each independently $Z^1$, H, F, Cl, CN, or straight-chain, branched or cyclic alkyl with 1 to 30 C atoms, in which one or more $CH_2$ groups are optionally replaced by —O—, —S—, —C(═O)—, —C(═S)—, —C(═O)—O—, —O—C(═O)—, —$NR^0$—, —$SiR^0R^{00}$—, —$CF_2$—, —$CR^0$═$CR^{00}$—, —$CY^1$═$CY^2$— or —C≡C— in such a manner that 0 and/or S atoms are not linked directly to one another, and in which one or more H atoms are optionally replaced by F, Cl, Br, I or CN, and in which one or more $CH_2$ or $CH_3$ groups are optionally replaced by a cationic or anionic group, or aryl, heteroaryl, arylalkyl, heteroarylalkyl, aryloxy or heteroaryloxy, wherein each of the aforementioned cyclic groups has 5 to 20 ring atoms, is mono- or polycyclic, does optionally contain fused rings, and is unsubstituted or substituted by one or more identical or different groups L, or a pair of $R^1$ and $R^2$ together with the C, Si or Ge atom to which they are attached, may also form a spiro group with 5 to 20 ring atoms which is mono- or polycyclic, does optionally contain fused rings, and is unsubstituted or substituted by one or more identical or different groups L, Z is an electron withdrawing group, $R^{T1,T2}$ is each independently H, a carbyl or hydrocarbyl group with 1 to 30 C atoms that is optionally substituted by one or more groups L and optionally comprises one or more hetero atoms, wherein at least one of $R^{T1}$ and $R^{T2}$ is an electron withdrawing group, $Y^{1,2}$ is each independently H, F, Cl or CN, L is F, Cl, —$NO_2$, —CN, —NC, —NCO, —NCS, —OCN, —SCN, $R^0$, $OR^0$, $SR^0$, —C(═O)$X^0$, —C(═O)$R^0$, —C(═O)—$OR^0$, —O—C(═O)—$R^0$, —$NH_2$, —$NHR^0$, —$NR^0R^{00}$, —C(═O)$NHR^0$, —C(═O)$NR^0R^{00}$, —$SO_3R^0$, —$SO_2R^0$, —OH, —$NO_2$, —$CF_3$, —$SF_5$, or optionally substituted silyl, or carbyl or hydrocarbyl with 1 to 30 C atoms that is optionally substituted and optionally comprises one or more hetero atoms, $R^0$, $R^{00}$ is each independently H or straight-chain or branched alkyl with 1 to 20 C atoms that is optionally fluorinated, $X^0$ is halogen, a, b is each independently 0, 1, 2 or 3, c is 0, 1, 2 or 3, i is 0, 1, 2 or 3, k is 0 or an integer from 1 to 10, m is 0 or an integer from 1 to 10, m1 is 0 or an integer from 1 to 10, a2, a3 is each independently 0, 1, 2 or 3, and $m1+a2+a3 \geq 10$.

3. The OPD according claim 2, wherein the n-type OSC compound of the photoactive layer is of formula I.

4. The OPD according to claim 2, wherein the n-type OSC compound of the photoactive layer is of formula IA.

5. The OPD according to claim 2, wherein, in formula NI, I and IA, $Ar^1$, $Ar^{1A}$, $Ar^{1B}$ and $Ar^{1C}$ are selected from the following formulae

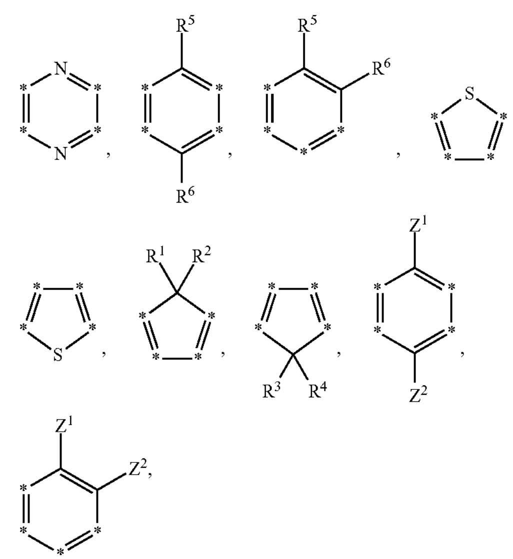

wherein $R^{1-3}$, $R^{5-7}$ and $Z^1$ are as defined for the compound of formula NI, I or IA, $R^4$ has one of the meanings given for $R^3$, and $Z^2$ has one of the meanings given for $Z^1$.

6. The OPD according to claim 2, wherein, in formula NI, I and IA, $Ar^2$ is selected from the following formulae

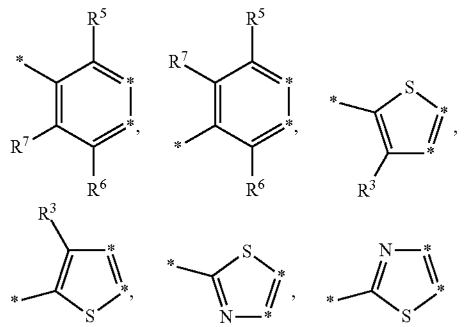

wherein $R^{3-7}$ are as defined for the compound of formula NI, I or IA.

7. The OPD according claim 2, wherein, in formula NI, I and IA, $Ar^3$ is selected from the following formulae

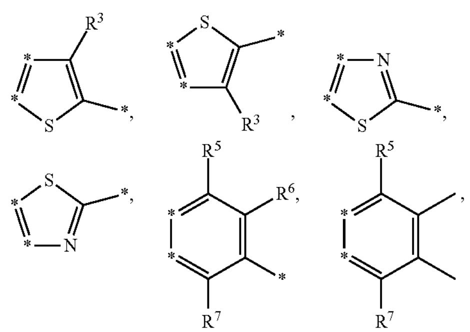

wherein $R^{3-7}$ are as defined for the compound of formula NI, I or IA.

8. The OPD according to claim 2, wherein, in formula NI, I and IA, $Ar^4$ and $Ar^5$ are selected from the following formulae and their mirror images

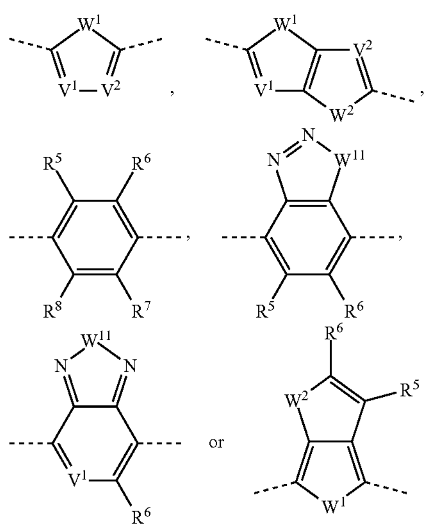

wherein $W^{1,2}$, $V^{1,2}$ and $R^{5-7}$, independently of each other and on each occurrence identically or differently, have the meanings given for the compound of formula NI, I or IA, and $R^8$ has one of the meanings given for $R^5$ and $W^{11}$ is $NR^0$, S, O, Se or Te.

9. The OPD according to claim 2, wherein, in formula NI, I and IA, $Ar^4$ and $Ar^5$ are selected from the following formulae and their mirror images

AR1

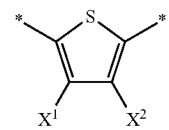

AR2

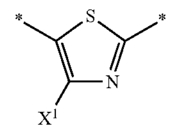

AR3

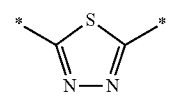

AR4

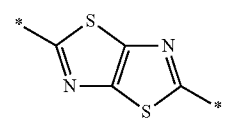

AR5

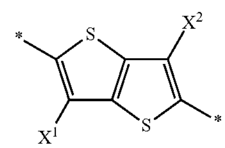

AR6

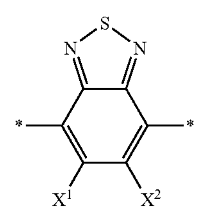

AR7

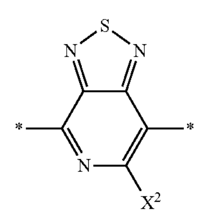

AR8

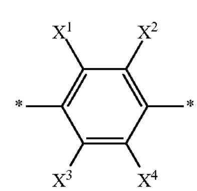

AR9

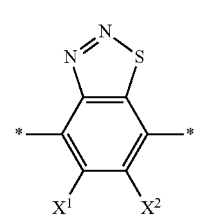

-continued

AR10

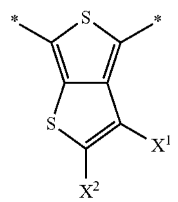

AR11

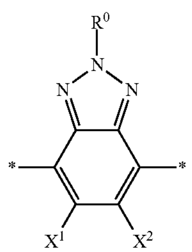

wherein $R^0$ is as defined for the compound of formula NI, I or IA, and $X^{1-4}$ have one of the meanings given for $R^1$ for the compound of formula NI, I or IA.

10. The OPD according to claim 2, wherein, in formula NI, I and IA, $R^{T1}$ and $R^{T2}$ are selected from H, F, Cl, Br, —$NO_2$, —CN, —$CF_3$, R*, —$CF_2$—R*, —O—R*, —S—R*, —$SO_2$—R*, —$SO_3$—R*, —C(═O)—H, —C(═O)—R*, —C(═S)—R*, —C(═O)—$CF_2$—R*, —C(═O)—OR*, —C(═S)—OR*, —O—C(═O)—R*, —O—C(═S)—R*, —C(═O)—SR*, —S—C(═O)—R*, —C(═O)NR*R**, —NR*—C(═O)—R*, —NHR*, —NR*R**, —CR*═CR*R**, —C≡C—R*, —C≡C—SiR*RR*, —SiR*RR*, —CH═CH(CN), —CH═C$(CN)_2$, —C(CN)═C$(CN)_2$, —CH═C(CN)($R^a$), CH═C(CN)—C(═O)—OR*, —CH═C(CO—OR*$)_2$, —CH═C(CO—NR*R**$)_2$,

T1

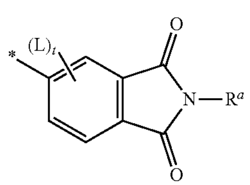

T2

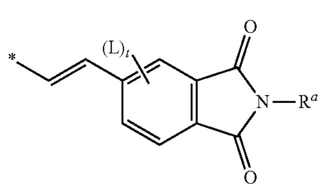

T3

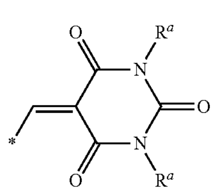

-continued

T4

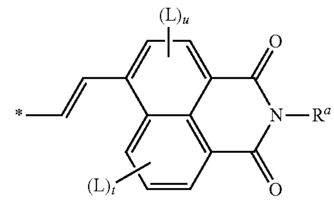

T5

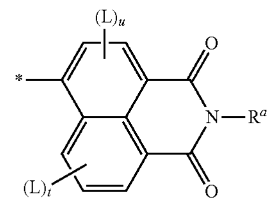

T6

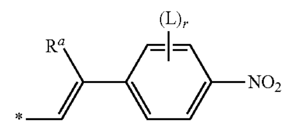

T7

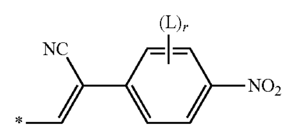

T8

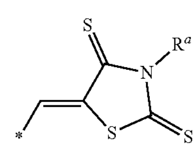

T9

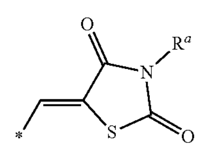

T10

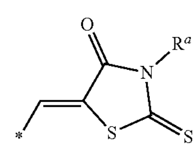

T11

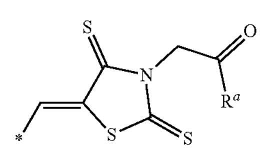

T12

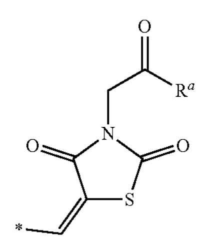

-continued
T13
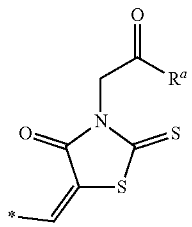
T14
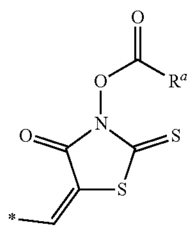
T15
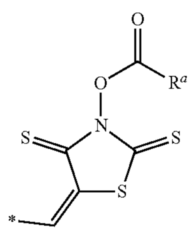
T16
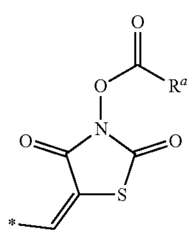
T17
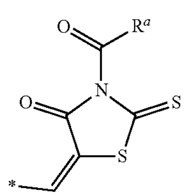
T18
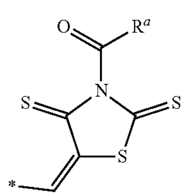
T19
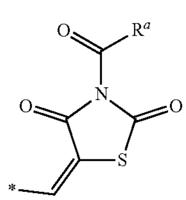
-continued
T20
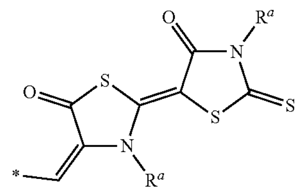
T21
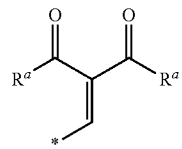
T22
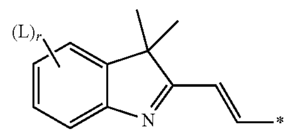
T23
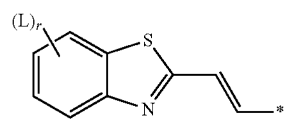
T24
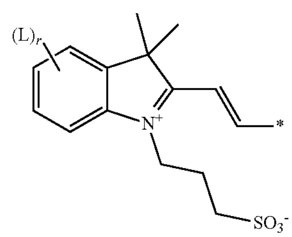
T25
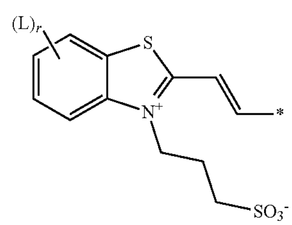
T26
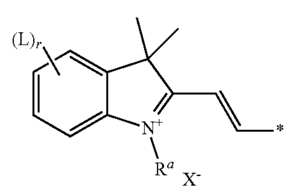
T27
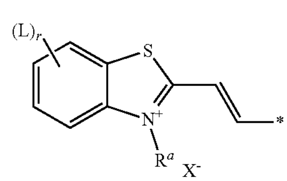
T28
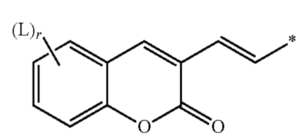

-continued
T29
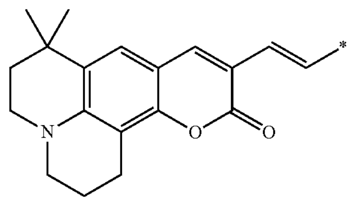
T30
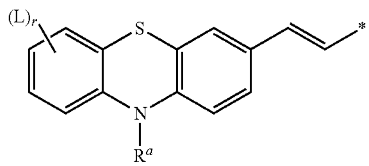
T31
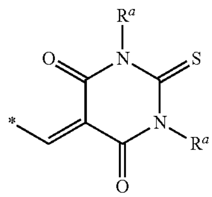
T32
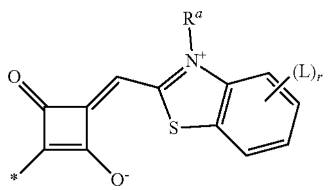
T33
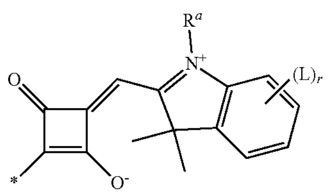
T34
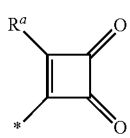
T35
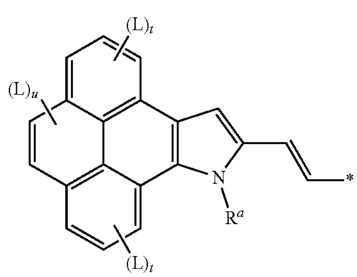
T36
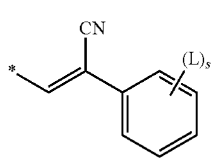
-continued
T37
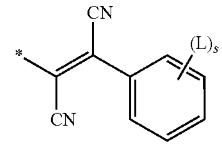
T38
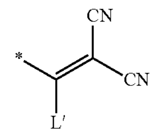
T39
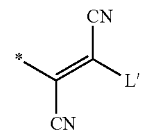
T40
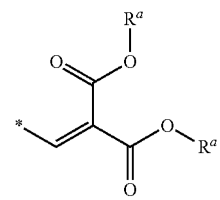
T41
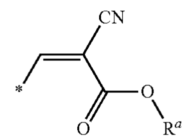
T42
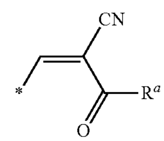
T43
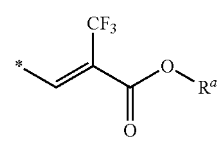
T44
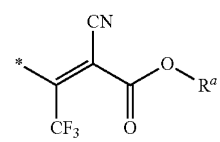
T45
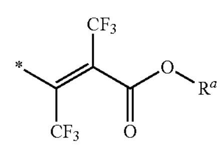
T46
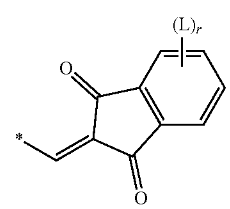

-continued

T47

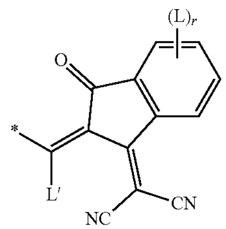

T48

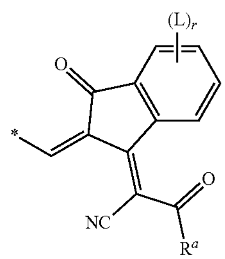

T49

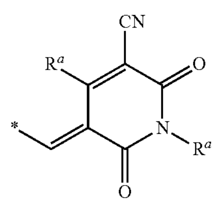

T50

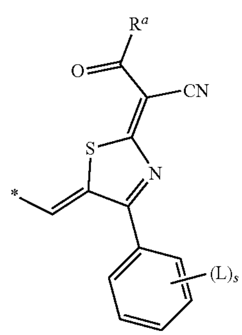

T51

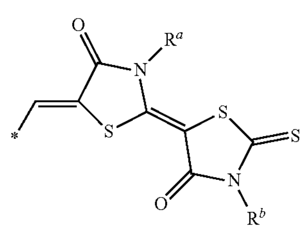

T52

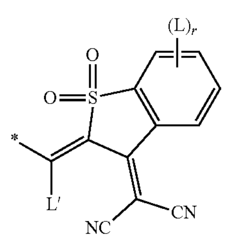

-continued

T53

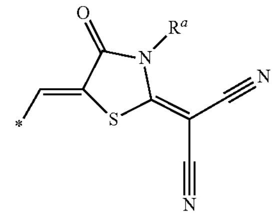

T54

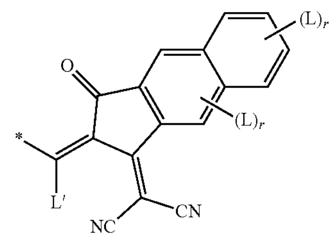

wherein the individual radicals, independently of each other and on each occurrence identically or differently, have the following meanings $R^a$, $R^b$ is each independently aryl or heteroaryl, each having from 4 to 30 ring atoms, optionally containing fused rings and being unsubstituted or substituted with one or more groups L, or one of the meanings given for L, R*, R, R* is each independently alkyl with 1 to 20 C atoms which is straight-chain, branched or cyclic, and is unsubstituted, or substituted with one or more F or Cl atoms or CN groups, or perfluorinated, and in which one or more C atoms are optionally replaced by —O—, —S—, —C(═O)—, —C(═S)—, —$SiR^0R^{00}$—, —$NR^0R^{00}$—, —$CHR^0$═$CR^{00}$— or —C≡C— such that O- and/or S-atoms are not directly linked to each other, or R*,R and R* have one of the meanings given for Ra, L is F, Cl, —$NO_2$, —CN, —NC, —NCO, —NCS, —OCN, —SCN, $R^0$, $OR^0$, $SR^0$, —C(═O)$X^0$, —C(═O)$R^0$, —C(═O)—$OR^0$, —O—C(═O)—$R^0$, —$NH_2$, —$NHR^0$, —$NR^0R^{00}$, —C(═O)$NHR^0$, —C(═O)$NR^0R^{00}$, —$SO_3R^0$, —$SO_2R^0$, —OH, —$NO_2$, —$CF_3$, —$SF_5$, or optionally substituted silyl, or carbyl or hydrocarbyl with 1 to 30 C atoms that is optionally substituted and optionally comprises one or more hetero atoms, L' is H or one of the meanings of L, $R^0$, $R^{00}$ is H or straight-chain or branched alkyl with 1 to 12 C atoms that is optionally fluorinated, $Y^1$, $Y^2$ is H, F, C or CN, $X^0$ is halogen, r is 0, 1, 2, 3 or 4, s is 0, 1, 2, 3, 4 or 5, t is 0, 1, 2 or 3, u is 0, 1 or 2.

11. The OPD according to claim 2, wherein, in formula NI, I and IA, $Z^1$ and $Z^2$ are each independently selected from the group consisting of F, Cl, Br, —$NO_2$, —CN, —$CF_3$, —$CF_2$—R*, —$SO_2$—R*, —$SO_3$—R*, —C(═O)—H, —C(═O)—R*, —C(═S)—R*, —C(═O)—$CF_2$—R*, —C(═O)—OR*, —C(═S)—OR*, —O—C(═O)—R*, —O—C(═S)—R*, —C(═O)—SR*, —S—C(═O)—R*, —C(═O)NR*R**, —NR*—C(═O)—R*, —CH═CH(CN), —CH═C$(CN)_2$, —C(CN)═C(CN)$_2$, —CH═C(CN)($R^a$), CH═C(CN)—C(═O)—OR*, —CH═C(CO—OR*)$_2$, and —CH═C(CO—NR*R**)$_2$, R*, R** is each independently alkyl with 1 to 20 C atoms which is straight-chain, branched or cyclic, and is unsubstituted, or substituted with one or more F or Cl atoms or CN groups, or perfluorinated, and in which one or more C atoms are optionally replaced by —O—, —S—, —C(═O)—, —C(═S)—, —SiR$^0$R$^{00}$—, —NR$^0$R$^{00}$—, —CHR$^0$═CR$^{00}$— or —C≡C— such that O- and/or S-atoms are not directly linked to each other, or R* and R** have one of the meanings given for $R^a$, $R^a$ is aryl or heteroaryl, each having from 4 to 30 ring atoms, optionally containing fused rings and being unsubstituted or substituted with one or more groups L, or one of the meanings given for L, L is F, Cl, —NO$_2$, —CN, —NC, —NCO, —NCS, —OCN, —SCN, R$^0$, OR$^0$, SR$^0$, —C(═O)X$^0$, —C(═O)R$^0$, —C(═O)—OR$^0$, —O—C(═O)—R$^0$, —NH$_2$, —NHR$^0$, —NR$^0$R$^{00}$, —C(═O)NHR$^0$, —C(═O)NR$^0$R$^{00}$, —SO$_3$R$^0$, —SO$_2$R$^0$, —OH, —NO$_2$, —CF$_3$, —SF$_5$, or optionally substituted silyl, or carbyl or hydrocarbyl with 1 to 30 C atoms that is optionally substituted and optionally comprises one or more hetero atoms, R$^0$, R$^{00}$ is H or straight-chain or branched alkyl with 1 to 12 C atoms that is optionally fluorinated, X$^0$ is halogen.

12. The OPD according to claim 2, wherein, in formula NI, I and IA, $R^{1\text{-}4}$ are each independently alkyl or alkoxy with 1 to 16 C atoms which is optionally fluorinated, or aryl or heteroaryl having 4 to 30 ring atoms that is mono- or polycyclic, optionally contains fused rings, and is optionally substituted with one or more groups L, wherein L is F, Cl, —NO$_2$, —CN, —NC, —NCO, —NCS, —OCN, —SCN, R$^0$, OR$^0$, SR$^0$, —C(═O)X$^0$, —C(═O)R$^0$, —C(═O)—OR$^0$, —O—C(═O)—R$^0$, —NH$_2$, —NHR$^0$, —NR$^0$R$^{00}$, —C(═O)NHR$^0$, —C(═O)NR$^0$R$^{00}$, —SO$_3$R$^0$, —SO$_2$R$^0$, —OH, —NO$_2$, —CF$_3$, —SF$_5$, or optionally substituted silyl, or carbyl or hydrocarbyl with 1 to 30 C atoms that is optionally substituted and optionally comprises one or more hetero atoms, R$^0$, R$^{00}$ is each independently H or straight-chain or branched alkyl with 1 to 20 C atoms that is optionally fluorinated, and X$^0$ is halogen.

13. The OPD according to claim 1, wherein the n-type OSC compound of the photoactive layer is a naphthalene or perylene derivative.

14. The OPD according to claim 1, wherein in the p-type conjugated OSC polymer of the photoactive layer the donor and acceptor units are selected from arylene or heteroarylene that has from 5 to 20 ring atoms, is mono- or polycyclic, optionally contains fused rings, and is unsubstituted or substituted by one or more identical or different groups L, wherein L is F, Cl, —NO$_2$, —CN, —NC, —NCO, —NCS, —OCN, —SCN, R$^0$, OR$^0$, SR$^0$, —C(═O)X$^0$, —C(═O)R$^0$, —C(═O)—OR$^0$, —O—C(═O)—R$^0$, —NH$_2$, —NHR$^0$, —NR$^0$R$^{00}$, —C(═O)NHR$^0$, —C(═O)NR$^0$R$^{00}$, —SO$_3$R$^0$, —SO$_2$R$^0$, —OH, —NO$_2$, —CF$_3$, —SF$_5$, or optionally substituted silyl, or carbyl or hydrocarbyl with 1 to 30 C atoms that is optionally substituted and optionally comprises one or more hetero atoms, R$^0$, R$^{00}$ is each independently H or straight-chain or branched alkyl with 1 to 20 C atoms that is optionally fluorinated, and X$^0$ is halogen.

15. The OPD according to claim 1, wherein the p-type conjugated OSC polymer of the photoactive layer additionally comprises one or more spacer units, which are selected from arylene or heteroarylene that has from 5 to 20 ring atoms, is mono- or polycyclic, optionally contains fused rings, are is unsubstituted or substituted by one or more identical or different groups L, and which are located between the donor and acceptor units such that a donor unit and an acceptor unit are not directly connected to each other, wherein L is F, Cl, —NO$_2$, —CN, —NC, —NCO, —NCS, —OCN, —SCN, R$^0$, OR$^0$, SR$^0$, —C(═O)X$^0$, —C(═O)R$^0$, —C(═O)—OR$^0$, —O—C(═O)—R$^0$, —NH$_2$, —NHR$^0$, —NR$^0$R$^{00}$, —C(═O)NHR$^0$, —C(═O)NR$^0$R$^{00}$, —SO$_3$R$^0$, —SO$_2$R$^0$, —OH, —NO$_2$, —CF$_3$, —SF$_5$, or optionally substituted silyl, or carbyl or hydrocarbyl with 1 to 30 C atoms that is optionally substituted and optionally comprises one or more hetero atoms, R$^0$, R$^{00}$ is each independently H or straight-chain or branched alkyl with 1 to 20 C atoms that is optionally fluorinated, and X$^0$ is halogen.

16. The OPD according claim 1, wherein the p-type conjugated OSC polymer of the photoactive layer comprises one or more donor units selected from formula DA and DB

DA

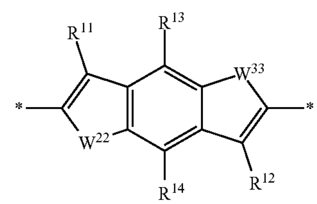

DB

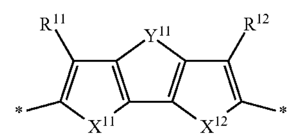

wherein

X$^{11}$, X$^{12}$ independently of each other denote S, O or Se,

W$^{22}$, W$^{33}$ independently of each other denote S, O or Se,

Y$^{11}$ is CR$^{11}$R$^{12}$, SiR$^{11}$R$^{12}$, GeR$^{11}$R$^{12}$, NR$^{11}$, C═O, —O—C(R$^{11}$R$^{12}$)—, —C(R$^{11}$R$^{12}$)—O—, —C(R$^{11}$R$^{12}$)—C(═O)—, —C(═O)—C(R$^{11}$R$^{12}$)—, or —CR$^{11}$═CR$^{12}$—, and R$^{11}$, R$^{12}$, R$^{13}$ and R$^{14}$ independently of each other denote H or have one of the meanings of L or R$^1$ R$^{11}$ is Z$^1$, H, F, Cl, CN, or straight-chain, branched or cyclic alkyl with 1 to 30 C atoms, in which one or more CH$_2$ groups are optionally replaced by —O—, —S—, —C(═O)—, —C(═S)—, —C(═O)—O—, —O—C(═O)—, —NR$^0$—, —SiR$^0$R$^{00}$—, —CF$_2$—, —CR$^0$═CR$^{00}$—, —CY$^1$═CY$^2$— or —C≡C— in such a manner that O and/or S atoms are not linked directly to one another, and in which one or more H atoms are optionally replaced by F, Cl, Br, I or CN, and in which one or more CH$_2$ or CH$_2$ groups are optionally replaced by a cationic or anionic group, or aryl, heteroaryl, arylalkyl, heteroarylalkyl, aryloxy or heteroaryloxy, wherein each of the aforementioned cyclic groups has 5 to 20 ring atoms, is mono- or polycyclic, does optionally contain fused rings, and is unsubstituted or substituted by one or more identical or different groups L, $Z^1$ is an electron withdrawing group, $Y^{1,2}$ is each independently H, F, Cl or CN, L is F, Cl, —$NO_2$, —CN, —NC, —NCO, —NCS, —OCN, —SCN, $R^0$, $OR^0$, $SR^0$, —C(═O)$X^0$, —C(═O)$R^0$, —C(═O)—$OR^0$, —O—C(═O)—$R^0$, —$NH_2$, —$NHR^0$, —$NR^0R^{00}$, —C(═O)$NHR^0$, —C(═O)$NR^0R^{00}$, —$SO_3R^0$, —$SO_2R^0$, —OH, —$NO_2$, —$CF_3$, —$SF_5$, or optionally substituted silyl, or carbyl or hydrocarbyl with 1 to 30 C atoms that is optionally substituted and optionally comprises one or more hetero atoms, $R^0$, $R^{00}$ is each independently H or straight-chain or branched alkyl with 1 to 20 C atoms that is optionally fluorinated, and $X^0$ is halogen.

17. The OPD according to claim 1, wherein the p-type conjugated OSC polymer of the photoactive layer comprises one or more acceptor units of formula AA

AA

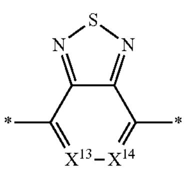

wherein $X^{13}$ and $X^{14}$ independently of each other denote are $CR^{11}$ or N and $R^{11}$ denotes H or has one of the meanings of L or $R^1$, $R^1$ is $Z^1$, H, F, Cl, CN, or straight-chain, branched or cyclic alkyl with 1 to 30 C atoms, in which one or more $CH_2$ groups are optionally replaced by —O—, —S—, —C(═O)—, —C(═S)—, —C(═O)—O—, —O—C(═O)—, —$NR^0$—, —$SiR^0R^{00}$—, —$CF_2$—, —$CR^0$═$CR^{00}$—, —$CY^1$═$CY^2$— or —C≡C— in such a manner that O and/or S atoms are not linked directly to one another, and in which one or more H atoms are optionally replaced by F, Cl, Br, I or CN, and in which one or more $CH_2$ or $CH_2$ groups are optionally replaced by a cationic or anionic group, or aryl, heteroaryl, arylalkyl, heteroarylalkyl, aryloxy or heteroaryloxy, wherein each of the aforementioned cyclic groups has 5 to 20 ring atoms, is mono- or polycyclic, does optionally contain fused rings, and is unsubstituted or substituted by one or more identical or different groups L, $Z^1$ is an electron withdrawing group, $Y^{1,2}$ is each independently H, F, Cl or CN, L is F, Cl, —$NO_2$, —CN, —NC, —NCO, —NCS, —OCN, —SCN, $R^0$, $OR^0$, $SR^0$, —C(═O)$X^0$, —C(═O)$R^0$, —C(═O)—$OR^0$, —O—C(═O)—$R^0$, —$NH_2$, —$NHR^0$, —$NR^0R^{00}$, —C(═O)$NHR^0$, —C(═O)$NR^0R^{00}$, —$SO_3R^0$, —$SO_2R^0$, —OH, —$NO_2$, —$CF_3$, —$SF_5$, or optionally substituted silyl, or carbyl or hydrocarbyl with 1 to 30 C atoms that is optionally substituted and optionally comprises one or more hetero atoms, $R^0$, $R^{00}$ is each independently H or straight-chain or branched alkyl with 1 to 20 C atoms that is optionally fluorinated, and $X^0$ is halogen.

18. The OPD according to claim 17, wherein the p-type conjugated OSC polymer of the photoactive layer comprises one or more acceptor units selected from the following subformulae

AA1

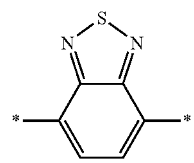

AA2

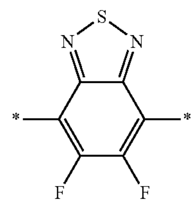

AA3

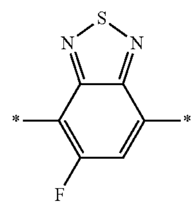

AA4

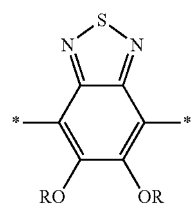

AA5

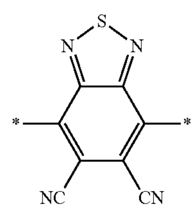

AA6

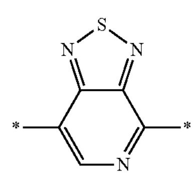

AA7

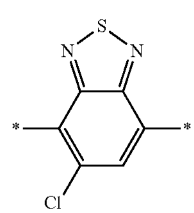

wherein R denotes alkyl with 1 to 20 C atoms, wherein

SUB1

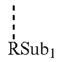

SUB2

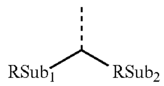

SUB3

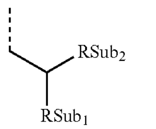

SUB4

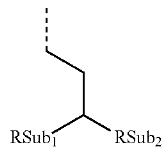

SUB5

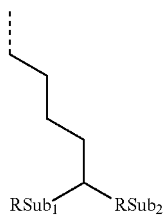

SUB6

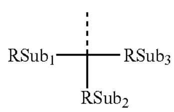

$RSub_{1-3}$ denotes L and where at least one group $RSub_{1-3}$ is alkyl, alkoxy, oxaalkyl, thioalkyl, alkylcarbonyl or alkoxycarbonyl with 1 to 24 C atoms, that is optionally fluorinated, and wherein the dashed line denotes the link to the group to which these groups are attached, L is F, Cl, —$NO_2$, —CN, —NC, —NCO, —NCS, —OCN, —SCN, $R^0$, $OR^0$, $SR^0$, —C(═O)$X^0$, —C(═O)$R^0$, —C(═O)—$OR^0$, —O—C(═O)—$R^0$, —$NH_2$, —$NHR^0$, —$NR^0R^{00}$, —C(═O)$NHR^0$, —C(═O)$NR^0R^{00}$, —$SO_3R^0$, —$SO_2R^0$, —OH, —$NO_2$, —$CF_3$, —$SF_5$, or optionally substituted silyl, or carbyl or hydrocarbyl with 1 to 30 C atoms that is optionally substituted and optionally comprises one or more hetero atoms, $R^0$, $R^{00}$ is each independently H or straight-chain or branched alkyl with 1 to 20 C atoms that is optionally fluorinated, and $X^0$ is halogen.

19. The OPD according to claim 1, wherein the p-type conjugated OSC polymer of the photoactive layer comprises one or more spacer units of formula Sp1 or Sp6

Sp1

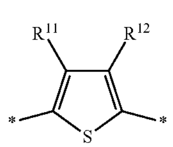

-continued

Sp6

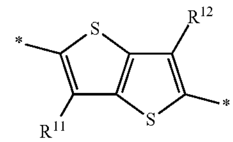

wherein $R^{11}$, $R^{12}$ each independently denotes H or has one of the meanings of L or $R^1$, $R^1$ is $Z^1$, H, F, Cl, CN, or straight-chain, branched or cyclic alkyl with 1 to 30 C atoms, in which one or more $CH_2$ groups are optionally replaced by —O—, —S—, —C(═O)—, —C(═S)—, —C(═O)—O—, —O—C(═O)—, —$NR^0$—, —$SiR^0R^{00}$—, —$CF_2$—, —$CR^0$═$CR^0$—, —$CY^1$═$CY^2$— or —C≡C— in such a manner that O and/or S atoms are not linked directly to one another, and in which one or more H atoms are optionally replaced by F, Cl, Br, I or CN, and in which one or more $CH_2$ or $CH_3$ groups are optionally replaced by a cationic or anionic group, or aryl, heteroaryl, arylalkyl, heteroarylalkyl, aryloxy or heteroaryloxy, wherein each of the aforementioned cyclic groups has 5 to 20 ring atoms, is mono- or polycyclic, does optionally contain fused rings, and is unsubstituted or substituted by one or more identical or different groups L, $Z^1$ is an electron withdrawing group, $Y^{1,2}$ is each independently H, F, Cl or CN, L is F, Cl, —$NO_2$, —CN, —NC, —NCO, —NCS, —OCN, —SCN, $R^0$, $OR^0$, $SR^0$, —C(═O)$X^0$, —C(═O)$R^0$, —C(═O)—$OR^0$, —O—C(═O)—$R^0$, —$NH_2$, —$NHR^0$, —$NR^0R^{00}$, —C(═O)$NHR^0$, —C(═O)$NR^0R^{00}$, —$SO_3R^0$, —$SO_2R^0$, —OH, —$NO_2$, —$CF_3$, —$SF_5$, or optionally substituted silyl, or carbyl or hydrocarbyl with 1 to 30 C atoms that is optionally substituted and optionally comprises one or more hetero atoms, $R^0$, $R^{00}$ is each independently H or straight-chain or branched alkyl with 1 to 20 C atoms that is optionally fluorinated, and $X^0$ is halogen.

20. The OPD according to claim 1, wherein the p-type conjugated OSC polymer comprises one or more units selected from the following formulae -(D-Sp)- U1

-(A-Sp)- U2

-(D-A)- U3

-(D)- U4

-(A)- U5

-(D-A-D-Sp)- U6

-(D-Sp-A-Sp)- U7

-(Sp-A-Sp)- U8

-(Sp-D-Sp)- U9 wherein

D denotes, on each occurrence identically or differently, a donor unit,

A denotes, on each occurrence identically or differently, an acceptor unit and

Sp denotes, on each occurrence identically or differently, a spacer unit, all of which are selected from arylene or heteroarylene that has from 5 to 20 ring atoms, is mono- or polycyclic, optionally contains fused rings, are is unsubstituted or substituted by one or more identical or different groups L, and wherein the polymer contains at least one unit selected from formulae U1-U9 containing a unit D and at least one unit selected from formulae U1-U9 containing a unit A, L is F, Cl, —$NO_2$, —CN, —NC, —NCO, —NCS, —OCN, —SCN, $R^0$, $OR^0$, $SR^0$, —C(═O)$X^0$, —C(═O)$R^0$, —C(═O)—$OR^0$, —O—C(═O)—$R^0$, —$NH_2$, —$NHR^0$, —$NR^0R^{00}$, —C(═O)$NHR^0$, —C(═O)$NR^0R^{00}$, —$SO_3R^0$, —$SO_2R^0$, —OH, —$NO_2$, —$CF_3$, —$SF_5$, or optionally substituted silyl, or carbyl or hydrocarbyl with 1 to 30 C atoms that is optionally substituted and optionally comprises one or more hetero atoms, $R^0$, $R^{00}$ is each independently H or straight-chain or branched alkyl with 1 to 20 C atoms that is optionally fluorinated, and $X^0$ is halogen.

21. The OPD according to claim 1, wherein in the p-type conjugated OSC polymer of the photoactive layer the donor and acceptor units are distributed in random sequence along the polymer backbone.

22. The OPD according to claim 1, wherein the p-type conjugated OSC polymer is selected from the following formulae $-[(D\text{-}Sp)_x\text{-}(A\text{-}Sp)_y]_n-$ Pi $-[(D\text{-}A)_x\text{-}(Sp\text{-}A)_y]_n-$ Pii $-[(D\text{-}A^1)_x\text{-}(D\text{-}A^2)_y]_n-$ Piii $-[(D^1\text{-}A)_x\text{-}(D^2\text{-}A)_y]_n-$ Piv $-[(D)_x\text{-}(Sp\text{-}A\text{-}Sp)_y]_n-$ Pv $-[(D\text{-}Sp^1)_x\text{-}(Sp^1\text{-}A\text{-}Sp^2)_y]_n-$ Pvi $-[(D\text{-}Sp\text{-}A^1\text{-}Sp)_x\text{-}(A^2\text{-}Sp)_y]_n-$ Pvi $-[(D\text{-}Sp\text{-}A^1\text{-}Sp)^x\text{-}(D\text{-}A^2)_y]_n-$ Pvii $-[(D\text{-}A^1\text{-}D\text{-}Sp)^x\text{-}(A^2\text{-}Sp)_y]_n-$ Pviii $-[(D\text{-}Sp\text{-}A^1\text{-}Sp)_x\text{-}(D\text{-}Sp\text{-}A^2\text{-}Sp)_y]_n-$ Pix $-[(D\text{-}A^1)_x\text{-}(Sp\text{-}A^1)_y\text{-}(D\text{-}Sp^1\text{-}A^2\text{-}Sp^1)_z\text{-}(Sp^2\text{-}A^2\text{-}Sp^1)_{xx}]_n-$ Px $-[(D^1\text{-}A^1)_x\text{-}(D^2\text{-}A^1)_y\text{-}(D^1\text{-}A^2)_z\text{-}(D^2\text{-}A^2)_{xx}]_n-$ Pxi wherein D denotes, on each occurrence identically or differently, a donor unit, A denotes, on each occurrence identically or differently, an acceptor unit, Sp denotes, on each occurrence identically or differently, a spacer unit, all of which are selected from arylene or heteroarylene that has from 5 to 20 ring atoms, is mono- or polycyclic, optionally contains fused rings, are is unsubstituted or substituted by one or more identical or different groups L, L is F, Cl, —$NO_2$, —CN, —NC, —NCO, —NCS, —OCN, —SCN, $R^0$, $OR^0$, $SR^0$, —C(═O)$X^0$, —C(═O)$R^0$, —C(═O)—$OR^0$, —O—C(═O)—$R^0$, —$NH_2$, —$NHR^0$, —$NR^0R^{00}$, —C(═O)$NHR^0$, —C(═O)$NR^0R^{00}$, —$SO_3R^0$, —$SO_2R^0$, —OH, —$NO_2$, —$CF_3$, —$SF_5$, or optionally substituted silyl, or carbyl or hydrocarbyl with 1 to 30 C atoms that is optionally substituted and optionally comprises one or more hetero atoms, $R^0$, $R^{00}$ is each independently H or straight-chain or branched alkyl with 1 to 20 C atoms that is optionally fluorinated, and $X^0$ is halogen $A^1$ and $A^2$ are different acceptor units having one of the meanings of A, $D^1$ and $D^2$ are different donor units having one of the meanings of D, $Sp^1$ and $Sp^2$ are different spacer units having one of the meanings of Sp, x, y, z and xx denote the molar fraction of the respective unit and are each, independently of one another >0 and <1, with x+y+z+xx=1, and n is an integer >1.

23. The OPD according to claim 1, wherein the photoactive layer further comprises one or more n-type OSC compounds selected from fullerenes or fullerene derivatives.

24. The OPD according to claim 1, wherein the photoactive layer further comprises one or more n-type OSC compounds selected from conjugated OSC polymers.

25. The OPD according to claim 24, wherein the n-type conjugated OSC polymers comprise one or more units derived from perylene or naphthalene.

26. The OPD according to claim 1, wherein the photoactive layer further comprises one or more p-type OSC compounds selected from small molecules.

27. The OPD according to claim 1, wherein the n-type OSC of the photoactive layer has a band-gap of <2.0 eV.

28. The OPD according to claim 1, wherein the n-type OSC of the photoactive layer has a band-gap of <1.5 eV.

29. The OPD according to claim 1, wherein the p-type OSC of the photoactive layer has a band-gap of <2.0 eV.

30. The OPD according to claim 1, wherein in the photoactive layer the HOMO of the n-type OSC is >0.3 eV deeper than the HOMO of the p-type OSC.

31. The OPD according to claim 1, which has a photodetector response to wavelengths >700 nm.

32. The OPD according to claim 1, wherein the p-type OSC in the photoactive layer forms a bulk heterojunction (BHJ).

33. A method for recognizing or imaging of finger geometrics or vein patterns by the detection of NIR light, which is achieved by the OPD according to claim 1.

34. A sensor device comprising an OPD according to claim 1.

35. The OPD of claim 2, wherein the n-type OSC compound of the photoactive layer is of formula NI.

* * * * *